United States Patent [19]

Shoemaker et al.

[11] 4,204,114
[45] May 20, 1980

[54] METHOD AND APPARATUS FOR COMPARING LOGIC FUNCTIONS BY ACQUIRING SIGNALS ONE AT A TIME FROM CIRCUIT NODES

[75] Inventors: William E. Shoemaker, Los Altos; David W. Wilson, San Jose, both of Calif.

[73] Assignee: Gould, Inc., Rolling Meadows, Ill.

[21] Appl. No.: 880,876

[22] Filed: Feb. 24, 1978

[51] Int. Cl.² ............... G06F 11/06; G01R 15/12
[52] U.S. Cl. ...................... 371/25; 324/72.5; 324/73 R; 371/20
[58] Field of Search ............ 235/302; 324/72.5, 73 R, 324/158 P; 364/580, 200, 900

[56] References Cited

U.S. PATENT DOCUMENTS

| | | | |
|---|---|---|---|
| 3,546,676 | 12/1970 | Ragen | 364/200 |
| 3,813,647 | 5/1974 | Loo | 235/302 X |
| 3,814,920 | 6/1974 | Huelters | 235/302 |
| 3,831,149 | 8/1974 | Job | 324/73 R X |
| 3,903,471 | 9/1975 | Hiraga et al. | 325/72.5 X |
| 4,038,599 | 7/1977 | Bore et al. | 324/158 P X |

Primary Examiner—David H. Malzahn
Attorney, Agent, or Firm—Limbach, Limbach & Sutton

[57] ABSTRACT

Techniques for displaying on a cathode ray tube a plurality of logic signals either from a single electronic circuit under test wherein the signals are acquired by a single probe, or in comparison to signals from a known good electronic circuit of the same type wherein compensation is provided to eliminate differences in the logic signals that are due to differences in the timing signal frequencies of the two circuits.

27 Claims, 15 Drawing Figures

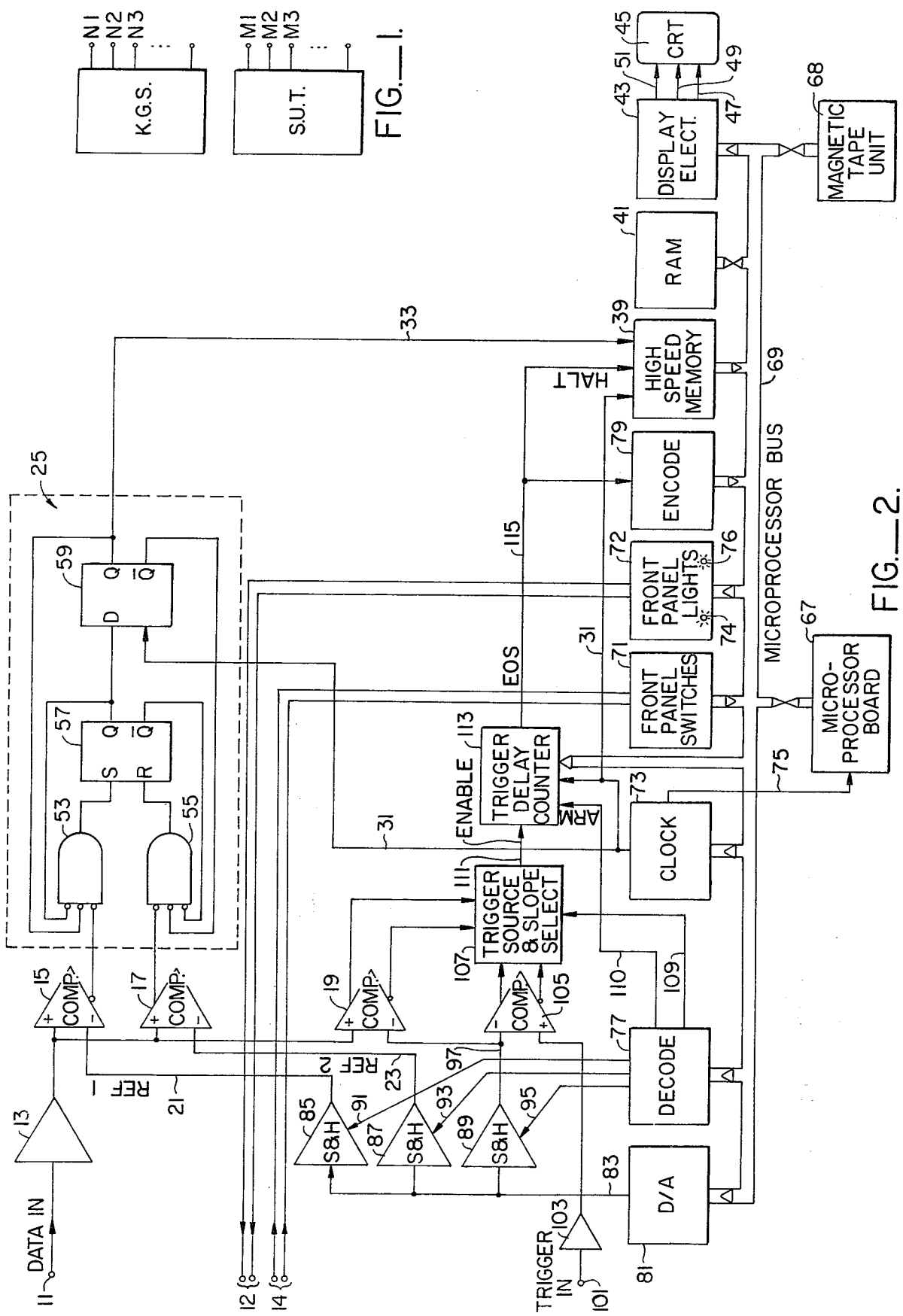

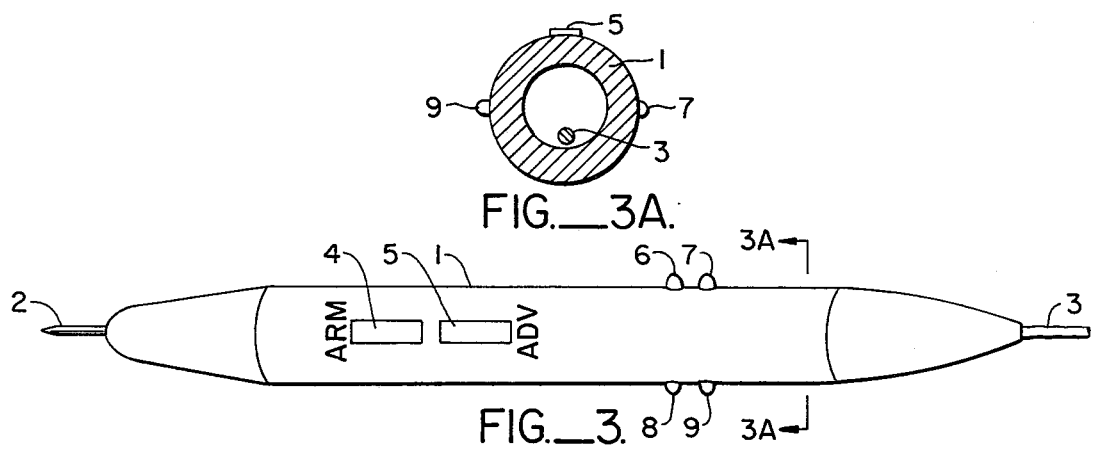
FIG._3A.
FIG._3.
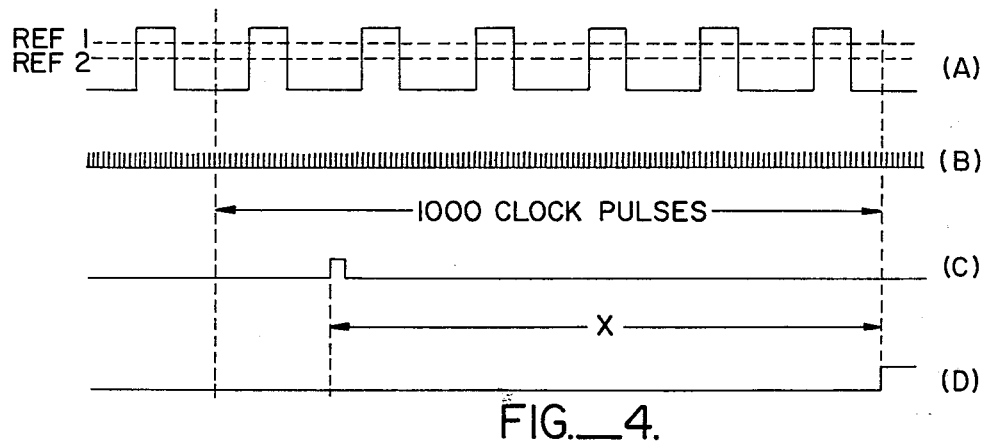
FIG._4.
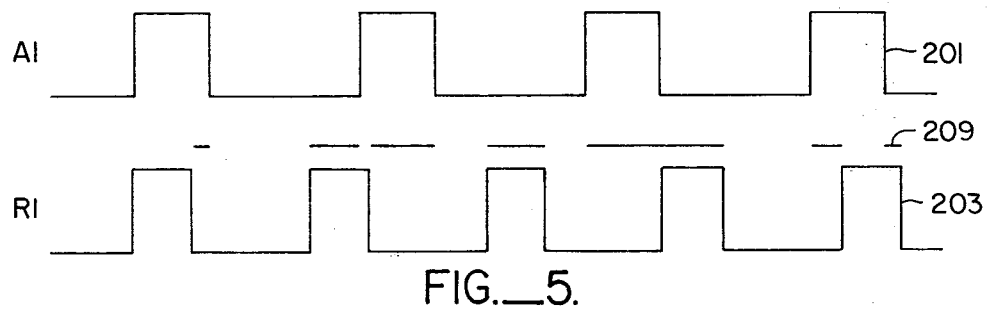
FIG._5.
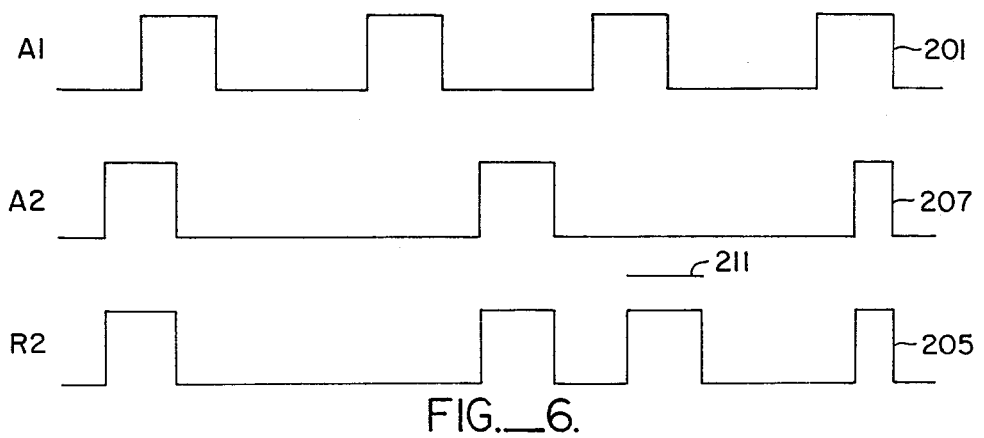
FIG._6.

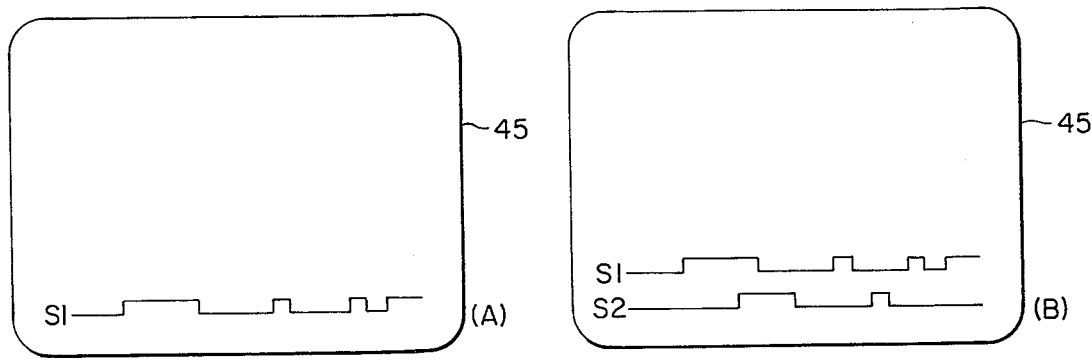
FIG._7.
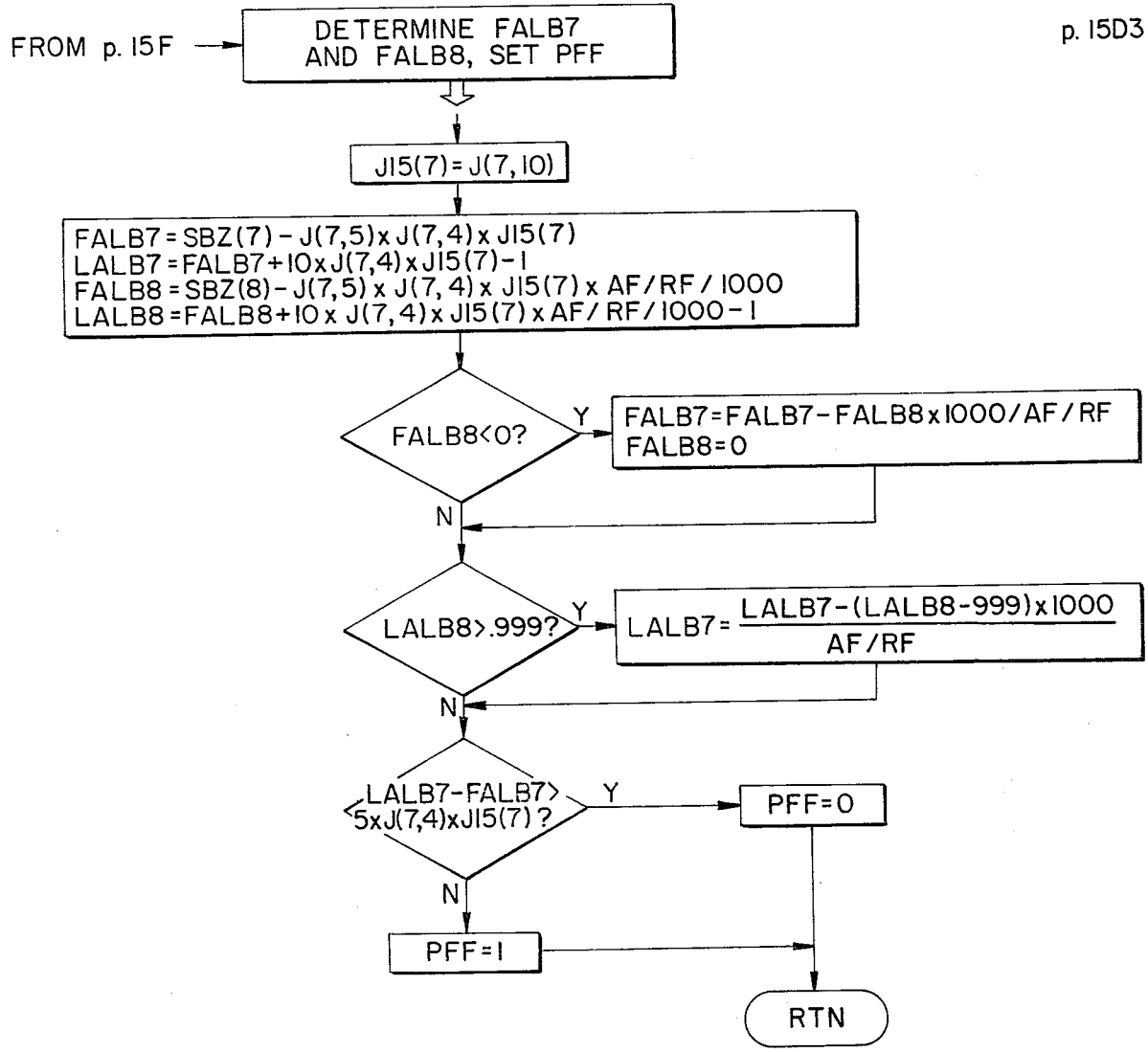
NOTE: LALB8 IS USED ONLY ON THIS PAGE.
FIG._11.

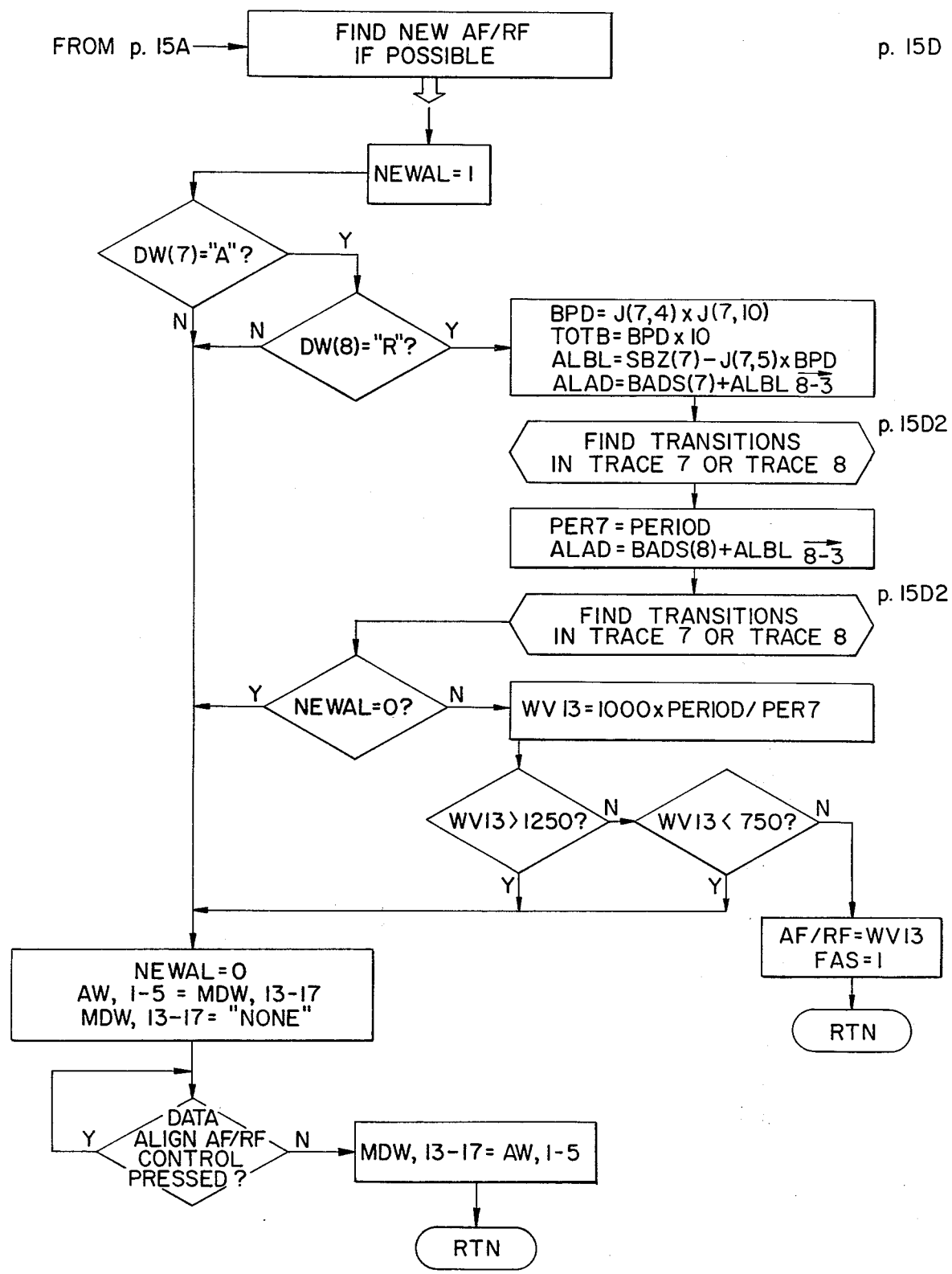
FIG._8.

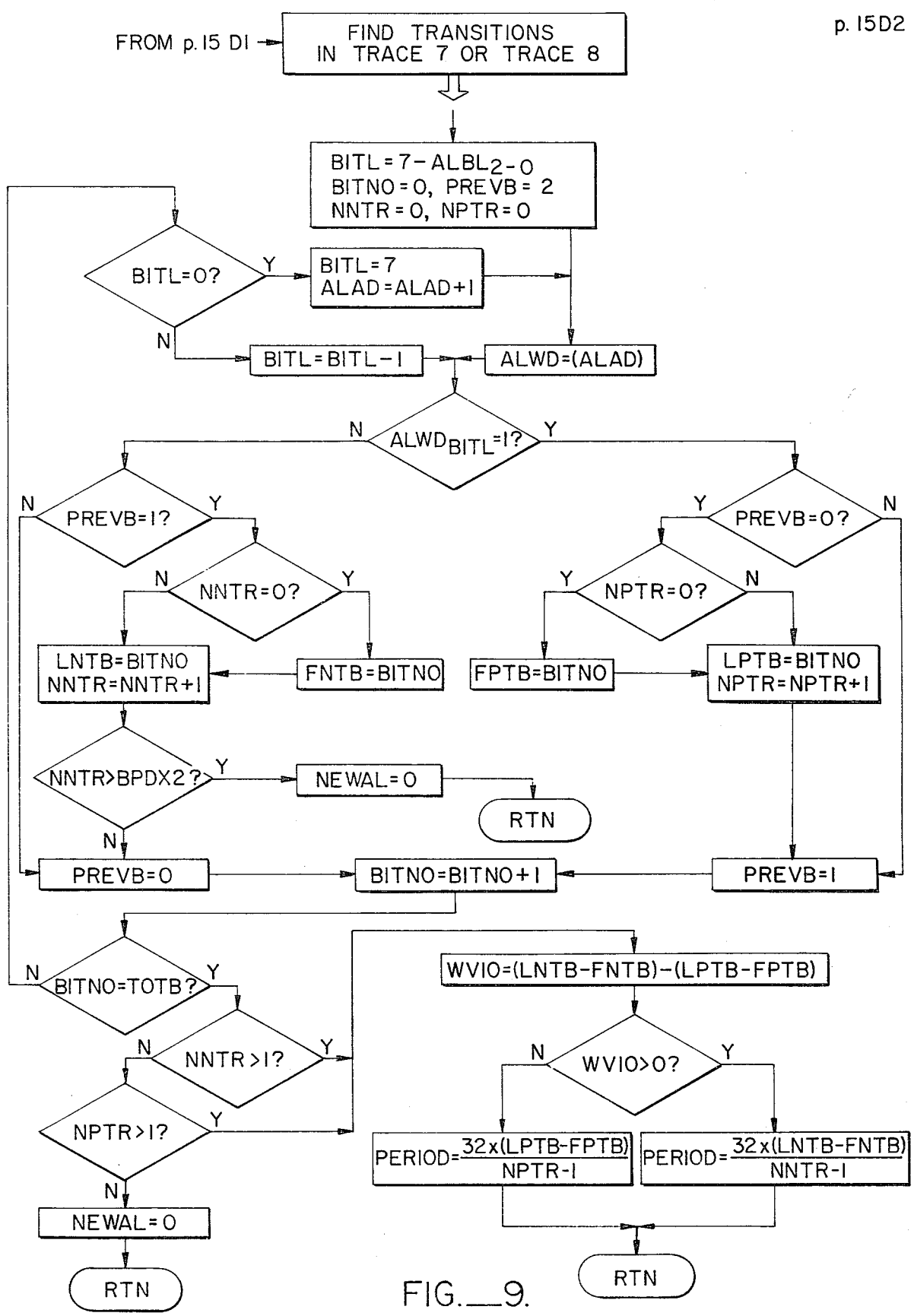
FIG._9.

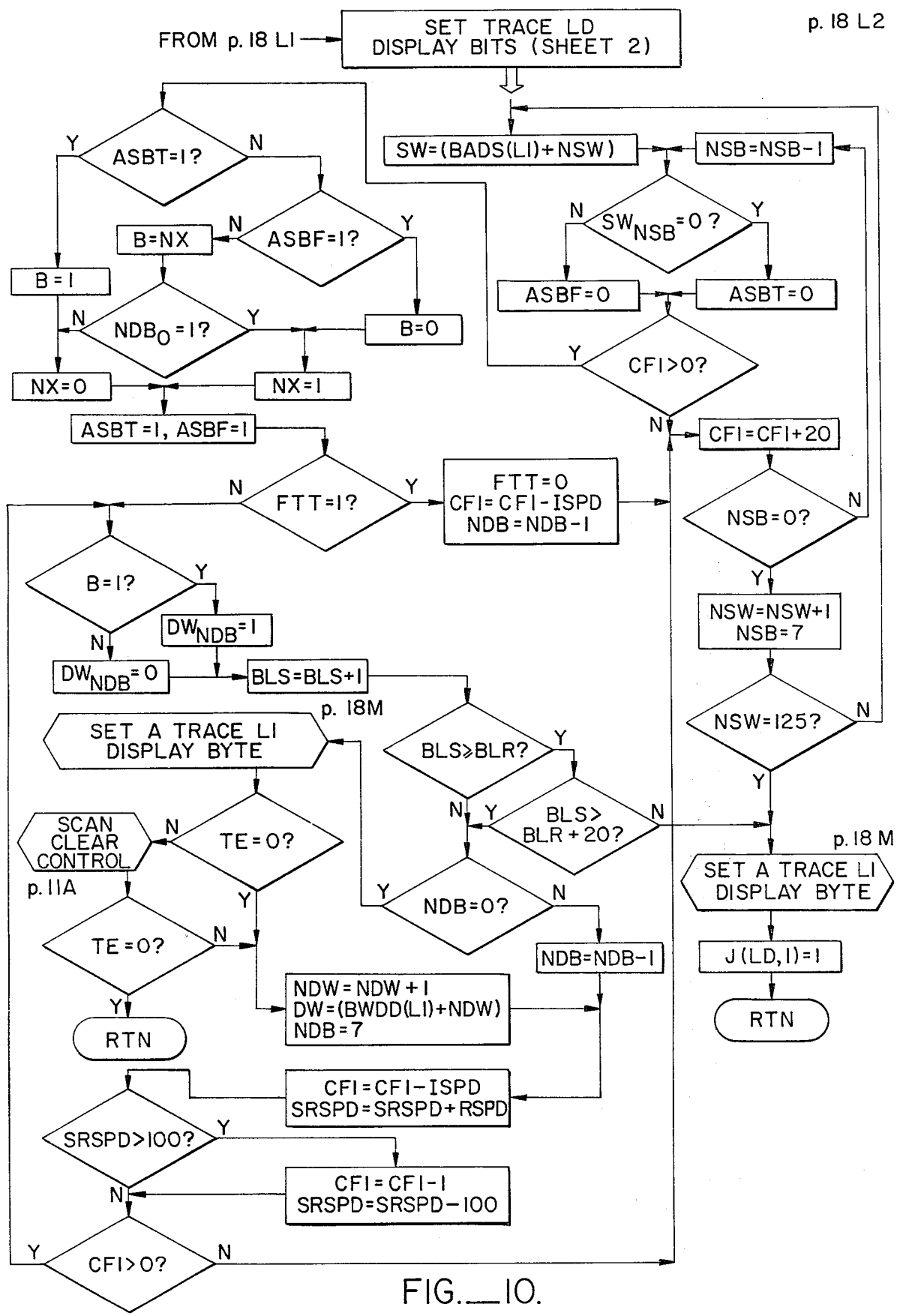
FIG._10.

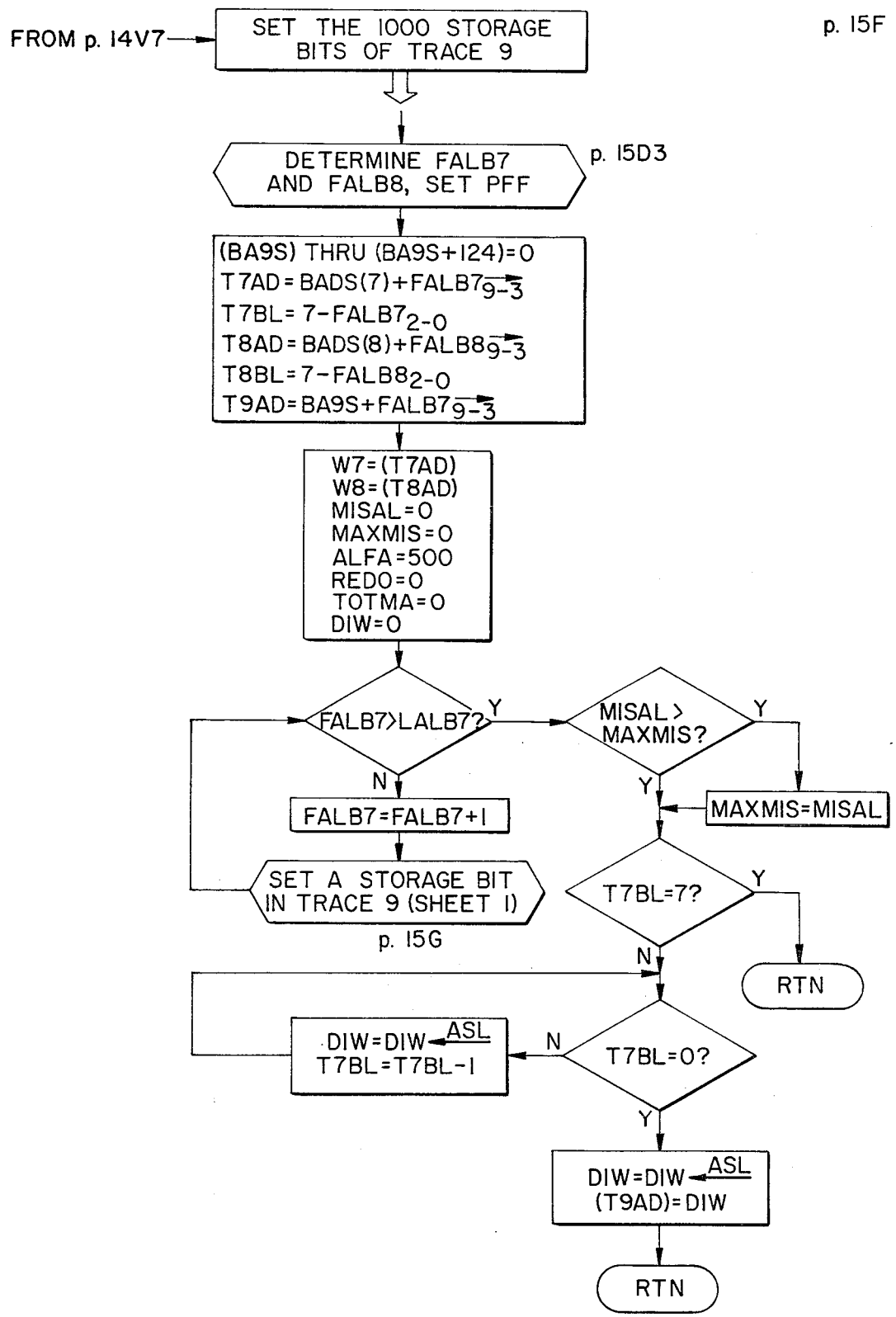
FIG._12.

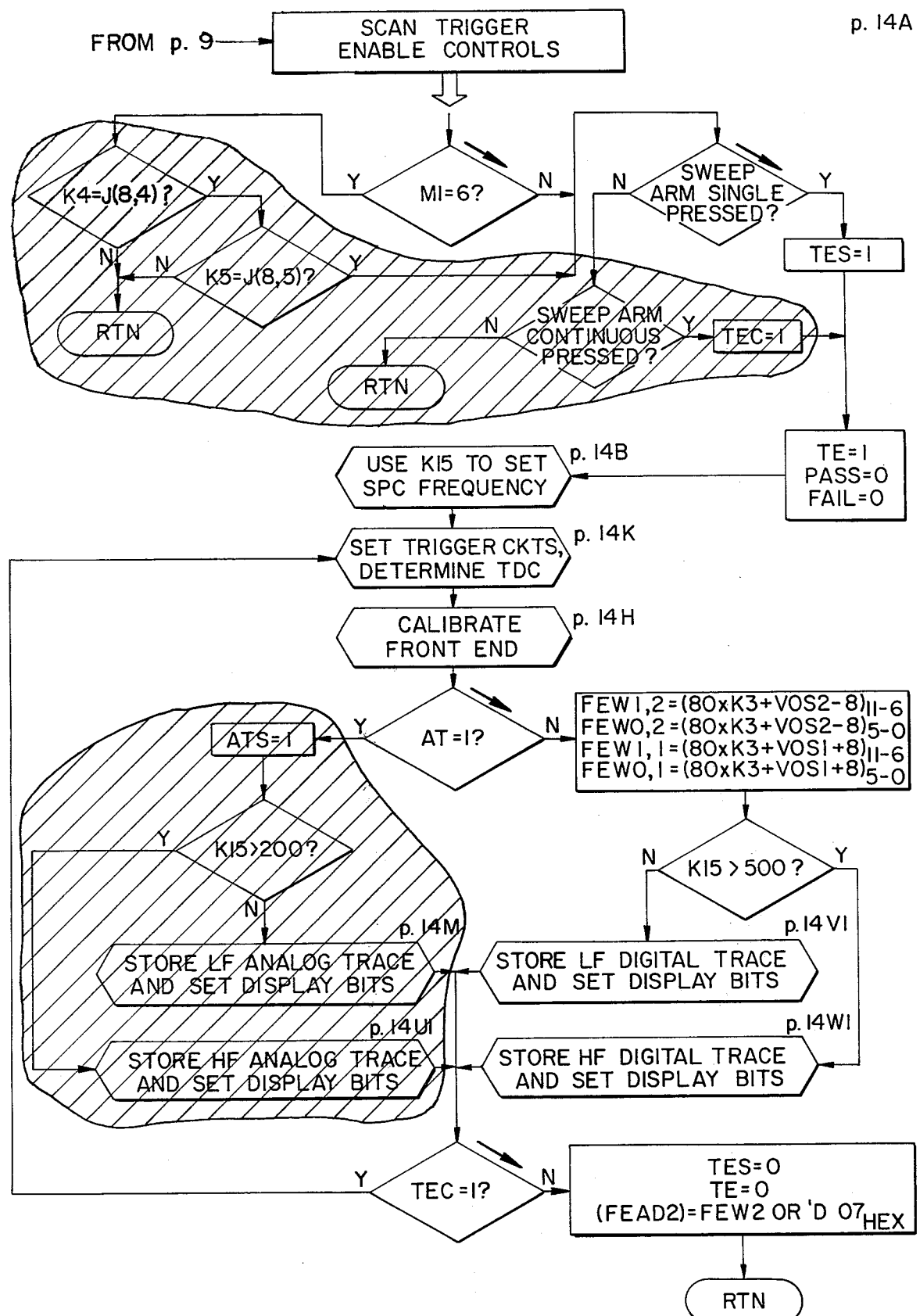
FIG._13.

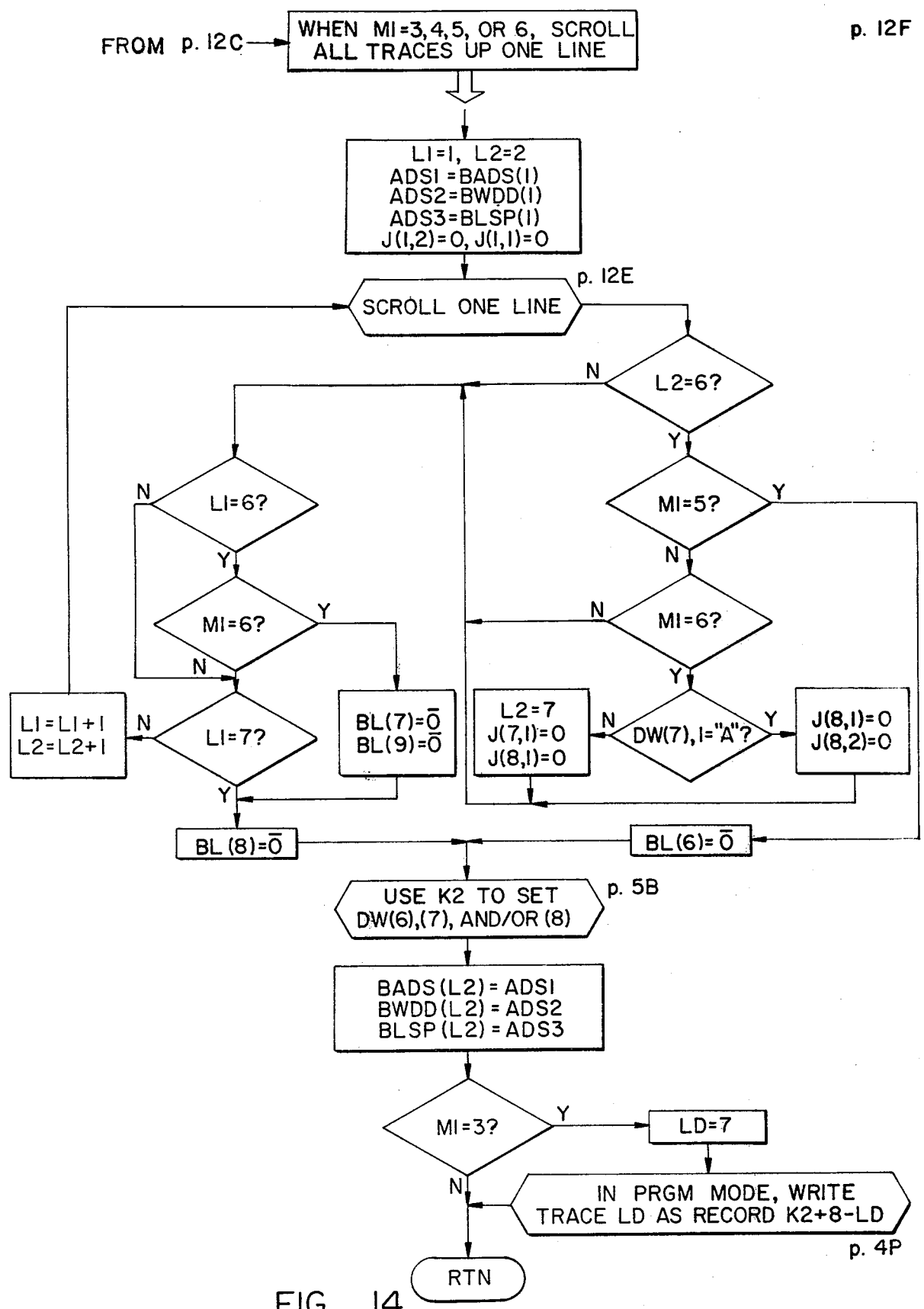
FIG._14.

METHOD AND APPARATUS FOR COMPARING LOGIC FUNCTIONS BY ACQUIRING SIGNALS ONE AT A TIME FROM CIRCUIT NODES

BACKGROUND OF THE INVENTION

This invention relates generally to the art of examining logic signals of an electronic circuit. In verifying the performance of a circuit or system under test (S.U.T.) it is often desirable to compare logic signals within the system to corresponding logic signals within a similar but known good system (K.G.S.) or circuit. A logic signal is acquired, in practice, by placing a probe contact on a conductive portion of the system. Such a contact point of a circuit is termed a "node". The logic signals at a plurality of nodes are generally desired to be acquired and examined in some manner such as by being displayed on a cathode ray tube.

One obstacle that often exists for comparing logic signals at the same node of two systems is that the systems may be driven by clock oscillators which differ in frequency. It is common for a system to have an R-C controlled timing frequency oscillator, the frequencies of the timing oscillators of different systems thus being subject to significant difference. Therefore, although the logic signals of a given system have a proper timing relationship to one another since they are based upon a common timing oscillator, it is difficult to compare logic signals between systems because the logic signals at any particular node will also differ by the difference in frequency of their respective timing oscillators.

Therefore, it is a principal object of the present invention to provide a technique for comparing logic signals of systems of the same type wherein compensation is automatically provided for different timing frequencies of the two systems.

It is another object of the present invention to provide a technique for comparing logic signals of two systems of the same type that is extremely convenient and fast for an operator that is comparing two systems.

It is yet another object of the present invention to provide an improved technique for acquiring and displaying logic signals from several nodes of a single system with the use of less complex equipment and with a corresponding increase in operator convenience.

SUMMARY OF THE INVENTION

These and additional objects are accomplished by the present invention, wherein, briefly, according to one aspect thereof, a plurality of reference signals are recorded from a known good system to which other systems are to be compared such as in the final testing of newly assembled systems. One reference signal recorded is a periodic waveform that has a specific frequency ratio to the known good system common clock oscillator output. The remaining reference signals are taken at various nodes throughout the system.

A system under test is first examined by comparing the frequency of a periodic waveform derived from its clock oscillator output to that previously recorded for the known good system. Any difference in frequency is due to a difference in frequency of the systems' timing oscillators. Compensation is provided for this frequency difference by adjusting all of the reference signals to have a different frequency. Logic signals are then acquired from the system under test by touching a probe to the various nodes thereof. The signal acquired from each node of the system under test is displayed on a cathode ray tube immediately above or below the frequency adjusted signal obtained from the same node of the known good system. Visual comparison of the signals is then possible but "pass" and "fail" lights are also provided to let the operator know whether the signal at a particular node of the system under test corresponds to the reference signal for that node within a preset limit. Emphasis is also provided on the cathode ray tube display to show regions of disagreement between the two signals.

According to another aspect of the present invention, a plurality of signals from a plurality of nodes of a given system are acquired, stored and displayed all with the use of a single probe. This single probe logic analyzing technique has the advantage of eliminating a number of cumbersome probes which must be simultaneously attached to various nodes of a system with the use of existing equipment. As each signal is acquired and displayed, previously acquired and displayed signals are advanced on the cathode ray tube screen in order to make room for the most recently acquired signal. As the screen becomes filled, the oldest signals are discarded with the most recent group of signals being retained for observation.

Other objects, features and advantages of the present invention will become apparent from the following description of its preferred embodiments which should be taken in conjunction with the accompanying drawings.

BRIEF DESCRIPTION OF THE DRAWINGS

FIG. 1 illustrates electronic systems with which the methods and apparatus of the present invention are utilized;

FIG. 2 is a circuit diagram of a testing instrument according to the present invention;

FIGS. 3 and 3A illustrate the construction of a probe for use with the circuit of FIG. 2;

FIG. 4 shows timing signals at various points within the circuit of FIG. 2;

FIGS. 5, 6 and 7 are waveforms that illustrate the operation and use of the circuit of FIG. 2; and FIGS. 8–14 are flow diagrams of the controlling program for the microprocessor of the circuit of FIG. 2 for carrying out certain operations.

DESCRIPTION OF THE PREFERRED EMBODIMENTS

Referring to FIG. 1, the nature of the electronic circuits or systems which may be tested according to the various techniques of the present invention are described. A principal aspect of the present invention is the comparison of logic signals of a system under test "S.U.T." with a known good system "K.G.S.". Each of these systems is an electronic circuit of a similar type and it is desired to compare logic signals at various nodes therein. For example, the nodes N1 and M1 of the K.G.S. and S.U.T. systems, respectively, could be a conductor within the circuits that carries a clock signal which is derived from an internal oscillator. Other logic signals in synchronism with the clock signal are carried at the nodes N2, N3 and so on of K.G.S., and M2, M3 and so on of the S.U.T. The system under test S.U.T. will generally be a production system that must be thoroughly tested before it is shipped by the factory. One step of the testing is to compare the signals at various nodes with those signals at the same nodes of a known good system K.G.S. This is done in a preferred embodiment according to the present invention by an instrument of FIGS. 2 and 3.

Referring initially to FIG. 2, a signal to be analyzed is connected from a system node through a probe to an input terminal 11. This circuit is designed to receive and process binary signals. The signal at the terminal 11 is applied through a unity gain amplifier 13 to non-inverting inputs of comparator amplifiers 15, 17 and 19. The comparators 15 and 17 have a purpose in this embodiment of detecting voltage levels of signals. Referring to FIG. 4(A), a rectangular wave clock signal is shown to pass through in both an upward and a downwards direction to reference voltage levels REF1 and REF2. These reference voltage levels are applied to the inverting inputs of the comparators 15 and 17 through lines 21 and 23, respectively. Therefore, the comparator 15 has an output signal that changes level when the input signal crosses the reference voltage REF1. Similarly, the comparator 17 has an output which changes level as the signal level at its non-inverting input passes through the voltage reference REF2. The use of two comparators provides the advantages of hysteresis.

An inverted output of the comparator 15 and a non-inverted output of the comparator 17 are applied to a glitch detector circuit 25 which in response to a clock signal pulse in a line 31 emits a data pulse in the line 33. A representative clock pulse signal 31 is shown in FIG. 4(B). The output in the line 33 at each clock pulse is a digital "1" or "0", depending upon whether the input signal of FIG. 4(A) is above the reference voltage level REF1 or below the reference voltage level REF2. The comparators 15 and 17 and the glitch detector 25, therefore, serve as an analog-to-digital converter for binary signals.

The digitized signal bits in the line 33 are stored in a high speed memory 39 in serial fashion as they occur. The memory 39 may be, for instance, a 1024 bit memory. That means that when the memory 39 is being clocked the last 1024 bits to have occurred in the line 33 will be stored in the memory 39 at any given time. Periodically, some or all of these bits are transferred to a random access memory 41. The information in the memory 41 is then used by display electronics 43 to drive a cathode ray tube 45 to reconstruct the logic pattern of the signal applied to the input terminal 11. The cathode ray tube 45 has its beam deflected in accordance with vertical and horizontal scanning signals, respectively, in lines 47 and 49 according to the logic pattern to be reconstructed as a representation of that received at the data input terminal 11.

The glitch detector 25 of FIG. 1 contains logic elements in the form of AND gates 53 and 55, a set-reset flip-flop 57 and a D flip-flop 59. This particular circuit has a further advantage of emitting a bit signal in the line 33 at a particular clock pulse even though the corresponding analog signal does not at that instant exist at the terminal 11 but rather if a short "glitch" signal occurred prior to that instant but after the most recent previous clock signal. That is, pulses which occur in the signal in the input terminal 11 between the sampling times of the clock pulses. If the flip-flops 57 and 59 are not set and the inverting output of comparator 15 goes low, the flip-flop 57 is set. Conversely, if flip-flops 57 and 59 are both set and the non-inverting output of the comparator 17 goes low, the flip-flop 57 is reset.

As is typically being done in modern circuit design, a microprocessor board 67 is utilized in place of hard wired electronic components in order to provide flexibility and a reduced number of components with a resulting reduction in cost. The microprocessor board 67 contains a microprocessor and associated memory elements containing controlling programs. The microprocessor communicates with other circuit elements through a microprocessor bus 69. One of the functions accomplished by the microprocessor is to transfer a string of data bits from the high speed memory 39 to the random access memory 41. Similarly, the microprocessor sets display bits in the memory 41 which are read by the display electronic circuits 43 when it is desired to display on the cathode ray tube 45 a reconstruction of the binary signal inputted to the terminal 11. The memory 41 has the further capability of storing many such signals. A magnetic tape unit 68 is also connected to the microprocessor bus 69 to provide additional storage capacity. The tape unit 68 in this embodiment is a cartridge type.

Many other circuits are connected directly to the microprocessor bus 69. Front panel switches 71 are so connected and the programmed microprocessor periodically examines the state of these switches to see if an operator is calling for any particular function of the apparatus to be performed. A system clock oscillator 73 is operated from the bus 69 and also provides the microprocessor board 67 with a clock signal through a line 75. Decoding circuits 77 provide certain controlling signals to other circuit elements. Similarly, encoding circuits 79 convert at least one signal into an appropriate digital code for communication with the microprocessor over the bus 69. Front panel lights 72 are also controlled from the bus 69 and include a green "pass" light 74 and a red "fail" light 76, the function of which is described hereinafter.

A digital to analog converter 81 is also connected to the bus 69 and provides at an output line 83 analog voltage levels that are responsive to particular digital codes communicated to it by the microprocessor 67 on the bus 69. These voltages are applied to three different sample and hold circuits 85, 87 and 89. Outputs of the two sample and hold circuits 85 and 87 provide the reference voltages REF1 and REF2 in the lines 21 and 23, respectively, previously described. These voltages are utilized to establish the voltage reference levels for the analog to digital converting comparators 15 and 17.

The combination of the digital to analog converter 81 and the sample and hold circuits 85, 87 and 89 permits three simultaneous reference voltage levels to be established by the microprocessor, the two in the lines 21 and 23 and another in a line 97. All of this is with the use of a single digital to analog converter which is an expensive item and this arrangement, therefore, has the advantage of reducing the cost of the appartus.

When the microprocessor 67 wants to set a particular voltage on one of the lines 21, 23 or 97, it places a digital code for the voltage on the bus 69 and the digital to analog converter 81 generates that voltage in the line 83. The microprocessor then submits a signal in the bus 69 appropriate to be decoded by the circuit 77 to enable the appropriate sample and hold circuit 85, 87 or 89 so that this voltage in the line 83 will then appear at its output.

The circuit illustrated in FIG. 2 has a capability of being synchronized to an external trigger signal applied to a terminal 101, or to an internally generated trigger signal developed by the comparator 19 from the input signal. The external trigger is applied through a unity gain amplifier 103 to a non-inverting input of a comparator 105. The inverting inputs of both the internal trigger comparator 19 and the external trigger comparator 105 are connected to the line 97 which is the output of the third sample and hold circuit 89. The voltage set in the line 97, under microprocessor control as described previously, determines the threshold voltage for detecting when a trigger signal occurs.

Both the inverting of non-inverting outputs of the internal trigger comparator 19 and external trigger comparator 105 are applied to a trigger source and slope selecting circuit 107 which is controlled by signals through lines 109 from the decoding circuit 77. The circuit 107 selects either the external trigger or the internal trigger by connection to the appropriate comparator 105 or 19, respectively. It also selects whether an enable signal in the line 111 will be initiated on a positive going or negative going slope of either the external trigger pulse or the signal at the terminal 11, depending upon which is selected as the trigger source. The signal in the line 111 enables a trigger delay counter 113 to increment in response to a clock signal in the line 31. An overflow of the counter 113 is communicated through a line 115 as an "EOS" signal to both the high speed memory 39 and the encoding circuitry 79 for communication through the bus 69 to the microprocessor 67.

To explain the operation of the triggering circuit, an external trigger pulse is illustrated in FIG. 4(C). This is the signal that is applied to the terminal 101 of FIG. 2. Such a trigger signal is available in many types of circuits under test along with the signal of FIG. 4(A). Logic circuits will usually have a synchronizing trigger pulse, such as that shown in FIG. 4(C), which is in synchronism with the occurrences of the input signal at terminal 11. FIG. 4(D) is the "EOS" signal in the line 115 and is set in time a distance X from the trigger pulse through the delay of the counter 113. That delay is set upon command of the microprocessor through its bus 69 which is connected to the counter 113. The microprocessor presets the counter at a certain number so that when it is enabled with the pulse in the line 111 at the occurrence of a trigger pulse at the terminal 101, the counter will have a set number of clock pulses 31 to run before an overflow "EOS" level occurs in the line 115.

The high speed memory 39 is of a type which, when being clocked, stores the last 1024 bits of information given it through the line 33. The memory 39 responds to the "EOS" signal in the line 115 to freeze the data therein for a time. Once stopped, the memory 39 will receive no further information from the line 33 until those frozen bits of information are transferred from the memory 39 to the random access memory 41. In a particular embodiment, 1000 bits are so removed and utilized.

Referring principally to FIG. 3, a preferred hand-held probe 1 is illustrated for use with the circuit of FIG. 2. A conductor 2 at one end of the probe is placed on a circuit node whose signal is desired to be acquired and this signal is passed through conductors 3 to the terminal 11 of the circuit of FIG. 2. Two push button switches 4 and 5 are provided on the surface of the probe body. The probe body is generally circular in cross section. Red "fail" lights 6 and 8 are provided on opposite sides of the probe body. Similarly, green "pass" lights 7 and 9 are provided adjacent to the lights 6 and 8, respectively. As viewed in cross section of FIG. 3(A), it may be appreciated that the relative placement of the push button switches 4 and 5 and the various lights permit the lights to be clearly visible as a user wraps his or her hand around the probe to operate the switches 4 and 5 with the thumb or index finger. The provision of two sets of pass-fail lights on opposite sides of the probe assures that a set of lights is clearly visible for either right hand or left hand operation. The pass-fail lights also appear on the panel of the instrument in the form of previously mentioned lights 74 and 76 of FIG. 2 but their presence on the probe 1, along with the push button switches 4 and 5, make it very fast and convenient for an operator to check out the various nodes, one at a time, of a system under test. The pass-fail lights of the probe 1 of FIG. 3 are connected through the conductors 3 to terminals 12 of the circuit of FIG. 2. Similarly, the switches 4 and 5 are connected through the conductors 3 to terminals 14 of the electronic circuit.

PROGRAM AND AUTO-SCOPE OPERATION MODE

The operation of the instrument previously described will now be outlined for comparing various nodes of a system under test with reference signals of a known good system. An engineer or technician first uses the probe of FIG. 3 to record onto magnetic tape contained in the magnetic tape unit 68 of FIG. 2 a clock trace and various logic signals at desired nodes of a known good system. At the same time, certain parameters including a pass-fail criteria, specified by the engineer or technician is recorded onto tape. Such a tape can then be read over and over again by any number of people on a similar instrument at test, repair or field locations to test other systems by comparing their clock and logic signals to those recorded from a known good system. The nodes of the system under test are thus passed or failed based on that comparison.

The operation of the instrument to acquire any signal is accomplished by the operator placing the conductor 2 of the probe 1 on a circuit node and then depressing the "ARM" switch 4 on the probe 1. Operation of the switch 4 causes, through the microprocessor 67, a signal in the line 110 which allows line 111 to enable the counter 113. When EOS goes high, the previous 1000 bits or so of information digitized from the signal at the node being examined are frozen in the memory 39 temporarily and are used to form a display on the CRT 45 and may be recorded on the magnetic tape unit 68.

In examining a system under test, the technician first connects the external trigger probe to the proper node and then places the conductor 2 of the probe 1 on a node carrying a clock signal that is related in frequency to a local driving clock oscillator. When the arm button 4 is depressed, that signal 201 is shown in FIG. 5 immediately above a reference trace 203. The trace 203 is read from magnetic tape into the memory 41. It will be noted that the traces of FIG. 5 are of a different frequency so the first step is to adjust all of the reference traces called from magnetic tape by a ratio of the frequencies of the clock signals 201 and 203. The differences in frequency are due to different clock oscillator frequencies. The frequency difference must somehow be eliminated as a factor before the operator can go on through other nodes of the circuit to compare logic traces with the recorded references traces.

In order to accomplish this compensation, the operator presses an appropriate button on the front panel which causes the microprocessor 67 to calculate the frequency proportionality factor. Software flow diagrams showing the algorithm for calculating this ratio are given as FIGS. 8 and 9. The detailed computer coding therefore is given in the Appendix. The Appendix is a complete code for an instrument embodying the techniques of the present invention as well as other features. The algorithm for calculating this frequency ratio is given at pages 15D1 and 15D2 of the code in the Appendix. Briefly, the system calculates a number of sample clock pulses per period for each of the waveforms 201 and 203 and then takes a ratio of them in order to obtain the frequency proportionality factor. This is done on the raw 1000 or so bits of data that comes from the high speed memory 39.

Not all of the 1000 bits are displayed on the cathode ray tube for each trace. The microprocessor 67 developes 200 display bits from the 1000 acquired and it is these 200 which form the traces on the cathode ray tube. The software algorithm for this is given in the flow chart of FIG. 10 and in the portion of the computer code of the Appendix at page 18L2. It is in the reduction of the 1000 bits of information for the reference signals stored on the magnetic tape into 200 display bits that the adjustment for the frequency difference between it and the system under test is taken care of. Once the operator pushes the button to determining the ratio of the frequencies of the two systems, the reference clock signal display 203 of FIG. 5 expands to one that looks identical to the clock trace 201. All of the known good system reference traces subsequently read from magnetic tape will be displayed in this frequency adjusted mode. The operator can now step through the various nodes of the system under test.

The operator then presses the advance button 5 of the probe 1 which causes the signal trace 201 to move up one line and for a new reference trace 205 to appear at the bottom of the cathode ray tube display. The trace 205 is what the operator should see when a signal is acquired from the same node of the system under test. The operator then places the probe contact 2 on that node and presses the arm switch 4 which causes the trace 207 to appear immediately above the reference trace 205. They are then in relative positions for easy comparison.

In order to make the comparison of a logic signal with a reference logic signal even easier, an error trace is placed inbetween them, such as the error trace 209 of FIG. 5 and the error trace 211 of FIG. 6. This trace, in the form of a broken line, appears at any sampling point of the logic traces where their digital state does not agree, as shown in the figures. This trace is preferably made to be flashing to call attention to the areas of disagreement between the two logic traces. Alternatively, the traces themselves could be varied in intensity or color to emphasize the regions of disagreement.

The computer operation for generating the error traces 209 and 211 are illustrated in the software flow chart of FIGS. 11 and 12. The specific program pages of the Appendix are pages 15D3, 15F, 15G and 15H. The program constructions on page 15G serve an additional function to calculate two numbers for each comparison which are then utilized by additional software steps illustrated on page 15C to set the pass-fail lights 6–9, 74 and 76. The two numbers so calculated are the number of consecutive sample periods where the two traces disagree and the total number of sample periods where they disagree. The software on page 15C will light the fail lights 6, 8 and 76 whenever the total number of sample periods of disagreement exceeds a certain percentage of the samples, being 30% in this particular example. The fail lights will also be caused to light if the total number of consecutive sample periods of disagreement exceeds a number of periods that has been recorded on the magnetic tape as an allowable maximum disagreement by the engineer or technician when the known good system signals were recorded. Otherwise, the pass lights 7, 9 and 74 are caused to light at a comparison of a logic signal with a reference signal.

As the operator goes through each node of the system under test, her or she needs to look only at the probe 1 itself since the pass-fail lights and controlling switches exist there as well. So long as the logic signals "pass" the operator need not even look at the cathode ray tube 45. But when the operator notes a failure of the signal at a particular node, the instrument can then be used to acquire more information as to the nature of the failure and to otherwise troubleshoot the system. The logic signals required from the system under test remain displayed in a stack relationship on the cathode ray tube 45, as partially illustrated in FIG. 6. Therefore, the last several logic signals, within the capacity of the cathode ray tube 45, remain displayed for future reference by the operator if desired. Normally, only a single reference trace appears on the cathode ray tube 45 at the bottom of the display.

SCOPE MODE OPERATION OF THE INSTRUMENT

In this somewhat different operation of the instrument described with respect to FIGS. 2–4, it is utilized as a single channel logic analyzer. Referring to FIG. 7, logic signal S1 is first displayed on the cathode ray tube 45 at the bottom. This is displayed when the conductive tip 2 of the probe 1 is placed on a particular circuit node and the arm button 4 of the probe pushed by the operator, as previously described.

The operator then presses the advance button 5 on the probe 1 and the first trace S1 advances upward on line. A second trace S2 is acquired by then placing the probe tip 2 on a second node and the arm button 4 momentarily depressed. The display of two signals is shown in part (B) of FIG. 7. The operator performs similar operations to acquire signals at additional nodes until the entire face of the cathode ray tube is filled. If additional signals are desired to be displayed, the oldest ones are rolled off the screen and lost with the maximum number of most recent logic signals being displayed according to the capacity of the cathode ray tube. The signals may all be acquired relative to a common trigger signal connected to the terminal 101. The operation of the microprocessor 67 is controlled in this mode in accordance with the software flow diagrams of FIGS. 13 and 14 which represent pages 14A and 12F, respectively, of the attached program code Appendix. The portions of FIG. 13 which have been cross-hatched are not utilized in this operating mode.

Although the various aspects of the present invention have been described with respect to preferred embodiments thereof, it will be understood that the invention is entitled to protection within the full scope of the appended claims.

```
00001                    NAM     FOA
00002                    OPT     REL,CREF,LLEN=80
00003                    TTL     DTO EQUATES
00004                    IDNT    FEB. 21, 1978

00006            ****************************************************
00007            ****************************************************
00008            **                                                **
00009            **  BIOMATION 1100-D DIGITAL TESTING OSCILLOSCOPE **
00010            **                                                **
00011            ** PROGRAM COMPLETED 1977                         **
00012            **    BY WILLIAM SHOEMAKER (FLOW DIAGRAMS)        **
00013            **       FRED DELVEY, AND                         **
00014            **       ROBERT A. MICHAEL (M6800 CODE)           **
00015            **                                                **
00016            ****************************************************
00017            ****************************************************

00019                    XDEF    BATDA, BA9S, BADS, BADD, BATT, BAAD
00020                    XDEF    PBAADL, PBAADM, BATTMS, BATTLS
00021                    XDEF    FEAD0, FEAD8
00022                    XDEF    SR1, SR2, SR3, SR4, LR1, LR2, LRMS, ROMEND, ROM0, ST
00023                    XDEF    TWRITE, RESET, RUN, STOP
00024                    XDEF    SETRW, CLRRW, SETFR, CLRFR
00025                    XDEF    TREAD, TSTAT
00026                    XDEF    PASS, FAIL, TES, TEC
00027                    XDEF    AT, TSLP, TSLN
00028                    XDEF    ATS, FAS, TE, FEOS, NEGRES, LFROG, K1
00029                    XDEF    TDF, P, M, ASBF, ASBT, NX, FTT
00030                    XDEF    XDAC1, XDAC2, XDAC3, XDAC4, XDAC5
00031                    XDEF    XDAC6, XDAC7, XDAC8, XDAC9, XDAC11
00032                    XDEF    OXDAC
00033                    XDEF    UNBL1, UNBL2, UNBL3, UNBL4, UNBL5
00034                    XDEF    UNBL6, UNBL7, UNBL8, UNBL9, UNBL11
00035                    XDEF    OUNBL
00036                    XDEF    BL1, BL2, BL3, BL4, BL5
00037                    XDEF    BL6, BL7, BL8, BL9, BL11
00038                    XDEF    OBL
00039                    XDEF    BLSP1, BLSP2, BLSP3, BLSP4, BLSP5
00040                    XDEF    BLSP6, BLSP7, BLSP8, BLSP9, BLSP11
00041                    XDEF    OBLSP
00042                    XDEF    BWDD1, BWDD2, BWDD3, BWDD4, BWDD5
00043                    XDEF    BWDD6, BWDD7, BWDD8, BWDD9
00044                    XDEF    OBWDD
00045                    XDEF    BWAD
00046                    XDEF    DW1, DW2, DW3, DW4, DW5
00047                    XDEF    DW6, DW7, DW8, MDW
00048                    XDEF    JL1OFS, JL2OFS, JL3OFS, JL4OFS, JL5OFS
00049                    XDEF    JL6OFS, JL7OFS, JL8OFS, JL9OFS, JLAOFS
00050                    XDEF    CONF, FIRG, FTOK, TERR, REW, NCF
00051                    XDEF    READY, WBEMP, IRG, INCCHR, BOT, RBFULL
00052                    XDEF    AUX, GENPLY
00053                    XDEF    CAR, NEWAL, PFF, POL, REDO

00055            *
00056            * FRONT END ADDRESSES
00057            *
00058            * NOTE:  FEAD1-FEAD7 ARE ADDRESSED AS OFFSETS
00059            *        TO FEAD0, AND FEAD9-FEAD15 ARE ADDRESSED AS
00060            *        OFFSETS TO FEAD8.
00061            *
00062            *        EG:  STA A FEAD0+2 (FEAD2) _ A
00063            *             LDA A FEAD8+4 A _ (FEAD12)
00064            *
00065    6000  A FEAD0    EQU     $6000      FRONT END BASE ADDRESS
00066    6000  A FEAD8    EQU     FEAD0
```

```
00068                   *
00069                   * FRONT PANEL (SWITCHES AND LEDS) ADDRESSES
00070                   *
00071      4000   A SR1    EQU   $4000      SWITCH REGISTER 1
00072      4001   A SR2    EQU   $4001      SWITCH REGISTER 2
00073      4002   A SR3    EQU   $4002      SWITCH REGISTER 3
00074      4003   A SR4    EQU   $4003      SWITCH REGISTER 4

00076      4001   A LR1    EQU   $4001      LED REGISTER 1
00077      4002   A LR2    EQU   $4002      LED REGISTER 2

00079                   *
00080                   * TAPE WRITE ADDRESSES
00081                   *
00082      C000   A TWRITE EQU   $C000      WRITE BUFFER
00083      C001   A RESET  EQU   $C001      RESET
00084      C002   A RUN    EQU   $C002      INITIATE TAPE MOTION
00085      C003   A STOP   EQU   $C003      HALT TAPE
00086      C004   A SETRW  EQU   $C004      SET TO READ FROM TAPE
00087      C005   A CLRRW  EQU   $C005      SET TO WRITE TO TAPE
00088      C006   A SETFR  EQU   $C006      SET FOR FORWARD MOTION
00089      C007   A CLRFR  EQU   $C007      SET FOR REVERSE MOTION

00091                   *
00092                   * TAPE READ ADDRESSES
00093                   *
00094      C001   A TREAD  EQU   $C001      TAPE READ BUFFER
00095      C002   A TSTAT  EQU   $C002      TAPE STATUS REGISTER

00097                   *
00098                   * BITS IN TSTAT
00099                   *
00100      0004   A READY  EQU   4
00101      0008   A WBEMP  EQU   8
00102      0010   A IRG    EQU   16
00103      0020   A INCCHR EQU   32
00104      0040   A BOT    EQU   64
00105      0080   A RBFULL EQU   128
00107                   *
00108                   * LED BITS - LR1
00109                   *
00110      0001   A PASS   EQU   1
00111      0002   A FAIL   EQU   2
00112      0004   A TES    EQU   4          TRIGGER ENABLE SINGLE
00113      0008   A TEC    EQU   8          TRIGGER ENABLE CONTINUOUS
00114             *        EQU   16         NOT USED
00115      0020   A AT     EQU   32         ANALOG TRACE
00116      0040   A TSLP   EQU   64         TRIGGER SLOPE POSITIVE (= K6)
00117      0080   A TSLN   EQU   128        TRIGGER SLOPE NEGATIVE (= 1-K6)

00119                   *
00120                   * ROM ADDRESS DEFINITIONS FOR DIAGNOSTIC POWER
00121                   *   UP ROUTINES.
00122                   *
00123      B800   A STLROM EQU   $B800      START OF LAST ROM
00124      00B8   A LRMS   EQU   STLROM/256 MSB OF LAST ROM ADDRESS
00125      8000   A ROM0   EQU   $8000      ADDRESS OF FIRST ROM
00126      C000   A ROMEND EQU   $C000      FIRST ADDRESS AFTER LAST ROM
00128                   *
00129                   * FLAG BITS - FR1
00130                   *
00131      0001   A ATS    EQU   1          ANALOG TRACE, STORED
00132      0002   A FAS    EQU   2          FREQUENCY ALIGN, STORED
00133      0004   A TE     EQU   4          TRIGGER ENABLE
00134             *        EQU   8          NOT USED
00135      0010   A FEOS   EQU   16         END OF SAMPLING
00136      0020   A NEGRES EQU   32         NEGATIVE RESULT (MATH ONLY)
00137      0040   A LFROG  EQU   64         LEAP FROG (ASK BILL!)
00138      0080   A K1     EQU   128
00139                   *
```

```
00140                   * FLAG BITS - FR2
00141                   *
00142         0001  A TDF    EQU    1           TIME DELAY FLAG
00143         0002  A P      EQU    2
00144         0004  A M      EQU    4
00145         0008  A ASBF   EQU    8
00146         0010  A ASBT   EQU    16
00147         0020  A NX     EQU    32
00148         0040  A FTT    EQU    64          FIRST TIME THROUGH
00149         0080  A NCF    EQU    128         NO CHANGE FLAG
00150                   *
00151                   * FLAG BITS - FR3
00152                   *
00153         0001  A FIRG   EQU    1           FLAG - INTER RECORD GAP
00154         0002  A FTOK   EQU    2           FIRST TIME OK
00155         0004  A CONF   EQU    4           CONTINUE FLAG
00156               *         EQU    8          NOT USED
00157         0010  A TERR   EQU    16          TAPE ERROR
00158               *         EQU    32         NOT USED
00159         0040  A REW    EQU    64          REWINDING TAPE
00160               *         EQU    128        NOT USED
00161                   *
00162                   * FLAG BITS - FR4
00163                   *
00164         0001  A CAR    EQU    1           AUTOSCOPE - CARRY
00165         0002  A NEWAL  EQU    2           AUTOSCOPE - NEW ALIGN
00166         0004  A PFF    EQU    4           AUTOSCOPE - PASS/FAIL
00167         0008  A POL    EQU    8           AUTOSCOPE - POLARITY
00168         0010  A REDO   EQU    16          AUTOSCOPE - RE-DO
00169         0020  A AUX    EQU    32          XCRIBE - AUX RAM AVAILABLE
00171                   *
00172                   * DTO CONSTANTS
00173                   *
00174         0200  A BATDA  EQU    $200        BEG ADDR, TRACE ATTRIBUTES
00175         0278  A BATT   EQU    $278        TEMP. ANALOG STORAGE
00176         0002  A BATTMS EQU    BATT/256
00177         0078  A BATTLS EQU    BATT-(BATT/256)*256
00178         0608  A BAAD   EQU    $608        ANALOG DISPLAY (200*39/8)
00179         0005  A PBAADM EQU    (BAAD-25)/256
00180         00EF  A PBAADL EQU    (BAAD-25)-((BAAD-25)/256)*256
00181         09D8  A BADS   EQU    $9D8        DIGITAL STORAGE, TRACES 1-8
00182         0E40  A BA9S   EQU    $E40        DIGITAL STORAGE, TRACE 9
00183         0EC0  A BADD   EQU    $EC0        DIGITAL DISPLAY (10*32)

00185                   *
00186                   * TRACE DISPLAY ATTRIBUTES VARIABLE LOCATIONS
00187                   *
00188         0200  A XDAC1  EQU    BATDA       XDAC MULTIPLIERS
00189         0205  A XDAC2  EQU    BATDA+5
00190         020A  A XDAC3  EQU    BATDA+10
00191         020F  A XDAC4  EQU    BATDA+15
00192         0214  A XDAC5  EQU    BATDA+20
00193         0219  A XDAC6  EQU    BATDA+25
00194         021E  A XDAC7  EQU    BATDA+30
00195         0228  A XDAC8  EQU    BATDA+40
00196         0223  A XDAC9  EQU    BATDA+35
00197         022D  A XDAC11 EQU    BATDA+45

00199         0000  A OXDAC  EQU    0           XDAC OFFSET 00201         0201  A UNBL1  EQU    BATDA+1     UNBLANKING TIMES
00202         0206  A UNBL2  EQU    BATDA+6
00203         020B  A UNBL3  EQU    BATDA+11
00204         0210  A UNBL4  EQU    BATDA+16
00205         0215  A UNBL5  EQU    BATDA+21
00206         021A  A UNBL6  EQU    BATDA+26
00207         021F  A UNBL7  EQU    BATDA+31
00208         0229  A UNBL8  EQU    BATDA+41
00209         0224  A UNBL9  EQU    BATDA+36
00210         022E  A UNBL11 EQU    BATDA+46

00212         0001  A OUNBL  EQU    UNBL1-XDAC1 UNBL OFFSET
```

```
00214        0202  A BL1    EQU    BATDA+2   BLANKING TIMES
00215        0207  A BL2    EQU    BATDA+7
00216        020C  A BL3    EQU    BATDA+12
00217        0211  A BL4    EQU    BATDA+17
00218        0216  A BL5    EQU    BATDA+22
00219        021B  A BL6    EQU    BATDA+27
00220        0220  A BL7    EQU    BATDA+32
00221        022A  A BL8    EQU    BATDA+42
00222        0225  A BL9    EQU    BATDA+37
00223        022F  A BL11   EQU    BATDA+47

00225        0002  A OBL    EQU    BL1-XDAC1 BL OFFSET
00227        0203  A BLSP1  EQU    BATDA+3   BIT LOCATIONS AND
00228        0208  A BLSP2  EQU    BATDA+8   ... START PAGES
00229        020D  A BLSP3  EQU    BATDA+13
00230        0212  A BLSP4  EQU    BATDA+18
00231        0217  A BLSP5  EQU    BATDA+23
00232        021C  A BLSP6  EQU    BATDA+28
00233        0221  A BLSP7  EQU    BATDA+33
00234        022B  A BLSP8  EQU    BATDA+43
00235        0226  A BLSP9  EQU    BATDA+38
00236        0230  A BLSP11 EQU    BATDA+48

00238        0003  A OBLSP  EQU    BLSP1-XDAC1 BLSP OFFSET 00240        0204  A BWDD1  EQU    BATDA+4   BEGINNING WORDS,
00241        0209  A BWDD2  EQU    BATDA+9   ... DIGITAL DISPLAY
00242        020E  A BWDD3  EQU    BATDA+14
00243        0213  A BWDD4  EQU    BATDA+19
00244        0218  A BWDD5  EQU    BATDA+24
00245        021D  A BWDD6  EQU    BATDA+29
00246        0222  A BWDD7  EQU    BATDA+34
00247        022C  A BWDD8  EQU    BATDA+44
00248        0227  A BWDD9  EQU    BATDA+39

00250        0004  A OBWDD  EQU    BWDD1-XDAC1 BWDD OFFSET 00252        0231  A BWAD   EQU    BATDA+49 BEG WORD, ANALOG DISPLAY 00254        0232  A DW1    EQU    BATDA+50 DISPLAY WORDS
00255        0236  A DW2    EQU    4+DW1
00256        023A  A DW3    EQU    2*4+DW1
00257        023E  A DW4    EQU    3*4+DW1
00258        0242  A DW5    EQU    4*4+DW1
00259        0246  A DW6    EQU    5*4+DW1
00260        024A  A DW7    EQU    6*4+DW1
00261        024E  A DW8    EQU    7*4+DW1
00262        024E  A MDW    EQU    DW8
00263             *
00264             * OFFSETS FOR DIGITAL STORED ATTRIBUTES LOCATIONS
00265             *
00266             * FOR EXAMPLE, J(3,5) WOULD BE ADDRESSED AS FOLLOWS:
00267             *
00268             *
00269             *          LDX     BADS3      POINT TO TRACE 3 DATA
00270             *          LDA A   JL5OFS,X   GET 1ST BYTE OF J(3,5)
00271             *
00272        007D  A JL1OFS EQU    125         TRACE DESCRIPTION CHARACTER
00273        007E  A JL2OFS EQU    126         RECORD NUMBER (INT8)
00274        007F  A JL3OFS EQU    127         DATA THRESHOLD (INT15*10)
00275        0081  A JL4OFS EQU    129         DATA SEC/DIV (PV2)
00276        0083  A JL5OFS EQU    131         TRIGGER POSITION (INT15*10)
00277        0085  A JL6OFS EQU    133         TRIG SLOPE (#K6=>POS, 0=>NEG)
00278        0086  A JL7OFS EQU    134         TRIG THRESHOLD (INT15*10)
00279        0088  A JL8OFS EQU    136         TRIGGER SOURCE (INT8)
00280        0089  A JL9OFS EQU    137         AUTO COMPARE (INT8*10)
00281        008A  A JLAOFS EQU    138         SAMPLE FREQUENCY (PV2)

00283             * SEE NOTE ON CRC GENERATION ON FLOW PAGE 4H 00285        0085  A GENPLY EQU    $85
00287                       END
TOTAL ERRORS 00000
```

```
D  0003 ASBF    00029 00145*
D  0010 ASBT    00029 00146*
D  0020 AT      00027 00115*
D  0001 ATS     00028 00131*
D  0020 AUX     00052 00169*
D  0E40 BA9S    00019 00182*
D  0608 BAAD    00019 00178*00179 00180 00180
D  0EC0 BADD    00019 00183*
D  09D8 BADS    00019 00181*
D  0200 BATDA   00019 00174*00188 00189 00190 00191 00192 00193 00194 00195
                      00196 00197 00201 00202 00203 00204 00205 00206 00207 00208
                      00209 00210 00214 00215 00216 00217 00218 00219 00220 00221
                      00222 00223 00227 00228 00229 00230 00231 00232 00233 00234
                      00235 00236 00240 00241 00242 00243 00244 00245 00246 00247
                      00248 00252 00254
D  0278 BATT    00019 00175*00176 00177 00177
D  0078 BATTLS  00020 00177*
D  0002 BATTMS  00020 00176*
D  0202 BL1     00036 00214*00225
D  022F BL11    00037 00223*
D  0207 BL2     00036 00215*
D  020C BL3     00036 00216*
D  0211 BL4     00036 00217*
D  0216 BL5     00036 00218*
D  021B BL6     00037 00219*
D  0220 BL7     00037 00220*
D  022A BL8     00037 00221*
D  0225 BL9     00037 00222*
D  0203 BLSP1   00039 00227*00238
D  0230 BLSP11  00040 00236*
D  0208 BLSP2   00039 00228*
D  020D BLSP3   00039 00229*
D  0212 BLSP4   00039 00230*
D  0217 BLSP5   00039 00231*
D  021C BLSP6   00040 00232*
D  0221 BLSP7   00040 00233*
D  022B BLSP8   00040 00234*
D  0226 BLSP9   00040 00235*
D  0040 BOT     00051 00104*
D  0231 BWAD    00045 00252*
D  0204 BWDD1   00042 00240*00250
D  0209 BWDD2   00042 00241*
D  020E BWDD3   00042 00242*
D  0213 BWDD4   00042 00243*
D  0218 BWDD5   00042 00244*
D  021D BWDD6   00043 00245*
D  0222 BWDD7   00043 00246*
D  022C BWDD8   00043 00247*
D  0227 BWDD9   00043 00248*
D  0001 CAR     00053 00164*
D  C007 CLRFR   00024 00089*
D  C005 CLRRW   00024 00087*
D  0004 CONF    00050 00155*
D  0232 DW1     00046 00254*00255 00256 00257 00258 00259 00260 00261
D  0236 DW2     00046 00255*
D  023A DW3     00046 00256*
D  023E DW4     00046 00257*
D  0242 DW5     00046 00258*
D  0246 DW6     00047 00259*
D  024A DW7     00047 00260*
D  024E DW8     00047 00261*00262
D  0002 FAIL    00026 00111*
D  0002 FAS     00028 00132*
D  6000 FEAD0   00021 00065*00066
D  6000 FEAD8   00021 00066*
D  0010 FEOS    00028 00135*
D  0001 FIRG    00050 00153*
D  0002 FTOK    00050 00154*
D  0040 FTT     00029 00148*
D  0085 GENPLY  00052 00285*
D  0020 INCCHR  00051 00103*
D  0010 IRG     00051 00102*
D  007D JL1OFS  00048 00272*
D  007E JL2OFS  00048 00273*
```

```
D   007F  JL3OFS  00048 00274*
D   0081  JL4OFS  00048 00275*
D   0083  JL5OFS  00048 00276*
D   0085  JL6OFS  00049 00277*
D   0086  JL7OFS  00049 00278*
D   0088  JL8OFS  00049 00279*
D   0089  JL9OFS  00049 00280*
D   008A  JLAOFS  00049 00281*
D   0080  K1      00028 00138*
D   0040  LFROG   00028 00137*
D   4001  LR1     00022 00076*
D   4002  LR2     00022 00077*
D   00B8  LRMS    00022 00124*
D   0004  M       00029 00144*
D   024E  MDW     00047 00262*
D   0080  NCF     00050 00149*
D   0020  NEGRES  00028 00136*
D   0002  NEWAL   00053 00165*
D   0020  NX      00029 00147*
D   0002  OBL     00038 00225*
D   0003  OBLSP   00041 00238*
D   0004  OBWDD   00044 00250*
D   0001  OUNBL   00035 00212*
D   0000  OXDAC   00032 00199*
D   0002  P       00029 00143*
D   0001  PASS    00026 00110*
D   00EF  PBAADL  00020 00180*
D   0005  PBAADM  00020 00179*
D   0004  PFF     00053 00166*
D   0008  POL     00053 00167*
D   0080  RBFULL  00051 00105*
D   0004  READY   00051 00100*
D   0010  REDO    00053 00168*
D   C001  RESET   00023 00083*
D   0040  REW     00050 00159*
D   8000  ROM0    00022 00125*
D   C000  ROMEND  00022 00126*
D   C002  RUN     00023 00084*
D   C006  SETFR   00024 00088*
D   C004  SETRW   00024 00086*
D   4000  SR1     00022 00071*
D   4001  SR2     00022 00072*
D   4002  SR3     00022 00073*
D   4003  SR4     00022 00074*
D   B800  STLROM  00022 00123*00124
D   C003  STOP    00023 00085*
D   0001  TDF     00029 00142*
D   0004  TE      00028 00133*
D   0008  TEC     00026 00113*
D   0010  TERR    00050 00157*
D   0004  TES     00026 00112*
D   C001  TREAD   00025 00094*
D   0080  TSLN    00027 00117*
D   0040  TSLP    00027 00116*
D   C002  TSTAT   00025 00095*
D   C000  TWRITE  00023 00082*
D   0201  UNBL1   00033 00201*00212
D   022E  UNBL11  00034 00210*
D   0206  UNBL2   00033 00202*
D   020B  UNBL3   00033 00203*
D   0210  UNBL4   00033 00204*
D   0215  UNBL5   00033 00205*
D   021A  UNBL6   00034 00206*
D   021F  UNBL7   00034 00207*
D   0229  UNBL8   00034 00208*
D   0224  UNBL9   00034 00209*
D   0008  WBEMP   00051 00101*
D   0200  XDAC1   00030 00188*00212 00225 00238 00250
D   022D  XDAC11  00031 00197*
D   0205  XDAC2   00030 00189*
D   020A  XDAC3   00030 00190*
D   020F  XDAC4   00030 00191*
D   0214  XDAC5   00030 00192*
D   0219  XDAC6   00031 00193*
```

```
00067B 0055    0002  A BLT    RMB   2     INT15
00068B 0057    0001  A BP     RMB   1     INT8
00069B 0058    0001  A CF     RMB   1     INT7
00070B 0059    0002  A CF1    RMB   2     INT15
00071B 005B    0001  A CF2    RMB   1     INT7
00072B 005C    0002  A CM     RMB   2     INT15
00073B 005E    0002  A CMC    RMB   2     INT15
00074B 0060    0001  A CRC    RMB   1     CYCLIC REDUNDANCY CHECK CHARACTER
00075B 0061    0001  A D      RMB   1     INT8
00076B 0062    0001  A DCOMP  RMB   1     INT8
00077B 0063    0001  A DIW    RMB   1     INT8
00078B 0064    0002  A FALB7  RMB   2     INT15
00079B 0066    0002  A FALB8  RMB   2     INT15
00080B 0068    0001  A FDB    RMB   1     INT8
00081B 0069    0001  A FEW01  RMB   1     FRONT END WRITE ADDRESS
00082B 006A    0001  A FEW02  RMB   1     "
00083B 006B    0001  A FEW03  RMB   1     "
00084B 006C    0001  A FEW11  RMB   1     "
00085B 006D    0001  A FEW12  RMB   1     "
00086B 006E    0001  A FEW13  RMB   1     "
00087B 006F    0001  A FEW2   RMB   1     "
00088B 0070    0001  A FEW4   RMB   1     "
00089B 0071    0001  A BX     RMB   1     INT8
00090B 0072    0001  A FF     RMB   1     INT8
00091B 0073    0001  A FM4    RMB   1     INT8
00092B 0074    0002  A FNTB   RMB   2     INT15
00093B 0076    0002  A FPTB   RMB   2     INT15
00094B 0078    0002  A FSB    RMB   2     INT15
00095B 007A    0001  A FSBRF  RMB   1     INT7
00096B 007B    0001  A H      RMB   1     INT8
00097B 007C    0001  A K2     RMB   1     INT8
00098B 007D    0002  A K3     RMB   2     INT15 * 10
00099B 007F    0002  A K4     RMB   2     PV2
00100B 0081    0002  A K4S    RMB   2     PV2
00101B 0083    0002  A K5     RMB   2     INT15 * 10
00102B 0085    0002  A K5S    RMB   2     INT15 * 10
00103B 0087    0002  A K5T    RMB   2     INT15 * 10
00104B 0089    0001  A K6     RMB   1     TRIGGER SLOPE - INT8
00105B 008A    0002  A K7     RMB   2     INT15 * 10
00106B 008C    0001  A K8     RMB   1     INT8
00107B 008D    0002  A K15    RMB   2     PV2
00108B 008F    0002  A K16    RMB   2     INT15
00109B 0091    0001  A L1     RMB   1     INT8
00110B 0092    0001  A L2     RMB   1     "
00111B 0093    0002  A LALB7  RMB   2     INT15
00112B 0095    0001  A LD     RMB   1     INT8
00113B 0096    0001  A LI     RMB   1     INT8
00114B 0097    0002  A LNTB   RMB   2     INT15
00115B 0099    0002  A LPTB   RMB   2     INT15
00116B 009B    0001  A M1     RMB   1     MODE NUMBER
00117B 009C    0001  A M2     RMB   1     "
00118B 009D    0001  A M3     RMB   1     "
00119B 009E    0002  A MISAL  RMB   2     INT15
00120B 00A0    0001  A MTR1   RMB   1     INT8
00121B 00A1    0001  A MTR2   RMB   1     INT8
00122B 00A2    0001  A N      RMB   1     INT8
00123B 00A3    0002  A NAD    RMB   2     ADDRESS
00124B 00A5    0001  A NNTR   RMB   1     INT8
00125B 00A6    0001  A NPTR   RMB   1     INT8
00126B 00A7    0001  A NRN    RMB   1     NEXT RECORD NUMBER (INT8)
00127B 00A8    0001  A PK2    RMB   1     INT8
00128B 00A9    0001  A Q      RMB   1     INT8
00129B 00AA    0001  A R      RMB   1     INT8
00130B 00AB    0001  A SH     RMB   1     INT7
00131B 00AC    0001  A SKIP   RMB   1     INT8
00132B 00AD    0002  A TAD    RMB   2     ADDRESS
00133B 00AF    0002  A TDC    RMB   2     TRIGGER DELAY COUNTDOWN
00134B 00B1    0002  A TAAC   RMB   2     TRIGGER ARM ADDRESS COUNT
00135B 00B3    0002  A TSAA   RMB   2     TRIGGER SOURCE AUTO ADDRESS
00136B 00B5    0001  A T1     RMB   1     INT8
00137B 00B6    0001  A T2     RMB   1     INT8
00138B 00B7    0001  A T3     RMB   1     INT8
00139B 00B8    0001  A T4     RMB   1     INT8
00140B 00B9    0002  A T5     RMB   2     INT15
```

```
D  021E XDAC7    00031 00194*
D  0220 XDAC8    00031 00195*
D  0223 XDAC9    00031 00196*

00001                              NAM     F0B
00002                              OPT     REL, CREF, LLEN=80
00003                              TTL     VARIABLES ON BASE PAGE
00004                              IDNT    FEB.  14, 1978

00006                      * EXTERNAL DEFINITIONS FOR VARIABLES ON BASE PAGE

00008                              XDEF    ALAD, ALBL, ALFA, BADS1, BADS2, BADS3, BADS4
00009                              XDEF    BADS5, BADS6, BADS7, BADS8, BADS9
00010                              XDEF    AA, A14N, A2, A3, AD, ADB, ADBB
00011                              XDEF    ADS1, ADS2, ADS3, AW
00012                              XDEF    BB, BITL, BITNO, BL, BLR, BLS, BLT, BP, BX
00013                              XDEF    CF, CF1, CF2, CM, CMC, CRC, D, DCOMP
00014                              XDEF    FALB7, FALB8, FDB, FNTB, FPTB, FSB, FSBRF
00015                              XDEF    FEW01, FEW02, FEW03, FEW11, FEW12, FEW13
00016                              XDEF    FEW2, FEW4, FF, FM4, H
00017                              XDEF    K2, K3, K4, K4S, K5, K5S, K5T, K6, K7, K8
00018                              XDEF    K15, K16
00019                              XDEF    LALB7, LNTB, LPTB, MISAL, MTR1, MTR2, NNTR, NPTR
00020                              XDEF    L1, L2, LD, LI, M1, M2, M3, N, NAD, NRN, PK2, Q, R, SH
00021                              XDEF    TAD, TDC, TAAC, TPR, TSAA, T1, T2, T3, T4, T5
00022                              XDEF    T7BL, VOS1, VOS2, W1, W2, W7, W8
00023                              XDEF    TVAR1, TMPIDX, SCRTCH
00024                              XDEF    PSTK, PSTKTP
00025                              XDEF    LITE1, LITE2, FR1, FR2
00026                              XDEF    TEMP, TEMP2, TEMP3, TEMP4, TEMP5
00027                              XDEF    STAD, FR3, FR4, AFXRF, DIW
00028                              XDEF    X2, X3, XM
00029                              XDEF    SKIP, TPL, TSK 00031B 0000                        BSCT
00033                     *
00034                     * VARIABLES LOCATED ON BASE PAGE
00035                     *

00037B 0000   0002   A  BADS1  RMB   2    BEGINNING ADDRESS,  TRACE 1
00038B 0002   0002   A  BADS2  RMB   2    BEGINNING ADDRESS,  TRACE 2
00039B 0004   0002   A  BADS3  RMB   2    BEGINNING ADDRESS,  TRACE 3
00040B 0006   0002   A  BADS4  RMB   2    BEGINNING ADDRESS,  TRACE 4
00041B 0008   0002   A  BADS5  RMB   2    BEGINNING ADDRESS,  TRACE 5
00042B 000A   0002   A  BADS6  RMB   2    BEGINNING ADDRESS,  TRACE 6
00043B 000C   0002   A  BADS7  RMB   2    BEGINNING ADDRESS,  TRACE 7
00044B 000E   0002   A  BADS8  RMB   2    BEGINNING ADDRESS,  TRACE 8
00045B 0010   0002   A  BADS9  RMB   2    BEGINNING ADDRESS,  TRACE 9
00046B 0012   0001   A  AA     RMB   1    INT8
00047B 0013   0002   A  A14N   RMB   2    INT15
00048B 0015   0001   A  A2     RMB   1    INT7
00049B 0016   0001   A  A3     RMB   1    INT8 * 2
00050B 0017   0002   A  AD     RMB   2    ADDRESS OR INT8
00051B 0019   0002   A  ADB    RMB   2    INT15 OR INT8
00052B 001B   0002   A  ADBB   RMB   2    INT15
00053B 001D   0002   A  ADS1   RMB   2    ADDRESS
00054B 001F   0001   A  ADS2   RMB   1    8 BIT ADDRESS
00055B 0020   0001   A  ADS3   RMB   1    8 BIT ADDRESS
00056B 0021   0002   A  AFXRF  RMB   2    INT15
00057B 0023   0002   A  ALAD   RMB   2    ADDRESS
00058B 0025   0002   A  ALBL   RMB   2    INT15
00059B 0027   0002   A  ALFA   RMB   2    INT15
00060B 0029   0024   A  AW     RMB   36   DISPLAY CHARACTERS
00061B 004D   0002   A  BB     RMB   2    INT8 OR INT15
00062B 004F   0001   A  BITL   RMB   1    INT8
00063B 0050   0002   A  BITNO  RMB   2    INT15
00064B 0052   0001   A  BL     RMB   1    INT8
00065B 0053   0001   A  BLR    RMB   1    INT8
00066B 0054   0001   A  BLS    RMB   1    INT8
```

```
00141B 00BB    0001  A  T7BL   RMB   1      INT8
00142B 00BC    0001  A  TPR    RMB   1      INT8
00143B 00BD    0001  A  TPL    RMB   1      INT8
00144B 00BE    0001  A  TSK    RMB   1      INT8
00145B 00BF    0002  A  VOS1   RMB   2      VOLTAGE OFFSET (INT15)
00146B 00C1    0002  A  VOS2   RMB   2      "
00147B 00C3    0001  A         RMB   1      NOT USED
00148B 00C4    0002  A  W1     RMB   2      INT15
00149B 00C6    0002  A  W2     RMB   2      "
00150B 00C8    0001  A  W7     RMB   1      INT8
00151B 00C9    0001  A  W8     RMB   1      INT8
00152B 00CA    0001  A  X2     RMB   1      INT8
00153B 00CB    0001  A  X3     RMB   1      INT8
00154B 00CC    0001  A  XM     RMB   1      INT8 - TRANSCRIBE MODE
00155B 00CD    0003  A  TVAR1  RMB   3      TEMP VARIABLE STORAGE
00156B 00D0    0002  A  TMPIDX RMB   2      TEMPORARY INDEX STORAGE
00157B 00D2    000A  A  SCRTCH RMB   10     MATH SCRATCH AREA
00158B 00DC    0002  A  STAD   RMB   2      ADDRESS
00159B 00DE    0012  A  PSTK   RMB   18     POLISH MATH STACK
00160          00F0  B  PSTKTP EQU   *
00161B 00F0    0001  A  LITE1  RMB   1      LR1 STATUS MEMORY
00162B 00F1    0001  A  LITE2  RMB   1      LR2 STATUS MEMORY
00163B 00F2    0001  A  FR1    RMB   1      FLAG REGISTER 1
00164B 00F3    0001  A  FR2    RMB   1      FLAG REGISTER 2
00165B 00F4    0001  A  FR3    RMB   1      FLAG REGISTER 3
00166B 00F5    0001  A  FR4    RMB   1      FLAG REGISTER 4
00167B 00F6    0002  A  TEMP   RMB   2      TEMP REGISTER STORAGE
00168B 00F8    0002  A  TEMP2  RMB   2      "
00169B 00FA    0002  A  TEMP3  RMB   2      "
00170B 00FC    0002  A  TEMP4  RMB   2      "
00171B 00FE    0001  A  TEMP5  RMB   1      "
00172                         *             NOTE: TEMP5 SHOULD BE "RMB 2"
00173                         *             HOWEVER, THE MACRO ASSEMBLER
00174                         *             WILL GIVE A DIAGNOSTIC IF IT
00175                         *             IS.  THE ASSEMBLER CANNOT
00176                         *             HANDLE AN EXACTLY FULL BASE
00177                         *             PAGE.
00179                            END
TOTAL ERRORS 00000

DB 0013 A14N    00010 00047*
DB 0015 A2      00010 00048*
DB 0016 A3      00010 00049*
DB 0012 AA      00010 00046*
DB 0017 AD      00010 00050*
DB 0019 ADB     00010 00051*
DB 001B ADBB    00010 00052*
DB 001D ADS1    00011 00053*
DB 001F ADS2    00011 00054*
DB 0020 ADS3    00011 00055*
DB 0021 AFXRF   00027 00056*
DB 0023 ALAD    00008 00057*
DB 0025 ALBL    00008 00058*
DB 0027 ALFA    00008 00059*
DB 0029 AW      00011 00060*
DB 0000 BADS1   00008 00037*
DB 0002 BADS2   00008 00038*
DB 0004 BADS3   00008 00039*
DB 0006 BADS4   00008 00040*
DB 0008 BADS5   00009 00041*
DB 000A BADS6   00009 00042*
DB 000C BADS7   00009 00043*
DB 000E BADS8   00009 00044*
DB 0010 BADS9   00009 00045*
DB 004D BB      00012 00061*
DB 004F BITL    00012 00062*
DB 0050 BITNO   00012 00063*
DB 0052 BL      00012 00064*
DB 0053 BLR     00012 00065*
DB 0054 BLS     00012 00066*
DB 0055 BLT     00012 00067*
DB 0057 BP      00012 00068*
DB 0071 BX      00012 00089*
```

```
DB 0058 CF        00013 00069*
DB 0059 CF1       00013 00070*
DB 005B CF2       00013 00071*
DB 005C CM        00013 00072*
DB 005E CMC       00013 00073*
DB 0060 CRC       00013 00074*
DB 0061 D         00013 00075*
DB 0062 DCOMP     00013 00076*
DB 0063 DIW       00027 00077*
DB 0064 FALB7     00014 00078*
DB 0066 FALB8     00014 00079*
DB 0068 FDB       00014 00080*
DB 0069 FEW01     00015 00081*
DB 006A FEW02     00015 00082*
DB 006B FEW03     00015 00083*
DB 006C FEW11     00015 00084*
DB 006D FEW12     00015 00085*
DB 006E FEW13     00015 00086*
DB 006F FEW2      00016 00087*
DB 0070 FEW4      00016 00088*
DB 0072 FF        00016 00090*
DB 0073 FM4       00016 00091*
DB 0074 FNTB      00014 00092*
DB 0076 FPTB      00014 00093*
DB 00F2 FR1       00025 00163*
DB 00F3 FR2       00025 00164*
DB 00F4 FR3       00027 00165*
DB 00F5 FR4       00027 00166*
DB 0078 FSB       00014 00094*
DB 007A FSBRF     00014 00095*
DB 007B H         00016 00096*
DB 008D K15       00018 00107*
DB 008F K16       00018 00108*
DB 007C K2        00017 00097*
DB 007D K3        00017 00098*
DB 007F K4        00017 00099*
DB 0081 K4S       00017 00100*
DB 0083 K5        00017 00101*
DB 0085 K5S       00017 00102*
DB 0087 K5T       00017 00103*
DB 0089 K6        00017 00104*
DB 008A K7        00017 00105*
DB 008C K8        00017 00106*
DB 0091 L1        00020 00109*
DB 0092 L2        00020 00110*
DB 0093 LALB7     00019 00111*
DB 0095 LD        00020 00112*
DB 0096 LI        00020 00113*
DB 00F0 LITE1     00025 00161*
DB 00F1 LITE2     00025 00162*
DB 0097 LNTB      00019 00114*
DB 0099 LPTB      00019 00115*
DB 009B M1        00020 00116*
DB 009C M2        00020 00117*
DB 009D M3        00020 00118*
DB 009E MISAL     00019 00119*
DB 00A0 MTR1      00019 00120*
DB 00A1 MTR2      00019 00121*
DB 00A2 N         00020 00122*
DB 00A3 NAD       00020 00123*
DB 00A5 NNTR      00019 00124*
DB 00A6 NPTR      00019 00125*
DB 00A7 NRN       00020 00126*
DB 00A8 PK2       00020 00127*
DB 00DE PSTK      00024 00159*
DB 00F0 PSTKTP    00024 00160*
DB 00A9 Q         00020 00128*
DB 00AA R         00020 00129*
DB 00D2 SCRTCH    00023 00157*
DB 00AB SH        00020 00130*
DB 00AC SKIP      00029 00131*
DB 00DC STAD      00027 00158*
DB 00B5 T1        00021 00136*
DB 00B6 T2        00021 00137*
```

```
DB 00B7 T3       00021 00138*
DB 00B8 T4       00021 00139*
DB 00B9 T5       00021 00140*
DB 00BB T7BL     00022 00141*
DB 00B1 TAAC     00021 00134*
DB 00AD TAD      00021 00132*
DB 00AF TDC      00021 00133*
DB 00F6 TEMP     00026 00167*
DB 00F8 TEMP2    00026 00168*
DB 00FA TEMP3    00026 00169*
DB 00FC TEMP4    00026 00170*
DB 00FE TEMP5    00026 00171*
DB 00D0 TMPIDX   00023 00156*
DB 00BD TPL      00029 00143*
DB 00BC TPR      00021 00142*
DB 00B3 TSAA     00021 00135*
DB 00BE TSK      00029 00144*
DB 00CD TVAR1    00023 00155*
DB 00BF VOS1     00022 00145*
DB 00C1 VOS2     00022 00146*
DB 00C4 W1       00022 00148*
DB 00C6 W2       00022 00149*
DB 00C8 W7       00022 00150*
DB 00C9 W8       00022 00151*
DB 00CA X2       00023 00152*
DB 00CB X3       00023 00153*
DB 00CC XM       00023 00154*

00001                    NAM    F0C
00002                    OPT    REL,CREF,LLEN=80
00003                    TTL    VARIABLES ON PAGE ONE
00004                    IDNT   FEB.   21, 1978

00006           * EXTERNAL DEFINITIONS FOR VARIABLES ON PAGE ONE

00008                    XDEF   AAD, ADW, BLOC, BPD, BR
00009                    XDEF   CBL, CH, DIM, DW, FDBT
00010                    XDEF   J15, K4T, K5A
00011                    XDEF   INC, MAXMIS, NATT, NBTT, NDB, NDW, NSB, NSW
00012                    XDEF   RAS, RATT, RNX, SBZ, SPD, ISPD, SPDT, SW
00013                    XDEF   T6, T7, T8, TBL, TDW, TOTB, TOTMA, TRET
00014                    XDEF   WF1, WF2, WFH, WFL
00015                    XDEF   STACK
00016                    XDEF   NTT, NTR, RMN, NOBY
00017                    XDEF   RCAP, X4, X5
00018                    XDEF   T7AD, T8AD, T8BL, T9AD
00019                    XDEF   ALWD, PERIOD, PER7, PREVB, RSPD, SRSPD 00021D 0000              DSCT
00023           *
00024           * VARIABLES LOCATED ON PAGE ONE
00025           *

00027D 0000     0002  A  AAD    RMB    2        ADDRESS
00028D 0002     0001  A  ADW    RMB    1        INT8
00029D 0003     0001  A  ALWD   RMB    1        INT8
00030D 0004     0001  A  BLOC   RMB    1        INT8
00031D 0005     0001  A  BPD    RMB    1        INT8
00032D 0006     0001  A  BR     RMB    1        INT8
00033D 0007     0001  A  CBL    RMB    1        INT8
00034D 0008     0001  A  CH     RMB    1        INT8
00035D 0009     0001  A  DW     RMB    1        INT8
00036D 000A     0001  A  DIM    RMB    1        INT8
00037D 000B     0010  A  FDBT   RMB    16       8 INT15 (ARRAY)
00038D 001B     0010  A  J15    RMB    16       8 PV2 (ARRAY)
00039D 002B     0002  A  K4T    RMB    2        PV2
00040D 002D     0002  A  K5A    RMB    2        INT15*10
```

```
00041D 002F    0001    A INC     RMB    1     INT8
00042D 0030    0002    A ISPD    RMB    2     INT15
00043D 0032    0002    A MAXMIS  RMB    2     INT15
00044D 0034    0001    A NATT    RMB    1     INT8
00045D 0035    0001    A NBTT    RMB    1     INT8
00046D 0036    0001    A NDB     RMB    1     INT8
00047D 0037    0001    A NDW     RMB    1     INT8
00048D 0038    0001    A NOBY    RMB    1     INT8 (NUMBER OF BYTES)
00049D 0039    0001    A NSB     RMB    1     INT8
00050D 003A    0001    A NSW     RMB    1     INT8
00051D 003B    0001    A NTR     RMB    1     INT8 (NUMBER OF TRYS)
00052D 003C    0002    A NTT     RMB    2     INT16 (NUMBER OF TIMES THROUGH)
00053D 003E    0002    A PER7    RMB    2     INT15
00054D 0040    0002    A PERIOD  RMB    2     INT15
00055D 0042    0001    A PREVB   RMB    1     INT8
00056D 0043    0001    A RAS     RMB    1     INT8
00057D 0044    0002    A RATT    RMB    2     ADDRESS
00058D 0046    0001    A RCAP    RMB    1     INT8
00059D 0047    0001    A RMN     RMB    1     INT8 (RECORD MARK NUMBER)
00060D 0048    0001    A RNX     RMB    1     INT8
00061D 0049    0001    A RSPD    RMB    1     INT8
00062D 004A    0010    A SBZ     RMB    16    8 INT15 (ARRAY)
00063D 005A    0001    A SPD     RMB    1     INT8
00064D 005B    0003    A SPDT    RMB    3     PV1
00065D 005E    0001    A SRSPD   RMB    1     INT8
00066D 005F    0001    A SW      RMB    1     INT8
00067D 0060    0002    A T6      RMB    2     INT15
00068D 0062    0002    A T7      RMB    2     INT15
00069D 0064    0002    A T7AD    RMB    2     ADDRESS
00070D 0066    0002    A T8      RMB    2     INT15
00071D 0068    0002    A T8AD    RMB    2     ADDRESS
00072D 006A    0001    A T8BL    RMB    1     INT8
00073D 006B    0002    A T9AD    RMB    2     ADDRESS
00074D 006D    0005    A TBL     RMB    5     5 INT8 (ARRAY)
00075D 0072    0014    A TDW     RMB    20    5 FOUR BYTE ENTRIES (ARRAY)
00076D 0086    0002    A TOTB    RMB    2     INT15
00077D 0088    0002    A TOTMA   RMB    2     INT15
00078D 008A    0002    A TRET    RMB    2     TEMP RETURN ADDRESS
00079D 008C    0002    A WF1     RMB    2     INT15
00080D 008E    0002    A WF2     RMB    2     INT15
00081D 0090    0002    A WFH     RMB    2     INT15
00082D 0092    0002    A WFL     RMB    2     INT15
00083D 0094    0001    A X4      RMB    1     INT8
00084D 0095    0001    A X5      RMB    1     INT8
00085         01FF    A STACK   EQU    $1FF
00087                              END
TOTAL ERRORS 00000

DD 0000 AAD     00008 00027*
DD 0002 ADW     00008 00028*
DD 0003 ALWD    00019 00029*
DD 0004 BLOC    00008 00030*
DD 0005 BPD     00008 00031*
DD 0006 BR      00008 00032*
DD 0007 CBL     00009 00033*
DD 0008 CH      00009 00034*
DD 000A DIM     00009 00036*
DD 0009 DW      00009 00035*
DD 000B FDBT    00009 00037*
DD 002F INC     00011 00041*
DD 0030 ISPD    00012 00042*
DD 001B J15     00010 00038*
DD 002B K4T     00010 00039*
DD 002D K5A     00010 00040*
DD 0032 MAXMIS  00011 00043*
DD 0034 NATT    00011 00044*
DD 0035 NBTT    00011 00045*
DD 0036 NDB     00011 00046*
DD 0037 NDW     00011 00047*
DD 0038 NOBY    00016 00048*
DD 0039 NSB     00011 00049*
DD 003A NSW     00011 00050*
```

```
DD 003B NTR    00016 00051*
DD 003C NTT    00016 00052*
DD 003E PER7   00019 00053*
DD 0040 PERIOD 00019 00054*
DD 0042 PREVB  00019 00055*
DD 0043 RAS    00012 00056*
DD 0044 RATT   00012 00057*
DD 0046 RCAP   00017 00058*
DD 0047 RMN    00016 00059*
DD 0048 RNX    00012 00060*
DD 0049 RSPD   00019 00061*
DD 004A SBZ    00012 00062*
DD 005A SPD    00012 00063*
DD 005B SPDT   00012 00064*
DD 005E SRSPD  00019 00065*
D  01FF STACK  00015 00085*
DD 005F SW     00012 00066*
DD 0060 T6     00013 00067*
DD 0062 T7     00013 00068*
DD 0064 T7AD   00018 00069*
DD 0066 T8     00013 00070*
DD 0068 T8AD   00018 00071*
DD 006A T8BL   00018 00072*
DD 006B T9AD   00018 00073*
DD 006D TBL    00013 00074*
DD 0072 TDW    00013 00075*
DD 0086 TOTB   00013 00076*
DD 0088 TOTMA  00013 00077*
DD 008A TRET   00013 00078*
DD 008C WF1    00014 00079*
DD 008E WF2    00014 00080*
DD 0090 WFH    00014 00081*
DD 0092 WFL    00014 00082*
DD 0094 X4     00017 00083*
DD 0095 X5     00017 00084*

00001              NAM   F1A
00002              OPT   REL, CREF, LLEN=80
00003              TTL   FLOW PAGES 1A THRU 1E
00004              IDNT  FEB.  21, 1978

00006              XREF  BSCT:AFXRF, BADS1, BADS7, BADS8
00007              XREF  BSCT:DCOMP, FEW2, FR1, K2, M1, M2, M3, PK2
00008              XREF  BSCT:T2, TEMP, TEMP2, TPL, TPR, XM

00010              XREF  PSCT:ASCP, CBLOCK, CFLG1, SFLG1, CLITE1
00011              XREF  PSCT:DIAG, MIXED, OFFX, PNTATT, PRGM
00012              XREF  PSCT:SCOPE, SETM1, TRIM, TSTOP, XCRIBE
00013              XREF  PSCT:SCRL1C, CFLG2, CFLG3

00015              XREF  AT, ATS, CONF
00016              XREF  BA9S, BAAD, PBAADL, PBAADM, BADD, BADS, BADS9
00017              XREF  BL11, BLSP11, BWAD, DW1, DW7, DW8
00018              XREF  FAIL, FAS, FEAD0, JL10FS, JL20FS, K1
00019              XREF  OBL, OBLSP, OBWDD
00020              XREF  NCF, PASS, STACK, TE, TEC, TES, UNBL11

00022              XDEF  START, EMODE1, CANLOG 00024P 0000              PSCT
00026        *
00027        * EMODE1 - ENTER MODE M1
00028        *
00029        * FLOW PAGES 1A AND 1B
00030        *
00031P 0000 BD 0000  A EMODE1 JSR  TSTOP    WAIT 5 MS., STOP,
                                            WAIT 200 MS., SET RW
00032        *
```

```
00033P 0003 8E 0000  A          LDS    #STACK    CLEAR STACK
00034P 0006 7E 00C5  P          JMP    JMPXIT 00036P 0009 8E 0000  A  START   LDS    #STACK    INITIALIZE PROCESSOR STACK
00037                        *
00038                        * INITIALIZE SYSTEM (PAGE 1B)
00039                        *
00040P 000C CE 03E8  A          LDX    #1000
00041P 000F DF 00    A          STX    AFXRF     AF/RF = 1000
00042P 0011 86 00    A          LDAA   #FAS
00043P 0013 BD 0000  A          JSR    CFLG1     FAS _ 0
00044P 0016 CE 0000  A          LDX    #BADS     POINT TO DIG STORAGE
00045P 0019 DF 00    A          STX    TEMP      SAVE POINTER
00046P 001B CE 0000  A          LDX    #BADS1    POINT TO TRACE POINTERS
00047P 001E 96 00    A  INITSL  LDAA   TEMP      INITIALIZE
00048P 0020 A7 00    A          STAA   X
00049P 0022 96 01    A          LDAA   TEMP+1
00050P 0024 A7 01    A          STAA   1,X       ... ONE POINTER
00051P 0026 DF 00    A          STX    TEMP2     SAVE POINTER POINTER
00052P 0028 DE 00    A          LDX    TEMP      GET POINTER VALUE
00053P 002A 86 8D    A          LDAA   #141      DIFFERENCE TO NEXT VAL
00054P 002C BD 0000  A          JSR    OFFX      X _ X + A
00055P 002F DF 00    A          STX    TEMP      SAVE POINTER VALUE
00056P 0031 DE 00    A          LDX    TEMP2     GET POINTER POINTER
00057P 0033 08                  INX              NEXT
00058P 0034 08                  INX              ... POINTER
00059P 0035 8C 0002  A          CPX    #BADS8+2  DONE?
00060P 0038 26 E4 001E          BNE    INITSL    LOOP TILL YES
00061P 003A CE 0000  A          LDX    #BA9S
00062P 003D FF 0000  A          STX    BADS9     BADS(9) = #BA9S
00063                        *
00064                        * DIGITAL STORAGE POINTERS INITIALIZED
00065                        *
00066P 0040 86 09    A          LDAA   #9        TRACE #9
00067P 0042 CE F100  A          LDX    #8*32+BADD+$F000
00068P 0045 DF 00    A          STX    TEMP      TEMP _ 8*32+BAAD
00069                        *
00070P 0047 36          INSL2   PSHA             SAVE TRACE COUNT
00071P 0048 BD 0000  A          JSR    PNTATT    INDEX _ #BEGINNING OF TRACE
00072P 004B 96 00    A          LDAA   TEMP
00073P 004D D6 01    A          LDAB   TEMP+1
00074P 004F A7 00    A          STAA   OBLSP,X   BLSP(TRACE) _ TEMP,15-8
00075P 0051 E7 00    A          STAB   OBWDD,X   BWDD(TRACE) _ TEMP,7-0
00076P 0053 C0 20    A          SUBB   #32
00077P 0055 82 00    A          SBCA   #0
00078P 0057 97 00    A          STAA   TEMP
00079P 0059 D7 01    A          STAB   TEMP+1    TEMP _ TEMP-32
00080P 005B 32                  PULA             RESTORE TRACE NUMBER
00081P 005C 4A                  DECA             TRACE _ TRACE-1
00082P 005D 26 E8 0047          BNE    INSL2     LOOP TILL TRACE=0
00083                        *
00084                        * BWDD(1-10) AND BLSP(1-10) INITIALIZED
00085                        *
00086P 005F 86 01    A          LDAA   #1
00087P 0061 97 00    A          STAA   TPR       TPR _ 1
00088P 0063 4C                  INCA
00089P 0064 BD 0000  A          JSR    SETM1     M1 _ 2
00090P 0067 7F 0000  A          CLR    M3        M3 _ 0
00091P 006A 86 F0    A          LDAA   #PBAADM+$F0
00092P 006C B7 0000  A          STAA   BLSP11    BLSP11 _ [BAAD-25],15-8 + $F0
00093P 006F 96 00    A          LDAA   #PBAADL
00094P 0071 B7 0000  A          STAA   BWAD      BWAD _ [BAAD-25],7-0
00095P 0074 86 37    A          LDAA   #255-200
00096P 0076 B7 0000  A          STAA   UNBL11    UNBL(11) _ 1'S COMPL. OF 200
00098                        *
00099                        * EXECUTIVE LOOP - TOP OF PAGE 1A IN FLOW
00100                        *
00101P 0079 8D 5F 00DA EXECLP  BSR    CLTOP     CLEAR TOP OF CRT
00102                        *
00103P 007B 96 00    A          LDAA   M1        GET MODE NUMBER
00104P 007D 81 02    A          CMPA   #2        IS M1 = 2?
00105P 007F 27 2F 00B0          BEQ    EXEC1A    IF YES...BRANCH
00106P 0081 81 07    A          CMPA   #7        IS M1 = 7?
00107P 0083 27 2B 00B0          BEQ    EXEC1A    IF YES...BRANCH
```

```
00108P 0085 81 05      A             CMPA    #5              IS M1 = 5?
00109P 0087 26 1D 00A6               BNE     EXEC0B          IF NOT...BRANCH
00110P 0089 96 00      A             LDAA    M2
00111P 008B 81 03      A             CMPA    #3              IS M2 = 3?
00112P 008D 26 0B 009A               BNE     EXEC0A          IF NOT...BRANCH
00113P 008F CE 007D    A             LDX     #BA9S+125
00114P 0092 DF 00      A             STX     TEMP
00115P 0094 CE 0000    A             LDX     #BA9S
00116P 0097 BD 0000    A             JSR     CBLOCK          (BA9S) THRU (BA9S+124) _ 0
00117P 009A D6 00      A EXEC0A LDAB  K2
00118P 009C D7 00      A             STAB    PK2             PK2 _ K2
00119P 009E 97 00      A             STAA    M3              M3 _ M2
00120P 00A0 86 05      A             LDAA    #5
00121P 00A2 97 00      A             STAA    M2              M2 _ 5
00122P 00A4 20 11 00B7               BRA     JMPGO 00124P 00A6 D6 00      A EXEC0B LDAB  M2
00125P 00A8 C1 05      A             CMPB    #5              IS M2 = 5?
00126P 00AA 26 04 00B0               BNE     EXEC1A          IF NOT...BRANCH
00127P 00AC 91 00      A             CMPA    M3              IS M1 = M3?
00128P 00AE 27 03 00B3               BEQ     EXEC1B          IF YES...BRANCH
00129P 00B0 BD 012E    P EXEC1A JSR  CLBOT           CLEAR BOTTOM OF CRT
00130P 00B3 96 00      A EXEC1B LDAA  M1
00131P 00B5 97 00      A             STAA    M2              M2 _ M1

00133P 00B7 96 00      A JMPGO  LDAA  M1
00134P 00B9 CE 00CA    P             LDX     #MODTBL-4 POINT TO MODE TABLE
00135P 00BC 08               JMPMLP INX                      POINT TO NEXT
00136P 00BD 08                        INX                    ... TABLE ENTRY
00137P 00BE 4A                        DECA                   THIS ENTRY?
00138P 00BF 26 FB 00BC                BNE     JMPMLP         LOOP TILL YES
00139P 00C1 EE 00      A              LDX     X              GET JUMP ADDRESS
00140P 00C3 AD 00      A              JSR     X              DO MODE EXECUTIVE
00141P 00C5 96 00      A JMPXIT LDAA  M1
00142P 00C7 81 02      A              CMPA    #2             IS M1 = 2? (IE. TRIM MODE?)
00143P 00C9 26 AE 0079                BNE     EXECLP         IF NOT...BRANCH
00144P 00CB 7E 0000    A              JMP     DIAG           ... ELSE RE-INITIALIZE
00145                                 *
00146                                 * MODE EXECUTIVE JUMP TABLE
00147                                 *
00148P 00CE    0000    A MODTBL FDB   TRIM, PRGM, SCOPE, MIXED, ASCP, XCRIBE
     P 00D0    0000    A
     P 00D2    0000    A
     P 00D4    0000    A
     P 00D6    0000    A
     P 00D8    0000    A
00150                                 *
00151                                 * CLTOP - CLEAR TOP 3/4 OF DISPLAY - DOES
00152                                 *   THAT AND INITIALIZES SOME PROGRAM VARIABLES
00153                                 *   AND LITES.
00154                                 *
00155                                 * FLOW PAGE 1C
00156                                 *
00157P 00DA CE 0000    A CLTOP  LDX   #DW7            CLEAR LOOP TERMINATOR
00158P 00DD DF 00      A        STX   TEMP            SAVE IT
00159P 00DF CE 0000    A        LDX   #DW1
00160P 00E2 BD 0000    A        JSR   CBLOCK          CLEAR DW1-DW6
00161                                 *
00162P 00E5 86 06      A        LDAA  #6              ACCA _ 6
00163P 00E7 BD 0000    A CLTLP2 JSR   PNTATT          INDEX _ #TRACE(ACCA)
00164P 00EA C6 FF      A        LDAB  #255-0          1'S COMPLEMENT OF 0
00165P 00EC E7 00      A        STAB  OBL,X           ... BL(ACCA) _ 255
00166P 00EE 4A                  DECA                  ACCA _ ACCA-1
00167P 00EF 26 F6 00E7          BNE   CLTLP2          LOOP TILL ACCA = 0
00168                                 *
00169P 00F1 86 06      A        LDAA  #6              ACCA _ 6
00170P 00F3 36                CLTLP PSHA
00171P 00F4 BD 0000    A        JSR   SCRL1C          (INDEX _ BADS(ACCA))
00172P 00F7 6F 00      A        CLR   JL1OFS,X        J(ACCA,1) _ 0
00173P 00F9 6F 00      A        CLR   JL2OFS,X        J(ACCA,2) _ 0
00174P 00FB 32                  PULA
00175P 00FC 4A                  DECA                  ACCA _ ACCA - 1
00176P 00FD 26 F4 00F3          BNE   CLTLP           LOOP UNTIL ACCA = 0
00177                                 *
```

```
00178P 00FF 86 00      A            LDAA    #NCF
00179P 0101 BD 0000    A            JSR     CFLG2       NCF _ 0
00180                               *
00181P 0104 86 00      A            LDAA    #CONF
00182P 0106 BD 0000    A            JSR     CFLG3       CONF _ 0

00184P 0109 C6 00      A            LDAB    #PASS+FAIL+TES+TEC+AT (LR1 LEDS)
00185P 010B BD 0000    A            JSR     CLITE1      CLEAR LITES IN LR1
00186P 010E 86 00      A            LDAA    #TE
00187P 0110 BD 0000    A            JSR     CFLG1       TE _ 0
00188P 0113 86 00      A            LDAA    #ATS
00189P 0115 BD 0000    A            JSR     SFLG1       ATS _ 1
00190P 0118 8D 49 0163              BSR     CANLOG      CLEAR ANALOG TRACE, IF REQD.
00191P 011A 7F 0000    A            CLR     XM          XM _ 0
00192P 011D 86 0F      A            LDAA    #$F
00193P 011F B7 0002    A            STAA    FEAD0+2     (FEAD2) _ FHEX
00194P 0122 7F 0000    A            CLR     FEW2        FEW2 _ 0
00195P 0125 86 C8      A            LDAA    #200
00196P 0127 97 00      A            STAA    T2          T2 _ 200
00197P 0129 86 00      A            LDAA    #K1
00198P 012B 7E 0000    A            JMP     SFLG1       K1 _ 1 ... AND EXIT
00200                               *
00201                               * CLBOT - CLEAR BOTTOM 1/4 OF CRT - DOES THAT AND
00202                               *    INITIALIZES CERTAIN VARIABLES, FLAGS, AND LITES.
00203                               *
00204                               * FLOW PAGE 1D
00205                               *
00206P 012E CE 0028    A CLBOT      LDX     #DW8+40     LOOP TERMINATOR
00207P 0131 DF 00      A            STX     TEMP
00208P 0133 CE 0000    A            LDX     #DW7        POINT TO DW7
00209P 0136 BD 0000    A            JSR     CBLOCK      CLEAR DW7, DW8, MDW
00210                               *
00211P 0139 86 07      A            LDAA    #7          ACCA _ 7
00212P 013B C6 FF      A            LDAB    #255
00213P 013D BD 0000    A CLBLP      JSR     PNTATT      INDEX _ #TRACE(ACCA)
00214P 0140 E7 00      A            STAB    OBL,X       BL(ACCA) _ 255
00215P 0142 4C                      INCA                ACCA _ ACCA+1
00216P 0143 81 0A      A            CMPA    #10
00217P 0145 26 F6 013D              BNE     CLBLP       LOOP TILL ACCA = 10
00218                               *
00219P 0147 DE 00      A            LDX     BADS7
00220P 0149 6F 00      A            CLR     JL1OFS,X    J(7,1) _ 0
00221P 014B 6F 00      A            CLR     JL2OFS,X    J(7,2) _ 0
00222P 014D DE 00      A            LDX     BADS8
00223P 014F 6F 00      A            CLR     JL1OFS,X    J(8,1) _ 0
00224P 0151 6F 00      A            CLR     JL2OFS,X    J(8,2) _ 0
00225                               *
00226P 0153 7F 0000    A            CLR     M3          M3 _ 0
00227P 0156 86 B4      A            LDAA    #180
00228P 0158 97 00      A            STAA    TPL         TPL _ 180
00229P 015A 86 33      A            LDAA    #51
00230P 015C 97 00      A            STAA    DCOMP       DCOMP = 51
00231                               *
00232P 015E C6 00      A            LDAB    #PASS+FAIL LITES IN LR1
00233P 0160 7E 0000    A            JMP     CLITE1      CLEAR THEM AND EXIT CLBOT
00234                               *
00235                               * CANLOG - CLEAR ANALOG TRACE IF REQUIRED
00236                               *
00237                               * FLOW PAGE 1E
00238                               *
00239P 0163 96 00      A CANLOG     LDAA    FR1
00240P 0165 85 00      A            BITA    #ATS        IS ATS = 1?
00241P 0167 27 13 017C              BEQ     CANLG9      IF NOT... BRANCH
00242P 0169 CE 03D0    A            LDX     #BAAD+976   LOOP TERMINATOR
00243P 016C DF 00      A            STX     TEMP        SAVE IT
00244P 016E CE 0000    A            LDX     #BAAD       GET START POINT
00245P 0171 BD 0000    A            JSR     CBLOCK      CLEAR BLOCK
00246                               *
00247P 0174 86 00      A            LDAA    #ATS
00248P 0176 BD 0000    A            JSR     CFLG1       ATS _ 0
00249                               *
00250P 0179 7F 0000    A            CLR     BL11        BL(11) _ 1'S COMPLEMENT OF 255
00251                               *
00252P 017C 39           CANLG9     RTS                 EXIT CANLOG
```

```
00254P 017D    00    A         FCB    0           CRC BYTE
00255                          END
TOTAL ERRORS 00000

RB        AFXRF   00006*00041
 RP        ASCP    00010*00148
 R         AT      00015*00184
 R         ATS     00015*00188 00240 00247
 R         BA9S    00016*00061 00113 00115
 R         BAAD    00016*00242 00244
 R         BADD    00016*00067
 R         BADS    00016*00044
 RB        BADS1   00006*00046
 RB        BADS7   00006*00219
 RB        BADS8   00006*00059 00222
 R         BADS9   00016*00062
 R         BL11    00017*00250
 R         BLSP11  00017*00092
 R         BWAD    00017*00094
 P  017C   CANLG9  00241 00252*
 DP 0163   CANLOG  00022 00190 00239*
 RP        CBLOCK  00010*00116 00160 00209 00245
 RP        CFLG1   00010*00043 00187 00248
 RP        CFLG2   00013*00179
 RP        CFLG3   00013*00182
 P  013D   CLBLP   00213*00217
 P  012E   CLBOT   00129 00206*
 RP        CLITE1  00010*00185 00233
 P  00F3   CLTLP   00170*00176
 P  00E7   CLTLP2  00163*00167
 P  00DA   CLTOP   00101 00157*
 R         CONF    00015*00181
 RB        DCOMP   00007*00230
 RP        DIAG    00011*00144
 R         DW1     00017*00159
 R         DW7     00017*00157 00208
 R         DW8     00017*00206
 DP 0000   EMODE1  00022 00031*
 P  009A   EXEC0A  00112 00117*
 P  00A6   EXEC0B  00109 00124*
 P  00B0   EXEC1A  00105 00107 00126 00129*
 P  00B3   EXEC1B  00128 00130*
 P  0079   EXECLP  00101*00143
 R         FAIL    00018*00184 00232
 R         FAS     00018*00042
 R         FEAD0   00018*00193
 RB        FEW2    00007*00194
 RB        FR1     00007*00239
 P  001E   INITSL  00047*00060
 P  0047   INSL2   00070*00082
 R         JL1OFS  00018*00172 00220 00223
 R         JL2OFS  00018*00173 00221 00224
 P  00B7   JMPGO   00122 00133*
 P  00BC   JMPMLP  00135*00138
 P  00C5   JMPXIT  00034 00141*
 R         K1      00018*00197
 RB        K2      00007*00117
 RB        M1      00007*00103 00130 00133 00141
 RB        M2      00007*00110 00121 00124 00131
 R         M3      00007*00090 00119 00127 00226
 RP        MIXED   00011*00148
 P  00CE   MODTBL  00134 00148*
 R         NCF     00020*00178
 R         OBL     00019*00165 00214
 R         OBLSP   00019*00074
 R         OBWDD   00019*00075
 RP        OFFX    00011*00054
 R         PASS    00020*00184 00232
 R         PBAADL  00016*00093
 R         PBAADM  00016*00091
 RB        PK2     00007*00118
 RP        PNTATT  00011*00071 00163 00213
```

```
RP       PRGM      00011*00148
RP       SCOPE     00012*00148
RP       SCRL1C    00013*00171
RP       SETM1     00012*00089
RP       SFLG1     00010*00189 00198
R        STACK     00020*00033 00036
DP 0009  START     00022 00036*
RB       T2        00008*00196
R        TE        00020*00186
R        TEC       00020*00184
RB       TEMP      00008*00045 00047 00049 00052 00055 00068 00072 00073 00078
                   00079 00114 00158 00207 00243
RB       TEMP2     00008*00051 00056
R        TES       00020*00134
RB       TPL       00008*00228
RB       TPR       00008*00087
RP       TRIM      00012*00148
RP       TSTOP     00012*00031
R        UNBL11    00020*00096
RP       XCRIBE    00012*00148
RB       XM        00008*00191

00001                         NAM     F3A
00002                         OPT     REL, CREF, LLEN=80
00003                         TTL     FLOW PAGES 3A THRU 3K
00004                         IDNT    FEB.    21, 1978

00006                         XREF    BSCT:A2, A3, AW, FEW2, K3, K4, K4S, K5, K5S
00007                         XREF    BSCT:K7, K8, M1, M3, N
00008                         XREF    BSCT:T2, TEMP, TPR, TVAR1

00010                         XREF    PSCT:ARSMDW, CBLOCK, CLITE2
00011                         XREF    PSCT:DCSMDW, DOMOVE, DTOBDC, DTOBTD
00012                         XREF    PSCT:EEXP10, EINT15, FLPMLT, MULTS, R10
00013                         XREF    PSCT:SCAN, SCRL1A, SETK6
00014                         XREF    PSCT:SLITE1, SLITE2, STOVAR
00015                         XREF    PSCT:XDIV10

00017                         XREF    AT, FEAD0, MDW

00019                         XDEF    SETAW, SETDW, SETTS
00020                         XDEF    SMDW1, SMDW2, SMDW4, SMDW5
00021                         XDEF    TRIM 00023P 0000                   PSCT
00025                   *
00026                   * TRIM - TRIM MODE EXECUTIVE - PAGE 3A OF FLOW
00027                   *
00028P 0000 C6 00     A TRIM   LDAB    #AT
00029P 0002 BD 0000   A        JSR     SLITE1      AT _ 1
00030P 0005 86 02     A        LDAA    #2
00031P 0007 97 00     A        STAA    A2          A2 _ 2V
00032P 0009 48                 ASLA                ACCA _ 4
00033P 000A 97 00     A        STAA    A3          A3 _ 2V (NOTE: A3 IS INT8*2)
00034P 000C BD 0000   A        JSR     SETK6       AT _ 1
00035P 000F CE 000E   A        LDX     #14
00036P 0012 DF 00     A        STX     K3          K3 _ 1.4V
00037P 0014 DF 00     A        STX     K7          K7 _ 1.4V
00038P 0016 86 05     A        LDAA    #5
00039P 0018 97 00     A        STAA    K8          K8 _ 5
00040                   *
00041P 001A D6 00     A        LDAB    TPR
00042P 001C 58                 ASLB
00043P 001D 17                 TBA
00044P 001E 58                 ASLB
00045P 001F 58                 ASLB
00046P 0020 1B                 ABA
00047P 0021 97 01     A        STAA    K5+1
```

```
00048P 0023 7F 0000   A           CLR      K5            K5 _ 10*TPR
00049P 0026 CE 0000   A           LDX      #0
00050P 0029 DF 00     A           STX      K5S           K5S _ 0
00051P 002B CE 02FC   A           LDX      #$02FC        2 * 10**-4 (PV2 NOTATION)
00052P 002E DF 00     A           STX      K4            K4 _ 200 US
00053P 0030 DF 00     A           STX      K4S           INITIALIZE K4S
00054P 0032 86 1F     A           LDAA     #$1F
00055P 0034 B7 0002   A           STAA     FEAD0+2       (FEAD2) _ 1FHEX
00056P 0037 86 10     A           LDAA     #$10
00057P 0039 97 00     A           STAA     FEW2          FEW2 _ 10HEX
00058P 003B 8D 13 0050            BSR      SETDW         SET DW1 THRU DW5
00059P 003D BD 0101   P           JSR      SMDW1         SET MDW
00060P 0040 BD 01F5   P           JSR      SETTS         SET TSI, TSA, TSE
00061P 0043 CE 07D0   A           LDX      #2000         FOR T2
00062P 0046 DF 00     A           STX      T2            SET T2
00063P 0048 7F 0000   A           CLR      M3            M3 _ 0
00064                             *
00065P 004B BD 0000   A  TRIMLP   JSR      SCAN          SCAN ALL CONTROLS
00066P 004E 20 FB 004B            BRA      TRIMLP        LOOP
00068                             *
00069                             * SETDW - PAGE 3B OF FLOW
00070                             *
00071P 0050 C6 01     A  SETDW    LDAB     #1            N _ 1

00073P 0052 D7 00     A  SETDW1   STAB     N             SET N
00074P 0054 86 03     A           LDAA     #3
00075P 0056 10                    SBA                    ACCA _ 3-N
00076P 0057 D6 00     A           LDAB     A3            NOTE: A3 IS INT8*2
00077P 0059 BD 0000   A           JSR      MULT8
00078P 005C 47                    ASRA                   DIVIDE BY 2
00079P 005D 56                    RORB                   TO COMPENSATE FOR A3
00080P 005E 97 00     A           STAA     TEMP
00081P 0060 D7 01     A           STAB     TEMP+1
00082P 0062 4F                    CLRA
00083P 0063 D6 00     A           LDAB     A2            IF A2 NOT < 0
00084P 0065 2A 01 0068            BPL      SETDW2        ... THEN BRANCH
00085P 0067 43                    COMA                   ... ELSE PROPAGATE SIGN 00087P 0068 DB 01     A  SETDW2   ADDB     TEMP+1
00088P 006A 99 00     A           ADCA     TEMP          ACCA,ACCB _ A2+(3-N)*A3/2
00089P 006C BD 0000   A           JSR      DTOBTD
00090P 006F 96 00     A           LDAA     N
00091P 0071 BD 0000   A           JSR      SCRL1A        POINT TO DW(N)
00092P 0074 33                    PULB                   GET SIGN
00093P 0075 CA 80     A           ORAB     #$80          TURN ON "SHIFT" BIT
00094P 0077 31                    INS
00095P 0078 31                    INS
00096P 0079 31                    INS                    SKIP 3 LEADING DIGITS
00097P 007A 32                    PULA                   GET 10'S DIGIT
00098P 007B 8A 80     A           ORAA     #$80          TURN ON "SHIFT" BIT
00099P 007D 81 8A     A           CMPA     #$8A          IS DIGIT = "0"?
00100P 007F 27 04 0085            BEQ      SETDW3        IF YES...BRANCH
00101P 0081 E7 00     A           STAB     0,X           ...ELSE DW(N),1 _ SIGN
00102                             *                      ...AND DW(N),2 _ 10'S DIGIT
00103P 0083 20 05 008A            BRA      SETDW4

00105P 0085 86 80     A  SETDW3   LDAA     #$80
00106P 0087 A7 00     A           STAA     0,X           DW(N),1 _ " "
00107P 0089 17                    TBA                    DW(N),2 _ SIGN 00109P 008A A7 01     A  SETDW4   STAA     1,X           SET DW(N),2
00110P 008C 32                    PULA
00111P 008D 8A 80     A           ORAA     #$80          TURN ON "SHIFT" BIT
00112P 008F A7 02     A           STAA     2,X           DW(N),3 _ 1'S DIGIT
00113P 0091 86 80     A           LDAA     #$80
00114P 0093 A7 03     A           STAA     3,X           DW(N),4 _ " "
00115P 0095 D6 00     A           LDAB     N
00116P 0097 C1 05     A           CMPB     #5            IS N = 5?
00117P 0099 27 16 00B1            BEQ      SETDW5        IF YES...BRANCH
00118P 009B 5C                    INCB                   N _ N+1
00119P 009C 96 00     A           LDAA     A3            NOTE: A3 IS INT8*2
00120P 009E 81 01     A           CMPA     #1            IS (A3/2) = .5?
00121P 00A0 26 B0 0052            BNE      SETDW1        IF NOT...BRANCH
00122P 00A2 17                    TBA
```

```
00123P 00A3 BD 0000   A              JSR     SCRL1A    POINT TO DW(N)
00124P 00A6 6F 00     A              CLR     0,X
00125P 00A8 6F 01     A              CLR     1,X
00126P 00AA 6F 02     A              CLR     2,X
00127P 00AC 6F 03     A              CLR     3,X       DW(N),1-4 = "    "
00128P 00AE 5C                       INCB              N _ N+1
00129P 00AF 20 A1 0052               BRA     SETDW1

00131P 00B1 39               SETDW5  RTS
00133                        *
00134                        * SETAW - SETS CHARACTERS OF A
00135                        * IN AW THRU AW + 5 (AW, 1 THRU AW, 6).
00136                        * A MUST BE IN X ON PSTK (ENTRY VALUE
00137                        * OF A IS SAVED IN TVAR1).  PAGE 3C OF FLOW.
00138                        *
00139                        * FIRST, CALCULATE STRING( INT(A*100) )
00140                        *
00141P 00B2 CE 0000   A      SETAW   LDX     #TVAR1
00142P 00B5 BD 0000   A              JSR     STOVAR    TVAR1 _ A
00143P 00B8 86 02     A              LDAA    #2
00144P 00BA BD 0000   A              JSR     EEXP10    10**2, A ON PSTK
00145P 00BD BD 0000   A              JSR     FLPMLT    A _ 100 * A
00146P 00C0 BD 0000   A              JSR     R10       A _ A + .5 (BASE 10)
00147P 00C3 BD 0000   A              JSR     DTOBDC    GET STRING(A)
00148                        *
00149                        * AW, 1-6 _ STRING(A)
00150                        *
00151P 00C6 CE 0000   A              LDX     #AW
00152P 00C9 32               SETAWL  PULA              GET CHARACTER
00153P 00CA A7 00     A              STAA    X         AW,N _ CHARACTER
00154P 00CC 08                       INX               N _ N + 1
00155P 00CD 8C 0006   A              CPX     #AW+6     LOOP
00156P 00D0 26 F7 00C9                BNE    SETAWL    ... WHILE N < 7
00157                        *
00158                        * NOW FIX AW FOR PAGE 3C
00159                        *
00160P 00D2 96 02     A              LDAA    AW+2      GET 10'S DIGIT
00161P 00D4 81 0A     A              CMPA    #10       IS IT "0"?
00162P 00D6 26 1E 00F6               BNE     SETAW2    BRANCH IF NOT
00163P 00D8 96 00     A              LDAA    AW
00164P 00DA 97 01     A              STAA    AW+1      MOVE SIGN IF SO
00165P 00DC 7F 0000   A              CLR     AW        ... AND CLEAR OLD SIGN
00166P 00DF 96 03     A              LDAA    AW+3      GET 1'S DIGIT
00167P 00E1 81 0A     A              CMPA    #10       IS IT "0"?
00168P 00E3 26 13 00F8               BNE     SETAW3    BRANCH IF NOT
00169P 00E5 96 04     A              LDAA    AW+4      GET 1/10'S DIGIT
00170P 00E7 81 0A     A              CMPA    #10       IS IT "0"?
00171P 00E9 26 0D 00F8               BNE     SETAW3    BRANCH IF NOT
00172P 00EB 96 05     A              LDAA    AW+5      GET 1/100'S DIGIT
00173P 00ED 81 0A     A              CMPA    #10       IS IT "0"?
00174P 00EF 26 07 00F8               BNE     SETAW3    BRANCH IF NOT
00175P 00F1 7F 0001   A              CLR     AW+1      CLEAR SIGN IF A=0
00176P 00F4 20 02 00F8               BRA     SETAW3
00177P 00F6 97 01     A      SETAW2  STAA    AW+1      MOVE 10'S DIGIT
00178P 00F8 96 03     A      SETAW3  LDAA    AW+3
00179P 00FA 97 02     A              STAA    AW+2      MOVE 1'S DIGIT
00180P 00FC 86 1D     A              LDAA    #29       GET "."
00181P 00FE 97 03     A              STAA    AW+3      AW, 4 _ "."
00182P 0100 39                       RTS               EXIT SETAW
00184                        *
00185                        * SMDW1 - PAGE 3D OF FLOW
00186                        *
00187P 0101 8D 20 0123 SMDW1  BSR    SMDW2     SET MDW, 7-11
00188P 0103 96 00     A              LDAA    M1
00189P 0105 81 06     A              CMPA    #6        IS M1 = 6?
00190P 0107 27 0D 0116               BEQ     SMDW1A 00192P 0109 CE 0012   A              LDX     #MDW+18   TERMINATOR
00193P 010C DF 00     A              STX     TEMP
00194P 010E CE 000C   A              LDX     #MDW+12   START
00195P 0111 BD 0000   A              JSR     CBLOCK    MDW, 13-18 _ "    "
00196P 0114 20 03 0119               BRA     SMDW1B
00197                        *
00198P 0116 BD 0000   A      SMDW1A JSR      ARSMDW    USE AF/RF TO SET MDW, 13-17
```

```
00199                        *
00200P 0119 BD 0000 A SMDW1B JSR    DCSMDW   USE DCOMP TO SET MDW,20-23
00201                        *
00202P 011C 8D 1F 013D        BSR    SMDW3    SET MDW,25-27
00203P 011E 8D 69 0189        BSR    SMDW4    SET MDW,30-34
00204P 0120 7E 01E4  P        JMP    SMDW5    SET MDW,36-40 AND EXIT
00206                        *
00207                        * SMDW2 - PAGE 3E
00208                        *
00209P 0123 CE 0000 A SMDW2  LDX    #K3       ENTER K3*10 ON PSTK
00210P 0126 BD 0000 A         JSR    EINT15   X _ X/10 ON PSTK
00211P 0129 BD 0000 A         JSR    XDIV10
00212P 012C BD 00B2  P        JSR    SETAW    SET AW FROM K3
00213P 012F 7F 0004 A         CLR    MDW+4    MDW, 5 _ " "
00214P 0132 7F 0005 A         CLR    MDW+5    MDW, 6 _ " "
00215P 0135 7F 000B A         CLR    MDW+11   MDW,12 _ " "
00216P 0138 86 04   A         LDAA   #4       POINT TO MOVE PARAMETERS
00217P 013A 7E 0000 A         JMP    DOMOVE   MDW, 7-11 _ AW, 1-5 & EXIT
00218                        *
00219                        * SMDW3 - PAGE 3H
00220                        *
00221P 013D 7F 0018 A SMDW3  CLR    MDW+24   MDW,25 _ " "
00222P 0140 7F 001A A         CLR    MDW+26   MDW,27 _ " "
00223P 0143 96 00   A         LDAA   K4       A _ MSD(K4)
00224P 0145 D6 01   A         LDAB   K4+1     B _ EXP(K4)
00225P 0147 36              PSHA            C _ MSD(K4)
00226P 0148 86 16   A         LDAA   #22      A _ "N" (NANO)
00227P 014A C1 F9   A         CMPB   #$F9
00228P 014C 2C 07 0155        BGE    SMDW31   BRANCH IF B >= -7
00229P 014E B7 001A A         STAA   MDW+26   MDW,27 _ "N"
00230P 0151 CB 09   A         ADDB   #9       B _ B+9
00231P 0153 20 16 016B        BRA    SMDW33
00232                        *
00233P 0155 C1 FC   A SMDW31 CMPB   #$FC
00234P 0157 2C 08 0161        BGE    SMDW32   BRANCH IF B >= -4
00235P 0159 4A              DECA
00236P 015A B7 001A A         STAA   MDW+26   MDW,27 _ "U" (MICRO)
00237P 015D CB 06   A         ADDB   #6       B _ B+6
00238P 015F 20 0A 016B        BRA    SMDW33
00239                        *
00240P 0161 C1 FF   A SMDW32 CMPB   #$FF
00241P 0163 2C 06 016B        BGE    SMDW33   BRANCH IF B >= -1
00242P 0165 4C              INCA
00243P 0166 B7 001A A         STAA   MDW+26   MDW,27 _ "M" (MILLI)
00244P 0169 CB 03   A         ADDB   #3       B _ B+3
00245                        *
00246P 016B 32              SMDW33 PULA      A _ C
00247P 016C C1 01   A         CMPB   #1
00248P 016E 26 0C 017C        BNE    SMDW34   BRANCH IF B <> 1
00249P 0170 B7 0018 A         STAA   MDW+24   MDW,25 _ C
00250P 0173 86 0A   A         LDAA   #10
00251P 0175 B7 0019 A         STAA   MDW+25   MDW,26 _ "0"
00252P 0178 7F 001B A SMDW35 CLR    MDW+27   MDW,28 _ " "
00253P 017B 39              RTS              ... AND EXIT
00254                        *
00255P 017C B7 0019 A SMDW34 STAA   MDW+25   MDW,26 _ C
00256P 017F 5D              TSTB
00257P 0180 27 F6 0178       BEQ    SMDW35   EXIT IF B = 0
00258P 0182 C6 1D   A         LDAB   #29
00259P 0184 F7 0018 A         STAB   MDW+24   MDW,26 _ "."
00260P 0187 20 EF 0178        BRA    SMDW35   EXIT
00262                        *
00263                        * SMDW4 - PAGE 3I
00264                        *
00265P 0189 4F              SMDW4  CLRA
00266P 018A 97 00   A         STAA   AW
00267P 018C 97 01   A         STAA   AW+1
00268P 018E 97 02   A         STAA   AW+2     PREPARE AW
00269P 0190 D6 00   A         LDAB   TPR      GET TPR 00271P 0192 58              ASLB
00272P 0193 49              ROLA             TIMES 2
00273P 0194 97 00   A         STAA   TEMP
00274P 0196 D7 01   A         STAB   TEMP+1   SAVE INTERMEDIATE RESULT
```

```
00276P 0198 58                        ASLB
00277P 0199 49                        ROLA 00279P 019A 58                        ASLB
00280P 019B 49                        ROLA           TIMES 8

00282P 019C DB 01      A              ADDB   TEMP+1
00283P 019E 99 00      A              ADCA   TEMP    TIMES 10

00285P 01A0 40                        NEGA
00286P 01A1 50                        NEGB
00287P 01A2 82 00      A              SBCA   #0      ACCA,ACCB _ (-10)*TPR
00288P 01A4 DB 01      A              ADDB   K5+1    NOTE: K5 IS INT15*10
00289P 01A6 99 00      A              ADCA   K5      ACCA,ACCB _ (K5-TPR)*10
00290P 01A8 36                        PSHA
00291P 01A9 37                        PSHB           SAVE BINARY VALUE
00292P 01AA BD 0000    A              JSR    DTOBTD  CONVERT TO DECIMAL
00293P 01AD CE 0000    A              LDX    #AW
00294P 01B0 33                        PULB           GET SIGN
00295P 01B1 31                        INS            SKIP OVER MOST SIGNIFICANT DIGIT
00296P 01B2 32                        PULA           GET NEXT DIGIT
00297P 01B3 81 0A      A              CMPA   #10     IS IT A ZERO
00298P 01B5 26 07 01BE                BNE    SMDW4B  IF NOT...BRANCH
00299P 01B7 32                        PULA           NEXT DIGIT
00300P 01B8 81 0A      A              CMPA   #10     IS IT A ZERO?
00301P 01BA 26 09 01C5                BNE    SMDW4D  IF NOT...BRANCH
00302P 01BC 20 0A 01C8                BRA    SMDW4H 00304P 01BE E7 00      A SMDW4B STAB   0,X           SET SIGN
00305P 01C0 A7 01      A              STAA   1,X     SET DIGIT
00306P 01C2 32                        PULA
00307P 01C3 20 02 01C7                BRA    SMDW4F 00309P 01C5 E7 01      A SMDW4D STAB   1,X           SET SIGN 00311P 01C7 16            SMDW4F TAB                 REPLACE SIGN WITH DIGIT 00313P 01C8 32            SMDW4H PULA                NEXT DIGIT
00314P 01C9 A7 03      A              STAA   3,X
00315P 01CB 86 1D      A              LDAA   #29     DTO "."
00316P 01CD A7 04      A              STAA   4,X
00317P 01CF 32                        PULA           GET LEAST SIGNIFICANT DIGIT
00318P 01D0 A7 05      A              STAA   5,X
00319P 01D2 32                        PULA           GET ORIGINAL BINARY VALUE
00320P 01D3 97 00      A              STAA   TEMP
00321P 01D5 32                        PULA
00322P 01D6 9A 00      A              ORAA   TEMP    WAS NUMBER = 0?
00323P 01D8 27 02 01DC                BEQ    SMDW4J  IF YES...BRANCH
00324P 01DA E7 02      A              STAB   2,X     ...ELSE SET SIGN OR DIGIT 00326P 01DC 7F 0022    A SMDW4J CLR    MDW+34        MDW,35 _ " "
00327P 01DF 86 05      A              LDAA   #5      POINT TO MOVE PARAMETERS
00328P 01E1 7E 0000    A              JMP    DOMOVE  MDW,29-34 _ AW,1-6 & EXIT

00330                                 *
00331                                 * SMDW5 - PAGE 3J OF FLOW
00332                                 *
00333P 01E4 CE 0000    A SMDW5  LDX    #K7
00334P 01E7 BD 0000    A              JSR    EINT15  K7*10 ON PSTK
00335P 01EA BD 0000    A              JSR    XDIV10  K7 ON PSTK
00336P 01ED BD 00B2    P              JSR    SETAW   SET AW FROM K7
00337P 01F0 86 06      A              LDAA   #6      POINT TO MOVE PARAMETERS
00338P 01F2 7E 0000    A              JMP    DOMOVE  MDW,36-40 _ AW,1-5 & EXIT

00340                                 *
00341                                 * SETTS - PAGE 3K OF FLOW
00342                                 *
00343P 01F5 C6 38      A SETTS  LDAB   #%00111000
00344P 01F7 BD 0000    A              JSR    CLITE2  CLEAR TRIGGER SOURCE LEDS
00345P 01FA D6 00      A              LDAB   K8
00346P 01FC 58                        ASLB
00347P 01FD 58                        ASLB
```

```
00348P 01FE 58          ASLB           ALIGN K8 WITH LR2 LED.BITS
00349P 01FF C4 38   A   ANDB   #%00111000 ENSURE VALID BITS
00350P 0201 7E 0000 A   JMP    SLITE2  SET TRIG SOURCE LED AND EXIT
00352P 0204    00   A   FCB    0       CRC BYTE
00353                   END
TOTAL ERRORS 00000
```

```
RB      A2      00006*00031 00083
RB      A3      00006*00033 00076 00119
RP      ARSMDW  00010*00198
R       AT      00017*00028
RB      AW      00006*00151 00155 00160 00163 00164 00165 00166 00169 00172
                00175 00177 00178 00179 00181 00266 00267 00268 00293
RP      CBLOCK  00010*00195
RP      CLITE2  00010*00344
RP      DCSMDW  00011*00200
RP      DOMOVE  00011*00217 00328 00338
RP      DTOBDC  00011*00147
RP      DTOBTD  00011*00089 00292
RP      EEXP10  00012*00144
RP      EINT15  00012*00210 00334
R       FEAD0   00017*00055
RB      FEW2    00006*00057
RP      FLPMLT  00012*00145
RB      K3      00006*00036 00209
RB      K4      00006*00052 00223 00224
RB      K4S     00006*00053
RB      K5      00006*00047 00048 00288 00289
RB      K5S     00006*00050
RB      K7      00007*00037 00333
RB      K8      00007*00039 00345
RB      M1      00007*00188
RB      M3      00007*00063
R       MDW     00017*00192 00194 00213 00214 00215 00221 00222 00229 00236
                00243 00249 00251 00252 00255 00259 00326
RP      MULTS   00012*00077
RB      N       00007*00073 00090 00115
RP      R10     00012*00146
RP      SCAN    00013*00065
RP      SCRL1A  00013*00091 00123
DP 00B2 SETAW   00019 00141*00212 00336
 P 00F6 SETAW2  00162 00177*
 P 00F8 SETAW3  00168 00171 00174 00176 00178*
 P 00C9 SETAWL  00152*00156
DP 0050 SETDW   00019 00058 00071*
 P 0052 SETDW1  00073*00121 00129
 P 0068 SETDW2  00084 00087*
 P 0085 SETDW3  00100 00105*
 P 008A SETDW4  00103 00109*
 P 00B1 SETDW5  00117 00131*
RP      SETK6   00013*00034
DP 01F5 SETTS   00019 00060 00343*
RP      SLITE1  00014*00029
RP      SLITE2  00014*00350
DP 0101 SMDW1   00020 00059 00187*
 P 0116 SMDW1A  00190 00198*
 P 0119 SMDW1B  00196 00200*
DP 0123 SMDW2   00020 00187 00209*
 P 013D SMDW3   00202 00221*
 P 0155 SMDW31  00228 00233*
 P 0161 SMDW32  00234 00240*
 P 016B SMDW33  00231 00238 00241 00246*
 P 017C SMDW34  00248 00255*
 P 0178 SMDW35  00252*00257 00260
DP 0189 SMDW4   00020 00203 00265*
 P 01BE SMDW4B  00298 00304*
 P 01C5 SMDW4D  00301 00309*
 P 01C7 SMDW4F  00307 00311*
 P 01C8 SMDW4H  00302 00313*
 P 01DC SMDW4J  00323 00326*
DP 01E4 SMDW5   00020 00204 00333*
RP      STOVAR  00014*00142
```

```
RB         T2       00008*00062
RB         TEMP     00008*00080 00081 00087 00088 00193 00273 00274 00282 00283
                    00320 00322
RB         TPR      00008*00041 00269
DP  0000   TRIM     00021 00028*
 P  004B   TRIMLP   00065*00066
RB         TVAR1    00008*00141
RP         XDIV10   00015*00211 00335

00001                              NAM      F4A
00002                              OPT      REL, CREF, LLEN=80
00003                              TTL      FLOW PAGES 4A THRU 4F
00004                              IDNT     FEB.   15, 1978

00006                              XREF     BSCT:DCOMP, FR2, FR3, K2, L1
00007                              XREF     BSCT:M1, M3, NRN, PK2, T2, TPL

00009                              XREF     DSCT:DIM, NTT

00011                              XREF     PSCT:CFLG3, DELAY, RREC
00012                              XREF     PSCT:SCAN, SCNMOD, TRUNR, TSTOP, SDW678
00013                              XREF     PSCT:WMARKS, TESTM2, M2P10, SCRL1C, SDWL1X
00014                              XREF     PSCT:CFLG2, SFLG1, SFLG2, SFLG3, XMDR, DSPDIM

00016                              XREF     BL11, CLRFR, CONF, FIRG, IRG, RBFULL
00017                              XREF     READY, RESET, RUN, SETRW, TERR
00018                              XREF     TSTAT, JL10FS
00019                              XREF     FTT, K1

00021                              XDEF     PRGM, FNRN, GOFWD, RWND
00022                              XDEF     ASCP, XCRIBE, RMARK 00024P 0000                        PSCT
00026                      *
00027                      * PRGM    - ENTER PRGM, AUTOSCOPE, OR XCRIBE MODE
00028                      * ASCP    -
00029                      * XCRIBE  -
00030                      *
00031                      * FLOW PAGE 4A
00032                      *
00033          0000   P PRGM    EQU      *
00034          0000   P ASCP    EQU      *
00035          0000   P XCRIBE  EQU      *
00036P 0000 96 00    A              LDAA     M1
00037P 0002 81 07    A              CMPA     #7          IS M1 = 7? (IE. TRANSCRIBE MODE?)
00038P 0004 27 05 000B              BEQ      PRGM0       IF YES...BRANCH
00039P 0006 BD 005E  P              JSR      FNRN        FIND NEXT RECORD NUMBER
00040P 0009 20 0A 0015              BRA      PRGM1
00041                      *
00042P 000B 86 FF    A PRGM0    LDAA     #255-0
00043P 000D B7 0000  A              STAA     BL11        BL(11) _ 1'S COMPLEMENT OF 0
00044P 0010 BD 0000  A              JSR      XMDR        IN XCRIBE MODE, DISPLAY "READ"
00045P 0013 20 41 0056              BRA      PRGML5      ENTER SCAN LOOP
00046                      *
00047P 0015 96 00    A PRGM1    LDAA     M3          IS M3 = 0?
00048P 0017 26 19 0032              BNE      PRGM2       IF NOT...BRANCH
00049P 0019 96 00    A              LDAA     NRN
00050P 001B 97 00    A              STAA     K2          K2 _ NRN
00051                      *
00052P 001D 86 08    A              LDAA     #8          A _ 8
00053P 001F 36               PRGML1 PSHA
00054P 0020 BD 0000  A              JSR      SCRL1C      INDEX _ BADS(A)
00055P 0023 6F 00    A              CLR      JL10FS,X    J(A,1) _ 0
00056P 0025 32                      PULA
00057P 0026 4A                      DECA                A _ A - 1
00058P 0027 26 F6 001F              BNE      PRGML1      LOOP UNTIL A = 0
00059                      *
```

```
00060P 0029 86 07      A            LDAA   #7
00061P 002B 97 00      A            STAA   L1        L1 _ 7
00062P 002D BD 0000    A            JSR    SDW678    USE K2 TO SET DW(6, 7, AND/OR 8)
00063P 0030 20 08 003A              BRA    PRGML2
00064P 0032 96 00      A PRGM2      LDAA   PK2
00065P 0034 97 00      A            STAA   K2        K2 _ PK2
00066P 0036 86 06      A            LDAA   #6
00067P 0038 97 00      A            STAA   L1        L1 _ 6

00069P 003A BD 0000    A PRGML2     JSR    SDWL1X    SET DW(L1)
00070P 003D BD 0000    A            JSR    M2P10     M2 _ M2 + 10
00071P 0040 7F 0000    A            CLR    T2        T2 _ 0
00072P 0043 86 00      A            LDAA   #K1
00073P 0045 BD 0000    A            JSR    SFLG1     K1 _ 1
00074P 0048 96 00      A            LDAA   M1
00075P 004A 81 03      A            CMPA   #3        IS M1 = 3?
00076P 004C 26 08 0056              BNE    PRGML5    IF NOT...BRANCH
00077P 004E 86 05      A            LDAA   #5
00078P 0050 97 00      A            STAA   DCOMP     DCOMP _ 5
00079P 0052 86 87      A            LDAA   #135
00080P 0054 97 00      A            STAA   TPL       TPL _ 135
00081                               *
00082P 0056 7F 0000    A PRGML5     CLR    M3        M3 _ 0
00084P 0059 BD 0000    A PRGML6     JSR    SCAN      SCAN ALL CONTROLS
00085P 005C 20 FB 0059              BRA    PRGML6    LOOP
00087                               *
00088                               * FIND NRN, WRITE MARKS IF REQUIRED, DISPLAY
00089                               *   MESSAGE AS REQUIRED - PAGE 4B
00090                               *
00091P 005E 8D 0F 006F   FNRN       BSR    MTCHK     CHECK CARTRIDGE
00092P 0060 BD 0000    A            JSR    TESTM2    EXIT IF M1 <> M2
00093P 0063 BD 00F9    P            JSR    RMARK     READ NEXT MARK
00094P 0066 BD 0000    A            JSR    TESTM2    EXIT IF M1 <> M2
00095P 0069 7D 0000    A            TST    NRN
00096P 006C 27 F0 005E              BEQ    FNRN      LOOP IF NRN = 0
00097P 006E 39                      RTS              EXIT FNRN

00099                               *
00100                               * MTCHK - SEE IF CARTRIDGE IS IN PLACE, REWIND
00101                               *   TO MARK OR BOT IF REQUIRED - PAGE 4C
00102                               *
00103P 006F 7F 0000    A MTCHK      CLR    SETRW     SET TO READ FROM TAPE
00104P 0072 7F 0000    A            CLR    NRN       NRN _ 0
00105P 0075 7F 0000    A            CLR    RESET     PULSE (RESET)
00106P 0078 B6 0000    A            LDAA   TSTAT
00107P 007B 85 00      A            BITA   #READY
00108P 007D 27 0F 008E              BEQ    RWND      BRANCH IF (READY) = 0
00109P 007F 86 06      A            LDAA   #6
00110P 0081 B7 0000    A            STAA   DIM       DIM _ 6
00111P 0084 86 00      A            LDAA   #CONF
00112P 0086 BD 0000    A            JSR    SFLG3     CONF _ 1
00113P 0089 BD 0000    A            JSR    DSPDIM    DISPLAY DIM
00114P 008C 20 E1 006F              BRA    MTCHK
00116                               *
00117                               * REWIND TO MARK OR BOT - PAGE 4D
00118                               *
00119P 008E 7F 0000    A RWND       CLR    SETRW     SET TO READ
00120P 0091 7F 0000    A            CLR    CLRFR     SET FOR REVERSE MOTION
00121P 0094 7F 0000    A            CLR    RUN       RUN TAPE
00122P 0097 86 00      A            LDAA   #FTT
00123P 0099 BD 0000    A            JSR    SFLG2     FTT _ 1
00124                               *
00125P 009C 86 00      A RWND1      LDAA   #FIRG
00126P 009E BD 0000    A            JSR    CFLG3     FIRG _ 0
00127                               *
00128P 00A1 B6 0000    A RWND2      LDAA   TSTAT
00129P 00A4 85 00      A            BITA   #IRG
00130P 00A6 26 19 00C1              BNE    RWND5     BRANCH IF IRG = 1 (FALSE)
00131P 00A8 86 00      A            LDAA   #FIRG
00132P 00AA BD 0000    A            JSR    SFLG3     FIRG _ 1
```

```
00134P 00AD B6 0000  A RWND3  LDAA  TSTAT
00135P 00B0 85 00    A        BITA  #READY
00136P 00B2 27 ED 00A1        BEQ   RWND2   LOOP IF READY = 0 (TRUE)
00137                *
00138P 00B4 7F 0000  A        CLR   RESET   RESET DRIVE ELECTRONICS
00139P 00B7 B6 0000  A        LDAA  TSTAT
00140P 00BA 85 00    A        BITA  #READY
00141P 00BC 26 26 00E4        BNE   RWND7   BRANCH IF READY = 1 (FALSE)
00142                *
00143P 00BE 7E 0000  A RWND4  JMP   TSTOP   STOP TAPE AND EXIT
00144                *
00145P 00C1 96 00    A RWND5  LDAA  FR3
00146P 00C3 85 00    A        BITA  #FIRG
00147P 00C5 27 E6 00AD        BEQ   RWND3   BRANCH IF FIRG = 0
00148P 00C7 CE 0046  A        LDX   #70
00149P 00CA BD 0000  A        JSR   DELAY   WAIT ABOUT 5 MS
00150P 00CD 86 00    A        LDAA  #FTT
00151P 00CF 95 00    A        BITA  FR2
00152P 00D1 27 05 00D8        BEQ   RWND5A  IF FTT = 1
00153P 00D3 BD 0000  A        JSR   CFLG2   ... THEN FTT _ 0
00154P 00D6 20 07 00DF        BRA   RWND6

00156P 00D8 B6 0000  A RWND5A LDAA  TSTAT
00157P 00DB 85 00    A        BITA  #IRG
00158P 00DD 27 DF 00BE        BEQ   RWND4   EXIT IF IRG = 0 (TRUE)

00160P 00DF BD 0000  A RWND6  JSR   SCNMOD  SCAN MODE CONTROLS
00161P 00E2 20 B8 009C        BRA   RWND1
00162                *
00163P 00E4 86 06    A RWND7  LDAA  #6
00164P 00E6 B7 0000  A        STAA  DIM     DIM _ 6
00165P 00E9 86 07    A        LDAA  #7
00166P 00EB 91 00    A        CMPA  M1      IS M1 = 7?
00167P 00ED 26 05 00F4        BNE   RWND8   IF NOT...BRANCH
00168P 00EF 86 00    A        LDAA  #CONF
00169P 00F1 BD 0000  A        JSR   SFLG3   ...ELSE SET CONF = 1
00170P 00F4 BD 0000  A RWND8  JSR   DSPDIM  DISPLAY DIM
00171P 00F7 20 95 008E        BRA   RWND
00173                * READ NEXT MARK - PAGE 4E
00174                *
00175P 00F9 7F 0000  A RMARK  CLR   DIM     DIM _ 0
00176P 00FC BD 012A  P        JSR   GOFWD   LOOK FOR DATA ON TAPE
00177P 00FF B6 0000  A        LDAA  TSTAT   ... FOR UP TO 2 SEC
00179P 0102 85 00    A        BITA  #RBFULL
00180P 0104 26 14 011A        BNE   RMARK3  BRANCH IF RBFULL = 1 (FALSE)
00181P 0106 BD 0000  A        JSR   RREC    TRY TO READ RECORD
00182P 0109 BD 0000  A        JSR   TSTOP   STOP TAPE
00183P 010C 96 00    A        LDAA  FR3
00184P 010E 85 00    A        BITA  #TERR
00185P 0110 27 17 0129        BEQ   RMKXIT  EXIT IF TERR = 0
00186P 0112 86 04    A        LDAA  #4      DIM _ 4
00187P 0114 B7 0000  A RMARK0 STAA  DIM
00188P 0117 7E 0000  A RMARK1 JMP   DSPDIM  DISPLAY DIM ... AND EXIT
00189                *
00190P 011A 96 00    A RMARK3 LDAA  M1
00191P 011C 81 06    A        CMPA  #6
00192P 011E 27 05 0125        BEQ   RMARK5  BRANCH IF M1 = 6
00193P 0120 BD 0000  A        JSR   WMARKS  WRITE INDEX MARKS
00194P 0123 20 F2 0117        BRA   RMARK1

00196P 0125 86 08    A RMARK5 LDAA  #8      "TAPE NOT INDEXED" DIM _ 8
00197P 0127 20 EB 0114        BRA   RMARK0

00199P 0129 39       RMKXIT   RTS           EXIT
00201                *
00202                * GO FORWARD FOR NTT * 31 MICROSECONDS.
00203                *     LOOK FOR READ BUFFER FULL - PAGE 4F
00204                *
00205P 012A BD 0000  A GOFWD  JSR   TRUNR   RUN TAPE, SET TO READ
00206P 012D CE FC04  A        LDX   #64516
00207P 0130 FF 0000  A        STX   NTT     SET UP FOR ABOUT 2 SECONDS
00208P 0133 B6 0000  A GOFWDL LDAA  TSTAT
00209P 0136 85 00    A        BITA  #RBFULL
```

```
00210P 0138 27 0C 0146            BEQ     GFDXIT    EXIT IF RBFULL = 0 (TRUE)
00211P 013A FE 0000   A           LDX     NTT
00212P 013D 09                    DEX
00213P 013E FF 0000   A           STX     NTT       NTT _ NTT-1
00214P 0141 26 F0 0133            BNE     GOFWDL    LOOP TILL NTT = 0
00215P 0143 BD 0000   A           JSR     TSTOP     STOP TAPE, ETC.
00216P 0146 39              GFDXIT RTS              EXIT GOFWD
00218P 0147    00     A           FCB     0         CRC BYTE
00219                             END
TOTAL ERRORS 00000
```

```
DP 0000 ASCP    00022 00034*
R       BL11    00016*00043
RP      CFLG2   00014*00153
RP      CFLG3   00311*00126
R       CLRFR   00016*00120
R       CONF    00016*00111 00168
RB      DCOMP   00006*00078
RP      DELAY   00011*00149
RD      DIM     00009*00110 00164 00176 00187
RP      DSPDIM  00014*00113 00170 00188
R       FIRG    00016*00125 00131 00146
DP 005E FNRN    00021 00039 00091*00096
RB      FR2     00006*00151
RB      FR3     00006*00145 00183
R       FTT     00019*00122 00150
 P 0146 GFDXIT  00210 00216*
DP 012A GOFWD   00021 00177 00205*
 P 0133 GOFWDL  00208*00214
R       IRG     00016*00129 00157
R       JL10FS  00018*00055
R       K1      00019*00072
RB      K2      00006*00050 00065
RB      L1      00006*00061 00067
RB      M1      00007*00036 00074 00166 00190
RP      M2P10   00013*00070
RB      M3      00007*00047 00082
 P 006F MTCHK   00091 00103*00114
RB      NRN     00007*00049 00095 00104
RD      NTT     00009*00207 00211 00213
RB      PK2     00007*00064
DP 0000 PRGM    00021 00033*
 P 000B PRGM0   00038 00042*
 P 0015 PRGM1   00040 00047*
 P 0032 PRGM2   00048 00064*
 P 001F PRGML1  00053*00058
 P 003A PRGML2  00063 00069*
 P 0056 PRGML5  00045 00076 00082*
 P 0059 PRGML6  00084*00085
R       RBFULL  00016*00179 00209
R       READY   00017*00107 00135 00140
R       RESET   00017*00105 00138
DP 00F9 RMARK   00022 00093 00176*
 P 0114 RMARK0  00187*00197
 P 0117 RMARK1  00189*00194
 P 011A RMARK3  00180 00190*
 P 0125 RMARK5  00192 00196*
 P 0129 RMKXIT  00185 00199*
RP      RREC    00011*00181
R       RUN     00017*00121
DP 008E RWND    00021 00108 00119*00171
 P 009C RWND1   00125*00161
 P 00A1 RWND2   00128*00136
 P 00AD RWND3   00134*00147
 P 00BE RWND4   00143*00158
 P 00C1 RWND5   00130 00145*
 P 00D8 RWND5A  00152 00156*
 P 00DF RWND6   00154 00160*
 P 00E4 RWND7   00141 00163*
 P 00F4 RWND8   00167 00170*
RP      SCAN    00012*00084
RP      SCNMOD  00012*00160
```

```
RP         SCRL1C 00013*00054
RP         SDW678 00012*00062
RP         SDWL1X 00013*00069
R          SETRW  00017*00103 00119
RP         SFLG1  00014*00073
RP         SFLG2  00014*00123
RP         SFLG3  00014*00112 00132 00169
RB         T2     00007*00071
R          TERR   00017*00184
RP         TESTM2 00013*00092 00094
RB         TPL    00007*00080
RP         TRUNR  00012*00205
R          TSTAT  00018*00106 00128 00134 00139 00156 00178 00208
RP         TSTOP  00012*00143 00182 00215
RP         WMARKS 00013*00193
DP 0000    XCRIBE 00022 00035*
RP         XMDR   00014*00044

00001                       NAM    F4G
00002                       OPT    REL, CREF, LLEN=80
00003                       TTL    FLOW PAGES 4G THRU 4L
00004                       IDNT   NOV.   15, 1977

00006                       XREF   BSCT:CRC, FR2, FR3, NAD, NRN, STAD, TAD

00008                       XREF   DSCT:DIM, NTR, RMN

00010                       XREF   PSCT:CFLG2, CFLG3, DELAY, DSPDIM, EMODE1
00011                       XREF   PSCT:MDWMSG, SCNMOD, SFLG3
00012                       XREF   PSCT:TSTOP, TRUNR, DOMOVE, WREC

00014                       XREF   BAAD, BATT, BOT, CLRFR, CLRRW, FTT, INCCHR, IRG
00015                       XREF   RBFULL, READY, RESET, RUN, SETFR
00016                       XREF   TERR, TREAD, TSTAT, TWRITE, WBEMP, FTOK
00017                       XREF   GENPLY

00019                       XDEF   RREC, RTBOT, WMARKS 00021P 0000                 PSCT
00023                  *
00024                  * TRY UP TO 4 TIMES TO READ RECORD, START STORE AT
00025                  *   STAD, RETURN ON IRG - PAGE 4G
00026                  *
00027P 0000 86 01    A RREC  LDAA   #1
00028P 0002 B7 0000  A       STAA   NTR         NTR _ 1
00029P 0005 DE 00    A       LDX    STAD
00030P 0007 DF 00    A       STX    TAD         TAD _ STAD
00031                  *
00032P 0009 DE 00    A RREC1 LDX    STAD
00033P 000B DF 00    A       STX    NAD         NAD _ STAD
00034P 000D 8D 71 0080       BSR    RRECB       READ, START STORE IF POSSIBLE
00035P 000F B6 0000  A       LDAA   TSTAT
00036P 0012 85 00    A       BITA   #READY
00037P 0014 26 43 0059       BNE    RREC4       BRANCH IF (READY) = 1 (FALSE)
00038P 0016 96 00    A       LDAA   FR3
00039P 0018 85 00    A       BITA   #TERR
00040P 001A 27 40 005C       BEQ    RRAXIT      EXIT IF TERR = 0
00041P 001C B6 0000  A       LDAA   NTR
00042P 001F 81 04    A       CMPA   #4
00043P 0021 27 39 005C       BEQ    RRAXIT      EXIT IF NTR = 4
00044P 0023 BD 0000  A       JSR    TSTOP       STOP TAPE, ETC.
00045P 0026 7F 0000  A       CLR    CLRFR       SET FOR REVERSE MOTION
00046P 0029 7F 0000  A       CLR    RUN         RUN TAPE
00047P 002C CE 01A9  A       LDX    #425
00048P 002F BD 0000  A       JSR    DELAY       DELAY 30 MS
00049                  *
00050P 0032 B6 0000  A RREC2 LDAA   TSTAT
00051P 0035 85 00    A       BITA   #IRG
```

```
00052P 0037 26 1C 0055          BNE    RREC3     BRANCH IF (IRG) = 1 (FALSE)
00053P 0039 CE 0046    A        LDX    #70
00054P 003C BD 0000    A        JSR    DELAY     WAIT 5 MS
00055P 003F B6 0000    A        LDAA   TSTAT
00056P 0042 85 00      A        BITA   #IRG
00057P 0044 26 EC 0032          BNE    RREC2     SMALL LOOP IF (IRG) = 1 (FALSE)
00058                       *
00059P 0046 BD 0000    A        JSR    TSTOP     WAIT 5 MS, STOP,
00060                       *                    WAIT 200 MS, SET RW
00061P 0049 7C 0000    A        INC    NTR       NTR _ NTR + 1
00062P 004C BD 0000    A        JSR    TRUNR     RUN TAPE, SET READING FLAGS
00063P 004F DE 00      A        LDX    TAD
00064P 0051 DF 00      A        STX    STAD      STAD _ TAD
00065P 0053 20 B4 0009          BRA    RREC1     LARGE LOOP
00066                       *
00067P 0055 85 00      A RREC3  BITA   #READY
00068P 0057 27 D9 0032          BEQ    RREC2     SMALL LOOP IF (READY) = 0
00069                       *
00070P 0059 7E 0000    A RREC4  JMP    EMODE1    ENTER MODE M1
00071                       *
00072P 005C 39           RRAXIT RTS              EXIT RREC
00074                       *
00075                       * READ RECORD, START STORE AT NAD, RETURN ON IRG.
00076                       *    PAGE 4H
00077                       *
00078P 005D 85 00      A RRECB3 BITA   #INCCHR
00079P 005F 26 05 0066          BNE    RRECB4
00080P 0061 86 00      A        LDAA   #TERR     IF (INCCHR) = 0 THEN
00081P 0063 BD 0000    A        JSR    SFLG3     ... TERR _ 1
00082P 0066 DE 00      A RRECB4 LDX    NAD
00083P 0068 F6 0000    A        LDAB   TREAD
00084P 006B E7 00      A        STAB   0,X       (NAD) _ (TREAD)
00085P 006D 08                  INX              NAD _ NAD + 1
00086P 006E DF 00      A        STX    NAD

00088                       * THE CRC GENERATION IS DONE USING THE METHOD
00089                       * DESCRIBED UNDER "POLYNOMIAL CODES" IN CHAPTER 8
00090                       * OF THE BOOK "SECURITY, ACCURACY, AND PRIVACY IN
00091                       * COMPUTER SYSTEMS" BY JAMES MARTIN.  THE GENERATING
00092                       * POLYNOMIAL USED HERE IS (X**8+X**7+X**2+1).  THIS
00093                       * POLYNOMIAL HAS FACTORS OF (X**7+X+1) AND (X+1).
00094                       * NOTE THAT THE DIVISION IS DONE IN MODULO 2
00095                       * ARITHMETIC.  ALSO NOTE THAT THE HIGH ORDER BIT
00096                       * OF THE GENERATING POLYNOMIAL IS IMPLIED BY USING
00097                       * THE CARRY BIT.

00099P 0070 96 00      A        LDAA   CRC
00100P 0072 CE 0008    A        LDX    #8

00102P 0075 58           RRECBC ASLB
00103P 0076 49                  ROLA
00104P 0077 24 02 007B          BCC    RRECBD
00105P 0079 88 00      A        EORA   #GENPLY
00106P 007B 09           RRECBD DEX
00107P 007C 26 F7 0075          BNE    RRECBC
00108P 007E 97 00      A        STAA   CRC       SAVE REMAINDER 00110          0080    P RRECB  EQU    *         ENTER ROUTINE HERE
00111P 0080 B6 0000    A RRECB5 LDAA   TSTAT
00112P 0083 85 00      A        BITA   #RBFULL
00113P 0085 27 D6 005D          BEQ    RRECB3    LOOP IF (RBFULL) = 0 (TRUE)
00114P 0087 85 00      A        BITA   #READY
00115P 0089 26 64 00EF          BNE    RRECBX    EXIT IF (READY) = 1
00116P 008B 85 00      A        BITA   #IRG
00117P 008D 26 F1 0080          BNE    RRECB5    LOOP IF (IRG) = 1
00118P 008F DE 00      A        LDX    NAD
00119P 0091 9C 00      A        CPX    STAD
00120P 0093 27 EB 0080          BEQ    RRECB5    IF NAD = STAD THEN LOOP
00121P 0095 D6 00      A        LDAB   FR3
00122P 0097 C5 00      A        BITB   #FTOK
00123P 0099 27 05 00A0          BEQ    RRECB6
00124P 009B 86 00      A        LDAA   #TERR     IF FTOK = 1
00125P 009D 7E 0000    A        JMP    CFLG3     ... THEN TERR _ 0 AND EXIT
00126P 00A0 7D 0000    A RRECB6 TST    CRC
```

```
00127P 00A3 27 05 00AA            BEQ     RRECB7
00128P 00A5 86 00       A         LDAA    #TERR       IF CRC <> 0
00129P 00A7 BD 0000     A         JSR     SFLG3       ... THEN TERR _ 1
00130P 00AA 96 00       A RRECB7  LDAA    FR2
00131P 00AC 85 00       A         BITA    #FTT
00132P 00AE 27 3F 00EF            BEQ     RRECBX      EXIT IF FTT = 0
00133P 00B0 09                    DEX
00134P 00B1 09                    DEX                 (NAD _ NAD-2 FOR COMPARE)
00135P 00B2 9C 00       A         CPX     STAD
00136P 00B4 27 2A 00E0            BEQ     RRECBB      BRANCH IF NAD-STAD = 2
00137P 00B6 96 00       A         LDAA    FR3
00138P 00B8 85 00       A         BITA    #TERR
00139P 00BA 26 10 00CC            BNE     RRECB8
00140P 00BC 86 00       A         LDAA    #FTOK       IF TERR = 0 THEN
00141P 00BE BD 0000     A         JSR     SFLG3       ... FTOK _ 1
00142P 00C1 CE 01A9     A         LDX     #425
00143P 00C4 BD 0000     A         JSR     DELAY       ... WAIT 30 MS
00144P 00C7 CE 0000     A         LDX     #BATT
00145P 00CA 20 02 00CE            BRA     RRECB9      ... AND NAD _ BATT
00146P 00CC DE 00       A RRECB8  LDX     STAD        ... ELSE NAD _ STAD
00147P 00CE DF 00       A RRECB9  STX     NAD
00148P 00D0 86 00       A         LDAA    #FTT
00149P 00D2 BD 0000     A         JSR     CFLG2       FTT _ 0
00150P 00D5 86 00       A         LDAA    #TERR
00151P 00D7 BD 0000     A         JSR     CFLG3       TERR _ 0
00152P 00DA 86 AA       A         LDAA    #$AA
00153P 00DC 97 00       A         STAA    CRC         CRC _ AAH
00154P 00DE 20 A0 0080            BRA     RRECB5      LOOP
00155                         *
00156P 00E0 7F 0000     A RRECBB  CLR     NRN         NRN _ 0
00157P 00E3 96 00       A         LDAA    FR3
00158P 00E5 85 00       A         BITA    #TERR
00159P 00E7 26 06 00EF            BNE     RRECBX
00160P 00E9 DE 00       A         LDX     STAD        IF TERR = 0
00161P 00EB A6 00       A         LDAA    X           ... THEN NRN _ (STAD)
00162P 00ED 97 00       A         STAA    NRN
00163P 00EF 39            RRECBX  RTS                 EXIT
00164                         *
00165                         * WRITE MARKS (SHEET 1) - PAGE 4I
00167                         *
00168P 00F0 86 00       A WMARKS  LDAA    #TERR
00169P 00F2 BD 0000     A         JSR     CFLG3       TERR _ 0
00170P 00F5 8D 57 014E            BSR     RTBOT       REWIND TO BOT
00171P 00F7 B6 0000     A         LDAA    TSTAT
00172P 00FA 85 00       A         BITA    #BOT
00173P 00FC 26 4D 014B            BNE     WMK4        EXIT IF BOT = 1
00174P 00FE BD 0000     A         JSR     TRUNR       RUN TAPE
00175P 0101 CE 1631     A         LDX     #5681
00176P 0104 BD 0000     A         JSR     DELAY       WAIT 400 MS
00177P 0107 7F 0000     A         CLR     RESET       RESET DRIVE ELECTRONICS
00178P 010A CE 01A9     A         LDX     #425
00179P 010D BD 0000     A         JSR     DELAY       WAIT 30 MS
00180P 0110 BD 0000     A         JSR     SCNMOD      SCAN MODE CONTROLS
00181P 0113 B6 0000     A         LDAA    TSTAT
00182P 0116 85 00       A         BITA    #READY
00183P 0118 26 31 014B            BNE     WMK4        IF (READY) = 1 THEN EXIT
00184P 011A 7F 0000     A         CLR     CLRRW       SET TO WRITE
00185P 011D 7F 0000     A         CLR     RESET       RESET DRIVE ELECTRONICS
00186P 0120 B6 0000     A         LDAA    TSTAT
00187P 0123 85 00       A         BITA    #READY
00188P 0125 27 08 012F            BEQ     WMK2
00189P 0127 86 07       A         LDAA    #7
00190P 0129 B7 0000     A         STAA    DIM         DIM _ 7
00191P 012C 7E 0000     A         JMP     DSPDIM      DISPLAY DIM 00193P 012F 7F 0000     A WMK2    CLR     RUN         RUN TAPE
00194P 0132 86 0C       A         LDAA    #12         AW _ MDW; MDW _ "INDEXING
00195P 0134 BD 0000     A         JSR     MDWMSG      ... TAPE - WAIT 60 SEC. "
00196P 0137 CE 017F     A         LDX     #383
00197P 013A BD 0000     A         JSR     DELAY       WAIT 27 MS
00198P 013D C6 FE       A         LDAB    #254        SET UP TO WRITE TEST RECORD
00199P 013F BD 0222     P         JSR     WMKX        WRITE CONTENTS OF ACCB TO TAPE
00200                         *                       AS A 1 BYTE RECORD.
```

```
00202P 0142 8D 0A 014E        BSR    RTBOT    REWIND TO BOT
00203P 0144 B6 0000    A      LDAA   TSTAT
00204P 0147 85 00      A      BITA   #BOT     IF BOT = 0 THEN
00205P 0149 27 3B 0186        BEQ    WMKSB    ... WRITE MARKS (SHEET2)
00206                      *                   ... AND EXIT
00207                      *
00208P 014B 7E 0000    A WMK4 JMP    EMODE1   ENTER MODE M1
00210                      *
00211                      * REWIND TO BOT - PAGE 4J
00212                      *
00213P 014E BD 0000    A RTBOT JSR   TSTOP    WAIT 5 MS., STOP,
00214                      *                   WAIT 200 MS., SET RW
00215P 0151 7F 0000    A      CLR    RESET    (RESET) _ "XX"
00216P 0154 B6 0000    A      LDAA   TSTAT
00217P 0157 85 00      A      BITA   #READY   IS (READY) = 0?
00218P 0159 26 23 017E        BNE    RTBOT4   IF NOT...BRANCH
00219P 015B 7F 0000    A      CLR    CLRFR    SET FOR REVERTSE MOTION
00220P 015E 7F 0000    A      CLR    RUN      RUN TAPE
00221P 0161 B6 0000    A RTBOT1 LDAA TSTAT
00222P 0164 85 00      A      BITA   #BOT
00223P 0166 27 0F 0177        BEQ    RTBOT3   STOP TAPE AND EXIT IF BOT = 0
00224P 0168 85 00      A      BITA   #READY
00225P 016A 26 05 0171        BNE    RTBOT2   BRANCH IF READY = 1
00226P 016C BD 0000    A      JSR    SCNMOD   SCAN MODE CONTROLS
00227P 016F 20 F0 0161        BRA    RTBOT1

00229P 0171 CE 6EF8    A RTBOT2 LDX  #28408
00230P 0174 BD 0000    A      JSR    DELAY    WAIT 2 SEC
00231P 0177 BD 0000    A RTBOT3 JSR  TSTOP    STOP TAPE, SET READING FLAGS
00232P 017A 7F 0000    A      CLR    SETFR    SET FOR FORWARD MOTION
00233P 017D 39                RTS             EXIT RTBOT 00235P 017E 86 06      A RTBOT4 LDAA #6
00236P 0180 B7 0000    A      STAA   DIM      DIM _ 6
00237P 0183 7E 0000    A      JMP    DSPDIM   DISPLAY DIM ... AND EXIT
00239                      *
00240                      * WRITE MARKS (SHEET 2) - PAGE 4K
00241                      *
00242P 0186 BD 0000    A WMKSB JSR   TRUNR    RUN, SET FLAGS FOR READING
00243P 0189 CE 058C    A      LDX    #1420
00244P 018C BD 0000    A      JSR    DELAY    WAIT 100 MS
00245P 018F 7F 0000    A      CLR    RESET    RESET DRIVE ELECTRONICS
00246P 0192 BD 0000    A      JSR    TRUNR    RUN TAPE, SET READING FLAGS
00247P 0195 BD 0000    P      JSR    RREC     TRY TO READ A RECORD
00248P 0198 8D B4 014E        BSR    RTBOT    REWIND TO BOT
00249P 019A 7F 0000    A      CLR    NRN      NRN _ 0
00250P 019D B6 0000    A      LDAA   TSTAT
00251P 01A0 85 00      A      BITA   #BOT
00252P 01A2 26 4B 01EF        BNE    WMKBXT   EXIT IF (BOT) = 1
00253P 01A4 7F 0000    A      CLR    RUN      RUN TAPE
00254P 01A7 CE 0B18    A      LDX    #2840
00255P 01AA BD 0000    A      JSR    DELAY    WAIT 200 MS
00256P 01AD 7F 0000    A      CLR    RESET    RESET DRIVE ELECTRONICS
00257P 01B0 7F 0000    A      CLR    CLRRW    SET TO READ
00258P 01B3 7F 0000    A      CLR    RUN      RUN TAPE
00259P 01B6 CE 1631    A      LDX    #5681
00260P 01B9 BD 0000    A      JSR    DELAY    WAIT 400 MS
00261P 01BC BD 0000    A      JSR    TSTOP    STOP TAPE
00262P 01BF 96 00      A      LDAA   FR3
00263P 01C1 85 00      A      BITA   #TERR
00264P 01C3 26 24 01E9        BNE    WMKBXS   EXIT IF TERR = 1
00265P 01C5 8D 87 014E        BSR    RTBOT    REWIND TO BOT
00266P 01C7 B6 0000    A      LDAA   TSTAT
00267P 01CA 85 00      A      BITA   #BOT
00268P 01CC 26 21 01EF        BNE    WMKBXT   EXIT IF (BOT) = 1
00269P 01CE 7F 0000    A      CLR    RUN      RUN TAPE
00270P 01D1 B6 0000    A WMKB1 LDAA  TSTAT
00271P 01D4 85 00      A      BITA   #READY
00272P 01D6 26 F9 01D1        BNE    WMKB1    LOOP UNTIL (READY) = 0
00273P 01D8 BD 0000    A      JSR    TSTOP    STOP TAPE
00274P 01DB 7F 0000    A      CLR    CLRRW    SET TO WRITE
00275P 01DE 7F 0000    A      CLR    RUN      RUN TAPE
00276P 01E1 CE 0F41    A      LDX    #3905
00277P 01E4 BD 0000    A      JSR    DELAY    WAIT 275 MS
00278P 01E7 20 09 01F2        BRA    WMKC     WRITE MARKS (SHEET 3) AND EXIT
```

```
00280P 01E9 86 02      A  WMKBXS LDAA    #2
00281P 01EB B7 0000    A         STAA    DIM         DIM _ 2
00282P 01EE 39                   RTS                 EXIT 00284P 01EF 7E 0000    A  WMKBXT JMP     EMODE1      ENTER MODE M1
00286                            *
00287                            * WRITE MARKS (SHEET 3) - PAGE 4L
00288                            *
00289P 01F2 7F 0000    A  WMKC   CLR     RMN         RMN _ 0
00290P 01F5 20 0E 0205           BRA     WMKC4       ENTER LOOP
00291                            *
00292P 01F7 CE 0000    A  WMKC2  LDX     #BAAD
00293P 01FA DF 00      A         STX     STAD        STAD _ #BAAD
00294P 01FC BD 0000    A         JSR     WREC        WRITE A RECORD, USING DATA
00295                                                STARTING AT STAD
00296                            *
00297P 01FF CE 0A5F    A         LDX     #2655
00298P 0202 BD 0000    A         JSR     DELAY       WAIT 187 MS (SUPER IRG)
00299P 0205 7C 0000    A  WMKC4  INC     RMN         RMN _ RMN + 1
00300P 0208 F6 0000    A         LDAB    RMN
00301P 020B 8D 15 0222           BSR     WMKX        WRITE RECORD NUMBER TO TAPE
00302                            *                   AS A 1 BYTE RECORD.

00304P 020D CE 0353    A         LDX     #851
00305P 0210 BD 0000    A         JSR     DELAY       WAIT 60 MS (MARK-RECORD IRG)
00306P 0213 B6 0000    A         LDAA    RMN
00307P 0216 81 65      A         CMPA    #101
00308P 0218 26 DD 01F7           BNE     WMKC2       LOOP UNTIL RMN = 101
00309                            *
00310P 021A BD 0000    A         JSR     TSTOP       STOP TAPE
00311P 021D 86 03      A         LDAA    #3
00312P 021F 7E 0000    A         JMP     DOMOVE      MDW _ AW AND EXIT

00314                            * WMKX - WRITES CONTENTS OF ACCB TO TAPE AS A
00315                            *        1 BYTE RECORD (PLUS CRC BYTE).
00316                            *
00317P 0222 37            WMKX   PSHB                SAVE FOR LATER

00319                            * SEE NOTE ON CRC GENERATION ON FLOW PAGE 4H 00321P 0223 86 AA      A         LDAA    #$AA
00322P 0225 CE 0010    A         LDX     #16         LOOP CONTROL 00324P 0228 58            WMKX1  ASLB
00325P 0229 49                   ROLA
00326P 022A 24 02 022E           BCC     WMKX2
00327P 022C 88 00      A         EORA    #GENPLY
00328P 022E 09            WMKX2  DEX
00329P 022F 26 F7 0228           BNE     WMKX1

00331P 0231 33                   PULB                GET DATA BYTE AGAIN
00332P 0232 F7 0000    A         STAB    TWRITE      (TWRITE) _ DATA 00334P 0235 F6 0000    A  WMKX3  LDAB    TSTAT       GET TAPE STATUS
00335P 0238 C5 00      A         BITB    #WBEMP      IS (WBEMP) = 0?
00336P 023A 26 F9 0235           BNE     WMKX3       IF NOT...CONTINUE TO LOOP 00338P 023C B7 0000    A         STAA    TWRITE      (TWRITE) _ CRC
00339P 023F 39                   RTS
00341P 0240    00      A         FCB     0           CRC BYTE
00342                            END
TOTAL ERRORS 00000

R       BAAD    00014*00292
R       BATT    00014*00144
R       BOT     00014*00172 00204 00222 00251 00267
RP      CFLG2   00010*00149
RP      CFLG3   00010*00125 00151 00169
R       CLRFR   00014*00045 00219
R       CLRRW   00014*00184 00257 00274
RB      CRC     00006*00099 00108 00126 00153
```

```
RP       DELAY   00010*00048 00054 00143 00176 00179 00197 00230 00244 00255
                 00260 00277 00298 00305
RD       DIM     00008*00190 00236 00281
RP       DOMOVE  00012*00312
RP       DSPDIM  00010*00191 00237
RP       EMODE1  00010*00070 00208 00284
RB       FR2     00006*00130
RB       FR3     00006*00038 00121 00137 00157 00262
R        FTOK    00016*00122 00140
R        FTT     00014*00131 00148
R        GENPLY  00017*00105 00327
R        INCCHR  00014*00078
R        IRG     00014*00051 00056 00116
RP       MDWMSG  00011*00195
R        NAD     00006*00033 00082 00086 00118 00147
RB       NRN     00006*00156 00162 00249
RD       NTR     00008*00028 00041 00061
R        RBFULL  00015*00112
R        READY   00015*00036 00067 00114 00182 00187 00217 00224 00271
R        RESET   00015*00177 00185 00215 00245 00256
RD       RMN     00008*00289 00299 00300 00306
 P 005C  RRAXIT  00040 00043 00072*
DP 0000  RREC    00019 00027*00247
 P 0009  RREC1   00032*00065
 P 0032  RREC2   00050*00057 00068
 P 0055  RREC3   00052 00067*
 P 0059  RREC4   00037 00070*
 P 0080  RRECB   00034 00110*
 P 005D  RRECB3  00078*00113
 P 0066  RRECB4  00079 00082*
 P 0080  RRECB5  00111*00117 00120 00154
 P 00A0  RRECB6  00123 00126*
 P 00AA  RRECB7  00127 00130*
 P 00CC  RRECB8  00139 00146*
 P 00CE  RRECB9  00145 00147*
 P 00E0  RRECBB  00136 00156*
 P 0075  RRECBC  00102*00107
 P 007B  RRECBD  00104 00106*
 P 00EF  RRECBX  00115 00132 00159 00163*
DP 014E  RTBOT   00019 00170 00202 00213*00248 00265
 P 0161  RTBOT1  00221*00227
 P 0171  RTBOT2  00225 00229*
 P 0177  RTBOT3  00223 00231*
 P 017E  RTBOT4  00218 00235*
R        RUN     00015*00046 00193 00220 00253 00258 00269 00275
RP       SCNMOD  00011*00180 00226
R        SETFR   00015*00232
RP       SFLG3   00011*00081 00129 00141
RB       STAD    00006*00029 00032 00064 00119 00135 00146 00160 00293
RB       TAD     00006*00030 00063
R        TERR    00016*00039 00080 00124 00128 00138 00150 00158 00168 00263
R        TREAD   00016*00083
RP       TRUNR   00012*00062 00174 00242 00246
R        TSTAT   00016*00035 00050 00055 00111 00171 00181 00186 00203 00216
                 00221 00250 00266 00270 00334
RP       TSTOP   00012*00044 00059 00213 00231 00261 00273 00310
R        TWRITE  00016*00332 00338
R        WBEMP   00016*00335
DP 00F0  WMARKS  00019 00168*
 P 012F  WMK2    00188 00193*
 P 0148  WMK4    00173 00183 00208*
 P 01D1  WMKB1   00270*00272
 P 01E9  WMKBXS  00264 00280*
 P 01EF  WMKBXT  00252 00268 00284*
 P 01F2  WMKC    00278 00289*
 P 01F7  WMKC2   00292*00308
 P 0205  WMKC4   00290 00299*
 P 0186  WMKSB   00205 00242*
 P 0222  WMKX    00199 00301 00317*
 P 0228  WMKX1   00324*00329
 P 022E  WMKX2   00326 00328*
 P 0235  WMKX3   00334*00336
R        WREC    00012*00294
```

```
00001                           NAM    F4M
00002                           OPT    REL, CREF, LLEN=80
00003                           TTL    FLOW PAGES 4M THRU 4X
00004                           IDNT   FEB.  15, 1978

00006                           XREF   BSCT:CRC, FR2, FR3, K2, LD, LI, NAD, TEMP, XM
00007                           XREF   BSCT:M1, M2, MTR1, MTR2, NRN, STAD, T4

00009                           XREF   DSCT:DIM, NOBY

00011                           XREF   PSCT:CFLG2, CFLG3, DELAY, DSPDIM, FNRN, RREC
00012                           XREF   PSCT:SCNMOD, SCRL1A, SCRL1C, SFLG2, SFLG3
00013                           XREF   PSCT:RWND, MULT8, SCLDN1

00015                           XREF   BAAD, BATT, CLRFR, CONF
00016                           XREF   FIRG, FTT, IRG, JL1OFS, JL2OFS
00017                           XREF   READY, REW, RUN, SETFR, SETRW, STOP, TERR
00018                           XREF   TSTAT, TWRITE, CLRRW, TREAD, FTOK, RESET
00019                           XREF   BATTMS, BATTLS, WBEMP, GENPLY

00021                           XDEF   RMR1R2, WRT7, WREC
00022                           XDEF   TSTOP, TRUNR, SREAD, WORER1

00024P 0000                     PSCT
00026                     *
00027                     * READ MTR1 THROUGH MTR2, START STORAGE AT BADS(LI)
00028                     *    OR BATT+140*LI - PAGE 4M
00029                     *
00030P 0000 BD 00AC  P RMR1R2  JSR   GMTRA      MOVE TAPE SO THAT NRN = MTR1
00031P 0003 20 13 0018         BRA   R1R22      ENTER LOOP
00032                     *
00033P 0005 86 06     A R1R21  LDAA  #6
00034P 0007 91 00     A        CMPA  LI         IS LI = 6?
00035P 0009 26 07 0012         BNE   R1R21A     IF NOT... BRANCH
00036P 000B 91 00     A        CMPA  M1         IS M1 = 6?
00037P 000D 26 03 0012         BNE   R1R21A     IF NOT... BRANCH
00038P 000F 4C                 INCA             ACCA _ 7
00039P 0010 97 00     A        STAA  LI         LI _ 7
00040P 0012 7C 0000   A R1R21A INC   MTR1       MTR1 _ MTR1 + 1
00041P 0015 7C 0000   A        INC   LI         LI _ LI + 1
00042P 0018 96 00     A R1R22  LDAA  NRN
00043P 001A 91 00     A        CMPA  MTR1
00044P 001C 26 22 0040         BNE   R1R26      EXIT MODE IF NRN <> MTR1
00045P 001E BD 0263   P        JSR   SREAD      SET FLAGS FOR READING
00046P 0021 96 00     A        LDAA  LI
00047P 0023 D6 00     A        LDAB  M1
00048P 0025 C1 07     A        CMPB  #7
00049P 0027 26 22 004B         BNE   R1R22A
00050P 0029 D6 00     A        LDAB  XM
00051P 002B C1 04     A        CMPB  #4         IS XM = 4?
00052P 002D 27 25 0054         BEQ   R1R22B     IF YES... BRANCH
00053                     *                     IF M1 = 7 AND XM <> 4 THEN
00054P 002F C6 46     A        LDAB  #70
00055P 0031 BD 0000   A        JSR   MULT8      ... A, B _ LI * 70
00056P 0034 58                 ASLB
00057P 0035 49                 ROLA             ... A, B _ (LI*70) * 2
00058P 0036 CB 00     A        ADDB  #BATTLS
00059P 0038 89 00     A        ADCA  #BATTMS    ... A, B _ A, B + BATT
00060P 003A 97 00     A        STAA  STAD
00061P 003C D7 01     A        STAB  STAD+1     ... STAD _ A, B
00062P 003E 20 14 0054         BRA   R1R22B 00064P 0040 86 05     A R1R26  LDAA  #5
00065P 0042 B7 0000   A        STAA  DIM        DIM _ 5
00066P 0045 7E 0000   A        JMP   DSPDIM     DISPLAY DIM 00068P 0048 7E 0247   P R1R27  JMP   TSTOP      STOP TAPE ... AND EXIT
00069                     *
```

```
00070P 004B BD 0000   A R1R22A JSR     SCRL1C
00071P 004E 6D 00     A        TST     JL1OFS,X   IS J(LI,1) = 0?
00072P 0050 26 02 0054         BNE     R1R22B     IF NOT ... BRANCH
00073P 0052 DF 00     A        STX     STAD       ... ELSE STAD _ BADS(LI)
00074                        *
00075P 0054 BD 0000   A R1R22B JSR     RREC       TRY TO READ RECORD
00076P 0057 96 00     A        LDAA    LI
00077P 0059 BD 0000   A        JSR     SCRL1C     POINT TO J(LI)
00078P 005C 96 00     A        LDAA    M1
00079P 005E 91 00     A        CMPA    M2
00080P 0060 26 E6 0048         BNE     R1R27      STOP TAPE AND EXIT IF M1 <> M2
00081P 0062 81 07     A        CMPA    #7         IS M1 = 7?
00082P 0064 26 08 006E         BNE     R1R22C     IF NOT... BRANCH
00083P 0066 96 00     A        LDAA    FR3
00084P 0068 85 00     A        BITA    #TERR      IS TERR = 1?
00085P 006A 27 31 009D         BEQ     R1R25      IF NOT... BRANCH
00086P 006C 20 1E 008C         BRA     R1R23A
00087P 006E 6D 00     A R1R22C TST     JL1OFS,X   IS J(LI,1) = 0?
00088P 0070 26 2B 009D         BNE     R1R25      IF NOT... BRANCH
00089P 0072 86 00     A        LDAA    #TERR
00090P 0074 95 00     A        BITA    FR3        IS TERR = 1?
00091P 0076 26 09 0081         BNE     R1R23      IF YES... BRANCH
00092P 0078 5F                 CLRB               PRESET ACCB TO DTO " "
00093P 0079 6D 00     A        TST     JL2OFS,X   IS JL(LI,2) = 0?
00094P 007B 27 19 0096         BEQ     R1R24      IF YES... BRANCH
00095P 007D C6 11     A        LDAB    #17        ACCB _ DTO "R"
00096P 007F 20 15 0096         BRA     R1R24

00098P 0081 6F 00     A R1R23  CLR     JL2OFS,X   J(LI,2) _ 0
00099P 0083 C6 0C     A        LDAB    #12        ACCB _ DTO "E"
00100P 0085 96 00     A        LDAA    LI
00101P 0087 BD 0000   A        JSR     SCRL1A     POINT TO DW(LI),1
00102P 008A E7 00     A        STAB    0,X        DW(LI),1 _ "E"
00103P 008C 86 03     A R1R23A LDAA    #3
00104P 008E B7 0000   A        STAA    DIM        DIM _ 3
00105P 0091 BD 0000   A        JSR     DSPDIM     DISPLAY DIM
00106P 0094 20 0A 00A0         BRA     R1R25A 00108P 0096 96 00     A R1R24  LDAA    LI
00109P 0098 BD 0000   A        JSR     SCRL1A     POINT TO DW(LI),1
00110P 009B E7 00     A        STAB    0,X        SET DW(LI),1
00111P 009D BD 0263   P R1R25  JSR     SREAD      SET FLAGS FOR READING
00112P 00A0 BD 0000   A R1R25A JSR     RREC       TRY TO READ RECORD
00113P 00A3 96 00     A        LDAA    MTR1
00114P 00A5 91 00     A        CMPA    MTR2
00115P 00A7 27 9F 0048         BEQ     R1R27
00116P 00A9 7E 0005   P        JMP     R1R21      LOOP IF MTR1 <> MTR2
00118                        *
00119                        * MOVE TAPE SO THAT NRN = MTR1 (SHEET 1) - PAGE 4N
00120                        *
00121P 00AC 96 00     A GMTRA  LDAA    M1
00122P 00AE 81 07     A        CMPA    #7         IS M1 = 7? (IE. TRANSCRIBE MODE?)
00123P 00B0 26 05 00B7         BNE     GMTRAZ     IF NOT... BRANCH
00124P 00B2 BD 0000   A        JSR     FNRN       FIND NRN,
00125                        *                    WRITES MARKS IF REQUIRED,
00126                        *                    DISPLAY MESSAGES AS REQUIRED
00127P 00B5 20 03 00BA         BRA     GMTRA0

00129P 00B7 7F 0000   A GMTRAZ CLR     RESET      (RESET) _ XX 00131P 00BA 86 00     A GMTRA0 LDAA    #REW
00132P 00BC BD 0000   A        JSR     CFLG3      REW _ 0
00133P 00BF 96 00     A        LDAA    NRN
00134P 00C1 91 00     A        CMPA    MTR1
00135P 00C3 27 6D 0132         BEQ     GMTRB      EXIT TO SHEET 2 IF NRN = MTR1
00136P 00C5 23 0D 00D4         BLS     GMTRA1     IF NRN > MTR1 THEN
00137P 00C7 7F 0000   A        CLR     CLRFR      ... SET FOR REVERSE MOTION
00138P 00CA 7C 0000   A        INC     NRN        ... NRN _ NRN + 1
00139P 00CD 86 00     A        LDAA    #REW
00140P 00CF BD 0000   A        JSR     SFLG3      ... AND REW _ 1
00141P 00D2 20 03 00D7         BRA     GMTRA2
00142P 00D4 7F 0000   A GMTRA1 CLR     SETFR      ... ELSE SET FOR FORWARD MOTION
00143P 00D7 7F 0000   A GMTRA2 CLR     SETRW      SET TO READ
00144P 00DA 7F 0000   A        CLR     RUN        RUN TAPE
```

```
00145P 00DD 86 00      A  GMTRA3 LDAA  #FIRG
00146P 00DF BD 0000    A         JSR   CFLG3    FIRG _ 0
00147P 00E2 B6 0000    A  GMTRA4 LDAA  TSTAT
00148P 00E5 85 00      A         BITA  #IRG
00149P 00E7 26 07 00F0           BNE   GMTRA5
00150P 00E9 86 00      A         LDAA  #FIRG    IF (IRG) = 0 (TRUE)
00151P 00EB BD 0000    A         JSR   SFLG3    ... THEN FIRG _ 1
00152P 00EE 20 06 00F6           BRA   GMTR5A 00154P 00F0 96 00      A  GMTRA5 LDAA  FR3
00155P 00F2 85 00      A         BITA  #FIRG    ... ELSE IF FIRG = 1
00156P 00F4 26 18 010E           BNE   GMTRA8   ...... THEN BRANCH 00158P 00F6 B6 0000    A  GMTR5A LDAA  TSTAT
00159P 00F9 85 00      A         BITA  #READY   IS READY = 0?
00160P 00FB 26 0C 0109           BNE   GMTR6A   IF NOT...BRANCH
00161P 00FD 20 E3 00E2           BRA   GMTRA4

00163P 00FF BD 0000    A  GMTRA6 JSR   SCNMOD   SCAN MODE CONTROLS
00164P 0102 F6 0000    A         LDAB  TSTAT
00165P 0105 C5 00      A         BITB  #READY   IF (READY) = 0 THEN
00166P 0107 27 D4 00DD           BEQ   GMTRA3   ... LOOP 00168P 0109 7F 0000    A  GMTR6A CLR   M2       M2 _ 0
00169P 010C 20 F1 00FF           BRA   GMTRA6
00170                          *
00171P 010E CE 0046    A  GMTRA8 LDX   #70
00172P 0111 BD 0000    A         JSR   DELAY    WAIT 5 MS
00173P 0114 B6 0000    A         LDAA  TSTAT
00174P 0117 85 00      A         BITA  #IRG
00175P 0119 26 E4 00FF           BNE   GMTRA6   LOOP IF (IRG) = 1 (FALSE)
00176P 011B 96 00      A         LDAA  FR3
00177P 011D 85 00      A         BITA  #REW
00178P 011F 27 05 0126           BEQ   GMTRA9   IF REW = 1 THEN
00179P 0121 7A 0000    A         DEC   NRN      ... NRN _ NRN - 1
00180P 0124 20 03 0129           BRA   GMTRAA
00181P 0126 7C 0000    A  GMTRA9 INC   NRN      ... ELSE NRN _ NRN + 1
00182P 0129 96 00      A  GMTRAA LDAA  MTR1
00183P 012B 91 00      A         CMPA  NRN
00184P 012D 26 D0 00FF           BNE   GMTRA6   IF NRN <> MTR1 THEN LOOP
00185                          *
00186P 012F BD 0247    P         JSR   TSTOP    STOP TAPE, JOIN SHEET 2 AND EXIT
00188                          *
00189                          * MOVE TAPE SO THAT NRN = MTR1 (SHEET 2) - PAGE 40
00190                          *
00191P 0132 96 00      A  GMTRB  LDAA  FR3
00192P 0134 85 00      A         BITA  #REW
00193P 0136 26 0F 0147           BNE   GMTRB1   IF REW = 0 THEN
00194P 0138 7F 0000    A         CLR   CLRFR    ... SET FOR REVERSE MOTION
00195P 013B 7F 0000    A         CLR   RUN      ... RUN TAPE
00196P 013E CE 018D    A         LDX   #397
00197P 0141 BD 0000    A         JSR   DELAY    ... WAIT 28 MS
00198P 0144 BD 0247    P         JSR   TSTOP    ... AND STOP TAPE
00199P 0147 BD 025A    P  GMTRB1 JSR   TRUNR    RUN, SET TO READ
00200P 014A BD 0000    A         JSR   RREC     TRY TO READ RECORD
00201P 014D DE 00      A         LDX   NAD
00202P 014F 09                   DEX
00203P 0150 09                   DEX            (INDEX _ NAD - 2)
00204P 0151 9C 00      A         CPX   STAD
00205P 0153 26 07 015C           BNE   GMTRB2   BRANCH IF NAD - STAD <> 2
00206P 0155 96 00      A         LDAA  FR3
00207P 0157 85 00      A         BITA  #TERR
00208P 0159 26 01 015C           BNE   GMTRB2   BRANCH IF TERR = 1
00209P 015B 39                   RTS            EXIT
00210P 015C 86 04      A  GMTRB2 LDAA  #4
00211P 015E B7 0000    A         STAA  DIM      DIM _ 4
00212P 0161 7E 0000    A         JMP   DSPDIM   DISPLAY DIM ... AND EXIT
00214                          *
00215                          * IN PRGM MODE,
00216                          * WRITE TRACE(LD) AS RECORD K2+LD-8
00217                          *
00218                          * FLOW PAGE 4P
00219                          *
00220P 0164 96 00      A  WRT7   LDAA  K2
00221P 0166 80 08      A         SUBA  #8
```

```
00222P 0168 9B 00    A          ADDA    LD
00223P 016A 97 00    A          STAA    MTR1       MTR1 _ K2+LD-8
00224P 016C 96 00    A          LDAA    LD
00225P 016E BD 0000  A          JSR     SCRL1A     FIND DW(LD)
00226P 0171 A6 00    A          LDAA    0,X        GET DW(LD),1
00227P 0173 81 10    A          CMPA    #16        IS DW(LD),1 = "P"?
00228P 0175 26 3C 01B3          BNE     WRT74      IF NOT...BRANCH AND EXIT
00229P 0177 8D 3B 01B4          BSR     WORER1     PREPARE TO WRITE OR ERASE MTR1

00231P 0179 B6 0000  A          LDAA    DIM        IS DIM = 0?
00232P 017C 26 35 01B3          BNE     WRT74      IF NOT...BRANCH AND EXIT
00233P 017E 96 00    A          LDAA    LD
00234P 0180 BD 0000  A          JSR     SCRL1C     POINT TO TRACE(LD)
00235P 0183 A6 00    A          LDAA    JL1OFS,X
00236P 0185 81 02    A          CMPA    #2         IS J(LD,1) = 2?
00237P 0187 27 08 0191          BEQ     WRT71      IF YES...BRANCH 00239P 0189 6F 00    A          CLR     JL1OFS,X   J(LD,1) _ 0
00240P 018B 96 00    A          LDAA    MTR1
00241P 018D A7 00    A          STAA    JL2OFS,X   J(LD,2) _ MTR1

00243                    *              INDEX REG = BADS(LD)

00245P 018F 20 03 0194          BRA     WRT72

00247P 0191 CE 0000  A WRT71    LDX     #BAAD      STAD _ BAAD 00249P 0194 DF 00    A WRT72    STX     STAD       SET STAD 00251P 0196 8D 5F 01F7          BSR     WREC       WRITE A RECORD STARTING AT STAD
00252P 0198 CE 047E  A          LDX     #1150
00253P 019B BD 0000  A          JSR     DELAY      WAIT 81 MS.
00254P 019E BD 0247  P          JSR     TSTOP      WAIT 5 MS., STOP,
00255                    *                         WAIT 200 MS., SET RW
00256P 01A1 96 00    A          LDAA    MTR1
00257P 01A3 97 00    A          STAA    NRN        NRN _ MTR1
00258P 01A5 96 00    A          LDAA    LD
00259P 01A7 BD 0000  A          JSR     SCRL1C     POINT TO TRACE(LD)
00260P 01AA 6F 00    A          CLR     JL1OFS,X   J(LD,1) _ 0
00261P 01AC BD 0000  A          JSR     RWND       REWIND TO MARK OR BOT
00262P 01AF 86 C7    A          LDAA    #199
00263P 01B1 97 00    A          STAA    T4         T4 _ 199

00265P 01B3 39          WRT74   RTS                EXIT WRT?
00267                    *
00268                    * PREPARE TO WRITE OR ERASE MTR1 - PAGE 4R
00269                    *
00270P 01B4 BD 00AC  P WORER1   JSR     GMTRA      MOVE TAPE SO THAT NRN = MTR1
00271P 01B7 BD 0247  P          JSR     TSTOP      STOP TAPE, SET TO READ
00272P 01BA 7F 0000  A          CLR     CLRRW      SET TO WRITE
00273P 01BD 7F 0000  A          CLR     RESET      RESET TAPE
00274P 01C0 7F 0000  A          CLR     DIM        DIM _ 0
00275P 01C3 B6 0000  A          LDAA    TSTAT
00276P 01C6 85 00    A          BITA    #READY     IS READY = 0?
00277P 01C8 27 23 01ED          BEQ     WER12      IF YES...BRANCH
00278P 01CA 86 07    A          LDAA    #7
00279P 01CC B7 0000  A          STAA    DIM        DIM _ 7
00280P 01CF 86 00    A          LDAA    #CONF
00281P 01D1 BD 0000  A          JSR     SFLG3      CONF _ 1
00282P 01D4 BD 0000  A          JSR     DSPDIM     DISPLAY DIM
00283P 01D7 B6 0000  A          LDAA    DIM
00284P 01DA 81 07    A          CMPA    #7         IS DIM = 7?
00285P 01DC 26 D6 01B4          BNE     WORER1     IF NOT...BRANCH AND LOOP
00286P 01DE 96 00    A          LDAA    M1
00287P 01E0 81 07    A          CMPA    #7         IS M1 = 7?
00288P 01E2 27 12 01F6          BEQ     WER13      IF YES...BRANCH AND EXIT
00289P 01E4 96 00    A          LDAA    K2
00290P 01E6 81 64    A          CMPA    #100       IS K2 = 100?
00291P 01E8 27 0C 01F6          BEQ     WER13      IF YES...BRANCH AND EXIT
00292P 01EA 7E 0000  A          JMP     SCLDN1     WHEN M1 = 3, 4, 5 OR 6, SCROLL
00293                    *                         ALL TRACES DOWN ONE LINE
00294                    *                         ... AND EXIT
```

```
00296P 01ED 7F 0000  A WER12   CLR   RUN         RUN TAPE
00297P 01F0 CE 0353  A         LDX   #851
00298P 01F3 7E 0000  A         JMP   DELAY       WAIT 60 MS AND EXIT 00300P 01F6 39         WER13   RTS               ... EXIT
00302                        *
00303                        * WRITE A RECORD, USING DATA STARTING AT STAD
00304                        *      PAGE 4S
00305                        *
00306P 01F7 86 00    A WREC    LDAA  #FTT
00307P 01F9 BD 0000  A         JSR   SFLG2       FTT _ 1

00309                        * SEE NOTE ON CRC GENERATION ON FLOW PAGE 4H 00311P 01FC DE 00    A WREC1   LDX   STAD        NAD _ STAD
00312P 01FE 86 8C    A         LDAA  #140
00313P 0200 B7 0000  A         STAA  NOBY        NOBY _ 140
00314P 0203 86 AA    A         LDAA  #$AA        CRC _ $AA
00315P 0205 09                 DEX               NAD _ NAD - 1
00316                        *
00317P 0206 08         WREC2   INX               NAD _ NAD + 1
00318P 0207 C6 08    A         LDAB  #8
00319P 0209 D7 00    A         STAB  TEMP
00320P 020B E6 00    A         LDAB  0,X
00321P 020D F7 0000  A         STAB  TWRITE      (TWRITE) _ (NAD)

00323P 0210 58         WREC3   ASLB
00324P 0211 49                 ROLA
00325P 0212 24 02 0216         BCC   WREC4
00326P 0214 88 00    A         EORA  #GENPLY
00327P 0216 7A 0000  A WREC4   DEC   TEMP
00328P 0219 26 F5 0210         BNE   WREC3

00330P 021B F6 0000  A WREC5   LDAB  TSTAT
00331P 021E C5 00    A         BITB  #WBEMP      IS WRITE BUFFER EMPTY?
00332P 0220 26 F9 021B         BNE   WREC5       IF NOT... BRANCH
00333P 0222 7A 0000  A         DEC   NOBY        NOBY _ NOBY - 1
00334P 0225 26 DF 0206         BNE   WREC2       LOOP UNTIL NOBY = 0
00335                        *
00336P 0227 CE 0008  A         LDX   #8          SET UP FOR FINAL DIVIDE 00338P 022A 48         WREC6   ASLA
00339P 022B 24 02 022F         BCC   WREC7
00340P 022D 88 00    A         EORA  #GENPLY
00341P 022F 09         WREC7   DEX
00342P 0230 26 F8 022A         BNE   WREC6
00343                        *
00344P 0232 B7 0000  A         STAA  TWRITE      (TWRITE) _ CRC
00345P 0235 86 00    A         LDAA  #FTT
00346P 0237 95 00    A         BITA  FR2
00347P 0239 27 0B 0246         BEQ   WRECXT      EXIT IF FTT = 0
00348P 023B BD 0000  A         JSR   CFLG2       FTT _ 0
00349P 023E CE 002A  A         LDX   #42
00350P 0241 BD 0000  A         JSR   DELAY       WAIT 3 MS (MINI-IRG)
00351P 0244 20 B6 01FC         BRA   WREC1       WRITE RECORD AGAIN
00352                        *
00353P 0246 39         WRECXT  RTS               EXIT WREC
00355                        *
00356                        * WAIT 5 MS, STOP TAPE, WAIT 200 MS, SET TW - PAGE 4V
00357                        *
00358P 0247 CE 0046  A TSTOP   LDX   #70
00359P 024A BD 0000  A         JSR   DELAY       WAIT 5 MS
00360P 024D 7F 0000  A         CLR   STOP        STOP TAPE
00361P 0250 CE 0B18  A         LDX   #2840
00362P 0253 BD 0000  A         JSR   DELAY       WAIT 200 MS
00363P 0256 7F 0000  A         CLR   SETRW       SET TO READ
00364P 0259 39                 RTS               EXIT

00366                        *
00367                        * RUN, SET READING FLAGS - PAGE 4W
00368                        *
00369P 025A 7F 0000  A TRUNR   CLR   SETFR       SET FOR FORWARD MOTION
```

```
00370P 025D 7F 0000   A           CLR       RUN         RUN TAPE
00371P 0260 7D 0000   A           TST       TREAD       CLEAR READ, BUFFER

00373                             *
00374                             * SET READING FLAGS - PAGE 4X
00375                             *
00376P 0263 86 00     A  SREAD    LDAA      #TERR+FTOK
00377P 0265 BD 0000   A           JSR       CFLG3       TERR _ FTOK _ 0
00378P 0268 86 00     A           LDAA      #FTT
00379P 026A BD 0000   A           JSR       SFLG2       FTT _ 1
00380P 026D 86 AA     A           LDAA      #$AA
00381P 026F 97 00     A           STAA      CRC         CRC _ AAH
00382P 0271 CE 0000   A           LDX       #BATT
00383P 0274 DF 00     A           STX       STAD        STAD _ BATT
00384P 0276 39                    RTS                   EXIT SREAD, TRUNR
00386P 0277    00     A           FCB       0           CRC BYTE
00387                             END
TOTAL ERRORS 00000

R       BAAD      00015*00247
R       BATT      00015*00382
R       BATTLS    00019*00058
R       BATTMS    00019*00059
RP      CFLG2     00011*00348
RP      CFLG3     00011*00132 00146 00377
R       CLRFR     00015*00137 00194
R       CLRRW     00018*00272
R       CONF      00015*00290
RB      CRC       00006*00381
RP      DELAY     00011*00172 00197 00253 00298 00350 00359 00362
RD      DIM       00009*00065 00104 00211 00231 00274 00279 00283
RP      DSPDIM    00011*00066 00105 00212 00282
R       FIRG      00016*00145 00150 00155
RP      FNRN      00011*00124
RB      FR2       00006*00346
RB      FR3       00006*00083 00090 00154 00176 00191 00206
R       FTOK      00018*00376
R       FTT       00016*00306 00345 00378
R       GENPLY    00019*00326 00340
 P 00F6 GMTR5A    00152 00158*
 P 0109 GMTR6A    00160 00168*
 P 00AC GMTRA     00030 00121*00270
 P 00BA GMTRA0    00127 00131*
 P 00D4 GMTRA1    00136 00142*
 P 00D7 GMTRA2    00141 00143*
 P 00DD GMTRA3    00145*00166
 P 00E2 GMTRA4    00147*00161
 P 00F0 GMTRA5    00149 00154*
 P 00FF GMTRA6    00163*00169 00175 00184
 P 010E GMTRA8    00156 00171*
 P 0126 GMTRA9    00178 00181*
 P 0129 GMTRAA    00180 00182*
 P 00B7 GMTRAZ    00123 00129*
 P 0132 GMTRB     00135 00191*
 P 0147 GMTRB1    00193 00199*
 P 015C GMTRB2    00205 00208 00210*
R       IRG       00016*00148 00174
R       JL10FS    00016*00071 00087 00235 00239 00260
R       JL20FS    00016*00093 00098 00241
RB      K2        00006*00220 00289
RB      LD        00006*00222 00224 00233 00258
RB      LI        00006*00034 00039 00041 00046 00076 00100 00108
RB      M1        00007*00036 00047 00078 00121 00286
RB      M2        00007*00079 00168
RB      MTR1      00007*00040 00043 00113 00134 00182 00223 00240 00256
RB      MTR2      00007*00114
R       MULT8     00013*00055
RB      NAD       00006*00201
RD      NOBY      00009*00313 00333
RB      NRN       00007*00042 00133 00138 00179 00181 00183 00257
 P 0005 R1R21     00033*00116
```

```
 P  0012  R1R21A  00035 00037 00040*
 P  0018  R1R22   00031 00042*
 P  004B  R1R22A  00049 00070*
 P  0054  R1R22B  00052 00062 00072 00075*
 P  006E  R1R22C  00082 00087*
 P  0081  R1R23   00091 00098*
 P  008C  R1R23A  00086 00103*
 P  0096  R1R24   00094 00096 00108*
 P  009D  R1R25   00085 00088 00111*
 P  00A0  R1R25A  00106 00112*
 P  0040  R1R26   00044 00064*
 P  0048  R1R27   00063*00080 00115
 R         READY   00017*00159 00165 00276
 R         RESET   00018*00129 00273
 R         REW     00017*00131 00139 00177 00192
 DP 0000  RMR1R2  00021 00030*
 RP        RREC    00011*00075 00112 00200
 R         RUN     00017*00144 00195 00296 00370
 RP        RWND    00013*00261
 RP        SCLDN1  00013*00292
 RP        SCNMOD  00012*00163
 RP        SCRL1A  00012*00101 00109 00225
 RP        SCRL1C  00012*00070 00077 00234 00259
 R         SETFR   00017*00142 00369
 R         SETRW   00017*00143 00363
 RP        SFLG2   00012*00307 00379
 RP        SFLG3   00012*00140 00151 00281
 DP 9263  SREAD   00022 00045 00111 00376*
 RB        STAD    00007*00060 00061 00073 00204 00249 00311 00383
 R         STOP    00017*00360
 RB        T4      00007*00263
 RB        TEMP    00006*00319 00327
 R         TERR    00017*00084 00089 00207 00376
 R         TREAD   00018*00371
 DP 025A  TRUNR   00022 00199 00369*
 R         TSTAT   00018*00147 00158 00164 00173 00275 00330
 DP 0247  TSTOP   00022 00068 00186 00198 00254 00271 00358*
 R         TWRITE  00018*00321 00344
 R         WBEMP   00019*00331
 P  01ED  WER12   00277 00296*
 P  01F6  WER13   00288 00291 00300*
 DP 01B4  WORER1  00022 00229 00270*00285
 DP 01F7  WREC    00021 00251 00306*
 P  01FC  WREC1   00311*00351
 P  0206  WREC2   00317*00334
 P  0210  WREC3   00323*00328
 P  0216  WREC4   00325 00327*
 P  021B  WREC5   00330*00332
 P  022A  WREC6   00338*00342
 P  022F  WREC7   00339 00341*
 P  0246  WRECXT  00347 00353*
 DP 0164  WRT7    00021 00220*
 P  0191  WRT71   00237 00247*
 P  0194  WRT72   00245 00249*
 P  01B3  WRT74   00228 00232 00265*
 RB        XM      00006*00050
00001                         NAM    F5A
00002                         OPT    REL, CREF, LLEN=80
00003                         TTL    FLOW PAGES 5A AND 5B
00004                         IDNT   NOV.  15, 1977

00006                         XREF   BSCT:K2, L1, M1, M2, M3
00007                         XREF   BSCT:PK2, T2, TEMP, TEMP2

00009                         XREF   PSCT:DTOBTD, MOVBLK
00010                         XREF   PSCT:SCAN, SDWL1X, SMDW1

00012                         XREF   DW6, DW7, DW8

00014                         XDEF   MIXED, SCOPE, SDW678
```

```
00016P 0000                              PSCT
00018                          *
00019                          * SCOPE - ENTER SCOPE OR MIXED MODE
00020                          * MIXED -
00021                          *
00022                          * FLOW PAGE 5A
00023                          *
00024           0000   P SCOPE  EQU    *
00025           0000   P MIXED  EQU    *
00026P 0000 96 00    A          LDAA   M1
00027P 0002 81 05    A          CMPA   #5
00028P 0004 27 18 001E          BEQ    SCOPE0     IF YES...BRANCH
00029P 0006 96 00    A          LDAA   M3         IS M3 = 0?
00030P 0008 27 14 001E          BEQ    SCOPE0     IF YES...BRANCH
00031P 000A 96 00    A          LDAA   PK2
00032P 000C 97 00    A          STAA   K2         K2 = PK2
00033P 000E 86 0E    A          LDAA   #14
00034P 0010 97 00    A          STAA   M2         M2 = 14
00035P 0012 7F 0000  A          CLR    M3         M3 = 0
00036P 0015 86 06    A          LDAA   #6
00037P 0017 97 00    A          STAA   L1         L1 = 6
00038P 0019 BD 0000  A          JSR    SDWL1X     USE K2 TO SET DW(1) THRU DW(L1)
00039P 001C 20 09 0027          BRA    SCOPE1

00041P 001E BD 0000  A SCOPE0   JSR    SMDW1      SET MDW 7-40
00042P 0021 86 01    A          LDAA   #1
00043P 0023 97 00    A          STAA   K2         K2 = 1 (K2 IS RECORD NUMBER)
00044P 0025 8D 09 0030          BSR    SDW678     SET DW8 TO STRING(K2)
00045P 0027 86 C8    A SCOPE1   LDAA   #200
00046P 0029 97 00    A          STAA   T2         T2 = 200
00047P 002B BD 0000  A SCOPE2   JSR    SCAN       SCAN ALL CONTROLS AND SET
00048                          *                  APPROPRIATE VARIABLES
00049P 002E 20 FB 002B          BRA    SCOPE2     LOOP
00051                          *
00052                          * SDW678 - USE K2 TO SET DW(6), (7) AND/OR (8)
00053                          *
00054                          * FLOW PAGE 5B
00055                          *
00056P 0030 4F         SDW678   CLRA
00057P 0031 D6 00    A          LDAB   K2         CONVERT K2 INTO DTO
00058P 0033 BD 0000  A          JSR    DTOBTD     CHARACTER STRING
00059P 0036 C6 05    A          LDAB   #5
00060P 0038 D1 00    A          CMPB   M1         IS M1 = 5? (IE. MIXED MODE?)
00061P 003A 26 05 0041          BNE    SDW000     IF NOT...BRANCH
00062P 003C CE 0000  A          LDX    #DW6       POINT TO "TO" AREA
00063P 003F 20 03 0044          BRA    SDW001
00064P 0041 CE 0000  A SDW000   LDX    #DW8       POINT TO "TO" AREA
00065P 0044 31         SDW001   INS               SKIP OVER SIGN
00066P 0045 31                  INS
00067P 0046 31                  INS               SKIP OVER FIRST TWO DIGITS
00068P 0047 6F 00    A          CLR    0,X        CLEAR FIRST BYTE OF "TO" AREA
00069P 0049 C6 03    A          LDAB   #3         PREPARE TO MOVE 3 BYTES
00070P 004B 08         SDW002   INX               NEXT BYTE OF "TO" AREA
00071P 004C 32                  PULA
00072P 004D A7 00    A          STAA   0,X        MOVE 1 DIGIT
00073P 004F 5A                  DECB              IS THIS END OF MOVE?
00074P 0050 26 F9 004B          BNE    SDW002     IF NOT...BRANCH
00075P 0052 D6 00    A          LDAB   M1
00076P 0054 C1 06    A          CMPB   #6         IS M1 = 6? (IE. AUTOSCOPE?)
00077P 0056 26 10 0068          BNE    SDW003     IF NOT...BRANCH
00078P 0058 CE 0000  A          LDX    #DW7
00079P 005B DF 00    A          STX    TEMP       POINT TO START OF "TO" AREA
00080P 005D CE 0004  A          LDX    #DW8+4
00081P 0060 DF 00    A          STX    TEMP2      POINT TO TERMINATOR
00082P 0062 CE 0000  A          LDX    #DW8       POINT TO "FROM" AREA
00083P 0065 7E 0000  A          JMP    MOVBLK     MOVE AND EXIT
00084P 0068 39         SDW003   RTS
00086P 0069    00    A          FCB    0          CRC BYTE
00087                            END
TOTAL ERRORS 00000

RP      DTOBTD  00009*00058
R       DW6     00012*00062
```

```
R        DW7    00012*00078
R        DW8    00012*00064 00080 00082
RB       K2     00006*00032 00043 00057
RB       L1     00006*00037
RB       M1     00006*00026 00060 00075
RB       M2     00006*00034
RB       M3     00006*00029 00035
DP 0000  MIXED  00014 00025*
RP       MOVBLK 00009*00083
RB       PK2    00007*00031
RP       SCAN   00010*00047
DP 0000  SCOPE  00014 00024*
 P 001E  SCOPE0 00028 00030 00041*
 P 0027  SCOPE1 00039 00045*
 P 002B  SCOPE2 00047*00049
 P 0041  SDW000 00061 00064*
 P 0044  SDW001 00063 00065*
 P 004B  SDW002 00070*00074
 P 0068  SDW003 00077 00084*
DP 0030  SDW678 00014 00044 00056*
R        SDWL1X 00010*00038
RP       SMDW1  00010*00041
RB       T2     00007*00046
RB       TEMP   00007*00079
RB       TEMP2  00007*00081

00001                         NAM    F6A
00002                         OPT    REL, CREF, LLEN=80
00003                         TTL    FLOW PAGES 6A THRU 6J
00004                         IDNT   JAN.  27, 1978

00006                         XREF   BSCT:LI, MTR1, MTR2, NRN
00007                         XREF   BSCT:SCRTCH, STAD, T2, T4, TEMP, TEMP3, TEMP4
00008                         XREF   BSCT:X2, X3, XM

00010                         XREF   DSCT:DIM, RCAP, X4, X5

00012                         XREF   PSCT:AINGW, CBLOCK, DELAY, DOMOVE, DTOBTD
00013                         XREF   PSCT:EMODE1, GOFWD, MULT16
00014                         XREF   PSCT:READSR, RMR1R2, RREC, RTBOT, RMARK
00015                         XREF   PSCT:SREAD, TESTM2, TSTOP
00016                         XREF   PSCT:WMARKS, WORER1, WREC

00018                         XREF   BATT, CLRRW, MDW, SETRW

00020                         XDEF   EXCXM, SDPO3, X2MDW 00022P 0000                   PSCT
00024                       *
00025                       * SDPO3 - IN XCRIBE MODE,
00026                       *      SCAN DATA POSITION CONTROLS (X2-X5)
00027                       *
00028                       * FLOW PAGE 6A
00029                       *
00030P 0000 BD 0000  A SDPO3  JSR    READSR    READ SWITCH REGISTERS
00031P 0003 D6 00    A        LDAB   XM
00032P 0005 81 22    A        CMPA   #$22      IS "DATA POSITION 100"
00033                       *                  CONTROL PRESSED?
00034P 0007 26 39 0042        BNE    SDPO3C    IF NOT... BRANCH
00035P 0009 96 00    A        LDAA   T4        IS T4 = 0?
00036P 000B 26 6E 007B        BNE    SDPO3I    IF NOT... BRANCH
00037P 000D C1 01    A        CMPB   #1        IS XM = 1?
00038P 000F 26 0B 001C        BNE    SDPO3A    IF NOT... BRANCH
00039P 0011 96 00    A        LDAA   X2
00040P 0013 81 64    A        CMPA   #100      IS X2 = 100?
00041P 0015 27 64 007B        BEQ    SDPO3I    IF YES... BRANCH
00042P 0017 7C 0000  A        INC    X2        X2 = X2+1
00043P 001A 20 3B 0057        BRA    SDPO3D
```

```
00045P 001C C1 02      A SDP03A CMPB  #2            IS XM = 2?
00046P 001E 26 13 0033          BNE   SDP03B        IF NOT...BRANCH
00047P 0020 96 00      A        LDAA  X3
00048P 0022 81 64      A        CMPA  #100          IS X3 = 100?
00049P 0024 27 55 007B          BEQ   SDP03I        IF YES...BRANCH
00050P 0026 D6 00      A        LDAB  X2
00051P 0028 FB 0000    A        ADDB  RCAP
00052P 002B 11                  CBA                 IS X3 = X2+RECAP?
00053P 002C 27 4D 007B          BEQ   SDP03I        IF YES..BRANCH
00054P 002E 7C 0000    A        INC   X3            X3 = X3+1
00055P 0031 20 35 0068          BRA   SDP03F 00057P 0033 B6 0000    A SDP03B LDAA  X5
00058P 0036 81 64      A        CMPA  #100          IS X5 = 100?
00059P 0038 27 41 007B          BEQ   SDP03I        IF YES...BRANCH
00060P 003A 7C 0000    A        INC   X4            X4 = X4+1
00061P 003D 7C 0000    A        INC   X5            X5 = X5+1
00062P 0040 20 37 0079          BRA   SDP03H 00064P 0042 81 21      A SDP03C CMPA  #$21          IS "DATA POSITION 1"
00065                        *                        CONTROL PRESSED?
00066P 0044 26 39 007F          BNE   SDP03J        IF NOT...BRANCH
00067P 0047 96 00      A        LDAA  T4            IS T4 = 0?
00068P 0048 26 31 007B          BNE   SDP03I        IF NOT...BRANCH
00069P 004A C1 01      A        CMPB  #1            IS XM = 1?
00070P 004C 26 0D 005B          BNE   SDP03E        IF NOT...BRANCH
00071P 004E 96 00      A        LDAA  X2
00072P 0050 81 01      A        CMPA  #1            IS X2 = 1?
00073P 0052 27 27 007B          BEQ   SDP03I        IF YES...BRANCH
00074P 0054 7A 0000    A        DEC   X2            X2 = X2-1

00076P 0057 8D 2E 0087 SDP03D   BSR   X2MDW         USE X2 TO SET MDW,12-16
00077P 0059 20 20 007B          BRA   SDP03I 00079P 005B C1 02      A SDP03E CMPB  #2            IS XM = 2?
00080P 005D 26 0D 006C          BNE   SDP03G        IF NOT...BRANCH
00081P 005F 96 00      A        LDAA  X3
00082P 0061 91 00      A        CMPA  X2            IS X3 = X2?
00083P 0063 27 16 007B          BEQ   SDP03I        IF YES...BRANCH
00084P 0065 7A 0000    A        DEC   X3            X3 = X3-1

00086P 0068 8D 24 008E SDP03F   BSR   X3MDW         USE X3 TO SET MDW,15-20
00087P 006A 20 0F 007B          BRA   SDP03I 00089P 006C B6 0000    A SDP03G LDAA  X4
00090P 006F 81 01      A        CMPA  #1            IS X4 = 1?
00091P 0071 27 08 007B          BEQ   SDP03I        IF YES...BRANCH
00092P 0073 7A 0000    A        DEC   X4            X4 = X4-1
00093P 0076 7A 0000    A        DEC   X5            X5 = X5-1

00095P 0079 8D 2A 00A5 SDP03H   BSR   X4MDW         USE X4 & X5 TO SET MDW,23-31

00097P 007B 7C 0000    A SDP03I INC   T4            T4 = T4+1
00098P 007E 39                  RTS 00100P 007F 7F 0000    A SDP03J CLR   T4            T4 = 0
00101P 0082 86 C8      A        LDAA  #200
00102P 0084 97 00      A        STAA  T2            T2 = 200
00103P 0086 39                  RTS
00105                         *
00106                         * X2MDW - USE X2 TO SET MDW,12-16
00107                         *
00108                         * FLOW PAGE 6B
00109                         *
00110P 0087 D6 00      A X2MDW  LDAB  X2            CONVERT X2 TO DTO CHARACTER
00111                         *                      STRING AND PUT IN MDW
00112P 0089 CE 000B    A        LDX   #MDW+11       POINT TO PLACE WITHIN MDW
00113P 008C 20 34 00C2          BRA   X4MDW1        DO THE CONVERSION ... AND EXIT

00115                         *
00116                         * X3MDW - USE X3 TO SET MDW,15-20
00117                         *
00118                         * FLOW PAGE 6C
00119                         *
```

```
00120P 008E CE 0019   A X3MDW   LDX    #MDW+25
00121P 0091 DF 00     A         STX    TEMP        TERMINATOR
00122P 0093 CE 0014   A         LDX    #MDW+20
00123P 0096 BD 0000   A         JSR    CBLOCK      MDW,21-25 = "    "
00124P 0099 86 1A     A         LDAA   #26
00125P 009B B7 000E   A         STAA   MDW+14      MDW,15 = "-"
00126P 009E D6 00     A         LDAB   X3          CONVERT X3 TO DTO CHARACTER
00127                           *                    STRING AND PUT IN MDW
00128P 00A0 CE 000F   A         LDX    #MDW+15     POINT TO PLACE WITHIN MDW
00129P 00A3 20 1D 00C2          BRA    X4MDW1      DO THE CONVERSION ... AND EXIT

00131                           *
00132                           * X4MDW - USE X4 & X5 TO SET MDW,23-31
00133                           *
00134                           * FLOW PAGE 6D
00135                           *
00136P 00A5 CE 0024   A X4MDW   LDX    #MDW+36
00137P 00A8 DF 00     A         STX    TEMP        TERMINATOR
00138P 00AA CE 001F   A         LDX    #MDW+31
00139P 00AD BD 0000   A         JSR    CBLOCK      MDW,32-36 = "    "
00140P 00B0 F6 0000   A         LDAB   X4          CONVERT X4 TO DTO CHARACTER
00141                           *                    STRING AND PUT IN MDW
00142P 00B3 CE 0016   A         LDX    #MDW+22     POINT TO PLACE WITHIN MDW
00143P 00B6 8D 0E 00C6          BSR    X4MDW2      DO THE CONVERSION
00144P 00B8 86 1A     A         LDAA   #26         DTO "-"
00145P 00BA A7 03     A         STAA   3,X         MDW,26 = "-"

00147P 00BC F6 0000   A         LDAB   X5          CONVERT X5 TO DTO CHARACTER
00148                           *                    STRING AND PUT IN MDW
00149P 00BF CE 001A   A         LDX    #MDW+26     POINT TO PLACE WITHIN MDW
00150                           *                    DO THE CONVERSION ... AND EXIT 00152P 00C2 86 18     A X4MDW1  LDAA   #24         DTO "?"
00153P 00C4 A7 04     A         STAA   4,X         MDW,X+4 = "?"

00155P 00C6 4F          X4MDW2  CLRA               CONVERT ACCA,ACCB INTO DTO
00156                           *                    CHARACTER STRING
00157P 00C7 DF 00     A         STX    TEMP4       SAVE INDEX
00158P 00C9 BD 0000   A         JSR    DTOBTD
00159P 00CC 31                  INS                SKIP OVER SIGN
00160P 00CD 31                  INS
00161P 00CE 31                  INS                SKIP OVER FIRST TWO DIGITS
00162P 00CF DE 00     A         LDX    TEMP4       RESTORE INDEX
00163P 00D1 32                  PULA
00164P 00D2 A7 00     A         STAA   0,X         MDW,X+0
00165P 00D4 32                  PULA
00166P 00D5 A7 01     A         STAA   1,X         MDW,X+1
00167P 00D7 32                  PULA
00168P 00D8 A7 02     A         STAA   2,X         MDW,X+2
00169P 00DA 39                  RTS
00171                           *
00172                           * EXCXM - IN XCRIBE MODE,
00173                           *         EXECUTE AND/OR CHANGE XM
00174                           *
00175                           * FLOW PAGE 6E
00176                           *
00177P 00DB 96 00     A EXCXM   LDAA   XM
00178P 00DD 81 04     A         CMPA   #4          IS XM = 4?
00179P 00DF 26 1C 00FD          BNE    EXCXM1      IF NOT... BRANCH
00180P 00E1 BD 0000   A         JSR    AINGW       ADD "ING-WAIT"
00181P 00E4 BD 0000   A         JSR    RTBOT       REWIND TO BOT
00182P 00E7 BD 0000   A         JSR    RMARK       READ NEXT MARK
00183P 00EA 86 01     A         LDAA   #1
00184P 00EC 97 00     A         STAA   MTR1        MTR1 = 1
00185P 00EE 86 64     A         LDAA   #100
00186P 00F0 97 00     A         STAA   MTR2        MTR2 = 100
00187P 00F2 BD 0000   A         JSR    RMR1R2      READ MTR1 THRU MTR2,
00188                           *                    START STORAGE AT BADS(LI)
00189                           *                    OR #BATT+140*LI
00190P 00F5 BD 0000   A         JSR    TESTM2      IF M1 NOT = M2 THEN EXIT
00191                           *                    ... ELSE CONTINUE
00192P 00F8 86 14     A         LDAA   #20
00193P 00FA 7E 0000   A         JMP    DOMOVE      MDW,10-21 = " TAPE AGAIN?"
00194                           *                    ... AND EXIT
```

```
00196P 00FD 81 01     A EXCXM1 CMPA    #1              IS XM = 1?
00197P 00FF 26 09 010A         BNE     EXCXM2          IF NOT...BRANCH
00198P 0101 7C 0000   A         INC     XM              XM = 2
00199P 0104 96 00     A         LDAA    X2
00200P 0106 97 00     A         STAA    X3              X3 = X2
00201P 0108 20 84 008E          BRA     X3MDW           USE X3 TO SET MDW,15-20
00202                  *                                ...AND EXIT 00204P 010A 81 02     A EXCXM2 CMPA    #2              IS XM = 2?
00205P 010C 26 3E 014C         BNE     EXCXM3          IF NOT...BRANCH
00206P 010E B6 0005   A         LDAA    MDW+5
00207P 0111 81 0C     A         CMPA    #12             IS MDW,6 = "E"?
00208P 0113 27 37 014C          BEQ     EXCXM3          IF YES...BRANCH
00209P 0115 BD 0000   A         JSR     AINGW           ADD "ING-WAIT"
00210P 0118 96 00     A         LDAA    X2
00211P 011A 97 00     A         STAA    MTR1            MTR1 = X2
00212P 011C 96 00     A         LDAA    X3
00213P 011E 97 00     A         STAA    MTR2            MTR2 = X3
00214P 0120 BD 0000   A         JSR     RMR1R2          READ MTR1 THRU MTR2,
00215                  *                                START STORAGE AT BADS(LI)
00216                  *                                OR #BATT+140*LI
00217P 0123 BD 0000   A         JSR     TESTM2          IF M1 NOT = M2 THEN EXIT
00218                  *                                ...ELSE CONTINUE
00219P 0126 BD 0087   P         JSR     X2MDW           USE X2 TO SET MDW,12-16
00220P 0129 BD 008E   P         JSR     X3MDW           USE X3 TO SET MDW,15-20
00221P 012C 86 03     A         LDAA    #3
00222P 012E 97 00     A         STAA    XM              XM = 3
00223P 0130 86 0E     A         LDAA    #14
00224P 0132 BD 0000   A         JSR     DOMOVE          MDW,6-11 = "WRITE "
00225P 0135 86 13     A         LDAA    #19
00226P 0137 B7 0013   A         STAA    MDW+19
00227P 013A 86 0A     A         LDAA    #10
00228P 013C B7 0014   A         STAA    MDW+20          MDW,20-21 = "TO"
00229P 013F 96 00     A         LDAA    X2
00230P 0141 B7 0000   A         STAA    X4              X4 = X2
00231P 0144 96 00     A         LDAA    X3
00232P 0146 B7 0000   A         STAA    X5              X5 = X3
00233P 0149 7E 00A5   P         JMP     X4MDW           USE X4 & X5 TO SET MDW,23-31
00234                  *                                ...AND EXIT 00236P 014C 20 00 014E EXCXM3 BRA      WOEMT           CONTINUE WITH ....
00237                  *                                IN XCRIBE MODE,
00238                  *                                WRITE OR ERASE MAG TAPE
00239                  *                                ...AND EXIT
00241                  *
00242                  * WOEMT - IN XCRIBE MODE,
00243                  *          WRITE OR ERASE MAG TAPE
00244                  *
00245                  * FLOW PAGE 6F
00246                  *
00247P 014E 96 00     A WOEMT  LDAA    XM
00248P 0150 81 02     A         CMPA    #2              IS XM = 2?
00249P 0152 27 08 015C         BEQ     WOEMT1          IF YES...BRANCH
00250P 0154 B6 0000   A         LDAA    X4              MTR1 = X4
00251P 0157 F6 0000   A         LDAB    X5              MTR2 = X5
00252P 015A 20 14 0170         BRA     WOEMT2

00254P 015C 96 00     A WOEMT1 LDAA    X2
00255P 015E D6 00     A         LDAB    X3
00256P 0160 81 01     A         CMPA    #1              IS X2 = 1?
00257P 0162 26 0C 0170         BNE     WOEMT2          IF NOT...BRANCH
00258P 0164 C1 64     A         CMPB    #100            IS X3 = 100?
00259P 0166 26 08 0170         BNE     WOEMT2          IF NOT...BRANCH
00260P 0168 BD 0000   A         JSR     GOFWD           GO FORWARD FOR NNT*45 MICROSECS,
00261                  *                                LOOK FOR READ BUFFER FULL,
00262P 016B BD 0000   A         JSR     WMARKS          WRITE MARKS (SHEET 1)
00263P 016E 20 67 01D7         BRA     WOEMT6

00265P 0170 97 00     A WOEMT2 STAA    MTR1            SET MTR1
00266P 0172 D7 00     A         STAB    MTR2            SET MTR2
00267P 0174 BD 0000   A         JSR     WORER1          PREPARE TO WRITE OR ERASE MTR1
00268P 0177 B6 0000   A         LDAA    DIM             IS DIM = 0?
00269P 017A 26 64 01E0         BNE     WOEMT9          IF NOT...BRANCH
00270P 017C 86 02     A         LDAA    #2
```

```
00271P 017E BD 0000   A            JSR     DOMOVE    AW = MDW
00272P 0181 BD 0000   A            JSR     AINGW     ADD "ING-WAIT"

00274P 0184 96 00     A  WOEMT3    LDAA    NRN
00275P 0186 91 00     A            CMPA    MTR1      IS NRN = MTR1?
00276P 0188 27 03 018D             BEQ     WOEMT4    IF YES...BRANCH
00277P 018A 7E 0000   A            JMP     EMODE1    ENTER MODE M1

00279P 018D 4F           WOEMT4    CLRA
00280P 018E D6 00     A            LDAB    LI
00281P 0190 CE 008C   A            LDX     #140
00282P 0193 DF 00     A            STX     TEMP3
00283P 0195 CE 0000   A            LDX     #TEMP3
00284P 0198 BD 0000   A            JSR     MULT16    PRODUCT = 140*LI
00285P 019B CE 0000   A            LDX     #BATT
00286P 019E DF 00     A            STX     TEMP3
00287P 01A0 96 00     A            LDAA    SCRTCH
00288P 01A2 D6 01     A            LDAB    SCRTCH+1
00289P 01A4 DB 01     A            ADDB    TEMP3+1
00290P 01A6 99 00     A            ADCA    TEMP3
00291P 01A8 97 00     A            STAA    STAD
00292P 01AA D7 01     A            STAB    STAD+1    STAD = #BATT+140*LI
00293P 01AC BD 01E3   P            JSR     WORAR     IN XCRIBE MODE,
00294                    *                           WRITE OR ERASE A RECORD
00295P 01AF BD 0000   A            JSR     SREAD     SET READING FLAGS 00297P 01B2 BD 0000   A            JSR     RREC      TRY UP TO 4 TIMES TO READ RECORD,
00298                    *                           START STORE AT STAD. RTN ON IRG
00299P 01B5 96 00     A            LDAA    MTR1
00300P 01B7 91 00     A            CMPA    MTR2      IS MTR1 = MTR2?
00301P 01B9 27 11 01CC             BEQ     WOEMT5    IF YES...BRANCH
00302P 01BB 7C 0000   A            INC     MTR1      MTR1 = MTR1+1
00303P 01BE 7C 0000   A            INC     LI        LI = LI+1
00304P 01C1 7F 0000   A            CLR     CLRRW     (CLRRW) = XX
00305P 01C4 CE 0353   A            LDX     #851
00306P 01C7 BD 0000   A            JSR     DELAY     WAIT 60 MILLISECONDS
00307P 01CA 20 B8 0184             BRA     WOEMT3

00309P 01CC 86 03     A  WOEMT5    LDAA    #3
00310P 01CE BD 0000   A            JSR     DOMOVE    MDW = AW
00311P 01D1 96 00     A            LDAA    XM
00312P 01D3 81 02     A            CMPA    #2        IS XM = 2?
00313P 01D5 26 04 01DB             BNE     WOEMT7    IF NOT...BRANCH
00314P 01D7 86 10     A  WOEMT6    LDAA    #16       MDW,20-25 = "AGAIN?"
00315P 01D9 20 02 01DD             BRA     WOEMT8

00317P 01DB 86 11     A  WOEMT7    LDAA    #17       MDW,31-36 = "AGAIN?"
00318P 01DD BD 0000   A  WOEMT8    JSR     DOMOVE 00320P 01E0 7E 0000   A  WOEMT9    JMP     TSTOP     WAIT 5 MS., STOP,
00321                    *                           WAIT 30 MS., SET RW
00322                    *                           ... AND EXIT

00324                    *
00325                    * WORAR - IN XCRIBE MODE, WRITE OR ERASE
00326                    *         A RECORD
00327                    *
00328                    * FLOW PAGE 6J
00329                    *
00330P 01E3 96 00     A  WORAR     LDAA    XM
00331P 01E5 81 02     A            CMPA    #2        IS XM = 2?
00332P 01E7 26 10 01F9             BNE     WORAR0    IF NOT... BRANCH
00333P 01E9 CE 0000   A            LDX     #BATT
00334P 01EC DF 00     A            STX     STAD      STAD = #BATT
00335P 01EE CE 008C   A            LDX     #BATT+140 TERMINATOR FOR CLEAR
00336P 01F1 DF 00     A            STX     TEMP
00337P 01F3 CE 0000   A            LDX     #BATT
00338P 01F6 BD 0000   A            JSR     CBLOCK    BATT THRU BATT+139 SET TO ALL 0

00340P 01F9 BD 0000   A  WORAR0    JSR     WREC      WRITE A RECORD
00341                    *                           USING DATA STARTING AT "STAD"
```

```
00343P 01FC CE 047E    A         LDX    #1150
00344P 01FF BD 0000    A         JSR    DELAY      WAIT 81 MILLISECS.
00345P 0202 7F 0000    A         CLR    SETRW      SETRW = 0
00346P 0205 39                   RTS
00348P 0206    00      A         FCB    0          CRC BYTE
00349                            END
TOTAL ERRORS 00000
```

```
RP           AINGW   00012*00180 00209 00272
R            BATT    00018*00285 00333 00335 00337
RP           CBLOCK  00012*00123 00139 00338
R            CLRRW   00018*00304
RP           DELAY   00012*00306 00344
RD           DIM     00010*00268
RP           DOMOVE  00012*00193 00224 00271 00310 00318
RP           DTOBTD  00012*00158
RP           EMODE1  00013*00277
DP  00DB     EXCXM   00020 00177*
 P  00FD     EXCXM1  00179 00196*
 P  010A     EXCXM2  00197 00204*
 P  014C     EXCXM3  00205 00208 00236*
RP           GOFWD   00013*00260
RB           LI      00006*00280 00303
R            MDW     00018*00112 00120 00122 00125 00128 00136 00138 00142 00149
                     00206 00226 00228
RB           MTR1    00006*00184 00211 00265 00275 00299 00302
RB           MTR2    00006*00186 00213 00266 00300
RP           MULT16  00013*00284
RB           NRN     00006*00274
RD           RCAP    00010*00051
R.           READSR  00014*00030
RP           RMARK   00014*00182
RP           RMR1R2  00014*00187 00214
RP           RREC    00014*00297
RP           RTBOT   00014*00181
RB           SCRTCH  00007*00287 00288
DP  0000     SDPO3   00020 00030*
 P  001C     SDPO3A  00038 00045*
 P  0033     SDPO3B  00046 00057*
 P  0042     SDPO3C  00034 00064*
 P  0057     SDPO3D  00043 00076*
 P  005B     SDPO3E  00070 00079*
 P  0068     SDPO3F  00055 00086*
 P  006C     SDPO3G  00080 00089*
 P  0079     SDPO3H  00062 00095*
 P  007B     SDPO3I  00036 00041 00049 00053 00059 00068 00073 00077 00083 00087
                     00091 00097*
 P  007F     SDPO3J  00066 00100*
R            SETRW   00018*00345
RP           SREAD   00015*00295
RB           STAD    00007*00291 00292 00334
RB           T2      00007*00102
RB           T4      00007*00035 00067 00097 00100
RB           TEMP    00007*00121 00137 00336
RB           TEMP3   00007*00282 00283 00286 00289 00290
RB           TEMP4   00007*00157 00162
RP           TESTM2  00015*00190 00217
RP           TSTOP   00015*00320
RP           WMARKS  00016*00262
 P  014E     WOEMT   00236 00247*
 P  015C     WOEMT1  00249 00254*
 P  0170     WOEMT2  00252 00257 00259 00265*
 P  0184     WOEMT3  00274*00307
 P  018D     WOEMT4  00276 00279*
 P  01CC     WOEMT5  00301 00309*
 P  01D7     WOEMT6  00263 00314*
 P  01DB     WOEMT7  00313 00317*
 P  01DD     WOEMT8  00315 00318*
 P  01E0     WOEMT9  00269 00320*
 P  01E3     WORAR   00293 00330*
 P  01F9     WORAR0  00332 00340*
RP           WORER1  00016*00267
```

```
RP    WREC    00016*00340
RB    X2      00008*00039 00042 00050 00071 00074 00082 00110 00199 00210
              00229 00254
DP 0087 X2MDW 00020 00076 00110*00219
RB    X3      00008*00047 00054 00081 00084 00126 00200 00212 00231 00255
 P 008E X3MDW 00086 00120*00201 00220
RD    X4      00010*00060 00089 00092 00140 00230 00250
 P 00A5 X4MDW 00095 00136*00233
 P 00C2 X4MDW1 00113 00129 00152*
 P 00C6 X4MDW2 00143 00155*
RD    X5      00010*00057 00061 00093 00147 00232 00251
RB    XM      00008*00031 00177 00198 00222 00247 00311 00330

00001                         NAM    F9
00002                         OPT    REL, CREF, LLEN=80
00003                         TTL    FLOW PAGES 9 THRU 12B
00004                         IDNT   DEC.    6, 1977

00006                         XREF   BSCT:A2, A3, BADS6, BADS7, BADS8
00007                         XREF   BSCT:FR1, LITE1, M1, M2
00008                         XREF   BSCT:T2, T3, T4, TEMP2, XM

00010                         XREF   PSCT:DELAY, EMODE1, OFFX
00011                         XREF   PSCT:CANLOG, CFLG1, CFLG2, CLITE1
00012                         XREF   PSCT:DOMOVE, EXCXM, READSR
00013                         XREF   PSCT:SCACFA, SCATC, SCNATT, SCNTE
00014                         XREF   PSCT:SDPO3, SDPO4, SETDW, SETM1
00015                         XREF   PSCT:SLITE1, SPDO3, SPFLED, WUNCP, XMDR

00017                         XREF   AT, BL6, BL7, BL8, BL9, CH
00018                         XREF   DW6, DW7, DW8, JL10FS, JL20FS
00019                         XREF   RCAP, MDW, TDF, TE, TEC, TES

00021                         XDEF   SCAN, SCNCLR, SCNMOD 00023P 0000                   PSCT
00025                  *
00026                  * SCAN - SCAN ALL CONTROLS - PAGE 9
00027                  *
00028P 0000 86 00    A SCAN   LDAA   #TDF
00029P 0002 BD 0000  A        JSR    CFLG2     TDF _ 0
00030P 0005 8D 30 0037        BSR    SCNMOD    SCAN MODE CONTROLS
00031P 0007 BD 0092  P        JSR    SCNCLR    SCAN CLEAR CONTROL
00032P 000A BD 0161  P        JSR    SCNDPO    SCAN DATA POS CONTROL
00033P 000D BD 0000  A        JSR    SCATC     SCAN AT CONTROL
00034P 0010 96 00    A        LDAA   M1
00035P 0012 81 07    A        CMPA   #7        IS M1 = 7?
00036P 0014 27 13 0029        BEQ    SCAN3     IF YES... BRANCH
00037P 0016 BD 0000  A        JSR    SCNTE     SCAN TRIG ENABLE CONTROLS
00038P 0019 96 00    A        LDAA   M1
00039P 001B 81 03    A        CMPA   #3        IS M1 = 3?
00040P 001D 27 04 0023        BEQ    SCAN0     IF YES... BRANCH
00041P 001F 81 06    A        CMPA   #6
00042P 0021 26 03 0026        BNE    SCAN1     BRANCH IF M1 <> 6
00043P 0023 BD 0000  A SCAN0  JSR    SCACFA    SCAN AC & FA
00044P 0026 7E 0000  A SCAN1  JMP    SCNATT    SCAN A3, K3-K8 CONTROLS
00045                  *                      ... AND EXIT 00047P 0029 BD 0000  A SCAN3  JSR    READSR    READ SWITCH REGISTERS
00048P 002C 81 43    A        CMPA   #$43      IS SWEEP ARM SINGLE PRESSED?
00049P 002E 26 06 0036        BNE    SCNXIT    IF NOT... BRANCH
00050P 0030 BD 0000  A        JSR    EXCXM     IN XCRIBE MODE,
00051                  *                      EXECUTE AND/OR CHANGE XM
00052P 0033 7E 0000  A        JMP    WUNCP     WAIT UNTIL NO CONTROL IS PRESSED
00053                  *                      ... AND EXIT 00055P 0036 39         SCNXIT RTS              EXIT
```

```
00057            *
00058            * SCNMOD - SCAN MODE CONTROLS.  IF MODE UP OR MODE DOWN
00059            *     CONTROLS ARE PRESSED, M1 GETS REPLACED BY UP(M1)
00060            *     OR DOWN(M1).  THE VALUES ARE IN A TABLE:
00061            *
00062            *         MODE      M1       UP(M1)      DOWN(M1)
00063            *
00064            *         TRIM       2          2           6
00065            *         PROGRAM    3          4           7
00066            *         SCOPE      4          5           3
00067            *         MIXED      5          6           4
00068            *         AUTOSCOPE  6          2           5
00069            *         TRANSCRIBE 7          3           7
00070            *
00071            * FLOW PAGE 10
00072            *
00073P 0037 DF 00      A  SCNMOD STX   TEMP2     SAVE INDEX
00074P 0039 7F 0000    A         CLR   T4        T4 _ 0
00075            *
00076P 003C 96 00      A  SCNM3  LDAA  M1
00077P 003E 80 02      A         SUBA  #2
00078P 0040 48                   ASLA            (ADJUST M1 FOR TABLE LOOKUP)
00079P 0041 CE 0086    P         LDX   #MCTBL    INDEX _ POINTER TO CHANGE
00080P 0044 BD 0000    A         JSR   OFFX      ... FUNCTIONS OF M1
00081P 0047 BD 0000    A         JSR   READSR    ACCA _ SWITCH REGISTER STATUS
00082P 004A 81 13      A         CMPA  #$13
00083P 004C 26 04 0052           BNE   SCNM4     IF ACCA = MODE CONTROL UP
00084P 004E A6 00      A         LDAA  X         ... THEN ACCA _ UP(M1)
00085P 0050 20 06 0058           BRA   SCNM4B    (SKIP ELSE)
00086P 0052 81 14      A  SCNM4  CMPA  #$14
00087P 0054 26 0E 0064           BNE   TESTT4    BRANCH IF MODE DOWN NOT PRESSED
00088P 0056 A6 01      A         LDAA  1,X       ... ELSE ACCA _ DOWN(M1)
00089P 0058 BD 0000    A  SCNM4B JSR   SETM1     M1 _ ACCA
00090P 005B BD 0000    A         JSR   WUNCP     WAIT UNTIL NO CONTROL IS PRESSED
00091P 005E 86 78      A         LDAA  #120
00092P 0060 97 00      A         STAA  T4        T4 _ 120
00093P 0062 20 D8 003C           BRA   SCNM3     LOOP
00094            *
00095P 0064 7D 0000    A  TESTT4 TST   T4
00096P 0067 27 0B 0074           BEQ   SCNM5     IF T4 = 0 THEN EXIT
00097P 0069 7A 0000    A         DEC   T4        T4 _ T4-1
00098P 006C CE 008D    A         LDX   #141
00099P 006F BD 0000    A         JSR   DELAY     WAIT 10 MS
00100P 0072 20 C8 003C           BRA   SCNM3     BRANCH TO LOOP
00101            *
00102P 0074 96 00      A  SCNM5  LDAA  M2
00103P 0076 91 00      A         CMPA  M1        IS M1 = M2?
00104P 0078 27 09 0083           BEQ   SCNM6     IF YES...BRANCH AND EXIT
00105P 007A 80 0A      A         SUBA  #10
00106P 007C 91 00      A         CMPA  M1        IS M1 = (M2-10)?
00107P 007E 27 03 0083           BEQ   SCNM6     IF YES...BRANCH AND EXIT 00109P 0080 7E 0000    A         JMP   EMODE1    ENTER MODE M1

00111P 0083 DE 00      A  SCNM6  LDX   TEMP2     RESTORE INDEX
00112P 0085 39                   RTS             EXIT SCNMOD
00114            *
00115            * MCTBL - MODE CHANGE TABLE
00116            *
00117P 0086    02      A  MCTBL  FCB   2,6
     P 0087    06      A
00118P 0088    04      A         FCB   4,7
     P 0089    07      A
00119P 008A    05      A         FCB   5,3
     P 008B    03      A
00120P 008C    06      A         FCB   6,4
     P 008D    04      A
00121P 008E    02      A         FCB   2,5
     P 008F    05      A
00122P 0090    03      A         FCB   3,7
     P 0091    07      A
00124            *
00125            * SCNCLR - SCAN CLEAR CONTROL - PAGE 11A
00126            *
```

```
00127P 0092 BD 0000   A SCNCLR JSR    READSR    A _ SR DATA
00128P 0095 D6 00     A        LDAB   M1
00129P 0097 C1 07     A        CMPB   #7        IS M1 = 7?
00130P 0099 26 4F 00EA         BNE    SCLR3     IF NOT...BRANCH
00131P 009B 81 44     A        CMPA   #$44      IS SWEEP ARM CONTINUOUS PRESSED?
00132P 009D 27 01 00A0         BEQ    SCLR02    IF YES...BRANCH AND CONTINUE
00133P 009F 39                 RTS              ...ELSE EXIT 00135P 00A0 96 00     A SCLR02 LDAA   XM
00136P 00A2 81 04     A        CMPA   #4        IS XM = 4?
00137P 00A4 26 09 00AF         BNE    SCLR03    IF NOT...BRANCH
00138P 00A6 86 01     A        LDAA   #1
00139P 00A8 97 00     A        STAA   XM        XM _ 1
00140P 00AA BD 0000   A        JSR    XMDR      IN XCRIBE MODE, DISPLAY "READ"
00141P 00AD 20 25 00D4         BRA    SCLR2

00143P 00AF 81 01     A SCLR03 CMPA   #1        IS XM = 1?
00144P 00B1 27 05 00B8         BEQ    SCLR05    IF YES...BRANCH
00145P 00B3 7F 0000   A        CLR    M2        M2 _ 0
00146P 00B6 20 1C 00D4         BRA    SCLR2

00148P 00B8 B6 0005   A SCLR05 LDAA   MDW+5
00149P 00BB 81 0C     A        CMPA   #12       IS MDW,6 = "E"?
00150P 00BD 27 0C 00CB         BEQ    SCLR07    IF YES...BRANCH
00151P 00BF 86 12     A        LDAA   #18
00152P 00C1 BD 0000   A        JSR    DOMOVE    MDW,6-10 _ "ERASE"
00153P 00C4 86 FF     A        LDAA   #255
00154P 00C6 B7 0000   A        STAA   RCAP      RCAP _ 255
00155P 00C9 20 09 00D4         BRA    SCLR2

00157P 00CB 86 15     A SCLR07 LDAA   #21
00158P 00CD BD 0000   A        JSR    DOMOVE    MDW,6-13 _ "TEST TAPE"
00159P 00D0 86 04     A        LDAA   #4
00160P 00D2 97 00     A        STAA   XM        XM _ 4

00162P 00D4 7E 0000   A SCLR2  JMP    WUNCP     WAIT UNTIL NO CONTROLS
00163                        *                  ARE PRESSED ... AND EXIT 00165P 00D7 C6 00     A SCLR1  LDAB   #TES+TEC
00166P 00D9 BD 0000   A        JSR    CLITE1    TES _ TEC _ 0
00167P 00DC 86 00     A        LDAA   #TE
00168P 00DE BD 0000   A        JSR    CFLG1     TE _ 0
00169P 00E1 86 00     A        LDAA   #AT
00170P 00E3 95 00     A        BITA   LITE1
00171P 00E5 27 3C 0123         BEQ    CLRWL     BRANCH IF AT = 0
00172                        *                  CLEAR WL AND EXIT
00173                        *
00174P 00E7 7E 0000   A        JMP    CANLOG    CLEAR ANALOG TRACE, IF REQUIRED
00175                        *                  ... AND EXIT
00176                        *
00177P 00EA 81 45     A SCLR3  CMPA   #$45      IS CLEAR PRESSED?
00178P 00EC 27 E9 00D7         BEQ    SCLR1     IF YES...BRANCH
00179P 00EE C6 00     A        LDAB   #TE
00180P 00F0 D5 00     A        BITB   FR1
00181P 00F2 27 24 0118         BEQ    SCLR7     BRANCH IF TE = 0
00182                        *
00183P 00F4 81 43     A        CMPA   #$43      TRIGEN SGL PRESSED?
00184P 00F6 27 0E 0106         BEQ    SCLR4     BRANCH IF SO
00185                        *
00186P 00F8 81 44     A        CMPA   #$44      TRIGEN CONT PRESSED?
00187P 00FA 26 14 0110         BNE    SCLR5     BRANCH IF NOT
00188                        *
00189P 00FC C6 00     A        LDAB   #TEC
00190P 00FE BD 0000   A        JSR    SLITE1    TEC _ 1
00191P 0101 C6 00     A        LDAB   #TES
00192P 0103 7E 0000   A        JMP    CLITE1    TES _ 0 AND EXIT
00193                        *
00194P 0106 C6 00     A SCLR4  LDAB   #TEC
00195P 0108 BD 0000   A        JSR    CLITE1    TEC _ 0
00196P 010B C6 00     A        LDAB   #TES
00197P 010D 7E 0000   A        JMP    SLITE1    TES _ 1
00198                        *                  ... AND EXIT 00200P 0110 81 13     A SCLR5  CMPA   #$13      IS "MODE UP" PRESSED?
```

```
00201P 0112 27 C3 00D7          BEQ     SCLR1       IF YES... BRANCH
00202P 0114 81 14     A          CMPA    #$14        IS "MODE DOWN" PRESSED?
00203P 0116 27 BF 00D7          BEQ     SCLR1       IF YES... BRANCH 00205P 0118 D6 00     A SCLR7    LDAB    LITE1
00206P 011A C5 00     A          BITB    #AT         IS AT = 1?
00207P 011C 27 04 0122          BEQ     SCLRXT      IF NOT... EXIT 00209P 011E 81 15     A          CMPA    #$15        IS PROBE ADV/CLEAR PRESSED?
00210P 0120 27 B5 00D7          BEQ     SCLR1       IF YES... BRANCH 00212P 0122 39                  SCLRXT  RTS                      EXIT
00214                           *
00215                           * CLRWL - WHEN AT = 0, CLEAR WORKING LINE
00216                           *
00217                           * FLOW PAGE 11B
00218                           *
00219P 0123 96 00     A CLRWL    LDAA    M1
00220P 0125 C6 FF     A          LDAB    #$FF        1'S COMPLEMENT OF 0
00221P 0127 81 05     A          CMPA    #5          CHECK MODE
00222P 0129 27 10 013B          BEQ     CLRWL0      BRANCH IF MIXED MODE
00223P 012B 2E 18 0145          BGT     CLRWL1      BRANCH IF AUTOSCOPE
00224                           *                               OTHERWISE PRGM OR SCOPE MODE
00225P 012D F7 0000   A          STAB    BL8         BL(8) = 1'S COMPLEMENT OF 0
00226P 0130 7F 0000   A          CLR     DW8         DW(8),1 = DTO BLANK
00227P 0133 DE 00     A          LDX     BADS8       POINT TO TRACE 8 DATA
00228P 0135 86 02     A          LDAA    #2
00229P 0137 A7 00     A          STAA    JL10FS,X    J(8,1) = 2
00230P 0139 20 15 0150          BRA     CLRWL2
00231P 013B F7 0000   A CLRWL0   STAB    BL6         BL(6) = 1'S COMPLEMENT OF 0
00232P 013E 7F 0000   A          CLR     DW6         DW(6),1 = DTO BLANK
00233P 0141 DE 00     A          LDX     BADS6       POINT TO TRACE 6 DATA
00234P 0143 20 0B 0150          BRA     CLRWL2
00235P 0145 F7 0000   A CLRWL1   STAB    BL7         BL(7) = 1'S COMPLEMENT OF 0
00236P 0148 F7 0000   A          STAB    BL9         BL(9) = 1'S COMPLEMENT OF 0
00237P 014B 7F 0000   A          CLR     DW7         DW(7),1 = DTO BLANK
00238P 014E DE 00     A          LDX     BADS7       POINT TO TRACE 7 DATA
00239P 0150 6F 00     A CLRWL2   CLR     JL20FS,X    J(X,2) = 0
00240P 0152 BD 0000   A          JSR     SPFLED      SET PASS/FAIL LED'S
00241P 0155 96 00     A          LDAA    M1
00242P 0157 81 03     A          CMPA    #3          IS M1 = 3? (IE. PROGRAM?)
00243P 0159 26 05 0160          BNE     CLRWL3      IF NOT... BRANCH
00244P 015B 86 10     A          LDAA    #16         DTO "P"
00245P 015D B7 0000   A          STAA    DW8         DW(8),1 = "P"

00247P 0160 39                  CLRWL3  RTS                      ... EXIT
00249                           *
00250                           * SCNDPO - SCAN DATA POSITION CONTROL - PAGE 12A
00251                           *
00252P 0161 86 14     A SCNDPO   LDAA    #20         200 MILLISEC COUNTER
00253P 0163 97 00     A          STAA    T3          STORE DELAY TIMER
00254P 0165 7F 0000   A          CLR     T4          CLEAR T4
00255P 0168 96 00     A SDP011   LDAA    LITE1       GET LITE REGISTER 1
00256P 016A 85 00     A          BITA    #AT         ANALOG TRACE?
00257P 016C 26 0B 0179          BNE     SDP012      BRANCH IF SO
00258                           *
00259P 016E 96 00     A          LDAA    M1          GET MODE NUMBER
00260P 0170 81 07     A          CMPA    #7          TRANSCRIBE MODE?
00261P 0172 27 09 017D          BEQ     SDP013      BRANCH IF SO
00262                           *
00263P 0174 BD 0000   A          JSR     SDP04       SCAN DATA POS CONTROL
00264P 0177 20 07 0180          BRA     SDP014      REJOIN SCNDPO
00265                           *
00266P 0179 8D 3F 01BA          SDP012  BSR     SDP02       SCAN DATA POS CONTROL
00267P 017B 20 03 0180          BRA     SDP014      REJOIN SCNDPO
00268                           *
00269P 017D BD 0000   A SDP013   JSR     SDP03       SCAN DATA POSCONTROL
00270                           *
00271P 0180 CE 008D   A SDP014   LDX     #141        PRESET FOR 10 MS. DELAY
00272P 0183 96 00     A          LDAA    T4          T4 = 0?
00273P 0185 27 18 019F          BEQ     SDP016      BRANCH IF SO
00274P 0187 81 C8     A          CMPA    #200        T4 = 200?
00275P 0189 27 1F 01AA          BEQ     SDP017      BRANCH IF SO
00276P 018B 91 00     A          CMPA    T3          T4 > T3?
```

```
00277P 018D 23 0B 019A           BLS    SDP015      BRANCH IF NOT
00278                      *
00279P 018F 7F 0000   A          CLR    T4          T4 _ 0
00280P 0192 96 00     A          LDAA   T3
00281P 0194 80 05     A          SUBA   #5          IS T3 < 5?
00282P 0196 25 02 019A           BCS    SDP015      IF YES... BRANCH
00283P 0198 97 00     A          STAA   T3          ... ELSE T3 _ (T3-5)
00284                      *
00285P 019A BD 0000   A   SDP015 JSR    DELAY       DELAY 10 MS
00286P 019D 20 C9 0168           BRA    SDP011      LOOP
00287                      *
00288                      *
00289P 019F 96 00     A   SDP016 LDAA   T2          GET T2
00290P 01A1 81 78     A          CMPA   #120        T2 > 120?
00291P 01A3 22 05 01AA           BHI    SDP017      BRANCH IF SO
00292                      *
00293P 01A5 BD 0000   A          JSR    DELAY       DELAY 10 MS
00294P 01A8 20 B7 0161           BRA    SCNDPO      LOOP
00295                      *
00296P 01AA 96 00     A   SDP017 LDAA   M2
00297P 01AC 80 0A     A          SUBA   #10
00298P 01AE 23 05 01B5           BLS    SDPOXT      EXIT IF M2 < OR = 10
00299P 01B0 97 00     A          STAA   M2          M2 _ M2 - 10
00300P 01B2 BD 0000   A          JSR    SPD03       READ TAPE IF REQUIRED
00301P 01B5 86 C8     A   SDPOXT LDAA   #200
00302P 01B7 97 00     A          STAA   T2          T2 _ 200
00303P 01B9 39                   RTS                EXIT
00305                      * SDP02 - WHEN AT = 1, SCAN DATA POSITION CONTROL
00306                      *
00307                      *   PAGE 12B
00308                      *
00309P 01BA 96 00     A   SDP02  LDAA   A3          NOTE: A3 IS INT8*2
00310P 01BC 16                   TAB
00311P 01BD 57                   ASRB               PRESET CH _ A3
00312P 01BE 81 01     A          CMPA   #1          IS A3 = .5?
00313P 01C0 26 02 01C4           BNE    SDP020      IF NOT... BRANCH
00314P 01C2 C6 01     A          LDAB   #1          CH _ 1
00315P 01C4 F7 0000   A   SDP020 STAB   CH          SET CH
00316P 01C7 BD 0000   A          JSR    READSR      A _ PANEL STATUS
00317P 01CA 81 22     A          CMPA   #$22        BRANCH IF DATA POSITION 250
00318P 01CC 26 16 01E4           BNE    SDP021      ... NOT PRESSED
00319                      *
00320P 01CE 96 00     A          LDAA   T4
00321P 01D0 26 34 0206           BNE    SDP023      BRANCH IF T4 <> 0
00322                      *
00323P 01D2 96 00     A          LDAA   A3          NOTE: A3 IS INT8*2
00324P 01D4 48                   ASLA
00325P 01D5 9B 00     A          ADDA   A3          ACCA _ 3*(2*A3)
00326P 01D7 D6 00     A          LDAB   A2
00327P 01D9 1B                   ABA
00328P 01DA 1B                   ABA                ACCA _ 2*(A2+3*A3)
00329P 01DB 81 32     A          CMPA   #2*25       IS 2*(A2+3*A3) > 2*25?
00330P 01DD 2E 27 0206           BGT    SDP023      IF YES... BRANCH
00331                      *
00332P 01DF FB 0000   A          ADDB   CH          A2 _ A2+CH
00333P 01E2 20 1A 01FE           BRA    SDP022      BRANCH AHEAD
00334                      *
00335P 01E4 81 21     A   SDP021 CMPA   #$21        BRANCH IF DATA POSITION 1
00336P 01E6 26 22 020A           BNE    SDP024      ... NOT PRESSED
00337                      *
00338P 01E8 96 00     A          LDAA   T4
00339P 01EA 26 1A 0206           BNE    SDP023      BRANCH IF T4 <> 0
00340                      *
00341P 01EC 96 00     A          LDAA   A2
00342P 01EE 48                   ASLA               ACCA _ 2*A2
00343P 01EF D6 00     A          LDAB   A3          NOTE: A3 IS INT8*2
00344P 01F1 58                   ASLB               ACCB _ 2*(2*A3)
00345P 01F2 DB 00     A          ADDB   A3          ACCB _ 3*(2*A3)
00346P 01F4 10                   SBA                ACCA _ 2*(A2-3*A3)
00347P 01F5 81 CE     A          CMPA   #-25*2      IS 2*(A2-3*A3) < 2*(-25)?
00348P 01F7 2D 0D 0206           BLT    SDP023      IF YES... BRANCH
00349                      *
00350P 01F9 D6 00     A          LDAB   A2
00351P 01FB F0 0000   A          SUBB   CH          A2 _ A2-CH
```

```
00352
00353P 01FE D7 00    A SDP022 STAB  A2          SET A2
00354P 0200 BD 0000  A        JSR   CANLOG      CLEAR ANALOG TRACE, IF REQD.
00355P 0203 BD 0000  A        JSR   SETDW       SET DW(1) THRU DW(5)
00356P 0206 7C 0000  A SDP023 INC   T4          T4 _ T4 + 1
00357P 0209 39                RTS               EXIT SDP02
00358                  *
00359P 020A 7F 0000  A SDP024 CLR   T4          T4 _ 0
00360P 020D 86 C8    A        LDAA  #200
00361P 020F 97 00    A        STAA  T2          T2 _ 200
00362P 0211 39                RTS               EXIT SDP02
00364P 0212    00    A        FCB   0           CRC BYTE
00365                         END
TOTAL ERRORS 00000
```

```
RB      A2       00006*00326 00341 00350 00353
RB      A3       00006*00309 00323 00325 00343 00345
R       AT       00017*00169 00206 00256
RB      BADS6    00006*00233
RB      BADS7    00006*00238
RB      BADS8    00006*00227
R       BL6      00017*00231
R       BL7      00017*00235
R       BL8      00017*00225
R       BL9      00017*00236
RP      CANLOG   00011*00174 00354
RP      CFLG1    00011*00168
RP      CFLG2    00011*00029
R       CH       00017*00315 00332 00351
RP      CLITE1   00011*00166 00192 00195
 P 0123 CLRWL    00171 00219*
 P 013B CLRWL0   00222 00231*
 P 0145 CLRWL1   00223 00235*
 P 0150 CLRWL2   00230 00234 00239*
 P 0160 CLRWL3   00243 00247*
RP      DELAY    00010*00099 00285 00293
RP      DOMOVE   00012*00152 00158
R       DW6      00018*00232
R       DW7      00018*00237
R       DW8      00018*00226 00245
RP      EMODE1   00010*00109
RP      EXCXM    00012*00050
RB      FR1      00007*00180
R       JL1OFS   00018*00229
R       JL2OFS   00018*00239
RB      LITE1    00007*00170 00205 00255
RB      M1       00007*00034 00038 00076 00103 00106 00128 00219 00241 00259
RB      M2       00007*00102 00145 00296 00299
 P 0086 MCTBL    00079 00117*
R       MDW      00019*00148
RP      OFFX     00010*00080
R       RCAP     00019*00154
RP      READSR   00012*00047 00081 00127 00316
RP      SCACFA   00013*00043
DP 0000 SCAN     00021 00028*
 P 0023 SCAN0    00040 00043*
 P 0026 SCAN1    00042 00044*
 P 0029 SCAN3    00036 00047*
RP      SCATC    00013*00033
 P 00A0 SCLR02   00132 00135*
 P 00AF SCLR03   00137 00143*
 P 00B8 SCLR05   00144 00148*
 P 00CB SCLR07   00150 00157*
 P 00D7 SCLR1    00165*00178 00201 00203 00210
 P 00D4 SCLR2    00141 00146 00155 00162*
 P 00EA SCLR3    00130 00177*
 P 0106 SCLR4    00184 00194*
 P 0110 SCLR5    00187 00200*
 P 0118 SCLR7    00181 00205*
 P 0122 SCLRXT   00207 00212*
R       SCNATT   00013*00044
DP 0092 SCNCLR   00021 00031 00127*
```

```
 P 0161 SCNDPO 00032 00252*00294
 P 003C  SCNM3  00076*00093 00100
 P 0052  SCNM4  00083 00086*
 P 0058  SCNM4B 00085 00089*
 P 0074  SCNM5  00096 00102*
 P 0083  SCNM6  00104 00107 00111*
DP 0037  SCNMOD 00021 00030 00073*
RP       SCNTE  00013*00037
 P 0036  SCNXIT 00049 00055*
 P 0168  SDP011 00255*00286
 P 0179  SDP012 00257 00266*
 P 017D  SDP013 00261 00269*
 P 0180  SDP014 00264 00267 00271*
 P 019A  SDP015 00277 00282 00285*
 P 019F  SDP016 00273 00289*
 P 01AA  SDP017 00275 00291 00296*
 P 01BA  SDP02  00266 00309*
 P 01C4  SDP020 00313 00315*
 P 01E4  SDP021 00318 00335*
 P 01FE  SDP022 00333 00353*
 P 0206  SDP023 00321 00330 00339 00348 00356*
 P 020A  SDP024 00336 00359*
RP       SDP03  00014*00269
R        SDP04  00014*00263
 P 01B5  SDPOXT 00298 00301*
RP       SETDW  00014*00355
RP       SETM1  00014*00089
RP       SLITE1 00015*00190 00197
RP       SPDO3  00015*00300
RP       SPFLED 00015*00240
RB       T2     00008*00289 00302 00361
RB       T3     00008*00253 00276 00280 00283
RB       T4     00008*00074 00092 00095 00097 00254 00272 00279 00320 00338
                00356 00359
R        TDF    00019*00028
R        TE     00019*00167 00179
R        TEC    00019*00165 00189 00194
RB       TEMP2  00008*00073 00111
R        TES    00019*00165 00191 00196
 P 0064  TESTT4 00087 00095*
RP       WUNCP  00015*00052 00090 00162
RB       XM     00008*00135 00139 00160
RP       XMDR   00015*00140

00001                    NAM   F12C
00002                    OPT   REL, CREF, LLEN=80
00003                    TTL   FLOW PAGES 12C THRU 12E
00004                    IDNT  JAN.  20, 1978

00006                    XREF  BSCT:ADS1, ADS2, ADS3
00007                    XREF  BSCT:BADS1, BADS6, BADS7, BADS8
00008                    XREF  BSCT:CLITE1, K2, L1, L2, LD, M1, M2
00009                    XREF  BSCT:T2, T4, TEMP, TEMP2, TEMP4, TEMP5

00011                    XREF  PSCT:MOVBLK, OFFX, PNTATT, READSR
00012                    XREF  PSCT:SCLUP1, SDW678, SDWL1, WRT7

00014                    XREF  BL1, BL7, BL8, BL9, BLSP1, BWDD1
00015                    XREF  DW1, DW6, DW8, FAIL, JL1OFS, JL2OFS
00016                    XREF  OBL, OBLSP, OBWDD, PASS

00018                    XDEF  SCLDN1
00019                    XDEF  SDP04, SCROL1, SCRL1A, SCRL1B, SCRL1C 00021P 0000              PSCT
00023                *
00024                * SDP04 - WHEN AT = 0, SCAN DATA POSITION
00025                *         CONTROL (K2)
```

```
00026
00027                                  * FLOW PAGE 12C
00028                                  *
00029P 0000 BD 0000   A  SDP04   JSR   READSR      READ SWITCH REGISTERS
00030P 0003 81 15     A          CMPA  #$15        IS PROBE ADV/CLEAR PRESSED?
00031P 0005 27 46 004D           BEQ   SDP042      IF YES...BRANCH
00032P 0007 81 22     A          CMPA  #$22        IS DATA POSITION CONTROL UP?
00033P 0009 27 42 004D           BEQ   SDP042      IF YES...BRANCH
00034P 000B 81 21     A          CMPA  #$21        IS DATA POSITION CONTROL DOWN?
00035P 000D 27 20 002F           BEQ   SDP041      IF YES...BRANCH
00036P 000F 7F 0000   A          CLR   T4          T4 = 0
00037P 0012 96 00     A          LDAA  M1
00038P 0014 81 04     A          CMPA  #4          IS M1 = 4?
00039P 0016 27 04 001C           BEQ   SDP046      IF YES...BRANCH
00040P 0018 81 05     A          CMPA  #5          IS M1 = 5?
00041P 001A 26 0F 002B           BNE   SDP040      IF NOT...BRANCH
00042P 001C 86 C8     A  SDP046  LDAA  #200
00043P 001E 97 00     A          STAA  T2          T2 = 200
00044P 0020 D6 00     A          LDAB  M2
00045P 0022 C1 08     A          CMPB  #8          IS M2 > 8?
00046P 0024 23 04 002A           BLS   SDP047      IF NOT...BRANCH
00047P 0026 96 00     A          LDAA  M1
00048P 0028 97 00     A          STAA  M2          M2 = M1
00049P 002A 39            SDP047 RTS               EXIT 00051P 002B 7C 0000   A  SDP040  INC   T2          T2 = T2+1
00052P 002E 39                   RTS 00054P 002F 96 00     A  SDP041  LDAA  T4
00055P 0031 26 4B 007E           BNE   SDP045      BRANCH IF T4 <> 0
00056P 0033 96 00     A          LDAA  K2
00057P 0035 81 01     A          CMPA  #1          IS K2 = 1?
00058P 0037 27 07 0040           BEQ   SDP049      IF YES...BRANCH
00059P 0039 7A 0000   A          DEC   K2          K2 = K2-1
00060P 003C 8D 44 0082           BSR   SCLDN1      SCROLL ALL TRACES DOWN 1 LINE
00061P 003E 20 2C 006C           BRA   SDP043

00063P 0040 B6 0000   A  SDP049  LDAA  DW8
00064P 0043 81 10     A          CMPA  #16         IS DW(8),1 = "P"?
00065P 0045 26 37 007E           BNE   SDP045      IF NOT...BRANCH
00066P 0047 DE 00     A          LDX   BADS8
00067P 0049 6F 00     A          CLR   JL10FS,X    J(8,1) = 0
00068P 004B 20 1F 006C           BRA   SDP043

00070P 004D 96 00     A  SDP042  LDAA  T4
00071P 004F 26 2D 007E           BNE   SDP045      BRANCH IF T4 <> 0
00072P 0051 96 00     A          LDAA  K2
00073P 0053 81 64     A          CMPA  #100        IS K2 = 100?
00074P 0055 26 0F 0066           BNE   SDP048      IF NOT...BRANCH
00075P 0057 96 00     A          LDAA  M1
00076P 0059 81 03     A          CMPA  #3          IS M1 = 3?
00077P 005B 26 21 007E           BNE   SDP045      IF NOT...BRANCH
00078P 005D 86 08     A          LDAA  #8
00079P 005F 97 00     A          STAA  LD          LD = 8
00080P 0061 BD 0000   A          JSR   WRT7        IN PRGM MODE, WRITE TRACE(LD)
00081                         *                    AS RECORD K2+8-LD
00082P 0064 20 06 006C           BRA   SDP043
00083P 0066 7C 0000   A  SDP048  INC   K2          K2 = K2+1
00084P 0069 BD 0000   A          JSR   SCLUP1      SCROLL ALL TRACES UP 1 LINE
00085P 006C 96 00     A  SDP043  LDAA  M2
00086P 006E 81 08     A          CMPA  #8          IS M2 > 8?
00087P 0070 2E 09 007B           BGT   SDP044      IF YES...BRANCH
00088P 0072 8B 0A     A          ADDA  #10
00089P 0074 97 00     A          STAA  M2          M2 = M2+10
00090P 0076 C6 00     A          LDAB  #PASS+FAIL
00091P 0078 BD 0000   A          JSR   CLITE1      PASS = 0, FAIL = 0
00092P 007B 7F 0000   A  SDP044  CLR   T2          T2 = 0
00093P 007E 7C 0000   A  SDP045  INC   T4          T4 = T4+1
00094P 0081 39                   RTS
00096                         *
00097                         * SCLDN1 - WHEN M1 = 3, 4, 5 OR 6 (IE. PROGRAM,
00098                         *          SCOPE, MIXED OR AUTOSCOPE), SCROLL
00099                         *          ALL TRACES DOWN ONE LINE
00100                         *
00101                         * FLOW PAGE 12D1
```

```
00102                         *
00103P 0082 96 00    A SCLDN1 LDAA    M1
00104P 0084 81 05    A        CMPA    #5           IS M1 = 5? (IE. MIXED MODE?)
00105P 0086 27 3A 00C2        BEQ     SCLD04       IF YES...BRANCH
00106P 0088 C6 08    A        LDAB    #8
00107P 008A D7 00    A        STAB    L1           L1 = 8
00108P 008C 81 06    A        CMPA    #6           IS M1 = 6? (IE. AUTOSCOPE?)
00109P 008E 27 05 0095        BEQ     SCLD01       IF YES...BRANCH
00110P 0090 5A                DECB                 ACCB = 7
00111P 0091 D7 00    A        STAB    L2           L2 = 7
00112P 0093 20 34 00C9        BRA     SCLD05
00113P 0095 97 00    A SCLD01 STAA    L2           L2 = 6 (L2 IS "FROM" LINE #)
00114P 0097 86 FF    A        LDAA    #255-0       1'S COMPLEMENT OF ZERO
00115P 0099 B7 0000  A        STAA    BL7          SET BL(7)
00116P 009C B7 0000  A        STAA    BL8          SET BL(8)
00117P 009F B7 0000  A        STAA    BL9          SET BL(9)
00118P 00A2 BD 0000  A        JSR     SDW678       SET DW(7) AND DW(8) TO
00119                         *                    STR(K2)
00120P 00A5 F6 0000  A        LDAB    DW6          GET DW(6),1
00121P 00A8 C1 0B    A        CMPB    #11          IS IT A DTO "A"?
00122P 00AA 26 0E 00BA        BNE     SCLD02       IF NOT...BRANCH
00123P 00AC DE 00    A        LDX     BADS6        POINT TO J(6)
00124P 00AE 86 03    A        LDAA    #3
00125P 00B0 A7 00    A        STAA    JL1OFS,X     J(6,1) = 3
00126P 00B2 86 07    A        LDAA    #7
00127P 00B4 97 00    A        STAA    L1           L1 = 7
00128P 00B6 DE 00    A        LDX     BADS8        POINT TO J(8)
00129P 00B8 20 02 00BC        BRA     SCLD03

00131P 00BA DE 00    A SCLD02 LDX     BADS7        POINT TO J(7)
00132P 00BC 6F 00    A SCLD03 CLR     JL1OFS,X     J(X,1) = 0
00133P 00BE 6F 00    A        CLR     JL2OFS,X     J(X,2) = 0
00134P 00C0 20 07 00C9        BRA     SCLD05

00136P 00C2 86 06    A SCLD04 LDAA    #6
00137P 00C4 97 00    A        STAA    L1           L1 = 6
00138P 00C6 4A                DECA
00139P 00C7 97 00    A        STAA    L2           L2 = 5
00140P 00C9 96 00    A SCLD05 LDAA    L1
00141P 00CB BD 0185  P        JSR     SCRL1C       GET BADS(L1)
00142P 00CE DF 00    A        STX     ADS1         ADS1 = BADS(L1)
00143P 00D0 96 00    A        LDAA    L1
00144P 00D2 BD 0000  A        JSR     PNTATT       POINT TO TRACE(L1) ATTRIBUTES
00145P 00D5 E6 00    A        LDAB    OBWDD,X      GET BWDD(L1)
00146P 00D7 D7 00    A        STAB    ADS2         ADS2 = BWDD(L1)
00147P 00D9 E6 00    A        LDAB    OBLSP,X      GET BLSP(L1)
00148P 00DB D7 00    A        STAB    ADS3         ADS3 = BLSP(L1)
00149P 00DD BD 0117  P SCLD06 JSR     SCROL1       SCROLL ONE LINE
00150P 00E0 96 00    A        LDAA    L1
00151P 00E2 D6 00    A        LDAB    L2
00152P 00E4 81 08    A        CMPA    #8           IS L1 = 8?
00153P 00E6 26 07 00EF        BNE     SCLD07       IF NOT...BRANCH
00154P 00E8 C1 06    A        CMPB    #6           IS L2 = 6?
00155P 00EA 26 03 00EF        BNE     SCLD07       IF NOT...BRANCH
00156P 00EC 7A 0000  A        DEC     L1           L1 = L1-1
00157P 00EF C1 01    A SCLD07 CMPB    #1           IS L2 = 1?
00158P 00F1 27 08 00FB        BEQ     SCLD08       IF YES...BRANCH
00159P 00F3 7A 0000  A        DEC     L1           L1 = L1-1
00160P 00F6 7A 0000  A        DEC     L2           L2 = L2-1
00161P 00F9 20 E2 00DD        BRA     SCLD06
00162P 00FB 86 FF    A SCLD08 LDAA    #255-0       1'S COMPLEMENT OF 0
00163P 00FD B7 0000  A        STAA    BL1          BL(1) = 1'S COMPLEMENT OF 0
00164P 0100 DE 00    A        LDX     ADS1
00165P 0102 DF 00    A        STX     BADS1        BADS(1) = ADS1
00166P 0104 96 00    A        LDAA    ADS2
00167P 0106 B7 0000  A        STAA    BWDD1        BWDD(1) = ADS2
00168P 0109 96 00    A        LDAA    ADS3
00169P 010B B7 0000  A        STAA    BLSP1        BLSP(1) = ADS3
00170P 010E 6F 00    A        CLR     JL2OFS,X     J(1,2) = 0
00171P 0110 D7 00    A        STAB    L1           L1 = 1
00172P 0112 6F 00    A        CLR     JL1OFS,X     J(1,1) = 0
00173P 0114 7E 0000  A        JMP     SDWL1        USE K2 TO SET DW(L1), EXIT
00175
00176                         * SCROL1 - SCROLL DISPLAY 1 LINE FROM L2 TO L1
```

```
00177                        *
00178                        * FLOW PAGE 12E
00179                        *
00180P 0117 96 00      A SCROL1 LDAA   L1          MOVE DISPLAY WORD
00181P 0119 8D 5A 0175          BSR    SCRL1A      COMPUTE "TO" ADDRESS
00182P 011B DF 00      A        STX    TEMP
00183P 011D 96 00      A        LDAA   L2
00184P 011F 8D 54 0175          BSR    SCRL1A      COMPUTE "FROM" ADDRESS
00185P 0121 08                  INX
00186P 0122 08                  INX
00187P 0123 08                  INX
00188P 0124 08                  INX                FOUR BYTES TO BE MOVED
00189P 0125 DF 00      A        STX    TEMP2
00190P 0127 09                  DEX
00191P 0128 09                  DEX
00192P 0129 09                  DEX
00193P 012A 09                  DEX
00194P 012B BD 0000    A        JSR    MOVBLK      DO THE MOVE
00195                        *
00196                        * MOVE DISPLAY ATTRIBUTES
00197                        *
00198P 012E 96 00      A        LDAA   L1
00199P 0130 BD 0000    A        JSR    PNTATT      COMPUTE "TO" ADDRESS
00200P 0133 DF 00      A        STX    TEMP4       SAVE FOR LATER
00201P 0135 86 FF      A        LDAA   #255-0      1'S COMPLEMENT OF 0
00202P 0137 A7 00      A        STAA   OBL,X       BLANK DISPLAY
00203P 0139 08                  INX
00204P 013A 08                  INX
00205P 013B 08                  INX                ADD 3
00206P 013C DF 00      A        STX    TEMP
00207P 013E 96 00      A        LDAA   L2
00208P 0140 BD 0000    A        JSR    PNTATT      COMPUTE "FROM" ADDRESS
00209P 0143 DF 00      A        STX    TEMP5       SAVE FOR LATER
00210P 0145 08                  INX
00211P 0146 08                  INX
00212P 0147 08                  INX                ADD 3
00213P 0148 08                  INX
00214P 0149 08                  INX                LENGTH OF MOVE IS 2
00215P 014A DF 00      A        STX    TEMP2       SET TERMINATOR
00216P 014C 09                  DEX
00217P 014D 09                  DEX
00218P 014E BD 0000    A        JSR    MOVBLK      MOVE BLSP AND BWDD
00219P 0151 DE 00      A        LDX    TEMP4       SET UP FOR SECOND PART OF MOVE
00220P 0153 DF 00      A        STX    TEMP        "TO" ADDRESS
00221P 0155 DE 00      A        LDX    TEMP5       "FROM" ADDRESS
00222P 0157 08                  INX
00223P 0158 08                  INX
00224P 0159 08                  INX                LENGTH OF MOVE IS 3
00225P 015A DF 00      A        STX    TEMP2
00226P 015C DE 00      A        LDX    TEMP5
00227P 015E BD 0000    A        JSR    MOVBLK      MOVE XDAC, UNBL AND BL
00228P 0161 96 00      A        LDAA   L1
00229P 0163 8D 18 017D          BSR    SCRL1B      COMPUTE BADS(L1)
00230P 0165 DF 00      A        STX    TEMP
00231P 0167 96 00      A        LDAA   L2
00232P 0169 8D 12 017D          BSR    SCRL1B      COMPUTE BADS(L2)
00233P 016B 08                  INX
00234P 016C 08                  INX                LENGTH OF MOVE IS 2
00235P 016D DF 00      A        STX    TEMP2
00236P 016F 09                  DEX
00237P 0170 09                  DEX
00238P 0171 BD 0000    A        JSR    MOVBLK      BADS(L1) = BADS(L2)
00239P 0174 39                  RTS 00241           0175 P SCRL1A EQU     *           PLACE DW(ACCA) ADDRESS
00242                        *                    IN INDEX REG
00243P 0175 48                  ASLA
00244P 0176 48                  ASLA               ACCA = 4*L
00245P 0177 CE FFFC   A        LDX     #DW1-4
00246P 017A 7E 0000   A        JMP     OFFX        ADD TO INDEX AND EXIT 00248           017D P SCRL1B EQU     *           PLACE BADS(ACCA) ADDRESS
00249                        *                    IN INDEX REGISTER
00250P 017D 4A                  DECA               ACCA = L-1
```

```
00251P 017E 48              ASLA
00252P 017F CE 0000  A      LDX   #BADS1    ACCA = (L-1)*2
00253P 0182 7E 0000  A      JMP   OFFX
00255
00256        0185    P SCRL1C
00257P 0185
```

4,204,114

123

124

```
RP    SDW678   00012*00118
RP    SDWL1    00012*00173
RB    T2       00009*00043 00051 00092
RB    T4       00009*00036 00054 00070 00093
RB    TEMP     00009*00182 00206 00220 00230
RB    TEMP2    00009*00189 00215 00225 00235
RB    TEMP4    00009*00200 00219
RB    TEMP5    00009*00209 00221 00226
RP    WRT7     00012*00080

00001                        NAM    F12F1
00002                        OPT    REL, CREF, LLEN=80
00003                        TTL    FLOW PAGES 12F1 THRU 12L
00004                        IDNT   FEB.   21, 1978

00006                        XREF   BSCT:ADS1, ADS2, ADS3, AFXRF
00007                        XREF   BSCT:BADS1, BADS6, BADS7, BADS8, DCOMP, FR1
00008                        XREF   BSCT:K15, K2, K3, K4, K4S, K5, K5S, K5T, K7, K8
00009                        XREF   BSCT:L1, L2, LD, LI
00010                        XREF   BSCT:M1, MTR1, MTR2, SH, T1, TEMP, TEMP4

00012                        XREF   PSCT:CFLG1, DETK15, DSPDEL, DTOBTD
00013                        XREF   PSCT:EEXP10, EINT15, ENTINT, FLPDIV, FLPMLT
00014                        XREF   PSCT:K5MTPR, OFFX, PNTATT, RMR1R2
00015                        XREF   PSCT:SCRL1A, SCRL1B, SCRL1C, SCROL1
00016                        XREF   PSCT:SDW678, SETK6, SETTS, SFLG2
00017                        XREF   PSCT:SINT15, SMDW1, SST9
00018                        XREF   PSCT:WRT7

00020                        XREF   BL6, BL7, BL8, BL9, BLSP1, BWDD1, DW7, J15
00021                        XREF   JL1OFS, JL2OFS, JL3OFS, JL4OFS, JL5OFS
00022                        XREF   JL6OFS, JL7OFS, JL8OFS, JL9OFS, JLAOFS
00023                        XREF   K1, K4T, K5A, OBLSP, OBWDD, NCF

00025                        XDEF   COMK5, SCLUP1, SDWL1, SDWL1X, SPDO3

00027P 0000                   PSCT
00029                         *
00030                         * SCLUP1 - WHEN M1 = 3, 4, 5 OR 6 (IE. PROGRAM,
00031                         *          SCOPE, MIXED OR AUTOSCOPE), SCROLL
00032                         *          ALL TRACES UP ONE LINE
00033                         *
00034                         * FLOW PAGE 12F1
00035                         *
00036P 0000 86 01      A SCLUP1 LDAA  #1
00037P 0002 97 00      A        STAA  L1        L1 = 1
00038P 0004 4C                  INCA
00039P 0005 97 00      A        STAA  L2        L2 = 2
00040P 0007 DE 00      A        LDX   BADS1
00041P 0009 DF 00      A        STX   ADS1      ADS1 = BADS(1)
00042P 000B B6 0000    A        LDAA  BWDD1
00043P 000E 97 00      A        STAA  ADS2      ADS2 = BWDD(1)
00044P 0010 B6 0000    A        LDAA  BLSP1
00045P 0013 97 00      A        STAA  ADS3      ADS3 = BLSP(1)
00046P 0015 6F 00      A        CLR   JL2OFS,X  J(1,2) = 0
00047P 0017 6F 00      A        CLR   JL1OFS,X  J(1,1) = 0
00048P 0019 BD 0000    A SCLP01 JSR   SCROL1    SCROLL ONE LINE
00049P 001C 96 00      A        LDAA  M1
00050P 001E D6 00      A        LDAB  L2
00051P 0020 C1 06      A        CMPB  #6        IS L2 = 6?
00052P 0022 26 24 0048          BNE   SCLP03    IF NOT...BRANCH
00053P 0024 81 05      A        CMPA  #5        IS M1 = 5? (IE. MIXED MODE?)
00054P 0026 26 07 002F          BNE   SCLP02    IF NOT...BRANCH
00055P 0028 86 FF      A        LDAA  #$FF      1'S COMPLEMENT OF 0
00056P 002A B7 0000    A        STAA  BL6       BL(6) = 1'S COMPLEMENT OF 0
00057P 002D 20 3E 006D          BRA   SCLP07
00058P 002F 81 06      A SCLP02 CMPA  #6        IS M1 = 6? (IE. AUTOSCOPE?)
```

```
00059P 0031 26 15 0043           BNE     SCLP03     IF NOT...BRANCH
00060P 0033 F6 0000  A           LDAB    DW7
00061P 0036 C1 0B    A           CMPB    #11        IS DW(7),1 = DTO "A"?
00062P 0038 27 08 0042           BEQ     SCLP2A     IF YES...BRANCH
00063P 003A C6 07    A           LDAB    #7
00064P 003C D7 00    A           STAB    L2         L2 = 7
00065P 003E DE 00    A           LDX     BADS7      POINT TO J(7)
00066P 0040 20 02 0044           BRA     SCLP2B 00068P 0042 DE 00    A SCLP2A    LDX     BADS8      POINT TO J(8)
00069P 0044 6F 00    A SCLP2B    CLR     JL1OFS,X   J(X,1) = 0
00070P 0046 6F 00    A           CLR     JL2OFS,X   J(X,2) = 0
00071P 0048 96 00    A SCLP03    LDAA    M1
00072P 004A D6 00    A           LDAB    L1
00073P 004C C1 06    A           CMPB    #6         IS L1 = 6?
00074P 004E 26 04 0054           BNE     SCLP04     IF NOT...BRANCH
00075P 0050 81 06    A           CMPA    #6         IS M1 = 6? (IE. AUTOSCOPE?)
00076P 0052 27 0C 0060           BEQ     SCLP05     IF YES...BRANCH
00077P 0054 C1 07    A SCLP04    CMPB    #7         IS L1 = 7?
00078P 0056 27 10 0068           BEQ     SCLP06     IF YES...BRANCH
00079P 0058 7C 0000  A           INC     L1         L1 = L1+1
00080P 005B 7C 0000  A           INC     L2         L2 = L2+1
00081P 005E 20 B9 0019           BRA     SCLP01
00082P 0060 86 FF    A SCLP05    LDAA    #255-0     1'S COMPLEMENT OF 0
00083P 0062 B7 0000  A           STAA    BL7        SET BL(7)
00084P 0065 B7 0000  A           STAA    BL9        SET BL(9)
00085P 0068 86 FF    A SCLP06    LDAA    #255-0     1'S COMPLEMENT OF 0
00086P 006A B7 0000  A           STAA    BL8        SET BL(8)
00087P 006D BD 0000  A SCLP07    JSR     SDW678     USE K2 TO SET DW(6), (7)
00088                 *                             AND/OR (8)
00089P 0070 96 00    A           LDAA    L2
00090P 0072 BD 0000  A           JSR     SCRL1B     POINT TO BADS(L2)
00091P 0075 96 00    A           LDAA    ADS1
00092P 0077 D6 01    A           LDAB    ADS1+1
00093P 0079 A7 00    A           STAA    0,X
00094P 007B E7 01    A           STAB    1,X        BADS(L2) = ADS1
00095P 007D 96 00    A           LDAA    L2
00096P 007F BD 0000  A           JSR     PNTATT     POINT TO TRACE(L2) ATTRIBUTES
00097P 0082 96 00    A           LDAA    ADS2
00098P 0084 A7 00    A           STAA    OBWDD,X    BWDD(L2) = ADS2
00099P 0086 96 00    A           LDAA    ADS3
00100P 0088 A7 00    A           STAA    OBLSP,X    BLSP(L2) = ADS3
00101P 008A 96 00    A           LDAA    M1
00102P 008C 81 03    A           CMPA    #3         IS M1 = 3? (IE. PRGM MODE?)
00103P 008E 26 07 0097           BNE     SCLP08     IF NOT...BRANCH
00104P 0090 86 07    A           LDAA    #7
00105P 0092 97 00    A           STAA    LD         LD = 7
00106P 0094 7E 0000  A           JMP     WRT7       IN PRGM MODE, WRITE TRACE(LD)
00107                 *                             AS RECORD K2+8-LD ... AND EXIT
00108P 0097 39         SCLP08    RTS
00109
00110                 *
00111                 * SDWL1 - USE K2 TO SET DW(L1)
00112                 *
00113                 * FLOW PAGE 12G
00114                 *
00115P 0098 4F         SDWL1     CLRA
00116P 0099 D6 00    A           LDAB    K2
00117P 009B DB 00    A           ADDB    L1
00118P 009D 89 00    A           ADCA    #0         ACCA,ACCB = K2+L1
00119P 009F C0 06    A           SUBB    #6
00120P 00A1 82 00    A           SBCA    #0         ACCA,ACCB = K2+L1-6
00121P 00A3 97 00    A           STAA    TEMP
00122P 00A5 D7 01    A           STAB    TEMP+1
00123P 00A7 DE 00    A           LDX     TEMP       INDEX REG = K2+L1-6
00124P 00A9 96 00    A           LDAA    M1
00125P 00AB 81 05    A           CMPA    #5         IS M1 = 5? (IE. MIXED MODE?)
00126P 00AD 27 06 00B5           BEQ     SDWL1A     IF YES...BRANCH
00127P 00AF 09                   DEX                INDEX REG = K2+L1-7
00128P 00B0 81 06    A           CMPA    #6         IS M1 = 6? (IE. AUTOSCOPE?)
00129P 00B2 27 01 00B5           BEQ     SDWL1A     IF YES...BRANCH
00130P 00B4 09                   DEX                INDEX REG = K2+L1-8
00131P 00B5 DF 00    A SDWL1A    STX     TEMP
00132P 00B7 2F 1B 00D4           BLE     SDWL1B     BRANCH IF RESULT NOT > 0
00133P 00B9 96 00    A           LDAA    TEMP
```

```
00134P 00B8 D6 01    A         LDAB   TEMP+1     CONVERT VALUE TO DTO
00135P 00BD BD 0000  A         JSR    DTOBTD     CHARACTER STRING
00136P 00C0 96 00    A         LDAA   L1
00137P 00C2 BD 0000  A         JSR    SCRL1A     COMPUTE ADDRESS OF DW(L1)
00138P 00C5 31                 INS               SKIP OVER SIGN
00139P 00C6 31                 INS
00140P 00C7 31                 INS               SKIP OVER FIRST TWO DIGITS
00141P 00C8 6F 00    A         CLR    0,X        DW(L1),1 = " "
00142P 00CA 32                 PULA
00143P 00CB A7 01    A         STAA   1,X        DW(L1),2
00144P 00CD 32                 PULA
00145P 00CE A7 02    A         STAA   2,X        DW(L1),3
00146P 00D0 32                 PULA
00147P 00D1 A7 03    A         STAA   3,X        DW(L1),4
00148P 00D3 39                 RTS               EXIT 00150P 00D4 96 00    A SDWL1B  LDAA   L1
00151P 00D6 BD 0000  A         JSR    SCRL1A     COMPUTE ADDRESS OF DW(L1)
00152P 00D9 6F 00    A         CLR    0,X
00153P 00DB 6F 01    A         CLR    1,X
00154P 00DD 6F 02    A         CLR    2,X
00155P 00DF 6F 03    A         CLR    3,X        DW(L1) = DTO "    "
00156P 00E1 39                 RTS
00158                       *
00159                       * SPD03 - READ MAG. TAPE, IF REQUIRED,
00160                       *         THEN DISPLAY
00161                       *
00162                       * FLOW PAGE 12H
00163                       *
00164P 00E2 7F 0000  A SPD03   CLR    MTR1       MTR1 = 0
00165P 00E5 86 01    A         LDAA   #1
00166P 00E7 97 00    A         STAA   LD         LD = 1
00167P 00E9 96 00    A         LDAA   M1
00168P 00EB D6 00    A         LDAB   K2
00169P 00ED 81 06    A         CMPA   #6         IS M1 = 6?
00170P 00EF 27 0F 0100         BEQ    SPD03A     IF YES...BRANCH
00171P 00F1 81 03    A         CMPA   #3         IS M1 = 3?
00172P 00F3 26 33 0128         BNE    SPD03D     IF NOT...BRANCH
00173P 00F5 C1 07    A         CMPB   #7         IS K2 > 7?
00174P 00F7 22 20 0119         BHI    SPD03C     IF YES...BRANCH
00175P 00F9 86 09    A         LDAA   #9
00176P 00FB 10                 SBA
00177P 00FC 97 00    A         STAA   LD         LD = 9-K2
00178P 00FE 20 19 0119         BRA    SPD03C 00180P 0100 C1 01    A SPD03A  CMPB   #1         IS K2 = 1?
00181P 0102 27 11 0115         BEQ    SPD03Z     IF YES...BRANCH
00182P 0104 C1 06    A         CMPB   #6         IS K2 > 6?
00183P 0106 22 05 010D         BHI    SPD03B     IF YES...BRANCH
00184P 0108 86 08    A         LDAA   #8
00185P 010A 10                 SBA
00186P 010B 97 00    A         STAA   LD         LD = 8-K2
00187P 010D C6 07    A SPD03B  LDAB   #7
00188P 010F 8D 23 0134         BSR    SPD03F     COMPUTE MTR1, MTR2, LI, LD
00189                        *                   ...RETURN WITH ACCA = LD
00190P 0111 81 07    A         CMPA   #7         IS LD = 7?
00191P 0113 26 F8 010D         BNE    SPD03B     IF NOT...BRANCH 00193P 0115 86 08    A SPD03Z  LDAA   #8
00194P 0117 97 00    A         STAA   LD         LD = 8

00196P 0119 C6 08    A SPD03C  LDAB   #8
00197P 011B 8D 17 0134         BSR    SPD03F     COMPUTE MTR1, MTR2, LI, LD
00198                        *                   ...RETURN WITH ACCA = LD
00199P 011D 81 09    A         CMPA   #9         IS LD = 9?
00200P 011F 26 F8 0119         BNE    SPD03C     IF NOT...BRANCH
00201P 0121 96 00    A         LDAA   MTR1       IS MTR1 = 0?
00202P 0123 27 03 0128         BEQ    SPD03D     IF YES...BRANCH
00203P 0125 BD 0000  A         JSR    RMR1R2     READ MTR1 THRU MTR2,
00204                        *                   START STORAGE AT BADS(LI)

00206P 0128 8D 2A 0154 SPD03D  BSR    SK3K8      SET K3 THRU K8
00207                        *                   THEN DISPLAY
00208P 012A 96 00    A         LDAA   M1
```

```
00209P 012C 81 06      A            CMPA    #6          IS M1 = 6?
00210P 012E 26 03 0133              BNE     SPDO3E
00211P 0130 7E 0000    A            JMP     SST9        SET STORAGE TRACE 9
00212                         *                         ... AND EXIT
00213P 0133 39              SPDO3E  RTS
00215       0134 P SPDO3F EQU       *                   COMPUTE MTR1, MTR2, LI, LD
00216                         *                         ACCB HAS CONSTANT USED
00217                         *                         IN SETTING MTR1, MTR2
00218P 0134 96 00      A            LDAA    LD
00219P 0136 BD 0000    A            JSR     SCRL1C      POINT TO J(LD)
00220P 0139 6D 00      A            TST     JL1OFS,X    IS J(LD,1) = 0?
00221P 013B 26 11 014E              BNE     SPDO3H      IF NOT...BRANCH
00222P 013D 96 00      A            LDAA    K2
00223P 013F 9B 00      A            ADDA    LD
00224P 0141 10                      SBA                 ACCA = K2+LD-CONSTANT
00225P 0142 D6 00      A            LDAB    MTR1        IS MTR1 = 0?
00226P 0144 26 06 014C              BNE     SPDO3G      IF NOT...BRANCH
00227P 0146 97 00      A            STAA    MTR1        SET MTR1
00228P 0148 D6 00      A            LDAB    LD
00229P 014A D7 00      A            STAB    LI          LI = LD
00230P 014C 97 00      A SPDO3G     STAA    MTR2        SET MTR2
00231P 014E 7C 0000    A SPDO3H     INC     LD          LD = LD+1
00232P 0151 96 00      A            LDAA    LD          SET ACCA FOR EXIT
00233P 0153 39                      RTS
00235                         *
00236                         * SK3K8 - SET K3 THRU K8, THEN DISPLAY
00237                         *
00238                         * FLOW PAGE 12K
00239                         *
00240P 0154 DE 00      A SK3K8      LDX     K4
00241P 0156 FF 0000    A            STX     K4T         K4T = K4
00242P 0159 DE 00      A            LDX     K5
00243P 015B DF 00      A            STX     K5T         K5T = K5
00244P 015D 96 00      A            LDAA    M1
00245P 015F 81 05      A            CMPA    #5          IS M1 = 5? (IE. MIXED MODE?)
00246P 0161 27 06 0169              BEQ     SK3K8A      IF YES...BRANCH
00247P 0163 DE 00      A            LDX     BADS8       POINT TO TRACE 8 DATA
00248P 0165 86 08      A            LDAA    #8          PRESET FOR LD
00249P 0167 20 04 016D              BRA     SK3K8B
00250P 0169 DE 00      A SK3K8A     LDX     BADS6       POINT TO TRACE 6 DATA
00251P 016B 86 06      A            LDAA    #6          PRESET FOR LD
00252P 016D 97 00      A SK3K8B     STAA    LD          SET LD
00253P 016F 6D 00      A            TST     JL2OFS,X    IS J(X,2) = 0?
00254P 0171 26 1C 018F              BNE     SK3K8D      IF NO...BRANCH
00255P 0173 86 00      A            LDAA    #K1
00256P 0175 95 00      A            BITA    FR1         IS K1 = 0?
00257P 0177 26 03 017C              BNE     SK3K8L
00258P 0179 7E 0218    P            JMP     SK3K8G      IF YES...BRANCH
00259P 017C BD 0000    A SK3K8L     JSR     CFLG1       K1 = 0
00260P 017F 96 00      A SK3K8C     LDAA    LD
00261P 0181 BD 0000    A            JSR     SCRL1C      POINT TO TRACE(LD) DATA
00262P 0184 6D 00      A            TST     JL2OFS,X    IS J(LD,2) = 0?
00263P 0186 26 07 018F              BNE     SK3K8D      IF NOT...BRANCH
00264P 0188 7A 0000    A            DEC     LD          LD = LD - 1
00265P 018B 26 F2 017F              BNE     SK3K8C      LOOP UNTIL LD = 0
00266P 018D 20 5F 01EE              BRA     SK3K8E      BRANCH 00268P 018F A6 00      A SK3K8D     LDAA    JL3OFS,X
00269P 0191 E6 01      A            LDAB    JL3OFS+1,X
00270P 0193 97 00      A            STAA    K3
00271P 0195 D7 01      A            STAB    K3+1        K3 = J(LD,3)
00272P 0197 A6 00      A            LDAA    JL4OFS,X
00273P 0199 E6 01      A            LDAB    JL4OFS+1,X
00274P 019B 97 00      A            STAA    K4
00275P 019D D7 01      A            STAB    K4+1        K4 = J(LD,4)
00276P 019F 97 00      A            STAA    K4S
00277P 01A1 D7 01      A            STAB    K4S+1       K4S = K4
00278P 01A3 A6 00      A            LDAA    JL5OFS,X
00279P 01A5 E6 01      A            LDAB    JL5OFS+1,X
00280P 01A7 36                      PSHA
00281P 01A8 96 00      A            LDAA    M1
00282P 01AA 81 06      A            CMPA    #6          IS M1 = 6?
00283P 01AC 32                      PULA
00284P 01AD 26 0C 01BB              BNE     SK3K8M      IF NOT...BRANCH
```

```
00285P 01AF DF 00     A              STX   TEMP4     SAVE INDEX
00286P 01B1 8D 70 0223               BSR   COMK5
00287                        *             K5 = 50+INT[(J(LD,5)-50)*1000/(AF/RF)]
00288P 01B3 B7 0000   A              STAA  K5A
00289P 01B6 F7 0001   A              STAB  K5A+1     K5A = K5
00290P 01B9 DE 00     A              LDX   TEMP4     RESTORE INDEX 00292P 01BB 97 00     A  SK3K8M      STAA  K5        SET K5
00293P 01BD D7 01     A              STAB  K5+1
00294P 01BF BD 0000   A              JSR   K5MTPR    ACCA,ACCB = K5-TPR*10
00295                        *                       NOTE: BOTH K5 AND K5S ARE INT15*10
00296P 01C2 97 00     A              STAA  K5S
00297P 01C4 D7 01     A              STAB  K5S+1     K5S = K5-TPR*10
00298P 01C6 DF 00     A              STX   TEMP4     SAVE POINTER TO TRACE(LD) DATA
00299P 01C8 A6 00     A              LDAA  JL80FS,X
00300P 01CA 97 00     A              STAA  K8        K8 = J(LD,8)
00301P 01CC E6 00     A              LDAB  JL90FS,X
00302P 01CE A6 00     A              LDAA  JL60FS,X
00303P 01D0 EE 00     A              LDX   JL70FS,X
00304P 01D2 DF 00     A              STX   K7        K7 = J(LD,7)
00305P 01D4 D7 00     A              STAB  DCOMP     DCOMP = J(LD,9)
00306P 01D6 BD 0000   A              JSR   SETK6     K6 = J(LD,6)
00307P 01D9 DE 00     A              LDX   TEMP4     GET POINTER TO TRACE(LD) DATA
00308P 01DB A6 00     A              LDAA  JLAOFS,X
00309P 01DD E6 01     A              LDAB  JLAOFS+1,X GET J(LD,10)
00310P 01DF 36                       PSHA
00311P 01E0 96 00     A              LDAA  LD
00312P 01E2 48                       ASLA            TIMES 2
00313P 01E3 CE FFFE   A              LDX   #J15-2
00314P 01E6 BD 0000   A              JSR   OFFX      POINT TO J15(LD)
00315P 01E9 32                       PULA
00316P 01EA A7 00     A              STAA  0,X
00317P 01EC E7 01     A              STAB  1,X       J15(LD) = J(LD,10)
00318P 01EE BD 0000   A  SK3K8E      JSR   DETK15    DETERMINE K15
00319P 01F1 DE 00     A              LDX   K15
00320P 01F3 FF 000E   A              STX   J15+14    J15(8) = K15
00321P 01F6 BD 0000   A              JSR   SMDW1     SET MDW 7-40
00322P 01F9 BD 0000   A              JSR   SETTS     USE K8 TO SET TSI, TSA & TSE
00323P 01FC DE 00     A              LDX   K4
00324P 01FE BC 0000   A              CPX   K4T       IS K4 = K4T?
00325P 0201 26 0B 020E                BNE  SK3K8F    IF NOT...BRANCH
00326P 0203 DE 00     A              LDX   K5
00327P 0205 9C 00     A              CPX   K5T       IS K5 = K5T?
00328P 0207 26 05 020E                BNE  SK3K8F    IF NOT...BRANCH
00329P 0209 86 00     A  SK3K8H      LDAA  #NCF
00330P 020B BD 0000   A              JSR   SFLG2     NCF = 1
00331P 020E 7F 0000   A  SK3K8F      CLR   SH        SH = 0
00332P 0211 86 16     A              LDAA  #22
00333P 0213 97 00     A              STAA  T1        T1 = 22
00334P 0215 7E 0000   A              JMP   DSPDEL    CHANGE DISPLAY DUE TO
00335                        *                       DELTA K4 / DELTA K5 AND EXIT
00336P 0218 96 00     A  SK3K8G      LDAA  LD
00337P 021A BD 0000   A              JSR   SCRL1C    (INDEX _ BADS(LD))
00338P 021D 86 01     A              LDAA  #1
00339P 021F A7 00     A              STAA  JL10FS,X  J(LD,1) = 1
00340P 0221 20 E6 0209                BRA  SK3K8H    BRANCH TO EXIT SEQUENCE 00342P 0223 C0 32     A  COMK5       SUBB  #50       NOTE: J(LD,5) IS INT15*10
00343P 0225 82 00     A              SBCA  #0
00344P 0227 BD 0000   A              JSR   ENTINT    ENTER J(LD,5)-50
00345P 022A 86 03     A              LDAA  #3
00346P 022C BD 0000   A              JSR   EEXP10    ENTER 10**3
00347P 022F BD 0000   A              JSR   FLPMLT    MULTIPLY
00348P 0232 CE 0000   A              LDX   #AFXRF
00349P 0235 BD 0000   A              JSR   EINT15    ENTER AF/RF
00350P 0238 BD 0000   A              JSR   FLPDIV    DIVIDE
00351P 023B CE 0000   A              LDX   #TEMP
00352P 023E BD 0000   A              JSR   SINT15    STORE RESULT IN TEMP
00353P 0241 96 00     A              LDAA  TEMP
00354P 0243 D6 01     A              LDAB  TEMP+1
00355P 0245 CB 32     A              ADDB  #50
00356P 0247 89 00     A              ADCA  #0        ADD IN 50
00357P 0249 39                       RTS             ...RETURN
```

```
00359                      *
00360                      * SDWL1X - USE K2 TO SET DW(1) THRU DW(L1)
00361                      *
00362                      * FLOW PAGE 12L
00363                      *
00364P 024A BD 0098  P SDWL1X JSR  SDWL1     USE K2 TO SET DW(L1)
00365P 024D 7A 0000  A        DEC  L1        L1 = L1-1
00366P 0250 26 F8 024A        BNE  SDWL1X    BRANCH IF L1 <> 0
00367P 0252 39                RTS
00369P 0253    00    A        FCB  0         CRC BYTE
00370                         END
TOTAL ERRORS 00000
```

```
RB        ADS1     00006*00041 00091 00092
RB        ADS2     00006*00043 00097
RB        ADS3     00006*00045 00099
RB        AFXRF    00006*00348
RB        BADS1    00007*00040
RB        BADS6    00007*00250
RB        BADS7    00007*00065
RB        BADS8    00007*00068 00247
R         BL6      00020*00056
R         BL7      00020*00083
R         BL8      00020*00086
R         BL9      00020*00084
R         BLSP1    00020*00044
R         BWDD1    00020*00042
RP        CFLG1    00012*00259
DP  0223  COMK5    00025 00286 00342*
RB        DCOMP    00007*00305
RP        DETK15   00012*00318
RP        DSPDEL   00012*00334
RP        DTOBTD   00012*00135
R         DW7      00020*00060
RP        EEXP10   00013*00346
RP        EINT15   00013*00349
RP        ENTINT   00013*00344
RP        FLPDIV   00013*00350
RP        FLPMLT   00013*00347
RB        FR1      00007*00256
R         J15      00020*00313 00320
R         JL1OFS   00021*00047 00069 00220 00339
R         JL2OFS   00021*00046 00070 00253 00262
R         JL3OFS   00021*00268 00269
R         JL4OFS   00021*00272 00273
R         JL5OFS   00021*00278 00279
R         JL6OFS   00022*00302
R         JL7OFS   00022*00303
R         JL8OFS   00022*00299
R         JL9OFS   00022*00301
R         JLAOFS   00022*00308 00309
R         K1       00023*00255
RB        K15      00008*00319
RB        K2       00008*00116 00168 00222
RB        K3       00008*00270 00271
RB        K4       00008*00240 00274 00275 00323
RB        K4S      00008*00276 00277
R         K4T      00023*00241 00324
RB        K5       00008*00242 00292 00293 00326
R         K5A      00023*00288 00289
R         K5MTPR   00014*00294
RB        K5S      00008*00296 00297
RB        K5T      00008*00243 00327
RB        K7       00008*00304
RB        K8       00008*00300
RB        L1       00009*00037 00072 00079 00117 00136 00150 00365
RB        L2       00009*00039 00050 00064 00080 00089 00095
RB        LD       00009*00105 00166 00177 00186 00194 00218 00223 00228 00231
                   00232 00252 00260 00264 00311 00336
RB        LI       00009*00229
RB        M1       00010*00049 00071 00101 00124 00167 00208 00244 00281
RB        MTR1     00010*00164 00201 00225 00227
```

```
RB      MTR2     00010*00230
R       NCF      00023*00329
R       OBLSP    00023*00100
R       OBWDD    00023*00098
RP      OFFX     00014*00314
RP      PNTATT   00014*00096
RP      RMR1R2   00014*00203
 P 0019 SCLP01   00048*00081
 P 002F SCLP02   00054 00058*
 P 0048 SCLP03   00052 00059 00071*
 P 0054 SCLP04   00074 00077*
 P 0060 SCLP05   00076 00082*
 P 0068 SCLP06   00078 00085*
 P 006D SCLP07   00057 00087*
 P 0097 SCLP08   00103 00108*
 P 0042 SCLP2A   00062 00068*
 P 0044 SCLP2B   00066 00069*
DP 0000 SCLUP1   00025 00036*
RP      SCRL1A   00015*00137 00151
RP      SCRL1B   00015*00090
RP      SCRL1C   00015*00219 00261 00337
RP      SCROL1   00015*00048
RP      SDW678   00016*00087
DP 0093 SDWL1    00025 00115*00364
 P 00B5 SDWL1A   00126 00129 00131*
 P 00D4 SDWL1B   00132 00150*
DP 024A SDWL1X   00025 00364*00366
RP      SETK6    00016*00306
RP      SETTS    00016*00322
RP      SFLG2    00016*00330
RB      SH       00010*00331
RP      SINT15   00017*00352
 P 0154 SK3K8    00206 00240*
 P 0169 SK3K8A   00246 00250*
 P 016D SK3K8B   00249 00252*
 P 017F SK3K8C   00260*00265
 P 018F SK3K8D   00254 00263 00268*
 P 01EE SK3K8E   00266 00318*
 P 020E SK3K8F   00325 00328 00331*
 P 0218 SK3K8G   00258 00336*
 P 0209 SK3K8H   00329*00340
 P 017C SK3K8L   00257 00259*
 P 01BB SK3K8M   00284 00292*
RP      SMDW1    00017*00321
DP 00E2 SPDO3    00025 00164*
 P 0100 SPDO3A   00170 00180*
 P 010D SPDO3B   00183 00187*00191
 P 0119 SPDO3C   00174 00178 00196*00200
 P 0129 SPDO3D   00172 00202 00206*
 P 0133 SPDO3E   00210 00213*
 P 0134 SPDO3F   00188 00197 00215*
 P 014C SPDO3G   00226 00230*
 P 014E SPDO3H   00221 00231*
 P 0115 SPDO3Z   00181 00193*
RP      SST9     00017*00211
RB      T1       00010*00333
RB      TEMP     00010*00121 00122 00123 00131 00133 00134 00351 00353 00354
RB      TEMP4    00010*00285 00290 00298 00307
RP      WRT7     00018*00106

00001              NAM    F13A
00002              OPT    REL, CREF, LLEN=80
00003              TTL    FLOW PAGES 13A THRU 13D
00004              IDNT   DEC.    9, 1977

00006              XREF   BSCT:FR3, FR4, LD, LI, LITE1, M1, M2, MTR1
00007              XREF   BSCT:TEMP, TEMP2, X2, XM

00009              XREF   DSCT:DIM, RCAP, TBL, TDW

00011              XREF   PSCT:CANCP, CBLOCK, CFLG3, CLITE1, DOMOVE
00012              XREF   PSCT:DTOBTD, MDWM2, MOVBLK, OFFX, PNTATT, READSR
```

```
00013                       XREF    PSCT:SCNMOD,SCRL1A,SETDW,SFLG3,SLITE1
00014                       XREF    PSCT:TRUNR,TSTOP,WUNCP,X2MDW

00016                       XREF    AT,AUX,CONF,MDW,OBL,READY,RESET,TSTAT

00018                       XDEF    AINGW,DSPDIM,SCATC,SCATR8,XMDR 00020P 0000                 PSCT
00022                *
00023                * SCATC - SCAN AT CONTROL
00024                *
00025                * FLOW PAGE 13A
00026                *
00027P 0000 96 00    A SCATC LDAA   M1
00028P 0002 81 04    A       CMPA   #4         IS M1 = 4? (IE. SCOPE MODE?)
00029P 0004 27 05 000B       BEQ    SCATR0     IF YES...BRANCH
00030P 0006 81 05    A       CMPA   #5         IS M1 = 5? (IE. MIXED MODE?)
00031P 0008 27 01 000B       BEQ    SCATR0     IF YES...BRANCH 00033P 000A 39         SCATR6 RTS 00035P 000B BD 0000  A SCATR0 JSR   READSR     READ SWITCH REGISTERS
00036P 000E 81 12    A       CMPA   #$12       IS ANALOG TRACE PRESSED?
00037P 0010 26 F8 000A       BNE    SCATR6     IF NOT...BRANCH
00038P 0012 86 01    A       LDAA   #1
00039P 0014 97 00    A       STAA   LD         LD = 1
00040P 0016 C6 00    A       LDAB   #AT
00041P 0018 D5 00    A       BITB   LITE1      IS AT = 1?
00042P 001A 27 30 004C       BEQ    SCATR2     IF NOT...BRANCH
00043P 001C BD 0000  A       JSR    CLITE1     AT = 0
00044P 001F 96 00    A SCATR1 LDAA  LD
00045P 0021 BD 0000  A       JSR    SCRL1A     COMPUTE "TO" ADDRESS
00046P 0024 DF 00    A       STX    TEMP
00047P 0026 96 00    A       LDAA   LD
00048P 0028 BD 0084  P       JSR    SCATR7     COMPUTE "FROM" ADDRESS
00049P 002B 08               INX
00050P 002C 08               INX
00051P 002D 08               INX
00052P 002E 08               INX               FOUR BYTES TO BE MOVED
00053P 002F DF 00    A       STX    TEMP2
00054P 0031 09               DEX
00055P 0032 09               DEX
00056P 0033 09               DEX
00057P 0034 09               DEX
00058P 0035 BD 0000  A       JSR    MOVBLK     DW(LD) = TDW(LD)
00059P 0038 96 00    A       LDAA   LD
00060P 003A 8D 53 008F       BSR    SCATR8     FIND TBL(LD)
00061P 003C E6 00    A       LDAB   0,X
00062P 003E BD 0000  A       JSR    PNTATT     POINT TO TRACE(LD) ATTRIBUTES
00063P 0041 E7 00    A       STAB   OBL,X      BL(LD) = TBL(LD)
00064P 0043 4C               INCA              LD = LD+1
00065P 0044 97 00    A       STAA   LD
00066P 0046 81 06    A       CMPA   #6         IS LD = 6?
00067P 0048 26 D5 001F       BNE    SCATR1     IF NOT...BRANCH
00068P 004A 20 35 0081       BRA    SCATR4

00070P 004C BD 0000  A SCATR2 JSR   SLITE1     AT = 1
00071P 004F 96 00    A       LDAA   LD
00072P 0051 8D 31 0084 SCATR3 BSR   SCATR7     COMPUTE "TO" ADDRESS
00073P 0053 DF 00    A       STX    TEMP
00074P 0055 BD 0000  A       JSR    SCRL1A     COMPUTE "FROM" ADDRESS
00075P 0058 08               INX
00076P 0059 08               INX
00077P 005A 08               INX
00078P 005B 08               INX               FOUR BYTES TO BE MOVED
00079P 005C DF 00    A       STX    TEMP2
00080P 005E 09               DEX
00081P 005F 09               DEX
00082P 0060 09               DEX
00083P 0061 09               DEX
```

```
00084P 0062 BD 0000  A          JSR    MOVBLK   TDW(LD) = DW(LD)
00085P 0065 96 00    A          LDAA   LD
00086P 0067 BD 0000  A          JSR    PNTATT   POINT TO TRACE(LD) ATTRIBUTES
00087P 006A E6 00    A          LDAB   OBL,X    FIND BL(LD)
00088P 006C 8D 21 008F          BSR    SCATR8   FIND TBL(LD)
00089P 006E E7 00    A          STAB   0,X      TBL(LD) = BL(LD)
00090P 0070 BD 0000  A          JSR    PNTATT   POINT TO TRACE(LD) ATTRIBUTES
00091                      *                    ... AGAIN
00092P 0073 C6 FF    A          LDAB   #$FF
00093P 0075 E7 00    A          STAB   OBL,X    BL(LD) = 1'S COMPLEMENT OF 0
00094P 0077 4C                  INCA            LD = LD+1
00095P 0078 97 00    A          STAA   LD
00096P 007A 81 06    A          CMPA   #6       IS LD = 6?
00097P 007C 26 D3 0051          BNE    SCATR3   IF NOT... BRANCH
00098P 007E BD 0000  A          JSR    SETDW    USE A2 & A3 TO SET
00099                      *                    DW(1) THRU DW(5)
00100P 0081 7E 0000  A SCATR4   JMP    CANCP    CLEAR ANALOG, NO CONTROLS PRESSED
00101                      *                    ... AND EXIT 00103P 0084 36         SCATR7   PSHA
00104P 0085 CE FFFC  A          LDX    #TDW-4
00105P 0088 48                  ASLA
00106P 0089 48                  ASLA            ACCA = 4*L
00107P 008A BD 0000  A          JSR    OFFX     ADD TO INDEX REGISTER
00108P 008D 32                  PULA            RESTORE ACCA
00109P 008E 39                  RTS 00111P 008F CE FFFF  A SCATR8   LDX    #TBL-1
00112P 0092 7E 0000  A          JMP    OFFX     ADD TO INDEX REGISTER AND EXIT
00114                      *
00115                      * XMDR - IN XCRIBE MODE, DISPLAY "READ"
00116                      *
00117                      * FLOW PAGE 13B
00118                      *
00119P 0095 86 0D    A XMDR     LDAA   #13
00120P 0097 BD 0000  A          JSR    MDWM2    MDW _ ALL " "
00121                      *                    MDW,6-9 _ "READ"
00122P 009A 86 01    A          LDAA   #1
00123P 009C 97 00    A          STAA   XM       XM _ 1
00124P 009E 97 00    A          STAA   X2       X2 _ 1
00125P 00A0 BD 0000  A          JSR    X2MDW    USE X2 TO SET MDW,12-16
00126P 00A3 86 16    A          LDAA   #22      PRESET FOR RCAP
00127P 00A5 D6 00    A          LDAB   FR4
00128P 00A7 C5 00    A          BITB   #AUX     IS AUX = 1?
00129P 00A9 27 02 00AD          BEQ    XMDR1    IF NOT... BRANCH
00130P 00AB 86 6C    A          LDAA   #108     RCAP _ 108
00131P 00AD B7 0000  A XMDR1    STAA   RCAP     SET RCAP
00132P 00B0 39                  RTS
00134                      *
00135                      * DSPDIM - DISPLAY DIM
00136                      *
00137                      * FLOW PAGE 13C
00138                      *
00139P 00B1 B6 0000  A DSPDIM   LDAA   DIM      IS DIM = 0?
00140P 00B4 26 01 00B7          BNE    DDIM10   IF YES... BRANCH
00141P 00B6 39                  RTS             ... AND EXIT 00143P 00B7 BD 0000  A DDIM10   JSR    TSTOP    WAIT 5 MS., STOP,
00144                      *                    WAIT 200 MS., SET RW
00145P 00BA 86 02    A          LDAA   #2
00146P 00BC BD 0000  A          JSR    DOMOVE   AW _ MDW 00148P 00BF B6 0000  A DDIM20   LDAA   DIM
00149P 00C2 36                  PSHA            SAVE DIM VALUE
00150P 00C3 CE 0150  P          LDX    #CDETBL
00151P 00C6 BD 0000  A          JSR    OFFX     TRANSLATE DIM NUMBER
00152P 00C9 A6 00    A          LDAA   0,X      TO NUMBER FOR MDWM2
00153P 00CB BD 0000  A          JSR    MDWM2    CLEAR MDW, THEN MOVE
00154                      *                    MESSAGE TO MDW
00155P 00CE 32                  PULA            RESTORE DIM VALUE
00156P 00CF 81 03    A          CMPA   #3       IS IT MESSAGE CODE 3?
00157P 00D1 27 04 00D7          BEQ    DDIM30   IF YES... BRANCH
00158P 00D3 81 05    A          CMPA   #5       IS IT MESSAGE CODE 5?
00159P 00D5 26 20 00F7          BNE    DDIM50   IF NOT... BRANCH
```

```
00161P 00D7 86 16      A DDIM30 LDAA   #22
00162P 00D9 BD 0000    A         JSR    DOMOVE     MDW,21-25 _ "ERROR"
00163P 00DC CE 0B13    A         LDX    #$0B13     DTO CHARACTERS "AT"
00164P 00DF FF 001A    A         STX    MDW+26     MDW,27-28 _ "AT"

00166P 00E2 4F                   CLRA
00167P 00E3 D6 00      A         LDAB   MTR1       CONVERT MTR1 INTO DTO
00168P 00E5 BD 0000    A         JSR    DTOBTD     CHARACTER STRING
00169P 00E8 31                   INS               SKIP OVER SIGN
00170P 00E9 31                   INS
00171P 00EA 31                   INS               SKIP OVER FIRST TWO DIGITS
00172P 00EB 32                   PULA
00173P 00EC B7 001D   A          STAA   MDW+29
00174P 00EF 32                   PULA
00175P 00F0 B7 001E   A          STAA   MDW+30
00176P 00F3 32                   PULA
00177P 00F4 B7 001F   A          STAA   MDW+31     MDW,30-32 _ (MTR1 BASE 10)

00179P 00F7 BD 0000   A DDIM50  JSR    SCNMOD     SCAN MODE CONTROLS
00180P 00FA BD 0000   A         JSR    READSR     READ SWITCH REGISTERS
00181P 00FD 81 45     A         CMPA   #$45       IS CLEAR CONTROL PRESSED?
00182P 00FF 27 28 0129          BEQ    DDIM70     IF YES...BRANCH
00183P 0101 F6 0000   A         LDAB   DIM
00184P 0104 C1 01     A         CMPB   #1         IS DIM = 1?
00185P 0106 27 EF 00F7          BEQ    DDIM50     IF YES...BRANCH
00186P 0108 7F 0000   A         CLR    RESET      (RESET) _ XX
00187P 010B B6 0000   A         LDAA   TSTAT
00188P 010E 85 00     A         BITA   #READY     IS (READY) = 0?
00189P 0110 27 0B 011D          BEQ    DDIM60     IF YES...BRANCH
00190P 0112 C1 06     A         CMPB   #6         IS DIM = 6?
00191P 0114 27 E1 00F7          BEQ    DDIM50     IF YES...BRANCH
00193P 0116 C6 06     A         LDAB   #6
00194P 0118 F7 0000   A         STAB   DIM        DIM _ 6
00195P 011B 20 A2 00BF          BRA    DDIM20

00197P 011D C1 06     A DDIM60 CMPB    #6         IS DIM = 6?
00198P 011F 26 D6 00F7          BNE    DDIM50     IF NOT...BRANCH
00199P 0121 96 00     A DDIM65 LDAA    FR3
00200P 0123 85 00     A         BITA   #CONF      IS CONF = 1?
00201P 0125 27 18 013F          BEQ    DDIM80     IF NOT...BRANCH
00202P 0127 20 1E 0147          BRA    DDIM95

00204P 0129 BD 0000   A DDIM70 JSR    WUNCP      WAIT UNTIL NO CONTROLS PRESSED
00205P 012C B6 0000   A         LDAA   DIM
00206P 012F 81 06     A         CMPA   #6         IS DIM = 6?
00207P 0131 27 C4 00F7          BEQ    DDIM50     IF YES...BRANCH
00208P 0133 81 03     A         CMPA   #3         IS DIM = 3?
00209P 0135 27 0D 0144          BEQ    DDIM90     IF YES...BRANCH
00210P 0137 81 01     A         CMPA   #1         IS DIM = 1?
00211P 0139 27 0C 0147          BEQ    DDIM95     IF YES...BRANCH
00212P 013B 81 07     A         CMPA   #7         IS DIM = 7?
00213P 013D 27 E2 0121          BEQ    DDIM65     IF YES...BRANCH 00215P 013F 7F 0000   A DDIM80 CLR    M2         M2 _ 0
00216P 0142 20 B3 00F7          BRA    DDIM50

00218P 0144 BD 0000   A DDIM90 JSR    TRUNR      RUN, SET READING FLAGS 00220P 0147 86 03     A DDIM95 LDAA   #3
00221P 0149 BD 0000   A         JSR    DOMOVE     MDW _ AW
00222P 014C 86 00     A         LDAA   #CONF
00223P 014E 7E 0000   A         JMP    CFLG3      CONF _ 0 ... AND EXIT 00225       0150      P CDETBL EQU    *-1
00226P 0151 01        A         FCB    1          MDW,15-26 _ "OFFSET ERROR"
00227P 0152 0A        A         FCB    10         MDW,10-28 _
00228                   *                         "READ OR WRITE ERROR"
00229P 0153 17        A         FCB    23         MDW,16-19 _ "READ"
00230P 0154 19        A         FCB    25         MDW,15-25 _ "INDEX ERROR"
00231P 0155 18        A         FCB    24         MDW,15-19 _ "INDEX"
00232P 0156 07        A         FCB    7          MDW,17-27 _ "TAPE NOT IN"
00233P 0157 09        A         FCB    9          MDW,16-29 _ "TAPE PROTECTED"
00234P 0158 08        A         FCB    8          MDW,15-30 _ "TAPE NOT INDEXED"
```

```
00236                     *
00237                     * AINGW - ADD "ING-WAIT"
00238                     *
00239                     * FLOW PAGE 13D
00240                     *
00241P 0159 B6 0000    A AINGW  LDAA   TSTAT
00242P 015C 85 00      A        BITA   #READY    IS (READY) = 0?
00243P 015E 27 0D 016D          BEQ    AINGW1    IF YES...BRANCH
00244P 0160 86 06      A        LDAA   #6
00245P 0162 B7 0000    A        STAA   DIM       DIM _ 6
00246P 0165 86 00      A        LDAA   #CONF
00247P 0167 BD 0000    A        JSR    SFLG3     CONF _ 1
00248P 016A BD 00B1    P        JSR    DSPDIM    DISPLAY DIM 00250P 016D 86 0F      A AINGW1 LDAA   #15
00251P 016F BD 0000    A        JSR    DOMOVE    MDW,10-17 _ "ING-WAIT"
00252P 0172 CE 0024    A        LDX    #MDW+36
00253P 0175 DF 00      A        STX    TEMP      TERMINATOR
00254P 0177 CE 0011    A        LDX    #MDW+17
00255P 017A BD 0000    A        JSR    CBLOCK    MDW,18-36 _ ALL " "
00256P 017D 86 01      A        LDAA   #1
00257P 017F 97 00      A        STAA   LI        LI _ 1
00258P 0181 39                  RTS
00260P 0182    00      A        FCB    0         CRC BYTE
00261                           END
TOTAL ERRORS 00000

DP 0159 AINGW  00018 00241*
 P 016D AINGW1 00243 00250*
R       AT     00016*00040
R       AUX    00016*00128
RP      CANCP  00011*00100
RP      CBLOCK 00011*00255
 P 0150 CDETBL 00150 00225*
RP      CFLG3  00011*00223
RP      CLITE1 00011*00043
R       CONF   00016*00200 00222 00246
 P 00B7 DDIM10 00140 00143*
 P 00BF DDIM20 00148*00195
 P 00D7 DDIM30 00157 00161*
 P 00F7 DDIM50 00159 00179*00185 00191 00198 00207 00216
 P 011D DDIM60 00189 00197*
 P 0121 DDIM65 00199*00213
 P 0129 DDIM70 00182 00204*
 P 013F DDIM80 00201 00215*
 P 0144 DDIM90 00209 00218*
 P 0147 DDIM95 00202 00211 00220*
RD      DIM    00009*00139 00148 00183 00194 00205 00245
RP      DOMOVE 00011*00146 00162 00221 00251
DP 00B1 DSPDIM 00018 00139*00248
RP      DTOBTD 00012*00168
RB      FR3    00006*00199
RB      FR4    00006*00127
RB      LD     00006*00039 00044 00047 00059 00065 00071 00085 00095
RB      LI     00006*00257
RB      LITE1  00006*00041
RB      M1     00006*00027
RB      M2     00006*00215
R       MDW    00016*00164 00173 00175 00177 00252 00254
RP      MDWM2  00012*00120 00153
RP      MOVBLK 00012*00058 00084
RB      MTR1   00006*00167
R       OBL    00016*00063 00087 00093
RP      OFFX   00012*00107 00112 00151
RP      PNTATT 00012*00062 00086 00090
RD      RCAP   00009*00131
RP      READSR 00012*00035 00180
R       READY  00016*00188 00242
R       RESET  00016*00186
DP 0000 SCATC  00018 00027*
 P 000B SCATR0 00029 00031 00035*
 P 001F SCATR1 00044*00067
```

```
P 004C SCATR2 00042 00070*
P 0051 SCATR3 00072*00097
P 0081 SCATR4 00068 00100*
P 000A SCATR6 00033*00037
P 0084 SCATR7 00048 00072 00103*
DP 008F SCATR8 00018 00060 00088 00111*
RP      SCNMOD 00013*00179
RP      SCRL1A 00013*00045 00074
RP      SETDW  00013*00098
RP      SFLG3  00013*00247
RP      SLITE1 00013*00070
RD      TBL    00009*00111
RD      TDW    00009*00104
RB      TEMP   00007*00046 00073 00253
RB      TEMP2  00007*00053 00079
RP      TRUNR  00014*00218
R       TSTAT  00016*00187 00241
RP      TSTOP  00014*00143
RP      WUNCP  00014*00204
RB      X2     00007*00124
RP      X2MDW  00014*00125
RB      XM     00007*00123
DP 0095 XMDR   00018 00119*
 P 00AD XMDR1  00129 00131*

00001                          NAM    F14A
00002                          OPT    REL, CREF, LLEN=80
00003                          TTL    FLOW PAGES 14A THRU 14H
00004                          IDNT   FEB.   22, 1978

00006                          XREF   BSCT:AD, BADS8, CM, CMC
00007                          XREF   BSCT:FEW01, FEW02, FEW03, FEW11, FEW12, FEW13
00008                          XREF   BSCT:FEW2, FF
00009                          XREF   BSCT:K15, K3, K4, K5, K5T, K7, K8, LITE1, M1
00010                          XREF   BSCT:SCRTCH, TEMP4, VOS1, VOS2, W1

00012                          XREF   PSCT:CFLG1, CLITE1, CMPIDX, CMPPV2
00013                          XREF   PSCT:DIGINO, DIV16, EINT15, ENTPV2
00014                          XREF   PSCT:FEWUNP, FLPMLT, MULT16
00015                          XREF   PSCT:READSR, SABL3X, SINT15, SFLG1
00016                          XREF   PSCT:SLITE1, STHFA, STHFD
00017                          XREF   PSCT:STLFA, STLFD, STRIG

00019                          XREF   AT, ATS, FAIL, FEAD0, FEAD8, K5A
00020                          XREF   JL40FS, JL50FS, PASS, TE, TEC, TES

00022                          XDEF   DETK15, SCNTE 00024P 0000                    PSCT
00026                   *
00027                   * SCNTE - SCAN TRIGGER ENABLE - PAGE 14A
00028                   *
00029P 0000 96 00      A SCNTE  LDAA   M1
00030P 0002 81 06      A        CMPA   #6              IS M1 = 6? (IE. AUTOSCOPE?)
00031P 0004 26 10 0016          BNE    SCNTE0          IF NOT... BRANCH
00032P 0006 DE 00      A        LDX    BADS8           POINT TO TRACE(8)
00033P 0008 EE 00      A        LDX    JL40FS, X
00034P 000A 9C 00      A        CPX    K4              IS K4 = J(8,4)?
00035P 000C 26 07 0015          BNE    SCNTEA          IF NOT... BRANCH
00036P 000E DE 00      A        LDX    K5
00037P 0010 BC 0000    A        CPX    K5A             IS K5 = K5A?
00038P 0013 27 01 0016          BEQ    SCNTE0          IF YES... BRANCH
00039P 0015 39           SCNTEA RTS                    ... ELSE EXIT 00041P 0016 BD 0000    A SCNTE0 JSR    READSR          A _ SWITCH STATUS
00042P 0019 81 43      A        CMPA   #$43            TRIG ENABLE SINGLE?
00043P 001B 26 04 0021          BNE    SCNTE1          BRANCH IF NOT
00044                   *
```

```
00045P 001D C6 00     A          LDAB   #TES         TRIG EN SINGLE LED CODE
00046P 001F 20 06 0027           BRA    SCNTE2       SET TE AND CONTINUE
00047                      *
00048P 0021 81 44     A SCNTE1   CMPA   #$44         TRIG EN CONT PRESSED?
00049P 0023 26 F0 0015           BNE    SCNTEA       EXIT IF NOT
00050P 0025 C6 00     A          LDAB   #TEC         TRIG EN CONT LED CODE
00051                      *
00052P 0027 BD 0000   A SCNTE2   JSR    SLITE1       TURN ON TRIG EN LITE
00053P 002A 86 00     A          LDAA   #TE
00054P 002C BD 0000   A          JSR    SFLG1        TE _ 1
00055P 002F C6 00     A          LDAB   #PASS+FAIL
00056P 0031 BD 0000   A          JSR    CLITE1       PASS = 0, FAIL = 0
00057                      *
00058P 0034 BD 00B2   P          JSR    USEK15       SET SCP FREQUENCY
00059P 0037 BD 0000   A SCNTE9   JSR    STRIG        SET TRIGGER CIRCUITS
00060P 003A BD 01E4   P          JSR    CALFE        CALIBRATE FRONT END
00061                      *
00062P 003D CE 0000   A          LDX    #K15         POINT TO K15
00063P 0040 86 00     A          LDAA   #AT
00064P 0042 95 00     A          BITA   LITE1
00065P 0044 27 1A 0060           BEQ    SCNTE4       BRANCH IF AT=0
00066                      *
00067P 0046 86 00     A          LDAA   #ATS
00068P 0048 BD 0000   A          JSR    SFLG1        ATS _ 1
00069P 004B CE 0000   A          LDX    #K15
00070P 004E 86 02     A          LDAA   #2
00071P 0050 16                   TAB                 2*10**2 (PV2 NOTATION)
00072P 0051 BD 0000   A          JSR    CMPPV2
00073P 0054 2D 05 005B           BLT    SCNTE3       BRANCH IF 200 < K15
00074                      *
00075P 0056 BD 0000   A          JSR    STLFA        STORE TRACE AND EXIT
00076P 0059 20 3F 009A           BRA    SCNTE6
00077                      *
00078P 005B BD 0000   A SCNTE3   JSR    STHFA        STORE TRACE AND EXIT
00079P 005E 20 3A 009A           BRA    SCNTE6
00080                      *
00081P 0060 96 00     A SCNTE4   LDAA   K3           NOTE: K3 IS INT15*10
00082P 0062 D6 01     A          LDAB   K3+1
00083P 0064 BD 0000   A          JSR    SABL3X       ACCA,ACCB = K3*8
00084P 0067 36                   PSHA
00085P 0068 37                   PSHB                SAVE K3*8
00086P 0069 DB 01     A          ADDB   VOS2+1
00087P 006B 99 00     A          ADCA   VOS2         ACCA,ACCB = K3*8+VOS2
00088P 006D C0 08     A          SUBB   #8
00089P 006F 82 00     A          SBCA   #0           ACCA,ACCB = K3*8+VOS2-8
00090P 0071 BD 0000   A          JSR    FEWUNP       SHIFT AND MASK AS APPROPRIATE
00091P 0074 97 00     A          STAA   FEW12        FEW1,2 _ BITS 11-6 OF K3*8+VOS2-8
00092P 0076 D7 00     A          STAB   FEW02        FEW0,2 _ BITS  5-0 OF K3*8+VOS2-8
00093P 0078 33                   PULB
00094P 0079 32                   PULA                RESTORE K3*8
00095P 007A DB 01     A          ADDB   VOS1+1
00096P 007C 99 00     A          ADCA   VOS1         ACCA,ACCB = K3*8+VOS1
00097P 007E CB 08     A          ADDB   #8
00098P 0080 89 00     A          ADCA   #0           ACCA,ACCB = K3*8+VOS1+8
00099P 0082 BD 0000   A          JSR    FEWUNP       SHIFT AND MASK AS APPROPRIATE
00100P 0085 97 00     A          STAA   FEW11        FEW1,1 _ BITS 11-6 OF K3*8+VOS1+8
00101P 0087 D7 00     A          STAB   FEW01        FEW0,1 _ BITS  5-0 OF K3*8+VOS1+8
00102P 0089 86 05     A          LDAA   #5
00103P 008B C6 02     A          LDAB   #2           5*10**2
00104P 008D BD 0000   A          JSR    CMPPV2
00105P 0090 2D 05 0097           BLT    SCNTE5       BRANCH IF 5*10**2 < K15
00106                      *
00107P 0092 BD 0000   A          JSR    STLFD        STORE TRACE ANC EXIT
00108P 0095 20 03 009A           BRA    SCNTE6
00109                      *
00110P 0097 BD 0000   A SCNTE5   JSR    STHFD        STORE TRACE AND EXIT 00112P 009A 96 00     A SCNTE6   LDAA   LITE1
00113P 009C 95 00     A          BITA   #TEC         IS TEC = 0?
00114P 009E 26 97 0037           BNE    SCNTE9       IF NOT...BRANCH
00115P 00A0 C6 00     A          LDAB   #TES
00116P 00A2 BD 0000   A          JSR    CLITE1       TES _ 0
00117P 00A5 86 00     A          LDAA   #TE
00118P 00A7 BD 0000   A          JSR    CFLG1        TE _ 0
```

```
00119P 00AA 96 00      A          LDAA    FEW2
00120P 00AC 8A 07      A          ORAA    #$07
00121P 00AE B7 0002    A          STAA    FEAD0+2    (FEAD2) _ FEW2 OR'D $07
00122                          *
00123P 00B1 39                    RTS                EXIT IF NO TE PRESSED
00125                          *
00126                          * USE K15 - PAGE 14B
00127                          *
00128P 00B2 BD 00D3    P USEK15   JSR     DETK15     DETERMINE K15
00129P 00B5 C6 10      A          LDAB    #$10
00130P 00B7 D0 01      A          SUBB    K15+1      B _ 10 HEX - EXP(K15)
00131P 00B9 96 00      A          LDAA    LITE1
00132P 00BB 85 00      A          BITA    #AT
00133P 00BD 27 02 00C1            BEQ     UK151
00134P 00BF CB 20      A          ADDB    #$20       IF AT=1 THEN B _ B+20 HEX
00135P 00C1 96 00      A UK151    LDAA    K15
00136P 00C3 4A                    DECA
00137P 00C4 27 09 00CF            BEQ     UK153
00138P 00C6 4A                    DECA
00139P 00C7 27 04 00CD            BEQ     UK152
00140P 00C9 CB 07      A          ADDB    #7         IF MSD(K15)=5 THEN B_B+7
00141P 00CB 20 02 00CF            BRA     UK153
00142P 00CD CB 0F      A UK152    ADDB    #15        IF MSD(K15)=2 THEN B_B+15
00143P 00CF F7 0003    A UK153    STAB    FEAD0+3    (FEAD3) _ B
00144P 00D2 39                    RTS                EXIT USEK15
00146                          *
00147                          * DETK15 - DETERMINE K15
00148                          *
00149                          * FLOW PAGES 14C1 AND 14C2
00150                          *
00151P 00D3 86 03      A DETK15   LDAA    #3
00152P 00D5 D6 01      A          LDAB    K4+1       GET EXP(K4)
00153P 00D7 10                    SBA
00154P 00D8 58                    ASLB               MULTIPLY BY 2
00155P 00D9 10                    SBA                FF = 3-EXP(K4)*3

00157P 00DA D6 00      A          LDAB    K4
00158P 00DC C1 05      A          CMPB    #5         IS NUM(K4) = 5?
00159P 00DE 27 06 00E6            BEQ     DK15A      IF YES...BRANCH
00160P 00E0 4C                    INCA               FF = FF+1
00161P 00E1 C1 02      A          CMPB    #2         IS NUM(K4) = 2?
00162P 00E3 27 01 00E6            BEQ     DK15A      IF YES...BRANCH
00163P 00E5 4C                    INCA               FF = FF+1
00164P 00E6 97 00      A DK15A    STAA    FF         SET FF 00166P 00E8 C6 00      A          LDAB    #AT
00167P 00EA D5 00      A          BITB    LITE1      IS AT = 1?
00168P 00EC 27 10 00FE            BEQ     DK15B2     IF NOT...BRANCH
00169P 00EE 81 09      A          CMPA    #9         IS FF < 9?
00170P 00F0 24 1C 010E            BCC     DK15C      IF NOT...BRANCH
00171P 00F2 81 04      A          CMPA    #4         IS FF < 4?
00172P 00F4 25 02 00F8            BCS     DK15B      IF YES...BRANCH
00173P 00F6 86 04      A          LDAA    #4         FF = 8-4

00175P 00F8 8B 04      A DK15B    ADDA    #4         FF = FF+4
00176P 00FA 97 00      A          STAA    FF
00177P 00FC 20 42 0140            BRA     DK15I 00179P 00FE DE 00      A DK15B2   LDX     K5
00180P 0100 DF 00      A          STX     K5T        K5T = K5
00181P 0102 96 00      A          LDAA    M1
00182P 0104 81 06      A          CMPA    #6         IS M1 = 6?
00183P 0106 26 06 010E            BNE     DK15C      IF NOT...BRANCH
00184P 0108 DE 00      A          LDX     BADS8
00185P 010A EE 00      A          LDX     JL50FS,X
00186P 010C DF 00      A          STX     K5         K5 = J(8,5)

00188P 010E 96 00      A DK15C    LDAA    K5
00189P 0110 D6 01      A          LDAB    K5+1       NOTE: K5 IS INT15*10
00190P 0112 CE 0136    A          LDX     #310
00191P 0115 BD 0000    A          JSR     CMPIDX     IS K5 > 310?
00192P 0118 2F 10 012A            BLE     DK15E      IF NOT...BRANCH
00193P 011A 7A 0000    A          DEC     FF         FF = FF-1
00194P 011D CE 02F8    A          LDX     #760
```

```
00195P 0120 BD 0000  A        JSR    CMPIDX     IS K5 > 760?
00196P 0123 2F 1B 0140         BLE    DK15I      IF NOT...BRANCH
00197P 0125 7A 0000  A        DEC    FF         FF = FF-1
00198P 0128 20 16 0140         BRA    DK15I 00200P 012A CE 00A0  A DK15E  LDX    #160
00201P 012D BD 0000  A        JSR    CMPIDX     IS K5 > 160?
00202P 0130 2E 0E 0140         BGT    DK15I      IF YES...BRANCH
00203P 0132 7C 0000  A        INC    FF         FF = FF+1
00204P 0135 CE 0050  A        LDX    #80
00205P 0138 BD 0000  A        JSR    CMPIDX     IS K5 > 80?
00206P 013B 2E 03 0140         BGT    DK15I      IF YES...BRANCH
00207P 013D 7C 0000  A        INC    FF         FF = FF+1

00209P 0140 CE 0100  A DK15I  LDX    #$0100
00210P 0143 DF 00    A        STX    K15        K15 = 1*10**0
00211P 0145 CE 0000  A        LDX    #0
00212P 0148 DF 00    A        STX    CMC        CMC = 0
00213P 014A 96 00    A        LDAA   FF
00214P 014C 81 01    A        CMPA   #1         IS FF = 1?
00215P 014E 27 23 0173         BEQ    DK15L      IF YES...BRANCH 00217P 0150 81 03    A DK15J  CMPA   #3         IS FF > 3?
00218P 0152 23 17 016B         BLS    DK15K      IF NOT...BRANCH
00219P 0154 80 03    A        SUBA   #3
00220P 0156 97 00    A        STAA   FF         FF = FF-3
00221P 0158 7C 0001  A        INC    K15+1      EXP(K15) = EXP(K15)+1
00222P 015B D6 01    A        LDAB   K15+1
00223P 015D C1 08    A        CMPB   #8         IS EXP(K15) = 8?
00224P 015F 26 EF 0150         BNE    DK15J      IF NOT...BRANCH
00225P 0161 CE 0003  A        LDX    #3
00226P 0164 DF 00    A        STX    CMC        CMC = 3

00228P 0166 7F 0000  A DK15J2 CLR    FF         FF = 0
00229P 0169 20 1D 0188         BRA    DK15M 00231P 016B 81 01    A DK15K  CMPA   #1         IS FF = 1?
00232P 016D 27 F7 0166         BEQ    DK15J2     IF YES...BRANCH
00233P 016F 81 02    A        CMPA   #2         IS FF = 2?
00234P 0171 26 06 0179         BNE    DK15L2     IF NOT...BRANCH 00236P 0173 86 02    A DK15L  LDAA   #2
00237P 0175 97 00    A        STAA   K15        NUM(K15) = 2
00238P 0177 20 0F 0188         BRA    DK15M 00240P 0179 86 05    A DK15L2 LDAA   #5
00241P 017B 97 00    A        STAA   K15        NUM(K15) = 5
00242P 017D 96 01    A        LDAA   K15+1
00243P 017F 81 06    A        CMPA   #6         IS EXP(K15) > 6?
00244P 0181 2F 05 0188         BLE    DK15M      IF NOT...BRANCH
00245P 0183 CE 0001  A        LDX    #1
00246P 0186 DF 00    A        STX    CMC        CMC = 1

00248P 0188 86 00    A DK15M  LDAA   #AT
00249P 018A 95 00    A        BITA   LITE1      IS AT = 1?
00250P 018C 26 10 019E         BNE    DK15N      IF YES...BRANCH
00251P 018E DE 00    A        LDX    K5T
00252P 0190 DF 00    A        STX    K5         K5 = K5T
00253P 0192 4F               CLRA
00254P 0193 C6 18    A        LDAB   #24
00255P 0195 D0 01    A        SUBB   CMC+1
00256P 0197 92 00    A        SBCA   CMC
00257P 0199 97 00    A        STAA   CM
00258P 019B D7 01    A        STAB   CM+1       CM = 24-CMC
00259P 019D 39               RTS                ...EXIT 00261P 019E CE 0000  A DK15N  LDX    #K4
00262P 01A1 BD 0000  A        JSR    ENTPV2     ENTER K4
00263P 01A4 DE 00    A        LDX    K15
00264P 01A6 DF 00    A        STX    TEMP4      SET UP FOR LATER COMPUTATION
00265P 01A8 96 00    A        LDAA   K5
00266P 01AA D6 01    A        LDAB   K5+1       NOTE: K5 IS INT15*10
00267P 01AC CE 0050  A        LDX    #80
00268P 01AF BD 0000  A        JSR    CMPIDX     IS K5 > 80?
00269P 01B2 2E 05 01B9         BGT    DK15O      IF YES...BRANCH
```

```
00271P 01B4 7C 0001    A            INC     TEMP4+1      MULTIPLY K15 BY 10
00272P 01B7 20 0C 01C5              BRA     DK15P 00274P 01B9 CE 0000    A    DK150   LDX     #K5          NOTE: K5 IS INT15*10
00275P 01BC BD 0000    A            JSR     EINT15       ENTER K5
00276P 01BF BD 0000    A            JSR     FLPMLT       MULTIPLY
00277P 01C2 7A 0001    A            DEC     TEMP4+1      DIVIDE K15 BY 10 TO
00278                       *                            COMPENSATE FOR K5

00280P 01C5 CE 0000    A    DK15P   LDX     #TEMP4
00281P 01C8 BD 0000    A            JSR     ENTPV2       ENTER ADJUSTED VALUE OF K15
00282P 01CB BD 0000    A            JSR     FLPMLT       MULTIPLY
00283P 01CE CE 0000    A            LDX     #TEMP4
00284P 01D1 BD 0000    A            JSR     SINT15       STORE RESULT
00285P 01D4 86 04      A            LDAA    #$04
00286P 01D6 5F                      CLRB                 NOTE: $0400 = 1024
00287P 01D7 D0 01      A            SUBB    CMC+1
00288P 01D9 92 00      A            SBCA    CMC          ACCA,ACCB = 1022-CMC
00289P 01DB D0 01      A            SUBB    TEMP4+1
00290P 01DD 92 00      A            SBCA    TEMP4
00291P 01DF 97 00      A            STAA    CMC
00292P 01E1 D7 01      A            STAB    CMC+1        RESULT IN CMC
00293P 01E3 39                      RTS                  ... EXIT
00295                       *
00296                       * CALFE - CALIBRATE FRONT END - PAGE 14H
00297                       *
00298P 01E4 96 00      A    CALFE   LDAA    FEW2
00299P 01E6 8B 07      A            ADDA    #7
00300P 01E8 B7 0002    A            STAA    FEAD0+2      FEAD2 _ FEW2+7
00301P 01EB CE 0000    A            LDX     #FEAD8
00302P 01EE DF 00      A            STX     AD           AD _ #FEAD8
00303P 01F0 BD 0000    A            JSR     DIGINO       DIGITIZE INPUT OFFSET
00304P 01F3 DE 00      A            LDX     W1
00305P 01F5 DF 00      A            STX     VOS1         VOS1 _ W1
00306                       *
00307P 01F7 CE 0001    A            LDX     #FEAD8+1
00308P 01FA DF 00      A            STX     AD           AD _ #FEAD9
00309P 01FC BD 0000    A            JSR     DIGINO       DIGITIZE INPUT OFFSET
00310P 01FF DE 00      A            LDX     W1
00311P 0201 DF 00      A            STX     VOS2         VOS2 _ W1
00312                       *
00313P 0203 96 00      A            LDAA    K8
00314P 0205 81 03      A            CMPA    #3
00315P 0207 22 0C 0215              BHI     CALFE2       BRANCH IF K8 > 3
00316P 0209 27 5C 0267              BEQ     CALFE4       EXIT IF K8 = 3
00317                       *
00318P 020B CE 0003    A            LDX     #FEAD8+3
00319P 020E DF 00      A            STX     AD           AD _ #FEAD11
00320P 0210 BD 0000    A            JSR     DIGINO       DIGITIZE INPUT OFFSET
00321P 0213 20 08 021D              BRA     CALFE3
00322                       *
00323P 0215 CE 0002    A    CALFE2  LDX     #FEAD8+2
00324P 0218 DF 00      A            STX     AD           AD _ #FEAD10
00325P 021A BD 0000    A            JSR     DIGINO       DIGITIZE INPUT OFFSET
00326                       *
00327P 021D 96 00      A    CALFE3  LDAA    K7
00328P 021F D6 01      A            LDAB    K7+1         ACCA,ACCB _ K7*10
00329P 0221 CE 004C    A            LDX     #76
00330P 0224 DF 00      A            STX     TEMP4
00331P 0226 CE 0000    A            LDX     #TEMP4
00332P 0229 BD 0000    A            JSR     MULT16       RESULT = 760*K7
00333P 022C CE 000A    A            LDX     #10
00334P 022F DF 00      A            STX     TEMP4
00335P 0231 CE 0000    A            LDX     #TEMP4
00336P 0234 BD 0000    A            JSR     DIV16        RESULT = 76*K7
00337P 0237 97 00      A            STAA    TEMP4
00338P 0239 D7 01      A            STAB    TEMP4+1      SAVE RESULT
00339P 023B D6 01      A            LDAB    SCRTCH+1     GET ABSOLUTE VALUE OF REMAINDER
00340P 023D C1 04      A            CMPB    #4
00341P 023F 2F 0E 024F              BLE     CLF3B        BRANCH IF NO ROUNDING NEEDED
00342P 0241 4D                      TSTA                 WAS QUOTIENT NEGATIVE?
00343P 0242 2B 05 0249              BMI     CLF3A        IF YES...BRANCH
00344P 0244 4F                      CLRA
00345P 0245 C6 01      A            LDAB    #1           SET UP TO ROUND UP
```

```
00346P 0247 20 08 0251            BRA     CLF3C 00348P 0249 86 FF      A  CLF3A   LDAA    #$FF
00349P 024B C6 FF      A          LDAB    #-1         SET UP FOR NEGATIVE ROUND
00350P 024D 20 02 0251            BRA     CLF3C 00352P 024F 4F            CLF3B   CLRA
00353P 0250 5F                    CLRB                NO ROUNDING 00355P 0251 DB 01      A  CLF3C   ADDB    TEMP4+1
00356P 0253 99 00      A          ADCA    TEMP4       ROUND AS NEEDED 00358P 0255 DB 01      A          ADDB    W1+1
00359P 0257 99 00      A          ADCA    W1          ACCA,ACCB _ (80*K7+W1)
00360P 0259 BD 0000    A          JSR     FEWUNP      UNPACK BITS FOR FRONT END
00361P 025C 97 00      A          STAA    FEW13       FEW1,3 _ (80*K7+W1) BITS 11-6
00362P 025E D7 00      A          STAB    FEW03       FEW0,3 _ (80*K7+W1) BITS 5-0
00363P 0260 96 00      A          LDAA    FEW2
00364P 0262 8B 0F      A          ADDA    #$0F
00365P 0264 B7 0002    A          STAA    FEAD0+2     (FEAD2) _ FEW2 + $0F
00366P 0267 39            CALFE4  RTS                 EXIT CALFE
00368P 0268    00      A          FCB     0           CRC BYTE
00369                             END
TOTAL ERRORS 00000

RB         AD       00006*00302 00308 00319 00324
R          AT       00019*00063 00132 00166 00248
R          ATS      00019*00067
RB         BADS8    00006*00032 00184
 P  01E4   CALFE    00060 00298*
 P  0215   CALFE2   00315 00323*
 P  021D   CALFE3   00321 00327*
 P  0267   CALFE4   00316 00366*
RP         CFLG1    00012*00118
 P  0249   CLF3A    00343 00348*
 P  024F   CLF3B    00341 00352*
 P  0251   CLF3C    00346 00350 00355*
RP         CLITE1   00012*00056 00116
RB         CM       00006*00257 00258
RB         CMC      00006*00212 00226 00246 00255 00256 00287 00288 00291 00292
RP         CMPIDX   00012*00191 00195 00201 00205 00268
RP         CMPPV2   00012*00072 00104
DP  00D3   DETK15   00022 00128 00151*
RP         DIGIN0   00013*00303 00309 00320 00325
RP         DIV16    00013*00336
 P  00E6   DK15A    00159 00162 00164*
 P  00F3   DK15B    00172 00175*
 P  00FE   DK15B2   00168 00179*
 P  010E   DK15C    00170 00183 00188*
 P  012A   DK15E    00192 00200*
 P  0140   DK15I    00177 00196 00198 00202 00206 00209*
 P  0150   DK15J    00217*00224
 P  0166   DK15J2   00228*00232
 P  016B   DK15K    00218 00231*
 P  0173   DK15L    00215 00236*
 P  0179   DK15L2   00234 00240*
 P  0188   DK15M    00229 00238 00244 00248*
 P  019E   DK15N    00250 00261*
 P  01B9   DK15O    00269 00274*
 P  01C5   DK15P    00272 00280*
RP         EINT15   00013*00275
RP         ENTPV2   00013*00262 00281
R          FAIL     00019*00055
R          FEAD0    00019*00121 00143 00300 00365
R          FEAD8    00019*00301 00307 00318 00323
RB         FEW01    00007*00101
RB         FEW02    00007*00092
RB         FEW03    00007*00362
RB         FEW11    00007*00100
RB         FEW12    00007*00091
RB         FEW13    00007*00361
RB         FEW2     00008*00119 00298 00363
```

```
RP      FEWUNP  00014*00090 00099 00360
RP      FF      00008*00164 00176 00193 00197 00203 00207 00213 00220 00228
RP      FLPMLT  00014*00276 00282
R       JL40FS  00020*00033
R       JL50FS  00020*00185
RB      K15     00009*00062 00069 00130 00135 00210 00221 00222 00237 00241
                00242 00263
RB      K3      00009*00081 00082
RB      K4      00009*00084 00152 00157 00261
RB      K5      00009*00086 00179 00186 00188 00189 00252 00265 00266 00274
R       K5A     00019*00037
RB      K5T     00009*00130 00251
RB      K7      00009*00327 00328
RB      K8      00009*00313
RB      LITE1   00009*00064 00112 00131 00167 00249
RB      M1      00009*00029 00181
RP      MULT16  00014*00332
R       PASS    00020*00055
RP      READSR  00015*00041
RP      SABL3X  00015*00083
DP 0000 SCNTE   00022 00029*
 P 0016 SCNTE0  00031 00038 00041*
 P 0021 SCNTE1  00043 00048*
 P 0027 SCNTE2  00046 00052*
 P 005B SCNTE3  00073 00078*
 P 0060 SCNTE4  00065 00081*
 P 0097 SCNTE5  00105 00110*
 P 009A SCNTE6  00076 00079 00108 00112*
 P 0037 SCNTE9  00059*00114
 P 0015 SCNTEA  00035 00039*00049
RB      SCRTCH  00010*00339
RP      SFLG1   00015*00054 00068
RP      SINT15  00015*00284
RP      SLITE1  00016*00052
RP      STHFA   00016*00078
RP      STHFD   00016*00110
RP      STLFA   00017*00075
RP      STLFD   00017*00107
RP      STRIG   00017*00059
R       TE      00020*00053 00117
R       TEC     00020*00050 00113
RB      TEMP4   00010*00264 00271 00277 00280 00283 00289 00290 00330 00331
                00334 00335 00337 00338 00355 00356
R       TES     00020*00045 00115
 P 00C1 UK151   00133 00135*
 P 00CD UK152   00139 00142*
 P 00CF UK153   00137 00141 00143*
 P 00B2 USEK15  00058 00128*
RB      VOS1    00010*00095 00096 00305
RB      VOS2    00010*00086 00087 00311
RB      W1      00010*00304 00310 00358 00359

00001               NAM     F14I
00002               OPT     REL, CREF, LLEN=80
00003               TTL     FLOW PAGES 14I THRU 14M
00004               IDNT    FEB.  22, 1978

00006               XREF    BSCT:AD, FEW2, FEW4, FR1, FR2
00007               XREF    BSCT:K6, K8, K15, K16, K4, K5, LD, LITE1
00008               XREF    BSCT:M1, TDC, TEMP3, W1

00010               XREF    PSCT:CFLG2, CMPIDX
00011               XREF    PSCT:DELAY, DIV16, DLFAS, DSPDIM
00012               XREF    PSCT:ENTINT, ENTPV2, FEWUNP, FLPMLT
00013               XREF    PSCT:MULT16, MULT8
00014               XREF    PSCT:SALFA, SARM, SCNCLR
00015               XREF    PSCT:SFLG2, SINT15, SLFAB, SLFAV, SUB16
00016               XREF    PSCT:UFE

00018               XREF    AT, DIM, FEAD0, FEAD8, FEOS, M
00019               XREF    P, SPD, TE
```

```
00021                           XDEF    DIGIN0, DK16, DK16X, STLFA, STRIG 00023P 0000                     PSCT
00025                   *
00026                   * DIGIN0 - DIGITIZE INPUT OFFSET - PAGE 14I
00027                   *
00028P 0000 CE 0827    A DIGIN0  LDX     #$0827          PRESET FOR W1
00029P 0003 96 00      A         LDAA    K6              IS K6 = 0?
00030P 0005 26 03 000A           BNE     DI00            IF NOT...BRANCH
00031P 0007 CE 07D8    A         LDX     #$07D8          W1 = $07D8

00033P 000A DF 00      A DI00    STX     W1              SET W1

00035P 000C 96 00      A DI01    LDAA    FEW2
00036P 000E B7 0002    A         STAA    FEAD0+2         (FEAD2) _ FEW2
00037P 0011 96 00      A         LDAA    W1
00038P 0013 D6 01      A         LDAB    W1+1
00039P 0015 BD 0000    A         JSR     FEWUNP          UNPACK FOR FRONT END
00040P 0018 B7 0001    A         STAA    FEAD0+1         (FEAD1) _ W1(11-6)
00041P 001B F7 0000    A         STAB    FEAD0           (FEAD0) _ W1(5-0)
00042P 001E CE 0001    A         LDX     #1
00043P 0021 BD 0000    A         JSR     DELAY           DELAY ABOUT 100 MICROSECONDS
00044P 0024 96 00      A         LDAA    FEW2
00045P 0026 8B 07      A         ADDA    #7
00046P 0028 B7 0002    A         STAA    FEAD0+2         (FEAD2) _ FEW2+7
00047P 002B CE 0004    A         LDX     #4
00048P 002E BD 0000    A         JSR     DELAY           DELAY ABOUT 300 MICROSECONDS
00049P 0031 96 00      A         LDAA    AD
00050P 0033 D6 01      A         LDAB    AD+1
00051P 0035 CE 0001    A         LDX     #FEAD8+1        GET ADDR(FEAD9)
00052P 0038 BD 0000    A         JSR     CMPIDX          IS AD > #FEAD9?
00053P 003B 22 03 0040           BHI     DI01A           IF YES...BRANCH
00054P 003D 7F 0007    A         CLR     FEAD0+7         (FEAD7) _ 0

00056P 0040 DE 00      A DI01A   LDX     AD
00057P 0042 A6 00      A         LDAA    0,X             GET BYTE POINTED TO BY "AD"
00058P 0044 D6 00      A         LDAB    K6              IS K6 = 0?
00059P 0046 26 14 005C           BNE     DI02            IF NOT...BRANCH
00060P 0048 85 80      A         BITA    #$80            IS [AD] BIT 7 = 0?
00061P 004A 27 24 0070           BEQ     DI03            IF YES...BRANCH
00062P 004C DE 00      A         LDX     W1
00063P 004E 08                   INX
00064P 004F DF 00      A         STX     W1              W1 _ W1 + 1
00065P 0051 86 08      A         LDAA    #$08
00066P 0053 C6 26      A         LDAB    #$26
00067P 0055 BD 0000    A         JSR     CMPIDX          IS $0826 < W1?
00068P 0058 24 B2 000C           BCC     DI01            IF NOT...BRANCH
00069P 005A 20 28 0084           BRA     DI04

00071P 005C 85 80      A DI02    BITA    #$80            IS [AD] BIT 7 = 0?
00072P 005E 26 10 0070           BNE     DI03            IF NOT...BRANCH
00073P 0060 DE 00      A         LDX     W1
00074P 0062 09                   DEX
00075P 0063 DF 00      A         STX     W1              W1 _ W1 - 1
00076P 0065 86 07      A         LDAA    #$07
00077P 0067 C6 D9      A         LDAB    #$D9
00078P 0069 BD 0000    A         JSR     CMPIDX          IS $07D9 > W1?
00079P 006C 23 9E 000C           BLS     DI01            IF NOT...BRANCH
00080P 006E 20 14 0084           BRA     DI04

00082P 0070 86 07      A DI03    LDAA    #$07
00083P 0072 C6 D8      A         LDAB    #$D8
00084P 0074 DE 00      A         LDX     W1
00085P 0076 BD 0000    A         JSR     CMPIDX          IS $07D8 < W1?
00086P 0079 24 09 0084           BCC     DI04            IF NOT...BRANCH
00087P 007B 86 08      A         LDAA    #$08
00088P 007D C6 27      A         LDAB    #$27
00089P 007F BD 0000    A         JSR     CMPIDX          IS $0827 > W1?
00090P 0082 22 08 008C           BHI     DI05            IF YES...BRANCH AND EXIT 00092P 0084 86 01      A DI04    LDAA    #1
00093P 0086 B7 0000    A         STAA    DIM             DIM _ 1
00094P 0089 7E 0000    A         JMP     DSPDIM          DISPLAY DIM ... AND EXIT
```

```
00096P 008C 39              DI05    RTS                     ... EXIT
00098                        *
00099                        * STRIG - SET TRIGGER CIRCUITS, DETERMINE TDC
00100                        *
00101                        * PAGE 14K
00102                        *
00103P 008D 96 00        A  STRIG   LDAA    K8
00104P 008F 81 03        A          CMPA    #3
00105P 0091 22 12 00A5              BHI     STRIG2          BRANCH IF K8 > 3
00106P 0093 96 00        A          LDAA    K8
00107P 0095 81 03        A          CMPA    #3
00108P 0097 2D 06 009F              BLT     STRIG1          BRANCH IF K8 < 3
00109P 0099 86 06        A          LDAA    #6
00110P 009B 97 00        A          STAA    FEW4            FEW4 _ 6
00111P 009D 20 10 00AF              BRA     STRIG4
00112                        *
00113P 009F 86 02        A  STRIG1  LDAA    #2
00114P 00A1 97 00        A          STAA    FEW4            FEW4 _ 2
00115P 00A3 20 03 00A8              BRA     STRIG3
00116                        *
00117P 00A5 7F 0000      A  STRIG2  CLR     FEW4            FEW4 _ 0
00118                        *
00119P 00A8 96 00        A  STRIG3  LDAA    K6
00120P 00AA 26 03 00AF              BNE     STRIG4          BRANCH IF K6=1
00121P 00AC 7C 0000      A          INC     FEW4            FEW4 _ FEW4+1
00122                        *
00123P 00AF 96 00        A  STRIG4  LDAA    FEW4
00124P 00B1 B7 0004      A          STAA    FEAD0+4         (FEAD4) _ FEW4
00125P 00B4 96 00        A          LDAA    LITE1
00126P 00B6 85 00        A          BITA    #AT
00127P 00B8 26 05 00BF              BNE     STRIG5          BRANCH IF AT=1
00128P 00BA BD 010C      P          JSR     DK16            DETERMINE K16
00129P 00BD 20 3E 00FD              BRA     STRIG7
00131P 00BF 96 00        A  STRIG5  LDAA    K5
00132P 00C1 D6 01        A          LDAB    K5+1            NOTE: K5 IS INT15*10
00133P 00C3 CE 0050      A          LDX     #80
00134P 00C6 BD 0000      A          JSR     CMPIDX          IS K5 > 80?
00135P 00C9 2E 2C 00F7              BGT     STRIG6          IF YES...BRANCH
00136P 00CB 40                      NEGA
00137P 00CC 50                      NEGB
00138P 00CD 82 00        A          SBCA    #0              ACCA,ACCB = -1*K5*10
00139P 00CF CB 64        A          ADDB    #100
00140P 00D1 89 00        A          ADCA    #0              ACCA,ACCB _ 100-K5*10
00141P 00D3 BD 0000      A          JSR     ENTINT          ENTER 10*(10-K5)
00142P 00D6 DE 00        A          LDX     K15
00143P 00D8 DF 00        A          STX     TEMP3
00144P 00DA 7A 0001      A          DEC     TEMP3+1         DIVIDE K15 BY 10 TO
00145                        *                              COMPENSATE FOR K5
00146P 00DD CE 0000      A          LDX     #TEMP3
00147P 00E0 BD 0000      A          JSR     ENTPV2          ENTER ADJUSTED K15
00148P 00E3 BD 0000      A          JSR     FLPMLT          MULTIPLY
00149P 00E6 CE 0000      A          LDX     #K4
00150P 00E9 BD 0000      A          JSR     ENTPV2          ENTER K4
00151P 00EC BD 0000      A          JSR     FLPMLT          MULTIPLY
00152P 00EF CE 0000      A          LDX     #K16
00153P 00F2 BD 0000      A          JSR     SINT15          K16 _ (10-K5)*K4*K15
00154P 00F5 20 06 00FD              BRA     STRIG7
00155                        *
00156P 00F7 7F 0000      A  STRIG6  CLR     K16
00157P 00FA 7F 0001      A          CLR     K16+1           K16 _ 0
00158                        *
00159P 00FD 86 FF        A  STRIG7  LDAA    #$FF
00160P 00FF C6 FE        A          LDAB    #$FE
00161P 0101 CE 0000      A          LDX     #K16
00162P 0104 BD 0000      A          JSR     SUB16
00163P 0107 97 00        A          STAA    TDC
00164P 0109 D7 01        A          STAB    TDC+1           TDC _ (2**16-2) - K16
00165P 010B 39                      RTS                     EXIT STRIG
00167                        *
00168                        * DK16 - WHEN AT = 0, DETERMINE K16
00169                        *
00170                        * FLOW PAGE 14L
00171                        *
00172P 010C 8D 35 0143   DK16       BSR     DK16X           COMPUTE K4*K15
```

```
00173                       *                    STORE 8 BIT RESULT IN SPD
00174                       *                    STORE 16 BIT RESULT IN TEMP3
00175P 010E 4F                       CLRA
00176P 010F C6 32     A               LDAB    #50
00177P 0111 D0 01     A               SUBB    K5+1      NOTE: K5 IS INT15*10
00178P 0113 92 00     A               SBCA    K5        ACCA,ACCB = 50-K5
00179P 0115 CE 0000   A               LDX     #TEMP3
00180P 0118 BD 0000   A               JSR     MULT16    RESULT = (50-K5)*SPD
00181P 011B CE 000A   A               LDX     #10
00182P 011E DF 00     A               STX     TEMP3
00183P 0120 CE 0000   A               LDX     #TEMP3
00184P 0123 BD 0000   A               JSR     DIV16     ACCA,ACCB = (5-K5/10)*SPD
00185P 0126 CB F4     A               ADDB    #$F4      NOTE: $01F4 = 500 DECIMAL
00186P 0128 89 01     A,              ADCA    #$01      ACCA,ACCB = 500+(5-K5/10)*SPD
00187P 012A 2A 02 012E                BPL     DK16B     BRANCH IF RESULT NOT < 0
00188P 012C 4F                        CLRA
00189P 012D 5F                        CLRB              SET RESULT TO ZERO
00190P 012E 97 00     A DK16B STAA    K16
00191P 0130 D7 01     A               STAB    K16+1
00192P 0132 96 00     A               LDAA    M1
00193P 0134 C6 06     A               LDAB    #6        ACCB = 6
00194P 0136 81 05     A               CMPA    #5        IS M1 = 5? (IE. MIXED MODE?)
00195P 0138 27 06 0140                BEQ     DK16C     IF YES...BRANCH
00196P 013A 5C                        INCB              ACCB = 7
00197P 013B 81 06     A               CMPA    #6        IS M1 = 6? (IE. AUTOSCOPE?)
00198P 013D 27 01 0140                BEQ     DK16C     IF YES...BRANCH
00199P 013F 5C                        INCB              ACCB = 8
00200P 0140 D7 00     A DK16C STAB    LD        SET LD TO APPROPRIATE VALUE
00201P 0142 39                        RTS 00203P 0143 96 00     A DK16X LDAA    K4        GET INTEGER PART OF
00204P 0145 D6 00     A               LDAB    K15       K4 AND K15
00205P 0147 BD 0000   A               JSR     MULT8     NOT: RESULT WILL BE BETWEEN
00206                       *                           1 AND 25
00207P 014A CE 0165   P               LDX     #DK16PT   POINT TO POWER OF TEN TABLE
00208P 014D 96 01     A               LDAA    K4+1      ADD EXPONENTS OF K4 AND K15
00209P 014F 9B 01     A               ADDA    K15+1     RESULT WILL BE 0, 1 OR 2
00210P 0151 27 05 0158                BEQ     DK16Y     BRANCH IF RESULT = 0
00211P 0153 08                        INX               NEXT TABLE ENTRY
00212P 0154 4A                        DECA
00213P 0155 27 01 0158                BEQ     DK16Y     BRANCH IF RESULT = 0
00214P 0157 08                        INX               NEXT TABLE ENTRY
00215P 0158 A6 00     A DK16Y LDAA    0,X       GET APPROPRIATE VALUE
00216P 015A BD 0000   A               JSR     MULT8
00217P 015D 97 00     A               STAA    TEMP3     SAVE SPD IN TEMP3 AS INT15
00218P 015F D7 01     A               STAB    TEMP3+1
00219P 0161 F7 0000   A               STAB    SPD       SPD = K4*K15
00220P 0164 39                        RTS               ... EXIT 00222P 0165    01     A DK16PT FCB    1,10,100
     P 0166    0A     A
     P 0167    64     A
00224                       *
00225                       *  STLFA - STORE LOW FREQUENCT ANALOG TRACE NAD
00226                       *    SET DISPLAY BITS.
00227                       *
00228                       * FLOW PAGE 14M
00229                       *
00230P 0168 BD 0000   A STLFA  JSR    SLFAV     SET LF ANALOG VARIABLES
00231P 016B 86 00     A        LDAA   #M
00232P 016D BD 0000   A        JSR    CFLG2     M _ 0
00233P 0170 BD 0000   A        JSR    SARM      ARM _ 1, ETC
00234P 0173 86 00     A STLFA2 LDAA   #P
00235P 0175 BD 0000   A        JSR    SFLG2     P _ 1
00236P 0178 B6 0006   A STLFA3 LDAA   FEAD8+6
00237P 017B 81 80     A        CMPA   #$80
00238P 017D 24 10 018F         BCC    STLFA4    BRANCH IF (FEAD14) >= 80H
00239                       *
00240P 017F 96 00     A        LDAA   FR2
00241P 0181 85 00     A        BITA   #P
00242P 0183 26 0F 0194         BNE    STLFA5    BRANCH IF P = 1
00243                       *
00244P 0185 BD 0000   A        JSR    DLFAS     DIGITIZE ANALOG SIGNAL
00245P 0188 86 00     A        LDAA   #M
```

```
00246P 018A BD 0000  A          JSR    SFLG2    M _ 1
00247P 018D 20 E4 0173          BRA    STLFA2   LOOP
00248                      *
00249P 018F 86 00    A STLFA4   LDAA   #P
00250P 0191 BD 0000  A          JSR    CFLG2    P _ 0
00251                      *
00252P 0194 BD 0000  A STLFA5   JSR    UFE      UPDATE FRONT END
00253P 0197 96 00    A          LDAA   FR2
00254P 0199 85 00    A          BITA   #M
00255P 019B 27 08 01A5          BEQ    STLFA6   BRANCH IF M=0
00256                      *
00257P 019D BD 0000  A          JSR    SLFAB    STORE ANALOG BYTE
00258P 01A0 86 00    A          LDAA   #M
00259P 01A2 BD 0000  A          JSR    CFLG2    M _ 0
00260                      *
00261P 01A5 96 00    A STLFA6   LDAA   FR1
00262P 01A7 85 00    A          BITA   #FEOS    IS FEOS = 0?
00263P 01A9 27 03 01AE          BEQ    STLFA7   IF YES...BRANCH
00264                      *
00265P 01AB 7E 0000  A          JMP    SALFA    SET ANALOG DISPLAY BITS
00266                      *                    ...AND EXIT
00267                      *
00268P 01AE BD 0000  A STLFA7   JSR    SCNCLR   SCAN CLEAR CONTROL
00269P 01B1 96 00    A          LDAA   FR1
00270P 01B3 85 00    A          BITA   #TE
00271P 01B5 26 C1 0178          BNE    STLFA3   LOOP IF TE = 1
00272P 01B7 39                  RTS             EXIT STLFA
00274P 01B8    00    A          FCB    0        CRC BYTE
00275                           END
TOTAL ERRORS 00000

RB      AD      00006*00049 00050 00056
R       AT      00018*00126
RP      CFLG2   00010*00232 00250 00259
RP      CMPIDX  00010*00052 00067 00078 00085 00089 00134
RP      DELAY   00011*00043 00048
DP 0000 DIGINO  00021 00028*
R       DIM     00018*00093
 P 000A DIO0    00030 00033*
 P 000C DIO1    00035*00068 00079
 P 0040 DIO1A   00053 00056*
 P 005C DIO2    00059 00071*
 P 0070 DIO3    00061 00072 00082*
 P 0084 DIO4    00069 00080 00086 00092*
 P 008C DIO5    00090 00096*
RP      DIV16   00011*00184
DP 010C DK16    00021 00128 00172*
 P 012E DK16B   00187 00190*
 P 0140 DK16C   00195 00198 00200*
 P 0165 DK16PT  00207 00222*
DP 0143 DK16X   00021 00172 00203*
 P 0158 DK16Y   00210 00213 00215*
RP      DLFAS   00011*00244
RP      DSPDIM  00011*00094
RP      ENTINT  00012*00141
RP      ENTPV2  00012*00147 00150
R       FEAD0   00018*00036 00040 00041 00046 00054 00124
R       FEAD8   00018*00051 00236
R       FEOS    00018*00262
RB      FEW2    00006*00035 00044
RB      FEW4    00006*00110 00114 00117 00121 00123
RP      FEWUNP  00012*00039
RP      FLPMLT  00012*00148 00151
RB      FR1     00006*00261 00269
RB      FR2     00006*00240 00253
RB      K15     00007*00142 00204 00209
RB      K16     00007*00152 00156 00157 00161 00190 00191
RB      K4      00007*00149 00203 00208
RB      K5      00007*00131 00132 00177 00178
RB      K6      00007*00029 00058 00119
RB      K8      00007*00103 00106
RB      LD      00007*00200
```

```
RB      LITE1   00007*00125
R       M       00018*00231 00245 00254 00258
RB      M1      00008*00192
RP      MULT16  00013*00180
RP      MULT8   00013*00205 00216
R       P       00019*00234 00241 00249
R       SALFA   00014*00265
RP      SARM    00014*00233
RP      SCNCLR  00014*00268
RP      SFLG2   00015*00235 00246
RP      SINT15  00015*00153
RP      SLFAB   00015*00257
RP      SLFAV   00015*00230
RP      SPD     00019*00219
DP 0168 STLFA   00021 00230*
 P 0173 STLFA2  00234*00247
 P 0178 STLFA3  00236*00271
 P 018F STLFA4  00238 00249*
 P 0194 STLFA5  00242 00252*
 P 01A5 STLFA6  00255 00261*
 P 01AE STLFA7  00263 00268*
DP 008D STRIG   00021 00103*
 P 009F STRIG1  00108 00113*
 P 00A5 STRIG2  00105 00117*
 P 00A8 STRIG3  00115 00119*
 P 00AF STRIG4  00111 00120 00123*
 P 00BF STRIG5  00127 00131*
 P 00F7 STRIG6  00135 00156*
 P 00FD STRIG7  00129 00154 00159*
RP      SUB16   00015*00162
RB      TDC     00008*00163 00164
R       TE      00019*00270
RB      TEMP3   00008*00143 00144 00146 00179 00182 00183 00217 00218
RP      UFE     00016*00252
RB      W1      00008*00033 00037 00038 00062 00064 00073 00075 00084

00001                           NAM     F14N
00002                           OPT     REL, CREF, LLEN=80
00003                           TTL     FLOW PAGES 14N THRU 14P
00004                           IDNT    FEB.  16, 1978

00006                           XREF    BSCT:A14N, A2, A3, AD, ADB, ADBB, BB, CF2, D
00007                           XREF    BSCT:FEW2, FEW4, FM4, H, K15, K4, K5, K5T, K8
00008                           XREF    BSCT:N, R, TAAC, TAD, TDC, TEMP, TSAA, TVAR1
00009                           XREF    BSCT:VOS2, W1, W2

00011                           XREF    PSCT:ABSAB, CFLG1, CMPIDX, ENTER, ENTIDX
00012                           XREF    PSCT:ENTINT, ENTPV2, FLPDIV, FLPMLT
00013                           XREF    PSCT:LASTD4, MULT8, SINT15, SINT8, STOVAR

00015                           XREF    BATT, FEAD0, FEAD8, FEOS

00017                           XDEF    SLFAV, SARM, DLFAS 00019P 0000                     PSCT
00021                   *
00022                   * SLFAV - SET LOW FREQUENCY ANALOG VARIABLES
00023                   *
00024                   * FLOW PAGE 14N
00025                   *
00026P 0000 86 50   A SLFAV LDAA  #80
00027P 0002 D6 00   A       LDAB  A2
00028P 0004 BD 0000 A       JSR   MULT8       MULTIPLY
00029P 0007 DB 01   A       ADDB  VOS2+1
00030P 0009 99 00   A       ADCA  VOS2
00031P 000B 97 00   A       STAA  W2
00032P 000D D7 01   A       STAB  W2+1        W2 = 80*A2+VOS2
00033P 000F 86 24   A       LDAA  #36
```

```
00034P 0011 D6 00      A        LDAB   A3              NOTE: A3 IS INT8*2
00035P 0013 BD 0000    A        JSR    MULT8           MULTIPLY
00036P 0016 97 00      A        STAA   A14N
00037P 0018 D7 01      A        STAB   A14N+1          A14N = 72*A3
00038P 001A 86 20      A        LDAA   #32
00039P 001C D6 00      A        LDAB   A3              NOTE: A3 IS INT8*2
00040P 001E BD 0000    A        JSR    MULT8           MULTIPLY
00041P 0021 97 00      A        STAA   BB
00042P 0023 D7 01      A        STAB   BB+1            B = 64*A3
00043P 0025 7F 0000    A        CLR    CF2             CF2 = 0
00044P 0028 CE 0000    A        LDX    #0
00045P 002B DF 00      A        STX    AD              AD = 0
00046P 002D 86 02      A        LDAA   #2
00047P 002F 97 00      A        STAA   N               N = 2
00048P 0031 DE 00      A        LDX    K5
00049P 0033 DF 00      A        STX    K5T             K5T = K5

00051P 0035 CE 0000    A        LDX    #BATT
00052P 0038 DF 00      A        STX    TAAC            PRESET TAAC = #BATT
00053P 003A CE 0000    A        LDX    #K4
00054P 003D BD 0000    A        JSR    ENTPV2          ENTER K4
00055P 0040 CE 0000    A        LDX    #K15
00056P 0043 BD 0000    A        JSR    ENTPV2          ENTER K15
00057P 0046 BD 0000    A        JSR    FLPMLT          COMPUTE K4*K15
00058P 0049 CE 0000    A        LDX    #TVAR1
00059P 004C BD 0000    A        JSR    STOVAR          SAVE RESULT 00061P 004F 96 00      A        LDAA   K5
00062P 0051 D6 01      A        LDAB   K5+1            NOTE: K5 IS INT15*10
00063P 0053 CE 02F8    A        LDX    #760
00064P 0056 BD 0000    A        JSR    CMPIDX          IS K5 > 760?
00065P 0059 2F 52 00AD          BLE    SLFV0C          IF NOT... BRANCH
00066P 005B 86 01      A        LDAA   #1
00067P 005D 97 00      A        STAA   FM4             PRESET FM4 = 1
00068P 005F 96 01      A        LDAA   K4+1            GET EXP(K4)
00069P 0061 81 FE      A        CMPA   #-2             IS EXP(K4) = -2?
00070P 0063 27 0F 0074          BEQ    SLFV0A          IF YES... BRANCH
00071P 0065 CE 0005    A        LDX    #5
00072P 0068 BD 0000    A        JSR    ENTIDX          ENTER 5
00073P 006B BD 0000    A        JSR    FLPDIV          DIVIDE
00074P 006E CE 0000    A        LDX    #FM4
00075P 0071 BD 0000    A        JSR    SINT8           FM4 = K4*K15/5

00077P 0074 96 00      A SLFV0A LDAA   K4              GET NUM(K4)
00078P 0076 81 02      A        CMPA   #2              IS NUM(K4) = 2?
00079P 0078 26 6F 00E9          BNE    SLFV0G          IF NOT... BRANCH 00081P 007A 96 00      A        LDAA   K5T
00082P 007C D6 01      A        LDAB   K5T+1

00084P 007E 58                  ASLB
00085P 007F 49                  ROLA 00087P 0080 58                  ASLB
00088P 0081 49                  ROLA 00090P 0082 58                  ASLB
00091P 0083 49                  ROLA                   TIMES 8

00093P 0084 BD 0000    A        JSR    ENTINT          ENTER K5T*8
00094P 0087 CE 000A    A        LDX    #10
00095P 008A BD 0000    A        JSR    ENTIDX          ENTER 10
00096P 008D BD 0000    A        JSR    FLPDIV          DIVIDE
00097P 0090 CE 0000    A        LDX    #K5T
00098P 0093 BD 0000    A        JSR    SINT15          K5T = .8*K5T
00099P 0096 CE 0000    A        LDX    #TVAR1
00100P 0099 BD 0000    A        JSR    ENTER           RE-ENTER K4*K15
00101P 009C CE 0004    A        LDX    #4
00102P 009F BD 0000    A        JSR    ENTIDX          ENTER 4
00103P 00A2 BD 0000    A        JSR    FLPDIV          DIVIDE
00104P 00A5 CE 0000    A        LDX    #FM4
00105P 00A8 BD 0000    A        JSR    SINT8           FM4 = K4*K15/4
00106P 00AB 20 3C 00E9          BRA    SLFV0G
```

```
00108P 00AD 78 0001    A SLFV0C ASL   K5T+1
00109P 00B0 79 0000    A        ROL   K5T              K5T = 2*K5T
00110P 00B3 96 00      A        LDAA  K5
00111P 00B5 D6 01      A        LDAB  K5+1             NOTE: K5 IS INT15*10
00112P 00B7 CE 0136    A        LDX   #310
00113P 00BA BD 0000    A        JSR   CMPIDX           IS K5 > 310?
00114P 00BD 2F 11 00D0          BLE   SLFV0E           IF NOT...BRANCH
00115P 00BF CE 000A    A        LDX   #10
00116P 00C2 BD 0000    A        JSR   ENTIDX           ENTER 10
00117P 00C5 BD 0000    A        JSR   FLPDIV           DIVIDE
00118P 00C8 CE 0000    A        LDX   #FM4
00119P 00CB BD 0000    A        JSR   SINT8            FM4 = K4*K15/10
00120P 00CE 20 19 00E9          BRA   SLFV0G 00122P 00D0 78 0001    A SLFV0E ASL   K5T+1
00123P 00D3 79 0000    A        ROL   K5T              K5T = 2*K5T
00124P 00D6 CE 0014    A        LDX   #20
00125P 00D9 BD 0000    A        JSR   ENTIDX           ENTER 20
00126P 00DC BD 0000    A        JSR   FLPDIV           DIVIDE
00127P 00DF CE 0000    A        LDX   #FM4
00128P 00E2 BD 0000    A        JSR   SINT8            FM4 = K4*K15/20
00129P 00E5 DE 00      A        LDX   K5               IS K5 > 0?
00130P 00E7 2F 0E 00F7          BLE   SLFV0I           IF NOT...BRANCH 00132P 00E9 96 00      A SLFV0G LDAA  K5T
00133P 00EB D6 01      A        LDAB  K5T+1            NOTE: K5T IS INT15*10
00134P 00ED 47                  ASRA
00135P 00EE 56                  RORB                   DIVIDE K5T BY 2
00136P 00EF D9 01      A        ADCB  TAAC+1           ROUND AND ADD #BATT
00137P 00F1 99 00      A        ADCA  TAAC
00138P 00F3 97 00      A        STAA  TAAC
00139P 00F5 D7 01      A        STAB  TAAC+1           TAAC = #BATT+5*K5T 00141P 00F7 96 00      A SLFV0I LDAA  K5T
00142P 00F9 D6 01      A        LDAB  K5T+1            NOTE: K5T IS INT15*10
00143P 00FB 47                  ASRA
00144P 00FC 56                  RORB                   DIVIDE K5T BY 2
00145P 00FD C9 00      A        ADCB  #0               ROUND
00146P 00FF 89 00      A        ADCA  #0
00147P 0101 97 00      A        STAA  ADBB
00148P 0103 D7 01      A        STAB  ADBB+1           ADBB = 5*K5T 00150P 0105 96 00      A        LDAA  K8
00151P 0107 81 03      A        CMPA  #3               IS K8 = 3?
00152P 0109 26 05 0110          BNE   SLFV3            IF NOT...BRANCH
00153P 010B DE 00      A        LDX   TAAC
00154P 010D DF 00      A        STX   TSAA             TSAA = TAAC
00155P 010F 39                  RTS 00157P 0110 96 00      A SLFV3  LDAA  K8
00158P 0112 81 01      A        CMPA  #1
00159P 0114 27 04 011A          BEQ   SLFV3A           BRANCH IF K8 = 1
00160P 0116 81 05      A        CMPA  #5
00161P 0118 25 06 0120          BCS   SLFV4            BRANCH IF 1 < K8 < 5
00162P 011A CE 07D0    A SLFV3A LDX   #BATT+2000
00163P 011D DF 00      A        STX   TSAA             TSAA = #BATT+2000
00164P 011F 39                  RTS 00166P 0120 96 00      A SLFV4  LDAA  K5T
00167P 0122 D6 01      A        LDAB  K5T+1            DETERMINE ABSOLUTE(K5T)
00168P 0124 BD 0000    A        JSR   ABSAB
00169P 0127 CE 00C8    A        LDX   #200
00170P 012A BD 0000    A        JSR   CMPIDX           IS ABS(K5T) > 200?
00171P 012D 2E 03 0132          BGT   SLFV8            IF YES...BRANCH 00173P 012F 4F                  CLRA
00174P 0130 C6 C8      A        LDAB  #200
00175                           *          ACCA,ACCB = 200

00177P 0132 DB 01      A SLFV8  ADDB  TAAC+1
00178P 0134 99 00      A        ADCA  TAAC 00180P 0136 CE 038F    A        LDX   #BATT+911
00181P 0139 BD 0000    A        JSR   CMPIDX           IS TSAA > #BATT+911?
```

```
00182P 013C 2F 04 0142        BLE    SLFV9      IF NOT...BRANCH
00183P 013E C0 90      A      SUBB   #$90
00184P 0140 82 03      A      SBCA   #$03       NOTE: $0390 = 912
00185P 0142 97 00      A SLFV9 STAA  TSAA
00186P 0144 D7 01      A      STAB   TSAA+1     SET TSAA 00188P 0146 39                RTS
00190                       *
00191                       * SARM - SET ARM = 1, THEN SET TRIGGER DELAY COUNTER
00192                       *
00193                       * FLOW PAGE 140
00194                       *
00195P 0147 86 08      A SARM  LDAA  #8
00196P 0149 9B 00      A      ADDA   FEW4
00197P 014B B7 0004    A      STAA   FEAD0+4    (FEAD4) = FEW4+8
00198P 014E 96 01      A      LDAA   TDC+1
00199P 0150 B7 0005    A      STAA   FEAD0+5    (FEAD5) = TDC BITS 7-0
00200P 0153 96 00      A      LDAA   TDC
00201P 0155 B7 0006    A      STAA   FEAD0+6    (FEAD6) = TDC BITS 15-8
00202P 0158 DE 00      A      LDX    ADBB
00203P 015A DF 00      A      STX    ADB        ADB = ADBB
00204P 015C 86 01      A      LDAA   #1
00205P 015E 97 00      A      STAA   H          H = 1
00206P 0160 CE FFFF    A      LDX    #BATT-1
00207P 0163 DF 00      A      STX    TAD        TAD = #BATT-1
00208P 0165 86 00      A      LDAA   #FEOS
00209P 0167 7E 0000    A      JMP    CFLG1      FEOS = 0
00210                       *                    ...AND EXIT
00212                       *
00213                       * DLFAS - DIGITIZE LOW FREQUENCY ANALOG SIGNAL
00214                       *
00215                       * FLOW PAGE 14P
00216                       *
00217P 016A DE 00      A DLFAS LDX   A14N
00218P 016C DF 00      A      STX    TEMP       "C" = A14N
00219P 016E 86 12      A      LDAA   #18
00220P 0170 97 00      A      STAA   D          D = 18
00221P 0172 86 28      A      LDAA   #40
00222P 0174 97 00      A      STAA   R          R = 40
00223P 0176 DE 00      A      LDX    W2
00224P 0178 DF 00      A      STX    W1         W1 = W2
00225P 017A 96 00      A DLFAS1 LDAA FEW2
00226P 017C 8B 08      A      ADDA   #8
00227P 017E B7 0002    A      STAA   FEAD0+2    (FEAD2) = FEW2+8
00228P 0181 96 00      A      LDAA   W1
00229P 0183 D6 01      A      LDAB   W1+1
00230P 0185 BD 0000    A      JSR    LASTD4     SHIFT ACCA, ACCB
00231P 0188 B7 0001    A      STAA   FEAD0+1    (FEAD1) = W1 BITS 11-6
00232P 018B F7 0000    A      STAB   FEAD0      (FEAD0) = W1 BITS 5-0
00233P 018E 96 00      A      LDAA   FEW2
00234P 0190 8B 0A      A      ADDA   #$0A
00235P 0192 B7 0002    A      STAA   FEAD0+2    (FEAD2) = FEW2+0A HEX
00236P 0195 96 00      A      LDAA   D
00237P 0197 81 09      A      CMPA   #9         IS D = 9?
00238P 0199 27 0F 01AA        BEQ    DLFAS4     IF YES...BRANCH
00239P 019B 47                ASRA
00240P 019C 97 00      A      STAA   D          D = D/2
00241P 019E 96 00      A      LDAA   TEMP
00242P 01A0 D6 01      A      LDAB   TEMP+1     GET "C"
00243P 01A2 47                ASRA
00244P 01A3 56                RORB
00245P 01A4 97 00      A      STAA   TEMP
00246P 01A6 D7 01      A      STAB   TEMP+1     "C" = "C"/2
00247P 01A8 20 08 01B2        BRA    DLFAS5

00249P 01AA 86 10      A DLFAS4 LDAA #16
00250P 01AC 97 00      A      STAA   D          D = 16
00251P 01AE DE 00      A      LDX    BB
00252P 01B0 DF 00      A      STX    TEMP       "C" = B 00254P 01B2 7F 0007    A DLFAS5 CLR  FEAD0+7    (FEAD7) = 0
00255P 01B5 B6 0001    A      LDAA   FEAD8+1
00256P 01B8 85 80      A      BITA   #$80       IS (FEAD9) BIT 7 = 0?
00257P 01BA 26 14 01D0        BNE    DLFAS2     IF NOT...BRANCH
00258P 01BC 96 00      A      LDAA   W1
```

```
00259P 01BE D6 01    A          LDAB    W1+1
00260P 01C0 D0 01    A          SUBB    TEMP+1
00261P 01C2 92 00    A          SBCA    TEMP       SUBTRACT "C"
00262P 01C4 97 00    A          STAA    W1
00263P 01C6 D7 01    A          STAB    W1+1       W1 = W1-"C"
00264P 01C8 96 00    A          LDAA    R
00265P 01CA 90 00    A          SUBA    D
00266P 01CC 97 00    A          STAA    R          R = R-D
00267P 01CE 20 12 01E2          BRA     DLFAS3
00268P 01D0 96 00    A DLFAS2   LDAA    W1
00269P 01D2 D6 01    A          LDAB    W1+1
00270P 01D4 DB 01    A          ADDB    TEMP+1
00271P 01D6 99 00    A          ADCA    TEMP       ADD "C"
00272P 01D8 97 00    A          STAA    W1
00273P 01DA D7 01    A          STAB    W1+1       W1 = W1+"C"
00274P 01DC 96 00    A          LDAA    R
00275P 01DE 9B 00    A          ADDA    D
00276P 01E0 97 00    A          STAA    R          R = R+D
00277P 01E2 96 00    A DLFAS3   LDAA    D
00278P 01E4 81 01    A          CMPA    #1         IS D = 1?
00279P 01E6 26 92 017A          BNE     DLFAS1     IF NOT... BRANCH
00280P 01E8 D6 00    A          LDAB    R
00281P 01EA 57                  ASRB
00282P 01EB D7 00    A          STAB    R          R = R/2
00283P 01ED 97 00    A          STAA    H          H = 1
00284P 01EF 39                  RTS
00286P 01F0    00    A          FCB     0          CRC BYTE
00287                           END
TOTAL ERRORS 00000

RB      A14N    00006*00036 00037 00217
RB      A2      00006*00027
RB      A3      00006*00034 00039
RP      ABSAB   00011*00168
RB      AD      00006*00045
RB      ADB     00006*00203
RB      ADBB    00006*00147 00148 00202
R       BATT    00015*00051 00162 00180 00206
RB      BB      00006*00041 00042 00251
RB      CF2     00006*00043
RP      CFLG1   00011*00209
RP      CMPIDX  00011*00064 00113 00170 00181
RB      D       00006*00220 00236 00240 00250 00265 00275 00277
DP 016A DLFAS   00017 00217*
 P 017A DLFAS1  00225*00279
 P 01D0 DLFAS2  00257 00268*
 P 01E2 DLFAS3  00267 00277*
 P 01AA DLFAS4  00238 00249*
 P 01B2 DLFAS5  00247 00254*
RP      ENTER   00011*00100
RP      ENTIDX  00011*00072 00095 00102 00116 00125
RP      ENTINT  00012*00093
RP      ENTPV2  00012*00054 00056
R       FEAD0   00015*00197 00199 00201 00227 00231 00232 00235 00254
R       FEAD8   00015*00255
R       FEOS    00015*00208
RB      FEW2    00007*00225 00233
RB      FEW4    00007*00196
RP      FLPDIV  00012*00073 00096 00103 00117 00126
RP      FLPMLT  00012*00057
RB      FM4     00007*00067 00074 00104 00118 00127
RB      H       00007*00205 00283
RB      K15     00007*00055
RB      K4      00007*00053 00068 00077
RB      K5      00007*00048 00061 00062 00110 00111 00129
RB      K5T     00007*00049 00081 00082 00097 00108 00109 00122 00123 00132
                00133 00141 00142 00166 00167
RB      K8      00007*00150 00157
RP      LASTD4  00013*00230
RP      MULT8   00013*00028 00035 00040
RB      N       00008*00047
RB      R       00008*00222 00264 00266 00274 00276 00280 00282
```

```
DP 0147  SARM    00017 00195*
RP       SINT15  00013*00098
RP       SINT3   00013*00075 00105 00119 00128
DP 0000  SLFAV   00017 00026*
 P 0074  SLFV0A  00070 00077*
 P 00AD  SLFV0C  00065 00108*
 P 00D0  SLFV0E  00114 00122*
 P 00E9  SLFV0G  00079 00106 00120 00132*
 P 00F7  SLFV0I  00130 00141*
 P 0110  SLFV3   00152 00157*
 P 011A  SLFV3A  00159 00162*
 P 0120  SLFV4   00161 00166*
 P 0132  SLFV8   00171 00177*
 P 0142  SLFV9   00182 00185*
RP       STOVAR  00013*00059
RB       TAAC    00008*00052 00136 00137 00138 00139 00153 00177 00178
RB       TAD     00008*00207
RB       TDC     00008*00198 00200
RB       TEMP    00008*00218 00241 00242 00245 00246 00252 00260 00261 00270
                 00271
RB       TSAA    00008*00154 00163 00185 00186
RB       TVAR1   00008*00058 00099
RB       VOS2    00009*00029 00030
RB       W1      00009*00224 00228 00229 00258 00259 00262 00263 00268 00269
                 00272 00273
RB       W2      00009*00031 00032 00223

00001                        NAM   F14Q
00002                        OPT   REL, CREF, LLEN=80
00003                        TTL   FLOW PAGES 14Q THRU 14T
00004                        IDNT  FEB.  17, 1978

00006                        XREF  BSCT:AA, AD, ADB, CF2
00007                        XREF  BSCT:FEW01, FEW02, FEW03, FEW11, FEW12, FEW13
00008                        XREF  BSCT:FEW2, FEW4, FM4
00009                        XREF  BSCT:H, K4, K5, K5T, N, Q, R
00010                        XREF  BSCT:TAAC, TAD, TEMP, TEMP3, TSAA

00012                        XREF  PSCT:COMP16, CMPIDX, SFLG1

00014                        XREF  BAAD, BATT, FEAD0, FEAD8, FEOS, RNX

00016                        XDEF  UFE, SLFAB, SALFA 00018P 0000                  PSCT
00020                  *
00021                  * UFE - UPDATE FRONT END
00022                  *
00023                  * FLOW PAGE 14Q
00024                  *
00025P 0000 CE 0000  A UFE    LDX   #FEAD0
00026P 0003 96 00    A        LDAA  FEW2
00027P 0005 8B 08    A        ADDA  #8
00028P 0007 97 00    A        STAA  Q         Q = FEW2+8
00029P 0009 A7 02    A        STAA  2,X       (FEAD2) = Q
00030P 000B 96 00    A        LDAA  H
00031P 000D 81 06    A        CMPA  #6
00032P 000F 27 4D 005E        BEQ   UFE60     BRANCH IF H = 6
00033P 0011 81 05    A        CMPA  #5
00034P 0013 27 3F 0054        BEQ   UFE50     BRANCH IF H = 5
00035P 0015 81 04    A        CMPA  #4
00036P 0017 27 2C 0045        BEQ   UFE40     BRANCH IF H = 4
00037P 0019 81 03    A        CMPA  #3
00038P 001B 27 1E 003B        BEQ   UFE30     BRANCH IF H = 3
00039P 001D 81 02    A        CMPA  #2
00040P 001F 27 0A 002B        BEQ   UFE20     BRANCH IF H = 2
00041                  *            ASSUME H = 1
00042P 0021 96 00    A        LDAA  FEW13
```

```
00043P 0023 A7 01       A           STAA    1,X         (FEAD1) = FEW 1,3
00044P 0025 96 00       A           LDAA    FEW03
00045P 0027 A7 00       A           STAA    0,X         (FEAD0) = FEW 0,3
00046P 0029 20 3B 0066              BRA     UFE70
00047P 002B 96 00       A UFE20     LDAA    Q           H = 2
00048P 002D 8B 04       A           ADDA    #4
00049P 002F 97 00       A           STAA    Q           Q = Q+4
00050P 0031 A7 02       A           STAA    2,X         (FEAD2) = Q
00051P 0033 96 00       A           LDAA    N
00052P 0035 81 02       A           CMPA    #2          IS N = 2?
00053P 0037 27 0C 0045              BEQ     UFE40       IF YES...BRANCH
00054P 0039 20 2B 0066              BRA     UFE70
00055P 003B 96 00       A UFE30     LDAA    FEW11       H = 3
00056P 003D A7 01       A           STAA    1,X         (FEAD1) = FEW 1,1
00057P 003F 96 00       A           LDAA    FEW01
00058P 0041 A7 00       A           STAA    0,X         (FEAD0) = FEW 0,1
00059P 0043 20 21 0066              BRA     UFE70
00060P 0045 96 00       A UFE40     LDAA    Q           H = 4
00061P 0047 4C                      INCA
00062P 0048 97 00       A           STAA    Q           Q = Q+1
00063P 004A A7 02       A           STAA    2,X         (FEAD2) = Q
00064P 004C 96 00       A           LDAA    N
00065P 004E 81 04       A           CMPA    #4          IS N = 4?
00066P 0050 27 0C 005E              BEQ     UFE60       IF YES...BRANCH
00067P 0052 20 12 0066              BRA     UFE70
00068P 0054 96 00       A UFE50     LDAA    FEW12       H = 5
00069P 0056 A7 01       A           STAA    1,X         (FEAD1) = FEW 1,2
00070P 0058 96 00       A           LDAA    FEW02
00071P 005A A7 00       A           STAA    0,X         (FEAD0) = FEW 0,2
00072P 005C 20 08 0066              BRA     UFE70
00073P 005E 96 00       A UFE60     LDAA    Q           H = 6
00074P 0060 8B 02       A           ADDA    #2
00075P 0062 97 00       A           STAA    Q           Q = Q+2
00076P 0064 A7 02       A           STAA    2,X         (FEAD2) = Q
00077P 0066 96 00       A UFE70     LDAA    H
00078P 0068 91 00       A           CMPA    N           IS H = N?
00079P 006A 27 03 006F              BEQ     UFE72       IF YES...BRANCH
00080P 006C 4C                      INCA                H = H+1
00081P 006D 20 02 0071              BRA     UFE73
00082P 006F 86 01       A UFE72     LDAA    #1          H = 1
00083P 0071 97 00       A UFE73     STAA    H
00084P 0073 39                      RTS                 EXIT
00085                               *
00086                               * SLFAB - STORE A LOW FREQUENCY ANALOG BYTE,
00087                               *         SET A BIT, ARM?
00088                               *
00089                               * FLOW PAGE 14R
00090                               *
00091 
00092P 0074 96 00       A SLFAB     LDAA    CF2
00093P 0076 80 01       A           SUBA    #1
00094P 0078 97 00       A           STAA    CF2         CF2 = CF2-1
00095P 007A 2E 43 00BF              BGT     SLFAB4      BRANCH IF CF2 > 0
00096P 007C 9B 00       A           ADDA    FM4
00097P 007E 97 00       A           STAA    CF2         CF2 = CF2+FM4
00098P 0080 96 00       A           LDAA    TAD
00099P 0082 D6 01       A           LDAB    TAD+1
00100P 0084 CE 0390     A           LDX     #BATT+912
00101P 0087 BD 0000     A           JSR     CMPIDX      IS TAD < #BATT+912?
00102P 008A 2C 05 0091              BGE     SLFAB1      IF NOT...BRANCH
00103P 008C DE 00       A           LDX     TAD
00104P 008E 08                      INX                 TAD = TAD+1
00105P 008F 20 03 0094              BRA     SLFAB2
00106P 0091 CE 0000     A SLFAB1    LDX     #BATT       TAD = #BATT
00107P 0094 DF 00       A SLFAB2    STX     TAD
00108P 0096 96 00       A           LDAA    R
00109P 0098 A7 00       A           STAA    0,X         (TAD) = R
00110P 009A B6 0004     A           LDAA    FEAD8+4
00111P 009D 81 80       A           CMPA    #$80        IS (FEAD12) < 80 HEX?
00112P 009F 24 1F 00C0              BCC     SLFAB5      IF NOT...BRANCH
00113P 00A1 9C 00       A           CPX     TAAC        IS TAD = TAAC?
00114P 00A3 26 0B 00B0              BNE     SLFAB3      IF NOT...BRANCH
00115P 00A5 96 00       A           LDAA    FEW4
00116P 00A7 B7 0004     A           STAA    FEAD0+4     (FEAD4) = FEW4
00117P 00AA DE 00       A           LDX     TSAA
```

```
00118P 00AC DF 00      A             STX    AD            AD = TSAA
00119P 00AE DE 00      A             LDX    TAD           RESTORE TAD
00120P 00B0 9C 00      A  SLFAB3     CPX    AD            IS TAD = AD?
00121P 00B2 26 0B 00BF                BNE    SLFAB4        IF NOT... BRANCH
00122P 00B4 96 00      A             LDAA   FEW4
00123P 00B6 16                        TAB
00124P 00B7 8B 10      A             ADDA   #$10
00125P 00B9 B7 0004    A             STAA   FEAD0+4       (FEAD4) = FEW4+10 HEX
00126P 00BC F7 0004    A             STAB   FEAD0+4       (FEAD4) = FEW4
00127P 00BF 39             SLFAB4    RTS 00129P 00C0 4F             SLFAB5    CLRA
00130P 00C1 C6 C7      A             LDAB   #199
00131P 00C3 D0 01      A             SUBB   ADB+1
00132P 00C5 92 00      A             SBCA   ADB           IS 199 < ADB?
00133P 00C7 2D 0C 00D5                BLT    SLFAB7        IF YES... BRANCH
00134P 00C9 DE 00      A             LDX    ADB           GET ADB
00135P 00CB 2B 02 00CF                BMI    SLFAB6        BRANCH IF ADB NEGATIVE
00136P 00CD 8D 0B 00DA                BSR    SLFADB        SET A LOW FREQUENCY
00137                       *                              ANALOG DISPLAY BIT.
00138P 00CF DE 00      A  SLFAB6     LDX    ADB
00139P 00D1 08                        INX
00140P 00D2 DF 00      A             STX    ADB           ADB = ADB+1
00141P 00D4 39                        RTS 00143P 00D5 86 00      A  SLFAB7     LDAA   #FEOS
00144P 00D7 7E 0000    A             JMP    SFLG1         FEOS = 1 ... AND EXIT
00146                       *
00147                       * SLFADB - SET A LOW FREQUENCY ANALOG DISPLAY BIT
00148                       *
00149                       * FLOW PAGE 145
00150                       *
00151P 00DA D6 00      A  SLFADB     LDAB   R             IS R = 0?
00152P 00DC 27 59 0137                BEQ    SLFDB2        IF YES... BRANCH
00153P 00DE C1 28      A             CMPB   #40           IS R = 40?
00154P 00E0 27 55 0137                BEQ    SLFDB2        IF YES... BRANCH
00155P 00E2 86 27      A             LDAA   #39
00156P 00E4 10                        SBA                  ACCA = 39-R
00157P 00E5 16                        TAB
00158P 00E6 4F                        CLRA                 ACCA, ACCB = 39-R 00160P 00E7 58                        ASLB
00161P 00E8 49                        ROLA 00163P 00E9 58                        ASLB
00164P 00EA 49                        ROLA 00166P 00EB 58                        ASLB
00167P 00EC 49                        ROLA                ACCA, ACCB = (39-R)*8

00169P 00ED 97 00      A             STAA   TEMP
00170P 00EF D7 01      A             STAB   TEMP+1        SAVE 00172P 00F1 58                        ASLB
00173P 00F2 49                        ROLA 00175P 00F3 58                        ASLB
00176P 00F4 49                        ROLA 00178P 00F5 58                        ASLB
00179P 00F6 49                        ROLA                ACCA, ACCB = (39-R)*64

00181P 00F7 97 00      A             STAA   TEMP3
00182P 00F9 D7 01      A             STAB   TEMP3+1       SAVE 00184P 00FB 58                        ASLB
00185P 00FC 49                        ROLA                ACCA, ACCB = (39-R)*128

00187P 00FD DB 01      A             ADDB   TEMP3+1
00188P 00FF 99 00      A             ADCA   TEMP3
00189P 0101 DB 01      A             ADDB   TEMP+1
00190P 0103 99 00      A             ADCA   TEMP          ACCA, ACCB = (39-R)*200
00191P 0105 DB 01      A             ADDB   ADB+1
00192P 0107 99 00      A             ADCA   ADB           ACCA, ACCB = (39-R)*100+ADB
```

```
00193P 0109 44                   LSRA              DIVIDE BY 8 AND LEAVE REMAINDER
00194P 010A 56                   RORB              IN HIGH ORDER BITS
00195P 010B 46                   RORA
00196P 010C 56                   RORB
00197P 010D 46                   RORA
00198P 010E 56                   RORB              ACCA, ACCB = INT(ACCA, ACCB/8)
00199P 010F 97 00       A        STAA    AA        SAVE RESULT MSB
00200P 0111 46                   RORA              GET FINAL BIT OF REMAINDER
00201P 0112 44                   LSRA
00202P 0113 44                   LSRA
00203P 0114 44                   LSRA
00204P 0115 44                   LSRA
00205P 0116 44                   LSRA              SHIFT REMAINDER 5 BITS RIGHT
00206P 0117 36                   PSHA              SAVE REMAINDER FOR LATER
00207P 0118 96 00       A        LDAA    AA
00208P 011A 84 1F       A        ANDA    #%00011111 CLEAN UP QUOTIENT.
00209                      *                       LSB OF QUOTIENT STILL IN ACCB.
00210P 011C CE 0000     A        LDX     #BAAD
00211P 011F DF 00       A        STX     TEMP3
00212P 0121 DB 01       A        ADDB    TEMP3+1
00213P 0123 99 00       A        ADCA    TEMP3     ADD DISPLACEMENT TO #BAAD
00214P 0125 97 00       A        STAA    TEMP3
00215P 0127 D7 01       A        STAB    TEMP3+1
00216P 0129 DE 00       A        LDX     TEMP3     INDEX NOW POINTS TO BYTE
00217                      *                       TO BE ALTERED
00218P 012B 32                   PULA              PICK UP REMAINDER AND
00219P 012C 4C                   INCA              CALCULATE BIT POSITION
00220P 012D 5F                   CLRB              CLEAR ACCB
00221P 012E 0D                   SEC               SET CARRY
00222P 012F 56           SLFDB1  RORB              ROTATE
00223P 0130 4A                   DECA
00224P 0131 26 FC 012F          BNE     SLFDB1
00225P 0133 EA 00       A        ORAB    0,X       LOGICAL OR EXISTING BITS
00226                      *                       WITH NEW BITS
00227P 0135 E7 00       A        STAB    0,X
00228P 0137 39           SLFDB2  RTS
00230                      *
00231                      * SALFA - SET ALL LOW FREQUENCY ANALOG DISPLAY BITS
00232                      *
00233                      * FLOW PAGE 14T
00234                      *
00235P 0138 96 00       A SALFA  LDAA    K5        NOTE: K5 IS INT15*10
00236P 013A D6 01       A        LDAB    K5+1
00237P 013C CE 0064     A        LDX     #100
00238P 013F BD 0000     A        JSR     CMPIDX    IS K5 > 100?
00239P 0142 2E 0A 014E          BGT     SLFA10    IF YES...BRANCH
00240P 0144 96 00       A        LDAA    TAD
00241P 0146 D6 01       A        LDAB    TAD+1
00242P 0148 C0 C8       A        SUBB    #200
00243P 014A 82 00       A        SBCA    #0        TAD = TAD-200
00244P 014C 20 22 0170          BRA     SLFA20

00246P 014E 96 00       A SLFA10 LDAA    K5T       NOTE: K5T IS INT15*10
00247P 0150 D6 01       A        LDAB    K5T+1
00248P 0152 47                   ASRA
00249P 0153 56                   RORB              DIVIDE BY 2
00250P 0154 C9 00       A        ADCB    #0        ROUND
00251P 0156 89 00       A        ADCA    #0
00252P 0158 97 00       A        STAA    TEMP
00253P 015A D7 01       A        STAB    TEMP+1
00254P 015C 96 00       A        LDAA    TAD
00255P 015E D6 01       A        LDAB    TAD+1
00256P 0160 CE 0000     A        LDX     #TEMP     POINT TO ADJUSTED K5T
00257P 0163 BD 0000     A        JSR     COMP16    IS TAD > K5T*5?
00258P 0166 2E 04 016C          BGT     SLFA12    IF YES...BRANCH
00259P 0168 CB 90       A        ADDB    #$90
00260P 016A 89 03       A        ADCA    #$03      TAD = TAD+912
00261P 016C D0 01       A SLFA12 SUBB    TEMP+1    NOTE: TEMP CONTAINS K5T*5
00262P 016E 92 00       A        SBCA    TEMP 00264P 0170 97 00       A SLFA20 STAA    TAD
00265P 0172 D7 01       A        STAB    TAD+1
00266P 0174 CE 0000     A        LDX     #BATT
00267P 0177 BD 0000     A        JSR     CMPIDX    IS TAD < #BATT?
```

```
00268P 017A 24 08 0184         BCC    SLFA30    IF NOT...BRANCH
00269P 017C CB 90      A       ADDB   #$90
00270P 017E 89 03      A       ADCA   #$03      NOTE: $0390 = 912
00271P 0180 97 00      A       STAA   TAD
00272P 0182 D7 01      A       STAB   TAD+1     TAD = TAD+912

00274P 0184 CE 0000    A SLFA30 LDX   #0
00275P 0187 DF 00      A       STX    ADB       ADB = 0
00276P 0189 DE 00      A       LDX    TAD
00277P 018B A6 00      A SLFA40 LDAA  0,X
00278P 018D 97 00      A       STAA   R         R = (TAD)
00279P 018F A6 01      A       LDAA   1,X
00280P 0191 B7 0000    A       STAA   RNX       RNX = (TAD+1)
00281P 0194 BD 00DA    P SLFA50 JSR   SLFADB    SET A LOW FREQUENCY ANALOG DISPLAY
00282                    *                      BIT.
00283P 0197 B6 0000    A       LDAA   RNX
00284P 019A 91 00      A       CMPA   R         IS RNX = R?
00285P 019C 27 0E 01AC         BEQ    SLFA80    IF YES...BRANCH
00286P 019E 25 05 01A5         BCS    SLFA60    BRANCH IF RNX < R
00287P 01A0 7C 0000    A       INC    R         R = R+1
00288P 01A3 20 03 01A8         BRA    SLFA70
00289P 01A5 7A 0000    A SLFA60 DEC   R         R = R-1
00290P 01A8 91 00      A SLFA70 CMPA  R         IS R = RNX?
00291P 01AA 26 E8 0194         BNE    SLFA50    IF NOT...BRANCH
00292P 01AC DE 00      A SLFA80 LDX   ADB
00293P 01AE 08                 INX
00294P 01AF DF 00      A       STX    ADB       ADB = ADB+1
00295P 01B1 96 00      A       LDAA   K5
00296P 01B3 D6 01      A       LDAB   K5+1      NOTE: K5 IS INT15*10
00297P 01B5 CE 0136    A       LDX    #310
00298P 01B8 BD 0000    A       JSR    CMPIDX    IS K5 > 310?
00299P 01BB 2F 1F 01DC         BLE    SLFA85    IF NOT...BRANCH
00300P 01BD DE 00      A       LDX    ADB
00301P 01BF 08                 INX
00302P 01C0 DF 00      A       STX    ADB       ADB = ADB+1
00303P 01C2 CE 02F8    A       LDX    #760
00304P 01C5 BD 0000    A       JSR    CMPIDX    IS K5 > 760?
00305P 01C8 2F 12 01DC         BLE    SLFA85    IF NOT...BRANCH
00306P 01CA DE 00      A       LDX    ADB
00307P 01CC 08                 INX
00308P 01CD 08                 INX
00309P 01CE DF 00      A       STX    ADB       ADB = ADB+2
00310P 01D0 DE 00      A       LDX    K4
00311P 01D2 8C 02FE    A       CPX    #$02FE    IS K4 = 2*10**-2?
00312P 01D5 26 05 01DC         BNE    SLFA85    IF NOT...BRANCH
00313P 01D7 DE 00      A       LDX    ADB
00314P 01D9 08                 INX
00315P 01DA DF 00      A       STX    ADB       ADB = ADB+1

00317P 01DC DE 00      A SLFA85 LDX   ADB
00318P 01DE 8C 00C8    A       CPX    #200      IS ADB = 200?
00319P 01E1 27 11 01F4         BEQ    SLFA90    IF YES...BRANCH
00320P 01E3 DE 00      A       LDX    TAD
00321P 01E5 08                 INX
00322P 01E6 DF 00      A       STX    TAD       TAD = TAD+1
00323P 01E8 8C 0390    A       CPX    #BATT+912 IS TAD = #BATT+912?
00324P 01EB 26 9E 018B         BNE    SLFA40    IF NOT...BRANCH
00325P 01ED CE 0000    A       LDX    #BATT
00326P 01F0 DF 00      A       STX    TAD       TAD = #BATT
00327P 01F2 20 97 018B         BRA    SLFA40

00329P 01F4 39            SLFA90 RTS
00331P 01F5 00         A        FCB    0         CRC BYTE
00332                            END
TOTAL ERRORS 00000

RB    AA      00006*00199 00207
RB    AD      00006*00118 00120
RB    ADB     00006*00131 00132 00134 00138 00140 00191 00192 00275 00292
              00294 00300 00302 00306 00309 00313 00315 00317
R     BAAD    00014*00210
R     BATT    00014*00100 00106 00266 00323 00325
```

```
RB       CF2      00006*00092 00094 00097
RP       CMPIDX   00012*00101 00238 00267 00298 00304
RP       COMP16   00012*00257
R        FEAD0    00014*00025 00116 00125 00126
R        FEAD8    00014*00110
R        FEOS     00014*00143
RB       FEW01    00007*00057
RB       FEW02    00007*00070
RB       FEW03    00007*00044
RB       FEW11    00007*00055
RB       FEW12    00007*00068
RB       FEW13    00007*00042
RB       FEW2     00008*00026
RB       FEW4     00008*00115 00122
RB       FM4      00008*00096
RB       H        00009*00030 00077 00083
RB       K4       00009*00310
RB       K5       00009*00235 00236 00295 00296
RB       K5T      00009*00246 00247
RB       N        00009*00051 00064 00078
RB       Q        00009*00028 00047 00049 00060 00062 00073 00075
RB       R        00009*00108 00151 00278 00284 00287 00289 00290
R        RNX      00014*00280 00283
DP 0138  SALFA    00016 00235*
RP       SFLG1    00012*00144
P  014E  SLFA10   00239 00246*
P  016C  SLFA12   00258 00261*
P  0170  SLFA20   00244 00264*
P  0184  SLFA30   00268 00274*
P  018B  SLFA40   00277*00324 00327
P  0194  SLFA50   00281*00291
P  01A5  SLFA60   00286 00289*
P  01A8  SLFA70   00288 00290*
P  01AC  SLFA80   00285 00292*
P  01DC  SLFA85   00299 00305 00312 00317*
P  01F4  SLFA90   00319 00329*
DP 0074  SLFAB    00016 00092*
P  0091  SLFAB1   00102 00106*
P  0094  SLFAB2   00105 00107*
P  00B0  SLFAB3   00114 00120*
P  00BF  SLFAB4   00095 00121 00127*
P  00C0  SLFAB5   00112 00129*
P  00CF  SLFAB6   00135 00138*
P  00D5  SLFAB7   00133 00143*
P  00DA  SLFADB   00136 00151*00281
P  012F  SLFDB1   00222*00224
P  0137  SLFDB2   00152 00154 00228*
RB       TAAC     00010*00113
RB       TAD      00010*00098 00099 00103 00107 00119 00240 00241 00254 00255
                  00264 00265 00271 00272 00276 00320 00322 00326
RB       TEMP     00010*00169 00170 00189 00190 00252 00253 00256 00261 00262
RB       TEMP3    00010*00181 00182 00187 00188 00211 00212 00213 00214 00215
                  00216
RB       TSAA     00010*00117
DP 0000  UFE      00016 00025*
P  002B  UFE20    00040 00047*
P  003B  UFE30    00038 00055*
P  0045  UFE40    00036 00053 00060*
P  0054  UFE50    00034 00068*
P  005E  UFE60    00032 00066 00073*
P  0066  UFE70    00046 00054 00059 00067 00072 00077*
P  006F  UFE72    00079 00082*
P  0071  UFE73    00081 00083*
00001                        NAM    F14U1
00002                        OPT    REL, CREF, LLEN=80
00003                        TTL    FLOW PAGES 14U1 THRU 14U4
00004                        IDNT   FEB.  17, 1978

00006                        XREF   BSCT:A2, A3, BX, CM, CMC
00007                        XREF   BSCT:FEW01, FEW02, FEW11, FEW12, FEW4
00008                        XREF   BSCT:FR1, K15, N, SCRTCH, SKIP
00009                        XREF   BSCT:T5, TDC, TEMP, TEMP3, VOS1, VOS2
```

```
00011                          XREF    PSCT:CFLG1,CHFLG1,CMPIDX
00012                          XREF    PSCT:DIV16,DK16X,MULT16,MULT8
00013                          XREF    PSCT:SHFAD,SHFDV,UAATRT

00015                          XREF    AAD,ADW,BAAD,FEAD0
00016                          XREF    INC,LFROG,RAS
00017                          XREF    T6,T7,T8,TE
00018                          XREF    WF1,WF2,WFH,WFL

00020                          XDEF    STHFA,LASTD4

00022P 0000                    PSCT
00024                  *
00025                  * STHFA - STORE HIGH FREQUENCY ANALOG TRACE AND
00026                  *         SET DISPLAY BITS
00027                  *
00028                  * FLOW PAGE 14U1
00029                  *
00030P 0000 8D 18 001A STHFA    BSR     SHFAV       SET HF ANALOG VARIABLES
00031P 0002 BD 0084  P          JSR     SHFAU       SET HF ANALOG UPPER RASTER
00032                  *                            VARIABLES
00033P 0005 BD 00D7  P STHFA1   JSR     LASTD       LEAPFROG, ARM = 1, THEN SET
00034                  *                            TRIGGER DELAY COUNTER
00035P 0008 BD 0000  A          JSR     UAATRT      UPDATE, ARM, AUTO-TRIGGER,
00036                  *                            RETURN ON EOS
00037P 000B 96 00    A          LDAA    FR1
00038P 000D 85 00    A          BITA    #TE         IS TRIGGER ENABLE RESET?
00039P 000F 27 08 0019          BEQ     STHFA3      IF YES... BRANCH
00040P 0011 BD 0000  A          JSR     SHFAD       SET 200 HF ANALOG DISPLAY BITS
00041P 0014 7A 0000  A          DEC     RAS         RAS = RAS-1
00042P 0017 26 EC 0005          BNE     STHFA1      BRANCH IF RAS <> 0
00043P 0019 39       STHFA3     RTS                 ... EXIT
00045                  *
00046                  * SHFAV - SET HIGH FREQUENCY ANALOG VARIABLES
00047                  *
00048                  * FLOW PAGE 14U2
00049                  *
00050P 001A BD 0000  A SHFAV    JSR     SHFDV       SET HF TRACE VARIABLES
00051P 001D 86 00    A          LDAA    #0
00052P 001F 97 00    A          STAA    BX          BX = 0
00053P 0021 86 06    A          LDAA    #6
00054P 0023 97 00    A          STAA    N           N = 6
00055P 0025 CE 004E  A          LDX     #78
00056P 0028 DF 00    A          STX     TEMP3
00057P 002A CE 0000  A          LDX     #TEMP3
00058P 002D 4F                  CLRA
00059P 002E D6 00    A          LDAB    A3          NOTE: A3 IS INT8*2
00060P 0030 BD 0000  A          JSR     MULT16
00061P 0033 DE 00    A          LDX     SCRTCH
00062P 0035 DF 00    A          STX     TEMP3       TEMP3 = 156*A3
00063P 0037 86 50    A          LDAA    #80
00064P 0039 D6 00    A          LDAB    A2
00065P 003B BD 0000  A          JSR     MULT8
00066P 003E DB 01    A          ADDB    TEMP3+1
00067P 0040 99 00    A          ADCA    TEMP3       ACCA,ACCB = 80*A2+156*A3
00068P 0042 97 00    A          STAA    TEMP
00069P 0044 D7 01    A          STAB    TEMP+1      SAVE 80*A2+156*A3
00070P 0046 DB 01    A          ADDB    VOS1+1
00071P 0048 99 00    A          ADCA    VOS1
00072P 004A B7 0000  A          STAA    WFL
00073P 004D F7 0001  A          STAB    WFL+1       WFL = 80*A2+156*A3+VOS1
00074P 0050 D6 00    A          LDAB    A3          NOTE: A3 IS INT8*2
00075P 0052 58                  ASLB
00076P 0053 58                  ASLB
00077P 0054 4F                  CLRA                ACCA,ACCB = 8*A3
00078P 0055 DB 01    A          ADDB    TEMP+1
00079P 0057 99 00    A          ADCA    TEMP
00080P 0059 DB 01    A          ADDB    VOS2+1
00081P 005B 99 00    A          ADCA    VOS2
00082P 005D DB 00    A          ADDB    BX
```

```
00083P 005F 89 00     A           ADCA    #0              ADD BX
00084P 0061 B7 0000   A           STAA    WFH
00085P 0064 F7 0001   A           STAB    WFH+1           WFH = 80*A2+164*A3+VOS2+BX
00086P 0067 96 00     A           LDAA    A3              NOTE: A3 IS INT8*2
00087P 0069 48                    ASLA
00088P 006A 48                    ASLA
00089P 006B 48                    ASLA
00090P 006C 9B 00     A           ADDA    BX
00091P 006E B7 0000   A           STAA    INC             INC = 16*A3+BX
00092P 0071 96 01     A           LDAA    K15+1
00093P 0073 81 04     A           CMPA    #4              IS EXP(K15) > 4?
00094P 0075 2F 0C 0083            BLE     SHFAV6          IF NOT...BRANCH
00095P 0077 96 00     A           LDAA    TDC
00096P 0079 D6 01     A           LDAB    TDC+1
00097P 007B D0 01     A           SUBB    CMC+1
00098P 007D 92 00     A           SBCA    CMC
00099P 007F 97 00     A           STAA    TDC
00100P 0081 D7 01     A           STAB    TDC+1           TDC = TDC-CMC
00101P 0083 39              SHFAV6 RTS
00103                       *
00104                       * SHFAU - SET HIGH FREQUENCY ANALOG UPPER RASTER
00105                       *           VARIABLES
00106                       *
00107                       * FLOW PAGE 14U3
00108                       *
00109P 0084 FE 0000   A SHFAU LDX    WFL
00110P 0087 FF 0000   A           STX     WF1             WF1 = WFL
00111P 008A FE 0000   A           LDX     WFH
00112P 008D FF 0000   A           STX     WF2             WF2 = WFH
00113P 0090 CE 0000   A           LDX     #BAAD
00114P 0093 FF 0000   A           STX     AAD             AAD = #BAAD
00115P 0096 86 00     A           LDAA    #LFROG
00116P 0098 BD 0000   A           JSR     CFLG1           LFROG = 0
00117P 009B 86 27     A           LDAA    #39
00118P 009D B7 0000   A           STAA    RAS             RAS = 39
00119P 00A0 B6 0000   A           LDAA    WF1
00120P 00A3 F6 0001   A           LDAB    WF1+1
00121P 00A6 BD 013D   P           JSR     LASTD4          OBTAIN APPROPRIATE BITS FROM WF1
00122P 00A9 97 00     A           STAA    FEW11           FEW 1,1 = WF1 BITS 11-6
00123P 00AB D7 00     A           STAB    FEW01           FEW 0,1 = WF1 BITS 5-0
00124P 00AD 7F 0000   A           CLR     ADW             ADW = 0

00126P 00B0 BD 0000   A           JSR     DK16X           COMPUTE K4*K15
00127                       *                             STORE 8 BIT RESULT IN SPD
00128                       *                             STORE 16 BIT RESULT IN TEMP3
00129P 00B3 7F 0000   A           CLR     SKIP            PRESET SKIP TO 0
00130P 00B6 96 00     A           LDAA    TEMP3
00131P 00B8 D6 01     A           LDAB    TEMP3+1         GET SPD VALUE
00132P 00BA CE 000A   A           LDX     #10
00133P 00BD BD 0000   A           JSR     CMPIDX          IS SPD > 10?
00134P 00C0 2E 14 00D6            BGT     SHFAU1          IF YES...BRANCH
00135P 00C2 97 00     A           STAA    TEMP3
00136P 00C4 D7 01     A           STAB    TEMP3+1         PUT SPD BACK IN TEMP3
00137                       *                             CMPIDX WIPED IT OUT
00138P 00C6 4F                    CLRA
00139P 00C7 5F                    CLRB
00140P 00C8 CE 0014   A           LDX     #20
00141P 00CB DF 00     A           STX     SCRTCH          DIVIDEND IS 20
00142P 00CD CE 0000   A           LDX     #TEMP3          POINT TO 16 BIT VERSION OF SPD
00143P 00D0 BD 0000   A           JSR     DIV16           DIVIDE
00144                       *                             RESULT IN ACCA,ACCB
00145P 00D3 5A                    DECB                    SUBTRACT 1
00146P 00D4 D7 00     A           STAB    SKIP            SKIP = 20/SPD-1
00147P 00D6 39              SHFAU1 RTS                    ...EXIT
00149                       *
00150                       * LASTD - LEAPFROG, ARM = 1,
00151                       *           THEN SET TRIGGER DELAY COUNTER
00152                       *
00153                       * FLOW PAGE 14U4
00154                       *
00155P 00D7 86 00     A LASTD LDAA   #LFROG
00156P 00D9 BD 0000   A           JSR     CHFLG1          FLIP (OR FLOP) LFROG
00157P 00DC C5 00     A           BITB    #LFROG          IS NEW SETTING OF LFROG = 0?
00158P 00DE 26 0C 00EC            BNE     LASTD1          IF NOT...BRANCH
00159P 00E0 CE 0000   A           LDX     #WF1
```

```
00160P 00E3 8D 4A 012F        BSR   LASTD3    WF1 = WF1-INC
00161P 00E5 CE 0000  A        LDX   #WF2
00162P 00E8 8D 5C 0146        BSR   LASTD5    WF2 = WF2+BX
00163P 00EA 20 0A 00F6        BRA   LASTD2

00165P 00EC CE 0000  A LASTD1 LDX   #WF2
00166P 00EF 8D 3E 012F        BSR   LASTD3    WF2 = WF2-INC
00167P 00F1 CE 0000  A        LDX   #WF1
00168P 00F4 8D 50 0146        BSR   LASTD5    WF1 = WF1+BX 00170P 00F6 B6 0000  A LASTD2 LDAA  WF1       GET WF1
00171P 00F9 F6 0001  A        LDAB  WF1+1
00172P 00FC 8D 3F 013D        BSR   LASTD4    SHIFT BITS AS NECESSARY
00173P 00FE 97 00    A        STAA  FEW11     FEW 1,1 = WF1 BITS 11-6
00174P 0100 D7 00    A        STAB  FEW01     FEW 0,1 = WF1 BITS 5-0
00175P 0102 B6 0000  A        LDAA  WF2
00176P 0105 F6 0001  A        LDAB  WF2+1     GET WF2
00177P 0108 8D 33 013D        BSR   LASTD4    SHIFT BITS AS NECESSARY
00178P 010A 97 00    A        STAA  FEW12     FEW 1,2 = WF2 BITS 11-6
00179P 010C D7 00    A        STAB  FEW02     FEW 0,2 = WF2 BITS 5-0
00180P 010E 96 00    A        LDAA  FEW4
00181P 0110 8B 08    A        ADDA  #8
00182P 0112 B7 0004  A        STAA  FEAD0+4   (FEAD4) = FEW4+8
00183P 0115 96 01    A        LDAA  TDC+1
00184P 0117 B7 0005  A        STAA  FEAD0+5   (FEAD5) = TDC BITS 7-0
00185P 011A 96 00    A        LDAA  TDC
00186P 011C B7 0006  A        STAA  FEAD0+6   (FEAD6) = TDC BITS 15-8
00187P 011F DE 00    A        LDX   T5
00188P 0121 FF 0000  A        STX   T6        T6 = T5
00189P 0124 FE 0000  A        LDX   T7
00190P 0127 FF 0000  A        STX   T8        T8 = T7
00191P 012A DE 00    A        LDX   CMC
00192P 012C DF 00    A        STX   CM        CM = CMC
00193P 012E 39              RTS 00195P 012F E6 01    A LASTD3 LDAB  1,X
00196P 0131 F0 0000  A        SUBB  INC
00197P 0134 E7 01    A        STAB  1,X
00198P 0136 A6 00    A        LDAA  0,X
00199P 0138 82 00    A        SBCA  #0        SUBTRACT INC
00200P 013A A7 00    A        STAA  0,X
00201P 013C 39              RTS               ...RETURN
00203P 013D 58         LASTD4 ASLB
00204P 013E 49                ROLA
00205P 013F 58                ASLB
00206P 0140 49                ROLA
00207P 0141 54                LSRB
00208P 0142 54                LSRB
00209P 0143 84 3F   A         ANDA  #%00111111
00210P 0145 39              RTS 00212P 0146 E6 01    A LASTD5 LDAB  1,X
00213P 0148 DB 00    A        ADDB  BX
00214P 014A E7 01    A        STAB  1,X
00215P 014C A6 00    A        LDAA  0,X
00216P 014E 89 00    A        ADCA  #0        ADD IN BX
00217P 0150 A7 00    A        STAA  0,X
00218P 0152 39              RTS               ...RETURN
00220P 0153    00    A        FCB   0         CRC BYTE
00221                         END
TOTAL ERRORS 00000

RB    A2       00006*00064
RB    A3       00006*00059 00074 00086
R     AAD      00015*00114
R     ADW      00015*00124
R     BAAD     00015*00113
RB    BX       00006*00052 00082 00090 00213
RP    CFLG1    00011*00116
RP    CHFLG1   00011*00156
RB    CM       00006*00192
RB    CMC      00006*00097 00098 00191
```

```
RP         CMPIDX    00011*00133
RP         DIV16     00012*00143
RP         DK16X     00012*00126
R          FEAD0     00015*00182 00184 00186
RB         FEW01     00007*00123 00174
RB         FEW02     00007*00179
RB         FEW11     00007*00122 00173
RB         FEW12     00007*00178
RB         FEW4      00007*00180
RB         FR1       00008*00037
R          INC       00016*00091 00196
RP         K15       00008*00092
 P  00D7   LASTD     00033 00155*
 P  00EC   LASTD1    00158 00165*
 P  00F6   LASTD2    00163 00170*
 P  012F   LASTD3    00160 00166 00195*
DP  013D   LASTD4    00020 00121 00172 00177 00203*
 P  0146   LASTD5    00162 00168 00212*
R          LFROG     00016*00115 00155 00157
RP         MULT16    00012*00060
RP         MULT8     00012*00065
RB         N         00008*00054
R          RAS       00016*00041 00118
RB         SCRTCH    00008*00061 00141
RP         SHFAD     00013*00040
 P  0034   SHFAU     00031 00109*
 P  00D6   SHFAU1    00134 00147*
 P  001A   SHFAV     00030 00050*
 P  0083   SHFAV6    00094 00101*
RP         SHFDV     00013*00050
RB         SKIP      00008*00129 00146
DP  0000   STHFA     00020 00030*
 P  0005   STHFA1    00033*00042
 P  0019   STHFA3    00039 00043*
RB         T5        00009*00187
R          T6        00017*00188
R          T7        00017*00189
R          T8        00017*00190
RB         TDC       00009*00095 00096 00099 00100 00183 00185
R          TE        00017*00038
RB         TEMP      00009*00068 00069 00078 00079
RB         TEMP3     00009*00056 00057 00062 00066 00067 00130 00131 00135 00136
                     00142
RP         UAATRT    00013*00035
RB         VOS1      00009*00070 00071
RB         VOS2      00009*00080 00081
R          WF1       00018*00110 00119 00120 00159 00167 00170 00171
R          WF2       00018*00112 00161 00165 00175 00176
R          WFH       00018*00084 00085 00111
R          WFL       00018*00072 00073 00109

00001                          NAM    F14U5
00002                          OPT    REL, CREF, LLEN=80
00003                          TTL    FLOW PAGES 14U5 THRU 14V2
00004                          IDNT   FEB.    21, 1978

00006                          XREF   BSCT:BL, BP, CF, CF2, CM
00007                          XREF   BSCT:FEW4, FF, FR1, FR2, H
00008                          XREF   BSCT:K15, K16, K5, K8, LD, N
00009                          XREF   BSCT:SCRTCH, SKIP
00010                          XREF   BSCT:TAAC, TDC, TEMP3, TSAA, TSK

00012                          XREF   PSCT:ABSAB, CFLG2, CMPIDX, COMP16
00013                          XREF   PSCT:DLFAAT, MULT16, PNTATT
00014                          XREF   PSCT:SCNCLR, SDSDB, SFLG2, STLFDB, SUB16, UFE

00016                          XREF   AAD, ADW, ASBF, ASBT
00017                          XREF   CBL, FEAD0, FEAD8, NX
00018                          XREF   OBLSP, OBWDD, P, RATT, SPD, T6, T7, T8, TE

00020                          XDEF   SHFAD, SHFADA, STLFD, UAATRT
```

```
00022P 0000                        PSCT
00024                 *
00025                 * SHFAD - SET 100 HIGH FREQUENCY ANALOG DISPLAY BITS
00026                 *
00027                 * FLOW PAGE 14U5
00028                 *
00029P 0000 96 01   A SHFAD  LDAA  K15+1
00030P 0002 81 04   A        CMPA  #4        IS EXP(K15) > 4?
00031P 0004 2E 08 000E       BGT   SHFAD1    IF YES...BRANCH
00032                 *
00033P 0006 DE 00   A        LDX   CM        SET INDEX
00034P 0008 7F 0007 A SHFAD0 CLR   FEAD0+7   (FEAD7) _ 0
00035P 000B 09               DEX             INDEX _ INDEX-1
00036P 000C 26 FA 0008       BNE   SHFAD0    LOOP TILL INDEX = 0
00037                 *
00038P 000E 7F 0000 A SHFAD1 CLR   CF2       CF2 = 0
00039P 0011 86 07   A        LDAA  #7
00040P 0013 90 00   A        SUBA  SKIP
00041P 0015 97 00   A        STAA  BL        BL = 7-SKIP
00042P 0017 86 C8   A        LDAA  #200
00043P 0019 97 00   A        STAA  BP        BP = 200

00045P 001B 96 00   A SHFAD2 LDAA  CF2
00046P 001D BB 0000 A        ADDA  SPD
00047P 0020 97 00   A        STAA  CF2       CF2 = CF2+SPD
00048P 0022 0C               CLC
00049P 0023 07               TPA             SAVE CARRY 00051P 0024 7F 0007 A SHFAD3 CLR   FEAD0+7   (FEAD7) _ 0
00052P 0027 06               TAP             RESTORE CARRY VALUE
00053P 0028 8D 46 0070       BSR   SHFADX    DECIDE WHETHER TO SET CARRY OR NOT
00054P 002A 07               TPA             SAVE CARRY
00055P 002B D6 00   A        LDAB  CF2
00056P 002D C0 14   A        SUBB  #20
00057P 002F D7 00   A        STAB  CF2       CF2 = CF2-20
00058P 0031 2E F1 0024       BGT   SHFAD3    BRANCH IF CF2 > 0
00059P 0033 06               TAP             RESTORE CARRY VALUE
00060P 0034 79 0000 A        ROL   ADW
00061                 *
00062P 0037 96 00   A        LDAA  SKIP
00063P 0039 97 00   A        STAA  TSK       TSK = SKIP
00064P 003B 96 00   A SHFADM LDAA  BL
00065P 003D 26 12 0051       BNE   SHFAD4    BRANCH IF BL <> 0
00066P 003F FE 0000 A        LDX   AAD       IF BL = 0 THEN
00067P 0042 A6 00   A        LDAA  X
00068P 0044 BA 0000 A        ORAA  ADW
00069P 0047 A7 00   A        STAA  X         ... (AAD) _ (AAD) OR'D ADW
00070P 0049 08               INX
00071P 004A FF 0000 A        STX   AAD       ... AAD _ AAD+1
00072P 004D 86 08   A        LDAA  #8
00073P 004F 97 00   A        STAA  BL        ... BL _ 8
00074                 *
00075P 0051 7A 0000 A SHFAD4 DEC   BL        BL _ BL-1
00076P 0054 7A 0000 A        DEC   BP        BP _ BP-1
00077P 0057 96 00   A        LDAA  TSK       IS TSK = 0?
00078P 0059 27 0F 006A       BEQ   SHFAD7    IF YES...BRANCH
00079P 005B 78 0000 A        ASL   ADW       SHIFT ADW 1 BIT LEFT
00080P 005E 7A 0000 A        DEC   TSK       TSK = TSK-1
00081P 0061 96 00   A        LDAA  CF2
00082P 0063 BB 0000 A        ADDA  SPD
00083P 0066 97 00   A        STAA  CF2       CF2 = CF2+SPD
00084P 0068 20 D1 003B       BRA   SHFADM 00086P 006A 96 00   A SHFAD7 LDAA  BP        IS BP = 0?
00087P 006C 26 AD 001B       BNE   SHFAD2    IF NOT...LOOP
00088P 006E 39               RTS             EXIT SHFAD 00090P 006F 0C        SHFADA CLC             INITIALIZE CARRY TO 0
00091P 0070 F6 0000 A SHFADX LDAB  FEAD8
00092P 0073 C5 20   A        BITB  #$20
00093P 0075 26 0F 0086       BNE   SHFADD    BRANCH IF (FEAD8),5 = 1
00094P 0077 C5 10   A        BITB  #$10
```

```
00095P 0079 27 06 0081            BEQ      SHFADB    BRANCH IF (FEAD8),4 = 0
00096P 007B C5 08     A            BITB     #8
00097P 007D 26 06 0085             BNE      SHFADC    BRANCH IF (FEAD8),3 = 1
00098P 007F 20 13 0094             BRA      SHFADF    BRANCH IF (FEAD8),3 = 0
00099P 0081 C5 04     A   SHFADB   BITB     #4
00100P 0083 27 0F 0094             BEQ      SHFADF    BRANCH IF (FEAD8),2 = 0
00101P 0085 39            SHFADC   RTS                EXIT DECISION SUBROUTINE
00102                              *
00103P 0086 C5 10     A   SHFADD   BITB     #$10
00104P 0088 27 06 0090             BEQ      SHFADE    BRANCH IF (FEAD8),4 = 0
00105P 008A C5 01     A            BITB     #1
00106P 008C 26 F7 0085             BNE      SHFADC    BRANCH IF (FEAD8),0 = 1
00107P 008E 20 04 0094             BRA      SHFADF    BRANCH IF (FEAD8),0 = 0
00108P 0090 C5 02     A   SHFADE   BITB     #2
00109P 0092 26 F1 0085             BNE      SHFADC    BRANCH IF (FEAD8),1 = 1
00110P 0094 0D            SHFADF   SEC
00111P 0095 39                     RTS                EXIT DECISION SUBROUTINE
00113                     *
00114                     * UAATRT - UPDATE, ARM, AUTO-TRIGGER,
00115                     *          RETURN ON EOS
00116                     *
00117                     * FLOW PAGE 14U6
00118                     *
00119P 0096 BD 0000   A   UAATRT   JSR      UFE       UPDATE FRONT END
00120P 0099 FE 0000   A            LDX      T6        IS T6 = 0?
00121P 009C 26 2A 00C8             BNE      UATRT3    IF NOT... BRANCH
00122P 009E 96 00     A            LDAA     FEW4
00123P 00A0 B7 0004   A            STAA     FEAD0+4   (FEAD4) = FEW4
00124P 00A3 D6 00     A            LDAB     K8
00125P 00A5 C1 01     A            CMPB     #1        IS 1 < K8?
00126P 00A7 23 17 00C0             BLS      UATRT2    IF NOT... BRANCH
00127P 00A9 C1 05     A            CMPB     #5        IS K8 < 5?
00128P 00AB 24 13 00C0             BCC      UATRT2    IF NOT... BRANCH
00129P 00AD FE 0000   A            LDX      T8        IS T8 = 0?
00130P 00B0 26 0A 00BC             BNE      UATRT1    IF NOT... BRANCH
00131P 00B2 FF 0000   A            STX      T7        T7 = 0
00132P 00B5 8B 10     A            ADDA     #$10
00133P 00B7 B7 0004   A            STAA     FEAD0+4   (FEAD4) = FEW4+10 HEX
00134P 00BA 20 04 00C0             BRA      UATRT2

00136P 00BC 09            UATRT1   DEX
00137P 00BD FF 0000   A            STX      T8        T8 = T8-1

00139P 00C0 B6 0005   A   UATRT2   LDAA     FEAD8+5
00140P 00C3 85 80     A            BITA     #%10000000 IS FEAD13 BIT 7 = 0?
00141P 00C5 27 05 00CC             BEQ      UATRT4    IF YES... BRANCH
00142P 00C7 39                     RTS                ... ELSE EXIT 00144P 00C8 09            UATRT3   DEX
00145P 00C9 FF 0000   A            STX      T6        T6 = T6-1

00147P 00CC BD 0000   A   UATRT4   JSR      SCNCLR    SCAN CLEAR CONTROL
00148P 00CF 96 00     A            LDAA     FR1
00149P 00D1 85 00     A            BITA     #TE       IS TE = 0?
00150P 00D3 26 C1 0096             BNE      UAATRT    IF NOT... BRANCH 00152P 00D5 39                     RTS                ... EXIT
00154                     *
00155                     * STLFD - STORE LOW FREQUENCY DIGITAL TRACE
00156                     *         AND SET DISPLAY BITS
00157                     *
00158                     * FLOW PAGE 14V1
00159                     *
00160P 00D6 96 00     A   STLFD    LDAA     LD
00161P 00D8 BD 0000   A            JSR      PNTATT    POINT TO XDAC(LD)
00162P 00DB A6 00     A            LDAA     OBLSP,X   GET BLSP(LD)
00163P 00DD 84 0F     A            ANDA     #$0F      GET BLSP(LD) BITS 3-0
00164P 00DF E6 00     A            LDAB     OBWDD,X   GET BWDD(LD)
00165P 00E1 B7 0000   A            STAA     RATT      RATT = BLSP(LD) BITS 3-0 *256
00166P 00E4 F7 0001   A            STAB     RATT+1    +BWDD(LD)
00167P 00E7 CE 000A   A            LDX      #10
00168P 00EA FF 0000   A            STX      T6        T6 = 10
00169P 00ED 86 06     A            LDAA     #6
00170P 00EF 97 00     A            STAA     N         N = 6
```

```
00171P 00F1 CE 0000  A           LDX    #0
00172P 00F4 FF 0000  A           STX    T8           T8 = 0
00173P 00F7 8D 73 016C           BSR    SLFDV        SET LF DIGITAL VARIABLES,
00174                   *                            ARM, THEN SET TDC
00175P 00F9 86 00    A STLFD1 LDAA #P
00176P 00FB BD 0000  A           JSR    SFLG2        P = 1
00177P 00FE B6 0006  A STLFD2 LDAA FEAD8+6
00178P 0101 81 80    A           CMPA   #$80         IS (FEAD14) < 80 HEX?
00179P 0103 25 19 011E           BCS    STLFD5       IF YES...BRANCH
00180P 0105 96 00    A           LDAA   FR2
00181P 0107 85 00    A           BITA   #P           IS P = 1?
00182P 0109 26 4A 0155           BNE    STLFD6       IF YES...BRANCH
00183P 010B FE 0000  A           LDX    T6           IS T6 = 0?
00184P 010E 27 06 0116           BEQ    STLFD3       IF YES...BRANCH
00185P 0110 09                   DEX                 T6 = T6-1
00186P 0111 FF 0000  A           STX    T6
00187P 0114 20 E3 00F9           BRA    STLFD1

00189P 0116 BD 0000  A STLFD3 JSR    STLFDB       STORE A LF DIGITAL DISP. BIT
00190P 0119 BD 0000  A           JSR    DLFAAT       DURING LF DIGITAL DISPLAY
00191P 011C 20 DB 00F9           BRA    STLFD1       ARM OR AUTO TRIGGER?
00192P 011E 86 00    A STLFD5 LDAA #P
00193P 0120 95 00    A           BITA   FR2          IS P = 0?
00194P 0122 27 1B 013F           BEQ    STLFDA       IF YES...BRANCH
00195P 0124 BD 0000  A           JSR    CFLG2        P = 0
00196P 0127 CE 0000  A           LDX    #0
00197P 012A FF 0000  A           STX    T8           T8 = 0
00198P 012D 96 00    A           LDAA   FF
00199P 012F 81 01    A           CMPA   #1           IS FF = 1?
00200P 0131 26 22 0155           BNE    STLFD6       IF NOT...BRANCH
00201P 0133 86 0F    A           LDAA   #$0F
00202P 0135 C6 07    A           LDAB   #$07
00203P 0137 B7 0003  A           STAA   FEAD0+3      (FEAD3) = $0F
00204P 013A F7 0003  A           STAB   FEAD0+3      (FEAD3) = $07
00205P 013D 20 16 0155           BRA    STLFD6

00207P 013F FE 0000  A STLFDA LDX    T8
00208P 0142 08                   INX
00209P 0143 FF 0000  A           STX    T8           T8 = T8+1
00210P 0146 8C 06E1  A           CPX    #1761        HAS 525 MS. DELAY ELAPSED?
00211P 0149 26 0A 0155           BNE    STLFD6       IF NOT...BRANCH
00212P 014B 86 0F    A           LDAA   #$0F
00213P 014D C6 1F    A           LDAB   #$1F
00214P 014F B7 0003  A           STAA   FEAD0+3      (FEAD3) = $0F
00215P 0152 F7 0003  A           STAB   FEAD0+3      (FEAD3) = $1F 00217P 0155 BD 0000  A STLFD6 JSR    UFE          UPDATE FRONT END
00218P 0158 B6 0005  A           LDAA   FEAD8+5
00219P 015B 81 80    A           CMPA   #$80         IS (FEAD13) < 80 HEX?
00220P 015D 24 0A 0169           BCC    STLFD7       IF NOT...BRANCH
00221P 015F BD 0000  A           JSR    SCNCLR       SCAN CLEAR CONTROL
00222P 0162 96 00    A           LDAA   FR1
00223P 0164 85 00    A           BITA   #TE          IS TE = 0?
00224P 0166 26 96 00FE           BNE    STLFD2       IF NOT...BRANCH
00225P 0168 39                   RTS                 ...EXIT 00227P 0169 7E 0000  A STLFD7 JMP    SDSDB        SET DIGITAL STORAGE
00228                   *                            AND DISPLAY BITS ... AND EXIT
00230                   *
00231                   * SLFDV - SET LOW FREQUENCY DIGITAL VARIABLES
00232                   *     ARM, THEN SET TDC
00233                   *
00234                   * FLOW PAGE 14V2
00235                   *
00236P 016C 86 03    A SLFDV  LDAA   #$03
00237P 016E C6 E7    A           LDAB   #$E7         ACCA,ACCB = 999
00238P 0170 CE 0000  A           LDX    #K16
00239P 0173 BD 0000  A           JSR    COMP16       IS 999 < K16?
00240P 0176 2D 07 017F           BLT    SLFDV0       IF YES...BRANCH
00241P 0178 C6 EC    A           LDAB   #$EC         ACCA,ACCB = 1004
00242                   *                            INDEX REG STILL POINTS TO K16
00243P 017A BD 0000  A           JSR    SUB16        TAAC = 1004-K16
00244P 017D 20 03 0182           BRA    SLFDV1
00245P 017F 4F                SLFDV0 CLRA
```

```
00246P 0180 C6 04      A           LDAB   #4          TAAC = 4
00247P 0182 97 00      A SLFDV1    STAA   TAAC
00248P 0184 D7 01      A           STAB   TAAC+1      STORE TAAC IN RAM
00249P 0186 CB 01      A           ADDB   #1
00250P 0188 89 00      A           ADCA   #0
00251P 018A 97 00      A           STAA   TSAA
00252P 018C D7 01      A           STAB   TSAA+1      SET TSAA = TAAC+1
00253P 018E 96 00      A           LDAA   K8
00254P 0190 81 03      A           CMPA   #3          IS K8 = 3?
00255P 0192 27 30 01C4             BEQ    SLFDV4      IF YES...BRANCH
00256P 0194 96 00      A           LDAA   K5
00257P 0196 D6 01      A           LDAB   K5+1
00258P 0198 BD 0000    A           JSR    ABSAB       GET ABS(K5)
00259P 019B CE 0064    A           LDX    #100        NOTE: K5 IS INT15*10
00260P 019E BD 0000    A           JSR    CMPIDX      IS ABS(K5) > 100?
00261P 01A1 2E 0A 01AD             BGT    SLFDV2      IF YES...BRANCH
00262P 01A3 86 03      A           LDAA   #$03
00263P 01A5 C6 E8      A           LDAB   #$E8        ACCA,ACCB = 1000
00264P 01A7 DB 01      A           ADDB   TAAC+1
00265P 01A9 99 00      A           ADCA   TAAC        TSAA = TAAC+1000
00266P 01AB 20 13 01C0             BRA    SLFDV3
00267P 01AD CE 000A    A SLFDV2    LDX    #10         NOTE: K5 IS INT15*10
00268P 01B0 DF 00      A           STX    TEMP3
00269P 01B2 CE 0000    A           LDX    #TEMP3
00270P 01B5 BD 0000    A           JSR    MULT16      RESULT = ABS(K5)*10
00271P 01B8 96 00      A           LDAA   TAAC
00272P 01BA D6 01      A           LDAB   TAAC+1
00273P 01BC DB 01      A           ADDB   SCRTCH+1
00274P 01BE 99 00      A           ADCA   SCRTCH      TSAA = TAAC+ABS(K5)*10
00275P 01C0 97 00      A SLFDV3    STAA   TSAA
00276P 01C2 D7 01      A           STAB   TSAA+1      STORE TSAA IN RAM
00277P 01C4 96 00      A SLFDV4    LDAA   FEW4
00278P 01C6 8B 08      A           ADDA   #8
00279P 01C8 B7 0004    A           STAA   FEAD0+4     (FEAD4) = FEW4+8
00280P 01CB 96 00      A           LDAA   TDC
00281P 01CD D6 01      A           LDAB   TDC+1
00282P 01CF F7 0005    A           STAB   FEAD0+5     (FEAD5) = TDC BITS 7-0
00283P 01D2 B7 0006    A           STAA   FEAD0+6     (FEAD6) = TDC BITS 15-8
00284P 01D5 86 01      A           LDAA   #1
00285P 01D7 97 00      A           STAA   H           H = 1
00286P 01D9 86 C8      A           LDAA   #200
00287P 01DB B7 0000    A           STAA   CBL         CBL = 200
00288P 01DE 86 00      A           LDAA   #NX+ASBF+ASBT
00289P 01E0 BD 0000    A           JSR    SFLG2       NX = 1, ASBF = 1, ASBT = 1
00290P 01E3 86 01      A           LDAA   #1
00291P 01E5 B0 0000    A           SUBA   SPD
00292P 01E8 97 00      A           STAA   CF          CF = 1-SPD
00293P 01EA 39                     RTS
00295P 01EB    00      A           FCB    0           CRC BYTE
00296                              END
TOTAL ERRORS 00000

R       AAD     00016*00066 00071
RP      ABSAB   00012*00258
R       ADW     00016*00060 00068 00079
R       ASBF    00016*00288
R       ASBT    00016*00288
RB      BL      00006*00041 00064 00073 00075
RB      BP      00006*00043 00076 00086
R       CBL     00017*00287
RB      CF      00006*00292
RB      CF2     00006*00038 00045 00047 00055 00057 00081 00083
RP      CFLG2   00012*00195
RB      CM      00006*00033
RP      CMPIDX  00012*00260
RP      COMP16  00012*00239
RP      DLFAAT  00013*00190
R       FEAD0   00017*00034 00051 00123 00133 00203 00204 00214 00215 00279
                00282 00283
R       FEAD8   00017*00091 00139 00177 00218
RB      FEW4    00007*00122 00277
RB      FF      00007*00198
```

```
RB       FR1      00007*00148 00222
RB       FR2      00007*00180 00193
RB       H        00007*00285
RB       K15      00008*00029
RB       K16      00008*00238
RB       K5       00008*00256 00257
RB       K8       00008*00124 00253
RB       LD       00008*00160
RP       MULT16   00013*00270
RB       N        00008*00170
R        NX       00017*00288
R        OBLSP    00018*00162
R        OBWDD    00018*00164
R        P        00018*00175 00181 00192
RP       PNTATT   00013*00161
R        RATT     00018*00165 00166
RP       SCNCLR   00014*00147 00221
RB       SCRTCH   00009*00273 00274
RP       SDSDB    00014*00227
RP       SFLG2    00014*00176 00289
DP 0000  SHFAD    00020 00029*
 P 0008  SHFAD0   00034*00036
 P 000E  SHFAD1   00031 00038*
 P 001B  SHFAD2   00045*00087
 P 0024  SHFAD3   00051*00058
 P 0051  SHFAD4   00065 00075*
 P 006A  SHFAD7   00078 00086*
DP 006F  SHFADA   00020 00090*
 P 0081  SHFADB   00095 00099*
 P 0085  SHFADC   00097 00101*00106 00109
 P 0086  SHFADD   00093 00103*
 P 0090  SHFADE   00104 00108*
 P 0094  SHFADF   00098 00100 00107 00110*
 P 003B  SHFADM   00064*00084
 P 0070  SHFADX   00053 00091*
R        SKIP     00009*00040 00062
 P 016C  SLFDV    00173 00236*
 P 017F  SLFDV0   00240 00245*
 P 0182  SLFDV1   00244 00247*
 P 01AD  SLFDV2   00261 00267*
 P 01C0  SLFDV3   00266 00275*
 P 01C4  SLFDV4   00255 00277*
R        SPD      00018*00046 00082 00291
DP 00D6  STLFD    00020 00160*
 P 00F9  STLFD1   00175*00187 00191
 P 00FE  STLFD2   00177*00224
 P 0116  STLFD3   00184 00189*
 P 011E  STLFD5   00179 00192*
 P 0155  STLFD6   00182 00200 00205 00211 00217*
 P 0169  STLFD7   00220 00227*
 P 013F  STLFDA   00194 00207*
RP       STLFDB   00014*00189
RP       SUB16    00014*00243
R        T6       00018*00120 00145 00168 00183 00186
R        T7       00018*00131
R        T8       00018*00129 00137 00172 00197 00207 00209
RB       TAAC     00010*00247 00248 00264 00265 00271 00272
RB       TDC      00010*00280 00281
R        TE       00018*00149 00223
RB       TEMP3    00010*00268 00269
RB       TSAA     00010*00251 00252 00275 00276
RB       TSK      00010*00063 00077 00080
DP 0096  UAATRT   00020 00119*00150
 P 00BC  UATRT1   00130 00136*
 P 00C0  UATRT2   00126 00128 00134 00139*
 P 00C3  UATRT3   00121 00144*
 P 00CC  UATRT4   00141 00147*
RP       UFE      00014*00119 00217

00001                         NAM   F14V3
00002                         OPT   REL, CREF, LLEN=80
00003                         TTL   FLOW PAGES 14V3 THRU 14V5
00004                         IDNT  FEB. 15, 1978
```

```
00006                              XREF    BSCT:BB, BP, CF, CM, FEW4, FR2, K8, LD, TAAC, TSAA

00008                              XREF    PSCT:CFLG2, OFFX, PNTATT
00009                              XREF    PSCT:SCRL1C, SDSAD, SFLG2, SHFADA

00011                              XREF    ASBF, ASBT, BR, CBL
00012                              XREF    FEAD0, FEAD8, NATT, NBTT, NX
00013                              XREF    OBL, OBLSP, OUNBL
00014                              XREF    RATT, SPD

00016                              XDEF    STLFDB, STLDB9, STLDBF, DLFAAT, SDSDB 00018P 0000                        PSCT
00020                        *
00021                        * STLFDB - STORE A LOW FREQUENCY DIGITAL
00022                        *           DISPLAY BIT
00023                        *
00024                        * FLOW PAGE 14V3
00025                        *
00026P 0000 B6 0000  A STLFDB LDAA    CBL
00027P 0003 81 C6    A        CMPA    #198         IS CBL > 198?
00028P 0005 23 1C 0023        BLS     STLDB0       IF NOT...BRANCH
00029P 0007 96 00    A        LDAA    LD
00030P 0009 BD 0000  A        JSR     PNTATT       POINT TO TRACE(LD) ATTRIBUTES
00031P 000C E6 00    A        LDAB    OBLSP,X      GET BLSP(LD)
00032P 000E 54                LSRB
00033P 000F 54                LSRB
00034P 0010 54                LSRB
00035P 0011 54                LSRB                 GET BIT LOCATION
00036P 0012 C0 08    A        SUBB    #8
00037P 0014 F7 0000  A        STAB    NBTT         NBTT = BLSP(LD) BITS 7-4 - 8
00038P 0017 7F 0000  A        CLR     NATT         NATT = 0
00039P 001A 7F 0000  A        CLR     CBL          CBL = 0
00040P 001D 86 FF    A        LDAA    #$FF         1'S COMPLEMENT OF 0
00041P 001F A7 00    A        STAA    OUNBL,X      UNBL(LD) = 1'S COMPLEMENT OF 0
00042P 0021 A7 00    A        STAA    OBL,X        BL(LD) = 1'S COMPLEMENT OF 0
00043P 0023 96 00    A STLDB0 LDAA    CF
00044P 0025 8B 14    A        ADDA    #20
00045P 0027 97 00    A        STAA    CF           CF = CF+20
00046P 0029 F6 0007  A        LDAB    FEAD8+7
00047P 002C C4 80    A        ANDB    #%10000000   IS (FEAD15) BIT 7 = 1?
00048P 002E 27 04 0034        BEQ     STLDB1       IF NOT...BRANCH
00049P 0030 86 00    A        LDAA    #ASBF        ASBF = 0
00050P 0032 20 02 0036        BRA     STLDB2
00051P 0034 86 00    A STLDB1 LDAA    #ASBT        ASBT = 0
00052P 0036 BD 0000  A STLDB2 JSR     CFLG2
00053P 0039 7D 0000  A        TST     CF           IS CF > 0?
00054P 003C 2F 4B 0089        BLE     STLDB8       IF NOT...BRANCH
00055P 003E CE 0000  A        LDX     #NBTT        DETERMINE VALUE OF NEXT
00056P 0041 8D 47 008A        BSR     STLDB9       DISPLAY BIT
00057P 0043 B6 0000  A STLDB3 LDAA    NATT
00058P 0046 FE 0000  A        LDX     RATT
00059P 0049 BD 0000  A        JSR     OFFX         INDEX REG = RATT+NATT
00060P 004C B6 0000  A STLDB4 LDAA    NBTT         DETERMINE BIT TO CHANGE
00061P 004F 8D 64 00B5        BSR     STLDBF       AND CHANGE IT
00062P 0051 7C 0000  A        INC     CBL          CBL = CBL+1
00063P 0054 96 00    A        LDAA    CF
00064P 0056 B0 0000  A        SUBA    SPD
00065P 0059 97 00    A        STAA    CF           CF = CF-SPD
00066P 005B 2F 0B 0068        BLE     STLDB5       BRANCH IF CF NOT > 0
00067P 005D F6 0000  A        LDAB    NBTT
00068P 0060 54                LSRB                 IS NBTT BIT 0 = 0?
00069P 0061 24 05 0068        BCC     STLDB5       IF YES...BRANCH
00070P 0063 7A 0000  A        DEC     NBTT         NBTT = NBTT-1
00071P 0066 20 E4 004C        BRA     STLDB4
00072P 0068 7D 0000  A STLDB5 TST     NBTT         IS NBTT = 0?
00073P 006B 27 05 0072        BEQ     STLDB6       IF YES...BRANCH
00074P 006D 7A 0000  A        DEC     NBTT         NBTT = NBTT-1
00075P 0070 20 08 007A        BRA     STLDB7
00076P 0072 7C 0000  A STLDB6 INC     NATT         NATT = NATT+1
00077P 0075 86 07    A        LDAA    #7
```

```
00078P 0077 B7 0000  A           STAA     NBTT         NBTT = 7
00079P 007A 96 00    A STLDB7    LDAA     LD
00080P 007C BD 0000  A           JSR      PNTATT       POINT TO TRACE(LD) ATTRIBUTES
00081P 007F B6 0000  A           LDAA     CBL
00082P 0082 43                   COMA
00083P 0083 A7 00    A           STAA     OBL,X        BL(LD) = 1'S COMPLEMENT CBL
00084P 0085 96 00    A           LDAA     CF           IS CF > 0?
00085P 0087 2E BA 0043           BGT      STLDB3       IF YES...BRANCH 00087P 0089 39          STLDB8   RTS 00089P 008A 96 00    A STLDB9    LDAA     FR2
00090P 008C 85 00    A           BITA     #ASBT        IS ASBT = 1?
00091P 008E 26 0F 009F           BNE      STLDBA       IF YES...BRANCH
00092P 0090 85 00    A           BITA     #ASBF        IS ASBF = 1?
00093P 0092 26 14 00A8           BNE      STLDBC       IF YES...BRANCH
00094P 0094 84 00    A           ANDA     #NX
00095P 0096 97 00    A           STAA     BB           B = NX
00096P 0098 E6 00    A           LDAB     0,X
00097P 009A 54                   LSRB                  IS BIT 0 = 1?
00098P 009B 25 0E 00AB           BCS      STLDBD       IF YES...BRANCH
00099P 009D 20 02 00A1           BRA      STLDBB
00100P 009F 97 00    A STLDBA    STAA     BB           B = 1 (IE. B NOT = 0)
00101P 00A1 86 00    A STLDBB    LDAA     #NX
00102P 00A3 BD 0000  A           JSR      CFLG2        NX = 0
00103P 00A6 20 08 00B0           BRA      STLDBE
00104P 00A8 7F 0000  A STLDBC    CLR      BB           B = 0
00105P 00AB 86 00    A STLDBD    LDAA     #NX
00106P 00AD BD 0000  A           JSR      SFLG2        NX = 1
00107P 00B0 86 00    A STLDBE    LDAA     #ASBT+ASBF
00108P 00B2 7E 0000  A           JMP      SFLG2        ASBT = 1, ASBF = 1, EXIT 00110P 00B5 4C          STLDBF   INCA                  ACCA = BIT POINTER
00111P 00B6 5F                   CLRB
00112P 00B7 0D                   SEC
00113P 00B8 59          STLDBG   ROLB                  PLACE BIT IN POSITION
00114P 00B9 4A                   DECA                  SPECIFIED BY ACCA
00115P 00BA 26 FC 00B8           BNE      STLDBG
00116P 00BC 7D 0000  A           TST      BB           IS B = 1?
00117P 00BF 27 04 00C5           BEQ      STLDBH       IF NOT...BRANCH
00118P 00C1 EA 00    A           ORAB     0,X          TURN ON SPECIFIED BIT
00119P 00C3 20 03 00C8           BRA      STLDBI
00120P 00C5 53          STLDBH   COMB                  1'S COMPLEMENT
00121P 00C6 E4 00    A           ANDB     0,X          TURN OFF SPECIFIED BIT
00122P 00C8 E7 00    A STLDBI    STAB     0,X          REPLACE BYTE
00123P 00CA 39                   RTS
00125
00126                   * DLFAAT - DURING LOW FREQUENCY DIGITAL DISPLAY,
00127                   *          ARM OR AUTO TRIGGER?
00128                   *
00129                   * FLOW PAGE 14V4
00130                   *
00131P 00CB D6 00    A DLFAAT    LDAB     FEW4         ACCB = FEW4
00132P 00CD DE 00    A           LDX      TSAA
00133P 00CF 09                   DEX
00134P 00D0 DF 00    A           STX      TSAA         TSAA = TSAA-1
00135P 00D2 2E 18 00EC           BGT      DLFAT0       BRANCH IF TSAA > 0
00136P 00D4 CE 2710              LDX      #10000
00137P 00D7 DF 00    A           STX      TSAA         TSAA = 10000
00138P 00D9 96 00    A           LDAA     K8
00139P 00DB 81 01    A           CMPA     #1
00140P 00DD 27 0D 00EC           BEQ      DLFAT0       BRANCH IF K8 = 1
00141P 00DF 81 05    A           CMPA     #5
00142P 00E1 27 09 00EC           BEQ      DLFAT0       BRANCH IF K8 = 5
00143P 00E3 17                   TBA
00144P 00E4 8B 10    A           ADDA     #$10
00145P 00E6 B7 0004  A           STAA     FEAD0+4      (FEAD4) = FEW4+10 HEX
00146P 00E9 F7 0004  A           STAB     FEAD0+4      (FEAD4) = FEW4
00147P 00EC DE 00    A DLFAT0    LDX      TAAC
00148P 00EE 09                   DEX
```

```
00149P 00EF DF 00    A           STX    TAAC     TAAC = TAAC-1
00150P 00F1 2E 08 00FB           BGT    DLFAT1   BRANCH IF TAAC > 0
00151P 00F3 F7 0004  A           STAB   FEAD0+4  (FEAD4) = FEW4
00152P 00F6 CE 2710  A           LDX    #10000
00153P 00F9 DF 00    A           STX    TAAC     TAAC = 10000
00154P 00FB 39           DLFAT1  RTS
00156                        *
00157                        * SDSDB - SET DIGITAL STORAGE & DISPLAY BITS
00158                        *
00159                        * FLOW PAGE 14V5
00160                        *
00161P 00FC DE 00    A   SDSDB   LDX    CM
00162P 00FE 7F 0007  A   SDSDB0  CLR    FEAD0+7  (FEAD7) = 0
00163P 0101 09                   DEX             CM = CM-1
00164P 0102 26 FA 00FE           BNE    SDSDB0   LOOP UNTIL CM = 0
00165P 0104 DF 00    A           STX    CM       SET CM = 0
00166P 0106 7F 0000  A           CLR    BP       BP = 0
00167P 0109 86 07    A   SDSDB1  LDAA   #7
00168P 010B B7 0000  A           STAA   BR       BR = 7
00169P 010E 7F 0007  A   SDSDB2  CLR    FEAD0+7  (FEAD7) = 0
00170P 0111 BD 0000  A           JSR    SHFADA   SET BIT FOR DISPLAY
00171P 0114 49                   ROLA            SET VALUE OF "DIW"
00172P 0115 7D 0000  A           TST    BR       IS BR = 0?
00173P 0118 27 05 011F           BEQ    SDSDB3   IF YES...BRANCH
00174P 011A 7A 0000  A           DEC    BR       BR = BR-1
00175P 011D 20 EF 010E           BRA    SDSDB2
00176P 011F 36           SDSDB3  PSHA            SAVE ACCA
00177P 0120 96 00    A           LDAA   LD       POINT TO "INDEX"
00178P 0122 BD 0000  A           JSR    SCRL1C   INDEX REG = BADS(LD)
00179P 0125 96 00    A           LDAA   BP
00180P 0127 BD 0000  A           JSR    OFFX     INDEX REG = BADS(LD)+BP
00181P 012A 32                   PULA            RETRIEVE "DIW"
00182P 012B A7 00    A           STAA   0,X      (BADS(LD)+BP) = "DIW"
00183P 012D 7C 0000  A           INC    BP       BP = BP+1
00184P 0130 96 00    A           LDAA   BP
00185P 0132 81 7D    A           CMPA   #125     IS BP = 125?
00186P 0134 26 D3 0109           BNE    SDSDB1   IF NOT...BRANCH
00187P 0136 7E 0000  A           JMP    SDSAD    SET DIGITAL STORAGE
00188                        *                   ATTRIBUTES, THEN DISPLAY
00189                        *                   AND EXIT
00191P 0139    00    A           FCB    0        CRC BYTE
00192                            END
TOTAL ERRORS 00000

R       ASBF    00011*00049 00092 00107
R       ASBT    00011*00051 00090 00107
RB      BB      00006*00095 00100 00104 00116
RB      BP      00006*00166 00179 00183 00184
R       BR      00011*00168 00172 00174
R       CBL     00011*00026 00039 00062 00081
RB      CF      00006*00043 00045 00053 00063 00065 00084
RP      CFLG2   00008*00052 00102
RB      CM      00006*00161 00165
DP 00CB DLFAAT  00016 00131*
 P 00EC DLFAT0  00135 00140 00142 00147*
 P 00FB DLFAT1  00150 00154*
R       FEAD0   00012*00145 00146 00151 00162 00169
R       FEAD8   00012*00046
RB      FEW4    00006*00131
RB      FR2     00006*00089
RB      K2      00006*00138
RB      LD      00006*00029 00079 00177
R       NATT    00012*00038 00057 00076
R       NBTT    00012*00037 00055 00060 00067 00070 00072 00074 00078
R       NX      00012*00094 00101 00105
R       OBL     00013*00042 00083
R       OBLSP   00013*00031
RP      OFFX    00008*00059 00180
R       OUNBL   00013*00041
RP      PNTATT  00008*00030 00080
R       RATT    00014*00058
RP      SCRL1C  00009*00178
```

```
RP         SDSAD    00009*00187
DP 00FC    SDSDB    00016 00161*
 P 00FE    SDSDB0   00162*00164
 P 0109    SDSDB1   00167*00186
 P 010E    SDSDB2   00169*00175
 P 011F    SDSDB3   00173 00176*
RP         SFLG2    00009*00106 00108
RP         SHFADA   00009*00170
R          SPD      00014*00064
 P 0023    STLDB0   00028 00043*
 P 0034    STLDB1   00048 00051*
 P 0036    STLDB2   00050 00052*
 P 0043    STLDB3   00057*00085
 P 004C    STLDB4   00060*00071
 P 0068    STLDB5   00066 00069 00072*
 P 0072    STLDB6   00073 00076*
 P 007A    STLDB7   00075 00079*
 P 0089    STLDB8   00054 00087*
DP 008A    STLDB9   00016 00056 00089*
 P 009F    STLDBA   00091 00100*
 P 00A1    STLDBB   00099 00101*
 P 00A8    STLDBC   00093 00104*
 P 00AB    STLDBD   00098 00105*
 P 00B0    STLDBE   00103 00107*
DP 00B5    STLDBF   00016 00061 00110*
 P 00B8    STLDBG   00113*00115
 P 00C5    STLDBH   00117 00120*
 P 00C8    STLDBI   00119 00122*
DP 0000    STLFDB   00016 00026*
RB         TAAC     00006*00147 00149 00153
RB         TSAA     00006*00132 00134 00137

00001                       NAM    F14V6
00002                       OPT    REL, CREF, LLEN=80
00003                       TTL    FLOW PAGES 14V6 THRU 14W2
00004                       IDNT   FEB.   17, 1978

00006                       XREF   BSCT:DCOMP, FEW4, FR1, H
00007                       XREF   BSCT:K15, K16, K2, K3, K4, K5, K6, K7, K8
00008                       XREF   BSCT:LD, LI, M1, N
00009                       XREF   BSCT:SH, T1, T5, TDC, TEMP, TEMP3

00011                       XREF   PSCT:CBLOCK, COMP16, DSTLD1
00012                       XREF   PSCT:EINT15, ENTIDX, ENTPV2, FLPDIV, FLPMLT
00013                       XREF   PSCT:SBTR9, SCRL1C, SDSDB, SINT15
00014                       XREF   PSCT:SPFLED, UAATRT

00016                       XREF   BA9S, BL7, BL9, DW6, DW7, DW8, FEAD0
00017                       XREF   JL10FS, JL20FS, JL30FS, JL40FS, JL50FS
00018                       XREF   JL60FS, JL70FS, JL80FS, JL90FS, JLAOFS
00019                       XREF   T6, T7, T8, TE

00021                       XDEF   SDSAD, SHFDV, STHFD, SST9

00023P 0000                 PSCT
00025                    *
00026                    * SDSAD - SET DIGITAL STORAGE ATTRIBUTES,
00027                    *         THEN DISPLAY
00028                    *
00029                    * FLOW PAGE 14V6
00030                    *
00031P 0000 96 00     A SDSAD   LDAA   M1
00032P 0002 81 03     A         CMPA   #3        IS M1 = 3? (IE. PRGM MODE?)
00033P 0004 26 07 000D          BNE    SDSAD3    IF NOT... BRANCH
00034P 0006 C6 10     A         LDAB   #16
00035P 0008 F7 0000   A         STAB   DW8       DW(8),1 = "P"
00036P 000B 20 20 002D          BRA    SDSAD0
00037P 000D 81 06     A SDSAD3  CMPA   #6        IS M1 = 6? (IE. AUTOSCOPE?)
00038P 000F 26 0C 001D          BNE    SDSAD4    IF NOT... BRANCH
```

```
00039P 0011 86 0B       A            LDAA   #11
00040P 0013 B7 0000     A            STAA   DW7        DW(7),1 = "A"
00041P 0016 86 FF       A            LDAA   #255-0
00042P 0018 B7 0000     A            STAA   BL9        BL(9) = 1'S COMPLEMENT OF 0
00043P 001B 20 10 002D               BRA    SDSAD0
00044P 001D 81 05       A  SDSAD4    CMPA   #5         IS M1 = 5? (IE. MIXED MODE?)
00045P 001F 26 07 0028               BNE    SDSAD5     IF NOT...BRANCH
00046P 0021 C6 1F       A            LDAB   #31
00047P 0023 F7 0000     A            STAB   DW6        DW(6),1 = "X"
00048P 0026 20 05 002D               BRA    SDSAD0
00049P 0028 C6 12       A  SDSAD5    LDAB   #18
00050P 002A F7 0000     A            STAB   DW8        DW(8),1 = "S"
00051P 002D 96 00       A  SDSAD0    LDAA   LD
00052P 002F BD 0000     A            JSR    SCRL1C     GET POINTER TO J(LD)
00053P 0032 6F 00       A            CLR    JL1OFS,X   J(LD,1) = 0
00054P 0034 96 00       A            LDAA   K2
00055P 0036 A7 00       A            STAA   JL2OFS,X   J(LD,2) = K2
00056P 0038 96 00       A            LDAA   K3
00057P 003A D6 01       A            LDAB   K3+1
00058P 003C A7 00       A            STAA   JL3OFS,X
00059P 003E E7 01       A            STAB   JL3OFS+1,X J(LD,3) = K3
00060P 0040 96 00       A            LDAA   K4
00061P 0042 D6 01       A            LDAB   K4+1
00062P 0044 A7 00       A            STAA   JL4OFS,X
00063P 0046 E7 01       A            STAB   JL4OFS+1,X J(LD,4) = K4
00064P 0048 96 00       A            LDAA   K5
00065P 004A D6 01       A            LDAB   K5+1
00066P 004C A7 00       A            STAA   JL5OFS,X
00067P 004E E7 01       A            STAB   JL5OFS+1,X J(LD,5) = K5
00068P 0050 96 00       A            LDAA   K6
00069P 0052 A7 00       A            STAA   JL6OFS,X   J(LD,6) = K6
00070P 0054 96 00       A            LDAA   K7
00071P 0056 D6 01       A            LDAB   K7+1
00072P 0058 A7 00       A            STAA   JL7OFS,X
00073P 005A E7 01       A            STAB   JL7OFS+1,X J(LD,7) = K7
00074P 005C 96 00       A            LDAA   K8
00075P 005E A7 00       A            STAA   JL8OFS,X   J(LD,8) = K8
00076P 0060 96 00       A            LDAA   DCOMP
00077P 0062 A7 00       A            STAA   JL9OFS,X   J(LD,9) = DCOMP
00078P 0064 96 00       A            LDAA   K15
00079P 0066 D6 01       A            LDAB   K15+1
00080P 0068 A7 00       A            STAA   JLAOFS,X
00081P 006A E7 01       A            STAB   JLAOFS+1,X J(LD,10) = K15
00082P 006C 86 16       A            LDAA   #22
00083P 006E 97 00       A            STAA   T1         T1 = 22
00084P 0070 7F 0000     A            CLR    SH         SH = 0
00085P 0073 96 00       A            LDAA   LD
00086P 0075 97 00       A            STAA   LI         LI = LD
00087P 0077 BD 0000     A  SDSAD1    JSR    DSTLD1     DISPLAY AND/OR SHIFT
00088                               *                  TRACE(LD) SHEET 1
00089P 007A 86 07       A            LDAA   #7
00090P 007C 91 00       A            CMPA   LD         IS LD = 7?
00091P 007E 26 13 0093               BNE    SDSAD2     IF NOT...BRANCH
00092P 0080 86 09       A            LDAA   #9
00093P 0082 91 00       A            CMPA   LI         IS LI = 9?
00094P 0084 27 0D 0093               BEQ    SDSAD2     IF YES...BRANCH
00095P 0086 F6 0000     A            LDAB   BL7
00096P 0089 C1 FF       A            CMPB   #255-0     IS BL(7) = 1'S COMPLEMENT OF 0?
00097P 008B 27 06 0093               BEQ    SDSAD2     IF YES...BRANCH
00098P 008D 97 00       A            STAA   LI         LI = 9
00099P 008F 8D 03 0094               BSR    SST9       SET STORAGE TRACE 9
00100P 0091 20 E4 0077               BRA    SDSAD1
00101P 0093 39             SDSAD2    RTS
00103                               *
00104                               * SST9 - SET STORAGE TRACE 9,
00105                               *        AND PASS/FAIL LED'S
00106                               *
00107                               * FLOW PAGE 14V7
00108                               *
00109P 0094 B6 0000     A  SST9      LDAA   DW8
00110P 0097 81 11       A            CMPA   #17        IS DW(8),1 = "R"?
00111P 0099 26 0C 00A7               BNE    SST9A      IF NOT...BRANCH
00112P 009B B6 0000     A            LDAA   DW7
00113P 009E 81 0B       A            CMPA   #11        IS DW(7),1 = "A"?
00114P 00A0 26 05 00A7               BNE    SST9A      IF NOT...BRANCH
```

```
00116P 00A2 BD 0000  A           JSR     SBTR9       SET THE 1000 STORAGE BITS
00117                         *                       OF TRACE 9
00118P 00A5 20 0B 00B2          BRA     SST9B 00120P 00A7 CE 007D  A  SST9A   LDX     #BA9S+125
00121P 00AA DF 00    A           STX     TEMP
00122P 00AC CE 0000  A           LDX     #BA9S
00123P 00AF BD 0000  A           JSR     CBLOCK      (BA9S) THRU (BA9S+124) = 0

00125P 00B2 7E 0000  A  SST9B   JMP     SPFLED      SET PASS/FAIL LED'S
00126                         *                       ... AND EXIT

00128                         *
00129                         * STHFD - STORE HIGH FREQUENCY DIGITAL TRACE
00130                         *          AND SET DISPLAY BITS
00131                         *
00132                         * FLOW PAGE 14W1
00133                         *
00134P 00B5 BD 00E5  P  STHFD   JSR     SHFDV       SET HIGH FREQUENCY TRACE
00135                         *                       VARIABLES
00136P 00B8 86 06    A           LDAA    #6
00137P 00BA 97 00    A           STAA    N           N = 6
00138P 00BC 96 00    A           LDAA    FEW4
00139P 00BE 8B 08    A           ADDA    #8
00140P 00C0 B7 0004  A           STAA    FEAD0+4     (FEAD4) = FEW4+8
00141P 00C3 96 00    A           LDAA    TDC
00142P 00C5 D6 01    A           LDAB    TDC+1
00143P 00C7 F7 0005  A           STAB    FEAD0+5     (FEAD5) = TDC BITS 7-0
00144P 00CA B7 0006  A           STAA    FEAD0+6     (FEAD6) = TDC BITS 15-8
00145P 00CD DE 00    A           LDX     T5
00146P 00CF FF 0000  A           STX     T6          T6 = T5
00147P 00D2 FE 0000  A           LDX     T7
00148P 00D5 FF 0000  A           STX     T8          T8 = T7
00149P 00D8 BD 0000  A           JSR     UAATRT      UPDATE, ARM, AUTO-TRIGGER,
00150                         *                       RETURN ON EOS
00151P 00DB 96 00    A           LDAA    FR1
00152P 00DD 85 00    A           BITA    #TE         IS TE = 0?
00153P 00DF 27 03 00E4          BEQ     STHFD1      IF YES...BRANCH
00154P 00E1 7E 0000  A           JMP     SDSDB       SET DIGITAL STORAGE
00155                         *                       AND DISPLAY BITS ... AND EXIT
00156P 00E4 39              STHFD1 RTS              ... EXIT
00158                         *
00159                         * SHFDV - SET HIGH FREQUENCY TRACE VARIABLES
00160                         *
00161                         * FLOW PAGE 14W2
00162                         *
00163P 00E5 86 03    A  SHFDV   LDAA    #$03
00164P 00E7 C6 E7    A           LDAB    #$E7        ACCA,ACCB = 999
00165P 00E9 CE 0000  A           LDX     #K16
00166P 00EC BD 0000  A           JSR     COMP16      IS 999 < K16?
00167P 00EF 2D 30 0121          BLT     SHFDV0      IF YES...BRANCH
00168P 00F1 5C                   INCB                ACCA,ACCB = 1000
00169P 00F2 D0 01    A           SUBB    K16+1
00170P 00F4 92 00    A           SBCA    K16         ACCA,ACCB = 1000-K16
00171P 00F6 97 00    A           STAA    TEMP3
00172P 00F8 D7 01    A           STAB    TEMP3+1
00173P 00FA CE 0000  A           LDX     #TEMP3
00174P 00FD BD 0000  A           JSR     EINT15      ENTER 1000-K16
00175P 0100 CE 12C0  A           LDX     #4800
00176P 0103 BD 0000  A           JSR     ENTIDX      ENTER 4,800
00177P 0106 BD 0000  A           JSR     FLPMLT      MULTIPLY
00178P 0109 CE 0000  A           LDX     #K15
00179P 010C BD 0000  A           JSR     ENTPV2      ENTER K15
00180P 010F BD 0000  A           JSR     FLPDIV      DIVIDE
00181P 0112 CE 0000  A           LDX     #TEMP3
00182P 0115 BD 0000  A           JSR     SINT15      STORE RESULT
00183P 0118 4F                   CLRA
00184P 0119 C6 1E   A           LDAB    #30         ADD 30 TO RESULT
00185P 011B DB 01   A           ADDB    TEMP3+1
00186P 011D 99 00   A           ADCA    TEMP3       T5 = INT((1000-K16)*10000/K15)+30
00187P 011F 20 03 0124          BRA     SHFDV1
00188P 0121 4F              SHFDV0 CLRA
```

```
00189P 0122 C6 1E       A           LDAB    #30         T5 = 30
00190P 0124 97 00       A   SHFDV1  STAA    T5
00191P 0126 D7 01       A           STAB    T5+1
00192P 0128 96 00       A           LDAA    K8
00193P 012A 81 03       A           CMPA    #3          IS K8 = 3?
00194P 012C 27 0A 0138              BEQ     SHFDV2      IF YES...BRANCH 00196P 012E 86 07       A           LDAA    #$07
00197P 0130 C6 D0       A           LDAB    #$D0        ACCA, ACCB = 2000
00198P 0132 DB 01       A           ADDB    T5+1
00199P 0134 99 00       A           ADCA    T5          T6 = 2000+T5
00200P 0136 20 02 013A              BRA     SHFDV3

00202P 0138 4F              SHFDV2  CLRA
00203P 0139 5F                      CLRB                T7 = 0
00204P 013A B7 0000     A   SHFDV3  STAA    T7
00205P 013D F7 0001     A           STAB    T7+1
00206P 0140 86 01       A           LDAA    #1
00207P 0142 97 00       A           STAA    H           H = 1
00208P 0144 39                      RTS
00210P 0145    00       A           FCB     0           CRC BYTE
00211                               END
TOTAL ERRORS 00000

R       BA9S    00016*00120 00122
R       BL7     00016*00095
R       BL9     00016*00042
RP      CBLOCK  00011*00123
RP      COMP16  00011*00166
RB      DCOMP   00006*00076
RP      DSTLD1  00011*00087
R       DW6     00016*00047
R       DW7     00016*00040 00112
R       DW8     00016*00035 00050 00109
RP      EINT15  00012*00174
RP      ENTIDX  00012*00176
RP      ENTPV2  00012*00179
R       FEAD0   00016*00140 00143 00144
RB      FEW4    00006*00138
RP      FLPDIV  00012*00180
RP      FLPMLT  00012*00177
RB      FR1     00006*00151
RB      H       00006*00207
R       JL1OFS  00017*00053
R       JL2OFS  00017*00055
R       JL3OFS  00017*00058 00059
R       JL4OFS  00017*00062 00063
R       JL5OFS  00017*00066 00067
R       JL6OFS  00018*00069
R       JL7OFS  00018*00072 00073
R       JL8OFS  00018*00075
R       JL9OFS  00018*00077
R       JLAOFS  00018*00080 00081
RB      K15     00007*00078 00079 00178
RB      K16     00007*00165 00169 00170
RB      K2      00007*00054
RB      K3      00007*00056 00057
RB      K4      00007*00060 00061
RB      K5      00007*00064 00065
RB      K6      00007*00068
RB      K7      00007*00070 00071
RB      K8      00007*00074 00192
RB      LD      00008*00051 00085 00090
RB      LI      00008*00086 00093 00098
RB      M1      00008*00031
RB      N       00008*00137
RP      SBTR9   00013*00116
RP      SCRL1C  00013*00052
DP 0000 SDSAD   00021 00031*
 P 002D SDSAD0  00036 00043 00048 00051*
 P 0077 SDSAD1  00087*00100
 P 0093 SDSAD2  00091 00094 00097 00101*
```

```
  P 000D  SDSAD3  00033 00037*
  P 001D  SDSAD4  00038 00044*
  P 0028  SDSAD5  00045 00049*
 RP       SDSDB   00013*00154
 RB       SH      00009*00084
 DP 00E5  SHFDV   00021 00134 00163*
  P 0121  SHFDV0  00167 00188*
  P 0124  SHFDV1  00187 00190*
  P 0138  SHFDV2  00194 00202*
  P 013A  SHFDV3  00200 00204*
 RP       SINT15  00013*00182
 RP       SPFLED  00014*00125
 DP 0094  SST9    00021 00099 00109*
  P 00A7  SST9A   00111 00114 00120*
  P 00B2  SST9B   00118 00125*
 DP 00B5  STHFD   00021 00134*
  P 00E4  STHFD1  00153 00156*
 RB       T1      00009*00083
 RB       T5      00009*00145 00190 00191 00198 00199
 R        T6      00019*00146
 R        T7      00019*00147 00204 00205
 R        T8      00019*00148
 RB       TDC     00009*00141 00142
 R        TE      00019*00152
 RB       TEMP    00009*00121
 RB       TEMP3   00009*00171 00172 00173 00181 00185 00186
 RP       UARTRT  00014*00149

00001                          NAM    F15A
00002                          OPT    REL,CREF,LLEN=80
00003                          TTL    FLOW PAGES 15A THRU 15C
00004                          IDNT   FEB.   22, 1978

00006                          XREF   BSCT:AW,BADS8,DCOMP,FR1,FR4,K15,K4,M1
00007                          XREF   BSCT:T1,TEMP,TEMP2,TEMP3,TVAR1

00009                          XREF   PSCT:ARSMDW
00010                          XREF   PSCT:CFLG1,CLITE1,COMP16,COMPXY,CRTT9
00011                          XREF   PSCT:DETK15,DROP,DT1MS,EEXP10,EINT15
00012                          XREF   PSCT:ENTER,ENTIDX,ENTIMM,ENTINT,ENTPV2
00013                          XREF   PSCT:FLPDIV,FLPMLT,FNAFRF,MOVBLK
00014                          XREF   PSCT:OFFX,READSR,SETAW,SLITE1,SST9

00016                          XREF   DW7,DW8,FAIL,FAS,J15,JL20FS,JL40FS
00017                          XREF   MAXMIS,MDW,NEWAL,PASS,PFF,TOTMA

00019                          XDEF   DCSMDW,SCACFA,SPFLED 00021P 0000                    PSCT
00023                       *
00024                       * SCACFA - SCAN AC & FA CONTROLS
00025                       *
00026                       * FLOW PAGE 15A
00027                       *
00028P 0000 86 16       A SCACFA LDAA  #22
00029P 0002 97 00       A        STAA  T1         T1 = 22
00030P 0004 BD 0000     A SCACFA0 JSR  READSR     READ SWITCH REGISTERS
00031P 0007 D6 00       A        LDAB  DCOMP
00032P 0009 81 28       A        CMPA  #$28       IS "DATA COMPARE .1 DIV" PRESSED?
00033P 000B 26 09 0016  A        BNE   SACFA1     IF NOT...BRANCH
00034P 000D C1 02       A        CMPB  #2         IS DCOMP = 2?
00035P 000F 27 3F 0050  A        BEQ   SACFA7     IF YES...BRANCH
00036P 0011 7A 0000     A        DEC   DCOMP      DCOMP = DCOMP-1
00037P 0014 20 0B 0021  A        BRA   SACFA2

00039P 0016 81 27       A SACFA1 CMPA  #$27       IS "DATA COMPARE OFF" PRESSED?
00040P 0018 26 23 003D  A        BNE   SACFA4     IF NOT...BRANCH
00041P 001A C1 31       A        CMPB  #49        IS DCOMP > 49?
00042P 001C 22 0D 002B  A        BHI   SACFA3     IF YES...BRANCH
```

```
00043P 001E 7C 0000  A          INC   DCOMP     DCOMP = DCOMP+1
00044P 0021 8D 44 0067 SACFA2 BSR   DCSMDW    USE DCOMP TO SET MDW, 20-23
00045P 0023 BD 016A  P          JSR   SPFLED    SET PASS/FAIL LED'S
00046P 0026 BD 0000  A          JSR   DT1MS     DELAY T1 MSEC., THEN REDUCE T1
00047P 0029 20 D9 0004          BRA   SACFA0
00048P 002B C6 33    A SACFA3 LDAB  #51
00049P 002D D7 00    A          STAB  DCOMP     DCOMP = 51
00050P 002F CE 0000  A          LDX   #MDW
00051P 0032 6F 13    A          CLR   19,X
00052P 0034 6F 14    A          CLR   20,X
00053P 0036 6F 15    A          CLR   21,X
00054P 0038 6F 16    A          CLR   22,X      MDW, 20-23 = "    "
00055P 003A 7E 016A  P          JMP   SPFLED    SET PASS/FAIL LEDS
00056                      *                    ... AND EXIT 00058P 003D D6 00    A SACFA4 LDAB  M1
00059P 003F C1 06    A          CMPB  #6        IS M1 = 6? (IE. AUTOSCOPE?)
00060P 0041 26 0D 0050          BNE   SACFA7    IF NOT... BRANCH
00061P 0043 81 26    A          CMPA  #$26      IS "DATA ALIGN AF/RF" PRESSED?
00062P 0045 26 0A 0051          BNE   SACFA5    IF NOT... BRANCH
00063P 0047 BD 0000  A          JSR   FNAFRF    FIND NEW AF/RF IF POSSIBLE
00064P 004A 96 00    A          LDAA  FR4
00065P 004C 85 00    A          BITA  #NEWAL    IS NEWAL = 1?
00066P 004E 26 0E 005E          BNE   SACFA6    IF YES... BRANCH 00068P 0050 39          SACFA7 RTS             ... EXIT 00070P 0051 81 25    A SACFA5 CMPA  #$25      IS "DATA ALIGN OFF" PRESSED?
00071P 0053 26 FB 0050          BNE   SACFA7    IF NOT... BRANCH
00072P 0055 86 00    A          LDAA  #FAS
00073P 0057 95 00    A          BITA  FR1       IS FAS = 0?
00074P 0059 27 F5 0050          BEQ   SACFA7    IF YES... BRANCH
00075P 005B BD 0000  A          JSR   CFLG1     FAS = 0
00076P 005E BD 0000  A SACFA6 JSR   ARSMDW    USE AF/RF TO SET MDW, 13-17
00077P 0061 BD 0000  A          JSR   SST9      SET STORAGE TRACE 9,
00078                      *                    PASS/FAIL LED'S
00079P 0064 7E 0000  A          JMP   CRTT9     CHANGE "R" TRACES & TRACE 9
00080                      *                    ... AND EXIT
00082                      *
00083                      * DCSMDW - USE DCOMP TO SET MDW, 20-23
00084                      *
00085                      * FLOW PAGE 15B
00086                      *
00087P 0067 7F 0012  A DCSMDW CLR   MDW+18    MDW, 19 = " "
00088P 006A 7F 0017  A          CLR   MDW+23    MDW, 24 = " "
00089P 006D 96 00    A          LDAA  DCOMP
00090P 006F 81 33    A          CMPA  #51       IS DCOMP = 51?
00091P 0071 26 08 007B          BNE   DCSMDX    IF NOT... BRANCH
00092P 0073 CE 0000  A          LDX   #MDW      POINT TO MDW
00093P 0076 4F                  CLRA            PUT A DTO " " IN ACCA
00094P 0077 A7 13    A          STAA  19,X      MDW, 20 = " "
00095P 0079 20 62 00DD          BRA   DCSMDY    GO DO MDW, 21-23

00097P 007B 96 00    A DCSMDX LDAA  M1
00098P 007D 81 03    A          CMPA  #3        IS M1 = 3? (IE. PRGM MODE?)
00099P 007F 27 06 0087          BEQ   DCSMDZ    IF YES... BRANCH
00100P 0081 DE 00    A          LDX   BADS8     GET POINTER TO TRACE 8
00101P 0083 6D 00    A          TST   JL20FS,X  IS J(8,2) = 0?
00102P 0085 26 1C 00A3          BNE   DCSMD5    IF NOT... BRANCH
00103P 0087 BD 0000  A DCSMDZ JSR   DETK15    DETERMINE K15
00104P 008A 4F                  CLRA
00105P 008B D6 00    A          LDAB  DCOMP 00107P 008D 58                  ASLB
00108P 008E 49                  ROLA            DCOMP*2

00110P 008F BD 0000  A          JSR   ENTINT    ENTER DCOMP*2
00111P 0092 CE 0000  A          LDX   #K4
00112P 0095 BD 0000  A          JSR   ENTPV2    ENTER K4
00113P 0098 CE 0000  A          LDX   #K15
00114P 009B BD 0000  A          JSR   ENTPV2    ENTER K15
00115P 009E BD 0000  A          JSR   FLPMLT    K4*K15
00116P 00A1 20 1E 00C1          BRA   DCSMD7
```

```
00118P 00A3 4F              DCSMD5 CLRA
00119P 00A4 D6 00    A             LDAB    DCOMP
00120P 00A6 58                     ASLB
00121P 00A7 49                     ROLA            DCOMP*2
00122P 00A8 97 00    A             STAA    TEMP3
00123P 00AA D7 01    A             STAB    TEMP3+1
00124P 00AC CE 0000  A             LDX     #TEMP3
00125P 00AF BD 0000  A             JSR     EINT15  ENTER DCOMP*2
00126P 00B2 CE 0000  A             LDX     #K4
00127P 00B5 BD 0000  A             JSR     ENTPV2  ENTER K4
00128P 00B8 CE 000E  A             LDX     #J15+14 POINT TO J15(8)
00129P 00BB BD 0000  A             JSR     ENTPV2  ENTER J15(8)
00130P 00BE BD 0000  A             JSR     FLPMLT  K4*J15(8)

00132P 00C1 BD 0000  A DCSMD7 JSR  FLPDIV  DIVIDE
00133P 00C4 CE 05FC  A             LDX     #$05FC  5*10**-4 IN PV2 NOTATION
00134P 00C7 DF 00    A             STX     TEMP3
00135P 00C9 CE 0000  A             LDX     #TEMP3
00136P 00CC BD 0000  A             JSR     ENTPV2  ENTER
00137P 00CF BD 0000  A             JSR     COMPXY  IS "WV7" < .0005?
00138P 00D2 2C 10 00E4             BGE     DCSMD0  IF NOT... BRANCH
00139P 00D4 CE 0000  A             LDX     #MDW
00140P 00D7 86 1D    A             LDAA    #29     DTO "."
00141P 00D9 A7 13    A             STAA    19,X    MDW,20 = "."
00142P 00DB 86 0A    A             LDAA    #10     DTO "0"
00143P 00DD A7 14    A DCSMD4 STAA 20,X
00144P 00DF A7 15    A             STAA    21,X
00145P 00E1 A7 16    A             STAA    22,X    SET MDW,21-23
00146P 00E3 39                     RTS 00148P 00E4 BD 0000  A DCSMD0 JSR  DROP    DROP 5*10**-4
00149P 00E7 CE 0063  A             LDX     #99
00150P 00EA BD 0000  A             JSR     ENTIDX  ENTER 99
00151P 00ED BD 0000  A             JSR     COMPXY  IS "WV7" > 99?
00152P 00F0 2E 31 0123             BGT     DCSMD1  IF YES... BRANCH
00153P 00F2 BD 0000  A             JSR     DROP    DROP 99
00154P 00F5 4F                     CLRA
00155P 00F6 BD 0000  A             JSR     EEXP10  ENTER 1
00156P 00F9 BD 0000  A             JSR     COMPXY  IS "WV7" < 1?
00157P 00FC 2D 40 013E             BLT     DCSMD4  IF YES... BRANCH
00158P 00FE BD 0000  A             JSR     DROP    DROP 1
00159                  * THE "A" USED IN SUBROUTINE ON FLOW PAGE 3C
00160                  * IS ACTUALLY THE TOP (IE. MOST RECENTLY
00161                  * ENTERED) VALUE OF "PSTK".
00162P 0101 BD 0000  A             JSR     SETAW   AW, 1-6 = ABS(A)
00163                  *                           WHERE ABS(A) < 99.99
00164P 0104 CE 0000  A             LDX     #TVAR1  RESTORE "A"
00165P 0107 BD 0000  A             JSR     ENTER
00166P 010A 86 01    A             LDAA    #1
00167P 010C BD 0000  A             JSR     EEXP10  ENTER 10
00168P 010F BD 0000  A             JSR     COMPXY  IS "A" < 10?
00169P 0112 2C 1A 012E             BGE     DCSMD2  IF NOT... BRANCH
00170P 0114 CE 0013  A             LDX     #MDW+19 SET UP INFO
00171P 0117 DF 00    A             STX     TEMP    ... FOR MOVE
00172P 0119 CE 0006  A             LDX     #AW+6   ... MDW,20-23 = AW,3-6
00173P 011C DF 00    A             STX     TEMP2
00174P 011E CE 0002  A             LDX     #AW+2
00175P 0121 20 18 013B             BRA     DCSMD3

00177P 0123 CE 63CE  A DCSMD1 LDX  #$63CE
00178P 0126 86 07    A             LDAA    #$07
00179P 0128 BD 0000  A             JSR     ENTIMM  ENTER 99.9
00180P 012B BD 0000  A             JSR     SETAW   AW, 1-6 = ABS(A)
00181                  *                           WHERE ABS(A) < 99.99
00182                  *                           NOTE: THE "A" USED HERE
00183                  *                           IS ACTUALLY THE TOP (IE. MOST
00184                  *                           RECENTLY ENTERED) VALUE OF
00185                  *                           "PSTK"
00186P 012E CE 0013  A DCSMD2 LDX  #MDW+19 SET UP INFO
00187P 0131 DF 00    A             STX     TEMP    ... FOR MOVE
00188P 0133 CE 0005  A             LDX     #AW+5   ... MDW,20-23 = AW,2-5
00189P 0136 DF 00    A             STX     TEMP2
00190P 0138 CE 0001  A             LDX     #AW+1
00191P 013B 7E 0000  A DCSMD3 JMP  MOVBLK  MOVE ... AND EXIT
```

```
00193P 013E BD 0000  A DCSMD4 JSR    DROP         DROP 1
00194P 0141 86 02    A        LDAA   #2
00195P 0143 BD 0000  A        JSR    EEXP10       ENTER 100
00196P 0146 BD 0000  A        JSR    FLPMLT       COMPUTE 100*"WV7"
00197P 0149 BD 0000  A        JSR    SETAW        AW,1-6 = ABS(A)
00198                       *                     WHERE ABS(A) < 99.99
00199                       *                     NOTE: THE "A" USED HERE
00200                       *                     IS ACTUALLY THE TOP (IE.
00201                       *                     MOST RECENTLY ENTERED) VALUE
00202                       *                     OF "PSTK"
00203P 014C CE 0000  A        LDX    #MDW
00204P 014F 96 03    A        LDAA   AW+3
00205P 0151 A7 13    A        STAA   19,X         MDW,20 = AW,4
00206P 0153 96 01    A        LDAA   AW+1
00207P 0155 A7 14    A        STAA   20,X         MDW,21 = AW,2
00208P 0157 96 02    A        LDAA   AW+2
00209P 0159 A7 15    A        STAA   21,X         MDW,22 = AW,3
00210P 015B 96 04    A        LDAA   AW+4
00211P 015D A7 16    A        STAA   22,X         MDW,23 = AW,5

00213P 015F A6 14    A        LDAA   20,X
00214P 0161 81 19    A        CMPA   #25          IS MDW,21 = "+"?
00215P 0163 26 04 0169        BNE    DCSMD6       IF NOT...BRANCH
00216P 0165 86 0A    A        LDAA   #10
00217P 0167 A7 14    A        STAA   20,X         MDW,21 = "0"
00218P 0169 39          DCSMD6 RTS
00220                       *
00221                       * SPFLED - SET PASS/FAIL LEDS
00222                       *
00223                       * FLOW PAGE 15C
00224                       *
00225P 016A C6 00    A SPFLED LDAB   #PASS+FAIL
00226P 016C BD 0000  A        JSR    CLITE1       PASS = 0, FAIL = 0
00227P 016F D6 00    A        LDAB   M1
00228P 0171 C1 06    A        CMPB   #6           IS M1 = 6? (IE. AUTOSCOPE?)
00229P 0173 26 57 01CC        BNE    SPFLD4       IF NOT...BRANCH AND EXIT
00230P 0175 B6 0000  A        LDAA   DW8
00231P 0178 81 11    A        CMPA   #17          IS DW(8),1 = "R"?
00232P 017A 26 47 01C3        BNE    SPFLD1       IF NOT...BRANCH
00233P 017C B6 0000  A        LDAA   DW7
00234P 017F 81 0B    A        CMPA   #11          IS DW(7),1 = "A"?
00235P 0181 26 44 01C7        BNE    SPFLD2       IF NOT...BRANCH
00236P 0183 96 00    A        LDAA   DCOMP
00237P 0185 81 33    A        CMPA   #51          IS DCOMP = 51?
00238P 0187 27 43 01CC        BEQ    SPFLD4       IF YES...BRANCH
00239P 0189 96 00    A        LDAA   FR4
00240P 018B 85 00    A        BITA   #PFF         IS PFF = 1?
00241P 018D 26 3D 01CC        BNE    SPFLD4       IF YES...BRANCH 00243P 018F 4F                CLRA
00244P 0190 D6 00    A        LDAB   DCOMP
00245P 0192 58                ASLB
00246P 0193 49                ROLA                ACCA,ACCB = 2*DCOMP 00248P 0194 CE 0000  A        LDX    #MAXMIS
00249P 0197 BD 0000  A        JSR    COMP16       IS "WV9" > MAXMIS?
00250P 019A 2F 2B 01C7        BLE    SPFLD2       IF NOT...BRANCH
00251P 019C DE 00    A        LDX    BADS8
00252P 019E 86 00    A        LDAA   #JL4OFS
00253P 01A0 BD 0000  A        JSR    OFFX         POINT TO J(8,4)
00254P 01A3 BD 0000  A        JSR    ENTPV2       ENTER J(8,4)
00255P 01A6 CE 000E  A        LDX    #J15+14
00256P 01A9 BD 0000  A        JSR    ENTPV2       ENTER J15(8)
00257P 01AC BD 0000  A        JSR    FLPMLT       MULTIPLY
00258P 01AF CE 0003  A        LDX    #3
00259P 01B2 BD 0000  A        JSR    ENTIDX       ENTER 3
00260P 01B5 BD 0000  A        JSR    FLPMLT       "WV9" = J(8,4)*J15(8)*3
00261P 01B8 CE 0000  A        LDX    #TOTMA
00262P 01BB BD 0000  A        JSR    EINT15       ENTER TOTMA
00263P 01BE BD 0000  A        JSR    COMPXY       IS "WV9" > TOTMA?
00264P 01C1 2F 04 01C7        BLE    SPFLD2       IF NOT...BRANCH 00266P 01C3 C6 00    A SPFLD1 LDAB   #PASS        PASS = 1
00267P 01C5 20 02 01C9        BRA    SPFLD3
```

```
00269P 01C7 C6 00    A SPFLD2 LDAB  #FAIL     FAIL = 1

00271P 01C9 7E 0000  A SPFLD3 JMP   SLITE1    SET LITE ... AND EXIT 00273P 01CC 39         SPFLD4 RTS             ... EXIT
00275P 01CD    00    A        FCB   0         CRC BYTE
00276                         END
TOTAL ERRORS 00000

RP       ARSMDW 00009*00076
RB       AW     00006*00172 00174 00188 00190 00204 00206 00208 00210
RB       BADS8  00006*00100 00251
RP       CFLG1  00010*00075
RP       CLITE1 00010*00226
RP       COMP16 00010*00249
RP       COMPXY 00010*00137 00151 00156 00168 00263
RP       CRTT9  00010*00079
RB       DCOMP  00006*00031 00036 00043 00049 00089 00105 00119 00236 00244
 P 00E4  DCSMD0 00138 00148*
 P 0123  DCSMD1 00152 00177*
 P 012E  DCSMD2 00169 00186*
 P 013B  DCSMD3 00175 00191*
 P 013E  DCSMD4 00157 00193*
 P 00A3  DCSMD5 00102 00118*
 P 0169  DCSMD6 00215 00218*
 P 00C1  DCSMD7 00116 00132*
DP 0067  DCSMDW 00019 00044 00087*
 P 007B  DCSMDX 00091 00097*
 P 00DD  DCSMDY 00095 00143*
 P 0087  DCSMDZ 00099 00103*
RP       DETK15 00011*00103
RP       DROP   00011*00148 00153 00158 00193
RP       DT1MS  00011*00046
R        DW7    00016*00233
R        DW8    00016*00230
RP       EEXP10 00011*00155 00167 00195
RP       EINT15 00011*00125 00262
RP       ENTER  00012*00165
RP       ENTIDX 00012*00150 00259
RP       ENTIMM 00012*00179
RP       ENTINT 00012*00110
RP       ENTPV2 00012*00112 00114 00127 00129 00136 00254 00256
R        FAIL   00016*00225 00269
R        FAS    00016*00072
RP       FLPDIV 00013*00132
RP       FLPMLT 00013*00115 00130 00196 00257 00260
RP       FNAFRF 00013*00063
RB       FR1    00006*00073
RB       FR4    00006*00064 00239
R        J15    00016*00128 00255
R        JL2OFS 00016*00101
R        JL4OFS 00016*00252
RB       K15    00006*00113
RB       K4     00006*00111 00126
RB       M1     00006*00058 00097 00227
R        MAXMIS 00017*00248
R        MDW    00017*00050 00087 00088 00092 00139 00170 00186 00203
R        MOVBLK 00013*00191
R        NEWAL  00017*00065
RP       OFFX   00014*00253
R        PASS   00017*00225 00266
R        PFF    00017*00240
RP       READSR 00014*00030
 P 0004  SACFA0 00030*00047
 P 0016  SACFA1 00033 00039*
 P 0021  SACFA2 00037 00044*
 P 002B  SACFA3 00042 00048*
 P 003D  SACFA4 00040 00058*
 P 0051  SACFA5 00062 00070*
 P 005E  SACFA6 00066 00076*
 P 0050  SACFA7 00035 00060 00068*00071 00074
DP 0000  SCACFA 00019 00028*
```

```
RP        SETAW    00014*00162  00180  00197
RP        SLITE1   00014*00271
 P  01C3  SPFLD1   00232  00266*
 P  01C7  SPFLD2   00235  00250  00264  00269*
 P  01C9  SPFLD3   00267  00271*
 P  01CC  SPFLD4   00229  00238  00241  00273*
DP  016A  SPFLED   00019  00045  00055  00225*
RP        SST9     00014*00077
RB        T1       00007*00029
RB        TEMP     00007*00171  00187
RB        TEMP2    00007*00173  00189
RB        TEMP3    00007*00122  00123  00124  00134  00135
R         TOTMA    00017*00261
RB        TVAR1    00007*00164

00001                        NAM    F15D1
00002                        OPT    REL, CREF, LLEN=80
00003                        TTL    FLOW PAGES 15D1 THRU 15D3
00004                        IDNT   FEB.   22, 1978

00006                        XREF   BSCT:AFXRF, ALAD, ALBL, BADS7, BITL, BITNO
00007                        XREF   BSCT:FALB7, FALB8, FNTB, FPTB, FR4
00008                        XREF   BSCT:LALB7, LNTB, LPTB, NNTR, NPTR
00009                        XREF   BSCT:SCRTCH, TEMP3, TEMP4

00011                        XREF   PSCT:CFLG4, CMPIDX, COMP16, COMPXY
00012                        XREF   PSCT:DIV16, DOMOVE
00013                        XREF   PSCT:EEXP10, EINT15, ENTIDX, ENTINT, ENTPV2
00014                        XREF   PSCT:FLPDIV, FLPMLT
00015                        XREF   PSCT:MULT16, MULT8, OFFX, READSR
00016                        XREF   PSCT:SCRL1B, SFLG1, SFLG4, SINT15, SINT8

00018                        XREF   ALWD, BPD, DW7, DW8, FAS
00019                        XREF   J15, JL4OFS, JL5OFS, JLAOFS, NEWAL
00020                        XREF   PER7, PERIOD, PFF, PREVB, SBZ, TOTB

00022                        XDEF   FNAFRF, DFALB, DFALB3

00024P 0000                  PSCT
00026                    *
00027                    * FNAFRF - FIND NEW AF/RF IF POSSIBLE
00028                    *           (SHEET 1)
00029                    *
00030                    * FLOW PAGE 15D1
00031                    *
00032P 0000 86 00      A FNAFRF LDAA  #NEWAL
00033P 0002 BD 0000    A        JSR   SFLG4     NEWAL = 1
00034P 0005 B6 0000    A        LDAA  DW7
00035P 0008 81 0B      A        CMPA  #11       IS DW(7),1 = "A"
00036P 000A 26 07 0013          BNE   FNFRF8    IF NOT...BRANCH
00037P 000C B6 0000    A        LDAA  DW8
00038P 000F 81 11      A        CMPA  #17       IS DW(8),1 = "R"
00039P 0011 27 03 0016          BEQ   FNFRF9    IF YES...BRANCH
00040P 0013 7E 00C4    P FNFRF8 JMP   FNFRF1

00042P 0016 DE 00      A FNFRF9 LDX   BADS7
00043P 0018 86 00      A        LDAA  #JL4OFS
00044P 001A BD 0000    A        JSR   OFFX      POINT TO J(7,4)
00045P 001D BD 0000    A        JSR   ENTPV2    ENTER J(7,4)
00046P 0020 86 00      A        LDAA  #JLAOFS
00047P 0022 DE 00      A        LDX   BADS7
00048P 0024 BD 0000    A        JSR   OFFX      POINT TO J(7,10)
00049P 0027 BD 0000    A        JSR   ENTPV2    ENTER J(7,10)
00050P 002A BD 0000    A        JSR   FLPMLT    MULTIPLY
00051P 002D CE 0000    A        LDX   #BPD
00052P 0030 BD 0000    A        JSR   SINT8     BPD = J(7,4)*J(7,10)
00053P 0033 B6 0000    A        LDAA  BPD
00054P 0036 C6 0A      A        LDAB  #10
```

```
00055P 0038 BD 0000  A        JSR    MULT8
00056P 003B B7 0000  A        STAA   TOTB
00057P 003E F7 0001  A        STAB   TOTB+1      TOTB = BPD*10
00058P 0041 86 00    A        LDAA   #JL5OFS
00059P 0043 DE 00    A        LDX    BADS7
00060P 0045 BD 0000  A        JSR    OFFX        POINT TO J(7,5)
00061P 0048 4F                CLRA
00062P 0049 F6 0000  A        LDAB   BPD
00063P 004C BD 0000  A        JSR    MULT16      J(7,5)*BPD
00064P 004F CE 000A  A        LDX    #10
00065P 0052 DF 00    A        STX    TEMP3
00066P 0054 CE 0000  A        LDX    #TEMP3
00067P 0057 BD 0000  A        JSR    DIV16       DIVIDE RESULT BY 10
00068                 *                          SINCE J(7,5) IS INT15*10
00069P 005A 40                NEGA
00070P 005B 50                NEGB
00071P 005C 82 00    A        SBCA   #0          NEGATE RESULT
00072P 005E FB 000D  A        ADDB   SBZ+13
00073P 0061 B9 000C  A        ADCA   SBZ+12      ADD SBZ(7)
00074P 0064 97 00    A        STAA   ALBL
00075P 0066 D7 01    A        STAB   ALBL+1      ALBL = SBZ(7)-J(7,5)*BPD
00076P 0068 86 07    A        LDAA   #7
00077P 006A 8D 73 00DF         BSR    FNFRF3     ALAD = BADS(7)+ALBL BITS 8-3
00078P 006C BD 00F5  P        JSR    FTRNS       FIND TRANSITIONS IN
00079                 *                          TRACE 7 OR TRACE 8
00080P 006F FE 0000  A        LDX    PERIOD
00081P 0072 FF 0000  A        STX    PER7        PER7 = PERIOD
00082P 0075 86 08    A        LDAA   #8
00083P 0077 8D 66 00DF         BSR    FNFRF3     ALAD = BADS(8)+ALBL BITS 8-3
00084P 0079 8D 7A 00F5         BSR    FTRNS      FIND TRANSITIONS IN
00085                 *                          TRACE 7 OR 8
00086P 007B 96 00    A        LDAA   FR4
00087P 007D 85 00    A        BITA   #NEWAL      IS NEWAL = 0?
00088P 007F 27 43 00C4         BEQ    FNFRF1     IF YES...BRANCH
00089P 0081 86 03    A        LDAA   #$03
00090P 0083 C6 E8    A        LDAB   #$E8        3E8 HEX = 1000 DECIMAL
00091P 0085 CE 0000  A        LDX    #PERIOD
00092P 0088 BD 0000  A        JSR    MULT16      PERIOD*1000
00093P 008B CE 0000  A        LDX    #PER7
00094P 008E BD 0000  A        JSR    DIV16       PERIOD*1000/PER7
00095P 0091 29 31 00C4         BVS    FNFRF1     BRANCH IF OVERFLOW
00096P 0093 36                PSHA
00097P 0094 37                PSHB
00098P 0095 96 00    A        LDAA   SCRTCH
00099P 0097 D6 01    A        LDAB   SCRTCH+1   PICK UP REMAINDER
00100P 0099 58                ASLB
00101P 009A 49                ROLA               MULTIPLY BY 2
00102P 009B CE 0000  A        LDX    #PER7
00103P 009E BD 0000  A        JSR    COMP16      IS 2*REMAINDER < PER7?
00104P 00A1 33                PULB
00105P 00A2 32                PULA
00106P 00A3 2D 06 00AB         BLT    FNFRF0     IF YES...BRANCH
00107P 00A5 CB 01    A        ADDB   #1
00108P 00A7 89 00    A        ADCA   #0          ... ELSE ROUND UP
00109P 00A9 29 19 00C4         BVS    FNFRF1     BRANCH IF OVERFLOW
00110P 00AB CE 04E2  A FNFRF0 LDX    #1250
00111P 00AE BD 0000  A        JSR    CMPIDX      IS AF/RF > 1250?
00112P 00B1 2E 11 00C4         BGT    FNFRF1     IF YES...BRANCH
00113P 00B3 CE 02EE  A        LDX    #750
00114P 00B6 BD 0000  A        JSR    CMPIDX      IS AF/RF < 750?
00115P 00B9 2D 09 00C4         BLT    FNFRF1     IF YES...BRANCH
00116P 00BB 97 00    A        STAA   AFXRF
00117P 00BD D7 01    A        STAB   AFXRF+1     AF/RF = PERIOD*1000/PER7
00118P 00BF 86 00    A        LDAA   #FAS
00119P 00C1 7E 0000  A        JMP    SFLG1       FAS = 1 ... AND EXIT 00121P 00C4 86 00    A FNFRF1 LDAA   #NEWAL
00122P 00C6 BD 0000  A        JSR    CFLG4       NEWAL = 0
00123P 00C9 86 02    A        LDAA   #2
00124P 00CB BD 0000  A        JSR    DOMOVE      AW = MDW
00125P 00CE 86 13    A        LDAA   #19
00126P 00D0 BD 0000  A        JSR    DOMOVE      MDW, 13-17 = " NONE"
00127P 00D3 BD 0000  A FNFRF2 JSR    READSR      READ SWITCH REGISTERS
00128P 00D6 81 26    A        CMPA   #$26        IS "DATA ALIGN AF/RF" PRESSED?
```

```
00129P 00D8 27 F9 00D3           BEQ     FNFRF2      IF YES...BRANCH
00130P 00DA 86 03       A        LDAA    #3
00131P 00DC 7E 0000     A        JMP     DOMOVE      MDW = AW ... AND EXIT 00133P 00DF BD 0000     A FNFRF3 JSR     SCRL1B      POINT TO BADS(ACCA)
00134P 00E2 96 00       A        LDAA    ALBL
00135P 00E4 D6 01       A        LDAB    ALBL+1
00136P 00E6 47                   ASRA
00137P 00E7 56                   RORB
00138P 00E8 47                   ASRA
00139P 00E9 56                   RORB
00140P 00EA 47                   ASRA
00141P 00EB 56                   RORB                SHIFT ALBL 3 BITS RIGHT
00142P 00EC EB 01       A        ADDB    1,X
00143P 00EE A9 00       A        ADCA    0,X
00144P 00F0 97 00       A        STAA    ALAD
00145P 00F2 D7 01       A        STAB    ALAD+1      ALAD = BADS(ACCA)+ ALBL BITS 8-3
00146P 00F4 39                   RTS
00148                        *
00149                        * FTRNS - FIND TRANSITIONS IN
00150                        *         TRACE 7 OR TRACE 8
00151                        *
00152                        * FLOW PAGE 15D2
00153                        *
00154P 00F5 96 01       A FTRNS  LDAA    ALBL+1
00155P 00F7 43                   COMA
00156P 00F8 84 07       A        ANDA    #%00000111
00157P 00FA 97 00       A        STAA    BITL        BITL = 7-ALBL BITS 2-0
00158P 00FC 4F                   CLRA
00159P 00FD 97 00       A        STAA    BITNO
00160P 00FF 97 01       A        STAA    BITNO+1     BITNO = 0
00161P 0101 C6 02       A        LDAB    #2
00162P 0103 F7 0000     A        STAB    PREVB       PREVB = 2
00163P 0106 97 00       A        STAA    NNTR        NNTR = 0
00164P 0108 97 00       A        STAA    NPTR        NPTR = 0
00165P 010A DE 00       A FTRNS0 LDX     ALAD
00166P 010C A6 00       A        LDAA    0,X
00167P 010E B7 0000     A        STAA    ALWD        ALWD = (ALAD)
00168P 0111 B6 0000     A FTRNS1 LDAA    ALWD
00169P 0114 D6 00       A        LDAB    BITL
00170P 0116 5C                   INCB
00171P 0117 46                FTRNS2 RORA              DETERMINE VALUE OF BIT
00172P 0118 5A                   DECB                ... OF ALWD INDICATED BY
00173P 0119 26 FC 0117           BNE     FTRNS2      ... BITL
00174P 011B DE 00       A        LDX     BITNO
00175P 011D 24 17 0136           BCC     FTRNS5      BRANCH IF BIT IS 0
00176P 011F B6 0000     A        LDAA    PREVB       IS PREVB = 0?
00177P 0122 26 0B 012F           BNE     FTRNS4      IF NOT...BRANCH
00178P 0124 96 00       A        LDAA    NPTR        IS NPTR = 0?
00179P 0126 26 02 012A           BNE     FTRNS3      IF NOT...BRANCH
00180P 0128 DF 00       A        STX     FPTB        FPTB = BITNO
00181P 012A DF 00       A FTRNS3 STX     LPTB        LPTB = BITNO
00182P 012C 4C                   INCA
00183P 012D 97 00       A        STAA    NPTR        NPTR = NPTR+1
00184P 012F 86 01       A FTRNS4 LDAA    #1
00185P 0131 B7 0000     A        STAA    PREVB       PREVB = 1
00186P 0134 20 1C 0152           BRA     FTRNS8

00188P 0136 B6 0000     A FTRNS5 LDAA    PREVB
00189P 0139 81 01       A        CMPA    #1          IS PREVB = 1?
00190P 013B 26 12 014F           BNE     FTRNS7      IF NOT...BRANCH
00191P 013D 96 00       A        LDAA    NNTR        IS NNTR = 0?
00192P 013F 26 02 0143           BNE     FTRNS6      IF NOT...BRANCH
00193P 0141 DF 00       A        STX     FNTB        FNTB = BITNO
00194P 0143 DF 00       A FTRNS6 STX     LNTB        LNTB = BITNO
00195P 0145 4C                   INCA
00196P 0146 97 00       A        STAA    NNTR        NNTR = NNTR+1
00197P 0148 F6 0000     A        LDAB    BPD
00198P 014B 58                   ASLB                ACCB = BPD*2
00199P 014C 11                   CBA                 IS NNTR > (BPD*2)?
00200P 014D 22 29 0178           BHI     FTRNS8      IF YES...BRANCH 00202P 014F 7F 0000     A FTRNS7 CLR     PREVB       PREVB = 0
```

```
00204P 0152 08            FTRNS8 INX
00205P 0153 DF 00     A          STX    BITNO     BITNO = BITNO+1
00206P 0155 BC 0000   A          CPX    TOTB      IS BITNO = TOTB?
00207P 0158 27 14 016E          BEQ    FTRNSA    IF YES...BRANCH
00208P 015A 96 00     A          LDAA   BITL      IS BITL = 0?
00209P 015C 27 05 0163          BEQ    FTRNS9    IF YES...BRANCH
00210P 015E 7A 0000   A          DEC    BITL      BITL = BITL-1
00211P 0161 20 AE 0111          BRA    FTRNS1

00213P 0163 86 07     A FTRNS9 LDAA   #7
00214P 0165 97 00     A          STAA   BITL      BITL = 7
00215P 0167 DE 00     A          LDX    ALAD
00216P 0169 08                   INX
00217P 016A DF 00     A          STX    ALAD      ALAD = ALAD+1
00218P 016C 20 9C 010A          BRA    FTRNS0

00220P 016E 86 01     A FTRNSA LDAA   #1
00221P 0170 91 00     A          CMPA   NNTR      IS 1 < NNTR?
00222P 0172 25 09 017D          BCS    FTRNSC    IF YES...BRANCH
00223P 0174 91 00     A          CMPA   NPTR      IS 1 < NPTR?
00224P 0176 25 05 017D          BCS    FTRNSC    IF YES...BRANCH 00226P 0178 86 00     A FTRNSB LDAA   #NEWAL
00227P 017A 7E 0000   A          JMP    CFLG4     NEWAL = 0 ... AND EXIT 00229P 017D 96 00     A FTRNSC LDAA   LNTB
00230P 017F D6 01     A          LDAB   LNTB+1
00231P 0181 D0 01     A          SUBB   FNTB+1
00232P 0183 92 00     A          SBCA   FNTB
00233P 0185 D0 01     A          SUBB   LPTB+1
00234P 0187 92 00     A          SBCA   LPTB
00235P 0189 DB 01     A          ADDB   FPTB+1
00236P 018B 99 00     A          ADCA   FPTB      "WV10" = LNTB-FNTB-LPTB+FPTB
00237P 018D 2B 14 01A3          BMI    FTRNSE    BRANCH IF "WV10" IS NEGATIVE
00238P 018F 2E 03 0194          BGT    FTRNSD    BRANCH IF "WV10" IS > 0
00239P 0191 5D                   TSTB
00240P 0192 27 0F 01A3          BEQ    FTRNSE    BRANCH IF "WV10" = 0

00242P 0194 96 00     A FTRNSD LDAA   NNTR
00243P 0196 4A                   DECA             NNTR-1
00244P 0197 97 01     A          STAA   TEMP3+1
00245P 0199 96 00     A          LDAA   LNTB
00246P 019B D6 01     A          LDAB   LNTB+1
00247P 019D D0 01     A          SUBB   FNTB+1
00248P 019F 92 00     A          SBCA   FNTB      ACCA,ACCB = LNTB-FNTB
00249P 01A1 20 0D 01B0          BRA    FTRNSF 00251P 01A3 96 00     A FTRNSE LDAA   NPTR
00252P 01A5 4A                   DECA             NPTR-1
00253P 01A6 97 01     A          STAA   TEMP3+1
00254P 01A8 96 00     A          LDAA   LPTB
00255P 01AA D6 01     A          LDAB   LPTB+1
00256P 01AC D0 01     A          SUBB   FPTB+1
00257P 01AE 92 00     A          SBCA   FPTB      ACCA,ACCB = LPTB-FPTB
00258P 01B0 58            FTRNSF ASLB
00259P 01B1 49                   ROLA
00260P 01B2 58                   ASLB
00261P 01B3 49                   ROLA
00262P 01B4 58                   ASLB
00263P 01B5 49                   ROLA
00264P 01B6 58                   ASLB
00265P 01B7 49                   ROLA
00266P 01B8 58                   ASLB
00267P 01B9 49                   ROLA             MULTIPLY DIFFERENCE BY 32
00268P 01BA 97 00     A          STAA   SCRTCH
00269P 01BC D7 01     A          STAB   SCRTCH+1
00270P 01BE 4F                   CLRA
00271P 01BF 5F                   CLRB
00272P 01C0 97 00     A          STAA   TEMP3     SET UP FOR DIVIDE
00273P 01C2 CE 0000   A          LDX    #TEMP3
00274P 01C5 BD 0000   A          JSR    DIV16
00275P 01C8 36                   PSHA
00276P 01C9 37                   PSHB
00277P 01CA 96 00     A          LDAA   SCRTCH
00278P 01CC D6 01     A          LDAB   SCRTCH+1  GET REMAINDER
```

```
00279P 01CE 58                   ASLB
00280P 01CF 49                   ROLA               MULTIPLY BY 2
00281P 01D0 CE 0000   A          LDX    #TEMP3
00282P 01D3 BD 0000   A          JSR    COMP16      IS 2*REMAINDER < DIVISOR?
00283P 01D6 33                   PULB
00284P 01D7 32                   PULA
00285P 01D8 2D 04 01DE           BLT    FTRNSG      IF YES...BRANCH
00286P 01DA CB 01     A          ADDB   #1          ...ELSE ROUND UP
00287P 01DC 89 00     A          ADCA   #0
00288P 01DE B7 0000   A FTRNSG   STAA   PERIOD
00289P 01E1 F7 0001   A          STAB   PERIOD+1    STORE RESULT IN PERIOD
00290P 01E4 39                   RTS
00292                         *
00293                         * DFALB - DETERMINE FALB7 & FALB8, SET PFF
00294                         *
00295                         * FLOW PAGE 15D3
00296                         *
00297P 01E5 DE 00     A DFALB    LDX    BADS7
00298P 01E7 EE 00     A          LDX    JLAOFS,X    GET J(7,10)
00299P 01E9 FF 000C   A          STX    J15+12      J15(7) = J(7,10)
00300P 01EC DE 00     A          LDX    BADS7
00301P 01EE 86 00     A          LDAA   #JL5OFS
00302P 01F0 BD 0000   A          JSR    OFFX        POINT TO J(7,5)
00303P 01F3 BD 0000   A          JSR    EINT15      ENTER J(7,5)
00304                         *                    NOTE: J(7,5) IS INT15*10
00305P 01F6 BD 02CA   P          JSR    DFALB1      ENTER J(7,4) AND MULTIPLY
00306P 01F9 FE 000C   A          LDX    J15+12      GET J15(7)
00307P 01FC DF 00     A          STX    TEMP3
00308P 01FE 7A 0001   A          DEC    TEMP3+1     DIVIDE BY 10 TO COMPENSATE
00309                         *                    FOR J(7,5)
00310P 0201 CE 0000   A          LDX    #TEMP3
00311P 0204 BD 0000   A          JSR    ENTPV2      ENTER J15(7)/10
00312P 0207 BD 0000   A          JSR    FLPMLT      MULTIPLY
00313P 020A BD 0302   P          JSR    DFALB6      STORE RESULT IN TEMP3
00314P 020D B6 000C   A          LDAA   SBZ+12
00315P 0210 F6 000D   A          LDAB   SBZ+13      GET SBZ(7)
00316P 0213 D0 01     A          SUBB   TEMP3+1
00317P 0215 92 00     A          SBCA   TEMP3       SUBTRACT FROM SBZ(7)
00318P 0217 97 00     A          STAA   FALB7
00319P 0219 D7 01     A          STAB   FALB7+1     FALB7 = SBZ(7)-J(7,5)*J(7,4)
00320                         *                          *J15(7)
00321P 021B BD 02D7   P          JSR    DFALB3      ENTER AF/RF, MULTIPLY,
00322                         *                    ENTER 1000, DIVIDE
00323P 021E BD 0302   P          JSR    DFALB6      STORE RESULT IN TEMP3
00324P 0221 B6 000E   A          LDAA   SBZ+14
00325P 0224 F6 000F   A          LDAB   SBZ+15      GET SBZ(8)
00326P 0227 D0 01     A          SUBB   TEMP3+1
00327P 0229 92 00     A          SBCA   TEMP3       SUBTRACT FROM SBZ(8)
00328P 022B 97 00     A          STAA   FALB8
00329P 022D D7 01     A          STAB   FALB8+1     FALB8 = SBZ(7)-J(7,5)*J(7,4)
00330                         *                          *J15(7)*AF/RF/1000
00331P 022F FE 000C   A          LDX    J15+12      GET J15(7)
00332P 0232 DF 00     A          STX    TEMP3
00333P 0234 7C 0001   A          INC    TEMP3+1     MULTIPLY BY 10
00334P 0237 CE 0000   A          LDX    #TEMP3
00335P 023A BD 0000   A          JSR    ENTPV2      ENTER 10*J15(7)
00336P 023D BD 02CA   P          JSR    DFALB1      ENTER J(7,4) AND MULTIPLY
00337P 0240 BD 0302   P          JSR    DFALB6      STORE RESULT IN TEMP3
00338P 0243 96 00     A          LDAA   FALB7
00339P 0245 D6 01     A          LDAB   FALB7+1
00340P 0247 BD 02E8   P          JSR    DFALB4      ADD TEMP3 AND SUBTRACT 1
00341P 024A 97 00     A          STAA   LALB7
00342P 024C D7 01     A          STAB   LALB7+1     LALB7 = FALB7+10*J(7,4)*J15(7)-1

00344P 024E BD 02D7   P          JSR    DFALB3      ENTER AF/RF, MULTIPLY,
00345                         *                    ENTER 1000, DIVIDE
00346P 0251 BD 0302   P          JSR    DFALB6      STORE RESULT IN TEMP3
00347P 0254 96 00     A          LDAA   FALB8
00348P 0256 D6 01     A          LDAB   FALB8+1
00349P 0258 BD 02E8   P          JSR    DFALB4      ADD TEMP3 AND SUBTRACT 1
00350P 025B 97 00     A          STAA   TEMP4
00351P 025D D7 01     A          STAB   TEMP4+1     STORE "LALB8" IN TEMP4
00352P 025F DE 00     A          LDX    FALB8       IS FALB8 < 0?
00353P 0261 2A 1A 027D           BPL    DFALB8      IF NOT...BRANCH
```

```
00354P 0263 CE 0000  A           LDX    #FALB8
00355P 0266 BD 0000  A           JSR    EINT15   ENTER FALB8
00356P 0269 BD 02F1  P           JSR    DFALB5   ENTER 1000, MULTIPLY,
00357                *                           ENTER AF/RF, DIVIDE,
00358                *                           STORE RESULT IN TEMP3
00359P 026C 96 00    A           LDAA   FALB7
00360P 026E D6 01    A           LDAB   FALB7+1
00361P 0270 D0 01    A           SUBB   TEMP3+1
00362P 0272 92 00    A           SBCA   TEMP3
00363P 0274 97 00    A           STAA   FALB7
00364P 0276 D7 01    A           STAB   FALB7+1  FALB7 = FALB7-FALB8*1000/AF/RF
00365P 0278 CE 0000  A           LDX    #0
00366P 027B DF 00    A           STX    FALB8    FALB8 = 0
00367P 027D 96 00    A DFALBA    LDAA   TEMP4
00368P 027F D6 01    A           LDAB   TEMP4+1  GET "LALB8"
00369P 0281 CE 03E7  A           LDX    #999
00370P 0284 BD 0000  A           JSR    CMPIDX   IS "LALB8" > 999?
00371P 0287 2F 16 029F           BLE    DFALBB   IF NOT...BRANCH
00372P 0289 C0 E7    A           SUBB   #$E7
00373P 028B 82 03    A           SBCA   #$03     3E7 HEX IS 999 DECIMAL
00374P 028D BD 0000  A           JSR    ENTINT   ENTER "LALB8"-999
00375P 0290 BD 02F1  P           JSR    DFALB5   ENTER 1000, MULTIPLY,
00376                *                           ENTER AF/RF, DIVIDE,
00377                *                           STORE RESULT IN TEMP3
00378P 0293 96 00    A           LDAA   LALB7
00379P 0295 D6 01    A           LDAB   LALB7+1
00380P 0297 D0 01    A           SUBB   TEMP3+1
00381P 0299 92 00    A           SBCA   TEMP3
00382P 029B 97 00    A           STAA   LALB7
00383P 029D D7 01    A           STAB   LALB7+1  LALB7 = LALB7-
00384                *                           ("LALB8"-999)*1000/AF/RF
00385P 029F 96 00    A DFALBB    LDAA   LALB7
00386P 02A1 D6 01    A           LDAB   LALB7+1
00387P 02A3 D0 01    A           SUBB   FALB7+1
00388P 02A5 92 00    A           SBCA   FALB7
00389P 02A7 BD 0000  A           JSR    ENTINT   ENTER LALB7-FALB7
00390P 02AA CE 0005  A           LDX    #5
00391P 02AD BD 0000  A           JSR    ENTIDX   ENTER 5
00392P 02B0 8D 18 02CA           BSR    DFALB1   ENTER J(7,4) AND MULTIPLY
00393P 02B2 CE 000C  A           LDX    #J15+12
00394P 02B5 BD 0000  A           JSR    ENTPV2   ENTER J15(7)
00395P 02B8 BD 0000  A           JSR    FLPMLT   MULTIPLY
00396P 02BB BD 0000  A           JSR    COMPXY   IS (LALB7-FALB7) >
00397                *                             5*J(7,4)*J15(7)?
00398P 02BE 2E 05 02C5           BGT    DFALBC   IF YES...BRANCH
00399P 02C0 86 00    A           LDAA   #PFF
00400P 02C2 7E 0000  A           JMP    SFLG4    PFF = 1 ... AND EXIT 00402P 02C5 86 00    A DFALBC    LDAA   #PFF
00403P 02C7 7E 0000  A           JMP    CFLG4    PFF = 0 ... AND EXIT 00405P 02CA DE 00    A DFALB1    LDX    BADS7
00406P 02CC 86 00    A           LDAA   #JL4OFS
00407P 02CE BD 0000  A           JSR    OFFX     POINT TO J(7,4)
00408P 02D1 BD 0000  A           JSR    ENTPV2   ENTER J(7,4)
00409P 02D4 7E 0000  A           JMP    FLPMLT   MULTIPLY ... AND EXIT 00412P 02D7 CE 0000  A DFALB3    LDX    #AFXRF
00413P 02DA BD 0000  A           JSR    EINT15   ENTER AF/RF
00414P 02DD BD 0000  A           JSR    FLPMLT
00415P 02E0 86 03    A           LDAA   #3
00416P 02E2 BD 0000  A           JSR    EEXP10   ENTER 10**3
00417P 02E5 7E 0000  A           JMP    FLPDIV   DIVIDE ... AND EXIT 00419P 02E8 DB 01    A DFALB4    ADDB   TEMP3+1
00420P 02EA 99 00    A           ADCA   TEMP3
00421P 02EC C0 01    A           SUBB   #1
00422P 02EE 82 00    A           SBCA   #0       ADD TEMP3 TO ACCA,ACCB
00423                *                           AND SUBTRACT 1
00424P 02F0 39                   RTS
```

```
00426P 02F1 86 03      A DFALB5 LDAA   #3
00427P 02F3 BD 0000    A        JSR    EEXP10    ENTER 10**3
00428P 02F6 BD 0000    A        JSR    FLPMLT    MULTIPLY
00429P 02F9 CE 0000    A        LDX    #AFXRF
00430P 02FC BD 0000    A        JSR    EINT15    ENTER AF/RF
00431P 02FF BD 0000    A        JSR    FLPDIV    DIVIDE 00433P 0302 CE 0000    A DFALB6 LDX    #TEMP3
00434P 0305 7E 0000    A        JMP    SINT15    STORE RESULT IN TEMP3 ... AND EXIT
00436P 0308    00      A        FCB    0         CRC BYTE
00437                           END
TOTAL ERRORS 00000
```

```
RB         AFXRF   00006*00116 00117 00412 00429
RB         ALAD    00006*00144 00145 00165 00215 00217
RB         ALBL    00006*00074 00075 00134 00135 00154
R          ALWD    00018*00167 00168
RB         BADS7   00006*00042 00047 00059 00297 00300 00405
RB         BITL    00006*00157 00169 00208 00210 00214
RB         BITNO   00006*00159 00160 00174 00205
R          BPD     00018*00051 00053 00062 00197
RP         CFLG4   00011*00122 00227 00403
RP         CMPIDX  00011*00111 00114 00370
RP         COMP16  00011*00103 00282
RP         COMPXY  00011*00396
DP 01E5    DFALB   00022 00297*
 P 02CA    DFALB1  00305 00336 00392 00405*
DP 02D7    DFALB3  00022 00321 00344 00412*
 P 02E8    DFALB4  00340 00349 00419*
 P 02F1    DFALB5  00356 00375 00426*
 P 0302    DFALB6  00313 00323 00337 00346 00433*
 P 027D    DFALBA  00353 00367*
 P 029F    DFALBB  00371 00385*
 P 02C5    DFALBC  00398 00402*
RP         DIV16   00012*00067 00094 00274
RP         DOMOVE  00012*00124 00126 00131
R          DW7     00018*00034
R          DW8     00018*00037
RP         EEXP10  00013*00416 00427
RP         EINT15  00013*00303 00355 00413 00430
RP         ENTIDX  00013*00391
RP         ENTINT  00013*00374 00389
RP         ENTPV2  00013*00045 00049 00311 00335 00394 00408
RB         FALB7   00007*00318 00319 00338 00339 00359 00360 00363 00364 00387
                   00388
RB         FALB8   00007*00328 00329 00347 00348 00352 00354 00366
R          FAS     00018*00118
RP         FLPDIV  00014*00417 00431
RP         FLPMLT  00014*00050 00312 00395 00409 00414 00428
DP 0000    FNAFRF  00022 00032*
 P 00AB    FNFRF0  00106 00110*
 P 00C4    FNFRF1  00040 00088 00095 00109 00112 00115 00121*
 P 00D3    FNFRF2  00127*00129
 P 00DF    FNFRF3  00077 00083 00133*
 P 0013    FNFRF8  00036 00040*
 P 0016    FNFRF9  00039 00042*
RB         FNTB    00007*00193 00231 00232 00247 00248
RB         FPTB    00007*00180 00235 00236 00256 00257
RB         FR4     00007*00086
 P 00F5    FTRNS   00078 00084 00154*
 P 010A    FTRNS0  00165*00218
 P 0111    FTRNS1  00168*00211
 P 0117    FTRNS2  00171*00173
 P 012A    FTRNS3  00179 00181*
 P 012F    FTRNS4  00177 00184*
 P 0136    FTRNS5  00175 00188*
 P 0143    FTRNS6  00192 00194*
 P 014F    FTRNS7  00190 00202*
 P 0152    FTRNS8  00186 00204*
 P 0163    FTRNS9  00209 00213*
 P 016E    FTRNSA  00207 00220*
 P 0178    FTRNSB  00200 00226*
```

```
P  017D  FTRNSC  00222  00224  00229*
P  0194  FTRNSD  00238  00242*
P  01A3  FTRNSE  00237  00240  00251*
P  01B0  FTRNSF  00249  00258*
P  01DE  FTRNSG  00285  00288*
R         J15     00019*00299  00306  00331  00393
R         JL40FS  00019*00043  00406
R         JL50FS  00019*00058  00301
R         JLAOFS  00019*00046  00298
RB        LALB7   00008*00341  00342  00378  00379  00382  00383  00385  00386
RB        LNTB    00008*00194  00229  00230  00245  00246
RB        LPTB    00008*00181  00233  00234  00254  00255
RP        MULT16  00015*00063  00092
RP        MULT8   00015*00055
R         NEWAL   00019*00032  00087  00121  00226
RB        NNTR    00008*00163  00191  00196  00221  00242
RB        NPTR    00008*00164  00178  00183  00223  00251
RP        OFFX    00015*00044  00048  00060  00302  00407
R         PER7    00020*00081  00093  00102
R         PERIOD  00020*00080  00091  00288  00289
R         PFF     00020*00399  00402
R         PREVB   00020*00162  00176  00185  00188  00202
RP        READSR  00015*00127
R         SBZ     00020*00072  00073  00314  00315  00324  00325
RP        SCRL1B  00016*00133
RB        SCRTCH  00009*00098  00099  00268  00269  00277  00278
RP        SFLG1   00016*00119
RP        SFLG4   00016*00033  00400
RP        SINT15  00016*00434
RP        SINT8   00016*00052
RB        TEMP3   00009*00065  00066  00244  00253  00272  00273  00281  00307  00308
                  00310  00316  00317  00326  00327  00332  00333  00334  00361  00362
                  00380  00381  00419  00420  00433
RB        TEMP4   00009*00350  00351  00367  00368
R         TOTB    00020*00056  00057  00206

00001                     NAM     F15E
00002                     OPT     REL, CREF, LLEN=80
00003                     TTL     FLOW PAGES 15E THRU 15J
00004                     IDNT    FEB.   22, 1978

00006                     XREF    BSCT:AFXRF, ALFA, BADS7, BADS8, DIW
00007                     XREF    BSCT:FALB7, FALB8, FR1, FR4, K5
00008                     XREF    BSCT:LALB7, LD, LI, MISAL, T7BL, TEMP, W7, W8

00010                     XREF    PSCT:CBLOCK, CFLG4, CMPIDX, COMK5, COMP16
00011                     XREF    PSCT:DFALB, DSTLD1, DTOBTD
00012                     XREF    PSCT:OFFX, SFLG4, SMDW4

00014                     XREF    BA9S, BL9, CAR, DW7, DW8, FAS
00015                     XREF    JL50FS, K5A, MAXMIS, MDW, POL, REDO
00016                     XREF    T7AD, T8AD, T8BL, T9AD, TOTMA

00018                     XDEF    ARSMDW, SBTR9, CRTT9

00020P 0000                PSCT

00022                  *
00023                  * ARSMDW - USE AF/RF TO SET MDW, 13-17
00024                  *
00025                  * FLOW PAGE 15E
00026                  *
00027P 0000 96 00      A ARSMDW LDAA  FR1
00028P 0002 85 00      A         BITA  #FAS         IS FAS = 1?
00029P 0004 26 11 0017           BNE   AMDW00       IF YES...BRANCH
00030P 0006 CE 0012    A         LDX   #MDW+18
00031P 0009 DF 00      A         STX   TEMP         TERMINATOR FOR CBLOCK
00032P 000B CE 000C    A         LDX   #MDW+12
```

```
00033P 000E BD 0000  A              JSR    CBLOCK   MDW, 13-18 = "      "
00034P 0011 CE 03E8  A              LDX    #1000
00035P 0014 DF 00    A              STX    AFXRF    AF/RF = 1000
00036P 0016 39                      RTS 00038P 0017 96 00    A  AMDW00 LDAA  AFXRF
00039P 0019 D6 01    A              LDAB   AFXRF+1  CONVERT AF/RF INTO
00040P 001B BD 0000  A              JSR    DTOBTD   DTO CHARACTER STRING
00041P 001E 31                      INS             SKIP OVER SIGN
00042P 001F 31                      INS             SKIP OVER FIRST DIGIT
00043P 0020 CE 0000  A              LDX    #MDW     POINT TO MDW
00044P 0023 32                      PULA
00045P 0024 A7 0C    A              STAA   12,X     MDW, 13
00046P 0026 86 1D    A              LDAA   #29      DTO PERIOD
00047P 0028 A7 0D    A              STAA   13,X     MDW, 14 = "."
00048P 002A 32                      PULA
00049P 002B A7 0E    A              STAA   14,X     MDW, 15
00050P 002D 32                      PULA
00051P 002E A7 0F    A              STAA   15,X     MDW, 16
00052P 0030 32                      PULA
00053P 0031 A7 10    A              STAA   16,X     MDW, 17
00054P 0033 6F 11    A              CLR    17,X     MDW, 18 = " "
00055P 0035 39                      RTS
00057                          *
00058                          * SBTR9 - SET THE 1000 STORAGE BITS
00059                          *           OF TRACE 9
00060                          *
00061                          * FLOW PAGE 15F
00062                          *
00063P 0036 BD 0000  A  SBTR9  JSR    DFALB    DETERMINE FALB7 & FALB8,
00064                          *                SET PFF
00065P 0039 CE 007D  A              LDX    #BA9S+125
00066P 003C DF 00    A              STX    TEMP
00067P 003E CE 0000  A              LDX    #BA9S
00068P 0041 BD 0000  A              JSR    CBLOCK   (BA9S) THRU (BA9S+124) = 0
00069P 0044 CE 0000  A              LDX    #FALB7   POINT TO FALB7
00070P 0047 BD 00CE  P              JSR    SBTR9F   ACCA = FALB7 BITS 9-3
00071                          *                    ACCB = 7-FALB7 BITS 2-0
00072P 004A DE 00    A              LDX    BADS7
00073P 004C BD 0000  A              JSR    OFFX     INDEX = BADS(7)+FALB7 BITS 9-3
00074P 004F FF 0000  A              STX    T7AD     T7AD = BADS(7)+FALB7 BITS 9-3
00075P 0052 D7 00    A              STAB   T7BL     T7BL = 7-FALB7 BITS 2-0
00076P 0054 E6 00    A              LDAB   0,X
00077P 0056 D7 00    A              STAB   W7       W7 = (T7AD)

00079P 0058 CE 0000  A              LDX    #BA9S
00080P 005B BD 0000  A              JSR    OFFX
00081P 005E FF 0000  A              STX    T9AD     T9AD = #BA9S+FALB7 BITS 9-3
00082P 0061 CE 0000  A              LDX    #FALB8   POINT TO FALB8
00083P 0064 8D 68 00CE             BSR    SBTR9F   ACCA = FALB8 BITS 9-3
00084                          *                    ACCB = 7-FALB8 BITS 2-0
00085P 0066 DE 00    A              LDX    BADS8
00086P 0068 BD 0000  A              JSR    OFFX
00087P 006B FF 0000  A              STX    T8AD     T8AD = BADS(8)+FALB8 BITS 9-3
00088P 006E F7 0000  A              STAB   T8BL     T8BL = 7-FALB8 BITS 2-0

00090P 0071 E6 00    A              LDAB   0,X
00091P 0073 D7 00    A              STAB   W8       W8 = (T8AD)
00092P 0075 CE 0000  A              LDX    #0
00093P 0078 DF 00    A              STX    MISAL    MISAL = 0
00094P 007A FF 0000  A              STX    MAXMIS   MAXMIS = 0
00095P 007D CE 01F4  A              LDX    #500
00096P 0080 DF 00    A              STX    ALFA     ALFA = 500
00097P 0082 86 00    A              LDAA   #REDO
00098P 0084 BD 0000  A              JSR    CFLG4    REDO = 0
00099P 0087 CE 0000  A              LDX    #0
00100P 008A FF 0000  A              STX    TOTMA    TOTMA = 0
00101P 008D 7F 0000  A              CLR    DIW      DIW = 0

00103P 0090 96 00    A  SBTR9A LDAA   LALB7
00104P 0092 D6 01    A              LDAB   LALB7+1
00105P 0094 DE 00    A              LDX    FALB7
00106P 0096 BD 0000  A              JSR    CMPIDX   IS LALB7 < FALB7?
00107P 0099 2D 07 00A2             BLT    SBTR9B   IF YES... BRANCH
```

```
00108P 009B 08                          INX
00109P 009C DF 00      A                STX     FALB7           FALB7 = FALB7+1
00110P 009E 8D 40 00E0                  BSR     SSBT9           SET A STORAGE BIT IN TRACE 9
00111                           *                               (SHEET 1)
00112P 00A0 20 EE 0090                  BRA     SBTR9A 00114P 00A2 B6 0000    A SBTR9B LDAA    MAXMIS
00115P 00A5 F6 0001    A        LDAB    MAXMIS+1
00116P 00A8 DE 00      A        LDX     MISAL
00117P 00AA BD 0000    A        JSR     CMPIDX          IS MAXMIS < MISAL?
00118P 00AD 2C 03 00B2          BGE     SBTR9X          IF NOT... BRANCH
00119P 00AF FF 0000    A        STX     MAXMIS          MAXMIS = MISAL
00120P 00B2 96 00      A SBTR9X LDAA    T7BL
00121P 00B4 81 07      A        CMPA    #7              IS T7BL = 7?
00122P 00B6 27 15 00CD          BEQ     SBTR9E          IF YES... BRANCH 00124P 00B8 4D           SBTR9C TSTA                    IS T7BL = 0?
00125P 00B9 27 08 00C3          BEQ     SBTR9D          IF YES... BRANCH
00126P 00BB 4A                  DECA
00127P 00BC 97 00      A        STAA    T7BL            T7BL = T7BL-1
00128P 00BE 78 0000    A        ASL     DIW             SHIFT LEFT DIW
00129P 00C1 20 F5 00B8          BRA     SBTR9C 00131P 00C3 78 0000    A SBTR9D ASL     DIW             SHIFT LEFT DIW
00132P 00C6 FE 0000    A        LDX     T9AD
00133P 00C9 96 00      A        LDAA    DIW
00134P 00CB A7 00      A        STAA    0,X             (T9AD) = DIW 00136P 00CD 39           SBTR9E RTS 00138P 00CE A6 01      A SBTR9F LDAA    1,X             INDEX POINTS TO DOUBLE
00139P 00D0 E6 00      A        LDAB    0,X             ... BYTE VARIABLE
00140P 00D2 54                  LSRB
00141P 00D3 46                  RORA                    PUT BITS 10-3 IN ACCA
00142P 00D4 56                  RORB                    (BIT 10 IS 0)
00143P 00D5 46                  RORA
00144P 00D6 56                  RORB
00145P 00D7 46                  RORA
00146P 00D8 56                  RORB                    PUT BITS 2-0 IN ACCB
00147P 00D9 53                  COMB                    7-BITS 2-0
00148P 00DA 54                  LSRB
00149P 00DB 54                  LSRB
00150P 00DC 54                  LSRB
00151P 00DD 54                  LSRB
00152P 00DE 54                  LSRB                    SHIFT RIGHT 5 BITS
00153P 00DF 39                  RTS
00155                   *
00156                   * SSBT9 - SET A STORAGE BIT IN TRACE 9
00157                   *          (SHEET 1)
00158                   *
00159                   * FLOW PAGE 15G
00160                   *
00161P 00E0 96 00      A SSBT9  LDAA    T7BL
00162P 00E2 BD 017A    P        JSR     SSBT9M          ACCB HAS "AND" MASK FOR W7
00163P 00E5 D4 00      A        ANDB    W7              EXTRACT THE "T7BL" BIT FROM W7
00164P 00E7 37                  PSHB                    SAVE
00165P 00E8 B6 0000    A        LDAA    T8BL
00166P 00EB BD 017A    P        JSR     SSBT9M          ACCB HAS "AND" MASK FOR W8
00167P 00EE 32                  PULA                    RESTORE W7 BIT "T7BL"
00168P 00EF D5 00      A        BITB    W8              EXTRACT THE "T8BL" BIT FROM W8
00169P 00F1 27 05 00F8          BEQ     SSBT9A          BRANCH IF BIT = 0
00170P 00F3 4D                  TSTA                    IS W7 BIT "T7BL" = 1?
00171P 00F4 26 33 0129          BNE     SSBT90          IF YES... BRANCH SINCE
00172                   *                               W7 BIT "T7BL" = W8 BIT "T8BL"
00173P 00F6 20 03 00FB          BRA     SSBT9B          ... ELSE THE TWO BITS ARE NOT =

00175P 00F8 4D           SSBT9A TSTA                    IS W7 BIT "T7BL" = 0?
00176P 00F9 27 2E 0129          BEQ     SSBT90          IF YES... BRANCH SINCE
00177                   *                               W7 BIT "T7BL" = W8 BIT "T8BL"
00178P 00FB 37           SSBT9B PSHB
00179P 00FC 86 00      A        LDAA    #CAR
```

```
00180P 00FE BD 0000  A           JSR    SFLG4     CAR = 1
00181P 0101 33                   PULB
00182P 0102 86 00    A           LDAA   #POL      PRESET ACCA = POL
00183P 0104 DE 00    A           LDX    MISAL     IS MISAL = 0?
00184P 0106 26 09 0111            BNE    SSBT9C    IF NOT...BRANCH
00185P 0108 D5 00    A           BITB   W8        IS W8 BIT "T8BL" = 0?
00186P 010A 26 13 011F            BNE    SSBT9E    IF NOT...BRANCH
00187P 010C BD 0000  A           JSR    CFLG4     POL = 0
00188P 010F 20 11 0122            BRA    SSBT9F 00190P 0111 D5 00    A SSBT9C    BITB   W8        IS W8 BIT "T8BL" = 0?
00191P 0113 26 06 011B            BNE    SSBT9D    IF NOT...BRANCH
00192P 0115 95 00    A           BITA   FR4       IS POL = 0?
00193P 0117 26 15 012E            BNE    SSBT9G    IF NOT...BRANCH
00194P 0119 20 07 0122            BRA    SSBT9F 00196P 011B 95 00    A SSBT9D    BITA   FR4       IS POL = 0?
00197P 011D 27 0F 012E            BEQ    SSBT9G    IF YES...BRANCH
00198P 011F BD 0000  A SSBT9E    JSR    SFLG4     POL = 1

00200P 0122 DE 00    A SSBT9F    LDX    MISAL
00201P 0124 08                   INX
00202P 0125 DF 00    A           STX    MISAL     MISAL = MISAL+1
00203P 0127 20 1A 0143            BRA    SSBT9I 00205P 0129 86 00    A SSBT9O    LDAA   #CAR
00206P 012B BD 0000  A           JSR    CFLG4     CAR = 0

00208P 012E 96 00    A SSBT9G    LDAA   MISAL
00209P 0130 D6 01    A           LDAB   MISAL+1
00210P 0132 CE 0000  A           LDX    #MAXMIS
00211P 0135 BD 0000  A           JSR    COMP16    IS MISAL > MAXMIS?
00212P 0138 2F 04 013E            BLE    SSBT9H    IF NOT...BRANCH
00213P 013A A7 00    A           STAA   0,X
00214P 013C E7 01    A           STAB   1,X       MAXMIS = MISAL 00216P 013E CE 0000  A SSBT9H    LDX    #0
00217P 0141 DF 00    A           STX    MISAL     MISAL = 0

00219P 0143 86 00    A SSBT9I    LDAA   #REDO
00220P 0145 95 00    A           BITA   FR4       IS REDO = 1?
00221P 0147 27 1B 0164            BEQ    SSBT9J    IF NOT...BRANCH
00222P 0149 BD 0000  A           JSR    CFLG4     REDO = 0
00223P 014C 96 00    A           LDAA   ALFA
00224P 014E D6 01    A           LDAB   ALFA+1
00225P 0150 C0 E8    A           SUBB   #$E8
00226P 0152 82 03    A           SBCA   #$03      NOTE: $3E8 = 1000 DECIMAL
00227P 0154 97 00    A           STAA   ALFA
00228P 0156 D7 01    A           STAB   ALFA+1    ALFA = ALFA-1000
00229P 0158 BD 01D3  P           JSR    DT8BL     DECREMENT T8BL
00230P 015B 86 00    A           LDAA   #CAR
00231P 015D 95 00    A           BITA   FR4       IS CAR = 1?
00232P 015F 26 0C 016D            BNE    SSBT9K    IF YES...BRANCH
00233P 0161 7E 00E0  P           JMP    SSBT9

00235P 0164 96 00    A SSBT9J    LDAA   #CAR
00236P 0166 95 00    A           BITA   FR4       IS CAR = 1?
00237P 0168 26 03 016D            BNE    SSBT9K    IF YES...BRANCH
00238P 016A 0C                   CLC              CARRY = 0
00239P 016B 20 08 0175            BRA    SSBT9L 00241P 016D FE 0000  A SSBT9K    LDX    TOTMA
00242P 0170 08                   INX
00243P 0171 FF 0000  A           STX    TOTMA     TOTMA = TOTMA+1
00244P 0174 0D                   SEC              CARRY = 1

00246P 0175 79 0000  A SSBT9L    ROL    DIW       DIW = DIW ROTATED LEFT
00247P 0178 20 08 0182            BRA    SSBT92    SET A STORAGE BIT IN TRACE 9
00248                    *                         (SHEET 2)... AND EXIT 00250P 017A 4C               SSBT9M INCA
00251P 017B 5F                      CLRB
00252P 017C 0D                      SEC
```

```
00253P 017D 59              SSBT9N  ROLB                SHIFT BIT INTO PLACE
00254P 017E 4A                      DECA
00255P 017F 26 FC 017D              BNE     SSBT9N      ... AND LOOP
00256P 0181 39                      RTS

00258                       *
00259                       * SSBT92 - SET A STORAGE BIT IN TRACE 9
00260                       *          (SHEET 2)
00261                       *
00262                       * FLOW PAGE 15H
00263                       *
00264P 0182 96 00    A      SSBT92  LDAA    T7BL        IS T7BL = 0?
00265P 0184 27 03 0189              BEQ     SBT92A      IF YES...BRANCH
00266P 0186 4A                      DECA                T7BL = T7BL-1
00267P 0187 20 18 01A1              BRA     SBT92B 00269P 0189 FE 0000  A      SBT92A  LDX     T9AD
00270P 018C 96 00    A              LDAA    DIW
00271P 018E A7 00    A              STAA    0,X         (T9AD) = DIW
00272P 0190 08                      INX
00273P 0191 FF 0000  A              STX     T9AD        T9AD = T9AD+1
00274P 0194 FE 0000  A              LDX     T7AD
00275P 0197 08                      INX
00276P 0198 FF 0000  A              STX     T7AD        T7AD = T7AD+1
00277P 019B A6 00    A              LDAA    0,X
00278P 019D 97 00    A              STAA    W7          W7 = (T7AD)
00279P 019F 86 07    A              LDAA    #7          T7BL = 7

00281P 01A1 97 00    A      SBT92B  STAA    T7BL
00282P 01A3 96 00    A              LDAA    ALFA
00283P 01A5 D6 01    A              LDAB    ALFA+1
00284P 01A7 DB 01    A              ADDB    AFXRF+1
00285P 01A9 99 00    A              ADCA    AFXRF
00286P 01AB 97 00    A              STAA    ALFA
00287P 01AD D7 01    A              STAB    ALFA+1      ALFA = ALFA+AF/RF
00288P 01AF CE 03E8  A              LDX     #1000
00289P 01B2 BD 0000  A              JSR     CMPIDX      IS ALFA > 1000?
00290P 01B5 2F 1B 01D2              BLE     SBT92C      IF NOT...BRANCH
00291P 01B7 8D 1A 01D3              BSR     DT8BL       DECREMENT T8BL
00292P 01B9 96 00    A              LDAA    ALFA
00293P 01BB D6 01    A              LDAB    ALFA+1
00294P 01BD C0 E8    A              SUBB    #$E8
00295P 01BF 82 03    A              SBCA    #$03        NOTE: $3E8 = 1000 DECIMAL
00296P 01C1 97 00    A              STAA    ALFA
00297P 01C3 D7 01    A              STAB    ALFA+1      ALFA = ALFA-1000
00298P 01C5 CE 03E8  A              LDX     #1000
00299P 01C8 BD 0000  A              JSR     CMPIDX      IS ALFA > 1000?
00300P 01CB 2F 05 01D2              BLE     SBT92C      IF NOT...BRANCH
00301P 01CD 86 00    A              LDAA    #REDO
00302P 01CF 7E 0000  A              JMP     SFLG4       REDO = 1 ... AND EXIT
00303P 01D2 39              SBT92C  RTS

00305                       *
00306                       * DT8BL -DECREMENT T8BL
00307                       *
00308                       * FLOW PAGE 15I
00309                       *
00310P 01D3 B6 0000  A      DT8BL   LDAA    T8BL        IS T8BL = 0?
00311P 01D6 27 03 01DB              BEQ     DT8BL1      IF YES...BRANCH
00312P 01D8 4A                      DECA                T8BL = T8BL-1
00313P 01D9 20 0D 01E8              BRA     DT8BL2

00315P 01DB FE 0000  A      DT8BL1  LDX     T8AD
00316P 01DE 08                      INX
00317P 01DF FF 0000  A              STX     T8AD        T8AD = T8AD+1
00318P 01E2 E6 00    A              LDAB    0,X
00319P 01E4 D7 00    A              STAB    W8          W8 = (T8AD)
00320P 01E6 86 07    A              LDAA    #7          T8BL = 7
00321P 01E8 B7 0000  A      DT8BL2  STAA    T8BL
00322P 01EB 39                      RTS

00324                       *
00325                       * CRTT9 - CHANGE "R" TRACES & TRACE 9
```

```
00326                           *
00327                           * FLOW PAGE 15J
00328                           *
00329P 01EC DE 00     A CRTT9   LDX     BADS8       GET POINTER TO TRACE 8
00330P 01EE A6 00     A         LDAA    JL50FS,X
00331P 01F0 E6 01     A         LDAB    JL50FS+1,X  GET J(8,5)
00332P 01F2 BD 0000   A         JSR     COMK5
00333                           * ACCA,ACCB = 50+INT[(J(8,5)-50)*1000/(AF/RF)]
00334P 01F5 97 00     A         STAA    K5
00335P 01F7 D7 01     A         STAB    K5+1
00336P 01F9 B7 0000   A         STAA    K5A
00337P 01FC F7 0001   A         STAB    K5A+1       K5A = K5
00338P 01FF BD 0000   A         JSR     SMDW4       USE K5 TO SET MDW,30-34
00339P 0202 86 FF     A         LDAA    #255-0
00340P 0204 B7 0000   A         STAA    BL9         BL(9) = 1'S COMPLEMENT OF 0
00341P 0207 B6 0000   A         LDAA    DW8
00342P 020A 81 11     A         CMPA    #17         IS DW(8),1 = "R"?
00343P 020C 26 20 022E          BNE     CRTT9A      IF NOT...BRANCH
00344P 020E 86 08     A         LDAA    #8
00345P 0210 97 00     A         STAA    LD          LD = 8
00346P 0212 97 00     A         STAA    LI          LI = 8
00347P 0214 BD 0000   A         JSR     DSTLD1      DISPLAY AND/OR SHIFT TRACE LD
00348                           *                   (SHEET 1)
00349P 0217 B6 0000   A         LDAA    DW7
00350P 021A 81 0B     A         CMPA    #11         IS DW(7),1 = "A"?
00351P 021C 26 10 022E          BNE     CRTT9A      IF NOT...BRANCH
00352P 021E 86 07     A         LDAA    #7
00353P 0220 97 00     A         STAA    LD          LD = 7
00354P 0222 97 00     A         STAA    LI          LI = 7
00355P 0224 BD 0000   A         JSR     DSTLD1      DISPLAY AND/OR SHIFT TRACE LD
00356                           *                   (SHEET 1)
00357P 0227 86 09     A         LDAA    #9
00358P 0229 97 00     A         STAA    LI          LI = 9
00359P 022B BD 0000   A         JSR     DSTLD1      DISPLAY AND/OR SHIFT TRACE LD
00360                           *                   (SHEET 1)
00361P 022E 86 06     A CRTT9A  LDAA    #6
00362P 0230 97 00     A         STAA    LD          LD = 6
00363P 0232 97 00     A         STAA    LI          LI = 6
00364P 0234 BD 0000   A CRTT9B  JSR     DSTLD1      DISPLAY AND/OR SHIFT TRACE LD
00365                           *                   (SHEET 1)
00366P 0237 7A 0000   A         DEC     LI          LI = LI-1
00367P 023A 7A 0000   A         DEC     LD          LD = LD-1
00368P 023D 26 F5 0234          BNE     CRTT9B      BRANCH IF LD <> 0
00369P 023F 39                  RTS
00371P 0240    00     A         FCB     0           CRC BYTE
00372                           END
TOTAL ERRORS 00000

RB       AFXRF   00006*00035 00038 00039 00284 00285
RB       ALFA    00006*00096 00223 00224 00227 00228 00282 00283 00286 00287
                 00292 00293 00296 00297
 P 0017  AMDW00  00029 00038*
DP 0000  ARSMDW  00018 00027*
R        BA9S    00014*00065 00067 00079
RB       BADS7   00006*00072
RB       BADS8   00006*00085 00329
R        BL9     00014*00340
R        CAR     00014*00179 00205 00230 00235
RP       CBLOCK  00010*00033 00068
RP       CFLG4   00010*00098 00187 00206 00222
RP       CMPIDX  00010*00106 00117 00289 00299
RP       COMK5   00010*00332
RP       COMP16  00010*00211
DP 01EC  CRTT9   00018 00329*
 P 022E  CRTT9A  00343 00351 00361*
 P 0234  CRTT9B  00364*00368
RP       DFALB   00011*00063
RB       DIW     00006*00101 00128 00131 00133 00246 00270
RP       DSTLD1  00011*00347 00355 00359 00364
 P 01D3  DTSBL   00229 00291 00310*
```

```
P  01DB  DT8BL1  00311 00315*
P  01E8  DT8BL2  00313 00321*
RP       DTOBTD  00011*00040
R        DW7     00014*00349
R        DW8     00014*00341
RB       FALB7   00007*00069 00105 00109
RB       FALB8   00007*00082
R        FAS     00014*00028
RB       FR1     00007*00027
RB       FR4     00007*00192 00196 00220 00231 00236
R        JL50FS  00015*00330 00331
RB       K5      00007*00334 00335
R        K5A     00015*00336 00337
RB       LALB7   00008*00103 00104
RB       LD      00008*00345 00353 00362 00367
RB       LI      00008*00346 00354 00358 00363 00366
R        MAXMIS  00015*00094 00114 00115 00119 00210
R        MDW     00015*00030 00032 00043
RB       MISAL   00008*00093 00116 00183 00200 00202 00208 00209 00217
RP       OFFX    00012*00073 00080 00086
R        POL     00015*00182
R        REDO    00015*00097 00219 00301
P  0189  SBT92A  00265 00269*
P  01A1  SBT92B  00267 00281*
P  01D2  SBT92C  00290 00300 00303*
DP 0036  SBTR9   00018 00063*
P  0090  SBTR9A  00103*00112
P  00A2  SBTR9B  00107 00114*
P  00B8  SBTR9C  00124*00129
P  00C3  SBTR9D  00125 00131*
P  00CD  SBTR9E  00122 00136*
P  00CE  SBTR9F  00070 00083 00138*
P  00F2  SBTR9X  00118 00120*
RP       SFLG4   00012*00180 00198 00302
RP       SMDW4   00012*00338
P  00E0  SSBT9   00110 00161*00233
P  0182  SSBT92  00247 00264*
P  00F8  SSBT9A  00169 00175*
P  00FB  SSBT9B  00173 00178*
P  0111  SSBT9C  00184 00190*
P  011B  SSBT9D  00191 00196*
P  011F  SSBT9E  00186 00198*
P  0122  SSBT9F  00188 00194 00200*
P  012E  SSBT9G  00193 00197 00208*
P  013E  SSBT9H  00212 00216*
P  0143  SSBT9I  00203 00219*
P  0164  SSBT9J  00221 00235*
P  016D  SSBT9K  00232 00237 00241*
P  0175  SSBT9L  00239 00246*
P  017A  SSBT9M  00162 00166 00250*
P  017D  SSBT9N  00253*00255
P  0129  SSBT9O  00171 00176 00205*
R        T7AD    00016*00074 00274 00276
RB       T7BL    00008*00075 00120 00127 00161 00264 00281
R        T8AD    00016*00087 00315 00317
R        T8BL    00016*00088 00165 00310 00321
R        T9AD    00016*00081 00132 00269 00273
PP       TEMP    00008*00031 00066
R        TOTMA   00016*00100 00241 00243
RB       W7      00008*00077 00163 00278
RB       W8      00008*00091 00168 00185 00190 00319

00001                    NAM    F16
00002                    OPT    REL,CREF,LLEN=80
00003                    TTL    FLOW PAGES 16 THRU 17I
00004                    IDNT   FEB.  21, 1978

00006                    XREF   BSCT:A2,A3,FR2,K3,LITE1,T1,T4

00008                    XREF   PSCT:CANCP,CANLOG,CFLG2,CMPIDX
00009                    XREF   PSCT:DELAY,READSR
```

```
00010                           XREF    PSCT:SCDSD, SCTP, SCTSL, SCTSO, SCTT
00011                           XREF    PSCT:SETDW, SMDW2

00013                           XREF    AT, TDF

00015                           XDEF    DT1MS, SCNATT 00017P 0000                     PSCT

00019                   *
00020                   * SCNATT - SCAN A3 / K3 THRU K8 CONTROLS
00021                   *
00022                   * FLOW PAGE 16
00023                   *
00024P 0000 8D 10 0012  SCNATT  BSR     SCDT    SCAN DATA THRESHOLD CONTROL
00025                   *                       (A3/K3)
00026P 0002 BD 0000  A          JSR     SCDSD   SCAN DATA SEC/DIV CONTROL (K4)
00027P 0005 BD 0000  A          JSR     SCTP    SCAN TRIGGER POSITION CONTROL (K5)
00028P 0008 BD 0000  A          JSR     SCTSL   SCAN TRIGGER SLOPE CONTROL (K6)
00029P 000B BD 0000  A          JSR     SCTT    SCAN TRIGGER THRESHOLD CONTROL
00030                   *                       (K7)
00031P 000E BD 0000  A          JSR     SCTSO   SCAN TRIGGER SOURCE CONTROL (K8)
00032P 0011 39                  RTS

00034                   *
00035                   * SCDT - SCAN DATA THRESHOLD CONTROL (A3/K3)
00036                   *
00037                   * FLOW PAGE 17A
00038                   *
00039P 0012 96 00    A  SCDT    LDAA    LITE1
00040P 0014 85 00    A          BITA    #AT     IS AT = 1?
00041P 0016 27 48 0060          BEQ     SCDTY   WHEN AT = 0,
00042                   *                       SCAN DATA THRESHOLD,
00043                   *                       IF PERMITTED ... AND EXIT 00045P 0018 20 00 001A          BRA     SCDTX   WHEN AT = 1,
00046                   *                       SCAN DATA THRESHOLD
00047                   *                       CONTROL (A3) ... AND EXIT

00049                   *
00050                   * SCDTX - WHEN AT = 1, SCAN DATA THRESHOLD CONTROL
00051                   *         (A3)
00052                   *
00053                   * FLOW PAGE 17B
00054                   *
00055P 001A BD 0000  A  SCDTX   JSR     READSR  READ SWITCH REGISTERS
00056P 001D 81 24    A          CMPA    #$24    IS DATA THRESHOLD CONTROL UP?
00057P 001F 27 10 0031          BEQ     SCDTX1  IF YES... BRANCH
00058P 0021 81 23    A          CMPA    #$23    IS DATA THRESHOLD CONTROL DOWN?
00059P 0023 26 1F 0044          BNE     SCDTX3  IF NOT... BRANCH
00060P 0025 96 00    A          LDAA    A3      NOTE: A3 IS INT8*2
00061P 0027 81 01    A          CMPA    #1      IS A3 = .5?
00062P 0029 27 10 003B          BEQ     SCDTX2  IF YES... BRANCH
00063P 002B 8D 18 0045          BSR     SCDNLV  GET NEXT LOWER VALUE OF A3
00064P 002D 97 00    A          STAA    A3
00065P 002F 20 0A 003B          BRA     SCDTX2

00067P 0031 96 00    A  SCDTX1  LDAA    A3      NOTE: A3 IS INT8*2
00068P 0033 81 14    A          CMPA    #20     IS A3 = 10?
00069P 0035 27 0D 0044          BEQ     SCDTX3  IF YES... BRANCH
00070P 0037 8D 17 0050          BSR     SCDNHV  GET NEXT HIGHER VALUE OF A3
00071P 0039 97 00    A          STAA    A3

00073P 003B 7F 0000  A  SCDTX2  CLR     A2      A2 = 0
00074P 003E BD 0000  A          JSR     SETDW   USE A2 AND A3
00075                   *                       TO SET DW(1) THRU DW(5)
00076P 0041 7E 0000  A          JMP     CANCP   CLEAR ANALOG, NO CONTROLS PRESSED
00077                   *                       ... AND EXIT
```

```
00079P 0044 39              SCDTX3 RTS 00081P 0045 CE 005A P SCDNLV LDX    #SCDTBL-1  START AT LOW END OF TABLE
00082P 0048 08            SCDNL0 INX             INCREMENT
00083P 0049 A1 01    A           CMPA   1,X      DOES ACCA = TABLE ENTRY?
00084P 004B 26 FB 0048           BNE    SCDNL0   IF NOT...BRANCH
00085P 004D A6 00    A           LDAA   0,X      PICK UP NEXT LOWER VALUE
00086P 004F 39                   RTS 00088P 0050 CE 005A P SCDNHV LDX    #SCDTBL-1  START AT LOW END OF TABLE
00089P 0053 08            SCDNH0 INX             INCREMENT
00090P 0054 A1 00    A           CMPA   0,X      DOES ACCA = TABLE ENTRY?
00091P 0056 26 FB 0053           BNE    SCDNH0   IF NOT...BRANCH
00092P 0058 A6 01    A           LDAA   1,X      PICK UP NEXT HIGHER VALUE
00093P 005A 39                   RTS 00095P 005B    01    A SCDTBL FCB    1,2,4,10,20
      P 005C    02    A
      P 005D    04    A
      P 005E    0A    A
      P 005F    14    A

00097                       *
00098                       * SCDTY - WHEN AT = 0, SCAN DATA THRESHOLD
00099                       *              CONTROL K3
00100                       *
00101                       * FLOW PAGE 17E
00102                       *
00103P 0060 86 16    A SCDTY  LDAA   #22
00104P 0062 97 00    A        STAA   T1        T1 = 22
00105P 0064 BD 0000  A SCDTY9 JSR    READSR    READ SWITCH REGISTERS
00106P 0067 DE 00    A        LDX    K3        NOTE: K3 IS INT15*10
00107P 0069 81 24    A        CMPA   #$24      IS DATA THRESHOLD +25V
00108                       *                   PRESSED?
00109P 006B 27 10 007D        BEQ    SCDTY1    IF YES...BRANCH
00110P 006D 81 23    A        CMPA   #$23      IS DATA THRESHOLD -25V
00111                       *                   PRESSED?
00112P 006F 26 14 0085        BNE    SCDTY2    IF NOT...BRANCH
00113P 0071 86 FF    A        LDAA   #$FF
00114P 0073 C6 06    A        LDAB   #$06      ACCA,ACCB = -250
00115P 0075 BD 0000  A        JSR    CMPIDX    IS K3 = -250?
00116P 0078 27 0B 0085        BEQ    SCDTY2    IF YES...BRANCH
00117P 007A 09                DEX              K3 = K3-1
00118P 007B 20 0D 008A        BRA    SCDTY4
00119P 007D 4F         SCDTY1 CLRA
00120P 007E C6 FA    A        LDAB   #250
00121P 0080 BD 0000  A        JSR    CMPIDX    IS K3 = 250?
00122P 0083 26 04 0089        BNE    SCDTY3    IF NOT...BRANCH
00123P 0085 7F 0000  A SCDTY2 CLR    T1        T1 = 0
00124P 0088 39                RTS 00126P 0089 08         SCDTY3 INX              K3 = K3+1
00127P 008A DF 00    A SCDTY4 STX    K3
00128P 008C BD 0000  A        JSR    SMDW2     USE K3 TO SET MDW, 7-11
00129P 008F 8D 02 0093        BSR    DT1MS     DELAY T1 MS.,
00130                       *                   THEN REDUCE T1
00131P 0091 20 D1 0064        BRA    SCDTY9

00133                       *
00134                       * DT1MS - DELAY T1 MSEC., THEN REDUCE T1
00135                       *
00136                       * FLOW PAGE 17I
00137                       *
00138P 0093 86 03    A DT1MS  LDAA   #3
00139P 0095 97 00    A        STAA   T4        T4 = 3
00140P 0097 BD 0000  A        JSR    CANLOG    CLEAR ANALOG TRACE, IF REQD.
00141P 009A 96 00    A        LDAA   T4

00143P 009C D6 00    A DT1MS1 LDAB   T1
00144P 009E 11                CBA              IS T4 > T1?
00145P 009F 22 1E 00BF        BHI    DT1MS2    IF YES...BRANCH
00146P 00A1 86 00    A        LDAA   #TDF
00147P 00A3 95 00    A        BITA   FR2
```

```
00148P 00A5 27 05 00AC           BEQ    DT1MS4    BRANCH IF TDF = 0
00149P 00A7 BD 0000    A         JSR    CFLG2     ...ELSE TDF _ 0
00150P 00AA 20 06 00B2           BRA    DT1MS5

00152P 00AC CE 01A9    A DT1MS4  LDX    #425
00153P 00AF BD 0000    A         JSR    DELAY     WAIT 30 MILLISECS.

00155P 00B2 BD 0000    A DT1MS5  JSR    READSR    READ SWITCH REGISTERS
00156P 00B5 27 16 00CD           BEQ    DT1MS3    BRANCH IF NO SWITCHES PRESSED
00157P 00B7 96 00      A         LDAA   T4
00158P 00B9 8B 03      A         ADDA   #3
00159P 00BB 97 00      A         STAA   T4        T4 = T4+3
00160P 00BD 20 DD 009C           BRA    DT1MS1

00162P 00BF C1 04      A DT1MS2  CMPB   #4        IS T1 < 4?
00163P 00C1 25 0A 00CD           BCS    DT1MS3    IF YES...BRANCH
00164P 00C3 C0 05      A         SUBB   #5
00165P 00C5 D7 00      A         STAB   T1        T1 = T1-5
00166P 00C7 CE 011D    A         LDX    #285
00167P 00CA 7E 0000    A         JMP    DELAY     WAIT 20 MS. ... AND EXIT 00169P 00CD 39                   DT1MS3 RTS       EXIT 00171P 00CE 00         A         FCB    0         CRC BYTE
00172                            END
TOTAL ERRORS 00000

RB      A2       00006*00073
  RB      A3       00006*00060 00064 00067 00071
  R       AT       00013*00040
  RP      CANCP    00008*00076
  RP      CANLOG   00008*00140
  RP      CFLG2    00008*00149
  RP      CMPIDX   00008*00115 00121
  RP      DELAY    00009*00153 00167
  DP 0093 DT1MS    00015 00129 00138*
   P 009C DT1MS1   00143*00160
   P 00BF DT1MS2   00145 00162*
   P 00CD DT1MS3   00156 00163 00169*
   P 00AC DT1MS4   00148 00152*
   P 00B2 DT1MS5   00150 00155*
  RB      FR2      00006*00147
  RB      K3       00006*00106 00127
  RB      LITE1    00006*00039
  RP      READSR   00009*00055 00105 00155
   P 0053 SCDNH0   00089*00091
   P 0050 SCDNHV   00070 00088*
   P 0048 SCDNL0   00082*00084
   P 0045 SCDNLV   00063 00081*
  RP      SCDSD    00010*00026
   P 0012 SCDT     00024 00039*
   P 005B SCDTBL   00081 00088 00095*
   P 001A SCDTX    00045 00055*
   P 0031 SCDTX1   00057 00067*
   P 003B SCDTX2   00062 00065 00073*
   P 0044 SCDTX3   00059 00069 00079*
   P 0060 SCDTY    00041 00103*
   P 007D SCDTY1   00109 00119*
   P 0085 SCDTY2   00112 00116 00123*
   P 0089 SCDTY3   00122 00126*
   P 008A SCDTY4   00118 00127*
   P 0064 SCDTY9   00105*00131
  DP 0000 SCNATT   00015 00024*
  RP      SCTP     00010*00027
  RP      SCTSL    00010*00028
  RP      SCTSO    00010*00031
  RP      SCTT     00010*00029
  RP      SETDW    00011*00074
  RP      SMDW2    00011*00128
  RB      T1       00006*00104 00123 00143 00165
  RB      T4       00006*00139 00141 00157 00159
  R       TDF      00013*00146
```

```
00001                            NAM    F18A
00002                            OPT    REL, CREF, LLEN=80
00003                            TTL    FLOW PAGES 18A THRU 18G
00004                            IDNT   FEB.    21, 1978

00006                            XREF   BSCT:FR2, K4, K4S, K5, K5S
00007                            XREF   BSCT:LD, LI, SH, T1, TEMP, TEMP4, TPL, TPR

00009                            XREF   PSCT:CBFK5, CBLOCK, CFLG2, COMP16, CMPPV2
00010                            XREF   PSCT:DELAY, DSTLD1, DT1MS, EINT15, ENTPV2
00011                            XREF   PSCT:FLPDIV, FLPMLT, K5MTPR, NHV, NLV
00012                            XREF   PSCT:PNTATT, READSR
00013                            XREF   PSCT:SCRL1C, SFLG2, SINT15
00014                            XREF   PSCT:SMDW1, SMDW4

00016                            XREF   JL1OFS, JL2OFS, MDW, OBL, NCF, TDF

00018                            XDEF   SCDSD, DSPDEL 00020P 0000                      PSCT

00022                    *
00023                    * SCDSD - SCAN DATA SEC/DIV CONTROL (K4)
00024                    *
00025                    * FLOW PAGE 18A
00026                    *
00027P 0000 86 16     A  SCDSD   LDAA   #22
00028P 0002 97 00     A          STAA   T1           T1 = 22
00029P 0004 BD 0000   A  SCDSD0  JSR    READSR       READ SWITCH REGISTERS
00030P 0007 81 42     A          CMPA   #$42         IS THE 5 SEC/DIV BUTTON PRESSED?
00031P 0009 27 4F 005A           BEQ    SCDSD2       IF YES...BRANCH
00032P 000B 81 41     A          CMPA   #$41         IS THE 50 NSEC/DIV BUTTON PRESSED?
00033P 000D 26 4A 0059           BNE    SCDSD1       IF NOT...BRANCH
00034P 000F 86 05     A          LDAA   #5           PV2 VARIABLE 5*10**-8
00035P 0011 C6 F8     A          LDAB   #$F8
00036P 0013 CE 0000   A          LDX    #K4          IS K4 = 5*10**-8 SECS?
00037P 0016 BD 0000   A          JSR    CMPPV2
00038P 0019 27 3E 0059           BEQ    SCDSD1       IF YES...BRANCH
00039P 001B BD 00AF  P           JSR    LK4IK5       K4 = NLV(K4), INCREASE K5
00040P 001E 4F                   CLRA
00041P 001F D6 00     A          LDAB   TPL 00043P 0021 58                   ASLB
00044P 0022 49                   ROLA                TIMES 2
00045P 0023 97 00     A          STAA   TEMP4
00046P 0025 D7 01     A          STAB   TEMP4+1      SAVE INTERMEDIATE RESULT 00048P 0027 58                   ASLB
00049P 0028 49                   ROLA 00051P 0029 58                   ASLB
00052P 002A 49                   ROLA                TIMES 8

00054P 002B DB 01     A          ADDB   TEMP4+1
00055P 002D 99 00     A          ADCA   TEMP4        TIMES 10
00056P 002F 97 00     A          STAA   TEMP4
00057P 0031 D7 01     A          STAB   TEMP4+1      TPL*10

00059P 0033 BD 0000   A          JSR    K5MTPR       ACCA, ACCB = K5-TPR*10
00060P 0036 CE 0000   A          LDX    #TEMP4       NOTE: K5 IS INT15*10
00061P 0039 BD 0000   A          JSR    COMP16       IS K5-TPR*10 > TPL*10?
00062P 003C 2E 18 0056           BGT    SCDSD9       IF YES...BRANCH 00064P 003E 36                   PSHA
00065P 003F 37                   PSHB
00066P 0040 96 00     A          LDAA   TEMP4
00067P 0042 D6 01     A          LDAB   TEMP4+1      GET TPL*10
```

```
00068P 0044 40                        NEGA
00069P 0045 50                        NEGB
00070P 0046 82 00     A               SBCA     #0           MAKE IT NEGATIVE
00071P 0048 97 00     A               STAA     TEMP4
00072P 004A D7 01     A               STAB     TEMP4+1      -TPL*10
00073P 004C 33                        PULB
00074P 004D 32                        PULA 00076P 004E CE 0000   A               LDX      #TEMP4
00077P 0051 BD 0000   A               JSR      COMP16       IS K5-TPR*10 < -TPL*10?
00078P 0054 2C 11 0067                BGE      SCDSD3       IF NOT...BRANCH
00079P 0056 7E 00B7   P  SCDSD9 JMP   BLMDW                 BLINK MDW, 30-34 ... AND EXIT 00081P 0059 39           SCDSD1 RTS 00083P 005A 86 05     A  SCDSD2 LDAA  #5
00084P 005C 5F                        CLRB
00085P 005D CE 0000   A               LDX      #K4          IS K4 = 5*10**0?
00086P 0060 BD 0000   A               JSR      CMPPV2
00087P 0063 27 F4 0059                BEQ      SCDSD1       IF YES...BRANCH
00088P 0065 8D 13 007A                BSR      HK4DK5       K4 = NHV(K4), DECREASE K5
00089P 0067 BD 0000   A  SCDSD3 JSR   SMDW1                 WHEN M1 = 2, 3, 4, 5, OR 6,
00090                                 *                     SET MDW, 7-40
00091P 006A 7F 0000   A               CLR      SH           SH = 0
00092P 006D 86 00     A               LDAA     #TDF
00093P 006F BD 0000   A               JSR      SFLG2        TDF _ 1
00094P 0072 BD 00DD   P               JSR      DSPDEL       CHANGE DISPLAY DUE TO
00095                                 *                     DELTA K4 / DELTA K5
00096P 0075 BD 0000   A               JSR      DT1MS        DELAY T1 MSEC., THEN REDUCE T1
00097P 0078 20 8A 0004                BRA      SCDSD0
00098
00099                                 *
00100                                 * HK4DK5 - K4 = NHV(K4), DECREASE K5
00101                                 *
00102                                 * FLOW PAGE 18B
00103                                 *
00104P 007A CE 0000   A  HK4DK5 LDX   #K4
00105P 007D BD 0000   A               JSR      NHV          K4 = NHV(K4)
00106P 0080 CE 0000   A  H4D5A  LDX   #K5S
00107P 0083 BD 0000   A               JSR      EINT15       ENTER K5S
00108P 0086 CE 0000   A               LDX      #K4S
00109P 0089 BD 0000   A               JSR      ENTPV2       ENTER K4S
00110P 008C BD 0000   A               JSR      FLPMLT       MULTIPLY
00111P 008F CE 0000   A               LDX      #K4
00112P 0092 BD 0000   A               JSR      ENTPV2       ENTER K4
00113P 0095 BD 0000   A               JSR      FLPDIV       DIVIDE
00114P 0098 CE 0000   A               LDX      #K5
00115P 009B BD 0000   A               JSR      SINT15       K5 = INT(K5S*K4S/K4) ROUNDED
00116P 009E D6 00     A               LDAB     TPR
00117P 00A0 58                        ASLB                  MULTIPLY BY 2
00118P 00A1 17                        TBA
00119P 00A2 58                        ASLB
00120P 00A3 58                        ASLB                  MULTIPLY BY 4 MORE
00121P 00A4 1B                        ABA                   ACCA = TPR*10
00122P 00A5 9B 01     A                ADDA    K5+1
00123P 00A7 97 01     A                STAA    K5+1
00124P 00A9 24 03 00AE                 BCC     H4D5B
00125P 00AB 7C 0000   A                INC     K5           K5 = INT(K5S*K4S/K4) ROUNDED
00126                                 *                      +TPR*10
00127                                 *                     NOTE: K5 IS INT15*10
00128P 00AE 39           H4D5B  RTS

00130                                 *
00131                                 * LK4IK5 - K4 = NLV(K4), INCREASE K5
00132                                 *
00133                                 * FLOW PAGE 18C
00134                                 *
00135P 00AF CE 0000   A  LK4IK5 LDX   #K4
00136P 00B2 BD 0000   A               JSR      NLV          K4 = NLV(K4)
00137P 00B5 20 C9 0080                BRA      H4D5A
```

```
00139          *
00140          * BLMDW - BLINK MDW, 30-34
00141          *
00142          * FLOW PAGE 18F
00143          *
00144P 00B7 8D C1 007A  BLMDW  BSR    HK4DK5    K4 = NHV(K4), DECREASE K5
00145P 00B9 BD 0000 A   BLMDW1 JSR    READSR    READ SWITCH REGISTERS
00146P 00BC 81 41   A          CMPA   #$41      IS THE 50 NSEC/DIV BUTTON PRESSED?
00147P 00BE 26 1C 00DC         BNE    BLMDW2    IF NOT...BRANCH
00148P 00C0 CE 0022 A          LDX    #MDW+34
00149P 00C3 DF 00   A          STX    TEMP
00150P 00C5 CE 001D A          LDX    #MDW+29
00151P 00C8 BD 0000 A          JSR    CBLOCK    MDW, 30-34 = " "
00152P 00CB CE 0B18 A          LDX    #2840
00153P 00CE BD 0000 A          JSR    DELAY     DELAY 200 MILLISEC.
00154P 00D1 BD 0000 A          JSR    SMDW4     USE K5 TO SET MDW, 30-34
00155P 00D4 CE 0B18 A          LDX    #2840
00156P 00D7 BD 0000 A          JSR    DELAY     DELAY 200 MILLISEC.
00157P 00DA 20 DD 00B9         BRA    BLMDW1
00158P 00DC 39          BLMDW2 RTS
00159          *
00160          *
00161          * DSPDEL - CHANGE DISPLAY DUE TO
00162          *          DELTA K4 / DELTA K5
00163          *
00164          * FLOW PAGE 18G
00165          *
00166P 00DD 86 08   A   DSPDEL LDAA   #8
00167P 00DF 97 00   A          STAA   LD        LD = 8
00168P 00E1 97 00   A          STAA   LI        LI = 8
00169P 00E3 86 00   A   DSPDL0 LDAA   #NCF
00170P 00E5 95 00   A          BITA   FR2       IS NCF = 0?
00171P 00E7 26 12 00FB         BNE    DSPDL1    IF NOT...BRANCH
00172P 00E9 96 00   A          LDAA   SH        IS SH = 0?
00173P 00EB 27 19 0106         BEQ    DSPDL2    IF YES...BRANCH
00174P 00ED 96 00   A          LDAA   LI
00175P 00EF BD 0000 A          JSR    PNTATT    POINT TO TRACE(LI) ATTRIBUTES
00176P 00F2 86 FF   A          LDAA   #255-0
00177P 00F4 A7 00   A          STAA   OBL,X     BL(LI) = 1'S COMPLEMENT OF 0
00178P 00F6 BD 0000 A          JSR    CBFK5     CHANGE BWDD(LI) & FDBT(LD)
00179          *                                DUE TO DELTA K5
00180P 00F9 20 0B 0106         BRA    DSPDL2
00181P 00FB 96 00   A   DSPDL1 LDAA   LD
00182P 00FD BD 0000 A          JSR    SCRL1C    GET POINTER TO J(LD)
00183P 0100 A6 00   A          LDAA   JL1OFS,X
00184P 0102 81 01   A          CMPA   #1        IS J(LD,1) = 1?
00185P 0104 27 11 0117         BEQ    DSPDL5    IF YES...BRANCH
00186P 0106 96 00   A   DSPDL2 LDAA   LD
00187P 0108 BD 0000 A          JSR    SCRL1C    GET POINTER TO J(LD)
00188P 010B 6D 00   A          TST    JL2OFS,X  IS J(LD,2) = 0?
00189P 010D 27 08 0117         BEQ    DSPDL5    IF YES...BRANCH
00190P 010F 86 00   A          LDAA   #TDF
00191P 0111 BD 0000 A          JSR    SFLG2     TDF = 1
00192P 0114 BD 0000 A          JSR    DSTLD1    DISPLAY AND/OR SHIFT
00193          *                                TRACE(LD) (SHEET 1)
00194P 0117 96 00   A   DSPDL5 LDAA   LD
00195P 0119 81 07   A          CMPA   #7        IS LD = 7?
00196P 011B 26 0A 0127         BNE    DSPDL3    IF NOT...BRANCH
00197P 011D 86 09   A          LDAA   #9
00198P 011F 91 00   A          CMPA   LI        IS LI = 9?
00199P 0121 27 04 0127         BEQ    DSPDL3    IF YES...BRANCH
00200P 0123 97 00   A          STAA   LI        LI = 9
00201P 0125 20 0F 0136         BRA    DSPDL4

00203P 0127 7A 0000 A   DSPDL3 DEC    LD        LD = LD-1
00204P 012A 96 00   A          LDAA   LD
00205P 012C 97 00   A          STAA   LI        LI = LD
00206P 012E 4C              INCA
00207P 012F BD 0000 A          JSR    SCRL1C
00208P 0132 86 01   A          LDAA   #1
00209P 0134 A7 00   A          STAA   JL1OFS,X  J(LD+1,1) = 1
00210P 0136 96 00   A   DSPDL4 LDAA   LD        IS LD = 0?
00211P 0138 26 A9 00E3         BNE    DSPDL0    IF NOT...BRANCH
00212P 013A 86 00   A          LDAA   #NCF
```

```
00213P 013C BD 0000   A     JSR     CFLG2      NCF = 0
00214P 013F 39              RTS
00216P 0140   00      A     FCB     0          CRC BYTE
00217                       END
TOTAL ERRORS 00000

P  00B7  BLMDW    00079 00144*
 P  00B9  BLMDW1   00145*00157
 P  00DC  BLMDW2   00147 00158*
RP        CBFK5    00009*00178
RP        CBLOCK   00009*00151
RP        CFLG2    00009*00213
RP        CMPPY2   00009*00037 00086
RP        COMP16   00009*00061 00077
RP        DELAY    00010*00153 00156
DP  00DD  DSPDEL   00018 00094 00166*
 P  00E3  DSPDL0   00169*00211
 P  00FB  DSPDL1   00171 00181*
 P  0106  DSPDL2   00173 00180 00186*
 P  0127  DSPDL3   00196 00199 00203*
 P  0136  DSPDL4   00201 00210*
 P  0117  DSPDL5   00185 00189 00194*
RP        DSTLD1   00010*00192
RP        DT1MS    00010*00096
RP        EINT15   00010*00107
RP        ENTPY2   00010*00109 00112
RP        FLPDIV   00011*00113
RP        FLPMLT   00011*00110
RB        FR2      00006*00170
 P  0080  H4D5A    00106*00137
 P  00AE  H4D5B    00124 00128*
 P  007A  HK4DK5   00088 00104*00144
R         JL1OFS   00016*00183 00209
R         JL2OFS   00016*00188
RB        K4       00006*00036 00085 00104 00111 00135
RB        K4S      00006*00108
RB        K5       00006*00114 00122 00123 00125
RP        K5MTPR   00011*00059
RB        K5S      00006*00106
RB        LD       00007*00167 00181 00186 00194 00203 00204 00210
RB        LI       00007*00168 00174 00198 00200 00205
 P  00AF  LK4IK5   00039 00135*
R         MDW      00016*00148 00150
R         NCF      00016*00169 00212
RP        NHV      00011*00105
RP        NLV      00011*00136
R         OBL      00016*00177
RP        PNTATT   00012*00175
RP        READSR   00012*00029 00145
DP  0000  SCDSD    00018 00027*
 P  0004  SCDSD0   00029*00097
 P  0059  SCDSD1   00033 00038 00081*00087
 P  005A  SCDSD2   00031 00083*
 P  0067  SCDSD3   00078 00089*
 P  0056  SCDSD9   00062 00079*
RP        SCRL1C   00013*00182 00187 00207
RP        SFLG2    00013*00093 00191
RB        SH       00007*00091 00172
RP        SINT15   00013*00115
RP        SMDW1    00014*00089
R         SMDW4    00014*00154
RB        T1       00007*00028
R         TDF      00016*00092 00190
RB        TEMP     00007*00149
RB        TEMP4    00007*00045 00046 00054 00055 00056 00057 00060 00066 00067
                   00071 00072 00076
RB        TPL      00007*00041
RB        TPR      00007*00116
```

```
00001                         NAM     F18H1
00002                         OPT     REL, CREF, LLEN=80
00003                         TTL     FLOW PAGES 18H1 THRU 18I
00004                         IDNT    FEB.    21, 1978

00006                         XREF    BSCT:BADS7, FR2, K15, K16, K4, K5, K5T
00007                         XREF    BSCT:LD, LI, M1
00008                         XREF    BSCT:SH, T1, TEMP3, TEMP4, TEMP5

00010                         XREF    PSCT:CMPIDX, COMPXY
00011                         XREF    PSCT:DFALB3, DK16, DROP, DSTLD2
00012                         XREF    PSCT:EINT15, ENTER, ENTIDX, ENTPV2
00013                         XREF    PSCT:FLPDIV, FLPMLT, OFFX, PNTATT
00014                         XREF    PSCT:SCRL1A, SCRL1C, SINT15
00015                         XREF    PSCT:SST9, STOVAR

00017                         XREF    BADD, DW7, DW8, FDBT
00018                         XREF    JL1OFS, JL4OFS, JL5OFS, JLAOFS
00019                         XREF    K4T, NCF, OBL, OBLSP, OBWDD, SBZ, SPDT

00021                         XDEF    CBFK5, DSTLD1, DSTL1M 00023P 0000                   PSCT

00025                   *
00026                   * DSTLD1 - DISPLAY AND/OR SHIFT TRACE LD (SHEET 1)
00027                   *
00028                   * FLOW PAGE 18H1
00029                   *
00030P 0000 96 00    A  DSTLD1  LDAA    LI
00031P 0002 81 07    A          CMPA    #7              IS LI = 7?
00032P 0004 26 08 000E          BNE     DSTL1Q          IF NOT... BRANCH
00033P 0006 DE 00    A          LDX     BADS7           POINT TO TRACE(7)
00034P 0008 E6 00    A          LDAB    JL1OFS,X
00035P 000A C1 03    A          CMPB    #3              IS J(7,1) = 3?
00036P 000C 27 25 0033          BEQ     DSTL1R          IF YES... BRANCH
00037P 000E BD 0000  A  DSTL1Q  JSR     PNTATT          POINT TO XDAC(LI)
00038P 0011 C6 FF    A          LDAB    #$FF-0          ACCB = 1'S COMPLEMENT OF 0
00039P 0013 E7 00    A          STAB    OBL,X           SET BL(LI)
00040P 0015 96 00    A          LDAA    LD
00041P 0017 91 00    A          CMPA    LI              IS LD = LI?
00042P 0019 27 12 002D          BEQ     DSTL10          IF YES... BRANCH
00043P 001B B6 0000  A          LDAA    DW7
00044P 001E 81 0B    A          CMPA    #11             IS DW(7),1 = "A"?
00045P 0020 26 0A 002C          BNE     DSTL1P          IF NOT... BRANCH
00046P 0022 B6 0000  A          LDAA    DW8
00047P 0025 81 11    A          CMPA    #17             IS DW(8),1 = "R"?
00048P 0027 26 03 002C          BNE     DSTL1P          IF NOT... BRANCH
00049P 0029 7E 00FB  P          JMP     DSTL1G          (LONG,BRANCH FORWARD)
00050P 002C 39          DSTL1P  RTS                     ... EXIT 00052P 002D 96 00    A  DSTL10  LDAA    T1
00053P 002F 81 16    A          CMPA    #22             T1 = 22?
00054P 0031 26 44 0077          BNE     DSTL1B          IF NOT... BRANCH
00055P 0033 DE 00    A  DSTL1R  LDX     K4
00056P 0035 FF 0000  A          STX     K4T             K4T = K4
00057P 0038 DE 00    A          LDX     K5
00058P 003A DF 00    A          STX     K5T             K5T = K5
00059P 003C 96 00    A          LDAA    LD
00060P 003E BD 0000  A          JSR     SCRL1C          GET POINTER TO J(LD)
00061P 0041 A6 00    A          LDAA    JL4OFS,X
00062P 0043 E6 01    A          LDAB    JL4OFS+1,X
00063P 0045 97 00    A          STAA    K4
00064P 0047 D7 01    A          STAB    K4+1            K4 = J(LD,4)
00065P 0049 EE 00    A          LDX     JL5OFS,X        GET J(LD,5)
00066P 004B DF 00    A          STX     K5              K5 = J(LD,5)
00067P 004D 96 00    A          LDAA    LD
```

```
00068P 004F BD 0140   P           JSR     DSTL1K      POINT TO J(LD,10)
00069P 0052 EE 00     A           LDX     0,X
00070P 0054 DF 00     A           STX     K15         K15 = J(LD,10)
00071P 0056 BD 0000   A           JSR     DK16        WHEN AT = 0, DETERMINE K16
00072P 0059 FE 0000   A           LDX     K4T
00073P 005C DF 00     A           STX     K4          K4 = K4T
00074P 005E DE 00     A           LDX     K5T
00075P 0060 DF 00     A           STX     K5          K5 = K5T
00076P 0062 96 00     A           LDAA    LI
00077P 0064 97 00     A           STAA    LD          LD = LI
00078P 0066 BD 0147   P           JSR     DSTL1L      POINT TO SBZ(LD)
00079P 0069 86 03     A           LDAA    #3
00080P 006B C6 E8     A           LDAB    #$E8        ACCA,ACCB = 1000
00081P 006D D0 01     A           SUBB    K16+1
00082P 006F 92 00     A           SBCA    K16         ACCA,ACCB = 1000-K16
00083P 0071 A7 00     A           STAA    0,X
00084P 0073 E7 01     A           STAB    1,X         SBZ(LD) = 1000-K16
00085P 0075 20 05 007C           BRA     DSTL1C
00086P 0077 7D 0000   A  DSTL1B  TST     SH          IS SH = 0?
00087P 007A 26 7F 00FB           BNE     DSTL1G      IF NOT... BRANCH
00088P 007C BD 0115   P  DSTL1C  JSR     DSTL1J      SPDT = K4*J(LD,10)
00089P 007F 96 00     A           LDAA    LI
00090P 0081 81 07     A           CMPA    #7          IS LI = 7?
00091P 0083 26 17 009C           BNE     DSTL1S      IF NOT... BRANCH
00092P 0085 DE 00     A           LDX     BADS7       POINT TO TRACE(7)
00093P 0087 E6 00     A           LDAB    JL10FS,X
00094P 0089 C1 03     A           CMPB    #3          IS J(7,1) = 3?
00095P 008B 26 0F 009C           BNE     DSTL1S      IF NOT... BRANCH 00097P 008D 96 00     A           LDAA    FR2
00098P 008F 85 00     A           BITA    #NCF        IS NCF = 0?
00099P 0091 27 04 0097           BEQ     DSTL1U      IF YES... BRANCH
00100P 0093 86 09     A           LDAA    #9
00101P 0095 97 00     A           STAA    LI          LI = 9

00103P 0097 BD 0000   A  DSTL1U  JSR     SST9        SET STORAGE TRACE 9,
00104                              *                  PASS/FAIL LED'S
00105P 009A 20 11 00AD           BRA     DSTL1T 00107P 009C CE 0000   A  DSTL1S  LDX     #SPDT
00108P 009F BD 0000   A           JSR     ENTER       ENTER SPDT
00109P 00A2 CE 0003   A           LDX     #3
00110P 00A5 BD 0000   A           JSR     ENTIDX      ENTER 3
00111P 00A8 BD 0000   A           JSR     COMPXY      IS SPDT < 3?
00112P 00AB 2D 67 0114           BLT     DSTL1I      IF YES... BRANCH
00113P 00AD 96 00     A  DSTL1T  LDAA    LD
00114P 00AF BD 0147   P           JSR     DSTL1L      POINT TO SBZ(LD)
00115P 00B2 BD 0000   A           JSR     EINT15      ENTER SBZ(LD)
00116P 00B5 CE 0014   A           LDX     #20
00117P 00B8 BD 0000   A           JSR     ENTIDX      ENTER 20
00118P 00BB BD 0000   A           JSR     FLPMLT      MULTIPLY
00119P 00BE CE 0000   A           LDX     #SPDT
00120P 00C1 BD 0000   A           JSR     ENTER       ENTER SPDT
00121P 00C4 BD 0000   A           JSR     FLPDIV      DIVIDE
00122P 00C7 CE E0C0   A           LDX     #-8000
00123P 00CA BD 0000   A           JSR     ENTIDX      ENTER -8000
00124P 00CD BD 0000   A           JSR     COMPXY      IS 20*SBZ(LD)/SPDT < -8000?
00125P 00D0 2D 19 00EB           BLT     DSTL1E      IF YES... BRANCH
00126P 00D2 BD 0000   A           JSR     DROP        DROP -8000
00127P 00D5 CE 0000   A           LDX     #TEMP3
00128P 00D8 BD 0000   A           JSR     SINT15      CONVERT AND SAVE
00129P 00DB 4F                     CLRA
00130P 00DC 5F                     CLRB                ACCA,ACCB = 0
00131P 00DD D0 01     A           SUBB    K5+1
00132P 00DF 92 00     A           SBCA    K5          ACCA,ACCB = -K5
00133P 00E1 D0 01     A           SUBB    K5+1
00134P 00E3 92 00     A           SBCA    K5          ACCA,ACCB = -2*K5
00135P 00E5 DB 01     A           ADDB    TEMP3+1
00136P 00E7 99 00     A           ADCA    TEMP3       A,B = INT(20*SBZ(LD)/SPDT)-2*K5
00137P 00E9 20 04 00EF           BRA     DSTL1F
00138P 00EB 86 E0     A  DSTL1E  LDAA    #$E0
00139P 00ED C6 C0     A           LDAB    #$C0        ACCA,ACCB = -8000
00140P 00EF 36           DSTL1F  PSHA                SAVE ACCA
```

```
00141P 00F0 96 00     A          LDAA   LD
00142P 00F2 8D 59 014D           BSR    DSTL1M   POINT TO FDBT(LD)
00143P 00F4 32                   PULA
00144P 00F5 A7 00     A          STAA   0,X
00145P 00F7 E7 01     A          STAB   1,X      ALTER FDBT(LD) IN RAM
00146P 00F9 20 02 00FD           BRA    DSTL1H
00147P 00FB 8D 18 0115 DSTL1G    BSR    DSTL1J   SPDT = K4*J(LD,10)
00148P 00FD BD 0000   A DSTL1H   JSR    DSTLD2   DISPLAY AND/OR SHIFT TRACE LD
00149                      *                    (SHEET 2)
00150P 0100 96 00     A          LDAA   LD
00151P 0102 BD 0000   A          JSR    SCRL1A   POINT TO DW(LD)
00152P 0105 A6 03     A          LDAA   3,X
00153P 0107 85 7F     A          BITA   #$7F     IS DW(LD),4 BITS 6-0 = " "?
00154P 0109 26 09 0114           BNE    DSTL1I   IF NOT...BRANCH
00155P 010B 96 00     A          LDAA   LD
00156P 010D BD 0000   A          JSR    PNTATT   POINT TO XDAC(LD)
00157P 0110 C6 FF     A          LDAB   #$FF-0   ACCB = 1'S COMPLEMENT OF 0
00158P 0112 E7 00     A          STAB   OBL,X    BL(LD) = 1'S COMPL. OF 0
00159P 0114 39             DSTL1I RTS

00161                      *
00162                      * DSTL1J - DETERMINE SPDT
00163                      *
00164                      * FLOW PAGE 18H2
00165                      *
00166        0115     P DSTL1J EQU    *          SPDT = K4*J(LD,10)
00167P 0115 96 00     A          LDAA   LD
00168P 0117 8D 27 0140           BSR    DSTL1K   POINT TO J(LD,10)
00169P 0119 BD 0000   A          JSR    ENTPV2   ENTER J(LD,10)
00170P 011C CE 0000   A          LDX    #K4
00171P 011F BD 0000   A          JSR    ENTPV2   ENTER K4
00172P 0122 BD 0000   A          JSR    FLPMLT   MULTIPLY
00173P 0125 96 00     A          LDAA   M1
00174P 0127 81 06     A          CMPA   #6       IS M1 = 6?
00175P 0129 26 0E 0139           BNE    DL1JX    IF NOT...BRANCH 00177P 012B 96 00     A          LDAA   LD
00178P 012D BD 0000   A          JSR    SCRL1A   POINT TO DW(LD)
00179P 0130 A6 00     A          LDAA   0,X
00180P 0132 81 11     A          CMPA   #17      IS DW(LD),1 = "R"?
00181P 0134 26 03 0139           BNE    DL1JX    IF NOT...BRANCH
00182P 0136 BD 0000   A          JSR    DFALB3   ENTER AF/RF, MULTIPLY,
00183                      *                    ENTER 1000, DIVIDE
00184P 0139 CE 0000   A DL1JX    LDX    #SPDT
00185P 013C BD 0000   A          JSR    STOVAR   STORE RESULT INSPDT
00186P 013F 39                   RTS 00188P 0140 BD 0000   A DSTL1K   JSR    SCRL1C   GET POINTER TO J(LD)
00189P 0143 86 00     A          LDAA   #JLAOFS  OFFSET FOR J(L,10)
00190P 0145 20 0A 0151           BRA    DSTL1N   POINT TO J(L,10)

00192P 0147 48             DSTL1L ASLA                  L*2
00193P 0148 CE FFFE   A          LDX    #SBZ-2
00194P 014B 20 04 0151           BRA    DSTL1N   POINT TO SBZ(L)

00196P 014D 48             DSTL1M ASLA                  L*2
00197P 014E CE FFFE   A          LDX    #FDBT-2  POINT TO FDBT(L)
00198P 0151 7E 0000   A DSTL1N   JMP    OFFX

00200                      *
00201                      * CBFK5 - CHANGE BWDD(LI) AND FDBT(LD)
00202                      *         DUE TO DELTA K5
00203                      *
00204                      * FLOW PAGE 18I
00205                      *
00206P 0154 96 00     A CBFK5    LDAA   LI
00207P 0156 BD 0000   A          JSR    PNTATT   POINT TO XDAC(LI)
00208P 0159 DF 00     A          STX    TEMP5    SAVE POINTER
00209P 015B A6 00     A          LDAA   OBLSP,X  GET BLSP(LI)
00210P 015D E6 00     A          LDAB   OBWDD,X  GET BWDD(LI)
00211                      *
```

```
00212P 015F 58             ASLB
00213P 0160 49             ROLA
00214             *
00215P 0161 59             ROLB
00216P 0162 49             ROLA
00217             *
00218P 0163 59             ROLB
00219P 0164 49             ROLA
00220             *
00221P 0165 59             ROLB
00222P 0166 49             ROLA            SHIFT EVERYTHING 4 BITS
00223P 0167 37             PSHB            SAVE
00224P 0168 59             ROLB            GET LAST BIT
00225P 0169 53             COMB            15-BS1LSP BITS 7-4
00226P 016A C4 0F    A     ANDB   #%00001111 GET ONLY BIT LOCATION
00227P 016C D7 00    A     STAB   TEMP4    SAVE
00228P 016E 33             PULB            RESTORE
00229P 016F C4 F0    A     ANDB   #%11110000
00230P 0171 44             LSRA
00231P 0172 56             RORB            SHIFT BACK 1 BIT
00232P 0173 DA 00    A     ORAB   TEMP4    "OR" IN BIT LOCATION
00233P 0175 8D 4D 01C4     BSR    CBFK5D   SUBTRACT SH
00234             *                        ACCA,ACCB = BLSP(LI) BITS 3-0
00235             *                        * 2**11 + BWDD(LI) * 2**3
00236             *                        + 15 - BLSP(LI) BITS 7-4 - SH
00237P 0177 37             PSHB
00238P 0178 53             COMB
00239P 0179 CA 08    A     ORAB   #%00001000
00240P 017B C4 0F    A     ANDB   #%00001111 GET NEW BIT LOCATION
00241P 017D 58             ASLB
00242P 017E 58             ASLB
00243P 017F 58             ASLB
00244P 0180 58             ASLB            SHIFT LEFT 4 BITS
00245             *                        ACCB = (15-"DAW" BITS 2-0)*2**4
00246P 0181 D7 00    A     STAB   TEMP4    SAVE FOR LATER
00247P 0183 33             PULB
00248P 0184 44             LSRA
00249P 0185 56             RORB
00250             *
00251P 0186 44             LSRA
00252P 0187 56             RORB
00253             *
00254P 0188 44             LSRA
00255P 0189 56             RORB            SHIFT RIGHT 3 BITS INFO
00256             *                        ON START PAGE AND BWDD
00257P 018A 7D 0000  A     TST    SH       IS SH > 0?
00258P 018D 2E 0E 019D     BGT    CBFK5A   IF YES...BRANCH
00259P 018F CE 0120  A     LDX    #BADD+288
00260P 0192 BD 0000  A     JSR    CMPIDX   IS START PAGE + BADD <
00261             *                        #BADD+288?
00262P 0195 2D 12 01A9     BLT    CBFK5B   IF YES...BRANCH
00263P 0197 C0 20    A     SUBB   #$20
00264P 0199 82 01    A     SBCA   #$01     SUBTRACT 288 FROM ACCA,ACCB
00265P 019B 20 0C 01A9     BRA    CBFK5B
00266P 019D CE 0000  A CBFK5A LDX  #BADD
00267P 01A0 BD 0000  A     JSR    CMPIDX   IS START PAGE + BWDD <
00268             *                        #BADD
00269P 01A3 2C 04 01A9     BGE    CBFK5B   IF NOT...BRANCH
00270P 01A5 CB 20    A     ADDB   #$20
00271P 01A7 89 01    A     ADCA   #$01     ADD 288 TO ACCA,ACCB
00272P 01A9 DE 00    A CBFK5B LDX  TEMP5   POINT TO XDAC(LI)
00273P 01AB 9A 00    A     ORAA   TEMP4    NEW VALUE FOR BLSP(LI)
00274P 01AD A7 00    A     STAA   OBLSP,X  SAVE BLSP(LI)
00275P 01AF E7 00    A     STAB   OBWDD,X  SAVE BWDD(LI)
00276P 01B1 96 00    A     LDAA   LD
00277P 01B3 91 00    A     CMPA   LI       IS LD = LI?
00278P 01B5 26 0C 01C3     BNE    CBFK5C   IF NOT...BRANCH
00279P 01B7 8D 94 014D     BSR    DSTL1M   POINT TO FDBT(LD)
00280P 01B9 A6 00    A     LDAA   0,X
00281P 01BB E6 01    A     LDAB   1,X
00282P 01BD 8D 05 01C4     BSR    CBFK5D   SUBTRACT SH
00283P 01BF A7 00    A     STAA   0,X
00284P 01C1 E7 01    A     STAB   1,X      FDBT(LD) = FDBT(LD)-SH
00285P 01C3 39        CBFK5C RTS
```

```
00287P 01C4 D0 00      A  CBFK5D  SUBB  SH
00288P 01C6 82 00      A          SBCA  #0
00289P 01C8 7D 0900    A          TST   SH      CHECK FOR NEGATIVE SH
00290P 01CB 2A 01 01CE            BPL   CBFK5E  BRANCH IF NOT NEGATIVE
00291P 01CD 4C                    INCA          ELSE CORRECT RESULT
00292P 01CE 39            CBFK5E  RTS
00294P 01CF    00      A          FCB   0       CRC BYTE
00295                             END
TOTAL ERRORS 00000

R          BADD    00017*00259 00266
RB         BADS7   00006*00033 00092
DP  0154   CBFK5   00021 00206*
 P  019D   CBFK5A  00258 00266*
 P  01A9   CBFK5B  00262 00265 00269 00272*
 P  01C3   CBFK5C  00278 00285*
 P  01C4   CBFK5D  00233 00282 00287*
 P  01CE   CBFK5E  00290 00292*
RP         CMPIDX  00010*00260 00267
RP         COMPXY  00010*00111 00124
RP         DFALB3  00011*00182
RP         DK16    00011*00071
 P  0139   DL1JX   00175 00181 00184*
RP         DROP    00011*00126
 P  0077   DSTL1B  00054 00086*
 P  007C   DSTL1C  00085 00088*
 P  00EB   DSTL1E  00125 00138*
 P  00EF   DSTL1F  00137 00140*
 P  00FB   DSTL1G  00049 00087 00147*
 P  00FD   DSTL1H  00146 00148*
 P  0113   DSTL1I  00112 00154 00159*
 P  0115   DSTL1J  00088 00147 00166*
 P  0140   DSTL1K  00068 00168 00188*
 P  0147   DSTL1L  00078 00114 00192*
DP  014D   DSTL1M  00021 00142 00196*00279
 P  0151   DSTL1N  00190 00194 00198*
 P  002D   DSTL1O  00042 00052*
 P  002C   DSTL1P  00045 00048 00050*
 P  000E   DSTL1Q  00032 00037*
 P  0033   DSTL1R  00036 00055*
 P  009C   DSTL1S  00091 00095 00107*
 P  00AD   DSTL1T  00105 00113*
 P  0097   DSTL1U  00099 00103*
DP  0000   DSTLD1  00021 00030*
RP         DSTLD2  00011*00148
R          DW7     00017*00043
R          DW8     00017*00046
RP         EINT15  00012*00115
RP         ENTER   00012*00108 00120
RP         ENTIDX  00012*00110 00117 00123
RP         ENTPV2  00012*00169 00171
R          FDBT    00017*00197
RP         FLPDIV  00013*00121
RP         FLPMLT  00013*00118 00172
RB         FR2     00006*00097
R          JL10FS  00018*00034 00093
R          JL40FS  00018*00061 00062
R          JL50FS  00018*00065
R          JLAOFS  00018*00189
RB         K15     00006*00070
RB         K16     00006*00081 00082
RB         K4      00006*00055 00063 00064 00073 00170
R          K4T     00019*00056 00072
RB         K5      00006*00057 00066 00075 00131 00132 00133 00134
R          K5T     00006*00058 00074
RB         LD      00007*00040 00059 00067 00077 00113 00141 00150 00155 00167
                   00177 00276
RB         LI      00007*00030 00041 00076 00089 00101 00206 00277
RB         M1      00007*00173
R          NCF     00019*00098
R          OBL     00019*00039 00158
```

```
R       OBLSP   00019*00209 00274
R       OBWDD   00019*00210 00275
RP      OFFX    00013*00198
RP      PNTATT  00013*00037 00156 00207
R       SBZ     00019*00193
RP      SCRL1A  00014*00151 00178
RP      SCRL1C  00014*00060 00188
RB      SH      00008*00086 00257 00287 00289
RP      SINT15  00014*00128
R       SPDT    00019*00107 00119 00184
RP      SST9    00015*00103
RP      STOVAR  00015*00185
RB      T1      00008*00052
RB      TEMP3   00008*00127 00135 00136
RB      TEMP4   00008*00227 00232 00246 00273
RB      TEMP5   00008*00208 00272

0001                            NAM     F18J
0002                            OPT     REL,CREF,LLEN=80
0003                            TTL     FLOW PAGE 18J
0004                            IDNT    JULY  19, 1977

0006                            XREF    BSCT:BLT,FDB,FSB,FSBRF
0007                            XREF    BSCT:LD,LI,TEMP,TEMP3

0009                            XREF    PSCT:ABSAB,CMPIDX,COMPXY
0010                            XREF    PSCT:DROP,DSTL1M,DSTL3X,DSTLD3
0011                            XREF    PSCT:EINT15,ENTER,ENTIDX,ENTINT
0012                            XREF    PSCT:FLPDIV,FLPMLT,FLPSUB,OFFX,PNTATT
0013                            XREF    PSCT:SINT15,SINT7

0015                            XREF    OBL,OBLSP,OBWDD,OUNBL,SPDT

0017                            XDEF    DSTLD2

0019P 0000                      PSCT

0021                    *
0022                    * DSTLD2 - DISPLAY AND/OR SHIFT TRACE LD
0023                    *             (SHEET 2)
0024                    *
0025                    * FLOW PAGE 18J
0026                    *
0027P 0000 CE 0000   A  DSTLD2  LDX     #SPDT
0028P 0003 BD 0000   A          JSR     ENTER       ENTER SPDT
0029P 0006 CE 0003   A          LDX     #3
0030P 0009 BD 0000   A          JSR     ENTIDX      ENTER 3
0031P 000C BD 0000   A          JSR     COMPXY      IS SPDT < 3?
0032P 000F 2D 12 0023           BLT     DSTL2P      IF YES...BRANCH
0033P 0011 BD 00D0   P          JSR     DSTL2Q      ACCA,ACCB = FDBT(LD)
0034P 0014 CE FF3B   A          LDX     #-197
0035P 0017 BD 0000   A          JSR     CMPIDX      IS FDBT(LD) < -197?
0036P 001A 2C 08 0024           BGE     DSTL2A      IF NOT...BRANCH
0037P 001C 86 18     A          LDAA    #24         OFFSET FOR "AA" HEX BIT STRING
0038P 001E C6 39     A          LDAB    #255-198    1'S COMPLEMENT OF 198
0039P 0020 7E 00E6   P          JMP     DSTL2S      SET TRACE(LD), UNBL(LD), BL(LD)

0041P 0023 39           DSTL2P  RTS 0043P 0024 97 00     A  DSTL2A  STAA    BLT         SAVE FDBT(LD) IN BLT WHILE
0044P 0026 D7 01     A          STAB    BLT+1       ... DOING REMAING COMPUTATION
0045P 0028 CE 4E20   A          LDX     #20000
0046P 002B BD 0000   A          JSR     ENTIDX      ENTER 20000
0047P 002E CE 0000   A          LDX     #SPDT
0048P 0031 BD 0000   A          JSR     ENTER
```

```
0049P 0034 BD 0000  A          JSR   FLPDIV    DIVIDE
0050P 0037 CE 0000  A          LDX   #TEMP3
0051P 003A BD 0000  A          JSR   SINT15    INT(20000/SPDT+.5)
0052P 003D 96 00    A          LDAA  TEMP3
0053P 003F D6 01    A          LDAB  TEMP3+1
0054P 0041 D0 01    A          SUBB  BLT+1     SUBTRACT SAVED VALUE FDBT(LD)
0055P 0043 92 00    A          SBCA  BLT
0056P 0045 97 00    A          STAA  BLT
0057P 0047 D7 01    A          STAB  BLT+1     BLT = -FDBT(LD)
0058                     *                            +INT(20000/SPDT+.5)
0059P 0049 CE 0002  A          LDX   #2
0060P 004C BD 0000  A          JSR   CMPIDX    IS BLT < 2?
0061P 004F 2C 06 0057         BGE   DSTL2B    IF NOT...BRANCH
0062P 0051 4F                  CLRA            OFFSET FOR "AA" BIT STRING
0063P 0052 C6 FF    A          LDAB  #255-0    1'S COMPLEMENT OF ZERO
0064P 0054 7E 00E6  P          JMP   DSTL2S 0066P 0057 8D 77 00D0 DSTL2B  BSR   DSTL2Q    ACCA,ACCB = FDBT(LD)
0067P 0059 EE 00    A          LDX   0,X       IS FDBT > 0?
0068P 005B 2F 01 005E         BLE   DSTL2C    IF NOT...BRANCH
0069P 005D 5F                  CLRB            FDB = 0
0070P 005E 50         DSTL2C  NEGB            NEGATE FDB
0071P 005F D7 00    A          STAB  FDB       SET FDB
0072P 0061 53                  COMB            COMPLEMENT FDB
0073P 0062 5A                  DECB            SUBTRACT 1
0074P 0063 96 00    A          LDAA  LI
0075P 0065 BD 0000  A          JSR   PNTATT    POINT TO XDAC(LI)
0076P 0068 E7 00    A          STAB  OUNBL,X   UNBL(LI) = (1'S COM. OF FDB)-1
0077P 006A CE 0000  A          LDX   #SPDT
0078P 006D BD 0000  A          JSR   ENTER     ENTER SPDT
0079P 0070 CE 32C8  A          LDX   #13000
0080P 0073 BD 0000  A          JSR   ENTIDX    ENTER 13000
0081P 0076 BD 0000  A          JSR   COMPXY    IS SPDT > 13000?
0082P 0079 2E 5F 00DA         BGT   DSTL2R    IF YES...BRANCH
0083P 007B 7F 0000  A          CLR   FSB
0084P 007E 7F 0001  A          CLR   FSB+1     FSB = 0
0085P 0081 7F 0000  A          CLR   FSBRF     FSBRF = 0
0086P 0084 7D 0000  A          TST   FDB       IS FDB = 0?
0087P 0087 26 44 00CD         BNE   DSTL2O    IF NOT...BRANCH
0088P 0089 BD 0000  A          JSR   DROP      DROP 13000
0089P 008C 8D 42 00D0         BSR   DSTL2Q    ACCA,ACCB = FDBT(LD)
0090P 008E BD 0000  A          JSR   ABSAB
0091P 0091 BD 0000  A          JSR   ENTINT    ENTER ABS(FDBT(LD))
0092P 0094 BD 0000  A          JSR   FLPMLT    MULTIPLY
0093P 0097 CE 0014  A          LDX   #20
0094P 009A BD 0000  A          JSR   ENTIDX    ENTER 20
0095P 009D BD 0000  A          JSR   FLPDIV    DIVIDE
0096P 00A0 BD 0000  A          JSR   DSTL3X    RE-ENTER VALUE ONTO PSTK,
0097                     *                            SUBTRACT .5 TO AVOID ROUNDING
0098                     *                            WHEN FSB IS STORED
0099P 00A3 CE 0000  A          LDX   #FSB
0100P 00A6 BD 0000  A          JSR   SINT15    FSB = INT(ABS(FDBT(LD))
0101                     *                              *SPDT/20)
0102P 00A9 BD 0000  A          JSR   DROP      DROP UN-ALTERED VALUE BACK TO
0103                     *                            TOP OF PSTK
0104P 00AC DE 00    A          LDX   FSB       IS FSB NEGATIVE?
0105P 00AE 2A 05 00B5         BPL   DSTL2N    IF POSITIVE...BRANCH
0106P 00B0 CE 0000  A          LDX   #0
0107P 00B3 DF 00    A          STX   FSB       FSB = 0

0109P 00B5 CE 0000  A DSTL2N  LDX   #FSB
0110P 00B8 BD 0000  A          JSR   EINT15    ENTER FSB
0111P 00BB BD 0000  A          JSR   FLPSUB    SUBTRACT TO GET FRACTIONAL PART
0112P 00BE CE 0014  A          LDX   #20
0113P 00C1 BD 0000  A          JSR   ENTIDX    ENTER 20
0114P 00C4 BD 0000  A          JSR   FLPMLT    MULTIPLY
0115P 00C7 CE 0000  A          LDX   #FSBRF
0116P 00CA BD 0000  A          JSR   SINT7     FSBRF = 20*(ABS(FDBT(LD))
0117                     *                              *SPDT/20-FSB)
0118P 00CD 7E 0000  A DSTL2O  JMP   DSTLD3    DISPLAY AND/OR SHIFT TRACE LD
0119                     *                            (SHEET3) AND EXIT
```

```
0121P 00D0 96 00    A DSTL2Q LDAA  LD
0122P 00D2 BD 0000  A        JSR   DSTL1M    POINT TO FDBT(LD)
0123P 00D5 A6 00    A        LDAA  0,X
0124P 00D7 E6 01    A        LDAB  1,X       ACCA,ACCB = FDBT(LD)
0125P 00D9 39                RTS 0127P 00DA 96 00    A DSTL2R LDAA  LD
0128P 00DC BD 0000  A        JSR   PNTATT    POINT TO XDAC(LD)
0129P 00DF 96 00    A        LDAA  FDB
0130P 00E1 44                LSRA
0131P 00E2 44                LSRA
0132P 00E3 44                LSRA            OFFSET FOR "AA" HEX BIT STRNG
0133P 00E4 E6 00    A        LDAB  OUNBL,X   PICK UP CURRENT UNBL(LD)
0134P 00E6 36         DSTL2S PSHA
0135P 00E7 37                PSHB
0136P 00E8 96 00    A        LDAA  LD
0137P 00EA BD 0000  A        JSR   PNTATT    POINT TO XDAC(LD)
0138P 00ED 33                PULB
0139P 00EE E7 00    A        STAB  OUNBL,X   CHANGE UNBL(LD)
0140P 00F0 C0 02    A        SUBB  #2
0141P 00F2 E7 00    A        STAB  OBL,X     CHANGE BL(LD)
0142P 00F4 A6 00    A        LDAA  OBLSP,X
0143P 00F6 84 0F    A        ANDA  #$0F
0144P 00F8 E6 00    A        LDAB  OBWDD,X
0145P 00FA 97 00    A        STAA  TEMP
0146P 00FC D7 01    A        STAB  TEMP+1
0147P 00FE DE 00    A        LDX   TEMP      POINT TO DIGITAL DISPLAY
0148P 0100 32                PULA
0149P 0101 BD 0000  A        JSR   OFFX      ADD OFFSET
0150P 0104 86 AA    A        LDAA  #$AA
0151P 0106 A7 00    A        STAA  0,X       PLACE "AA" HEX BIT STRING
0152P 0108 A7 01    A        STAA  1,X       IN TRACE
0153P 010A 39                RTS
0156P 010B    00    A        FCB   0         CRC BYTE
0157                         END
```

~~0~~ ✓ ERRORS 00000
TOTAL

```
P      ABSAB   00009*00090
B      BLT     00006*00043 00044 00054 00055 00056 00057
P      CMPIDX  00009*00035 00060
P      COMPXY  00009*00031 00081
P      DROP    00010*00088 00102
P      DSTL1M  00010*00122
P 0024 DSTL2A  00036 00043*
P 0057 DSTL2B  00061 00066*
P 005E DSTL2C  00068 00070*
P 00B5 DSTL2N  00105 00109*
P 00CD DSTL2O  00087 00118*
P 0023 DSTL2P  00032 00041*
P 00D0 DSTL2Q  00033 00066 00089 00121*
P 00DA DSTL2R  00082 00127*
P 00E6 DSTL2S  00039 00064 00134*
P      DSTL3X  00010*00096
P 0000 DSTLD2  00017 00027*
P      DSTLD3  00010*00118
P      EINT15  00011*00110
P      ENTER   00011*00028 00048 00078
P      ENTIDX  00011*00030 00046 00080 00094 00113
P      ENTINT  00011*00091
B      FDB     00006*00071 00086 00129
P      FLPDIV  00012*00049 00095
P      FLPMLT  00012*00092 00114
P      FLPSUB  00012*00111
B      FSB     00006*00083 00084 00099 00104 00107 00109
B      FSBRF   00006*00085 00115
B      LD      00007*00121 00127 00136
B      LI      00007*00074
       OBL     00015*00141
       OBLSP   00015*00142
       OBWDD   00015*00144
P      OFFX    00012*00149
```

```
              OUNBL    00015*00076 00133 00139
    P         PNTATT   00012*00075 00128 00137
    P         SINT15   00013*00051 00100
    P         SINT7    00013*00116
              SPDT     00015*00027 00047 00077
    B         TEMP     00007*00145 00146 00147
    B         TEMP3    00007*00050 00052 00053

00001                          NAM      F18K
00002                          OPT      REL, CREF, LLEN=80
00003                          TTL      FLOW PAGES 18K THRU 18M
00004                          IDNT     DEC.   1, 1977

00006                          XREF     BSCT:BLR, BLS, BLT, CF1
00007                          XREF     BSCT:FDB, FR1, FR2, FSB, FSBRF
00008                          XREF     BSCT:LD, LI, SH, TEMP3

00010                          XREF     PSCT:BUMP, CFLG2, CMPIDX, COMPXY, DROP
00011                          XREF     PSCT:EEXP10, EINT15, EINT7, ENTER
00012                          XREF     PSCT:ENTIDX, ENTINT, ENTPV2
00013                          XREF     PSCT:FLPADD, FLPDIV, FLPMLT, FLPSUB
00014                          XREF     PSCT:OFFX, PNTATT
00015                          XREF     PSCT:SCATR8, SCNCLR, SCRL1A
00016                          XREF     PSCT:SCRL1C, SFLG2, SINT15, SINT7, SINT8
00017                          XREF     PSCT:STLDB9, STLDBF

00019                          XREF     ASBF, ASBT
00020                          XREF     BADD, BLOC, DW, FTT, ISPD
00021                          XREF     JL1OFS
00022                          XREF     NDB, NDW, NSB, NSW, NX
00023                          XREF     OBL, OBLSP, OBWDD, OUNBL
00024                          XREF     RSPD, SPDT, SRSPD, SW, TE

00026                          XDEF     DSTL3X, DSTLD3

00028P 0000                    PSCT

00030                    *
00031                    * DSTLD3 - DISPLAY AND/OR SHIFT TRACE LD
00032                    *           (SHEET 3)
00033                    *
00034                    * FLOW PAGE 18K
00035                    *
00036P 0000 96 00      A DSTLD3 LDAA    LD
00037P 0002 BD 0000    A        JSR     PNTATT    POINT TO XDAC(LD)
00038P 0005 A6 00      A        LDAA    OBLSP,X   GET BLSP(LD)
00039P 0007 44                  LSRA
00040P 0008 44                  LSRA
00041P 0009 44                  LSRA
00042P 000A 44                  LSRA
00043P 000B 43                  COMA
00044P 000C 84 0F      A        ANDA    #$0F
00045P 000E B7 0000    A        STAA    BLOC      BLOC = 15-BLSP(LD) BITS 7-4
00046P 0011 C6 C7      A        LDAB    #199
00047P 0013 D7 00      A        STAB    BLR       BLR = 199
00048P 0015 7D 0000    A        TST     SH        IS SH = 0?
00049P 0018 26 06 0020          BNE     DSTL3A    IF NOT...BRANCH
00050P 001A D6 00      A        LDAB    FDB
00051P 001C D7 00      A        STAB    BLS       BLS = FDB
00052P 001E 20 2A 004A          BRA     DSTL3C
00053P 0020 86 C7      A DSTL3A LDAA    #199
00054P 0022 97 00      A        STAA    BLS       PRESET BLS = 199
00055P 0024 96 00      A        LDAA    BLT
00056P 0026 D6 01      A        LDAB    BLT+1
00057P 0028 CE 00C7    A        LDX     #199
```

```
00058P 002B BD 0000  A          JSR    CMPIDX        IS BLT > 199?
00059P 002E 2E 04 0034           BGT    DSTL3B        IF YES...BRANCH
00060P 0030 D7 00    A           STAB   BLS           BLS = BLT
00061P 0032 D7 00    A           STAB   BLR           BLR = BLT
00062P 0034 7D 0000  A  DSTL3B   TST    SH            IS SH < 0?
00063P 0037 2D 1B 0054           BLT    DSTL3D        IF YES...BRANCH
00064P 0039 96 00    A           LDAA   LD
00065P 003B BD 0000  A           JSR    PNTATT        POINT TO XDAC(LD)
00066P 003E A6 00    A           LDAA   OUNBL,X
00067P 0040 81 FE    A           CMPA   #255-0-1      IS UNBL(LD) = (1'S COMPL. OF 0)-1?
00068P 0042 26 1A 005E           BNE    DSTL3E        IF NOT...BRANCH
00069P 0044 96 00    A           LDAA   BLS
00070P 0046 90 00    A           SUBA   SH
00071P 0048 97 00    A           STAA   BLS           BLS = BLS-SH
00072P 004A 96 00    A  DSTL3C   LDAA   FDB
00073P 004C BB 0000  A           ADDA   BLOC
00074P 004F 97 00    A           STAA   FDB           FDB = FDB+BLOC
00075P 0051 7E 00C9  P           JMP    DSTL3H
00076P 0054 C6 C7    A  DSTL3D   LDAB   #199
00077P 0056 DB 00    A           ADDB   SH
00078P 0058 D7 00    A           STAB   BLS           BLS = 199+SH
00079P 005A D1 00    A           CMPB   BLR           IS BLS < BLR?
00080P 005C 25 0B 0069          BCS    DSTL3F        IF YES...BRANCH
00081P 005E 96 00    A  DSTL3E   LDAA   LI
00082P 0060 BD 0000  A           JSR    PNTATT        POINT TO XDAC(LI)
00083P 0063 96 00    A           LDAA   BLR
00084P 0065 43                   COMA
00085P 0066 A7 00    A           STAA   OBL,X         BL(LI) = 1'S COMP. OF BLR
00086P 0068 39                   RTS
00088P 0069 4F          DSTL3F   CLRA                 ACCA,ACCB = BLS
00089P 006A D0 00    A           SUBB   FDB
00090P 006C 82 00    A           SBCA   #0            ACCA,ACCB = BLS-FDB
00091P 006E BD 0000  A           JSR    ENTINT        ENTER BLS-FDB
00092P 0071 CE 0000  A           LDX    #SPDT
00093P 0074 BD 0000  A           JSR    ENTER         ENTER SPDT
00094P 0077 BD 0000  A           JSR    FLPMLT        MULTIPLY
00095P 007A CE 0014  A           LDX    #20
00096P 007D BD 0000  A           JSR    ENTIDX        ENTER 20
00097P 0080 BD 0000  A           JSR    FLPDIV        DIVIDE
00098P 0083 CE 0000  A           LDX    #FSB
00099P 0086 BD 0000  A           JSR    EINT15        ENTER FSB
00100P 0089 BD 0000  A           JSR    FLPADD        ADD
00101P 008C 8D 3D 00CB           BSR    DSTL3X        RE-ENTER VALUE ONTO PSTK,
00102                   *                             SUBTRACT .5 TO AVOID ROUNDING
00103                   *                             WHEN FSB IS STORED
00104P 008E CE 0000  A           LDX    #FSB
00105P 0091 BD 0000  A           JSR    SINT15        FSB = INT(FSB+
00106                   *                                (BLS-FDB)*SPDT/20)
00107P 0094 BD 0000  A           JSR    DROP          DROP UN-ALTERED VALUE BACK TO
00108                   *                             TOP OF PSTK
00109P 0097 CE 0000  A           LDX    #FSB
00110P 009A BD 0000  A           JSR    EINT15        ENTER FSB
00111P 009D BD 0000  A           JSR    FLPSUB        SUBTRACT TO GET FRACTIONAL PART
00112P 00A0 CE 0014  A           LDX    #20
00113P 00A3 BD 0000  A           JSR    ENTIDX        ENTER 20
00114P 00A6 BD 0000  A           JSR    FLPMLT        MULTIPLY
00115P 00A9 CE 0000  A           LDX    #TEMP3
00116P 00AC BD 0000  A           JSR    SINT7
00117P 00AF D6 00    A           LDAB   TEMP3
00118P 00B1 DB 00    A           ADDB   FSBRF
00119P 00B3 D7 00    A           STAB   FSBRF         FSBRF = FSBRF+REMAINDER
00120P 00B5 96 00    A           LDAA   BLS
00121P 00B7 BB 0000  A           ADDA   BLOC
00122P 00BA 97 00    A           STAA   FDB           FDB = BLS+BLOC
00123P 00BC C1 14    A           CMPB   #20           IS FSBRF < 20?
00124P 00BE 2D 09 00C9           BLT    DSTL3H        IF YES...BRANCH
00125P 00C0 C0 14    A           SUBB   #20
00126P 00C2 D7 00    A           STAB   FSBRF         FSBRF = FSBRF-20
00127P 00C4 DE 00    A           LDX    FSB
00128P 00C6 08                   INX
00129P 00C7 DF 00    A           STX    FSB           FSB = FSB+1
00130P 00C9 20 11 00DC DSTL3H   BRA    STLDB1        CONTINUE WITH ......
00131                   *                             SET TRACE LD DISPLAY BITS
00132                   *                             (SHEET 1)
```

```
00134P 00CB BD 0000  A  DSTL3X JSR   BUMP      RE-ENTER TOP VALUE OF PSTK
00135P 00CE CE 05FF  A         LDX   #$05FF
00136P 00D1 DF 00    A         STX   TEMP3
00137P 00D3 CE 0000  A         LDX   #TEMP3
00138P 00D6 BD 0000  A         JSR   ENTPV2    ENTER 5*10**-1
00139P 00D9 7E 0000  A         JMP   FLPSUB    SUBTRACT .5 TO AVOID ROUNDING
00140                     *                    ... AND EXIT
00142                     *
00143                     * STLDB1 - SET TRACE LD DISPLAY BITS
00144                     *          (SHEET 1)
00145                     *
00146                     * FLOW PAGE 18L1
00147                     *
00148P 00DC 96 00    A  STLDB1 LDAA  FDB
00149P 00DE 16              TAB
00150P 00DF 44              LSRA
00151P 00E0 44              LSRA
00152P 00E1 44              LSRA
00153P 00E2 B7 0000  A         STAA  NDW       NDW = INT(FDB/8)
00154P 00E5 53                 COMB
00155P 00E6 C4 07    A         ANDB  #%00000111
00156P 00E8 F7 0000  A         STAB  NDB       NDB = 7-FDB BITS 2-0
00157P 00EB 86 00    A         LDAA  #FTT
00158P 00ED BD 0000  A         JSR   CFLG2     PRESET FTT = 0
00159P 00F0 CE 0000  A         LDX   #FSB
00160P 00F3 BD 0000  A         JSR   EINT15    ENTER FSB
00161P 00F6 CE 0014  A         LDX   #20
00162P 00F9 BD 0000  A         JSR   ENTIDX    ENTER 20
00163P 00FC BD 0000  A         JSR   FLPMLT    MULTIPLY
00164P 00FF CE 0000  A         LDX   #FSBRF
00165P 0102 BD 0000  A         JSR   EINT7     ENTER FSBRF
00166P 0105 BD 0000  A         JSR   FLPADD    ADD
00167P 0108 CE 0000  A         LDX   #SPDT
00168P 010B BD 0000  A         JSR   ENTER     ENTER SPDT
00169P 010E BD 0000  A         JSR   COMPXY    IS "WV" < SPDT?
00170P 0111 2D 37 014A         BLT   STLB1A    IF YES...BRANCH
00171P 0113 86 00    A         LDAA  #FTT
00172P 0115 BD 0000  A         JSR   SFLG2     FTT = 1
00173P 0118 BD 0000  A         JSR   FLPSUB    "WV"-SPDT
00174P 011B CE 0014  A         LDX   #20
00175P 011E BD 0000  A         JSR   ENTIDX    ENTER 20
00176P 0121 BD 0000  A         JSR   FLPDIV    "WV" = ("WV"-SPDT)/20
00177P 0124 8D A5 00CB         BSR   DSTL3X    RE-ENTER "WV" ONTO PSTK
00178                     *                    SUBTRACT .5 TO AVOID ROUNDING
00179                     *                    WHEN VALUE IS STORED
00180P 0126 CE 0000  A         LDX   #FSB
00181P 0129 BD 0000  A         JSR   SINT15    FSB = INT("WV")
00182P 012C BD 0000  A         JSR   DROP      DROP UNALTERED "WV" BACK TO
00183                     *                    TOP OF PSTK
00184P 012F CE 0000  A         LDX   #FSB
00185P 0132 BD 0000  A         JSR   EINT15    ENTER INT("WV")
00186P 0135 BD 0000  A         JSR   FLPSUB    SUBTRACT
00187P 0138 CE 0014  A         LDX   #20
00188P 013B BD 0000  A         JSR   ENTIDX    ENTER 20
00189P 013E BD 0000  A         JSR   FLPMLT    MULTIPLY
00190P 0141 CE 0000  A         LDX   #FSBRF
00191P 0144 BD 0000  A         JSR   SINT7     FSBRF = ("WV"-INT("WV"))*20
00192P 0147 7C 0000  A         INC   NDB       NDB = NDB+1
00193P 014A CE 0000  A  STLB1A LDX   #SPDT
00194P 014D BD 0000  A         JSR   ENTER     ENTER SPDT
00195P 0150 BD 00CB  P         JSR   DSTL3X    RE-ENTER SPDT ONTO PSTK,
00196                     *                    SUBTRACT .5 TO AVOID ROUNDING
00197                     *                    WHEN VALUE IS STORED
00198P 0153 CE 0000  A         LDX   #ISPD
00199P 0156 BD 0000  A         JSR   SINT15    ISPD = INT(SPDT)
00200P 0159 BD 0000  A         JSR   DROP      DROP UNALTERED SPDT BACK TO
00201                     *                    TOP OF PSTK
00202P 015C CE 0000  A         LDX   #ISPD
00203P 015F BD 0000  A         JSR   EINT15    ENTER ISPD
00204P 0162 BD 0000  A         JSR   FLPSUB    SPDT-ISPD
00205P 0165 86 02    A         LDAA  #2
00206P 0167 BD 0000  A         JSR   EEXP10    ENTER 10**2
00207P 016A BD 0000  A         JSR   FLPMLT    MULTIPLY
```

```
00208P 016D CE 0000    A            LDX      #RSPD
00209P 0170 BD 0000    A            JSR      SINT8      RSPD = (SPDT-ISPD)*100
00210P 0173 B6 0000    A            LDAA     RSPD
00211P 0176 B7 0000    A            STAA     SRSPD      SRSPD = RSPD
00212P 0179 4F                      CLRA
00213P 017A 97 00      A            STAA     TEMP3
00214P 017C D6 00      A            LDAB     FSBRF
00215P 017E D7 01      A            STAB     TEMP3+1
00216P 0180 2A 03 0185              BPL      STLB1B     BRANCH IF POSITIVE
00217P 0182 73 0000    A            COM      TEMP3      ... ELSE MAKE NEGATIVE
00218P 0185 C6 15      A STLB1B     LDAB     #21
00219P 0187 D0 01      A            SUBB     TEMP3+1
00220P 0189 92 00      A            SBCA     TEMP3
00221P 018B F0 0001    A            SUBB     ISPD+1
00222P 018E B2 0000    A            SBCA     ISPD
00223P 0191 97 00      A            STAA     CF1
00224P 0193 D7 01      A            STAB     CF1+1      CF1 = 21-FSBRF-ISPD
00225P 0195 96 00      A            LDAA     FSB
00226P 0197 D6 01      A            LDAB     FSB+1
00227P 0199 44                      LSRA
00228P 019A 56                      RORB
00229P 019B 44                      LSRA
00230P 019C 56                      RORB
00231P 019D 44                      LSRA
00232P 019E 56                      RORB
00233P 019F F7 0000    A            STAB     NSW        NSW = INT(FSB/8)
00234P 01A2 D6 01      A            LDAB     FSB+1
00235P 01A4 53                      COMB
00236P 01A5 C4 07      A            ANDB     #%00000111
00237P 01A7 F7 0000    A            STAB     NSB        NSB = 7-FSB BITS 2-0
00238P 01AA 96 00      A            LDAA     LI
00239P 01AC BD 0000    A            JSR      PNTATT     POINT TO XDAC(LI)
00240P 01AF A6 00      A            LDAA     OBLSP,X    GET BLSP(LI)
00241P 01B1 84 0F      A            ANDA     #$0F       WIPE OUT BIT LOCATION
00242P 01B3 E6 00      A            LDAB     OBWDD,X    GET BWDD(LI)
00243P 01B5 FB 0000    A            ADDB     NDW
00244P 01B8 89 00      A            ADCA     #0
00245P 01BA 97 00      A            STAA     TEMP3
00246P 01BC D7 01      A            STAB     TEMP3+1
00247P 01BE DE 00      A            LDX      TEMP3      IDX = BLSP(LI) BITS 3-0 * 256
00248                              *                        +BWDD(LI)+NDW
00249P 01C0 A6 00      A            LDAA     0,X
00250P 01C2 B7 0000    A            STAA     DW         DW = BYTE ADDRESSED
00251                              *                        BY INDEX REGISTER
00252P 01C5 86 00      A            LDAA     #ASBF+ASBT
00253P 01C7 BD 0000    A            JSR      SFLG2      ASBF = 1, ASBT = 1
00254P 01CA 86 00      A            LDAA     #NX
00255P 01CC BD 0000    A            JSR      CFLG2      NX = 0
00256P 01CF 20 00 01D1              BRA      STLDB2     CONTINUE WITH ......
00257                              *                    SET TRACE LD DISPLAY BITS
00258                              *                    (SHEET 2)
00260                              *
00261                              * STLDB2 - SET TRACE LD DISPLAY BITS
00262                              *              (SHEET 2)
00263                              *
00264                              * FLOW PAGE 18L2
00265                              *
00266P 01D1 96 00      A STLDB2     LDAA     LI
00267P 01D3 BD 0000    A            JSR      SCRL1C     GET BADS(LI)
00268P 01D6 B6 0000    A            LDAA     NSW
00269P 01D9 BD 0000    A            JSR      OFFX
00270P 01DC A6 00      A            LDAA     0,X
00271P 01DE B7 0000    A            STAA     SW         SW = (BADS(LI)+NSW)
00272P 01E1 B6 0000    A STLB2A     LDAA     NSB
00273P 01E4 4C                      INCA
00274P 01E5 F6 0000    A            LDAB     SW
00275P 01E8 56          STLB2B      RORB                GET BIT FROM SW
00276P 01E9 4A                      DECA
00277P 01EA 26 FC 01E8              BNE      STLB2B     CONTINUE UNTIL SW(BIT BSB)
00278P 01EC 24 04 01F2              BCC      STLB2C     BRANCH IF SW(BIT NSB) = 0
00279P 01EE 86 00      A            LDAA     #ASBF      READY TO SET ASBF = 0
00280P 01F0 20 02 01F4              BRA      STLB2D
00281P 01F2 86 00      A STLB2C     LDAA     #ASBT      READY TO SET ASBT = 0
```

```
00282P 01F4 BD 0000  A STLB2D JSR   CFLG2
00283P 01F7 DE 00    A        LDX   CF1        IS CF1 > 0?
00284P 01F9 2F 7A 0275         BLE   STLB2H     IF NOT...BRANCH
00285P 01FB CE 0000  A        LDX   #NDB       DETERMINE VALUE OF NEXT
00286P 01FE BD 0000  A        JSR   STLDB9     DISPLAY BIT
00287P 0201 86 00    A        LDAA  #FTT
00288P 0203 95 00    A        BITA  FR2        IS FTT = 1?
00289P 0205 27 0B 0212         BEQ   STLB2E     IF NOT...BRANCH
00290P 0207 BD 0000  A        JSR   CFLG2      FTT = 0
00291P 020A BD 02A7  P        JSR   STLB2J     CF1 = CF1-ISPD
00292P 020D 7A 0000  A        DEC   NDB        NDB = NDB-1
00293P 0210 20 63 0275         BRA   STLB2H
00294P 0212 B6 0000  A STLB2E LDAA  NDB
00295P 0215 CE 0000  A        LDX   #DW        DETERMINE BIT TO CHANGE
00296P 0218 BD 0000  A        JSR   STLDBF     AND CHANGE IT
00297P 021B 7C 0000  A        INC   BLS        BLS = BLS+1
00298P 021E 96 00    A        LDAA  BLS
00299P 0220 91 00    A        CMPA  BLR        IS BLS >= BLR?
00300P 0222 25 07 022B         BCS   STLB2U     BRANCH IF BLS < BLR
00301P 0224 D6 00    A        LDAB  BLR
00302P 0226 CB 14    A        ADDB  #20
00303P 0228 11                CBA              IS BLS > (BLR+20)?
00304P 0229 23 6D 0298         BLS   STLB2Y     IF NOT...BRANCH
00305P 022B B6 0000  A STLB2U LDAA  NDB        IS NDB = 0?
00306P 022E 26 28 0258         BNE   STLB2F     IF NOT...BRANCH
00307P 0230 BD 02CA  P        JSR   STLIDB     SET A TRACE(LI) DISPLAY BIT
00308P 0233 96 00    A        LDAA  FR1
00309P 0235 85 00    A        BITA  #TE        IS TE = 0?
00310P 0237 27 09 0242         BEQ   STLB2V     IF YES...BRANCH
00311P 0239 BD 0000  A        JSR   SCNCLR     SCAN CLEAR CONTROL
00312P 023C 96 00    A        LDAA  FR1
00313P 023E 85 00    A        BITA  #TE        IS TE = 0?
00314P 0240 27 61 02A3         BEQ   STLB2W     IF YES...BRANCH
00315P 0242 7C 0000  A STLB2V INC   NDW        NDW = NDW+1
00316P 0245 96 00    A        LDAA  LI         TRACE(LI)
00317P 0247 F6 0000  A        LDAB  NDW        OFFSET FROM BWDD
00318P 024A 8D 6A 02B6         BSR   STLB2K     POINT TO BYTE WITHIN TRACE
00319P 024C A6 00    A        LDAA  0,X        DW = (BLSP(LI) BITS 3-0 *256
00320P 024E B7 0000  A        STAA  DW         +BWDD(LI)+NDW)
00321P 0251 86 07    A        LDAA  #7
00322P 0253 B7 0000  A        STAA  NDB        NDB = 7
00323P 0256 20 03 025B         BRA   STLB2G
00324P 0258 7A 0000  A STLB2F DEC   NDB        NDB = NDB-1
00325P 025B 8D 4A 02A7 STLB2G BSR   STLB2J     CF1 = CF1-ISPD
00326P 025D B6 0000  A        LDAA  SRSPD
00327P 0260 BB 0000  A        ADDA  RSPD       SRSPD = SRSPD+RSPD
00328P 0263 81 64    A        CMPA  #100       IS SRSPD > 100?
00329P 0265 23 07 026E         BLS   STLB2Z     IF NOT...BRANCH
00330P 0267 DE 00    A        LDX   CF1
00331P 0269 09                DEX
00332P 026A DF 00    A        STX   CF1        CF1 = CF1-1
00333P 026C 80 64    A        SUBA  #100       SRSPD = SRSPD-100
00334P 026E B7 0000  A STLB2Z STAA  SRSPD
00335P 0271 DE 00    A        LDX   CF1        IS CF1 > 0?
00336P 0273 2E 9D 0212         BGT   STLB2E     IF YES..BRANCH
00337P 0275 86 14    A STLB2H LDAA  #20
00338P 0277 DE 00    A        LDX   CF1
00339P 0279 BD 0000  A        JSR   OFFX
00340P 027C DF 00    A        STX   CF1        CF1 = CF1+20
00341P 027E 7D 0000  A        TST   NSB        IS NSB = 0?
00342P 0281 27 06 0289         BEQ   STLB2I     IF YES...BRANCH
00343P 0283 7A 0000  A        DEC   NSB        NSB = NSB-1
00344P 0286 7E 01E1  P        JMP   STLB2A
00345P 0289 7C 0000  A STLB2I INC   NSW        NSW = NSW+1
00346P 028C 86 07    A        LDAA  #7
00347P 028E B7 0000  A        STAA  NSB        NSB = 7
00348P 0291 B6 0000  A        LDAA  NSW
00349P 0294 81 7D    A        CMPA  #125       IS NSW = 125?
00350P 0296 26 0C 02A4         BNE   STLB2X     IF NOT...BRANCH
00351P 0298 8D 30 02CA STLB2Y BSR   STLIDB     SET A TRACE(LI) DISPLAY BIT
00352P 029A 96 00    A        LDAA  LD
00353P 029C BD 0000  A        JSR   SCRL1C     GET POINTER TO J(LD)
00354P 029F C6 01    A        LDAB  #1
```

```
00355P 02A1 E7 00      A           STAB    JL1OFS,X   J(LD,1) = 1
00356P 02A3 39           STLB2W    RTS
00357P 02A4 7E 01D1   P STLB2X    JMP     STLDB2     IF NOT EQUAL...BRANCH 00359P 02A7 96 00      A STLB2J   LDAA    CF1
00360P 02A9 D6 01      A           LDAB    CF1+1
00361P 02AB F0 0001    A           SUBB    ISPD+1
00362P 02AE B2 0000    A           SBCA    ISPD
00363P 02B1 97 00      A           STAA    CF1
00364P 02B3 D7 01      A           STAB    CF1+1      CF1 = CF1-ISPD
00365P 02B5 39                     RTS 00367P 02B6 BD 0000    A STLB2K   JSR     PNTATT     POINT TO XDAC(ACCA)
00368P 02B9 37                     PSHB
00369P 02BA A6 00      A           LDAA    OBLSP,X    GET BLSP(ACCA)
00370P 02BC 84 0F      A           ANDA    #$0F       REMOVE BIT LOCATION INFO
00371P 02BE E6 00      A           LDAB    OBWDD,X    GET BWDD(ACCA)
00372P 02C0 97 00      A           STAA    TEMP3
00373P 02C2 D7 01      A           STAB    TEMP3+1
00374P 02C4 DE 00      A           LDX     TEMP3
00375P 02C6 32                     PULA
00376P 02C7 7E 0000    A           JMP     OFFX       POINT TO BYTE WITHIN TRACE

00378                              *
00379                              * STLIDB - SET A TRACE(LI) DISPLAY BYTE
00380                              *
00381                              * FLOW PAGE 18M
00382                              *
00383P 02CA 96 00      A STLIDB   LDAA    LI         TRACE(LI)
00384P 02CC F6 0000    A           LDAB    NDW        OFFSET FROM BWDD
00385P 02CF 8D E5 02B6             BSR     STLB2K     POINT TO BYTE WITHIN TRACE
00386P 02D1 B6 0000    A           LDAA    DW
00387P 02D4 A7 00      A           STAA    0,X        (BLSP(LI) BITS 3-0*256
00388                              *                  +BWDD(LI)+NDW) = DW
00389P 02D6 DF 00      A           STX     TEMP3
00390P 02D8 96 00      A           LDAA    TEMP3
00391P 02DA D6 01      A           LDAB    TEMP3+1
00392P 02DC CE 0020    A           LDX     #BADD+32
00393P 02DF BD 0000    A           JSR     CMPIDX     IS DISPLAY ADDR. < #BADD+32?
00394P 02E2 2D 0E 02F2             BLT     STLID1     IF YES...BRANCH
00395P 02E4 CE 0120    A           LDX     #BADD+288
00396P 02E7 BD 0000    A           JSR     CMPIDX     IS DISPLAY ADDR. < #BADD+288?
00397P 02EA 2D 15 0301             BLT     STLID3     IF YES...BRANCH
00398P 02EC C0 20      A           SUBB    #$20       SUBTRACT 288(DECIMAL)
00399P 02EE 82 01      A           SBCA    #$01       FROM DISPLAY ADDR.
00400P 02F0 20 04 02F6             BRA     STLID2
00401P 02F2 CB 20      A STLID1   ADDB    #$20       ADD 288(DECIMAL)
00402P 02F4 89 01      A           ADCA    #$01       TO DISPLAY ADDRESS
00403P 02F6 97 00      A STLID2   STAA    TEMP3
00404P 02F8 D7 01      A           STAB    TEMP3+1
00405P 02FA DE 00      A           LDX     TEMP3
00406P 02FC B6 0000    A           LDAA    DW
00407P 02FF A7 00      A           STAA    0,X        (DISPLAY ADDRESS) = DW
00408P 0301 96 00      A STLID3   LDAA    LD
00409P 0303 BD 0000    A           JSR     SCRL1A     POINT DW(LD)
00410P 0306 D6 00      A           LDAB    BLS
00411P 0308 53                     COMB
00412P 0309 A6 03      A           LDAA    3,X
00413P 030B 85 7F      A           BITA    #$7F       IS DW(LD),4 BITS 6-0 = " "?
00414P 030D 26 08 0317             BNE     STLID4     IF NOT...BRANCH
00415P 030F 96 00      A           LDAA    LD
00416P 0311 BD 0000    A           JSR     SCATR8     POINT TBL(LD)
00417P 0314 E7 00      A           STAB    0,X        TBL(LD) = 1'S COMPL. OF BLS
00418P 0316 39                     RTS 00420P 0317 96 00      A STLID4   LDAA    LI
00421P 0319 BD 0000    A           JSR     PNTATT     POINT TO XDAC(LI)
00422P 031C E7 00      A           STAB    OBL,X      BL(LI) = 1'S COMPL. OF BLS
00423P 031E 39                     RTS 00425P 031F    00      A           FCB     0          CRC BYTE
00426                              END
TOTAL ERRORS 00000
```

```
R       ASBF    00019*00252 00279
R       ASBT    00019*00252 00281
R       BADD    00020*00392 00395
R       BLOC    00020*00045 00073 00121
RB      BLR     00006*00047 00061 00079 00083 00299 00301
RB      BLS     00006*00051 00054 00060 00069 00071 00078 00120 00297 00298
                00410
RB      BLT     00006*00055 00056
RP      BUMP    00010*00134
RB      CF1     00006*00223 00224 00283 00330 00332 00335 00338 00340 00359
                00360 00363 00364
RP      CFLG2   00010*00158 00255 00282 00290
RP      CMPIDX  00010*00058 00393 00396
RP      COMPXY  00010*00169
RP      DROP    00010*00107 00182 00200
 P 0020 DSTL3A  00049 00053*
 P 0034 DSTL3B  00059 00062*
 P 004A DSTL3C  00052 00072*
 P 0054 DSTL3D  00063 00076*
 P 005E DSTL3E  00068 00081*
 P 0069 DSTL3F  00080 00088*
 P 00C9 DSTL3H  00075 00124 00130*
D/P 00CB DSTL3X 00026 00101 00134*00177 00195
DP 0000 DSTLD3  00026 00036*
R       DW      00020*00250 00295 00320 00386 00406
RP      EEXP10  00011*00206
RP      EINT15  00011*00099 00110 00160 00185 00203
RP      EINT7   00011*00165
RP      ENTER   00011*00093 00168 00194
RP      ENTIDX  00012*00096 00113 00162 00175 00188
RP      ENTINT  00012*00091
RP      ENTPV2  00012*00138
RB      FDB     00007*00050 00072 00074 00089 00122 00148
RP      FLPADD  00013*00100 00166
RP      FLPDIV  00013*00097 00176
RP      FLPMLT  00013*00094 00114 00163 00189 00207
RP      FLPSUB  00013*00111 00139 00173 00186 00204
RB      FR1     00007*00308 00312
RB      FR2     00007*00288
RB      FSB     00007*00098 00104 00109 00127 00129 00159 00180 00184 00225
                00226 00234
RB      FSBRF   00007*00118 00119 00126 00164 00190 00214
R       FTT     00020*00157 00171 00287
R       ISPD    00020*00198 00202 00221 00222 00361 00362
R       JL1OFS  00021*00355
RB      LD      00008*00036 00064 00352 00408 00415
RB      LI      00008*00081 00238 00266 00316 00383 00420
R       NDB     00022*00156 00192 00285 00292 00294 00305 00322 00324
R       NDW     00022*00153 00243 00315 00317 00384
R       NSB     00022*00237 00272 00341 00343 00347
R       NSW     00022*00233 00268 00345 00348
R       NX      00022*00254
R       OBL     00023*00085 00422
R       OBLSP   00023*00038 00240 00369
RP      OBWDD   00023*00242 00371
RP      OFFX    00014*00269 00339 00376
R       OUNBL   00023*00066
RP      PNTATT  00014*00037 00065 00082 00239 00367 00421
R       RSPD    00024*00208 00210 00327
RP      SCATR8  00015*00416
RP      SCNCLR  00015*00311
RP      SCRL1A  00015*00409
RP      SCRL1C  00016*00267 00353
RP      SFLG2   00016*00172 00253
RB      SH      00008*00048 00062 00070 00077
RP      SINT15  00016*00105 00181 00199
RP      SINT7   00016*00116 00191
RP      SINT8   00016*00209
R       SPDT    00024*00092 00167 00193
R       SRSPD   00024*00211 00326 00334
 P 014A STLB1A  00170 00193*
 P 0185 STLB1B  00216 00218*
 P 01E1 STLB2A  00272*00344
```

```
P 01E8 STLB2B 00275*00277
P 01F2 STLB2C 00278 00281*
P 01F4 STLB2D 00280 00282*
P 0212 STLB2E 00289 00294*00336
P 0258 STLB2F 00306 00324*
P 025B STLB2G 00323 00325*
P 0275 STLB2H 00284 00293 00337*
P 0289 STLB2I 00342 00345*
P 02A7 STLB2J 00291 00325 00359*
P 02B6 STLB2K 00318 00367*00385
P 022B STLB2U 00300 00305*
P 0242 STLB2V 00310 00315*
P 02A3 STLB2W 00314 00356*
P 02A4 STLB2X 00350 00357*
P 0298 STLB2Y 00304 00351*
P 026E STLB2Z 00329 00334*
P 00DC STLDB1 00130 00148*
P 01D1 STLDB2 00256 00266*00357
RP      STLDB9 00017*00296
RP      STLDBF 00017*00296
P 02F2 STLID1 00394 00401*
P 02F6 STLID2 00400 00403*
P 0301 STLID3 00397 00408*
P 0317 STLID4 00414 00420*
P 02CA STLIDB 00307 00351 00383*
R       SW     00024*00271 00274
R       TE     00024*00309 00313
RB      TEMP3  00008*00115 00117 00136 00137 00213 00215 00217 00219 00220
               00245 00246 00247 00372 00373 00374 00389 00390 00391 00403
               00404 00405

00001                          NAM    F19A
00002                          OPT    REL,CREF,LLEN=80
00003                          TTL    FLOW PAGES 19A THRU 24
00004                          IDNT   FEB.   21, 1978

00006                          XREF   BSCT:K4, K4S, K5, K5S, K6, K7, K8
00007                          XREF   BSCT:M1, SCRTCH, SH
00008                          XREF   BSCT:T1, TEMP3, TEMP4, TPL, TPR

00010                          XREF   PSCT:CANLOG, CLITE1, COMP16
00011                          XREF   PSCT:DELAY, DIV16, DSPDEL, DT1MS
00012                          XREF   PSCT:OFFX, READSR
00013                          XREF   PSCT:SETTS, SFLG2, SLITE1, SMDW4, SMDW5

00015                          XREF   TDF, TSLN, TSLP

00017                          XDEF   CANCP, K5MTPR
00018                          XDEF   SCTP, SCTSL, SCTT, SCTSO, SETK6
00019                          XDEF   WUNCP 00021P 0000                    PSCT

00023                   *
00024                   * SCTP - SCAN TRIGGER POSITION CONTROL (K5)
00025                   *
00026                   * FLOW PAGE 19A
00027                   *
00028P 0000 86 16     A SCTP    LDAA   #22
00029P 0002 97 00     A         STAA   T1        T1 = 22
00030P 0004 86 02     A         LDAA   #2
00031P 0006 97 00     A         STAA   SH        SH = 2
00032P 0008 BD 0000   A SCTP0   JSR    READSR    READ SWITCH REGISTERS
00033P 000B 81 31     A         CMPA   #$31      IS TRIG POSITION -90 PRESSED?
00034P 000D 27 08 0017          BEQ    SCTP2     IF YES...BRANCH
00035P 000F 81 32     A         CMPA   #$32      IS TRIG POSITION +90 PRESSED?
00036P 0011 27 07 001A          BEQ    SCTP3     IF YES...BRANCH
```

```
00037P 0013 7F 0000  A           CLR   SH          SH = 0
00038P 0016 39             SCTP1  RTS 00040P 0017 70 0000  A SCTP2     NEG   SH          SH = -SH
00041P 001A 4F         SCTP3     CLRA              MSB OF A,B _ 0
00042P 001B D6 00    A           LDAB  SH          A,B _ SH
00043P 001D 57                   ASRB              A,B _ SH/2
00044P 001E 2A 01 0021           BPL   SCTPC       BRANCH IF SH POSITIVE
00045P 0020 43                   COMA              ELSE CORRECT MSB
00046P 0021 DB 01    A SCTPC     ADDB  K5+1
00047P 0023 99 00    A           ADCA  K5
00048P 0025 97 00    A           STAA  K5
00049P 0027 D7 01    A           STAB  K5+1        K5 = K5+SH/2
00050P 0029 4F                   CLRA
00051P 002A D6 00    A           LDAB  TPL 00053P 002C 58                   ASLB
00054P 002D 49                   ROLA              TIMES 2
00055P 002E 97 00    A           STAA  TEMP4
00056P 0030 D7 01    A           STAB  TEMP4+1     SAVE INTERMEDIATE RESULT 00058P 0032 58                   ASLB
00059P 0033 49                   ROLA 00061P 0034 58                   ASLB
00062P 0035 49                   ROLA              TIMES 8

00064P 0036 DB 01    A           ADDB  TEMP4+1
00065P 0038 99 00    A           ADCA  TEMP4       TIMES 10
00066P 003A 97 00    A           STAA  TEMP4
00067P 003C D7 01    A           STAB  TEMP4+1     TPL*10

00069P 003E BD 00DD  P           JSR   K5MTPR      ACCA,ACCB = K5-TPR*10
00070P 0041 CE 0000  A           LDX   #TEMP4      POINT TO TPL*10
00071P 0044 BD 0000  A           JSR   COMP16      IS K5-TPR*10 > TPL*10?
00072P 0047 2F 04 004D           BLE   SCTP4       IF NOT...BRANCH
00073P 0049 D0 01    A           SUBB  TEMP4+1     ACCB = K5-TPR*10-TPL*10
00074P 004B 20 1A 0067           BRA   SCTP5
00075P 004D 36             SCTP4  PSHA
00076P 004E 37                   PSHB              SAVE K5-TPR*10
00077P 004F 96 00    A           LDAA  TEMP4
00078P 0051 D6 01    A           LDAB  TEMP4+1
00079P 0053 40                   NEGA
00080P 0054 50                   NEGB
00081P 0055 82 00    A           SBCA  #0          NEGATE
00082P 0057 97 00    A           STAA  TEMP3
00083P 0059 D7 01    A           STAB  TEMP3+1     -TPL*10
00084P 005B 33                   PULB
00085P 005C 32                   PULA              RESTORE K5-TPR*10
00086P 005D CE 0000  A           LDX   #TEMP3      POINT TO -TPL*10
00087P 0060 BD 0000  A           JSR   COMP16      IS K5-TPR*10 < -TPL*10?
00088P 0063 2C 16 007B           BGE   SCTP6       IF NOT...BRANCH
00089P 0065 DB 01    A           ADDB  TEMP4+1     ACCB = K5-TPR*10+TPL*10
00090P 0067 58             SCTP5  ASLB             TIMES 2
00091P 0068 D0 00    A           SUBB  SH          -SH
00092P 006A 50                   NEGB              TIMES -1
00093P 006B D7 00    A           STAB  SH          SET SH
00094P 006D D6 00    A           LDAB  TPR
00095P 006F 58                   ASLB
00096P 0070 17                   TBA
00097P 0071 58                   ASLB
00098P 0072 58                   ASLB
00099P 0073 1B                   ABA               ACCA = TPR*10
00100P 0074 EE 00    A           LDX   0,X         GET PROPER VALUE OF TPL*10
00101                      *                       (+ OR -)
00102P 0076 BD 0000  A           JSR   OFFX        INDEX = INDEX+TPR*10
00103P 0079 DF 00    A           STX   K5          SET K5
00104P 007B 7D 0000  A SCTP6     TST   SH          IS SH = 0?
00105P 007E 27 96 0016           BEQ   SCTP1       IF YES...BRANCH
00106P 0080 DE 00    A           LDX   K4
00107P 0082 DF 00    A           STX   K4S         K4S = K4
00108P 0084 8D 57 00DD           BSR   K5MTPR      ACCA,ACCB = K5-TPR*10
00109P 0086 97 00    A           STAA  K5S
```

```
00110P 0088 D7 01     A            STAB    K5S+1       K5S = K5-TPR*10
00111P 008A BD 0000   A            JSR     SMDW4       USE K5 TO SET MDW, 30-34
00112P 008D 86 00     A            LDAA    #TDF
00113P 008F BD 0000   A            JSR     SFLG2       TDF _ 1
00114P 0092 96 00     A            LDAA    M1
00115P 0094 81 02     A            CMPA    #2          IS M1 = 2? (IE. TRIM MODE?)
00116P 0096 27 03 009B             BEQ     SCTP7       IF YES...BRANCH
00117P 0098 BD 0000   A            JSR     DSPDEL      CHANGE DISPLAY DUE TO
00118                      *                           DELTA K4 / DELTA K5
00119P 009B BD 0000   A  SCTP7     JSR     DT1MS       DELAY T1 MSEC.,
00120                      *                           THEN REDUCE T1
00121P 009E 96 00     A            LDAA    SH
00122P 00A0 2A 01 00A3             BPL     SCTP8
00123P 00A2 40                     NEGA
00124P 00A3 81 14     A  SCTP8     CMPA    #20
00125P 00A5 26 05 00AC             BNE     SCTPA
00126P 00A7 97 00     A  SCTP9     STAA    SH          IF ABS(SH) = 20 THEN
00127P 00A9 7E 0008   P            JMP     SCTP0       ... SH _ 20 AND LOOP
00128                      *
00129P 00AC 96 00     A  SCTPA     LDAA    T1
00130P 00AE 81 06     A            CMPA    #6
00131P 00B0 24 27 00D9             BCC     SCTPB       BRANCH IF T1 >= 6
00132P 00B2 4F                     CLRA
00133P 00B3 5F                     CLRB
00134P 00B4 DE 00     A            LDX     K5
00135P 00B6 DF 00     A            STX     SCRTCH
00136P 00B8 2A 02 00BC             BPL     SCTPD       BRANCH IF K5 IS POSITIVE
00137P 00BA 43                     COMA                ... ELSE PROPAGATE SIGN
00138P 00BB 53                     COMB
00139P 00BC CE 000A   A  SCTPD     LDX     #10
00140P 00BF DF 00     A            STX     TEMP3
00141P 00C1 CE 0000   A            LDX     #TEMP3
00142P 00C4 BD 0000   A            JSR     DIV16       DIVIDE K5 BY 10
00143P 00C7 DE 00     A            LDX     SCRTCH      IS REMAINDER = 0?
00144P 00C9 26 0E 00D9             BNE     SCTPB       IF NOT...BRANCH
00145P 00CB 86 16     A            LDAA    #22
00146P 00CD 97 00     A            STAA    T1          ... ELSE T1 _ 22
00147P 00CF 86 14     A            LDAA    #20
00148P 00D1 CE 0B28   A            LDX     #2856       ... AND SH _ 20
00149P 00D4 BD 0000   A            JSR     DELAY       WAIT 200 MS.
00150P 00D7 20 CE 00A7             BRA     SCTP9       ... AND LOOP
00151                      *
00152P 00D9 86 02     A  SCTPB     LDAA    #2          SH _ 2
00153P 00DB 20 CA 00A7             BRA     SCTP9       ... AND LOOP 00155            00DD  P  K5MTPR   EQU     *           COMPUTE K5-TPR*10
00156P 00DD D6 00     A            LDAB    TPR
00157P 00DF 58                     ASLB
00158P 00E0 17                     TBA
00159P 00E1 58                     ASLB
00160P 00E2 58                     ASLB
00161P 00E3 1B                     ABA                 ACCA = TPR*10
00162P 00E4 16                     TAB
00163P 00E5 96 01     A            LDAA    K5+1
00164P 00E7 10                     SBA
00165P 00E8 16                     TAB
00166P 00E9 96 00     A            LDAA    K5
00167P 00EB 82 00     A            SBCA    #0
00168P 00ED 39                     RTS                 ACCA, ACCB = K5-TPR*10

00170                      *
00171                      * SCTSL - SCAN TRIGGER SLOPE CONTROL (K6)
00172                      *
00173                      * FLOW PAGE 20A
00174                      *
00175P 00EE BD 0000   A  SCTSL     JSR     READSR
00176P 00F1 16                     TAB                 ACCB _ SWITCH STATUS
00177P 00F2 4F                     CLRA                ACCA _ 0
00178P 00F3 C1 33     A            CMPB    #$33        BRANCH IF TRIGGER
00179P 00F5 27 06 00FD             BEQ     SCTSL0      ... SLOPE NEGATIVE PRESSED
00180P 00F7 4C                     INCA                ACCA _ 1
```

```
00181P 00F8 C1 34     A            CMPB   #$34      IS "TRIGGER SLOPE +" PRESSED?
00182P 00FA 27 01 00FD             BEQ    SCTSL0    IF YES...BRANCH
00183P 00FC 39                     RTS              EXIT 00185P 00FD 8D 03 0102  SCTSL0     BSR    SETK6     SET LED'S
00186P 00FF 7E 0000   A            JMP    CANLOG    CLEAR ANALOG TRACE, IF REQD.
00187                       *                      ... AND EXIT 00189P 0102 97 00     A SETK6      STAA   K6        K6 _ ACCA
00190P 0104 C6 00     A            LDAB   #TSLP+TSLN
00191P 0106 BD 0000   A            JSR    CLITE1    TSLP _ TSLN _ 0
00192P 0109 C6 00     A            LDAB   #TSLP     ACCB _ TSLP BIT
00193P 010B 7D 0000   A            TST    K6
00194P 010E 26 02 0112             BNE    SCTSL1
00195P 0110 C6 00     A            LDAB   #TSLN     IF K6=0 THEN ACCB _ TSLN BIT
00196P 0112 7E 0000   A SCTSL1     JMP    SLITE1    ACCB BIT _ 1 ... AND EXIT

00198                       *
00199                       * SCTT - SCAN TRIGGER THRESHOLD CONTROL (K7)
00200                       *
00201                       * FLOW PAGE 21
00202                       *
00203P 0115 86 16     A SCTT       LDAA   #22
00204P 0117 97 00     A            STAA   T1        T1 = 22
00205P 0119 BD 0000   A SCTT0      JSR    READSR    READ SWITCH REGISTERS
00206P 011C 81 36     A            CMPA   #$36      IS TRIGGER THRESHOLD +25V PRESSED?
00207P 011E 27 17 0137             BEQ    SCTT1     IF YES...BRANCH
00208P 0120 81 35     A            CMPA   #$35      IS TRIGGER THRESHOLD -25V PRESSED?
00209P 0122 26 2B 014F             BNE    SCTT3     IF NOT...BRANCH
00210P 0124 86 FF     A            LDAA   #$FF
00211P 0126 C6 06     A            LDAB   #$06      ACCA,ACCB = -250
00212P 0128 CE 0000   A            LDX    #K7       NOTE: K7 IS INT15*10
00213P 012B BD 0000   A            JSR    COMP16    IS K7 = -250?
00214P 012E 27 1F 014F             BEQ    SCTT3     IF YES...BRANCH
00215P 0130 DE 00     A            LDX    K7        NOTE: K7 IS INT15*10
00216P 0132 09                     DEX
00217P 0133 DF 00     A            STX    K7        K7 = K7-1
00218P 0135 20 10 0147             BRA    SCTT2
00219P 0137 4F          SCTT1      CLRA
00220P 0138 C6 FA     A            LDAB   #250      ACCA,ACCB = 250
00221P 013A CE 0000   A            LDX    #K7       NOTE: K7 IS INT15*10
00222P 013D BD 0000   A            JSR    COMP16    IS K7 = 250?
00223P 0140 27 0D 014F             BEQ    SCTT3     IF YES...BRANCH
00224P 0142 DE 00     A            LDX    K7
00225P 0144 08                     INX
00226P 0145 DF 00     A            STX    K7        K7 = K7+1
00227P 0147 BD 0000   A SCTT2      JSR    SMDW5     USE K7 TO SET MDW, 36-40
00228P 014A BD 0000   A            JSR    DT1MS     DELAY T1 MILLISEC., THEN REDUCE T1
00229P 014D 20 CA 0119             BRA    SCTT0
00230P 014F 39          SCTT3      RTS

00232                       *
00233                       * SCTSO - SCAN TRIGGER SOURCE CONTROL (K8)
00234                       *
00235                       * FLOW PAGE 22
00236                       *
00237P 0150 BD 0000   A SCTSO      JSR    READSR    READ SWITCH REGISTERS
00238P 0153 D6 00     A            LDAB   K8        ACCB _ K8
00239P 0155 81 37     A            CMPA   #$37      IF TRIGGER SOURCE UP PRESSED
00240P 0157 27 07 0160             BEQ    DOINC     ... THEN BRANCH TO INCREMENT K8
00241P 0159 81 38     A            CMPA   #$38      IF TRIG SOURCE DOWN NOT PRESSED
00242P 015B 26 11 016E             BNE    SCTSOX    ... THEN EXIT
00243P 015D 5A                     DECB             ACCB _ ACCB-1
00244P 015E 26 01 0161             BNE    CHKOR     CHECK OVERFLOW IF ACCB <> 0
00245P 0160 5C          DOINC      INCB             ACCB _ ACCB+1
00246P 0161 C1 05     A CHKOR      CMPB   #5
00247P 0163 23 02 0167             BLS    DOSET     IF ACCB > 5
00248P 0165 C6 05     A            LDAB   #5        ... THEN ACCB _ 5
00249P 0167 D7 00     A DOSET      STAB   K8        K8 _ ACCB
00250P 0169 BD 0000   A            JSR    SETTS     SET TRIG SOURCE LEDS FROM K8
00251P 016C 20 06 0174             BRA    WUNCP     WAIT UNTIL NO CONTROLS ARE PRESSED
```

```
00252                   *                      ... AND EXIT
00253P 016E 39          SCTSOX RTS             EXIT

00255                   *
00256                   * CANCP - CLEAR ANALOG, NO CONTROLS PRESSED
00257                   *
00258                   * FLOW PAGE 23
00259                   *
00260P 016F BD 0000  A  CANCP  JSR    CANLOG   CLEAR ANALOG TRACE, IF REQD.
00261P 0172 20 00 0174         BRA    WUNCP    WAIT UNTIL NO CONTROLS ARE PRESSED
00262                   *                      ... AND EXIT

00264                   *
00265                   * WUNCP - WAIT UNTIL NO CONTROLS ARE PRESSED
00266                   *
00267                   * FLOW PAGE 24
00268                   *
00269P 0174 CE 02C5  A   WUNCP  LDX    #709
00270P 0177 BD 0000  A          JSR    DELAY   WAIT 50 MS (DEBOUNCE)
00271P 017A BD 0000  A   WUNCP1 JSR    READSR
00272P 017D 26 FB 017A          BNE    WUNCP1  WAIT UNTIL NO SWITCHES PRESSED
00273P 017F CE 02C5  A          LDX    #709
00274P 0182 BD 0000  A          JSR    DELAY   WAIT 50 MS
00275P 0185 39                  RTS            EXIT 00277P 0186    00    A          FCB    0       CRC BYTE
00278                           END
TOTAL ERRORS 00000

DP 016F CANCP  00017 00260*
RP      CANLOG 00010*00186 00260
 P 0161 CHKOR  00244 00246*
RP      CLITE1 00010*00191
RP      COMP16 00010*00071 00087 00213 00222
RP      DELAY  00011*00149 00270 00274
RP      DIV16  00011*00142
 P 0160 DOINC  00240 00245*
 P 0167 DOSET  00247 00249*
RP      DSPDEL 00011*00117
RP      DT1MS  00011*00119 00228
RB      K4     00006*00106
RB      K4S    00006*00107
RB      K5     00006*00046 00047 00048 00049 00103 00134 00163 00166
DP 00DD K5MTPR 00017 00069 00108 00155*
RB      K5S    00006*00109 00110
RB      K6     00006*00189 00193
RB      K7     00006*00212 00215 00217 00221 00224 00226
RB      K8     00006*00238 00249
RB      M1     00007*00114
RP      OFFX   00012*00102
RP      READSR 00012*00032 00175 00205 00237 00271
RP      SCRTCH 00007*00135 00143
DP 0000 SCTP   00018 00028*
 P 0009 SCTP0  00032*00127
 P 0016 SCTP1  00038*00105
 P 0017 SCTP2  00034 00040*
 P 001A SCTP3  00036 00041*
 P 004D SCTP4  00072 00075*
 P 0067 SCTP5  00074 00090*
 P 007B SCTP6  00088 00104*
 P 009B SCTP7  00116 00119*
 P 00A3 SCTP8  00122 00124*
 P 00A7 SCTP9  00126*00150 00153
 P 00AC SCTPA  00125 00129*
 P 00D9 SCTPB  00131 00144 00152*
 P 0021 SCTPC  00044 00046*
 P 00BC SCTPD  00136 00139*
DP 00EE SCTSL  00018 00175*
 P 00FD SCTSL0 00179 00182 00185*
```

```
 P 0112 SCTSL1 00194 00196*
DP 0150 SCTS0  00018 00237*
 P 016E SCTSOX 00242 00253*
DP 0115 SCTT   00018 00203*
 P 0119 SCTT0  00205*00229
 P 0137 SCTT1  00207 00219*
 P 0147 SCTT2  00218 00227*
 P 014F SCTT3  00209 00214 00223 00230*
DP 0102 SETK6  00018 00185 00189*
 RP     SETTS  00013*00250
 RP     SFLG2  00013*00113
 RB     SH     00007*00031 00037 00040 00042 00091 00093 00104 00121 00126
 RP     SLITE1 00013*00196
 RP     SMDW4  00013*00111
 RP     SMDW5  00013*00227
 RP     T1     00008*00029 00129 00146 00204
 R      TDF    00015*00112
 RB     TEMP3  00008*00082 00083 00086 00140 00141
 RB     TEMP4  00008*00055 00056 00064 00065 00066 00067 00070 00073 00077
                           00078 00089
 RB     TPL    00008*00051
 RB     TPR    00008*00094 00156
 R      TSLN   00015*00190 00195
 R      TSLP   00015*00190 00192
DP 0174 WUNCP  00019 00251 00261 00269*
 P 017A WUNCP1 00271*00272
```

```
00001                          NAM    DTOU0
00002                          OPT    REL, CREF, LLEN=80
00003                          TTL    UTILITY SUBROUTINES AND MATHPAK
00004                          IDNT   DEC.   12, 1977

00006                          XREF   BSCT:FR1, FR2, FR3, FR4, LITE1, LITE2
00007                          XREF   BSCT:M1, M2, PSTK, PSTKTP, SCRTCH
00008                          XREF   BSCT:TEMP, TEMP2, TEMP3, TEMP5, TMPIDX

00010                          XREF   LR1, LR2, MDW, NEGRES, SR1, SR2, SR3, SR4
00011                          XREF   TRET, BATDA, MPTBL

00013                          XDEF   BUMP, CRCUA, CRCUB
00014                          XDEF   SINT7, SINT8, ENTINT, ENTIDX
00015                          XDEF   CBLOCK, CFLG1, CLITE1, CLITE2, OFFX
00016                          XDEF   PNTATT, SETM1, CMPPV2, DOMOVE, DTOBDC
00017                          XDEF   EEXP10, EINT15, ENTER, ENTIMM
00018                          XDEF   FLPADD, FLPMLT, FLPSUB, MOVBLK
00019                          XDEF   R10, SLITE2, SLITE1, STOVAR, XDIV10
00020                          XDEF   DTOBTD, EINT7, EINT8, READSR
00021                          XDEF   COMP16, SFLG1, CFLG2, CMPIDX
00022                          XDEF   DELAY, DIV16, FEWUNP, MULT16, MULT8
00023                          XDEF   SABL3X, SFLG2, SUB16, CHFLG1, ENTPV2
00024                          XDEF   SINT15, SUBIDX, ABSAB, FLPDIV
00025                          XDEF   NHV, NLV, COMPXY, DROP, SFLG3, CFLG3
00026                          XDEF   M2P10, MDWM2, MDWMSG, TESTM2
00027                          XDEF   SFLG4, CFLG4

00029P 0000                    PSCT

00031                   ****************************************************
00032                   ****************************************************
00033                   **                                                **
00034                   ** UTILITY ROUTINES - GENERAL SUBROUTINES         **
00035                   **    CALLED BY THE FLOW CHART EXECUTIVES.        **
00036                   **                                                **
00037                   ****************************************************
00038                   ****************************************************
```

```
00040                    * CBLOCK - CLEAR BLOCK - TERMINATOR STORED IN
00041                    *   TEMP, FIRST BYTE TO BE CLEARED IN
00042                    *   THE INDEX.  ONLY REGISTER CHANGED IS
00043                    *   THE INDEX.
00044                    *
00045
00046P 0000 6F 00    A CBLOCK CLR   X            CLEAR ONE LOCATION IN BLOCK
00047P 0002 08                INX                NEXT LOCATION
00048P 0003 9C 00    A        CPX   TEMP         DONE?
00049P 0005 26 F9 0000        BNE   CBLOCK       LOOP IF NOT
00050P 0007 39                RTS                EXIT CBLOCK
00051                    *
00052                    * SAVES VALUE FROM A AS NEW M1.  ALSO
00053                    * JOINS SLITE2 TO SET APPROPRIATE MODE
00054                    * LED.
00055                    *
00056P 0008 97 00    A SETM1  STAA  M1           SAVE NEW M1 VALUE
00057P 000A 20 02 000E        BRA   ADJM1        ENTER ADJUSTMENT LOOP
00058P 000C 80 0A    A ADJLP  SUBA  #10
00059P 000E 81 0A    A ADJM1  CMPA  #10
00060P 0010 22 FA 000C        BHI   ADJLP        LOOP UNTIL ACCA <= 10
00061P 0012 36                PSHA               SAVE FOR LED SET
00062P 0013 C6 07    A        LDAB  #7
00063P 0015 8D 09 0020        BSR   CLITE2       CLEAR MODE LEDS
00064P 0017 33                PULB               GET MODE LED PATTERN

00066                    *
00067                    * CLITE1,..., SLITE2 - CLEAR AND SET LITE ROUTINES -
00068                    *   1 MEANS LR1, 2 MEANS LR2.
00069                    *
00070P 0018 DA 00    A SLITE2 ORAB  LITE2        SET LITES IN LR2 STATUS
00071P 001A D7 00    A L2LINK STAB  LITE2        SAVE NEW PATTERN
00072P 001C F7 0000  A        STAB  LR2          CHANGE LITES
00073P 001F 39                RTS                EXIT SLITE2, CLITE2, SETM1
00074                    *
00075P 0020 53         CLITE2 COMB               INVERT BITS
00076P 0021 D4 00    A        ANDB  LITE2        CLEAR LITES
00077P 0023 20 F5 001A        BRA   L2LINK       SAVE STATUS AND CH LITES
00078                    *
00079                    *
00080P 0025 DA 00    A SLITE1 ORAB  LITE1        SET LITES IN LR1 STAT
00081P 0027 D7 00    A L1LINK STAB  LITE1        SAVE NEW PATTERN
00082P 0029 53                COMB               INVERT BITS
00083P 002A F7 0000  A        STAB  LR1          CHANGE LITES
00084P 002D 53                COMB               RESTORE POLARITY
00085P 002E 39                RTS                EXIT SLITE1, CLITE1
00086                    *
00087P 002F 53         CLITE1 COMB               INVERT BITS
00088P 0030 D4 00    A        ANDB  LITE1        CLEAR LITES' STATUS
00089P 0032 20 F3 0027        BRA   L1LINK       CHANGE LITES & EXIT

00091                    *
00092                    * SET, CLEAR, AND CHANGE FLAGS ROUTINES - THE
00093                    *   BITS SET IN ACCA ARE SET, CLEARED, OR
00094                    *   INVERTED IN THE SPECIFIED FLAGS REGISTER.
00095                    *   ACCA IS UNCHANGED, ACCB EXITS WITH THE
00096                    *   RESULT OF THE OPERATION.
00097                    *
00098P 0034 16         SFLG1  TAB                SAVE SET BITS
00099P 0035 DA 00    A        ORAB  FR1          SET BITS FOR FR1
00100P 0037 D7 00    A F1LINK STAB  FR1          RESAVE FR1
00101P 0039 39                RTS                EXIT SFLG1, CFLG1
00102                    *
00103P 003A 16         CFLG1  TAB                SAVE CLEARED BITS
00104P 003B 53                COMB               INVERT FOR BIT MASK
00105P 003C D4 00    A        ANDB  FR1          CLEAR BITS IN FR1
00106P 003E 20 F7 0037        BRA   F1LINK       SAVE FR1 AND EXIT
00107                    *
00108P 0040 16         CHFLG1 TAB                SAVE INVERTED BITS
00109P 0041 D8 00    A        EORB  FR1          INVERT BITS IN FR1
00110P 0043 20 F2 0037        BRA   F1LINK       RESAVE FR1 AND EXIT
00111                    *
```

```
00112P 0045 16              SFLG2  TAB              SAVE SET BITS
00113P 0046 DA 00      A           ORAB   FR2       SET BITS FOR FR2
00114P 0048 D7 00      A  F2LINK   STAB   FR2       RESAVE FR2
00115P 004A 39                     RTS              EXIT SFLG2, CFLG2
00116                       *
00117P 004B 16              CFLG2  TAB              SAVE CLEARED BITS
00118P 004C 53                     COMB             INVERT FOR BIT MASK
00119P 004D D4 00      A           ANDB   FR2       CLEAR BITS IN FR2
00120P 004F 20 F7 0048             BRA    F2LINK    RESAVE FR2 AND EXIT
00121                       *
00122P 0051 16              CHFLG2 TAB              SAVE INVERTED BITS
00123P 0052 D8 00      A           EORB   FR2       INVERT BITS IN FR2
00124P 0054 20 F2 0048             BRA    F2LINK    RESAVE FR2 AND EXIT
00125                       *
00126P 0056 16              SFLG3  TAB              SAVE SET BITS
00127P 0057 DA 00      A           ORAB   FR3       SET BITS FOR FR3
00128P 0059 D7 00      A  F3LINK   STAB   FR3       RESAVE FR3
00129P 005B 39                     RTS              EXIT SFLG3, CFLG3
00130                       *
00131P 005C 16              CFLG3  TAB              SAVE CLEARED BITS
00132P 005D 53                     COMB             INVERT FOR BIT MASK
00133P 005E D4 00      A           ANDB   FR3       CLEAR BITS IN FR3
00134P 0060 20 F7 0059             BRA    F3LINK    RESAVE FR3 AND EXIT
00135                       *
00136P 0062 16              SFLG4  TAB              SAVE SET BITS
00137P 0063 DA 00      A           ORAB   FR4       SET FITS FOR FR4
00138P 0065 D7 00      A  F4LINK   STAB   FR4       RESAVE FR4
00139P 0067 39                     RTS              EXIT SFLG4, CFLG4
00140                       *
00141P 0068 16              CFLG4  TAB              SAVE CLEARED BITS
00142P 0069 53                     COMB             INVERT FOR BIT MASK
00143P 006A D4 00      A           ANDB   FR4       CLEAR BITS IN FR4
00144P 006C 20 F7 0065             BRA    F4LINK    RESAVE FR4 AND EXIT

00146                       *
00147                       * READSR - READ SWITCH REGISTERS - Z SET ON RETURN
00148                       *    INDICATES NO VALID DATA.  Z CLEAR INDICATES
00149                       *    ENCODED SWITCH DATA IN A.  UPPER 4 BITS ARE
00150                       *    (1,2,3,4) THE SR NUMBER.  LOWER 4 (1, ..., 8)
00151                       *    INDICATE THE BIT WHICH IS SET IN THE SR
00152                       *
00153P 006E C6 01      A  READSR   LDAB   #1        SR1 FIRST
00154P 0070 D7 00      A           STAB   TEMP      SAVE SR NUMBER
00155P 0072 B6 0000    A           LDAA   SR1       GET SR1 DATA
00156P 0075 43                     COMA             INVERT IT
00157P 0076 16                     TAB              SAVE IT
00158P 0077 26 30 00A9             BNE    CHKSR2    CHECK FOR ERRORS IF DATA
00159                       *
00160P 0079 7C 0000    A           INC    TEMP      SR2 IF NO SR1 DATA
00161P 007C B6 0000    A           LDAA   SR2       GET SR2 DATA
00162P 007F 43                     COMA             INVERT IT
00163P 0080 16                     TAB              SAVE IT
00164P 0081 26 2C 00AF             BNE    CHKSR3    CHECK FOR ERRORS IF DATA
00165                       *
00166P 0083 7C 0000    A           INC    TEMP      SR3 IF NO SR2 DATA
00167P 0086 B6 0000    A           LDAA   SR3       GET SR3 DATA
00168P 0089 43                     COMA             INVERT
00169P 008A 16                     TAB              SAVE IT
00170P 008B 26 28 00B5             BNE    CHKSR4    CHECK FOR ERRORS IF DATA
00171                       *
00172P 008D 7C 0000    A           INC    TEMP      SR4 IF NO SR3 DATA
00173P 0090 B6 0000    A           LDAA   SR4       GETSR4 DATA
00174P 0093 43                     COMA             INVERT IT
00175P 0094 16                     TAB              SAVE IT
00176P 0095 27 24 00BB             BEQ    SRERR     EXIT IF NO SR DATA AT ALL
00177                       *
00178P 0097 17              CHKERR TBA              NEED DATA IN BOTH ACCS
00179P 0098 44              CHKER2 LSRA             ROTATE UNTIL 1ST DATA
00180P 0099 24 FD 0098             BCC    CHKER2    ... BIT IS IN CARRY
00181P 009B 26 1E 00BB             BNE    SRERR     ERROR IF ANOTHER BIT IS SET

00183                       *
00184                       * ENCODE DATA AND EXIT
```

```
00185                       *
00186P 009D 4C              SRLOOP  INCA              NEXT BIT NUMBER
00187P 009E 54                      LSRB              THIS BIT?
00188P 009F 24 FC 009D              BCC     SRLOOP    LOOP IF NOT
00189                       *
00190P 00A1 D6 00    A              LDAB    TEMP      GET SR NUMBER
00191P 00A3 58                      ASLB              ALIGN
00192P 00A4 58                      ASLB              ... FOR
00193P 00A5 58                      ASLB              ... ENCODE
00194P 00A6 58                      ASLB              ... ADDITION
00195P 00A7 1B                      ABA               MERGE CODES
00196P 00A8 39                      RTS               EXIT READSR WITH DATA
00197                       *
00198                       * CHKSR ROUTINES - MAKES SURE NO OTHER SR
00199                       *   SHOWS ACTIVE BITS.  EXITS WITH "NO VALID DATA"
00200                       *   FLAG IF OTHER SR'S DO CONTAIN ACTIVE BITS.
00201                       *
00202P 00A9 B6 0000  A CHKSR2 LDAA   SR2               GET SR2 DATA
00203P 00AC 43                      COMA              ANY BITS SET?
00204P 00AD 26 0C 00BB              BNE     SRERR     ERROR IF SO
00205P 00AF B6 0000  A CHKSR3 LDAA   SR3               GET SR3 DATA
00206P 00B2 43                      COMA              ANY BITS SET?
00207P 00B3 26 06 00BB              BNE     SRERR     ERROR IF SO
00208P 00B5 B6 0000  A CHKSR4 LDAA   SR4               GET SR4 DATA
00209P 00B8 43                      COMA              ANY BITS SET?
00210P 00B9 27 DC 0097              BEQ     CHKERR    CHECK MULTI-BIT ERR IF NOT
00211                       *
00212P 00BB 4F              SRERR   CLRA              SET "NO VALID DATA" FLAG
00213P 00BC 39                      RTS               EXIT READSR

00215                       *
00216                       * GET10 - ENTERS 10 ONTO PSTK
00217                       *
00218P 00BD 86 01    A GET10        LDAA    #1        EXPONENT FOR POWER OF 10
00219P 00BF 7E 0124  P              JMP     EEXP10    ENTER 10**1 AND EXIT
00220                       *
00221                       * XDIV10 -  X <- X/10 ON PSTK
00222                       *
00223P 00C2 8D F9 00BD XDIV10 BSR   GET10             10, X ON PSTK
00224P 00C4 7E 0335  P              JMP     FLPDIV    X <- X/10 AND EXIT

00226                       *
00227                       * R10 - ROUND (BASE 10) - ADDS .5 TO X
00228                       *
00229P 00C7 4F              R10     CLRA              EXPONENT (.5)
00230P 00C8 CE 0FA0  A              LDX     #4000     FRACTION (.5)
00231P 00CB BD 04BD  P              JSR     ENTIMM    ENTER NUMBER
00232P 00CE 7E 033C  P              JMP     FLPADD    BASE 10 ROUND UP
00233                       *
00234                       * DELAY - DELAYS APPROXIMATELY (70X + 24)
00235                       *   MICROSECONDS, WHERE X IS THE CONTENTS OF
00236                       *   THE INDEX REGISTER.  BASED ON AN AVERAGE
00237                       *   SYSTEM CLOCK OF 1 MEGAHERTZ.
00238                       *
00239P 00D1 DF 00    A DELAY        STX     TEMP      SAVE MAJOR LOOP COUNTER
00240P 00D3 CE 0005  A              LDX     #5        GET MINOR LOOP COUNTER
00241                       *
00242P 00D6 09              MINORL  DEX               COUNT IN MINOR LOOP
00243P 00D7 01                      NOP
00244P 00D8 26 FC 00D6              BNE     MINORL    LOOP TILL INDEX = 0
00245                       *
00246P 00DA DE 00    A              LDX     TEMP      GET MAJOR LOOP COUNTER
00247P 00DC 09                      DEX               COUNT IN MAJOR LOOP
00248P 00DD 26 F2 00D1              BNE     DELAY     LOOP TILL INDEX = 0

00250P 00DF 08                      INX
00251P 00E0 09                      DEX
00252P 00E1 01                      NOP
00253P 00E2 39                      RTS               EXIT DELAY

00255                       *
00256                       * ETABLE - EXPONENT TABLE - POWERS OF 10 IN PSTK
00257                       *   REPRESENTATION FROM 10**-10 TO 10**10.
```

```
00258                   *
00259P 00E3  6DF3   A ETABLE FDB   $6DF3       10**-10
00260P 00E5  DE     A        FCB   $DE
00261P 00E6  44B8   A        FDB   $44B8       10**-9
00262P 00E8  E3     A        FCB   $E3
00263P 00E9  55E6   A        FDB   $55E6       10**-8
00264P 00EB  E6     A        FCB   $E6
00265P 00EC  6B60   A        FDB   $6B60       10**-7
00266P 00EE  E9     A        FCB   $E9
00267P 00EF  431C   A        FDB   $431C       10**-6
00268P 00F1  ED     A        FCB   $ED
00269P 00F2  53E3   A        FDB   $53E3       10**-5
00270P 00F4  F0     A        FCB   $F0
00271P 00F5  68DC   A        FDB   $68DC       10**-4
00272P 00F7  F3     A        FCB   $F3
00273P 00F8  4189   A        FDB   $4189       10**-3
00274P 00FA  F7     A        FCB   $F7
00275P 00FB  51EC   A        FDB   $51EC       10**-2
00276P 00FD  FA     A        FCB   $FA
00277P 00FE  6666   A        FDB   $6666       10**-1
00278P 0100  FD     A        FCB   $FD
00279P 0101  4000   A        FDB   $4000       1        (EXACT)
00280P 0103  01     A        FCB   $1
00281P 0104  5000   A        FDB   $5000       10       (EXACT)
00282P 0106  04     A        FCB   $4
00283P 0107  6400   A        FDB   $6400       10**2    (EXACT)
00284P 0109  07     A        FCB   $7
00285P 010A  7D00   A        FDB   $7D00       10**3    (EXACT)
00286P 010C  0A     A        FCB   $A
00287P 010D  4E20   A        FDB   $4E20       10**4    (EXACT)
00288P 010F  0E     A        FCB   $E
00289P 0110  61A8   A        FDB   $61A8       10**5    (EXACT)
00290P 0112  11     A        FCB   $11
00291P 0113  7A12   A        FDB   $7A12       10**6    (EXACT)
00292P 0115  14     A        FCB   $14
00293P 0116  4C4B   A        FDB   $4C4B       10**7
00294P 0118  18     A        FCB   $18
00295P 0119  5F5E   A        FDB   $5F5E       10**8
00296P 011B  1B     A        FCB   $1B
00297P 011C  7736   A        FDB   $7736       10**9
00298P 011E  1E     A        FCB   $1E
00299P 011F  4A81   A        FDB   $4A81       10**10
00300P 0121  22     A        FCB   $22
00301P 0122  00E3   P ETBLHI FDB   ETABLE
00302        0123   P ETBLLO EQU   *-1

00304                   *
00305                   * EEXP10 - ENTER EXPONENT OF 10 - ENTERS POWER OF 10
00306                   * INDICATED BY THE A REGISTER.  ALLOWED RANGE OF
00307                   * A IS + OR - 10.
00308                   *
00309P 0124 8B 0A   A EEXP10 ADDA  #10         OFFSET TO POSITIVE REPRESENTATION
00310P 0126 2B 21 0149      BMI    E10ERR      ERROR IF UNDERFLOW
00311P 0128 81 15   A        CMPA  #21         OVERFLOW?
00312P 012A 24 1D 0149      BCC    E10ERR      ERROR IF SO
00313                   *
00314P 012C 16               TAB
00315P 012D 48               ASLA
00316P 012E 1B               ABA               A = 3*A
00317                   *
00318P 012F BB 0123  P       ADDA  ETBLLO      CALC LSB OF TABLE ADDR
00319P 0132 97 01    A       STAA  TEMP+1      SAVE LSB
00320P 0134 B6 0122  P       LDAA  ETBLHI      GET MSB
00321P 0137 89 00    A       ADCA  #0          PROPAGATE CARRY
00322P 0139 97 00    A       STAA  TEMP        SAVE MSB
00323P 013B DF 00    A       STX   TEMP2       SAVE INDEX
00324P 013D DE 00    A       LDX   TEMP        POINT TO POWER OF 10
00325P 013F A6 02    A       LDAA  2,X         GET EXPONENT
00326P 0141 EE 00    A       LDX   X           GET FRACTION
00327P 0143 BD 04BD  P       JSR   ENTIMM      ENTER PWR ONTO PSTK
00328P 0146 DE 00    A       LDX   TEMP2       RESTORE INDEX
00329P 0148 39               RTS               EXIT EEXP10
```

```
00330                     *
00331P 0149 0B            E10ERR  SEV                   SET ERROR FLAG
00332P 014A 39                    RTS                   EXIT EEXP10

00334                     *
00335                     * DOMOVE - LOOKS UP BLOCK MOVE PARAMETERS IN
00336                     *   MPTBL AS SPECIFIED BY ACCA.  THEN IT JOINS
00337                     *   MOVBLK TO EXECUTE THE MOVE.
00338                     *
00339P 014B CE FFFA  A    DOMOVE  LDX     #MPTBL-6      POINT TO PARAMETER TABLE
00340P 014E C6 06    A    DMVLP1  LDAB    #6            DISTANCE TO NEXT ENTRY
00341P 0150 08            DMVLP2  INX                   NEXT BYTE TOWARDS ENTRY
00342P 0151 5A                    DECB                  THIS ENTRY?
00343P 0152 26 FC 0150            BNE     DMVLP2        LOOP TILL YES
00344P 0154 4A                    DECA                  THIS THE RIGHT ENTRY?
00345P 0155 26 F7 014E            BNE     DMVLP1        LOOP TILL YES
00346P 0157 DF 00    A            STX     TEMP3         SAVE TABLE POINTER
00347P 0159 EE 04    A            LDX     4,X           DESTINATION POINTER
00348P 015B DF 00    A            STX     TEMP
00349P 015D DE 00    A            LDX     TEMP3         TABLE POINTER
00350P 015F EE 02    A            LDX     2,X           TERMINATOR
00351P 0161 DF 00    A            STX     TEMP2
00352P 0163 DE 00    A            LDX     TEMP3         TABLE POINTER
00353P 0165 EE 00    A            LDX     X             INITIATOR
00354                     *
00355                     * MOVBLK - MOVE BLOCK - ENTERS WITH INDEX POINTING
00356                     *   TO FIRST CHARACTER TO BE MOVED, TEMP POINTING
00357                     *   TO FIRST DESTINATION LOCATION, AND TEMP2
00358                     *   THE LOCATION OF THE LAST CHARACTER TO BE
00359                     *   MOVED PLUS ONE, THE TERMINATOR.  EXECUTES
00360                     *   BLOCK MOVE.
00361                     *
00362P 0167 A6 00    A    MOVBLK  LDAA    X             GET CHARACTER FOR MOVE
00363P 0169 DF 00    A            STX     TEMP3         SAVE CHARACTER POINTER
00364P 016B DE 00    A            LDX     TEMP          POINT TO DESTINATION
00365P 016D A7 00    A            STAA    X             MOVE CHARACTER
00366P 016F 08                    INX                   NEXT DESTINATION LOCATION
00367P 0170 DF 00    A            STX     TEMP          SAVE DESTINATION POINTER
00368P 0172 DE 00    A            LDX     TEMP3         GET CHARACTER POINTER
00369P 0174 08                    INX                   NEXT CHARACTER
00370P 0175 9C 00    A            CPX     TEMP2         DONE?
00371P 0177 26 EE 0167            BNE     MOVBLK        LOOP TILL YES
00372P 0179 39                    RTS                   EXIT MOVBLK

00374                     *
00375                     * SUB16, COMP16 - BOTH SET 2'S COMPLEMENT FLAGS
00376                     *   ACCORDING TO THE OPERATION: A,B - (X),(X+1).
00377                     *   SUB16 ALSO REPLACES A,B WITH THE RESULT.
00378                     *
00379P 017A E0 01    A    SUB16   SUBB    1,X
00380P 017C A2 00    A            SBCA    X             A,B _ A,B - (X),(X+1)
00381P 017E 36                    PSHA
00382P 017F 07                    TPA
00383P 0180 5D                    TSTB
00384P 0181 27 02 0185            BEQ     S16L          IF B <> 0
00385P 0183 84 FB    A            ANDA    #$FB          ... THEN Z BIT _ 0
00386P 0185 06            S16L    TAP
00387P 0186 32                    PULA
00388P 0187 39                    RTS                   EXIT SUB16
00389                     *
00390P 0188 36            COMP16  PSHA                  SAVE
00391P 0189 37                    PSHB                  ... A,B
00392P 018A 8D EE 017A            BSR     SUB16         A,B - (X),(X+1)
00393P 018C 33                    PULB                  RESTORE
00394P 018D 32                    PULA                  ... A,B
00395P 018E 39                    RTS                   EXIT COMP16

00397                     *
00398                     * OFFX - OFFSET INDEX - ADDS A TO INDEX AND
00399                     *   REPLACES INDEX WITH RESULT.
00400                     *
00401P 018F 36            OFFX    PSHA                  SAVE A
```

```
00402P 0190 DF 00      A          STX    TEMP3       SAVE INDEX
00403P 0192 9B 01      A          ADDA   TEMP3+1     CALCULATE LSB
00404P 0194 97 01      A          STAA   TEMP3+1     SAVE LSB
00405P 0196 24 03 019B            BCC    OFFX1       BRANCH IF NO CARRY
00406P 0198 7C 0000    A          INC    TEMP3       PROPAGATE CARRY
00407P 019B DE 00      A OFFX1    LDX    TEMP3       GET NEW INDEX
00408P 019D 32                    PULA               RESTORE A
00409P 019E 39                    RTS                EXIT OFFX
00410                          *
00411                          * NLV - NEXT LOWER VALUE OF A PV2 VARIABLE
00412                          *     WHICH GOES IN 1, 2, 5 STEPS.
00413                          *
00414P 019F A6 00      A NLV      LDAA   X           GET COEFFICIENT
00415P 01A1 81 01      A          CMPA   #1          IS IT 1?
00416P 01A3 26 06 01AB            BNE    NLV1        BRANCH IF NOT
00417P 01A5 6A 01      A          DEC    1,X         DECREMENT EXPONENT
00418P 01A7 86 05      A          LDAA   #5          NEW COEFFICIENT
00419P 01A9 20 09 01B4            BRA    NLHVXT      EXIT NLV
00420                          *
00421P 01AB 81 02      A NLV1     CMPA   #2          IS IT 2?
00422P 01AD 26 03 01B2            BNE    NLV2        BRANCH IF NOT
00423P 01AF 4A                    DECA               NEW COEFFICIENT
00424P 01B0 20 02 01B4            BRA    NLHVXT      EXIT NLV
00425                          *
00426P 01B2 86 02      A NLV2     LDAA   #2          NEW COEFFICIENT
00427                          *
00428P 01B4 A7 00      A NLHVXT   STAA   X           SAVE NEW COEFFICIENT
00429P 01B6 39                    RTS                EXIT NLV, NHV
00430                          *
00431                          * NHV - NEXT HIGHER VALUE OF A PV2 VARIABLE
00432                          *     WHICH GOES IN 1, 2, 5 STEPS
00433                          *
00434P 01B7 A6 00      A NHV      LDAA   X           GET COEFFICIENT
00435P 01B9 81 05      A          CMPA   #5          IS IT 5?
00436P 01BB 26 06 01C3            BNE    NHV1        BRANCH IF NOT
00437P 01BD 6C 01      A          INC    1,X         INCREMENT EXPONENT
00438P 01BF 86 01      A          LDAA   #1          NEW COEFFICIENT
00439P 01C1 20 F1 01B4            BRA    NLHVXT      EXIT NHV
00440                          *
00441P 01C3 81 02      A NHV1     CMPA   #2          IS COEFFICIENT 2?
00442P 01C5 26 04 01CB            BNE    NHV2        BRANCH IF NOT
00443P 01C7 86 05      A          LDAA   #5          NEW COEFFICIENT
00444P 01C9 20 E9 01B4            BRA    NLHVXT      EXIT NHV
00445                          *
00446P 01CB 86 02      A NHV2     LDAA   #2          NEW COEFFICIENT
00447                          *
00448P 01CD 20 E5 01B4            BRA    NLHVXT      EXIT NHV

00450                          *
00451                          * FEWUNP - FRONT END WORD UNPACK -
00452                          *
00453                          *    A _ BITS 11-6 OF A,B
00454                          *    B _ BITS 5-0 OF A,B
00455                          *
00456P 01CF 58                    FEWUNP ASLB                  6-0
00457P 01D0 49                    ROLA                         14-7
00458P 01D1 58                    ASLB                         5-0
00459P 01D2 49                    ROLA                         13-6
00460P 01D3 84 3F      A          ANDA   #$3F                  11-6
00461P 01D5 54                    LSRB                         NORMALIZE
00462P 01D6 54                    LSRB                         ... RIGHT
00463P 01D7 39                    RTS                          EXIT
00464                          *
00465                          * SABL3X - SHIFT A,B LEFT 3 TIMES
00466                          *
00467P 01D8 58         SABL3X     ASLB
00468P 01D9 49                    ROLA
00469P 01DA 58                    ASLB
00470P 01DB 49                    ROLA
00471P 01DC 58                    ASLB
00472P 01DD 49                    ROLA
00473P 01DE 39                    RTS                EXIT SABL3X
```

```
00475                    ****************************************
00476                    *                                      *
00477                    * END OF DTOU1                         *
00478                    *                                      *
00479                    ****************************************

00481                    *
00482                    * PNTATT - POINT TO ATTRIBUTES - INDEX _ POINTER
00483                    *     TO XDAC(ACCA).  NO OTHER REGISTERS CHANGED.
00484                    *
00485                    * NOTE: AN UNDEFINED TRACE NUMBER IN ACCA CAUSES
00486                    *     THE INDEX TO BE REPLACED WITH $E000, HOPEFULLY
00487                    *     A HARMLESS ADDRESS.
00488                    *
00489                    *
00490P 01DF 81 0A      A PNTATT CMPA   #10
00491P 01E1 27 1E 0201        BEQ     PATERR
00492P 01E3 81 0C      A      CMPA    #12
00493P 01E5 24 1A 0201        BCC     PATERR     ERROR IF UNDEF TRACE NUMBER
00494                    *
00495P 01E7 36                PSHA
00496P 01E8 37                PSHB               SAVE A AND B
00497P 01E9 81 08      A      CMPA    #8
00498P 01EB 25 06 01F3        BCS     DOPNT      A UNCHANGED IF A < 8
00499P 01ED 26 03 01F2        BNE     PNTAT1
00500P 01EF 4C                INCA               A _ A+1 IF A = 8
00501P 01F0 20 01 01F3        BRA     DOPNT
00502P 01F2 4A         PNTAT1 DECA               A _ A-1 IF A > 8
00503                    *
00504P 01F3 4A         DOPNT  DECA
00505P 01F4 16                TAB
00506P 01F5 48                ASLA
00507P 01F6 48                ASLA
00508P 01F7 1B                ABA                A _ (A-1)*5
00509P 01F8 CE 0000    A      LDX     #BATDA
00510P 01FB BD 018F    P      JSR     OFFX       INDEX _ #XDAC1+A
00511P 01FE 33                PULB
00512P 01FF 32                PULA               RESTORE A AND B
00513P 0200 39                RTS                EXIT PNTATT
00514                    *
00515P 0201 CE E000    A PATERR LDX   #$E000     POINT TO UNOCCUPIED AREA
00516P 0204 39                RTS                EXIT PNTATT 00518P 0205      00    A CRCUA  FCB    0         CRC SPACE

00520                    ****************************************
00521                    *                                      *
00522                    * END OF DTOU2                         *
00523                    *                                      *
00524                    ****************************************

00526                    ********************************************************
00527                    *
00528                    * MATHPAK ROUTINES - FIXED AND FLOATING POINT
00529                    *     ADD, SUBTRACT, MULTIPLY, AND DIVIDE, AS
00530                    *     WELL AS COMPARE AND OTHER USEFUL FUNCTIONS.
00531                    *
00532                    ********************************************************

00534                    *
00535                    * MULT16 - 16 BIT MULTIPLY - A, B, SCRTCH, SCRTCH+1 _
00536                    *     A, B * (X),(X+1).  TWOS COMPLEMENT NOTATION.
00537                    *     LOOP VARIABLES ARE:
00538                    *        INDEX - LOOP COUNTER
00539                    *        A, B, SCRTCH, SCRTCH+1 - PRODUCT
00540                    *        SCRTCH+2, SCRTCH+3 - MULTIPLIER (FROM A, B)
00541                    *        SCRTCH+4, SCRTCH+5 - MULTIPLICAND
00542                    *
00543P 0206 8D 33 023B MULT16 BSR     FIXNEG     SET SIGN OF RESULT
00544P 0208 8D 4E 0258        BSR     ABSAB      MAKE A, B POSITIVE
00545P 020A 97 02      A      STAA    SCRTCH+2   SAVE
```

```
00546P 020C D7 03      A         STAB     SCRTCH+3  ... MULTIPLIER
00547P 020E A6 00      A         LDAA     X         GET
00548P 0210 E6 01      A         LDAB     1,X       ... MULTIPLICAND
00549P 0212 8D 44 0258           BSR      ABSAB     MAKE IT POSITIVE
00550P 0214 97 04      A         STAA     SCRTCH+4  SAVE
00551P 0216 D7 05      A         STAB     SCRTCH+5  ... MULTIPLICAND
00552P 0218 4F                   CLRA               INITIALIZE
00553P 0219 5F                   CLRB               ... PROCUCT
00554P 021A CE 0010    A         LDX      #16       INITIALIZE LOOP COUNTER
00555                      *
00556                      * COMPUTATION LOOP
00557                      *
00558P 021D 74 0002    A M16LP   LSR      SCRTCH+2  IS MULTIPLIER
00559P 0220 76 0003    A         ROR      SCRTCH+3  ... LSB SET?
00560P 0223 24 04 0229           BCC      MSHIFT    SKIP ADD IF NOT
00561P 0225 DB 05      A         ADDB     SCRTCH+5  ADD MULTIPLICAND
00562P 0227 99 04      A         ADCA     SCRTCH+4  ... TO PRODUCT
00563P 0229 44                 MSHIFT LSRA          SHIFT
00564P 022A 56                   RORB
00565P 022B 76 0000    A         ROR      SCRTCH
00566P 022E 76 0001    A         ROR      SCRTCH+1  ... PROCUCT
00567P 0231 09                   DEX                DONE?
00568P 0232 26 E9 021D           BNE      M16LP     LOOP IF NOT
00569                      *
00570                      * SET SIGN AND EXIT
00571                      *
00572P 0234 8D 1B 0251           BSR      TSTNEG    NEGATIVE RESULT?
00573P 0236 27 02 023A           BEQ      M16XIT    EXIT IF NOT
00574P 0238 8D 2B 0265           BSR      NEGAEX    NEGATE PRODUCT
00575P 023A 39                 M16XIT RTS           EXIT MULT16

00577                      *
00578                      * NEGRES FLAG MANIPULATION ROUTINES
00579                      *
00580P 023B 8D 0D 024A FIXNEG  BSR      CLRNEG    CLEAR NEG RESULT FLAG
00581P 023D 36                   PSHA
00582P 023E A8 00      A         EORA     X         GET SIGN OF RESULT
00583P 0240 32                   PULA
00584P 0241 2A 06 0249           BPL      FXNXIT    EXIT IF POSITIVE
00585                      *
00586P 0243 36                 SETNEG PSHA
00587P 0244 86 00      A         LDAA     #NEGRES   POINT TO NEGRES FLAG
00588P 0246 8D 40 0288           BSR      SF1       SET IT
00589P 0248 32                   PULA
00590P 0249 39                 FXNXIT RTS           EXIT SETNEG, FIXNEG
00591                      *
00592P 024A 36                 CLRNEG PSHA          SAVE A
00593P 024B 86 00      A         LDAA     #NEGRES   POINT TO NEGRES
00594P 024D 8D 3F 028E           BSR      CF1       CLEAR IT
00595P 024F 32                   PULA               RESTORE A
00596P 0250 39                   RTS                EXIT CLRNEG
00597                      *
00598P 0251 36                 TSTNEG PSHA
00599P 0252 96 00      A         LDAA     FR1
00600P 0254 85 00      A         BITA     #NEGRES
00601P 0256 32                   PULA
00602P 0257 39                 DNAXIT RTS           EXIT TEST NEGATIVE RESULT
00603                      *
00604                      * ABSOULUTE VALUE AND NEGATION ROUTINES
00605                      *
00606P 0258 4D                 ABSAB  TSTA          A, B NEGATIVE?
00607P 0259 2A 06 0261           BPL      AABXIT    EXIT IF NOT
00608P 025B 43                 NEGAB  COMA
00609P 025C 53                   COMB
00610P 025D CB 01      A         ADDB     #1
00611P 025F 89 00      A         ADCA     #0        A, B IS NEGATED
00612P 0261 39                 AABXIT RTS           EXIT ABSAB, NEGAB
00613                      *
00614P 0262 4D                 ABSAEX TSTA          IS A, B (EXTENDED) NEGATIVE?
00615P 0263 2A 0F 0274           BPL      AEXIT     EXIT IF NOT
00616P 0265 43                 NEGAEX COMA          PREPARE TO
00617P 0266 53                   COMB              ... NEGATE
```

```
00618P 0267 DF 08     A           STX    SCRTCH+8   SAVE INDEX
00619P 0269 CE 0000   A           LDX    #SCRTCH    POINT TO LSB'S
00620P 026C 8D 0B 0279            BSR    NEGX       NEGATE THEM
00621P 026E DE 08     A           LDX    SCRTCH+8   RESTORE INDEX
00622P 0270 C9 00     A           ADCB   #0         PROPAGE
00623P 0272 89 00     A           ADCA   #0         ... CARRY
00624P 0274 39              AEXIT RTS               EXIT ABSEX, NEGEX
00625                             *
00626P 0275 6D 00     A  ABSX     TST    X
00627P 0277 2A 0E 0287            BPL    AXEXIT     EXIT IF (X) POSITIVE
00628P 0279 36              NEGX  PSHA
00629P 027A 37                    PSHB              SAVE A AND B
00630P 027B A6 00     A           LDAA   X
00631P 027D E6 01     A           LDAB   1,X        GET (X),(X+1)
00632P 027F 8D DA 025B            BSR    NEGAB      NEGATE (X),(X+1)
00633P 0281 E7 01     A           STAB   1,X
00634P 0283 A7 00     A           STAA   X          SAVE (X),(X+1)

00635P 0285 33              RESXIT PULB
00636P 0286 32                    PULA              RESTORE A,B
00637P 0287 39              AXEXIT RTS              EXIT
00638                             *
00639                             * LOCAL FLAG MANIPULATION ROUTINES
00640                             *
00641P 0288 37              SF1   PSHB              SAVE B
00642P 0289 BD 0034  P            JSR    SFLG1      SET FLAGS
00643P 028C 33                    PULB              RESTORE B
00644P 028D 39                    RTS               EXIT
00645                             *
00646P 028E 37              CF1   PSHB
00647P 028F BD 003A  P            JSR    CFLG1      CLEAR FLAGS
00648P 0292 33                    PULB              RESTORE B
00649P 0293 39                    RTS               EXIT

00651                             *
00652                             * DIV16 - 16 BIT DIVIDE:
00653                             *   A,B _ A,B,SCRTCH,SCRTCH+1 / (X),(X+1).
00654                             *   ABSOLUTE VALUE OF REMAINDER IS LEFT IN
00655                             *   SCRTCH,SCRTCH+1.
00656                             *   V SET ON RETURN INDICATES DIVISOR = 0 OR 16
00657                             *   BIT OVERFLOW IN THE QUOTIENT. LOOP VARIABLES
00658                             *   ARE:
00659                             *       INDEX - LOOP COUNTER
00660                             *       A,B,SCRTCH,SCRTCH+1 - DIVIDEND
00661                             *       SCRTCH+2,SCRTCH+3 - DIVISOR
00662                             *       SCRTCH+4,SCRTCH+5 - QUOTIENT
00663                             *
00664P 0294 8D A5 023B DIV16      BSR    FIXNEG     SET RESULT SIGN
00665P 0296 8D CA 0262            BSR    ABSAEX     MAKE DIVIDEND POSITIVE
00666P 0298 36                    PSHA
00667P 0299 37                    PSHB
00668P 029A A6 00     A           LDAA   X          GET DIVISOR MSB
00669P 029C 27 42 02E0            BEQ    TEST0      TEST FOR ERROR IF 0
00670P 029E E6 01     A           LDAB   1,X        GET DIVISOR LSB
00671P 02A0 8D B6 0258 DSROK      BSR    ABSAB      MAKE DIVISOR POSITIVE
00672P 02A2 97 02     A           STAA   SCRTCH+2   SAVE
00673P 02A4 D7 03     A           STAB   SCRTCH+3   ... DIVISOR
00674P 02A6 CE 0011   A           LDX    #17        INITIALIZE LOOP COUNTER
00675P 02A9 33                    PULB              RESTORE
00676P 02AA 32                    PULA              ... DIVIDEND
00677P 02AB 20 11 02BE            BRA    D16ST      ENTER DIVISION LOOP
00678                             *
00679                             * COMPUTATION LOOP
00680                             *
00681P 02AD D0 03     A  D16LP    SUBB   SCRTCH+3   SUBTRACT DIVISOR
00682P 02AF 92 02     A           SBCA   SCRTCH+2   ... FROM DIVIDEND
00683P 02B1 2A 05 02B8            BPL    DSHIFT     BRANCH IF NO "BORROW"
00684P 02B3 DB 03     A           ADDB   SCRTCH+3   OTHERWISE RESTORE
00685P 02B5 99 02     A           ADCA   SCRTCH+2   ... DIVIDEND
00686P 02B7 0D                    SEC               ... AND SET QBIT = "0"
00687P 02B8 79 0005  A  DSHIFT    ROL    SCRTCH+5   ADD QBIT
```

```
00688P 02BB 79 0004   A          ROL      SCRTCH+4   ... TO QUOTIENT
00689P 02BE 78 0001   A D16ST    ASL      SCRTCH+1   SHIFT
00690P 02C1 79 0000   A          ROL      SCRTCH
00691P 02C4 59                   ROLB
00692P 02C5 49                   ROLA                ... DIVIDEND
00693P 02C6 25 1E 02E6           BCS      D16ERR     EXIT IF 16 BIT OVERFLOW
00694P 02C8 09                   DEX                 LAST LOOP?
00695P 02C9 26 E2 02AD           BNE      D16LP      LOOP AGAIN IF NOT

00697                       *
00698                       * SET SIGN AND EXIT
00699                       *
00700P 02CB 44                   LSRA                CORRECT
00701P 02CC 56                   RORB                ... REMAINDER
00702P 02CD 97 00     A          STAA     SCRTCH     SAVE
00703P 02CF D7 01     A          STAB     SCRTCH+1   ... REMAINDER
00704P 02D1 96 04     A          LDAA     SCRTCH+4   GET
00705P 02D3 D6 05     A          LDAB     SCRTCH+5   ... QUOTIENT
00706P 02D5 43                   COMA                CORRECT IT
00707P 02D6 53                   COMB
00708P 02D7 BD 0251   P          JSR      TSTNEG     NEGATIVE RESULT?
00709P 02DA 27 03 02DF           BEQ      D16XIT     EXIT IF POSITIVE RESULT
00710P 02DC BD 025B   P          JSR      NEGAB      MAKE QUOTIENT NEGATIVE
00711P 02DF 39                   D16XIT RTS          EXIT DIV16
00712                       *
00713                       * TEST FOR 0 DIVISOR AND EXIT IF ERROR
00714                       *
00715P 02E0 E6 01     A TEST0    LDAB     1,X        GET DIVISOR LSB
00716P 02E2 26 BC 02A0           BNE      DSROK      REJOIN DIV16 IF NOT ZERO
00717P 02E4 31                   INS                 RESTORE
00718P 02E5 31                   INS                 ... STACK
00719P 02E6 0B                   D16ERR SEV          SET ERROR FLAG
00720P 02E7 39                   RTS                 EXIT DIV16

00722                       *
00723                       * FMLT24 - A,B;TEMP _ A,B;TEMP * (X),(X+1);(X+2).
00724                       *     V SET ON RETURN INDICATES EXPONENT OVERFLOW
00725                       *     OR UNDERFLOW.
00726                       *
00727P 02E8 36                   FMLT24 PSHA         SAVE MULTIPLICAND MSB
00728P 02E9 96 00     A          LDAA     TEMP       GET MULTIPLICAND EXP
00729P 02EB AB 02     A          ADDA     2,X        CALC PRODUCT EXPONENT
00730P 02ED 29 0C 02FB           BVS      FMLTER     ERR IF UNDFLO OR OVRFLO
00731P 02EF 4C                   INCA                (CONSEQUENCE
00732P 02F0 29 09 02FB           BVS      FMLTER     ... OF 2 SIGN BITS)
00733P 02F2 97 00     A          STAA     TEMP       SAVE PRODUCT EXPONENT
00734P 02F4 32                   PULA                RESTORE MPCAND MSB
00735P 02F5 BD 0206   P          JSR      MULT16     MULTIPLY FRACTIONS
00736P 02F8 7E 0364   P          JMP      NORM32     NORMALIZE, ROUND, EXIT
00737                       *
00738P 02FB 39                   FMLTER RTS          ERROR EXIT

00740                       *
00741                       * FDIV24 - A,B;TEMP _ A,B;TEMP / (X),(X+1);(X+2).
00742                       *     V SET ON RETURN INDICATES (X),(X+1) = 0
00743                       *     (ZERO DIVISOR), EXPONENT OVERFLOW,
00744                       *     OR EXPONENT UNDERFLOW.
00745                       *     INPUTS ASSUMED TO BE NORMALIZED.
00746                       *
00747P 02FC 7F 0000   A FDIV24   CLR      SCRTCH     INITIALIZE
00748P 02FF 7F 0001   A          CLR      SCRTCH+1   ... DIVIDEND
00749P 0302 36                   PSHA                SAVE DIVIDEND MSB
00750P 0303 96 00     A          LDAA     TEMP       GET DIVIDEND EXP
00751P 0305 A0 02     A          SUBA     2,X        CALC QUOTIENT EXP
00752P 0307 29 23 032C           BVS      FDIVER     ERR IF UNDFLO OR OVRFLO
00753P 0309 97 00     A          STAA     TEMP       SAVE QUOTIENT EXP
00754P 030B 32                   PULA                RESTORE DIVIDEND MSB
00755                       *
00756                       * THE FOLLOWING IS TO ENSURE 16 BITS OF ACCURACY
00757                       *     IN THE QUOTIENT
00758                       *
00759P 030C BD 05C5   P          JSR      ACMP16     COMPARE A,B WITH (X),(X+1)
```

```
00760P 030F 2D 0A 031B              BLT    FD241    OK IF A,B < (X),(X+1)
00761P 0311 47                      ASRA            SHIFT RIGHT
00762P 0312 56                      RORB
00763P 0313 76 0000  A              ROR    SCRTCH   ... DIVIDEND FRACTION
00764P 0316 7C 0000  A              INC    TEMP     COMPENSATE EXPONENT
00765P 0319 29 11 032C              BVS    FDIVER   ERROR IF OVERFLOW
00766                           *
00767P 031B 47           FD241      ASRA            SHIFT TO
00768P 031C 56                      RORB            ... ENSURE A
00769P 031D 76 0000  A              ROR    SCRTCH   ... NORMALIZED RESULT
00770                           *
00771P 0320 BD 0294  P              JSR    DIV16    DIVIDE FRACTIONS
00772P 0323 29 07 032C              BVS    FDIVER   EXIT IF ERROR
00773                           *
00774P 0325 4D                      TSTA            RESULT=0?
00775P 0326 26 03 032B              BNE    FD24XT   EXIT IF NOT
00776P 0328 7F 0000  A              CLR    TEMP     EXP _ 0 IF SO
00777                           *
00778P 032B 39           FD24XT     RTS             EXIT FDIV24
00779                           *
00780P 032C 0B           FDIVER     SEV             SET ERROR FLAG
00781P 032D 39                      RTS             EXIT
00782                           *
00783                           * NOTE THAT THE QUOTIENT FRACTION WILL EITHER
00784                           *   BE NORMALIZED OR EQUAL TO ZERO ON EXIT FROM
00785                           *   DIV16.
00786                           *

00788                           *
00789                           * FLPMLT - FLOATING POINT MULTIPLY - Y _ Y*X ON
00790                           *   PSTK AND DROP STACK.
00791                           *
00792P 032E 8D 23 0353   FLPMLT     BSR    GETXY
00793P 0330 BD 02E8  P              JSR    FMLT24   MULTIPLY
00794P 0333 20 13 0348              BRA    ENDFLP   SAVE RESULT AND EXIT
00795                           *
00796                           * FLPDIV - FLOATING POINT DIVISION - Y _ Y/X ON
00797                           *   PSTK AND DROP STACK.
00798                           *
00799P 0335 8D 1C 0353   FLPDIV     BSR    GETXY
00800P 0337 BD 02FC  P              JSR    FDIV24   DIVIDE
00801P 033A 20 0C 0348              BRA    ENDFLP   SAVE RESULT AND EXIT
00802                           *
00803                           * FLPADD - FLOATING POINT ADDITION - Y _ Y+X ON
00804                           *   PSTK AND DROP STACK.
00805                           *
00806P 033C 8D 15 0353   FLPADD     BSR    GETXY
00807P 033E BD 03B2  P              JSR    FADD24   ADD
00808P 0341 20 05 0348              BRA    ENDFLP   SAVE RESULT AND EXIT
00809                           *
00810                           * FLPSUB - FLOATING POINT SUBTRACTION - Y _ Y-X
00811                           *   ON PSTK AND DROP STACK.
00812                           *
00813P 0343 8D 0E 0353   FLPSUB     BSR    GETXY
00814P 0345 BD 03AF  P              JSR    FSUB24   SUBTRACT
00815                           *
00816                           * ENDFLP - Y _ A,B;TEMP AND DROP STACK.
00817                           *
00818P 0348 97 03     A   ENDFLP    STAA   PSTK+3
00819P 034A D7 04     A              STAB   PSTK+4
00820P 034C D6 00     A              LDAB   TEMP
00821P 034E D7 05     A              STAB   PSTK+5   Y _ A,B;TEMP
00822P 0350 7E 04A7  P              JMP    DROP     DROP STACK AND EXIT
00823                           *
00824                           * GETXY - INDEX _ #PSTK (POINTER TO X)
00825                           *   A,B;TEMP _ Y.
00826                           *
00827P 0353 CE 0000  A   GETXY      LDX    #PSTK
00828P 0356 96 05    A              LDAA   PSTK+5
00829P 0358 97 00    A              STAA   TEMP
00830P 035A 96 03    A              LDAA   PSTK+3
00831P 035C D6 04    A              LDAB   PSTK+4
00832P 035E 39                      RTS
```

```
00834                   *
00835                   * NORMALIZE AND ROUND ROUTINES - NORMALIZES
00836                   *   A (EXTENDED);TEMP AND ROUNDS TO 16 TWOS
00837                   *   COMPLEMENT BITS.  INPUT IN 2'S COMPLEMENT.
00838                   *
00839P 035F CE 0000  A NORM16 LDX    #0          CLEAR 16
00840P 0362 DF 00    A        STX    SCRTCH      ... LS BITS
00841P 0364 DE 00    A NORM32 LDX    SCRTCH
00842P 0366 26 0C 0374        BNE    NRM2
00843P 0368 4D          NRM1  TSTA
00844P 0369 2B 3D 03A8        BMI    NRMNEG      BRANCH IF AEX < 0
00845P 036B 26 07 0374        BNE    NRM2
00846P 036D 5D                TSTB
00847P 036E 26 04 0374        BNE    NRM2
00848P 0370 7F 0000  A NRMZRO CLR    TEMP        EXP _ 0 IF FRAC=0
00849P 0373 39          NRMXIT RTS                NO ERROR EXIT
00850                   *
00851P 0374 78 0001  A NRM2  ASL    SCRTCH+1 SCALE AEX
00852P 0377 79 0000  A       ROL    SCRTCH
00853P 037A 59               ROLB
00854P 037B 49               ROLA               ... LEFT
00855P 037C 29 06 0384       BVS    NRM3        CANCEL IF NORMALIZED
00856P 037E 7A 0000  A       DEC    TEMP        COMPENSATE EXPONENT
00857P 0381 28 F1 0374       BVC    NRM2        LOOP UNLESS UNDERFLOW
00858P 0383 39         NRMERR RTS               ERROR EXIT
00859                   *
00860P 0384 46          NRM3  RORA               RESTORE
00861P 0385 56               RORB
00862P 0386 76 0000  A       ROR    SCRTCH     ... AEX
00863P 0389 4D          ROUND TSTA              AEX < 0 ?
00864P 038A 2B 12 039E       BMI    RNDNEG     ROUND AS NEGATIVE IF SO
00865P 038C 7D 0000  A NRM4  TST    SCRTCH     NEED TO ROUND?
00866P 038F 2A E2 0373       BPL    NRMXIT     EXIT IF NOT
00867P 0391 CB 01    A       ADDB   #1         ROUND
00868P 0393 89 00    A       ADCA   #0         ... UP
00869P 0395 28 DC 0373       BVC    NRMXIT     EXIT IF NO OVERFLOW
00870P 0397 7C 0000  A       INC    TEMP       COMPENSATE EXPONENT
00871P 039A 28 E8 0384       BVC    NRM3       SCALE RIGHT AND ROUND AGAIN
00872P 039C 20 E5 0383       BRA    NRMERR     ERROR IF EXPONENT OVERFLOW
00873                   *
00874P 039E BD 0265  P RNDNEG JSR    NEGAEX     MAKE AEX POSITIVE
00875P 03A1 8D E9 038C       BSR    NRM4       ROUND AEX TO 16 BITS
00876P 03A3 29 DE 0383 NRNEGL BVS   NRMERR     ERROR IF V SET
00877P 03A5 7E 025B  P       JMP    NEGAB      MAKE A,B NEG AND EXIT
00878                   *
00879P 03A8 BD 0265  P NRMNEG JSR    NEGAEX     MAKE AEX POSITIVE
00880P 03AB 8D C7 0374       BSR    NRM2       NORMALIZE
00881P 03AD 20 F4 03A3       BRA    NRNEGL     RE-NEGATE AND EXIT

00883                   *
00884                   * FSUB24 AND FADD24 - FLOATING POINT SUBTRACTION
00885                   *   AND ADDITION ROUTINES.  A,B;TEMP _ A,B;TEMP -
00886                   *   (X),(X+1);(X+2) AND A,B;TEMP _ A,B;TEMP +
00887                   *   (X),(X+1);(X+2), RESPECTIVELY.  V SET ON
00888                   *   RETURN INDICATES EXPONENT OVERFLOW OR
00889                   *   UNDERFLOW.  INPUTS ASSUMED TO BE NORMALIZED.
00890                   *   EITHER MAY CHANGE (X),(X+1);(X+2).
00891                   *
00892P 03AF BD 0279  P FSUB24 JSR    NEGX       NEGATE FOR SUBTRACTION
00893P 03B2 7F 0000  A FADD24 CLR    SCRTCH     CLEAR FOR
00894P 03B5 7F 0001  A       CLR    SCRTCH+1 ... ROUNDING PURPOSES
00895P 03B8 97 00    A       STAA   TEMP2      SAVE MSB OF FRACTION
00896P 03BA A6 02    A       LDAA   2,X        GET EXPONENT
00897P 03BC 90 00    A       SUBA   TEMP       EXPONENTS EQUAL?
00898P 03BE 27 17 03D7       BEQ    DOADD      DO ADDITION IF SO
00899P 03C0 2A 04 03C6       BPL    FAS1       ALIGN IF ABS(ABT) < ABS(X)
00900P 03C2 8D 23 03E7       BSR    EXTX1      OTHERWISE EXCHANGE
00901P 03C4 20 EC 03B2       BRA    FADD24     ... AND START AGAIN
00902P 03C6 81 10    A FAS1  CMPA   #16        IS ABT INSIGNIFICANT?
00903P 03C8 2C 35 03FF       BGE    GETABT     RES = (X),(X+1);(X+2) IF SO
00904                   *
00905                   * ALIGNMENT LOOP
```

```
00906                   *
00907P 03CA 77 0000  A ALILP ASR    TEMP2       ALIGN A,B,TEMP   (ABT)
00908P 03CD 56                RORB
00909P 03CE 76 0000  A        ROR    SCRTCH      SAVE MSBIT FOR ROUNDING
00910P 03D1 7C 0000  A        INC    TEMP
00911P 03D4 4A                DECA
00912P 03D5 26 F3 03CA        BNE    ALILP      ... WITH (X),(X+1);(X+2)
00913                   *
00914P 03D7 96 00    A DOADD  LDAA   TEMP2       GET FRACTION MSB
00915P 03D9 EB 01    A DOADD2 ADDB   1,X         ADD LSB'S
00916P 03DB A9 00    A        ADCA   X           ADD MSB'S
00917P 03DD 28 80 035F        BVC    NORM16      NORMALIZE IF NO OVERFLOW
00918P 03DF 7C 0000  A        INC    TEMP        BUMP EXPONENT
00919P 03E2 28 A0 0384        BVC    NRM3        NORMALIZE IF NO OVERFLOW
00920P 03E4 39         FASERR RTS                FLP ADD OR SUBRACT ERROR

00922                   *
00923                   * EXCATX - EXCHANGE A,B,TEMP WITH (X),(X+1);(X+2).
00924                   *
00925P 03E5 97 00    A EXCATX STAA   TEMP2       SAVE OLD A
00926P 03E7 A6 01    A EXTX1  LDAA   1,X         GET NEW B
00927P 03E9 E7 01    A        STAB   1,X         SAVE NEW (X+1)
00928P 03EB 16                TAB                SAVE NEW B
00929P 03EC A6 00    A        LDAA   X           GET NEW A
00930P 03EE 36                PSHA               PUSH TO STACK
00931P 03EF A6 02    A        LDAA   2,X         GET NEW TEMP
00932P 03F1 36                PSHA               PUSH TO STACK
00933P 03F2 96 00    A        LDAA   TEMP        GET NEW (X+2)
00934P 03F4 A7 02    A        STAA   2,X         SAVE NEW (X+2)
00935P 03F6 32                PULA               GET OLD (X+2)
00936P 03F7 97 00    A        STAA   TEMP        SAVE NEW TEMP
00937P 03F9 96 00    A        LDAA   TEMP2       GET OLD A
00938P 03FB A7 00    A        STAA   X           SAVE NEW (X)
00939P 03FD 32                PULA               GET NEW A
00940P 03FE 39                RTS                EXIT EXCATX
00941                   *
00942                   * GETABT - A,B,TEMP _ (X),(X+1);(X+2)
00943                   *
00944P 03FF A6 02    A GETABT LDAA   2,X         GET TEMP
00945P 0401 97 00    A        STAA   TEMP        SAVE TEMP
00946P 0403 A6 00    A        LDAA   X           GET A
00947P 0405 E6 01    A        LDAB   1,X         GET B
00948P 0407 39                RTS                EXIT GETABT

00950                   *
00951                   * CNVBTD CONVERT BINARY TO DECIMAL - PUTS DECIMAL
00952                   *     EQUIVALENT OF 1,B ON PROCESSOR STACK.  SIGN
00953                   *     FIRST, THEN 5 DIGITS STARTING WITH THE MSD.
00954                   *
00955P 0408 8D 2C 0436 CNVBTD BSR    SAVRET      TRET _ RETURN ADDRESS
00956P 040A 8D 39 0445        BSR    GSIGN       GET SIGN; A,B _ ABS(A,B)
00957P 040C 97 00    A        STAA   SCRTCH      SAVE A,B
00958P 040E D7 01    A        STAB   SCRTCH+1   ... FOR DIVISION
00959P 0410 86 05    A        LDAA   #5          LOOP COUNTER _ 5
00960P 0412 97 06    A        STAA   SCRTCH+6
00961P 0414 48                ASLA               DIVISOR _ 10
00962P 0415 97 08    A        STAA   SCRTCH+8
00963P 0417 7F 0007  A        CLR    SCRTCH+7
00964                   *
00965P 041A CE 0007  A BTDLP  LDX    #SCRTCH+7 POINT TO DIVISOR
00966P 041D 4F                CLRA               INIT DIVIDEND
00967P 041E 5F                CLRB
00968P 041F BD 0294  P        JSR    DIV16       CALC DECIMAL DIGIT
00969P 0422 97 00    A        STAA   SCRTCH      MSB NEW DIVIDEND
00970P 0424 96 01    A        LDAA   SCRTCH+1 GET DECIMAL DIGIT
00971P 0426 36                PSHA               SAVE ON STACK
00972P 0427 D7 01    A        STAB   SCRTCH+1 SAVE LSB DIVIDEND
00973P 0429 7A 0006  A        DEC    SCRTCH+6 5 DIGITS DONE?
00974P 042C 26 EC 041A        BNE    BTDLP       LOOP TILL YES
00975                   *
00976P 042E 96 00    A        LDAA   TEMP        GET SIGN
00977P 0430 36                PSHA               SAVE ON STACK
```

```
00978P 0431 FE 0000   A              LDX     TRET      GET RETURN ADDRESS
00979P 0434 6E 00     A              JMP     X         EXIT CNVBTD

00981                           *
00982                           * SAVRET - SAVES 2ND RETURN ADDRESS ON STACK IN
00983                           *    TRET, CORRECTS STACK, AND JUMPS TO 1ST
00984                           *    RETURN ADDRESS.
00985                           *
00986P 0436 30               SAVRET   TSX               POINT TO STACK
00987P 0437 EE 02     A              LDX     2,X       GET 2ND RET ADDR
00988P 0439 FF 0000   A              STX     TRET      ... AND SAVE IT
00989P 043C 30                       TSX               POINT TO STACK
00990P 043D EE 00     A              LDX     X         GET 1ST RETURN ADDRESS
00991P 043F 31                       INS               CORRECT
00992P 0440 31                       INS
00993P 0441 31                       INS
00994P 0442 31                       INS               ... STACK
00995P 0443 6E 00     A              JMP     X         EXIT SAVRET
00996                           *
00997                           * GSIGN - TEMP _ SIGN(A,B)
00998                           *    A,B _ ABS(A,B)
00999                           *
01000P 0445 37               GSIGN    PSHB              SAVE B
01001P 0446 C6 19     A              LDAB    #25       GET "+"
01002P 0448 4D                       TSTA
01003P 0449 2A 01 044C              BPL     GSLINK    BRANCH IF A,B >= 0
01004P 044B 5C                       INCB              GET "-"
01005P 044C D7 00     A GSLINK       STAB    TEMP      TEMP _ SIGN
01006P 044E 33                       PULB
01007P 044F 7E 0258   P              JMP     ABSAB     A,B _ ABS(A,B) AND EXIT

01009                           *
01010                           * DTOBDC - CONVERTS TOP LEVEL OF PSTK TO DECIMAL.
01011                           *    SAME OUTPUT AS DTOBTD.  PSTK UNAFFECTED.
01012                           *
01013P 0452 BD 04F6   P DTOBDC       JSR     INTEGR    GET INTEGER INTO A,B.
01014                           *
01015                           * DTOBTD - DTO BINARY TO DECIMAL - LEAVES DECIMAL
01016                           *    EQUIVALENT OF A,B ON PROCESSOR STACK IN DTO
01017                           *    CHARACTER FORM AS 6 BYTES: SIGN,MSD,...,LSD.
01018                           *
01019P 0455 8D DF 0436 DTOBTD       BSR     SAVRET
01020P 0457 FE 0000   A              LDX     TRET
01021P 045A DF 00     A              STX     TEMP5     SAVE RETURN ADDRESS
01022P 045C 8D AA 0408              BSR     CNVBTD    CONVERT A,B TO DECIMAL
01023P 045E 30                       TSX               POINT TO STACK
01024P 045F 86 06     A              LDAA    #6
01025P 0461 BD 018F   P              JSR     OFFX      X _ X+6
01026P 0464 DF 00     A              STX     TEMP      SAVE LOOP TERMINATOR
01027P 0466 30                       TSX               POINT TO STACK
01028                           *
01029P 0467 A6 00     A DBDCL        LDAA    X         GET CHARACTER
01030P 0469 26 04 046F              BNE     DBDC1     BRANCH IF NOT "0"
01031P 046B 86 0A     A              LDAA    #10
01032P 046D A7 00     A              STAA    X         CHAR _ DTO "0"
01033P 046F 08               DBDC1   INX               NEXT CHAR
01034P 0470 9C 00     A              CPX     TEMP
01035P 0472 26 F3 0467              BNE     DBDCL     LOOP TILL DONE
01036                           *
01037P 0474 DE 00     A              LDX     TEMP5     GET RETURN ADDRESS
01038P 0476 6E 00     A              JMP     X         EXIT DTOBTD,DTOBDC

01040                           *
01041                           * COMPXY - COMPARE X WITH Y AND RETURN TWOS
01042                           *    COMPLEMENT FLAGS ACCORDING TO Y-X.
01043                           *    X AND Y ARE ASSUMED TO BE NORMALIZED.
01044                           *    PSTK UNAFFECTED.
01045                           *
01046P 0478 96 03     A COMPXY       LDAA    PSTK+3    ACCA _ MSB(YFRAC)
01047P 047A 16                       TAB
01048P 047B D8 00     A              EORB    PSTK      (SEE IF SIGNS ARE EQUAL)
01049P 047D 2A 09 0488              BPL     SIGNEQ    BRANCH: SIGN(X) = SIGN(Y)
01050P 047F 4D                       TSTA
```

```
01051P 0480 2A 03 0485              BPL    YGTX       BRANCH: Y>=0 AND X<0

01053P 0482 86 FF     A  YLTX       LDAA   #-1        Z _ V _ 0; N _ 1
01054P 0484 39                      RTS               EXIT:  Y < X 01056P 0485 86 01     A  YGTX       LDAA   #1         Z _ V _ N _ 0
01057P 0487 39                      RTS               EXIT:  Y > X

01059                               *
01060                               * SIGN(Y) = SIGN(X)
01061                               *
01062P 0488 DE 00     A  SIGNEQ     LDX    PSTK       INDEX _ XFRAC
01063P 048A 26 04 0490              BNE    XNE0       BRANCH: X<>0
01064P 048C 4D                      TSTA
01065P 048D 26 F6 0485              BNE    YGTX       BRANCH: Y>0 AND X=0
01066P 048F 39                      RTS              EXIT: Y = X = 0

01068                               *
01069                               * X<>0 AND SIGN(Y) = SIGN(X)
01070                               *
01071P 0490 2B 0E 04A0   XNE0       BMI    XYLT0      BRANCH: X<0 AND Y<0
01072P 0492 4D                      TSTA
01073P 0493 27 ED 0482              BEQ    YLTX       BRANCH: Y=0 AND X>0

01075                               *
01076                               * Y>0 AND X>0
01077                               *
01078P 0495 D6 05     A             LDAB   PSTK+5
01079P 0497 D1 02     A             CMPB   PSTK+2     IF YEXP-XEXP <> 0 THEN
01080P 0499 26 0B 04A6              BNE    CMPXIT     ... EXIT: YEXP-XEXP GIVES RESULT 01082P 049B D6 04     A  CFRACS     LDAB   PSTK+4
01083P 049D 7E 04DE   P             JMP    SUBIDX     EXIT: YFRAC-XFRAC GIVES RESULT

01085                               *
01086                               * X<0 AND Y<0
01087                               *
01088P 04A0 D6 02     A  XYLT0      LDAB   PSTK+2
01089P 04A2 D1 05     A             CMPB   PSTK+5     IF XEXP-YEXP = 0 THEN
01090P 04A4 27 F5 049B              BEQ    CFRACS     ...BRANCH: YFRAC-XFRAC GIVES RES.

01092P 04A6 39           CMPXIT     RTS              EXIT: EXPONENT DIFF. GIVES RESULT

01094                               *
01095                               * DROP - DROPS STACK ONE LEVEL.  X IS LEFT IN TOP
01096                               *    3 LOCATIONS OF SCRTCH (PSTK-3--PSTK-1).
01097                               *
01098P 04A7 36           DROP       PSHA              SAVE A
01099P 04A8 CE FFFD   A             LDX    #PSTK-3    POINT TO PSTK
01100P 04AB A6 03     A  DROPLP     LDAA   3,X        GET BYTE FROM PSTK
01101P 04AD A7 00     A             STAA   X          DROP DOWN ONE LEVEL
01102P 04AF 08                      INX               NEXT BYTE
01103P 04B0 8C FFFD   A             CPX    #PSTKTP-3  DONE?
01104P 04B3 26 F6 04AB              BNE    DROPLP     LOOP TILL YES
01105P 04B5 32                      PULA              RESTORE A
01106P 04B6 39                      RTS               EXIT DROP
01107                               *
01108                               * ENTER - ENTERS FLOATING POINT VARIABLE POINTED TO
01109                               *    BY THE INDEX ONTO PSTK.
01110                               *
01111P 04B7 A6 02     A  ENTER      LDAA   2,X        GET EXPONENT
01112P 04B9 EE 00     A             LDX    X          GET FRACTION
01113P 04BB 20 00 04BD              BRA    ENTIMM     ENTER AND EXIT
01114                               *
01115                               * ENTIMM - ENTER IMMEDIATE - ENTERS FLOATING
01116                               *    POINT VARIABLE IN INDEX;A ONTO PSTK.
01117                               *
01118P 04BD B7 FFFF   A  ENTIMM     STAA   PSTK-1     SAVE EXPONENT
01119P 04C0 FF FFFD   A             STX    PSTK-3     SAVE FRACTION
01120P 04C3 CE FFFC   A             LDX    #PSTKTP-4  POINT TO PSTK
01121P 04C6 A6 00     A  ENTLP      LDAA   X          GET BYTE FROM STACK
01122P 04C8 A7 03     A             STAA   3,X        MOVE UP ONE LEVEL
01123P 04CA 09                      DEX               NEXT CHARACTER DOWN
```

```
01124P 04CB 8C FFFC    A           CPX     #PSTK-4     DONE?
01125P 04CE 26 F6 04C6             BNE     ENTLP       LOOP TILL YES
01126P 04D0 39                     RTS                 EXIT ENTIMM

01128                      *
01129                      * BUMP - REENTERS X ONTO PSTK.
01130                      *
01131P 04D1 96 02      A BUMP      LDAA    PSTK+2      GET EXPONENT
01132P 04D3 DE 00      A           LDX     PSTK        GET FRACTION
01133P 04D5 20 E6 04BD             BRA     ENTIMM      ENTER AND EXIT
01134                      *
01135                      * CMPIDX - COMPARE A,B WITH INDEX.  2'S COMPLEMENT
01136                      *     COMPARISON FLAGS SET BY THE OPERATION:
01137                      *     A,B - INDEX.  NO REGISTERS CHANGED.
01138                      *     TEMP3 _ INDEX.
01139                      *
01140P 04D7 36           CMPIDX    PSHA
01141P 04D8 37                     PSHB                SAVE A,B
01142P 04D9 8D 03 04DE             BSR     SUBIDX      SUBTRACT TO SET FLAGS
01143P 04DB 33                     PULB
01144P 04DC 32                     PULA                RESTORE A,B
01145P 04DD 39                     RTS                 EXIT CMPIDX
01146                      *
01147                      * SUBIDX - A,B _ A,B - INDEX.  2'S COMPLEMENT
01148                      *     COMPARISON FLAGS SET.  TEMP3 _ INDEX.
01149                      *
01150P 04DE DF 00      A SUBIDX    STX     TEMP3       SAVE INDEX
01151P 04E0 CE 0000    A           LDX     #TEMP3      POINT TO "INDEX"
01152P 04E3 BD 017A    P           JSR     SUB16       A,B _ A,B - "INDEX"
01153P 04E6 36                     PSHA                RESTORE
01154P 04E7 07                     TPA                 ... INDEX
01155P 04E8 DE 00      A           LDX     TEMP3       ... WITHOUT
01156P 04EA 06                     TAP                 ... KILLING
01157P 04EB 32                     PULA                ... FLAGS
01158P 04EC 39                     RTS                 EXIT SUBIDX

01160                      ****************************************
01161                      *                                      *
01162                      * END OF DTOU3                         *
01163                      *                                      *
01164                      ****************************************

01166                      *
01167                      * ENTIDX - ENTER INDEX ONTO PSTK AS A 16 BIT
01168                      *     TWOS COMPLEMENT INTEGER.  TEMP3 _ INDEX.
01169                      *
01170P 04ED DF 00      A ENTIDX    STX     TEMP3       SAVE VALUE TO BE ENTERED
01171P 04EF CE 0000    A           LDX     #TEMP3      POINT TO OLD INDEX
01172P 04F2 7E 0534    P           JMP     EINT15      ENTER OLD INDEX AND EXIT 01174P 04F5    00      A CRCUB     FCB     0           CRC SPACE

01176                      *
01177                      * INTEGR - A,B _ INTEGER(X ON PSTK).  ROUNDED
01178                      *     RESULT.  V SET INDICATES 16 BIT 2'S COMP
01179                      *     OVERFLOW.  A,B _ 0 IF EXPONENT(X) < -1.  PSTK
01180                      *     UNAFFECTED.
01181                      *
01182P 04F6 96 02      A INTEGR    LDAA    PSTK+2      A _ EXP(X)
01183P 04F8 81 0F      A           CMPA    #15
01184P 04FA 2E 33 052F             BGT     TOOBIG      OVERFLOW IF A > 15
01185P 04FC 81 FF      A           CMPA    #$FF
01186P 04FE 2D 31 0531             BLT     NOINT       UNDERFLOW IF A < -1
01187P 0500 80 0F      A           SUBA    #15
01188P 0502 40                     NEGA                A _ 15 - EXP(X)
01189P 0503 97 00      A           STAA    SCRTCH      SHIFT COUNTER
01190P 0505 BD 024A    P           JSR     CLRNEG      NEGRES _ 0
01191P 0508 D6 01      A           LDAB    PSTK+1
01192P 050A 96 00      A           LDAA    PSTK        A,B _ FRAC(X)
```

```
01193P 050C 2A 06 0514          BPL    INT0     BRANCH IF A,B > 0
01194                         *
01195P 050E BD 0243  P          JSR    SETNEG   NEGRES _ 1
01196P 0511 BD 025B  P          JSR    NEGAB    A,B _ ABS(A,B)
01197                         *
01198P 0514 7D 0000  A INT0     TST    SCRTCH   DO WE NEED TO ADJUST?
01199P 0517 27 0D 0526          BEQ    INT1     IF NOT...BRANCH
01200                         *
01201P 0519 47          INTLP   ASRA
01202P 051A 56                  RORB            A,B _ A,B/2
01203P 051B 7A 0000  A          DEC    SCRTCH
01204P 051E 26 F9 0519          BNE    INTLP    LOOP 15 - EXP(X) TIMES
01205                         *
01206P 0520 24 04 0526          BCC    INT1
01207P 0522 CB 01    A          ADDB   #1       ROUND UP IF LAST
01208P 0524 89 00    A          ADCA   #0       ... LSBIT = 1
01209P 0526 BD 0251  P INT1     JSR    TSTNEG
01210P 0529 27 03 052E          BEQ    INTXIT   A,B _ -A,B IF
01211P 052B BD 025B  P          JSR    NEGAB    ... NEGRES = 1
01212P 052E 39          INTXIT  RTS             EXIT
01213                         *
01214P 052F 0B          TOOBIG  SEV             OVERFLOW FLAG
01215P 0530 39                  RTS             EXIT
01216                         *
01217P 0531 4F          NOINT   CLRA
01218P 0532 5F                  CLRB            A,B _ 0 (UNDERFLOW)
01219P 0533 39                  RTS             EXIT

01221                         *
01222                         * EINT15 - (X),(X+1) ENTERED ONTO PSTK
01223                         *
01224P 0534 A6 00    A EINT15   LDAA   X
01225P 0536 E6 01    A          LDAB   1,X      A,B _ (X),(X+1)
01226P 0538 20 0B 0545          BRA    ENTINT   ENTER AND EXIT
01227                         *
01228                         * EINT8 - (X) ENTERED ONTO PSTK
01229                         *
01230P 053A E6 00    A EINT8    LDAB   X
01231P 053C 4F                  CLRA            A,B _ (X) (INT8)
01232P 053D 20 06 0545          BRA    ENTINT   ENTER AND EXIT
01233                         *
01234                         * EINT7 - (X) ENTERED ONTO PSTK
01235                         *
01236P 053F 4F          EINT7   CLRA            MSB _ 0
01237P 0540 E6 00    A          LDAB   X        GET INT7
01238P 0542 2A 01 0545          BPL    ENTINT   ENTER IF POSITIVE
01239P 0544 43                  COMA            CORRECT MSB IF NEGATIVE
01240                         *
01241                         * ENTINT - INT15 IN A,B ENTERED ONTO PSTK
01242                         *
01243P 0545 36          ENTINT  PSHA            SAVE A
01244P 0546 86 0F    A          LDAA   #15      GET INITIAL EXPONENT
01245P 0548 97 00    A          STAA   TEMP     SAVE IT
01246P 054A 32                  PULA            RESTORE A
01247P 054B BD 035F  P          JSR    NORM16   NORMALIZE A,B; TEMP
01248P 054E 97 00    A          STAA   TEMP2
01249P 0550 D7 01    A          STAB   TEMP2+1
01250P 0552 DE 00    A          LDX    TEMP2    INDEX _ A,B
01251P 0554 96 00    A          LDAA   TEMP     A _ EXPONENT
01252P 0556 7E 04BD  P          JMP    ENTIMM   ENTER INDEX; A AND EXIT

01254                         *
01255                         * SINT15 - (X),(X+1) _ INTEGER PART OF X ON PSTK
01256                         *
01257P 0559 BD 04F6  P SINT15   JSR    INTEGR   A,B _ INT(X)
01258P 055C A7 00    A          STAA   X
01259P 055E E7 01    A          STAB   1,X      (X),(X+1) _ A,B
01260P 0560 39                  RTS             EXIT SINT15
01261                         *
01262                         * SINT8 AND SINT7 - (X) _ INTEGER(X ON PSTK)
01263                         *
01264             0561 P SINT7  EQU    *
01265P 0561 BD 04F6  P SINT8    JSR    INTEGR   B _ INT(X)
```

```
01266P 0564 E7 00    A              STAB    X            (X) _ B
01267P 0566 39                      RTS                  EXIT SINT8, SINT7

01269                       *
01270                       * MULT8 A,B _ A * B.  TWOS COMP NOTATION.
01271                       *
01272P 0567 CE 0006  A  MULT8  LDX     #SCRTCH+6    FUTURE MULTIPLIER LOCATION
01273P 056A 6F 00    A         CLR     X            MSB OF MULTIPLIER _ 0
01274P 056C A7 01    A         STAA    1,X          MULTIPLIER _ A
01275P 056E 2A 02 0572         BPL     MULT8A
01276P 0570 63 00    A         COM     X            CORRECT MSB IF NEGATIVE
01277                       *
01278P 0572 4F          MULT8A CLRA
01279P 0573 5D                 TSTB
01280P 0574 2A 01 0577         BPL     MULT8B
01281P 0576 43                 COMA                 INITIALIZE MULTIPLICAND
01282                       *
01283P 0577 BD 0206  P  MULT8B JSR     MULT16       MULTIPLY
01284P 057A D6 01    A         LDAB    SCRTCH+1
01285P 057C 96 00    A         LDAA    SCRTCH       A,B _ A * B
01286P 057E 39                 RTS                  EXIT MULT8

01288                       *
01289                       * EXCH16 - A,B IS EXCHANGED WITH (X),(X+1).   FLAGS
01290                       *    UNAFFECTED.
01291                       *
01292P 057F 36          EXCH16 PSHA                 (SAVE A)
01293P 0580 07                 TPA
01294P 0581 97 00    A         STAA    TEMP         TEMP _ FLAGS
01295P 0583 A6 01    A         LDAA    1,X
01296P 0585 97 00    A         STAA    TEMP2        TEMP2 _ (X+1)
01297P 0587 A6 00    A         LDAA    X            A _ (X)
01298P 0589 E7 01    A         STAB    1,X          (X+1) _ B
01299P 058B 33                 PULB                 (GET OLD A)
01300P 058C E7 00    A         STAB    X            (X) _ OLD A
01301P 058E D6 00    A         LDAB    TEMP2        B _ TEMP2
01302P 0590 36                 PSHA
01303P 0591 96 00    A         LDAA    TEMP
01304P 0593 06                 TAP                  FLAGS _ TEMP
01305P 0594 32                 PULA
01306P 0595 39                 RTS                  EXIT EXCH16

01308                       *
01309                       * CMPPV2 2'S COMPLEMENT FLAGS SET BY THE COMPARISON
01310                       *    A;B - (X);(X+1).  (PV2 VARIABLES).  THE SUB-
01311                       *    TRACTION IS NOT ACTUALLY PERFORMED.
01312                       *
01313P 0596 6D 00    A  CMPPV2 TST     X
01314P 0598 2B 0A 05A4         BMI     CPV2A        BRANCH IF (X);(X+1) < 0
01315P 059A 4D                 TSTA                 A;B < (X);(X+1)
01316P 059B 2B 10 05AD         BMI     CMPLT        ... IF A;B < 0
01317P 059D E1 01    A  DOCPV2 CMPB    1,X
01318P 059F 26 02 05A3         BNE     CPV2XT       EXIT IF B <> (X+1)
01319P 05A1 A1 00    A         CMPA    X            COMPARE COEFFICIENTS
01320P 05A3 39          CPV2XT RTS                  EXIT CMPPV2
01321                       *
01322P 05A4 4D          CPV2A  TSTA                 BRANCH IF
01323P 05A5 2B 0B 05B2         BMI     CP2NEG       ... A;B < 0
01324                       *
01325P 05A7 36          CMPGT  PSHA                 (GREATER THAN)
01326P 05A8 86 01    A         LDAA    #1           N _ Z _ 0
01327P 05AA 0B                 SEV                  V _ 1
01328P 05AB 32                 PULA
01329P 05AC 39                 RTS                  EXIT CMPGT
01330                       *
01331P 05AD 36          CMPLT  PSHA                 (LESS THAN)
01332P 05AE 86 01    A         LDAA    #1           Z _ N _ V _ 0
01333P 05B0 32                 PULA
01334P 05B1 39                 RTS                  EXIT CMPLT
01335                       *
01336P 05B2 8D CB 057F  CP2NEG BSR     EXCH16       EXCHANGE BECAUSE NEGATIVE
```

```
01337P 05B4 8D E7 059D            BSR     DOCPV2     COMPARE
01338P 05B6 20 C7 057F            BRA     EXCH16     EXCHANGE AND EXIT
01339                     *
01340                     * STOVAR - STORE VARIABLE - STORES X FROM PSTK IN
01341                     *    THE LOCATION POINTED TO BY THE INDEX.
01342                     *
01343P 05B8 96 00    A    STOVAR  LDAA    PSTK       A _ MSB FRACTION
01344P 05BA A7 00    A            STAA    X          (X) _ A
01345P 05BC 96 01    A            LDAA    PSTK+1     A _ LSB FRACTION
01346P 05BE A7 01    A            STAA    1,X        (X+1) _ A
01347P 05C0 96 02    A            LDAA    PSTK+2     A _ EXPONENT
01348P 05C2 A7 02    A            STAA    2,X        (X+2) _ A
01349P 05C4 39                    RTS                EXIT STOVAR

01351                     *
01352                     * ACMP16 - ABSOLUTE VALUE 16 BIT COMPARE.
01353                     *    COMPARISON BY ABS(ACCA,ACCB) - ABS((X),(X+1)).
01354                     *    2'S COMPLEMENT FLAGS SET.  TEMP+1 DESTROYED.
01355                     *    ACCA, ACCB, (X), (X+1) UNCHANGED.
01356                     *
01357P 05C5 36            ACMP16  PSHA
01358P 05C6 37                    PSHB               SAVE A AND B
01359P 05C7 97 01    A            STAA    TEMP+1
01360P 05C9 A6 00    A            LDAA    X
01361P 05CB 36                    PSHA
01362P 05CC A6 01    A            LDAA    1,X
01363P 05CE 36                    PSHA               SAVE (X),(X+1)
01364P 05CF 96 01    A            LDAA    TEMP+1
01365P 05D1 BD 0258  P            JSR     ABSAB
01366P 05D4 BD 0275  P            JSR     ABSX       MAKE POSITIVE
01367P 05D7 BD 0188  P            JSR     COMP16     COMPARE
01368P 05DA 07                    TPA                SAVE FLAGS
01369P 05DB 33                    PULB
01370P 05DC E7 01    A            STAB    1,X
01371P 05DE 33                    PULB
01372P 05DF E7 00    A            STAB    X          RESTORE (X),(X+1)
01373P 05E1 06                    TAP                RESTORE FLAGS
01374P 05E2 33                    PULB
01375P 05E3 32                    PULA               RESTORE ACCA, ACCB
01376P 05E4 39                    RTS                EXIT ACMP16
01377                     *
01378                     * ENTPV2 - ENTERS PV2 VARIABLE POINTED TO BY THE
01379                     *    INDEX ONTO PSTK.  INDEX UNCHANGED.
01380                     *
01381P 05E5 DF 00    A    ENTPV2  STX     TMPIDX     SAVE VARIABLE POINTER
01382P 05E7 A6 01    A            LDAA    1,X        GET EXPONENT OF 10
01383P 05E9 BD 0124  P            JSR     EEXP10     ENTER ONTO PSTK
01384P 05EC DE 00    A            LDX     TMPIDX     POINT TO VARIABLE
01385P 05EE BD 053F  P            JSR     EINT7      ENTER COEFFICIENT
01386P 05F1 BD 032E  P            JSR     FLPMLT     MULTIPLY FOR RESULT
01387P 05F4 DE 00    A            LDX     TMPIDX     RESTORE INDEX
01388P 05F6 39                    RTS                EXIT ENTPV2

01390                     *******************************************
01391                     *                                         *
01392                     * END OF DTOU5                            *
01393                     *                                         *
01394                     *******************************************

01396                     *
01397                     * MDWMSG - AW _ MDW; MDW _ " "; EXECUTE BLOCK MOVE
01398                     *    DEFINED BY ACCA ON ENTRY.
01399                     * MDWM2 - SAME BUT WITHOUT AW _ MDW.
01400                     *
01401P 05F7 36            MDWMSG  PSHA               SAVE BLOCK MOVE NUMBER
01402P 05F8 86 02    A            LDAA    #2
01403P 05FA BD 014B  P            JSR     DOMOVE     AW _ MDW
01404P 05FD 32                    PULA               RESTORE BLOCK MOVE NUMBER
01405                     *
01406P 05FE CE 0028  A    MDWM2   LDX     #MDW+40
```

```
01407P 0601 DF 00      A            STX     TEMP
01408P 0603 CE 0004    A            LDX     #MDW+4
01409P 0606 BD 0000    P            JSR     CBLOCK     MDW _ " "
01410P 0609 7E 014B    P            JMP     DOMOVE     EXECUTE BLOCK MOVE AND EXIT

01412                               *
01413                               * TESTM2 - COMPARES M2 WITH M1 AND EXITS TWO LEVELS
01414                               *   OF SUBROUTINE IF NOT EQUAL.  ACCA DESTROYED.
01415                               *
01416P 060C 96 00      A   TESTM2   LDAA    M2
01417P 060E 91 00      A            CMPA    M1
01418P 0610 27 02 0614              BEQ     TM2XIT     IF M2 <> M1
01419P 0612 31                      INS                ... THEN BUMP STACK
01420P 0613 31                      INS                ... BEFORE RETURN
01421P 0614 39              TM2XIT  RTS                EXIT TESTM2

01423                               *
01424                               * M2P10 - M2 _ M2 + 10.  ACCA DESTROYED.
01425                               *
01426P 0615 96 00      A   M2P10    LDAA    M2
01427P 0617 8B 0A      A            ADDA    #10
01428P 0619 97 00      A            STAA    M2
01429P 061B 39                      RTS

01431                               END
TOTAL ERRORS 00000

P  0261 AABXIT  00607 00612*
DP  0258 ABSAB   00024 00544 00549 00606*00671 01007 01365
 P  0262 ABSAEX  00614*00665
 P  0275 ABSX    00626*01366
 P  05C5 ACMP16  00759 01357*
 P  000C ADJLP   00058*00060
 P  000E ADJM1   00057 00059*
 P  0274 AEXIT   00615 00624*
 P  03CA ALILP   00907*00912
 P  0287 AXEXIT  00627 00637*
R        BATDA   00011*00509
 P  041A BTDLP   00965*00974
DP  04D1 BUMP    00013 01131*
DP  0000 CBLOCK  00015 00046*00049 01409
 P  028E CF1     00594 00646*
DP  003A CFLG1   00015 00103*00647
DP  004B CFLG2   00021 00117*
DP  005C CFLG3   00025 00131*
DP  0068 CFLG4   00027 00141*
 P  049B CFRACS  01082*01090
DP  0040 CHFLG1  00023 00108*
 P  0051 CHFLG2  00122*
 P  0098 CHKER2  00179*00180
 P  0097 CHKERR  00178*00210
 P  00A9 CHKSR2  00158 00202*
 P  00AF CHKSR3  00164 00205*
 P  00B5 CHKSR4  00170 00208*
DP  002F CLITE1  00015 00087*
DP  0020 CLITE2  00015 00063 00075*
 P  024A CLRNEG  00580 00592*01190
 P  05A7 CMPGT   01325*
DP  04D7 CMPIDX  00021 01140*
 P  05AD CMPLT   01316 01331*
DP  0596 CMPPV2  00016 01313*
 P  04A6 CMPXIT  01080 01092*
```

```
 P 0408 CNVBTD 00955*01022
DP 0188 COMP16 00021 00390*01367
DP 0473 COMPXY 00025 01046*
 P 05B2 CP2NEG 01323 01336*
 P 05A4 CPV2A  01314 01322*
 P 05A3 CPV2XT 01318 01320*
DP 0205 CRCUA  00013 00518*
DP 04F5 CRCUB  00013 01174*
 P 02E6 D16ERR 00693 00719*
 P 02AD D16LP  00681*00695
 P 02BE D16ST  00677 00689*
 P 02DF D16XIT 00709 00711*
 P 046F DBDC1  01030 01033*
 P 0467 DBDCL  01029*01035
DP 00D1 DELAY  00022 00239*00248
DP 0294 DIV16  00022 00664*00771 00968
 P 014E DMVLP1 00340*00345
 P 0150 DMVLP2 00341*00343
 P 0257 DNAXIT 00602*
 P 03D7 DOADD  00898 00914*
 P 03D9 DOADD2 00915*
 P 059D DOCPV2 01317*01337
DP 014B DOMOVE 00016 00339*01403 01410
 P 01F3 DOPNT  00498 00501 00504*
DP 04A7 DROP   00025 00822 01098*
 P 04AB DROPLP 01100*01104
 P 02B8 DSHIFT 00683 00687*
 P 02A0 DSROK  00671*00716
DP 0452 DTOBDC 00016 01013*
DP 0455 DTOBTD 00020 01019*
 P 0149 E10ERR 00310 00312 00331*
DP 0124 EEXP10 00017 00219 00309*01383
DP 0534 EINT15 00017 01172 01224*
DP 053F EINT7  00020 01236*01385
DP 053A EINT8  00020 01230*
 P 0348 ENDFLP 00794 00801 00808 00818*
DP 04B7 ENTER  00017 01111*
DP 04ED ENTIDX 00014 01170*
DP 04BD ENTIMM 00017 00231 00327 01113 01118*01133 01252
DP 0545 ENTINT 00014 01226 01232 01238 01243*
 P 04C6 ENTLP  01121*01125
DP 05E5 ENTPV2 00023 01381*
 P 00E3 ETABLE 00259*00301
 P 0122 ETBLHI 00301*00320
 P 0123 ETBLLO 00302*00318
 P 03E5 EXCATX 00925*
 P 357F EXCH16 01292*01336 01338
 P 03E7 EXTX1  00900 00926*
 P 0037 F1LINK 00100*00106 00110
 P 0048 F2LINK 00114*00120 00124
 P 0059 F3LINK 00128*00134
 P 0065 F4LINK 00138*00144
 P 03B2 FADD24 00807 00893*00901
 P 03C6 FAS1   00899 00902*
 P 03E4 FASERR 00920*
 P 031B FD241  00760 00767*
 P 032B FD24XT 00775 00778*
 P 02FC FDIV24 00747*00800
 P 032C FDIVER 00752 00765 00772 00780*
DP 01CF FEWUNP 00022 00456*
 P 023B FIXNEG 00543 00580*00664
DP 033C FLPADD 00018 00232 00806*
DP 0325 FLPDIV 00024 00224 00799*
DP 032E FLPMLT 00018 00792*01386
DP 0343 FLPSUB 00018 00813*
 P 02E8 FMLT24 00727*00793
 P 02FB FMLTER 00730 00732 00738*
RB      FR1    00006*00099 00100 00105 00109 00599
RB      FR2    00006*00113 00114 00119 00123
RB      FR3    00006*00127 00128 00133
RB      FR4    00006*00137 00138 00143
 P 03AF FSUB24 00814 00892*
```

```
P  0249 FXNXIT 00584 00590*
P  00BD GET10  00218*00223
P  03FF GETABT 00903 00944*
P  0353 GETXY  00792 00799 00806 00813 00827*
P  0445 GSIGN  00956 01000*
P  044C GSLINK 01003 01005*
P  0514 INT0   01193 01198*
P  0526 INT1   01199 01206 01209*
P  04F6 INTEGR 01013 01182*01257 01265
P  0519 INTLP  01201*01204
P  052E INTXIT 01210 01212*
P  0027 L1LINK 00081*00089
P  001A L2LINK 00071*00077
RB      LITE1  00006*00080 00081 00088
RB      LITE2  00006*00070 00071 00076
R       LR1    00010*00083
R       LR2    00010*00072
RB      M1     00007*00056 01417
P  021D M16LP  00558*00568
P  023A M16XIT 00573 00575*
RB      M2     00007*01416 01426 01428
DP 0615 M2P10  00026 01426*
R       MDW    00010*01406 01408
DP 05FE MDWM2  00026 01406*
DP 05F7 MDWMSG 00026 01401*
P  00D6 MINORL 00242*00244
DP 0167 MOVBLK 00018 00362*00371
R       MPTBL  00011*00339
P  0229 MSHIFT 00560 00563*
DP 0206 MULT16 00022 00543*00735 01283
DP 0567 MULT8  00022 01272*
P  0572 MULT8A 01275 01278*
P  0577 MULT8B 01280 01283*
P  025B NEGAB  00608*00632 00710 00877 01196 01211
P  0265 NEGAEX 00574 00616*00874 00879
R       NEGRES 00010*00587 00593 00600
P  0279 NEGX   00620 00628*00892
DP 01B7 NHV    00025 00434*
P  01C3 NHV1   00436 00441*
P  01CB NHV2   00442 00446*
P  01B4 NLHVXT 00419 00424 00428*00439 00444 00448
DP 019F NLV    00025 00414*
P  01AB NLV1   00416 00421*
P  01B2 NLV2   00422 00426*
P  0531 NOINT  01186 01217*
P  035F NORM16 00839*00917 01247
P  0364 NORM32 00736 00841*
P  0368 NRM1   00843*
P  0374 NRM2   00842 00845 00847 00851*00857 00880
P  0384 NRM3   00855 00860*00871 00919
P  038C NRM4   00865*00875
P  0383 NRMERR 00858*00872 00876
P  03A8 NRMNEG 00844 00879*
P  0373 NRMXIT 00849*00866 00869
P  0370 NRMZRO 00848*
P  03A3 NRNEGL 00876*00881
DP 018F OFFX   00015 00401*00510 01025
P  019B OFFX1  00405 00407*
P  0201 PATERR 00491 00493 00515*
P  01F2 PNTAT1 00499 00502*
DP 01DF PNTATT 00016 00490*
RB      PSTK   00007*00818 00819 00821 00827 00828 00830 00831 01046 01048
               01062 01078 01079 01082 01088 01089 01099 01118 01119 01124
               01131 01132 01182 01191 01192 01343 01345 01347
RP      PSTKTP 00007*01103 01120
DP 00C7 R10    00019 00229*
DP 006E READSR 00020 00153*
P  0285 RESXIT 00635*
P  039E RNDNEG 00964 00874*
P  0389 ROUND  00863*
P  0185 S16L   00384 00386*
DP 01D8 SABL3X 00023 00467*
P  0436 SAVRET 00955 00986*01019
```

```
RB      SCRTCH    00007*00545 00546 00550 00551 00558 00559 00561 00562 00565
                  00566 00618 00619 00621 00672 00673 00681 00682 00684 00685
                  00687 00688 00689 00690 00702 00703 00704 00705 00747 00748
                  00763 00769 00840 00841 00851 00852 00862 00865 00893 00894
                  00909 00957 00958 00960 00962 00963 00965 00969 00970 00972
                  00973 01189 01198 01203 01272 01284 01285
DP 0008 SETM1     00016 00056*
 P 0243 SETNEG    00586*01195
 P 0288 SF1       00588 00641*
DP 0034 SFLG1     00021 00098*00642
DP 0045 SFLG2     00023 00112*
DP 0056 SFLG3     00025 00126*
DP 0062 SFLG4     00027 00136*
 P 0488 SIGNEQ    01049 01062*
DP 0559 SINT15    00024 01257*
DP 0561 SINT7     00014 01264*
DP 0561 SINT8     00014 01265*
DP 0025 SLITE1    00019 00080*
DP 0018 SLITE2    00019 00070*
R       SR1       00010*00155
R       SR2       00010*00161 00202
R       SR3       00010*00167 00205
R       SR4       00010*00173 00208
 P 00BB SRERR     00176 00181 00204 00207 00212*
 P 009D SRLOOP    00186*00188
DP 05B8 STOVAR    00019 01343*
DP 017A SUB16     00023 00379*00392 01152
DP 04DE SUBIDX    00024 01083 01142 01150*
RB      TEMP      00008*00048 00154 00160 00166 00172 00190 00239 00246 00319
                  00322 00324 00348 00364 00367 00728 00733 00750 00753 00764
                  00776 00820 00829 00848 00856 00870 00897 00910 00918 00933
                  00936 00945 00976 01005 01026 01034 01245 01251 01294 01303
                  01359 01364 01407
RB      TEMP2     00008*00323 00328 00351 00370 00895 00907 00914 00925 00937
                  01248 01249 01296 01301
RB      TEMP3     00008*00346 00349 00352 00363 00368 00402 00403 00404 00406
                  00407 01150 01151 01155 01170 01171
RB      TEMP5     00008*01021 01037
 P 02E0 TEST0     00669 00715*
DP 060C TESTM2    00026 01416*
 P 0614 TM2XIT    01418 01421*
RB      TMPIDX    00008*01381 01384 01387
 P 052F TOOBIG    01184 01214*
RB      TRET      00011*00978 00988 01020
 P 0251 TSTNEG    00572 00598*00708 01209
DP 00C2 XDIV10    00019 00223*
 P 0490 XNE0      01063 01071*
 P 04A0 XYLT0     01071 01088*
 P 0485 YGTX      01051 01056*01065
 P 0482 YLTX      01053*01073

00001                       NAM    TBL1
00002                       OPT    REL,CREF,LLEN=80
00003                       TTL    LOOKUP TABLES FOR DTO UTILITIES
00004                       IDNT   FEB. 18, 1978

00006                       XREF   MDW,AW

00008                       XDEF   MPTBL 00010P 0000                 PSCT
```

```
00012                   *
00013                   * MOVE PARAMETER TABLE (MPTBL) - BLOCK MOVE PARA-
00014                   *    METERS.  FIRST ADDRESS IS INITIATOR, THEN
00015                   *    TERMINATOR, AND LAST THE DESTINATION.
00016                   *
00017                   * #1:   MDW,15-26 _ "OFFSET ERROR"
00018P 0000    0096  P  MPTBL  FDB     BLK0,BLK1,MDW+14
     P 0002    00A2  P
     P 0004    000E  A
00019                   * #2:   AW _ MDW
00020P 0006    0004  A         FDB     MDW+4,MDW+40,AW
     P 0008    0028  A
     P 000A    0000  A
00021                   * #3:   MDW _ AW
00022P 000C    0000  A         FDB     AW,AW+36,MDW+4
     P 000E    0024  A
     P 0010    0004  A
00023                   * #4:   MDW,7-11 _ AW,1-5
00024P 0012    0000  A         FDB     AW,AW+5,MDW+6
     P 0014    0005  A
     P 0016    0006  A
00025                   * #5:   MDW,29-34 _ AW,1-6
00026P 0018    0000  A         FDB     AW,AW+6,MDW+28
     P 001A    0006  A
     P 001C    001C  A
00027                   * #6:   MDW,36-40 _ AW,1-5
00028P 001E    0000  A         FDB     AW,AW+5,MDW+35
     P 0020    0005  A
     P 0022    0023  A
00029                   * #7:   MDW,17-27 _ "TAPE NOT IN"
00030P 0024    00A7  P         FDB     BLK2,BLK2+11,MDW+16
     P 0026    00B2  P
     P 0028    0010  A
00031                   * #8:   MDW,15-30 _ "TAPE NOT INDEXED"
00032P 002A    00A7  P         FDB     BLK2,BLK3,MDW+14
     P 002C    00B7  P
     P 002E    000E  A
00033                   * #9:   MDW,16-29 _ "TAPE PROTECTED"
00034P 0030    00B7  P         FDB     BLK3,BLK4,MDW+15
     P 0032    00C5  P
     P 0034    000F  A
00035                   * #10:  MDW,10-28 _ "READ OR WRITE ERROR"
00036P 0036    00C5  P         FDB     BLK4,BLK5,MDW+9
     P 0038    00D8  P
     P 003A    0009  A
00037                   * #11:  MDW,17-27 _ "INDEX ERROR"
00038P 003C    00D8  P         FDB     BLK5,BLK6,MDW+16
     P 003E    00E3  P
     P 0040    0010  A
00039                   * #12:  MDW,9-36 _ "INDEXING TAPE - WAIT 60 SEC"
00040P 0042    00E3  P         FDB     BLK6,BLK7,MDW+8
     P 0044    00FF  P
     P 0046    0008  A
00041                   * #13:  MDW,6-9 _ "READ"
00042P 0048    00C5  P         FDB     BLK4,BLK4+4,MDW+5
     P 004A    00C9  P
     P 004C    0005  A
00043                   * #14:  MDW,6-11 _ "WRITE "
00044P 004E    00CD  P         FDB     BLK4+8,BLK4+14,MDW+5
     P 0050    00D3  P
     P 0052    0005  A
00045                   * #15:  MDW,10-17 _ "ING-WAIT"
00046P 0054    0109  P         FDB     BLK9,BLK10,MDW+9
     P 0056    0111  P
     P 0058    0009  A
00047                   * #16:  MDW,20-25 _ "AGAIN?"
00048P 005A    0117  P         FDB     BLK10+6,BLK11,MDW+19
     P 005C    011D  P
     P 005E    0013  A
00049                   * #17:  MDW,31-36 _ "AGAIN?"
00050P 0060    0117  P         FDB     BLK10+6,BLK11,MDW+30
     P 0062    011D  P
     P 0064    001E  A
```

```
00051                           * #18:  MDW, 6-10 _ "ERASE"
00052P 0066     00FF    P            FDB    BLK7, BLK8, MDW+5
     P 0068     0104    P
     P 006A     0005    A
00053                           * #19:  MDW, 13-17 _ " NONE"
00054P 006C     0104    P            FDB    BLK8, BLK9, MDW+12
     P 006E     0109    P
     P 0070     000C    A
00055                           * #20:  MDW, 10-21 _ " TAPE AGAIN?"
00056P 0072     0111    P            FDB    BLK10, BLK11, MDW+9
     P 0074     011D    P
     P 0076     0009    A
00057                           * #21:  MDW, 6-13 _ "TEST TAPE"
00058P 0078     00A2    P            FDB    BLK1, BLK2+4, MDW+5
     P 007A     00AB    P
     P 007C     0005    A
00059                           * #22:  MDW, 21-25 _ "ERROR"
00060P 007E     00DE    P            FDB    BLK5+6, BLK6, MDW+20
     P 0080     00E3    P
     P 0082     0014    A
00061                           * #23:  MDW, 16-19 _ "READ"
00062P 0084     00C5    P            FDB    BLK4, BLK4+4, MDW+15
     P 0086     00C9    P
     P 0088     000F    A
00063                           * #24:  MDW, 15-19 _ "INDEX"
00064P 008A     00D8    P            FDB    BLK5, BLK5+5, MDW+14
     P 008C     00DD    P
     P 008E     000E    A
00065                           * #25:  MDW, 15-25 _ "INDEX ERROR"
00066P 0090     00D8    P            FDB    BLK5, BLK6, MDW+14
     P 0092     00E3    P
     P 0094     000E    A
00068                           *
00069                           * BLOCK TABLE - MESSAGES FOR CRT DISPLAY
00070                           *
00071P 0096     0A      A BLK0   FCB    10, 30, 30, 18, 12, 19, 0 "OFFSET
     P 0097     1E      A
     P 0098     1E      A
     P 0099     12      A
     P 009A     0C      A
     P 009B     13      A
     P 009C     00      A
00072P 009D     0C      A        FCB    12, 17, 17, 10, 17 ERROR"
     P 009E     11      A
     P 009F     11      A
     P 00A0     0A      A
     P 00A1     11      A
00073P 00A2     13      A BLK1   FCB    19, 12, 18, 19, 0 "TEST "
     P 00A3     0C      A
     P 00A4     12      A
     P 00A5     13      A
     P 00A6     00      A
00074P 00A7     13      A BLK2   FCB    19, 11, 16, 12, 0, 15, 10, 19 "TAPE NOT
     P 00A8     0B      A
     P 00A9     10      A
     P 00AA     0C      A
     P 00AB     00      A
     P 00AC     0F      A
     P 00AD     0A      A
     P 00AE     13      A
00075P 00AF     00      A        FCB    0, 14, 15, 28, 12, 31, 12, 28 INDEXED"
     P 00B0     0E      A
     P 00B1     0F      A
     P 00B2     1C      A
     P 00B3     0C      A
     P 00B4     1F      A
     P 00B5     0C      A
     P 00B6     1C      A
00076P 00B7     13      A BLK3   FCB    19, 11, 16, 12, 0 "TAPE
     P 00B8     0B      A
     P 00B9     10      A
     P 00BA     0C      A
     P 00BB     00      A
```

```
00077P 00BC    10    A            FCB    16,17,10,19,12,27,19,12,28 PROTECTED"
     P 00BD    11    A
     P 00BE    0A    A
     P 00BF    13    A
     P 00C0    0C    A
     P 00C1    1B    A
     P 00C2    13    A
     P 00C3    0C    A
     P 00C4    1C    A
00078P 00C5    11    A BLK4        FCB    17,12,11,28,0 "READ
     P 00C6    0C    A
     P 00C7    0B    A
     P 00C8    1C    A
     P 00C9    00    A
00079P 00CA    0A    A            FCB    10,17,0,20,17,14,19,12 OR WRITE
     P 00CB    11    A
     P 00CC    00    A
     P 00CD    14    A
     P 00CE    11    A
     P 00CF    0E    A
     P 00D0    13    A
     P 00D1    0C    A
00080P 00D2    00    A            FCB    0,12,17,17,10,17 ERROR"
     P 00D3    0C    A
     P 00D4    11    A
     P 00D5    11    A
     P 00D6    0A    A
     P 00D7    11    A
00081P 00D8    0E    A BLK5        FCB    14,15,28,12,31,0 "INDEX
     P 00D9    0F    A
     P 00DA    1C    A
     P 00DB    0C    A
     P 00DC    1F    A
     P 00DD    00    A
00082P 00DE    0C    A            FCB    12,17,17,10,17 ERROR"
     P 00DF    11    A
     P 00E0    11    A
     P 00E1    0A    A
     P 00E2    11    A
00083P 00E3    0E    A BLK6        FCB    14,15,28,12,31,14,15,13 "INDEXING
     P 00E4    0F    A
     P 00E5    1C    A
     P 00E6    0C    A
     P 00E7    1F    A
     P 00E8    0E    A
     P 00E9    0F    A
     P 00EA    0D    A
00084P 00EB    00    A            FCB    0,19,11,16,12,0 TAPE
     P 00EC    13    A
     P 00ED    0B    A
     P 00EE    10    A
     P 00EF    0C    A
     P 00F0    00    A
00085P 00F1    1A    A            FCB    26,0,20,11,14,19 - WAIT
     P 00F2    00    A
     P 00F3    14    A
     P 00F4    0B    A
     P 00F5    0E    A
     P 00F6    13    A
00086P 00F7    00    A            FCB    0,6,10,0,18,12,27,29 60 SEC. "
     P 00F8    06    A
     P 00F9    0A    A
     P 00FA    00    A
     P 00FB    12    A
     P 00FC    0C    A
     P 00FD    1B    A
     P 00FE    1D    A
00087P 00FF    0C    A BLK7        FCB    12,17,11,18,12 "ERASE"
     P 0100    11    A
     P 0101    0B    A
     P 0102    12    A
     P 0103    0C    A
```

```
00088P 0104    00    A  BLK8   FCB    0,15,10,15,12 " NONE"
     P 0105    0F    A
     P 0106    0A    A
     P 0107    0F    A
     P 0108    0C    A
00089P 0109    0E    A  BLK9   FCB    14,15,13,26,20,11,14,19 "ING-WAIT"
     P 010A    0F    A
     P 010B    0D    A
     P 010C    1A    A
     P 010D    14    A
     P 010E    0B    A
     P 010F    0E    A
     P 0110    13    A
00090P 0111    00    A  BLK10  FCB    0,19,11,16,12,0 " TAPE
     P 0112    13    A
     P 0113    0B    A
     P 0114    10    A
     P 0115    0C    A
     P 0116    00    A
00091P 0117    0B    A         FCB    11,13,11,14,15,24 AGAIN?"
     P 0118    0D    A
     P 0119    0B    A
     P 011A    0E    A
     P 011B    0F    A
     P 011C    18    A
00092          011D  P  BLK11  EQU    *

00094P 011D    00    A         FCB    0        CRC BYTE
00095                          END
TOTAL ERRORS 00000

R       AW        00006*00020 00022 00022 00024 00024 00026 00026 00028 00028
 P 0096 BLK0      00018 00071*
 P 00A2 BLK1      00018 00058 00073*
 P 0111 BLK10     00046 00048 00050 00056 00090*
 P 011D BLK11     00048 00050 00056 00092*
 P 00A7 BLK2      00030 00030 00032 00058 00074*
 P 00B7 BLK3      00032 00034 00076*
 P 00C5 BLK4      00034 00036 00042 00042 00044 00044 00062 00062 00078*
 P 00D8 BLK5      00036 00038 00060 00064 00064 00066 00081*
 P 00E3 BLK6      00038 00040 00060 00066 00083*
 P 00FF BLK7      00040 00052 00087*
 P 0104 BLK8      00052 00054 00088*
 P 0109 BLK9      00046 00054 00089*
R       MDW       00006*00018 00020 00020 00022 00024 00026 00028 00030 00032
                  00034 00036 00038 00040 00042 00044 00046 00048 00050 00052
                  00054 00056 00058 00060 00062 00064 00066
DP 0000 MPTBL     00008 00018*

00001                          NAM    DIAG
00002                          OPT    REL,CREF,LLEN=80
00003                          TTL    DTO DIAGNOSTIC POWER UP ROUTINES AND RESTAR
00004                          IDNT   FEB.  21, 1978 - RAM

00006                          XREF   BSCT:TEMP,FR4

00008                          XREF   AUX,LR1,LR2,LRMS,ROMEND,ROM0,SR4,START
00009                          XREF   STLROM

00011          BFFE  A  RESTRT EQU    $BFFE    LOCATION FOR DTO RESTART VECTOR

00013                          XDEF   DIAG
```

```
00015P 0000                        PSCT

00017                    *
00018                    * FIRST, DO CRC TEST ON LAST ROM, WHERE THESE
00019                    *     ROUTINES RESIDE.
00020                    *
00021P 0000 4F           DIAG  CLRA
00022P 0001 B7 0000  A         STAA   LR2        CLEAR MODE AND TRIG SOURCE LEDS
00023P 0004 43                 COMA
00024P 0005 B7 0000  A         STAA   LR1        CLEAR ALL OTHER LEDS EXCEPT POWER
00025P 0008 CE 0000  A         LDX    #STLROM    POINT TO START OF LAST ROM
00026P 000B 86 AA    A         LDAA   #$AA       GET CRC CHECK PATTERN
00027                    *
00028P 000D A8 00    A  DLP1   EORA   X          UPDATE CRC
00029P 000F 08                 INX               NEXT LOCATION
00030P 0010 8C 0000  A         CPX    #ROMEND    DONE?
00031P 0013 26 F8 000D         BNE    DLP1       LOOP IF NOT
00032                    *
00033P 0015 C6 07    A         LDAB   #LRERR     (LAST ROM ERROR CODE)
00034P 0017 4D                 TSTA              CRC OK?
00035P 0018 27 03 001D         BEQ    DOCBT      DO CHECKERBOARD RAM TEST IF SO
00036P 001A 7E 00B4  P         JMP    DIAGER     OUTPUT ERROR CODE IF NOT
00038                    *
00039                    * DO CHECKERBOARD TEST ON RAMS
00040                    *
00041P 001D CE 3FFF  A  DOCBT  LDX    #16383     X _ 16K-1 (TOP OF AUX RAM)
00042P 0020 86 AA    A         LDAA   #%10101010 A _ CHECKERBOARD BYTE
00043P 0022 A7 00    A         STAA   X
00044P 0024 A1 00    A         CMPA   X
00045P 0026 27 03 002B         BEQ    STCBT      IF (X) IS A BAD LOCATION THEN
00046P 0028 CE 0FFF  A         LDX    #4095      ... X _ 4K-1 (TOP - NO AUX RAM)

00048P 002B 35          STCBT  TXS               S _ X-1 (REMEMBER TOP OF RAM)

00050P 002C A7 00    A  CBTL1  STAA   X
00051P 002E 43                 COMA
00052P 002F 09                 DEX
00053P 0030 26 FA 002C         BNE    CBTL1
00054P 0032 97 00    A         STAA   0          FILL RAM WITH CHECKERBOARD #1

00056P 0034 43                 COMA              (ORIGINAL CHECKERBOARD BYTE)

00058P 0035 30                 TSX               X _ S+1 (POINT TO TOP OF RAM)

00060P 0036 E6 00    A  CBTL2  LDAB   X
00061P 0038 10                 SBA
00062P 0039 26 23 005E         BNE    RTFAIL
00063P 003B 17                 TBA
00064P 003C 43                 COMA
00065P 003D 09                 DEX
00066P 003E 26 F6 0036         BNE    CBTL2
00067P 0040 D6 00    A         LDAB   0
00068P 0042 10                 SBA               TEST CHECKERBOARD #1 AND
00069P 0043 26 19 005E         BNE    RTFAIL     ... BRANCH IF ERROR
00070P 0045 17                 TBA 00072P 0046 30                 TSX               X _ S+1 (POINT TO TOP OF RAM)

00074P 0047 63 00    A  CBTL3  COM    X
00075P 0049 09                 DEX
00076P 004A 26 FB 0047         BNE    CBTL3      INVERT CHECKERBOARD #1 TO
00077P 004C 63 00    A         COM    X          ... CREATE CHECKERBOARD #2

00079P 004E 30                 TSX               X _ S+1 (POINT TO TOP OF RAM)

00081P 004F E6 00    A  CBTL4  LDAB   X
00082P 0051 10                 SBA
00083P 0052 26 0A 005E         BNE    RTFAIL
00084P 0054 17                 TBA
00085P 0055 43                 COMA
```

```
00086P 0056 09                      DEX
00087P 0057 26 F6 004F              BNE     CBTL4
00088P 0059 D6 00    A              LDAB    0
00089P 005B 10                      SBA             TEST CHECKERBOARD #2 AND
00090P 005C 27 28 0086              BEQ     RTPASS  ... BRANCH IF RAM TEST PASS
00092                       *
00093                       * RAM TEST FAILURE
00094                       *
00095P 005E 7F 0000 A RTFAIL CLR    FR4     AUX _ 0

00097                       *
00098                       * DETERMINE LEAST SIGNIFICANT ERROR BIT
00099                       *
00100P 0061 8E FFFF A                LDS    #$FFFF  BIT _ -1

00102P 0064 31             RTFL1    INS             BIT _ BIT+1
00103P 0065 46                      RORA            THIS BIT?
00104P 0066 24 FC 0064              BCC     RTFL1   LOOP UNTIL YES
00105                       *
00106                       * DETERMINE WHETHER RAM ERROR IS IN LOWER 4096 BYTES
00107                       *
00108P 0068 CE 0FFF A                LDX    #4095   POINT TO TOP OF 4K
00109P 006B 86 55   A                LDAA   #%01010101 GET CHECKERBOARD 00111P 006D A1 00   A RTFL2          CMPA   X
00112P 006F 26 0C 007D              BNE     L4KBAD
00113P 0071 43                      COMA
00114P 0072 09                      DEX
00115P 0073 26 F8 006D              BNE     RTFL2
00116P 0075 91 00   A                CMPA   0       TEST LOWER 4K AND
00117P 0077 26 04 007D              BNE     L4KBAD  ... BRANCH IF FAILURE
00118                       *
00119                       * THE ERROR IS IN THE UPPER 12K
00120                       *
00121P 0079 C6 1B   A                LDAB   #ECTLTH*2-1 GET BASE ERROR CODE
00122P 007B 20 02 007F              BRA     DOCODE

00124                       *
00125                       * THE ERROR IS IN THE LOWER 4K
00126                       *
00127P 007D C6 0D   A L4KBAD LDAB    #ECTLTH-1 GET BASE ERROR CODE

00129                       *
00130                       * ENCODE ERROR MESSAGE FROM BASE AND BIT NUMBER
00131                       *
00132P 007F 30              DOCODE TSX             POINT TO BIT+1

00134P 0080 5C              RTFL3  INCB            NEXT ERROR CODE
00135P 0081 09                      DEX             THIS BIT?
00136P 0082 26 FC 0080              BNE     RTFL3   LOOP UNTIL YES 00138P 0084 20 2E 00B4              BRA     DIAGER  OUTPUT ERROR CODE
00140                       *
00141                       * RAM TEST PASS
00142                       *
00143P 0086 7F 0000 A RTPASS CLR    FR4     AUX _ 0
00144P 0089 30                      TSX             POINT TO TOP OF RAM
00145P 008A 8C 3FFF A                CPX    #16383  16K OF GOOD RAM?
00146P 008D 26 04 0093              BNE     ROMTST  SKIP TO ROM TEST IF NOT
00147P 008F 86 00   A                LDAA   #AUX
00148P 0091 97 00   A                STAA   FR4     AUX _ 1 IF SO

00150                       *
00151                       * DO CRC CHECK ON ROMS UP TO LSTROM (LAST ROM).
00152                       *
00153P 0093 CE 0000 A ROMTST LDX     #ROM0   POINT TO FIRST ROM
00154P 0096 DF 00   A                STX    TEMP    SET LOOP TERMINATOR
00155P 0098 5F                      CLRB            GET BASE ERROR CODE
00156P 0099 96 00   A                LDAA   TEMP    READY TO CORRECT TERMINATOR 00158P 009B 8B 08   A DLP5           ADDA   #8      MSB OF NEXT ROM
00159P 009D 97 00   A                STAA   TEMP    UPDATE TERMINATOR
00160P 009F 86 AA   A                LDAA   #$AA    GET TEST PATTERN
00161                       *
```

```
00162P 00A1 A8 00    A  DLP6    EORA    X           UPDATE CRC
00163P 00A3 08                  INX                 NEXT LOCATION
00164P 00A4 9C 00    A          CPX     TEMP        DONE WITH THIS ROM?
00165P 00A6 26 F9 00A1          BNE     DLP6        LOOP IF NOT
00166                        *
00167P 00A8 4D                  TSTA                CRC OK?
00168P 00A9 26 09 00B4          BNE     DIAGER      BRANCH IF NOT
00169P 00AB 5C                  INCB                NEXT ERROR CODE
00170P 00AC 96 00    A          LDAA    TEMP
00171P 00AE 81 00    A          CMPA    #LRMS       THROUGH WITH LAST ROM?
00172P 00B0 26 E9 009B          BNE     DLP5        LOOP IF NOT 00174P 00B2 20 34 00E8          BRA     EXIT        NO ERRORS: START MAIN PROGRAM

00176                        *
00177                        * OUTPUT ERROR CODE TO LEDS
00178                        *
00179P 00B4 86 BC    A  DIAGER  LDAA    #$BC        ROM ERROR LR1 PATTERN
00180P 00B6 C1 0E    A          CMPB    #ECTLTH     ROM ERROR (ACCB < ECTLTH)?
00181P 00B8 25 0A 00C4          BCS     NOADJB      BRANCH IF SO 00183P 00BA 86 7C    A          LDAA    #$7C        RAM ERROR LR1 PATTERN
00184P 00BC 20 02 00C0          BRA     STADJB      BRANCH TO ADJUST ACCB 00186P 00BE C0 0E    A  ADJBLP  SUBB    #ECTLTH
00187P 00C0 C1 0E    A  STADJB  CMPB    #ECTLTH
00188P 00C2 24 FA 00BE          BCC     ADJBLP      ACCA _ ACCB MOD ECTLTH 00190P 00C4 CE 00EB  P  NOADJB  LDX     #ECTABL     INDEX _ POINTER TO CODE TABLE
00191P 00C7 5D                  TSTB                NEED TO ADJUST INDEX?
00192P 00C8 27 04 00CE          BEQ     NOADJX      BRANCH IF NOT 00194P 00CA 08          ADJXLP  INX
00195P 00CB 5A                  DECB
00196P 00CC 26 FC 00CA          BNE     ADJXLP      INDEX _ INDEX + ACCB 00198P 00CE E6 00    A  NOADJX  LDAB    X           ACCB _ LR2 PATTERN ERROR CODE 00200P 00D0 B7 0000  A          STAA    LR1         OUTPUT LR1 PATTERN
00201P 00D3 F7 0000  A          STAB    LR2         OUTPUT LR2 PATTERN
00202                        *
00203                        * WAIT 2 SECONDS IN CASE CLEAR BUTTON READS
00204                        *     ALWAYS PRESSED.
00205                        *
00206P 00D6 86 20    A          LDAA    #32         (OUTER LOOP COUNTER)
00207P 00D8 CE 1E83  A  DLP7    LDX     #7811       (INNER LOOP COUNTER)
00208P 00DB 09          DLP8    DEX
00209P 00DC 26 FD 00DB          BNE     DLP8        7811 * 8 = 62488 CYCLES
00210P 00DE 4A                  DECA                62488 * 32 = 1999616 CYCLES
00211P 00DF 26 F7 00D8          BNE     DLP7        1999616 = APPROX. 2.0 SECONDS
00212                        *
00213                        * WAIT UNTIL CLEAR BUTTON ONLY PRESSED IN SR4.
00214                        *     NO OTHER SR'S CHECKED.
00215                        *
00216P 00E1 B6 0000  A  DLP9    LDAA    SR4         GET SR4 DATA
00217P 00E4 88 EF    A          EORA    #$EF        CLEAR BUTTON ONLY?
00218P 00E6 26 F9 00E1          BNE     DLP9        LOOP IF NOT
00219                        *
00220                        * START MAIN PROGRAM
00221                        *
00222P 00E8 7E 0000  A  EXIT    JMP     START
00224                        *
00225                        * ERROR CODE TABLE (ROM NUMBER OR RAM BIT NUMBER).
00226                        *     THE CODE CONSISTS OF TWO OCTAL DIGITS, D1 AND
00227                        *     D2, WHICH HAVE THE FOLLOWING WEIGHTS:
00228                        *
00229                        *     D1-WEIGHT(D1)   D2-WEIGHT(D2)
00230                        *      5 - 0           2 - 0
00231                        *      4 - 1           6 - 5
00232                        *      3 - 2           5 - 10
00233                        *      2 - 3           4 - 15
00234                        *      1 - 4           3 - 20
```

7 - 25

```
00235                    *
00236                    *
00237P 00EB   2A    A  ECTABL FCB   @52        ROM 0, RAM BIT 0
00238P 00EC   22    A         FCB   @42        ROM 1, RAM BIT 1
00239P 00ED   1A    A         FCB   @32        ROM 2, RAM BIT 2
00240P 00EE   12    A         FCB   @22        ROM 3, RAM BIT 3
00241P 00EF   0A    A         FCB   @12        ROM 4, RAM BIT 4
00242P 00F0   2E    A         FCB   @56        ROM 5, RAM BIT 5
00243P 00F1   26    A         FCB   @46        ROM 6, RAM BIT 6
00244P 00F2   1E    A         FCB   @36        ROM 7, RAM BIT 7
00245P 00F3   16    A         FCB   @26        ROM 8
00246P 00F4   0E    A         FCB   @16        ROM 9
00247P 00F5   2D    A         FCB   @55        ROM 10
00248P 00F6   25    A         FCB   @45        ROM 11
00249P 00F7   1D    A         FCB   @35        ROM 12
00250P 00F8   15    A         FCB   @25        ROM 13
00251         000E  A  ECTLTH EQU   *-ECTABL   TABLE LENGTH
00252         0007  A  LRERR  EQU   7          LAST ROM ERROR TABLE ENTRY 00254P 00F9   00    A         FCB   0          OPTIONAL CRC SPACE

00256                    *
00257                    * DTO RESTART VECTOR
00258                    *
00259A BFFE                   ORG   RESTRT
00260A BFFE   0000  P         FDB   DIAG       DTO RESTART VECTOR TO DIAGNOSTICS

00262                         END
TOTAL ERRORS 00000

P 00BE ADJBLP 00186*00188
 P 00CA ADJXLP 00194*00196
R       AUX    00008*00147
 P 002C CBTL1  00050*00053
 P 0036 CBTL2  00060*00066
 P 0047 CBTL3  00074*00076
 P 004F CBTL4  00081*00087
DP 0000 DIAG   00013 00021*00260
 P 00B4 DIAGER 00036 00138 00168 00179*
 P 000D DLP1   00028*00031
 P 009B DLP5   00158*00172
 P 00A1 DLP6   00162*00165
 P 00D8 DLP7   00207*00211
 P 00DB DLP8   00208*00209
 P 00E1 DLP9   00216*00218
 P 001D DOCBT  00035 00041*
 P 007F DOCODE 00122 00132*
 P 00EB ECTABL 00190 00237*00251
        000E ECTLTH 00121 00127 00180 00186 00187 00251*
 P 00E3 EXIT   00174 00222*
RB      FR4    00006*00095 00143 00149
 P 007D L4KBAD 00112 00117 00127*
R       LR1    00008*00024 00200
R       LR2    00008*00022 00201
        0007 LRERR 00033 00252*
R       LRMS   00008*00171
 P 00C4 NOADJB 00181 00190*
 P 00CE NOADJX 00192 00198*
   BFFE RESTRT 00011*00259
R       ROM0   00008*00153
R       ROMEND 00008*00030
 P 0093 ROMTST 00146 00153*
```

```
 P 005E RTFAIL   00062 00069 00083 00095*
 P 0064 RTFL1    00102*00104
.P 006D RTFL2    00111*00115
 P 0080 RTFL3    00134*00136
 P 0086 RTPASS   00090 00143*
R       SR4      00008*00216
 P 00C0 STADJB   00184 00187*
R       START    00008*00222
 P 002B STCBT    00045 00048*
R       STLROM   00009*00025
RB      TEMP     00006*00154 00156 00159 00164 00170

00001                         NAM     CRCGN
00002                         OPT     REL,CREF,LLEN=80
00003                         TTL     CRC GENERATOR FOR DTO ROMS
00004                         IDNT    FEB. 18, 1978 - RAM

00006                         XREF    PSCT:BTHST,OUTMSG

00008                         XREF    CR,CRC0,CRC1,CRC2,CRC3,CRC4,CRC5,CRC6
00009                         XREF    CRC7
00010                         XREF    EXBUG,LF,ROM1,ROMEND,ROMSIZ

00012                         XDEF    CRCGEN 00014D 0000                   DSCT
00015D 0000    0002 A CRCPTR  RMB     2
00016D 0002    0002 A ROMPTR  RMB     2
00017D 0004    0002 A TEMP    RMB     2

00019P 0000                   PSCT

00021                 *
00022                 * CALCULATE CRC CHARACTERS FOR SUCCESSIVE XOR TO
00023                 *   BE AA HEX.  STORE RESULT IN CRC SPACES LOOKED
00024                 *   UP IN CRCTBL.
00025                 *
00026P 0000 CE 0000 A CRCGEN  LDX    #ROM1
00027P 0003 FF 0002 D         STX    ROMPTR   ROMPTR _ ROM1
00028P 0006 CE 0077 P         LDX    #CRCTBL  CRCPTR _ CRCTBL
00029                 *
00030                 *                       UNTIL CRCPTR = CRCEND DO
00031P 0009 FF 0000 D LOOP1   STX    CRCPTR
00032P 000C 8D 5B 0069        BSR    INIT1    ... INDEX _ ROMPTR
00033                 *                       ... ROMPTR _ ROMPTR + (ROMSIZ*256)
00034                 *                       ... CRC _ AA HEX
00035                 *
00036                 *                       ... UNTIL INDEX = ROMPTR DO
00037P 000E A8 00   A LOOP2   EORA   X        ...... CRC _ CRC XOR (INDEX)
00038P 0010 08                INX             ...... INDEX _ INDEX + 1
00039P 0011 BC 0002 D         CPX    ROMPTR
00040P 0014 26 F8 000E        BNE    LOOP2    ...... [LOOPTEST: INDEX <> ROMPTR]
00041                 *
00042P 0016 FE 0000 D         LDX    CRCPTR
00043P 0019 EE 00   A         LDX    X
00044P 001B A7 00   A         STAA   X        ... ((CRCPTR)) _ CRC
00045P 001D FE 0000 D         LDX    CRCPTR
00046P 0020 08                INX
00047P 0021 08                INX             ... CRCPTR _ CRCPTR + 2
00048P 0022 8C 0087 P         CPX    #CRCEND
00049P 0025 26 E2 0009        BNE    LOOP1    ... [LOOP TEST: CRCPTR <> CRCEND]
```

```
00051             *
00052             * CHECK GENERATED CRCS.  IF THERE IS A FAILURE,
00053             *     PRINT ERROR MESSAGE, INCLUDING THE BASE
00054             *     ADDRESS OF THE BLOCK WHEREIN THE FAILURE
00055             *     OCCURED.  OTHERWISE, PRINT COMPLETION
00056             *     MESSAGE.
00057             *
00058P 0027 CE 0000  A        LDX   #ROM1
00059P 002A FF 0002  D        STX   ROMPTR    ROMPTR _ ROM1
00060             *
00061             *                           UNTIL ROMPTR = ROMEND DO
00062P 002D 8D 3A 0069 LOOP3  BSR   INIT1     ... INDEX _ ROMPTR
00063             *                           ... ROMPTR _ ROMPTR + (ROMSIZ*256)
00064             *                           ... CRC _ AA HEX
00065             *                           ... UNTIL INDEX = ROMPTR DO
00066P 002F A8 00   A LOOP4  EORA  X         ...... CRC _ CRC XOR (INDEX)
00067P 0031 08              INX             ...... INDEX _ INDEX + 1
00068P 0032 BC 0002  D        CPX   ROMPTR
00069P 0035 26 F8 002F       BNE   LOOP4     ...... [LOOPTEST: INDEX <> ROMPTR]
00070             *
00071P 0037 4D              TSTA
00072P 0038 26 08 0042       BNE   ELP3      ... IF CRC <> 0 THEN BREAK LOOP
00073P 003A FE 0002  D        LDX   ROMPTR
00074P 003D 8C 0000  A        CPX   #ROMEND
00075P 0040 26 EB 002D       BNE   LOOP3     ... [LOOP TEST: ROMPTR <> ROMEND]
00076             *
00077P 0042 4D       ELP3    TSTA
00078P 0043 27 1B 0060       BEQ   CRCOK     IF CRC <> 0 THEN
00079P 0045 FF 0004  D        STX   TEMP      ... SET THE ERROR MESSAGE
00080P 0048 B6 0004  D        LDAA  TEMP      ... #1 DATA AREA TO BE
00081P 004B 80 00   A         SUBA  #ROMSIZ   ... THE BASE ADDRESS OF
00082P 004D CE 00AD  P        LDX   #EM1D     ... THE CRC FAILURE BLOCK
00083P 0050 BD 0000  A        JSR   BTHST     ... [SET MSDS]
00084P 0053 B6 0005  D        LDAA  TEMP+1
00085P 0056 08              INX
00086P 0057 08              INX
00087P 0058 BD 0000  A        JSR   BTHST     ... [SET LSDS]
00088P 005B CE 0087  P        LDX   #ERM1     ... POINT TO ERROR MESSAGE
00089P 005E 20 03 0063       BRA   LINK1     ... OUTPUT ERROR MESSAGE AND EXIT
00090             *
00091P 0060 CE 00B1  P CRCOK  LDX   #OKM1     POINT TO OK MESSAGE
00092P 0063 BD 0000  A LINK1  JSR   OUTMSG    OUTPUT MESSAGE
00093P 0066 7E 0000  A        JMP   EXBUG     EXIT CRCGEN
00094             *
00095P 0069 FE 0002  D INIT1  LDX   ROMPTR    INDEX _ ROMPTR
00096P 006C B6 0002  D        LDAA  ROMPTR
00097P 006F 8B 00   A         ADDA  #ROMSIZ
00098P 0071 B7 0002  D        STAA  ROMPTR    ROMPTR _ ROMPTR + (ROMSIZ*256)
00099P 0074 86 AA   A         LDAA  #$AA      CRC _ AA HEX
00100P 0076 39              RTS
00102             *
00103             * CRC ADDRESS TABLE
00104             *
00105P 0077     0000  A CRCTBL FDB  CRC0
00106P 0079     0000  A        FDB   CRC1
00107P 007B     0000  A        FDB   CRC2
00108P 007D     0000  A        FDB   CRC3
00109P 007F     0000  A        FDB   CRC4
00110P 0081     0000  A        FDB   CRC5
00111P 0083     0000  A        FDB   CRC6
00112P 0085     0000  A        FDB   CRC7
00113          0087  P CRCEND EQU   *         END OF CRC TABLE
00114             *
00115             * MESSAGES FOR TERMINAL OUTPUT:
00116             *
00117             *     ERM1:  "CRC GENERATION ERROR",
00118             *            "BASE ADDRESS:  ", 4 PRESET HEX CHARACTERS.
00119             *
00120             *     [NOTE THAT ERM1 MUST BE RAM RESIDENT]
00121             *
00122             *     OKM1:  "CRC GENERATION COMPLETE"
00123             *
```

```
00124P 0087    29      A  ERM1   FCB     EM1E-ERM1-1 BYTE COUNT
00125P 0088    43      A         FCC     \CRC GENERATION ERROR\
     P 0089    52      A
     P 008A    43      A
     P 008B    20      A
     P 008C    47      A
     P 008D    45      A
     P 008E    4E      A
     P 008F    45      A
     P 0090    52      A
     P 0091    41      A
     P 0092    54      A
     P 0093    49      A
     P 0094    4F      A
     P 0095    4E      A
     P 0096    20      A
     P 0097    45      A
     P 0098    52      A
     P 0099    52      A
     P 009A    4F      A
     P 009B    52      A
00126P 009C    00      A         FCB     CR,LF
     P 009D    00      A
00127P 009E    42      A         FCC     \BASE ADDRESS: \
     P 009F    41      A
     P 00A0    53      A
     P 00A1    45      A
     P 00A2    20      A
     P 00A3    41      A
     P 00A4    44      A
     P 00A5    44      A
     P 00A6    52      A
     P 00A7    45      A
     P 00A8    53      A
     P 00A9    53      A
     P 00AA    3A      A
     P 00AB    20      A
     P 00AC    20      A
00128P 00AD  0004      A  EM1D   RMB     4           [MUST BE RAM RESIDENT]
00129        00B1      P  EM1E   EQU     *

00131P 00B1    17      A  OKM1   FCB     OK1E-OKM1-1 BYTE COUNT
00132P 00B2    43      A         FCC     \CRC GENERATION COMPLETE\
     P 00B3    52      A
     P 00B4    43      A
     P 00B5    20      A
     P 00B6    47      A
     P 00B7    45      A
     P 00B8    4E      A
     P 00B9    45      A
     P 00BA    52      A
     P 00BB    41      A
     P 00BC    54      A
     P 00BD    49      A
     P 00BE    4F      A
     P 00BF    4E      A
     P 00C0    20      A
     P 00C1    43      A
     P 00C2    4F      A
     P 00C3    4D      A
     P 00C4    50      A
     P 00C5    4C      A
     P 00C6    45      A
     P 00C7    54      A
     P 00C8    45      A
00133        00C9      P  OK1E   EQU     *

00135                                    END
TOTAL ERRORS 00000
```

```
RP      BTHST   00006*00083 00087
R       CR      00008*00126
R       CRC0    00008*00105
R       CRC1    00008*00106
R       CRC2    00008*00107
R       CRC3    00008*00108
R       CRC4    00008*00109
R       CRC5    00008*00110
R       CRC6    00008*00111
R       CRC7    00009*00112
 P 0087 CRCEND  00048 00113*
DP 0000 CRCGEN  00012 00026*
 P 0060 CRCOK   00078 00091*
 D 0000 CRCPTR  00015*00031 00042 00045
 P 0077 CRCTBL  00028 00105*
 P 0042 ELP3    00072 00077*
 P 00AD EM1D    00082 00128*
 P 00B1 EM1E    00124 00129*
 P 0087 ERM1    00088 00124*00124
R       EXBUG   00010*00093
 P 0069 INIT1   00032 00062 00095*
R       LF      00010*00126
 P 0063 LINK1   00089 00092*
 P 0009 LOOP1   00031*00049
 P 000E LOOP2   00037*00040
 P 002D LOOP3   00062*00075
 P 002F LOOP4   00066*00069
 P 00C9 OK1E    00131 00133*
 P 00B1 OKM1    00091 00131*00131
RP      OUTMSG  00006*00092
R       ROM1    00010*00026 00058
R       ROMEND  00010*00074
 D 0002 ROMPTR  00016*00027 00039 00059 00068 00073 00095 00096 00098
R       ROMSIZ  00010*00081 00097
 D 0004 TEMP    00017*00079 00080 00084
```

We claim:

1. A method of testing a logic system having a common clock oscillator and which has a plurality of nodes wherein the logic signal at each node is in synchronism with said common clock oscillator, comprising the steps of:
  recording in sequence as reference signals from a known good system (a) a periodic waveform that has a specific frequency ratio to the system common clock oscillator output, and (b) the logic signal at each of a plurality of nodes,
  comparing the frequency of a periodic waveform of a system under test with the frequency of the periodic waveform of the known good system, the frequency of said periodic waveform of the system under test having said specific frequency ratio to a clock oscillator output of the system under test,
  deriving from the recorded signals a set of reference signals that are modified in frequency in proportion to the ratio of the periodic waveform frequencies of the known good system and the system under test, whereby compensation is provided for the effect of different clock oscillator frequencies, and
  comparing signals from a plurality of nodes of the system under test with corresponding modified reference signals, whereby the performance of the system under test is determined.

2. The method according to claim 1 wherein the step of comparing signals from a plurality of nodes of the system under test with corresponding modified reference signals includes the step of displaying a reference signal and a signal from the system under test for a particular node one immediately above the other.

3. The method according to claim 2 wherein the step of comparing signals further includes the step of emphasizing any time interval where one of said displayed signals does not correspond in digital level with the other of said display signals, whereby attention is directed to time intervals where the displayed signals are in logic disagreement.

4. The method according to claim 1 wherein the step of comparing signals from a plurality of nodes of the system under test with corresponding modified reference signals comprises the steps of:
  determining the extent that the modified reference signal and the signal from the system under test correspond for a particular node, and
  giving a first indication when intervals of disagreement between the two signals exceed predetermined limits, and giving a second indication when intervals of disagreement between the two signals are within the predetermined limits, whereby a pass or fail of the system under test at a particular node is clearly given.

5. The method according to claim 4 which comprises the additional step of establishing and recording at least a portion of said predetermined limits for each known good system logic signal, said additional step being performed in advance of the step of comparing signals.

6. The method according to claim 4 wherein said predetermined limits are characterized by maximum allowable total cummulative intervals of disagreement as a percentage of the interval of signal from the system under test, and by a maximum allowable single interval of continuance disagreement.

7. The method according to claim 6 which comprises the additional step of establishing and recording said maximum allowable signal interval of continuous disagreement for each known good system logic signal, said additional step being performed in advance of the step of comparing signals.

8. A method of recording and displaying a plurality of logic traces at a plurality of nodes of an electronic circuit, comprising the steps of:
placing a probe on a first circuit node to acquire a first logic signal,
displaying said first logic signal,
subsequently placing the same probe on a second circuit node to acquire a second logic signal,
displaying said second logic signal simultaneously with said first logic signal, and
similarly placing said probe on other circuit nodes one at a time to acquire and simultaneously display additional logic signals.

9. The method according to claim 8 wherein said logic signals are displayed, and including the additional step of moving the displayed signals when the display area is full in a manner to retain the most recently displayed signals and make room for another signal.

10. The method according to claim 8 wherein said first, second and additional logic signals are displayed with the same time base.

11. A method of recording and displaying a plurality of logic traces at a plurality of nodes of an electric circuit, comprising the steps of:
placing a probe on a first circuit node to acquire a first logic signal,
storing said first logic signal,
displaying the first logic signal in one area of an electronic display device,
moving the first logic signal display away from said one area,
placing the same probe on a second circuit node to acquire a second logic signal,
storing said second logic signal,
displaying said second logic signal in said one area of the electronic display device,
moving the second logic signal display away from said one area,
placing said probe on a third circuit node to acquire a third logic signal,
storing said third logic signal, and
displaying said third logic signal in said one area of the electronic display device.

12. The method according to claim 11 wherein the steps of displaying said first, second and third logic signals includes displaying said signals with a common time base.

13. The method according to claim 11 wherein the step of moving the first logic signal display away from said one area includes moving the first logic signal to a second area that is immediately adjacent said one area, wherein the step of moving the second logic signal display away from said one area includes moving the second logic signal to said second area, and which additionally comprises simultaneously with moving the second logic signal to said second area the step of moving said first logic signal to a third area of the display device, said third area being immediately adjacent said second area on a side thereof opposite the side of said one area.

14. The method according to claim 11 wherein the steps of displaying said first, second and third logic signals includes displaying said signals with a common time base in a horizontal direction on said display device, and wherein said one, second and third areas are vertically positioned relative to each other on said display device.

15. For testing a logic system having a common clock oscillator and a plurality of nodes wherein logic signals at each node exist in synchronism with said common clock oscillator, a testing device comprising:
a probe adapted for electrically contacting one at a time circuit nodes of said logic system,
means electrically connected to said probe for storing a plurality of distinct signals one at a time as they are acquired by connection of said probe to a plurality of nodes, whereby a plurality of signals at nodes of said logic system under test may be acquired and stored,
means for storing a plurality of distinct reference signals, whereby a plurality of signals at nodes of a known good logic system may be stored for reference purposes,
means responsive to the probe acquired and reference signals for normalizing the frequencies of said reference and probe acquired signals, thereby eliminating differences between them that are due to different clock oscillator frequencies in the known good logic system and the logic system under test,
means receiving the normalized reference and probe acquired signals for comparing corresponding pairs of such signals, one of each pair being a reference signal and the other of each pair being a probe acquired signal, and
means responsive to said comparison means for giving an indication when a corresponding pair of said signals differ along their time bases, whereby the performance of a system under test may be determined in comparison to that of the known good system.

16. For testing a logic system having a common clock oscillator and a plurality of nodes wherein logic signals at each node exist in synchronism with said common clock oscillator, the testing device according to claim 15 wherein said indication means includes:
means for identifying intervals of difference between each of said pair of signals along their time base, and
means responsive to said difference means for giving a first indication when intervals of disagreement between a pair of signals exceed a predetermined limit, and a second indication when intervals of disagreement are within said predetermined limit, whereby pass or fail signals for each node of the system under test are given.

17. For testing a logic system having a common clock oscillator and a plurality of nodes wherein logic signals at each node exist in synchronism with said common clock oscillator, the testing device according to claim 16 wherein said predetermined limit is characterized by maximum allowable total cummulative intervals of disagreement as a percentage of the interval of the probe acquired signal, and by a maximum allowable single interval of continuous disagreement.

18. For testing a logic system having a common clock oscillator and a plurality of nodes wherein logic signals at each node exist in synchronism with said common clock oscillator, the testing device according to claim 16 wherein said indication means includes a first visual indicator mounted on said probe for giving said first indication, and a second visual indicator mounted on said probe for giving said second indication.

19. For testing a logic system having a common clock oscillator and a plurality of nodes wherein logic signals at each node exist in synchronism with said common clock oscillator, the testing device according to claim 15 wherein said indication means includes:
a two dimensional electronic display device, and
means receiving said corresponding pairs of signals for displaying them on said display device with one immediately vertically adjacent the other.

20. For testing a logic system having a common clock oscillator and a plurality of nodes wherein logic signals at each node exist in synchronism with said common clock oscillator, the testing device according to claim 19 wherein said indication means additionally includes means for highlighting time intervals along said display wherein said pair of signals do not correspond.

21. For testing a logic system having a common clock oscillator and a plurality of nodes wherein logic signals at each node exist in synchronism with said common clock oscillator, the testing device according to claim 15 wherein said probe signal storage means includes:
means receiving said signals from the probe for converting said signals to a digital stream of data,
a high speed digital memory receiving said stream of data and characterized by normally containing only a most recent number of data stream bits, and
means responsive to a trigger signal for freezing said high speed digital memory, whereby a number of the most recent data stream bits equal to said number are stored.

22. For testing a logic system having a common clock oscillator and a plurality of nodes wherein logic signals at each node exist in synchronism with said common clock oscillator, the testing device according to claim 21 wherein said probe signal means additionally includes means for generating said trigger signal responsive to said probe acquired signal.

23. For testing a logic system having a common clock oscillator and a plurality of nodes wherein logic signals at each node exist in synchronism with said common clock oscillator, the testing device according to claim 21 wherein said probe signal storage means additionally includes means for receiving a trigger signal external of said testing device.

24. For testing a logic system having a common clock oscillator and a plurality of nodes wherein logic signals at each node exist in synchronism with said common clock oscillator, the testing device according to claim 21 wherein said probe signal storage means additionally includes a random access memory into which is transferred the data bits that are stored in said high speed memory.

25. For testing a logic system having a common clock oscillator and a plurality of nodes wherein logic signals at each node exist in synchronism with said common clock oscillator, the testing device according to claim 15 wherein said reference signal storage means includes a non-volatile storage media.

26. A testing device for displaying a plurality of logic traces, comprising:
an electronic display device,
a probe having an electrode adapted to contact a single node of an electronic circuit,
a manually operated electrical switch on said probe,
means receiving electronic signals from said probe electrode for storing a plurality of signals that are acquired one at a time through said probe electrode, and
means connected to receive the stored signals from said storage means for displaying the most recently acquired signal therein in a first area of said electronic display device, said displaying means also comprising means responsive to said probe switch for scrolling all displayed signals a distance on said display device away from said one area, thereby clearing said one display device area for displaying another more recently acquired signal.

27. The testing device to claim 26 wherein said display device is characterized by displaying all electronic signals with a common time base and further wherein said scrolling means causes said displayed signals to be displaced vertically on said electronic display device.

* * * * *